US012336426B2

(12) United States Patent
Cho et al.

(10) Patent No.: US 12,336,426 B2
(45) Date of Patent: Jun. 17, 2025

(54) ORGANIC LIGHT-EMITTING DEVICE

(71) Applicant: Samsung Display Co., Ltd., Yongin-si (KR)

(72) Inventors: Hwan-Hee Cho, Yongin-si (KR); Myeong-Suk Kim, Yongin-si (KR); Hee-Yeon Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/273,515

(22) Filed: Sep. 22, 2016

(65) Prior Publication Data

US 2017/0117486 A1 Apr. 27, 2017

(30) Foreign Application Priority Data

Oct. 27, 2015 (KR) ........................ 10-2015-0149727

(51) Int. Cl.
*H01L 51/54* (2006.01)
*C09K 11/02* (2006.01)
(Continued)

(52) U.S. Cl.
CPC ........ *H10K 85/6572* (2023.02); *C09K 11/025* (2013.01); *C09K 11/06* (2013.01);
(Continued)

(58) Field of Classification Search
CPC ... C09K 11/06; C09K 11/025; C09K 2211/00; C09K 2211/10; C09K 2211/1007;
(Continued)

(56) References Cited

U.S. PATENT DOCUMENTS

| | | | |
|---|---|---|---|
| 5,840,217 | A | 11/1998 | Lupo et al. |
| 6,911,551 | B2 | 6/2005 | Stössel et al. |
| 7,663,304 | B2 | 2/2010 | Fukuoka et al. |
| 7,956,531 | B2 | 6/2011 | Smith |

(Continued)

FOREIGN PATENT DOCUMENTS

| | | | |
|---|---|---|---|
| CN | 101535256 | A | 9/2009 |
| CN | 102668157 | A | 9/2012 |
| CN | 102858912 | A | 1/2013 |
| CN | 103328420 | A | 9/2013 |

(Continued)

OTHER PUBLICATIONS

Machine translation of KR2011-0066766. (Year: 2011).*

(Continued)

*Primary Examiner* — Andrew K Bohaty

(74) *Attorney, Agent, or Firm* — Womble Bond Dickinson (US) LLP

(57) ABSTRACT

An organic light-emitting device including: a first electrode; a second electrode; and an organic layer including an emission layer between the first electrode and the second electrode. The organic layer may include at least one compound selected from a first compound and a second compound, in addition to a third compound. The first compound is represented by one selected from Formulae 1-1 and 1-2, the second compound is represented by Formula 2, and the third compound is represented by one selected from Formulae 3-1A and 3-2A:

Formula 1-1

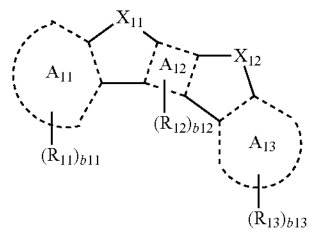

Formula 1-2

Formula 2

Formula 3-1A (Continued)

-continued

Formula 3-2A

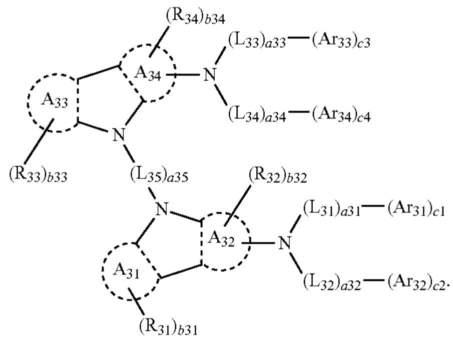

14 Claims, 1 Drawing Sheet

(51) Int. Cl.

| | |
|---|---|
| ***C09K 11/06*** | (2006.01) |
| ***H10K 85/60*** | (2023.01) |
| *H10K 50/11* | (2023.01) |
| *H10K 50/15* | (2023.01) |
| *H10K 85/30* | (2023.01) |
| *H10K 101/00* | (2023.01) |
| *H10K 101/10* | (2023.01) |

(52) U.S. Cl.
CPC ......... *H10K 85/631* (2023.02); *H10K 85/636* (2023.02); *H10K 85/654* (2023.02); *H10K 85/657* (2023.02); *C09K 2211/1007* (2013.01); *C09K 2211/1029* (2013.01); *C09K 2211/185* (2013.01); *H10K 50/11* (2023.02); *H10K 50/15* (2023.02); *H10K 85/342* (2023.02); *H10K 2101/10* (2023.02); *H10K 2101/90* (2023.02)

(58) Field of Classification Search
CPC ...... C09K 2211/1029; C09K 2211/185; H01L 51/0032; H01L 51/005; H01L 51/0059; H01L 51/006; H01L 51/0061; H01L 51/0067; H01L 51/0071; H01L 51/0072; H01L 51/0073; H01L 51/0085; H01L 51/50; H01L 51/5012; H01L 51/5016; H01L 51/5056; H01L 2251/5384
USPC ....... 428/690, 691, 917, 411.4, 336; 427/58, 427/66; 313/500–512; 257/40, 88–104, 257/E51.001–E51.052; 252/301.16–301.35
See application file for complete search history.

(56) References Cited

U.S. PATENT DOCUMENTS 8,394,510 B2 3/2013 Mizuki et al.
8,679,647 B2 3/2014 Pflumm et al.
8,841,655 B2 9/2014 Okamoto
8,865,323 B2 10/2014 Inoue et al.
8,890,126 B2 11/2014 Ryu et al.
8,932,732 B2 1/2015 Buesing et al.
9,040,172 B2 5/2015 Parham et al.
9,070,885 B2 6/2015 Ono
9,203,043 B2 12/2015 Nishimura et al.
9,590,184 B2 3/2017 Lee et al.
9,831,439 B2 11/2017 Kim et al.
9,871,208 B2 1/2018 Lee et al.
9,972,789 B2 5/2018 Cho et al.
10,056,560 B2 8/2018 Lee et al.
10,355,217 B2 7/2019 Pfister et al.
10,622,565 B2 4/2020 Parham et al.
10,818,846 B2 10/2020 Kim et al.
10,930,853 B2 2/2021 Kim et al.
11,588,117 B2 2/2023 Parham et al.
2002/0098379 A1 7/2002 Arakane et al.
2003/0160564 A1 8/2003 Park et al.
2003/0168970 A1 9/2003 Tominaga et al.
2005/0106419 A1 5/2005 Encoh et al.
2006/0055305 A1 3/2006 Funahashi et al.
2006/0088728 A1 4/2006 Kwong et al.
2006/0220535 A1 10/2006 Nakayama
2007/0231555 A1* 10/2007 Tsuji ...................... H10K 50/86 428/220
2007/0252516 A1 11/2007 Kondakova et al.
2008/0124572 A1 5/2008 Mizuki et al.
2009/0309487 A1 12/2009 Royster, Jr. et al.
2010/0001636 A1 1/2010 Yabunouchi
2010/0012931 A1 1/2010 Kato et al.
2010/0046336 A1 2/2010 Takahashi et al.
2010/0069647 A1 3/2010 Suzuki et al.
2010/0187977 A1* 7/2010 Kai ...................... C07D 487/04 313/504
2010/0187984 A1 7/2010 Lin et al.
2011/0037062 A1 2/2011 Fukumatsu et al.
2011/0248246 A1 10/2011 Ogita
2011/0278555 A1 11/2011 Inoue et al.
2011/0279020 A1 11/2011 Inoue et al.
2012/0001165 A1 1/2012 Komori et al.
2012/0068170 A1* 3/2012 Pflumm ............... C07D 209/82 257/40
2012/0091885 A1 4/2012 Kim et al.
2012/0097899 A1* 4/2012 Parham ................... C09B 57/00 528/7
2012/0112169 A1 5/2012 Mizuki et al.
2012/0112174 A1 5/2012 Lee et al.
2012/0138915 A1 6/2012 Nishimura et al.
2012/0153272 A1* 6/2012 Fukuzaki ............ H01L 51/0094 257/E51.026
2012/0181518 A1 7/2012 Ogiwara et al.
2012/0203010 A1 8/2012 Matsumoto et al.
2012/0235123 A1* 9/2012 Lee ....................... C07F 7/0814 257/40
2012/0256123 A1 10/2012 Cho et al.
2012/0273764 A1* 11/2012 Yu .......................... H05B 33/14 257/40
2012/0305898 A1 12/2012 Okamoto
2013/0075716 A1 3/2013 Nishimura et al.
2013/0105771 A1 5/2013 Ryu et al.
2013/0119354 A1* 5/2013 Ma ......................... C09K 11/06 257/40
2013/0256634 A1* 10/2013 Cho .................... H01L 51/0067 257/40
2013/0292665 A1 11/2013 Ono
2013/0313536 A1 11/2013 Nishimura et al.
2014/0001446 A1 1/2014 Mizuki et al.
2014/0034943 A1 2/2014 Mizuki et al.
2014/0048784 A1 2/2014 Inoue et al.
2014/0054564 A1 2/2014 Kim et al.
2014/0061609 A1* 3/2014 Kim ..................... C07D 403/04 257/40
2014/0070204 A1* 3/2014 Nagao .................. C07D 209/86 257/40
2014/0084270 A1 3/2014 Kato et al.
2014/0131665 A1 5/2014 Xia et al.
2014/0131681 A1 5/2014 Ito et al.
2014/0167003 A1 6/2014 Kato et al.
2014/0183500 A1 7/2014 Ikeda et al.
2014/0197386 A1 7/2014 Kim et al.
2014/0217393 A1 8/2014 Kato et al.
2014/0225046 A1 8/2014 Jatsch et al.
2014/0275530 A1 9/2014 Jatsch et al.
2014/0299865 A1* 10/2014 Nishimura .......... H01L 51/0067 257/40
2014/0306207 A1 10/2014 Nishimura et al.
2014/0312331 A1 10/2014 Inoue et al.

(56) References Cited

U.S. PATENT DOCUMENTS

2014/0312338 A1 10/2014 Mizutani et al.
2014/0326985 A1 11/2014 Mizuki et al.
2014/0367649 A1 12/2014 Cho et al.
2014/0374711 A1 12/2014 Cho et al.
2015/0001488 A1 1/2015 Min et al.
2015/0060796 A1 3/2015 Kim et al.
2015/0065730 A1 3/2015 Montenegro et al.
2015/0069352 A1 3/2015 Kim et al.
2015/0102301 A1 4/2015 Cho et al.
2015/0115239 A1 4/2015 Pflumm et al.
2015/0155498 A1 6/2015 Ahn et al.
2015/0179953 A1 6/2015 Mujica-Fernaud et al.
2015/0194622 A1* 7/2015 Yamamoto ............ H01L 51/009 257/40
2015/0207079 A1 7/2015 Cho et al.
2015/0236262 A1 8/2015 Cho et al.
2015/0243897 A1 8/2015 Montenegro et al.
2015/0280136 A1 10/2015 Ryu et al.
2015/0303379 A1 10/2015 Lee et al.
2015/0318486 A1 11/2015 Kim et al.
2015/0325795 A1 11/2015 Lee et al.
2015/0325800 A1 11/2015 Ito et al.
2015/0349270 A1 12/2015 Lee et al.
2016/0149139 A1 5/2016 Xia et al.
2016/0197289 A1 7/2016 Sado et al.
2016/0260909 A1 9/2016 Dyatkin et al.
2017/0047527 A1* 2/2017 Lee ..................... H01L 51/0065
2017/0062729 A1 3/2017 Cha et al.
2017/0084844 A1 3/2017 Parham et al.
2017/0098784 A1 4/2017 Kim et al.
2017/0117488 A1 4/2017 Ahn et al.
2017/0207396 A1 7/2017 Park et al.
2018/0130968 A1 5/2018 Ikeda

FOREIGN PATENT DOCUMENTS

CN 104795503 A 7/2015
CN 104860883 A 8/2015
CN 104903421 A 9/2015
CN 105051011 A 11/2015
JP 2010-34548 A 2/2010
JP 2012-156449 A 8/2012
JP 2012-156499 A 8/2012
JP 2014-49539 A 3/2014
JP 2014-216576 A 11/2014
JP 2015-167150 A 9/2015
JP 2015-216136 A 12/2015
KR 10-2003-0071617 A 9/2003
KR 10-2005-0085046 A 8/2005
KR 10-2005-0086729 A 8/2005
KR 10-2009-0073260 A 7/2009
KR 10-2009-0086057 A 8/2009
KR 10-2010-0105099 A 9/2010
KR 10-2011-0007124 A 1/2011
KR 10-2011-0011647 A 2/2011
KR 10-2011-0015836 A 2/2011
KR 10-2011-0071127 A 6/2011
KR 20110066766 A * 6/2011
KR 10-2011-0118542 A 10/2011
KR 10-2012-0021203 A 3/2012
KR 10-2012-0032572 A 4/2012
KR 10-2012-0038374 A 4/2012
KR 10-2012-0042633 A 5/2012
KR 10-2012-0047706 A 5/2012
KR 10-2012-0057611 A 6/2012
KR 10-2012-0088752 A 8/2012
KR 10-2012-0092550 A 8/2012
KR 10-2012-0127746 A 11/2012
KR 10-2013-0039671 A 4/2013
KR 10-2013-0054205 A 5/2013
KR 10-2013-0109471 A 10/2013
KR 10-2013-0115027 A 10/2013
KR 10-2013-0118059 A 10/2013
KR 10-2014-0000259 A 1/2014
KR 10-2014-0006000 A 1/2014
KR 10-2014-0031213 A 3/2014
KR 10-2014-0069199 A 6/2014
KR 10-2014-0073406 A 6/2014
KR 10-2014-0073412 A 6/2014
KR 10-2014-0074286 A 6/2014
KR 10-2014-0081879 A 7/2014
KR 10-2014-0085110 A 7/2014
KR 10-2014-0087883 A 7/2014
KR 10-2014-0092332 A 7/2014
KR 10-2014-0094520 A 7/2014
KR 10-2014-0095072 A 7/2014
KR 10-2014-0095491 A 8/2014
KR 10-2014-0096203 A 8/2014
KR 10-2014-0104895 A 8/2014
KR 10-1427605 B1 8/2014
KR 10-2014-0108637 9/2014
KR 10-2014-0124654 A 10/2014
KR 10-2014-0133572 A 11/2014
KR 10-2014-0145456 A 12/2014
KR 10-2014-0145887 A 12/2014
KR 10-2014-0145888 A 12/2014
KR 10-2014-0146103 A 12/2014
KR 10-1476231 B1 12/2014
KR 10-2015-0001101 A 1/2015
KR 10-2015-0006199 A 1/2015
KR 10-2015-0007476 A 1/2015
KR 10-1493482 B1 2/2015
KR 10-2015-0024735 A 3/2015
KR 10-2015-0034333 A 4/2015
KR 10-2015-0036721 A 4/2015
KR 10-2015-0041652 A 4/2015
KR 10-2015-0042603 A 4/2015
KR 10-2015-0066202 A 6/2015
KR 10-2015-0068776 A 6/2015
KR 10-2015-0079664 A 7/2015
KR 10-2015-0086721 7/2015
KR 10-2015-0096593 A 8/2015
KR 10-2015-0098631 A 8/2015
KR 10-2015-0124886 A 11/2015
KR 10-2015-0126526 A 11/2015
KR 10-2015-0135123 A 12/2015
WO WO 2010/107244 A2 9/2010
WO WO 2010/131855 A2 11/2010
WO 2011/065136 A1 6/2011
WO 2011/081423 A2 7/2011
WO 2011/132683 A1 10/2011
WO 2012/013271 A1 2/2012
WO WO-2012026780 A1 * 3/2012 ........... H01L 51/006
WO WO 2012/070233 A1 5/2012
WO WO 2013/013271 A1 1/2013
WO WO 2013/088973 A1 6/2013
WO WO-2013105747 A1 * 7/2013 ......... H01L 51/0072
WO WO 2013/120577 A1 8/2013
WO WO 2013/157886 A1 10/2013
WO WO-2013187894 A1 * 12/2013 ......... H01L 51/0072
WO WO 2014/088284 A1 6/2014
WO WO-2014097711 A1 6/2014
WO WO 2014/141725 A1 9/2014
WO WO 2015/014435 A1 2/2015
WO WO 2015/046916 A1 4/2015
WO WO 2015/050391 A1 4/2015
WO 2015/084114 A1 6/2015
WO WO 2015/082056 A1 6/2015
WO WO 2015/135625 A1 9/2015
WO WO 2015/156587 A1 10/2015
WO 2015/174682 A1 11/2015
WO WO 2015/167199 A1 11/2015
WO WO 2015/167259 A1 11/2015
WO WO 2015/169412 A1 11/2015
WO 2016/013875 A1 1/2016

OTHER PUBLICATIONS

Machine translation of WO2013105747. (Year: 2013).*
EPO Extended Search Report dated Jul. 26, 2017, corresponding to European Patent Application No. 17150355.0 (7 pages).

(56) References Cited

OTHER PUBLICATIONS

U.S. Office Action dated Aug. 7, 2018, issued in U.S. Appl. No. 15/293,174 (14 pages).
U.S. Office Action dated Oct. 4, 2018, issued in U.S. Appl. No. 15/182,298 (12 pages).
U.S. Office Action dated Oct. 4, 2018, issued in U.S. Appl. No. 15/372,042 (22 pages).
Concise Description of Relevance of the Third-Party Submission, submitted in U.S. Appl. No. 14/856,487, 9 pages.
Machine Translation of JP 2010-034548 A. Feb. 12, 2010. (Year: 2010).
Yersin, H., "Highly Efficient OLEDs with Phosphorescent Materials," Wiley-VCH Verlag GmbH & Co. 2008. pp. 311-328.
U.S. Office Action dated Aug. 17, 2017, issued in U.S. Appl. No. 15/183,627 (22 pages).
U.S. Office Action dated Nov. 3, 2017, issued in U.S. Appl. No. 14/856,487 (28 pages).
U.S. Final Office Action dated Dec. 15, 2017, issued in U.S. Appl. No. 15/183,627 (12 pages).
U.S. Office Action dated Apr. 6, 2018, issued in U.S. Appl. No. 15/390,294 (13 pages).
U.S. Office Action dated Apr. 6, 2018, issued in U.S. Appl. No. 15/390,210 (14 pages).
U.S. Advisory Action dated Jun. 14, 2018, issued in U.S. Appl. No. 14/856,487 (4 pages).
U.S. Office Action dated Jul. 17, 2018, issued in U.S. Appl. No. 15/183,627 (14 pages).
Machine translation of WO 2011-081423. (Year: 2011).
U.S. Final Office Action dated Jan. 17, 2019, issued in U.S. Appl. No. 15/293,174 (11 pages).
Cosimbescu et al. "Electron Transport Materials: Synthesis, Properties and Device Performance", International Journal of Organic Chemistry, 2012, 2, 101-110. (Year: 2012) 10 pages.
Office action issued in U.S. Appl. No. 15/183,627 by the USPTO, mailed Jul. 18, 2019, 11 pages.
U.S. Final Office Action dated Apr. 5, 2019, issued in U.S. Appl. No. 14/856,487 (29 pages).
U.S. Office Action dated Apr. 15, 2019, issued in U.S. Appl. No. 15/293,174 (10 pages).
U.S. Final Office Action dated Aug. 1, 2019, issued in U.S. Appl. No. 15/390,210 14 pages.
U.S. Office Action dated Nov. 14, 2019, issued in U.S. Appl. No. 15/390,210.
Hu, Jian-Yong, et al.; Synthesis and Photophysical Properties of Pyrene-Based Multiply Conjugated Shaped Light-Emitting Architectures: Toward Efficient Organic-Light Emitting Diodes, InTech Chapter 2, pp. 21-60, dated Jul. 27, 2011.
Office Action issued in U.S. Appl. No. 15/183,627 by the USPTO, dated Dec. 13, 2019, 15 pages.
U.S. Office Action dated Apr. 3, 2020, issued in U.S. Appl. No. 14/856,487 (43 pages).
U.S. Office Action dated Nov. 18, 2020, issued in U.S. Appl. No. 15/372,042 (34 pages).
U.S. Final Office Action dated Oct. 16, 2020, issued in U.S. Appl. No. 14/856,487 (35 pages).
EPO Office Action dated Mar. 11, 2021, issued in European Patent Application No. 17150355.0 (4 pages).
U.S. Office Action dated Apr. 29, 2021, issued in U.S. Appl. No. 16/866,460 (14 pages).
U.S. Office Action dated Oct. 5, 2021, issued in U.S. Appl. No. 14/856,487 (28 pages).
U.S. Advisory Action from U.S. Appl. No. 14/856,487, dated Dec. 30, 2020, 6 pages.
Shin et al. "A New N-flourenyl Carbazole Host Material: Synthesis, Physical Properties and Applications for Highly Efficient Phosphorescent Organic Light Emitting Diodes," Organic Electronics, 2011, 12(5), pp. 785-793.
U.S. Advisory Action for U.S. Appl. No. 14/856,487, dated Jul. 11, 2022, 4 pages.
U.S. Advisory Action for U.S. Appl. No. 15/293,174, dated Mar. 25, 2019, 3 pages.
U.S. Advisory Action for U.S. Appl. No. 16/866,460 dated Dec. 24, 2020, 3 pages.
U.S. Advisory Action from U.S. Appl. No. 15/182,298, dated Apr. 26, 2019, 2 pages.
U.S. Advisory Action from U.S. Appl. No. 15/183,627, dated Feb. 28, 2018, 4 pages.
U.S. Advisory Action from U.S. Appl. No. 15/183,627, dated Feb. 26, 2020, 5 pages.
U.S. Advisory Action from U.S. Appl. No. 15/183,627, dated Mar. 25, 2019, 6 pages.
U.S. Advisory Action from U.S. Appl. No. 15/372,042, dated Jul. 31, 2020, 3 pages.
U.S. Advisory Action from U.S. Appl. No. 15/372,042, dated May 14, 2019, 3 pages.
U.S. Advisory Action from U.S. Appl. No. 15/390,210, dated Dec. 26, 2018, 3 pages.
U.S. Advisory Action from U.S. Appl. No. 15/390,210, dated Jun. 16, 2020, 3 pages.
U.S. Advisory Action from U.S. Appl. No. 15/390,210, dated Oct. 4, 2019, 3 pages.
U.S. Notice of Allowance for U.S. Appl. No. 16/866,460, dated Jun. 16, 2022, 5 pages.
U.S. Notice of Allowance for U.S. Appl. No. 16/866,460, dated Mar. 3, 2022, 5 pages.
U.S. Notice of Allowance for U.S. Appl. No. 16/866,460, dated Nov. 24, 2021, 8 pages.
U.S. Notice of Allowance from U.S. Appl. No. 15/182,298, dated Jun. 24, 2020, 5 pages.
U.S. Notice of Allowance from U.S. Appl. No. 15/182,298, dated Mar. 17, 2020, 5 pages.
U.S. Notice of Allowance from U.S. Appl. No. 15/182,298, dated Nov. 26, 2019, 8 pages.
U.S. Notice of Allowance from U.S. Appl. No. 15/182,298, dated Oct. 15, 2020, 5 pages.
U.S. Notice of Allowance from U.S. Appl. No. 15/293,174, dated Aug. 6, 2019, 8 pages.
U.S. Notice of Allowance from U.S. Appl. No. 15/293,174, dated Feb. 7, 2022, 8 pages.
U.S. Notice of Allowance from U.S. Appl. No. 15/293,174, dated Jan. 23, 2020, 8 pages.
U.S. Notice of Allowance from U.S. Appl. No. 15/293,174, dated Jul. 21, 2020, 8 pages.
U.S. Notice of Allowance from U.S. Appl. No. 15/293,174, dated Jan. 25, 2021, 8 pages.
U.S. Notice of Allowance from U.S. Appl. No. 15/293,174, dated Jun. 10, 2021, 8 pages.
U.S. Notice of Allowance from U.S. Appl. No. 15/293,174, dated May 5, 2020, 8 pages.
U.S. Notice of Allowance from U.S. Appl. No. 15/293,174, dated May 18, 2022, 8 pages.
U.S. Notice of Allowance from U.S. Appl. No. 15/293,174, dated Oct. 17, 2019, 8 pages.
U.S. Notice of Allowance from U.S. Appl. No. 15/293,174, dated Oct. 5, 2021, 8 pages.
U.S. Notice of Allowance from U.S. Appl. No. 15/390,210, dated Jun. 21, 2021, 8 pages.
U.S. Notice of Allowance from U.S. Appl. No. 15/390,210, dated Jan. 31, 2022, 8 pages.
U.S. Notice of Allowance from U.S. Appl. No. 15/390,210, dated May 13, 2022, 8 pages.
U.S. Notice of Allowance from U.S. Appl. No. 15/390,210, dated Oct. 1, 2021, 8 pages.
U.S. Office Action for U.S. Appl. No. 16/866,460 dated Nov. 10, 2020, 29 pages.
U.S. Office Action for U.S. Appl. No. 16/866,460, dated Jun. 12, 2020, 13 pages.
U.S. Office Action for U.S. Appl. No. 16/866,460, dated Oct. 8, 2021, 7 pages.
U.S. Office Action from U.S. Appl. No. 14/856,487, dated Mar. 15, 2018, 20 pages.

(56) References Cited

OTHER PUBLICATIONS

U.S. Office Action from U.S. Appl. No. 14/856,487, dated Sep. 11, 2018, 18 pages.
U.S. Office Action from U.S. Appl. No. 15/182,298, dated Feb. 15, 2019, 11 pages.
U.S. Office Action from U.S. Appl. No. 15/182,298, dated Jun. 17, 2019, 11 pages.
U.S. Office Action from U.S. Appl. No. 15/183,627, dated Jan. 14, 2019, 12 pages.
U.S. Office Action from U.S. Appl. No. 15/183,627, dated Jun. 23, 2020, 13 pages.
U.S. Office Action from U.S. Appl. No. 15/183,627, dated Nov. 23, 2020, 10 pages.
U.S. Office Action from U.S. Appl. No. 15/372,042, dated Jun. 9, 2021, 17 pages.
U.S. Office Action from U.S. Appl. No. 15/372,042, dated Mar. 7, 2019, 27 pages.
U.S. Office Action from U.S. Appl. No. 15/372,042, dated May 12, 2020, 19 pages.
U.S. Office Action from U.S. Appl. No. 15/372,042, dated Nov. 15, 2019, 20 pages.
U.S. Office Action from U.S. Appl. No. 15/390,210, dated Apr. 7, 2020, 13 pages.
U.S. Office Action from U.S. Appl. No. 15/390,210, dated Mar. 23, 2021, 13 pages.
U.S. Office Action from U.S. Appl. No. 15/390,210, dated Mar. 5, 2019, 19 pages.
U.S. Office Action from U.S. Appl. No. 15/390,210, dated Oct. 11, 2018, 18 pages.
U.S. Office Action from U.S. Appl. No. 15/390,210, dated Oct. 6, 2020, 12 pages.
U.S. Office Action from U.S. Appl. No. 17/155,893, dated May 9, 2022, 12 pages.
U.S. Restriction Requirement from U.S. Appl. No. 15/182,298, dated May 14, 2018, 5 pages.
Final Office Action for U.S. Appl. No. 17/155,893 dated Aug. 25, 2022, 11 pages.
Notice of Allowance for U.S. Appl. No. 15/293,174 dated Sep. 7, 2022, 5 pages.
Notice of Allowance for U.S. Appl. No. 15/390,210 dated Sep. 6, 2022, 5 pages.
Notice of Allowance for U.S. Appl. No. 15/293,174 dated Jan. 12, 2023, 5 pages.
Notice of Allowance for U.S. Appl. No. 15/390,210 dated Jan. 17, 2023, 7 pages.
Office Action for U.S. Appl. No. 14/856,487 dated Dec. 1, 2022, 29 pages.
Office Action for U.S. Appl. No. 17/155,893 dated Dec. 20, 2022, 12 pages.
Office Action for U.S. Appl. No. 17/177,049 dated Dec. 27, 2022, 18 pages.
Advisory Action for U.S. Appl. No. 17/155,893 dated Nov. 1, 2022, 3 pages.
Notice of Allowance for U.S. Appl. No. 16/866,460 dated Oct. 17, 2022, 5 pages.
Office Action for U.S. Appl. No. 14/856,487, dated Apr. 14, 2022 (18 pages).
US Final Office Action dated Jun. 14, 2023, issued in U.S. Appl. No. 14/856,487 (30 pages).
Ahn et al. The positional effect of arylamines on pyrene core in a blue fluorescent dopant significantly affecting the performance of organic light emitting diodes. Dyes and Pigments, 2022, 205, 110505. (Year: 2022).
Cho et al. Anthracene-dibenzofuran based electron transport type hosts for long lifetime multiple resonance pure blue OLEDs. Organic Electronics, 2022, 105, 106501. (Year: 2022).
US Final Office Action dated Jun. 9, 2023, issued in U.S. Appl. No. 17/177,049 (13 pages).
Application JP2015-139245. Filed Jul. 10, 2015. (Year: 2015).
Machine Translation of Application JP2015-139245. Filed Jul. 10, 2015. (Year: 2015).
US Advisory Action dated Aug. 31, 2023, issued in U.S. Appl. No. 14/856,487 (4 pages).
US Office Action dated Sep. 19, 2023, issued in U.S. Appl. No. 17/177,049 (14 pages).
US Final Office Action dated Jan. 9, 2024, issued in U.S. Appl. No. 17/177,049 (11 pages).
Ahn et al., machine translation of KR-20120021203-A (2012) pp. 1-30. (Year: 2012).
US Office Action dated Jul. 3, 2024, issued in U.S. Appl. No. 14/856,487 (37 pages).
US Office Action dated Sep. 3, 2024, issued in U.S. Appl. No. 17/177,049 (11 pages).
Notice of Allowance for U.S. Appl. No. 14/856,487 dated Jan. 30, 2025, 33 pages.
Final Office Action for U.S. Appl. No. 17/177,049 dated Mar. 14, 2025, 11 pages.

* cited by examiner

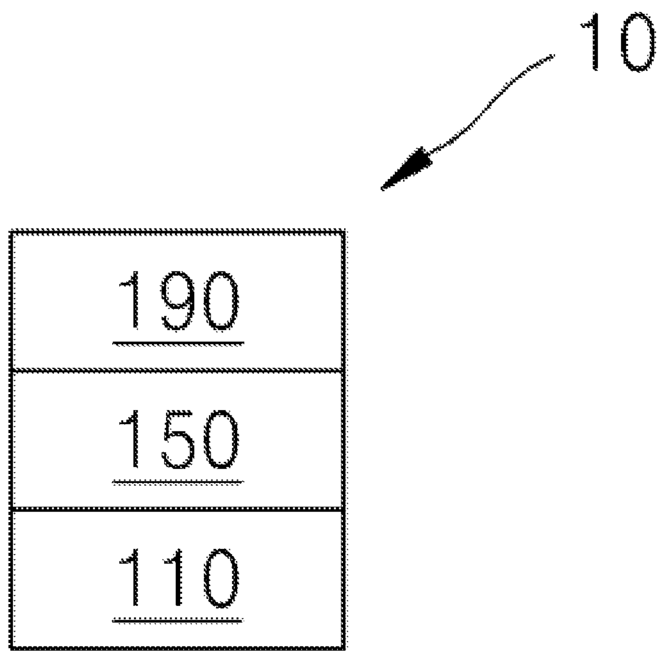
10
190
150
110

ORGANIC LIGHT-EMITTING DEVICE

CROSS-REFERENCE TO RELATED APPLICATION

This application claims priority to and the benefit of Korean Patent Application No. 10-2015-0149727, filed on Oct. 27, 2015, in the Korean Intellectual Property Office, the entire content of which is incorporated herein by reference.

BACKGROUND

1. Field

One or more aspects of example embodiments of the present disclosure are related to an organic light-emitting device.

2. Description of the Related Art

Organic light emitting devices are self-emission devices that have wide viewing angles, high contrast ratios, short response times, and/or excellent brightness, driving voltage, and/or response speed characteristics, and may produce full-color images.

An organic light-emitting device may include a first electrode on a substrate, and a hole transport region, an emission layer, an electron transport region, and a second electrode sequentially positioned on the first electrode. Holes provided from the first electrode may move toward the emission layer through the hole transport region, and electrons provided from the second electrode may move toward the emission layer through the electron transport region.

Carriers (such as holes and electrons) may recombine in the emission layer to produce excitons. These excitons may transition (e.g., radiatively decay) from an excited state to the ground state to thereby generate light.

SUMMARY

One or more aspects of example embodiments of the present disclosure are directed toward an organic light-emitting device having high efficiency and a long lifespan.

Additional aspects will be set forth in part in the description which follows and, in part, will be apparent from the description, or may be learned by practice of the presented example embodiments.

One or more example embodiments of the present disclosure provide an organic light-emitting device including:

a first electrode;

a second electrode; and an organic layer including an emission layer between the first electrode and the second electrode, the organic layer including at least one compound selected from a first compound and a second compound; in addition to a third compound, wherein the first compound is represented by one selected from Formulae 1-1 and 1-2, the second compound is represented by Formula 2, and the third compound is represented by one selected from Formulae 3-1A and 3-2A:

Formula 1-1

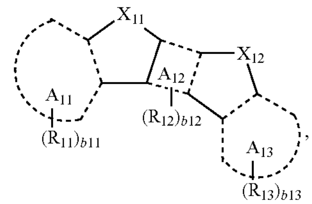

Formula 1-2

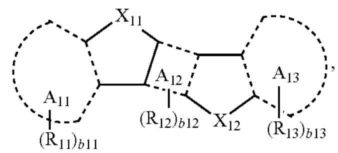

Formula 2

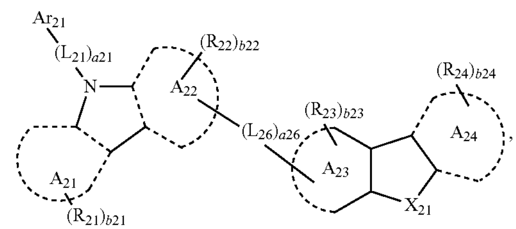

Formula 3-1A

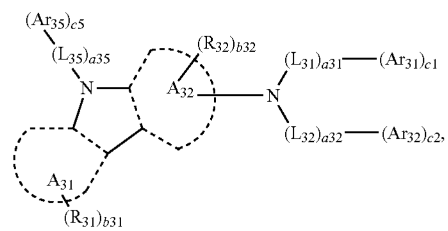

Formula 3-2A

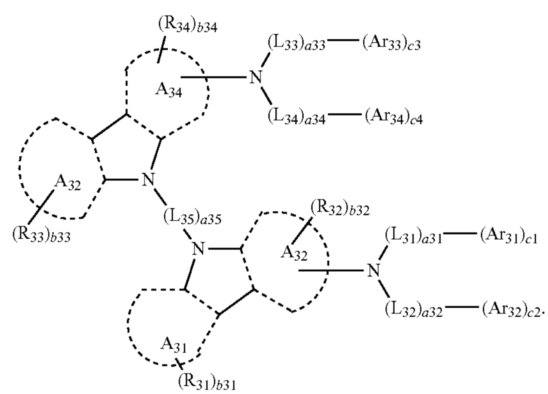

In Formulae 1-1, 1-2, 2, 3-1, and 3-2, $A_{11}$ to $A_{13}$, $A_{21}$ to $A_{24}$, and $A_{31}$ to $A_{34}$ may each independently be selected from a $C_5$-$C_{20}$ carbocyclic group and a $C_1$-$C_{20}$ heterocyclic group, $X_{11}$ may be selected from $N[(L_{11})_{a11}$-$Ar_{11}]$, $C(Ar_{13})(Ar_{15})$, oxygen (O), and sulfur (S), $X_{12}$ may be selected from $N[(L_{12})_{a12}$-$Ar_{12}]$, $C(Ar_{14})(Ar_{16})$, O, and S, $X_{21}$ may be selected from $N[(L_{22})_{a22}$-$Ar_{22}]$, $C(Ar_{23})(Ar_{24})$, O, S, $Si(Ar_{25})(Ar_{26})$, $P[(L_{23})_{a23}$-$Ar_{27}]$, $B[(L_{24})_{a24}$-$Ar_{28}]$, and $P(=O)[(L_{25})_{a25}$-$Ar_{29}]$, $L_{11}$, $L_{12}$, $L_{21}$ to $L_{26}$, and $L_{31}$ to $L_{35}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a11, a12, a21 to a26, and a31 to a35 may each independently be an integer selected from 0 to 5, $Ar_{11}$ to $Ar_{16}$, $Ar_{21}$ to $Ar_{29}$, and $Ar_{31}$ to $Ar_{35}$ may each independently be a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_4)(Q_5)$, and —$B(Q_6)(Q_7)$, provided that:

in Formula 3-1A, $Ar_{31}$ and $Ar_{32}$ are both not a substituted or unsubstituted fluorenyl group, in Formula 2, $Ar_{25}$ and $Ar_{26}$ may optionally be linked to each other to form a saturated or unsaturated ring, in Formulae 3-1A and 3-2A, $Ar_{31}$ and $Ar_{32}$ may optionally be linked to each other to form a saturated or unsaturated ring, and in Formula 3-2A, $Ar_{33}$ and $Ar_{34}$ may optionally be linked to each other to form a saturated or unsaturated ring, $R_{11}$ to $R_{13}$, $R_{21}$ to $R_{24}$, and $R_{31}$ to $R_{34}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_{11})(Q_{12})(Q_{13})$, —$N(Q_{14})(Q_{15})$, and —$B(Q_{16})(Q_{17})$, b11 to b13, b21 to b24, and b31 to b34 may each independently be an integer selected from 0 to 8, c1 to c5 may each independently be an integer selected from 1 to 3, and at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_1$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group and substituted monovalent non-aromatic condensed heteropolycyclic group may be selected from the group consisting of:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —$Si(Q_{21})(Q_{22})(Q_{23})$, —$N(Q_{24})(Q_{25})$, and —$B(Q_{26})(Q_{27})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —$Si(Q_{31})(Q_{32})(Q_{33})$, —$N(Q_{34})(Q_{35})$, and —$B(Q_{36})(Q_{37})$;

—$Si(Q_{41})(Q_{42})(Q_{43})$, —$N(Q_{34})(Q_{35})$, and —$B(Q_{46})(Q_{47})$, wherein $Q_1$ to $Q_7$, $Q_{11}$ to $Q_{17}$, $Q_{21}$ to $Q_{27}$, $Q_{31}$ to $Q_{37}$, and $Q_{41}$ to $Q_{47}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group; and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkoxy group, a phenyl group, a biphenyl group, a terphenyl group, and a naphthyl group, and $Q_4$ and $Q_5$ may optionally be linked to each other to form a saturated or unsaturated ring.

BRIEF DESCRIPTION OF THE DRAWING

These and/or other aspects will become apparent and more readily appreciated from the following description of the example embodiments, taken in conjunction with the drawing, which is a schematic view showing the structure of an organic light-emitting device according to an embodiment of the present disclosure.

DETAILED DESCRIPTION

Reference will now be made in more detail to example embodiments, examples of which are illustrated in the accompanying drawings, wherein like reference numerals refer to like elements throughout, and duplicative descriptions thereof may not be provided. In this regard, the present example embodiments may have different forms and should not be construed as being limited to the descriptions set forth herein. Accordingly, the example embodiments are merely described below, by referring to the drawing, to explain aspects of the present description. As used herein, the term "and/or" includes any and all combinations of one or more of the associated listed items. Expressions such as "at least one of", "one of", "selected from", "at least one selected from", and "one selected from", when preceding a list of elements, modify the entire list of elements and do not modify the individual elements of the list.

In the drawings, the thicknesses of layers, films, panels, regions, etc., may be exaggerated for clarity. It will be understood that when an element such as a layer, film, region, or substrate is referred to as being "on" another element, it can be directly on the other element or intervening element(s) may also be present. In contrast, when an element is referred to as being "directly on" another element, no intervening elements are present.

The drawing is a schematic view showing the structure of an organic light-emitting device 10 according to an embodiment of the present disclosure. The organic light-emitting device 10 includes a first electrode 110, an organic layer 150, and a second electrode 190.

Hereinafter, the structure of an organic light-emitting device according to an embodiment of the present disclosure and a method of manufacturing an organic light-emitting device according to an embodiment of the present disclosure will be described in connection with the drawing.

In the drawing, a substrate may be under the first electrode 110 and/or above the second electrode 190. The substrate may be a glass substrate or a transparent plastic substrate, each having excellent mechanical strength, thermal stability, transparency, surface smoothness, ease of handling, and/or water-resistance.

The first electrode 110 may be formed by depositing and/or sputtering a material for forming the first electrode 110 on the substrate. When the first electrode 110 is an anode, the material for the first electrode 110 may be selected from materials with a high work function to facilitate hole injection. The first electrode 110 may be a reflective electrode, a semi-transmissive electrode, or a transmissive electrode. The material for forming a first electrode may be a transparent and highly conductive material, and non-limiting examples of such a material may include indium tin oxide (ITO), indium zinc oxide (IZO), tin oxide ($SnO_2$), and zinc oxide (ZnO). When the first electrode 110 is a semi-transmissive electrode or a reflective electrode, at least one selected from magnesium (Mg), aluminum (Al), aluminum-lithium (Al—Li), calcium (Ca), magnesium-indium (Mg—In), and magnesium-silver (Mg—Ag) may be used as a material for forming the first electrode 110.

The first electrode 110 may have a single-layer structure or a multi-layer structure including two or more layers. For example, the first electrode 110 may have a three-layered structure of ITO/Ag/ITO, but embodiments of the structure of the first electrode 110 are not limited thereto.

The organic layer 150 is on the first electrode 110, and the second electrode 150 may include an emission layer.

The organic layer may include at least one compound selected from a first compound and a second compound; in addition to a third compound, wherein the first compound is represented by one selected from Formulae 1-1 and 1-2, the second compound is represented by Formula 2, and the third compound is represented by one selected from Formulae 3-1A and 3-2A:

Formula 1-1

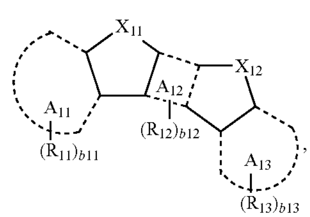

-continued

Formula 1-2

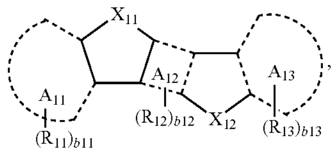

Formula 2

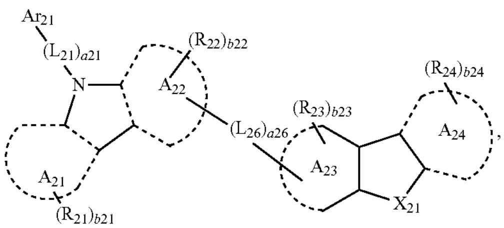

Formula 3-1A

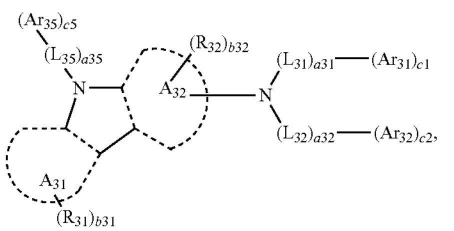

Formula 3-2A

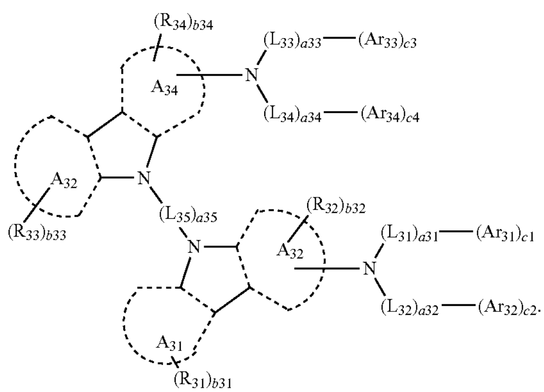

In Formulae 1-1, 1-2, 2, 3-1, and 3-2, $A_{11}$ to $A_{13}$, $A_{21}$ to $A_{24}$, and $A_{31}$ to $A_{34}$ may each independently be selected from a $C_5$-$C_{20}$ carbocyclic group and a $C_1$-$C_{20}$ heterocyclic group.

For example, $A_{11}$ to $A_{13}$, $A_{21}$ to $A_{24}$, and $A_{31}$ to $A_{34}$ may each independently be selected from a benzene, a naphthalene, a phenanthrene, an anthracene, a pyridine, a pyrimidine, a quinoline, an isoquinoline, naphthyridine, a quinoxaline, a phthalazine, a quinazoline, and a cinnoline.

In one or more embodiments, $A_{11}$ to $A_{13}$ and $A_{21}$ to $A_{24}$ may each independently be selected from a benzene, a naphthalene, a phenanthrene, an anthracene, a pyridine, a pyrimidine, a quinoline, an isoquinoline, naphthyridine, a quinoxaline, a phthalazine, a quinazoline, and a cinnoline, $A_{31}$ to $A_{34}$ may each independently be selected from a benzene, a naphthalene, a phenanthrene, and an anthracene, but embodiments of the present disclosure are not limited thereto.

In Formulae 1-1, 1-2, 2, 3-1, and 3-2, $X_{11}$ may be selected from $N[(L_{11})_{a11}$-$Ar_{11}]$, $C(Ar_{13})(Ar_{15})$, oxygen (O), and sulfur (S), $X_{12}$ may be selected from $N[(L_{12})_{a12}$-$Ar_{12}]$, $C(Ar_{14})(Ar_{16})$, O, and S, and $X_{21}$ may be selected from $N[(L_{22})_{a22}$-$Ar_{22}]$, $C(Ar_{23})(Ar_{24})$, O, S, $Si(Ar_{25})(Ar_{26})$, $P[(L_{23})_{a23}$-$Ar_{27}]$, $B[(L_{24})_{a24}$-$Ar_{28}]$, and $P(=O)[(L_{25})_{a25}$-$Ar_{29}]$.

For example, $X_{11}$ may be $N[(L_{11})_{a11}$-$Ar_{11}]$ and $X_{12}$ may be $N[(L_{12})_{a12}$-$Ar_{12}]$; or $X_{11}$ may be $N[(L_{11})_{a11}$-$Ar_{11}]$ and $X_{12}$ may be $C(Ar_{14})(Ar_{16})$; or $X_{11}$ may be $N[(L_{11})_{a11}$-$Ar_{11}]$ and $X_{12}$ may be O; or $X_{11}$ may be $N[(L_{11})_{a11}$-$Ar_{11}]$ and $X_{12}$ may be S.

In Formulae 1-1, 1-2, 2, 3-1, and 3-2, $L_{11}$, $L_{12}$, $L_{21}$ to $L_{26}$, and $L_{31}$ to $L_{35}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

For example, $L_{11}$, $L_{12}$, and $L_{21}$ to $L_{26}$ may each independently be selected from the group consisting of:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, an imidazopyrimidinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group, $L_{31}$ to $L_{35}$ may each independently be selected from the group consisting of:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, a ovalenylene group, a pyrrolylene group, a thiophenylene group, a furanylene group, a carbazolylene group, a benzofuranylene group, a benzothiophenylene group, a dibenzofuranylene group, a dibenzothiophenylene group, a benzocarbazolylene group, a dibenzocarbazolylene group;

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, a carbazolylene group, a benzofuranylene group, a benzothiophenylene group, a dibenzofuranylene group, a dibenzothiophenylene group, a benzocarbazolylene group, and a dibenzocarbazolylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, and a dibenzocarbazolyl group; and a phenylene group substituted with at least one —N($Q_{44}$)($Q_{45}$), wherein $Q_{44}$ and $Q_{45}$ may each be the same as described above.

In one or more embodiments, $L_{11}$, $L_{12}$, and $L_{21}$ to $L_{26}$ may each independently be selected from groups represented by Formulae 3-1 to 3-34, and $L_{31}$ to $L_{35}$ may each independently be selected from Formulae 3-1 to 3-10, 3-26 to 3-28, 3-32, and 3-33, but embodiments of the present disclosure are not limited thereto:

3-1

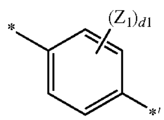

3-2

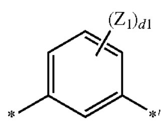

3-3

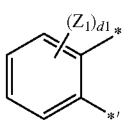

3-4

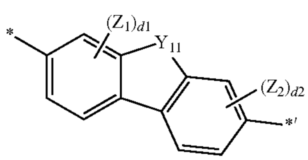

3-5

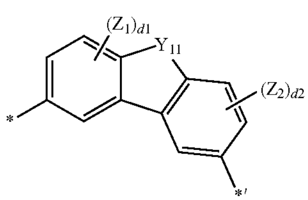

3-6

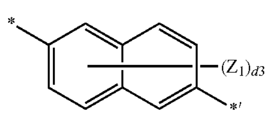

3-7

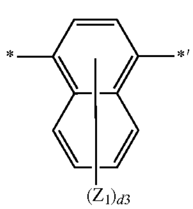

3-8

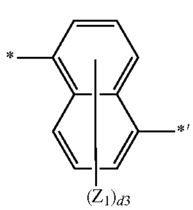

-continued 3-9

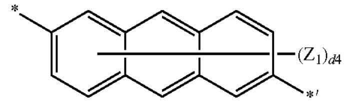

3-10

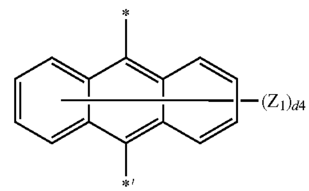

3-11

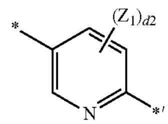

3-12

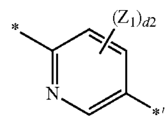

3-13

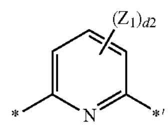

3-14

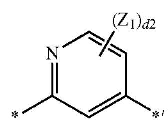

3-15

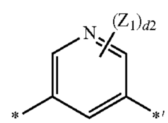

3-16

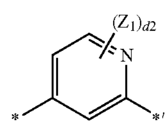

3-17

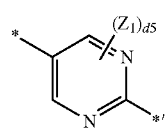

3-18

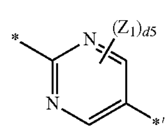

3-19

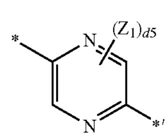

3-20

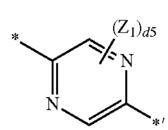

-continued 3-21

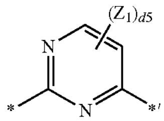

3-22

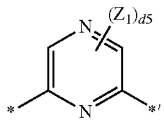

3-23

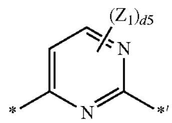

3-24

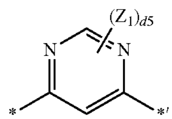

3-25

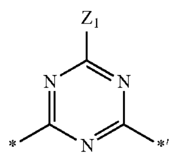

3-26

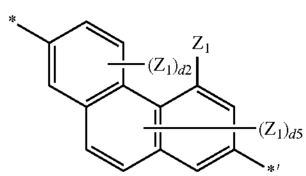

3-27

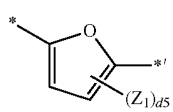

3-28

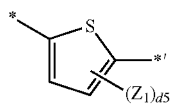

3-29

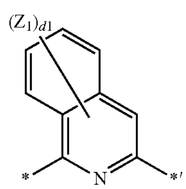

3-30

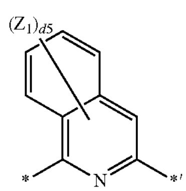

-continued 3-31

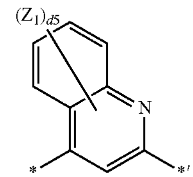

3-32

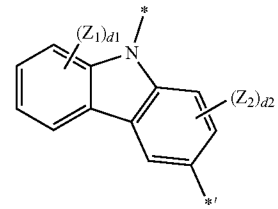

3-33

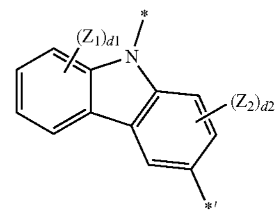

3-34

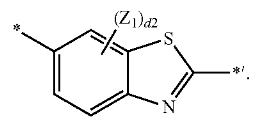

In Formulae 3-1 to 3-34, $Y_{11}$ may be selected from O, S, S(═O), $S(═O)_2$, $C(Z_3)(Z_4)$, $N(Z_5)$, and $Si(Z_6)(Z_7)$, $Z_1$ to $Z_7$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a biphenyl group, a terphenyl group, a naphthyl group, an anthracenyl group, a pyrenyl group, a phenanthrenyl group, a fluorenyl group, a carbazolyl group, a benzocarbazolyl group, a dibenzocarbazolyl group, and $—N(Q_{44})(Q_{45})$, d1 may be an integer selected from 1 to 4, d2 may be an integer selected from 1 to 3, d3 may be an integer selected from 1 to 6, d4 may be an integer selected from 1 to 8, d5 may be selected from 1 and 2, d6 may be an integer selected from 1 to 5, and * and *' may each indicate a binding site to neighboring atom.

a11, a12, a21 to a26, and a31 to a35 in Formulae 1-1, 1-2, 2, 3-1, and 3-2 may each independently be an integer selected from 0 to 5.

a11 indicates the number of $L_{11}$ groups. When a11 is 0, $-(L_{11})_{a11}-$ indicates a single bond, and when a11 is 2 or more, the 2 or more $L_{11}$ groups may be identical to or different from each other. a12, a21 to a26, and a31 to a35 may each be the same as described herein in connection with a11 and Formulae 1-1, 1-2, 2, 3-1, and 3-2.

For example, a11, a12, a21 to a26, and a31 to a35 in Formulae 1-1, 1-2, 2, 3-1, and 3-2 may each independently be an integer selected from 0 to 3, but embodiments of the present disclosure are not limited thereto.

$Ar_{11}$ to $Ar_{16}$, $Ar_{21}$ to $Ar_{29}$, and $Ar_{31}$ to $Ar_{35}$ in Formulae 1-1, 1-2, 2, 3-1, and 3-2 may each independently be a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_4)(Q_5)$, and —$B(Q_6)(Q_7)$, provided that:

in Formula 3-1A, $Ar_{31}$ and $Ar_{32}$ are both not a substituted or unsubstituted fluorenyl group, in Formula 2, $Ar_{25}$ and $Ar_{26}$ may optionally be linked to each other to form a saturated or unsaturated ring, in Formulae 3-1A and 3-2A, $Ar_{31}$ and $Ar_{32}$ may optionally be linked to each other to form a saturated or unsaturated ring, and in Formula 3-2A, $Ar_{33}$ and $Ar_{34}$ may optionally be linked to each other to form a saturated or unsaturated ring.

For example, $Ar_{25}$ and $Ar_{26}$ may optionally be linked to each other to form a carbocyclic ring.

In one or more embodiments, a31 and a32 may each be 0, and $Ar_{31}$ and $Ar_{32}$ may combine (e.g., couple) with the nitrogen atom to form a carbazole ring.

In one or more embodiments, a33 and a34 may each be 0, and $Ar_{33}$ and $Ar_{34}$ may combine (e.g., couple) with the nitrogen atom to form a carbazole ring.

$Q_1$ to $Q_7$ may each be the same as described above, and $Q_4$ and $Q_5$ may optionally be linked (e.g., coupled) to each other to form a saturated or unsaturated ring.

For example, $Q_4$ and $Q_5$ may combine (e.g., couple) with the nitrogen atom to form a carbazole ring.

For example, $Ar_{11}$ to $Ar_{16}$ and $Ar_{21}$ to $Ar_{29}$ may each independently be selected from the group consisting of:

a $C_1$-$C_{20}$ alkyl group, a $C_1$-$C_{20}$ alkoxy group;

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, an imidazopyrimidinyl group, —$Si(Q_1)(Q_2)(Q_3)$, —$N(Q_4)(Q_5)$; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, a dibenzosilolyl group, —$Si(Q_{41})(Q_{42})(Q_{43})$, and —$N(Q_{44})(Q_{45})$, and $Ar_{31}$ to $Ar_{35}$ may each independently be selected from the group consisting of:

a $C_1$-$C_{20}$ alkyl group, a $C_1$-$C_{20}$ alkoxy group;

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a dibenzofuranyl group, a dibenzothiophenyl group, a benzocarbazolyl group, a dibenzocarbazolyl group, a dibenzosilolyl group, —$Si(Q_1)(Q_2)(Q_3)$, —$N(Q_4)(Q_5)$; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group, each substituted with at least one selected from deuterium, —F, —Cl, —Br, —I, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a dibenzosilolyl group, —$Si(Q_{41})(Q_{42})(Q_{43})$, and —$N(Q_{44})(Q_{45})$, wherein $Q_1$ to $Q_5$ and $Q_{41}$ to $Q_{45}$ may each independently be selected from the group consisting of:

a $C_1$-$C_{10}$ alkyl group, a $C_1$-$C_{10}$ alkoxy group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a carbazolyl group, a benzofuranyl group, a benzothiophenyl group, a dibenzofuranyl group, a dibenzothiophenyl group, a benzocarbazolyl group, a dibenzocarbazolyl group, a dibenzosilolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group, each substituted with at least one selected from deuterium, —F, —Cl, —Br, —I, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, and a naphthyl group.

In one or more embodiments, $Ar_{11}$ to $Ar_{16}$ and $Ar_{21}$ to $Ar_{29}$ may each independently be selected from the group consisting of:

a $C_1$-$C_{20}$ alkyl group, a $C_1$-$C_{20}$ alkoxy group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a naphthacenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a naphthyridinyl group, a carbazolyl group, a phenanthridinyl group, an acridinyl group, a benzofuranyl group, a benzothiophenyl group, an isobenzothiazolyl group, a benzoxazolyl group, an isobenzoxazolyl group, a triazolyl group, a triazinyl group, a dibenzofuranyl group, a dibenzothiophenyl group, a benzocarbazolyl group, a dibenzocarbazolyl group, a dibenzosilolyl group, —$Si(Q_1)(Q_2)(Q_3)$, —$N(Q_4)(Q_5)$; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a naphthacenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a naphthyridinyl group, a carbazolyl group, a phenanthridinyl group, an acridinyl group, a benzofuranyl group, a benzothiophenyl group, an isobenzothiazolyl group, a benzoxazolyl group, an isobenzoxazolyl group, a triazolyl group, a triazinyl group, a dibenzofuranyl group, a dibenzothiophenyl group, a benzocarbazolyl group, a dibenzocarbazolyl group, and a dibenzosilolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group and a naphthyl group, —Si($Q_{41}$)($Q_{42}$)($Q_{43}$), and —N($Q_{44}$)($Q_{45}$), and $Ar_{31}$ to $Ar_{35}$ may each independently be selected from the group consisting of:

a $C_1$-$C_{20}$ alkyl group, a $C_1$-$C_{20}$ alkoxy group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a naphthacenyl group, a thiophenyl group, a furanyl group, a carbazolyl group, a dibenzofuranyl group, a dibenzothiophenyl group, a benzocarbazolyl group, a dibenzocarbazolyl group, a dibenzosilolyl group, —Si($Q_1$)($Q_2$)($Q_3$), —N($Q_4$)($Q_5$); and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a naphthacenyl group, a thiophenyl group, a furanyl group, a carbazolyl group, a dibenzofuranyl group, a dibenzothiophenyl group, a benzocarbazolyl group, a dibenzocarbazolyl group, and a dibenzosilolyl group, each substituted with at least one selected from deuterium, —F, —Cl, —Br, —I, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group and a naphthyl group, —Si($Q_{41}$)($Q_{42}$)($Q_{43}$), and —N($Q_{44}$)($Q_{45}$), wherein $Q_1$ to $Q_5$ and $Q_{41}$ to $Q_{45}$ may each independently be selected from the group consisting of:

a $C_1$-$C_{10}$ alkyl group, a $C_1$-$C_{10}$ alkoxy group;

a phenyl group, a biphenyl group, a terphenyl group, a naphthyl group, a fluorenyl group, a spiro-bifluorenyl group, a dibenzofluorenyl group, a phenanthrenyl group, an anthracenyl group, a triphenylenyl group, a pyrenyl group, a chrysenyl group, a carbazolyl group, a dibenzofuranyl group, a dibenzothiophenyl group, a benzocarbazolyl group, a dibenzocarbazolyl group, a dibenzosilolyl group; and a phenyl group, a biphenyl group, a terphenyl group, a naphthyl group, a fluorenyl group, a spiro-bifluorenyl group, a dibenzofluorenyl group, a phenanthrenyl group, an anthracenyl group, a triphenylenyl group, a pyrenyl group, a chrysenyl group, a carbazolyl group, a dibenzofuranyl group, a dibenzothiophenyl group, a benzocarbazolyl group, a dibenzocarbazolyl group, and a dibenzosilolyl group, each substituted with at least one selected from deuterium, —F, —Cl, —Br, —I, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, and a naphthyl group.

In one or more embodiments, $Ar_{11}$ to $Ar_{16}$ and $Ar_{21}$ to $Ar_{29}$ in Formulae 1-1, 1-2, 2, 3-1, and 3-2 may each independently be selected from the group consisting of:

a $C_1$-$C_{10}$ alkyl group, a $C_1$-$C_{10}$ alkoxy group;

—Si($Q_1$)($Q_2$)($Q_3$), —N($Q_4$)($Q_5$); and groups represented by Formulae 5-1 to 5-49 and 7-1 to 7-10, and $Ar_{31}$ to $Ar_{35}$ may each independently be selected from the group consisting of:

a $C_1$-$C_{10}$ alkyl group, a $C_1$-$C_{10}$ alkoxy group;

—Si($Q_1$)($Q_2$)($Q_3$), —N($Q_4$)($Q_5$); and groups represented by Formulae 7-1 to 7-10:

5-1

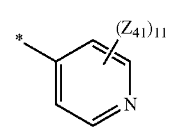

5-2

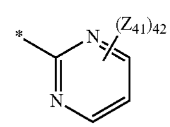

5-3

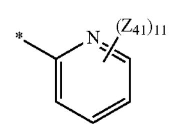

5-4

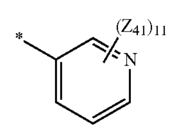

5-5

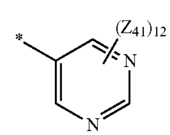

5-6

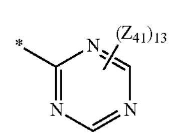

-continued
5-7
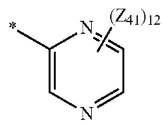
5-8
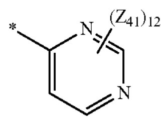
5-9
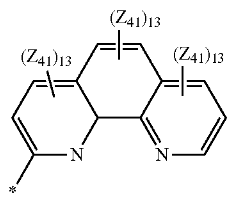
5-10
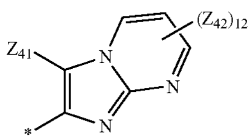
5-11
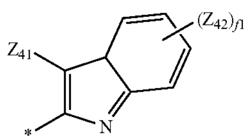
5-12
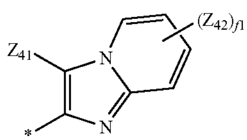
5-13
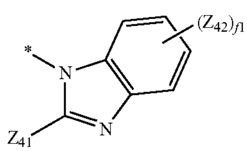
5-14
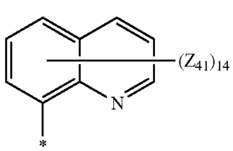
5-15
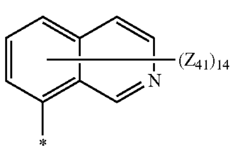
5-16
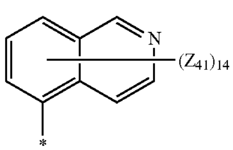
-continued
5-17
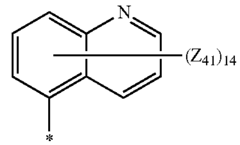
5-18
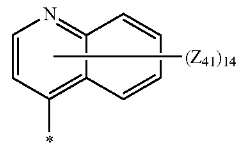
5-19
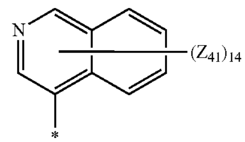
5-20
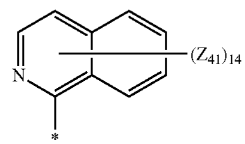
5-21
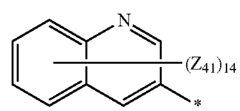
5-22
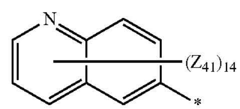
5-22
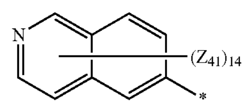
5-23
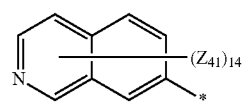
5-24
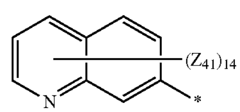
5-25
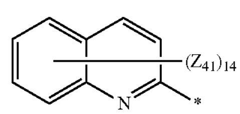
5-26
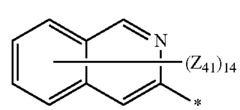
5-27
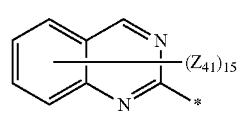

-continued
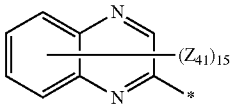
5-28
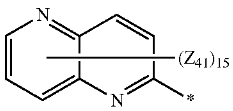
5-29
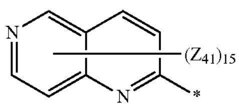
5-30
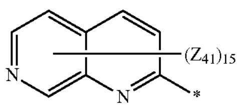
5-31
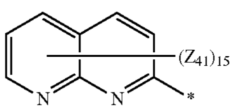
5-32
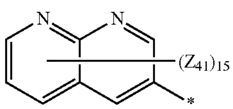
5-33
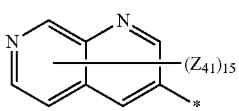
5-34
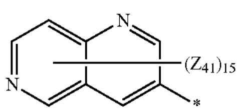
5-35
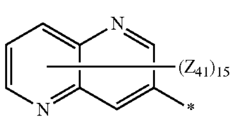
5-36
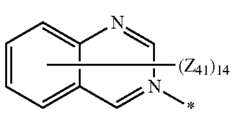
5-37
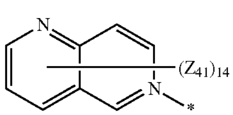
5-38
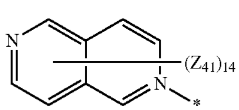
5-39
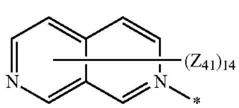
5-40
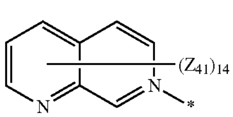
5-41
-continued
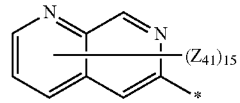
5-42
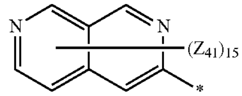
5-43
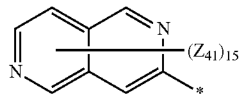
5-44
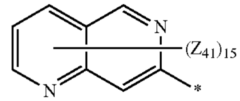
5-45
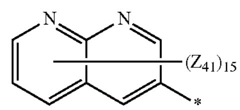
5-46
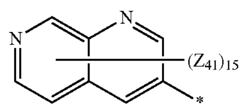
5-47
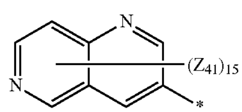
5-48
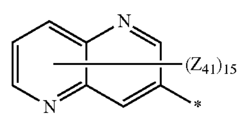
5-49
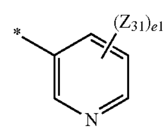
7-1
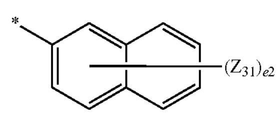
7-2
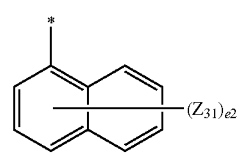
7-3
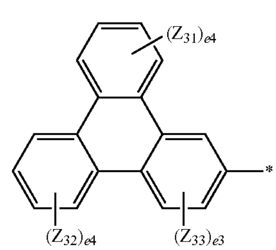
7-4

-continued 7-5

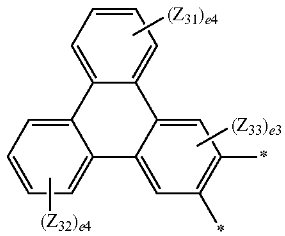

7-6

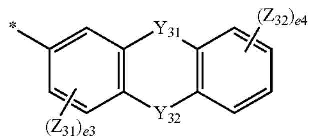

7-7

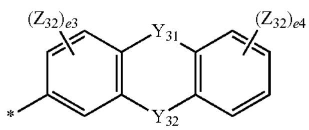

7-8

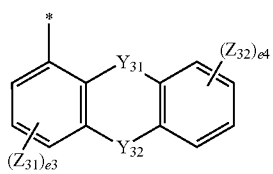

7-9

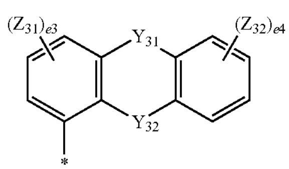

7-10

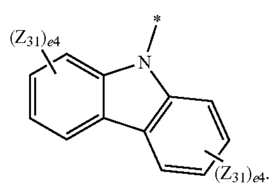

In Formulae 5-1 to 5-29, $Z_{41}$ to $Z_{43}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, —$Si(Q_{41})(Q_{42})(Q_{43})$, —$N(Q_{44})(Q_{45})$, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, and an imidazopyrimidinyl group, and f1 may be an integer selected from 1 to 4, f2 may be an integer selected from 1 to 3, f3 may be an integer selected from 1 or 2, f4 may be an integer selected from 1 to 6, and f5 may be an integer selected from 1 to 5.

In Formulae 7-1 to 7-10, $Y_{31}$ and $Y_{32}$ may each independently be selected from a single bond, O, S, $C(Z_{34})(Z_{35})$, $N(Z_{36})$, and $Si(Z_{37})(Z_{38})$, provided that $Y_{31}$ and $Y_{32}$ are not both single bonds, $Z_{31}$ to $Z_{38}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, —$Si(Q_{41})(Q_{42})(Q_{43})$, —$N(Q_{44})(Q_{45})$;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a carbazolyl group, a benzofuranyl group, a benzothiophenyl group, a dibenzofuranyl group, and a dibenzothiophenyl group, e1 may be an integer selected from 1 to 5, e2 may be an integer selected from 1 to 7, e3 may be an integer selected from 1 to 3, e4 may be an integer selected from 1 to 4, and * and *' may each indicate a binding site to a neighboring atom, wherein $Q_1$ to $Q_5$ and $Q_{41}$ to $Q_{45}$ may each independently be selected from the group consisting of:

a $C_1$-$C_{10}$ alkyl group, a $C_1$-$C_{10}$ alkoxy group;

a phenyl group, a biphenyl group, a terphenyl group, a naphthyl group, a carbazolyl group; and a phenyl group, a biphenyl group, a terphenyl group, a naphthyl group, and a carbazolyl group, each substituted with at least one selected from a $C_1$-$C_{10}$ alkyl group, a $C_1$-$C_{10}$ alkoxy group, a phenyl group, a biphenyl group, a terphenyl group, and a naphthyl group.

c1 to c5 in Formulae 3-1A and 3-2A may each independently be an integer selected from 1 to 3. c1 indicates the number of $Ar_{31}$ groups, and when c1 is 2 or more, the 2 or more $Ar_{31}$ groups may be identical to or different from each other. c2 to c5 may each be the same as described herein in connection with c1 and Formulae 3-1A and 3-2A.

$R_{11}$ to $R_{13}$, $R_{21}$ to $R_{24}$, and $R_{31}$ to $R_{34}$ in Formulae 1-1, 1-2, 2, 3-1, and 3-2 may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{11}$)($Q_{12}$)($Q_{13}$), —N($Q_{14}$)($Q_{15}$), and —B($Q_{16}$)($Q_{17}$), wherein $Q_{11}$ to $Q_{17}$ may each be the same as described above.

For example, in Formulae 1-1, 1-2, 2, 3-1, and 3-2, $R_{11}$ to $R_{13}$ and $R_{21}$ to $R_{24}$ may each independently be selected from the group consisting of:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, an indolyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, a benzocarbazolyl group, a dibenzocarbazolyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, an indolyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, a benzocarbazolyl group, and a dibenzocarbazolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, and a naphthyl group; and —Si($Q_{11}$)($Q_{12}$)($Q_{13}$) and —N($Q_{14}$)($Q_{15}$), and $R_{31}$ to $R_{34}$ may each independently be selected from the group consisting of:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group;

a phenyl group, a biphenyl group, a terphenyl group, a fluorenyl group, a phenanthrenyl group, an anthracenyl group, a triphenylenyl group, a pyrenyl group, a chrysenyl group, a naphthacenyl group, a carbazolyl group, a benzofuranyl group, a benzothiophenyl group, a dibenzofuranyl group, a dibenzothiophenyl group, a benzocarbazolyl group, a dibenzocarbazolyl group, a dibenzosilolyl group; and a phenyl group, a biphenyl group, a terphenyl group, a fluorenyl group, a phenanthrenyl group, an anthracenyl group, a triphenylenyl group, a pyrenyl group, a chrysenyl group, a naphthacenyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a biphenyl group, a terphenyl group, and a naphthyl group, wherein $Q_{11}$ to $Q_{15}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, in Formulae 1-1, 1-2, 2, 3-1, and 3-2, $R_{11}$ to $R_{13}$ and $R_{21}$ to $R_{24}$ may each independently be selected from the group consisting of:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group;

a phenyl group, a biphenyl group, a terphenyl group, a naphthyl group, a fluorenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, a benzocarbazolyl group, a dibenzocarbazolyl group;

a phenyl group, a biphenyl group, a terphenyl group, a naphthyl group, a fluorenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, a benzocarbazolyl group, and a dibenzocarbazolyl group, each substituted with at least one selected from deuterium, $C_1$-$C_{20}$ alkyl group, a $C_1$-$C_{20}$ alkoxy group, a phenyl group, a biphenyl group, a terphenyl group, and a naphthyl group; and —Si($Q_{11}$)($Q_{12}$)($Q_{13}$) and —N($Q_{14}$)($Q_{15}$), and $R_{31}$ to $R_{34}$ may each independently be selected from the group consisting of:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group;

a phenyl group, a biphenyl group, a terphenyl group, a fluorenyl group, a phenanthrenyl group, an anthracenyl group, a triphenylenyl group, a pyrenyl group, a chrysenyl group, a naphthacenyl group, a carbazolyl group, a benzofuranyl group, a benzothiophenyl group, a dibenzofuranyl group, a dibenzothiophenyl group, a benzocarbazolyl group, a dibenzocarbazolyl group, a dibenzosilolyl group; and a phenyl group, a biphenyl group, a terphenyl group, a fluorenyl group, a phenanthrenyl group, an anthracenyl group, a triphenylenyl group, a pyrenyl group, a chrysenyl group, a naphthacenyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group, each substituted with at least one selected from deuterium, $C_1$-$C_{10}$ alkyl group, a $C_1$-$C_{10}$ alkoxy group, a phenyl group, a biphenyl group, a terphenyl group, and a naphthyl group, wherein $Q_{11}$ to $Q_{15}$ may each independently be selected from a $C_1$-$C_{10}$ alkyl group, a $C_1$-$C_{10}$ alkoxy group, a phenyl group, a biphenyl group, a terphenyl group, and a naphthyl group.

b11 to b13, b21 to b24, and b31 to b34 in Formulae 1-1, 1-2, 2, 3-1, and 3-2 may each independently be an integer selected from 0 to 8. b11 indicates the number of $R_{11}$ groups, and when b11 is 2 or more, the 2 or more $R_{11}$ groups may be identical to or different from each other. b12, b13, b21 to b24, and b31 to b34 may each be the same as described herein in connection with b11 and Formulae 1-1, 1-2, 2, 3-1, and 3-2.

For example, b11 to b13, b21 to b24, and b31 to b34 in Formulae 1-1, 1-2, 2, 3-1, and 3-2 may each independently be an integer selected from 0 to 6.

In one or more embodiments, the first compound may be represented by one selected from Formulae 1-11 to 1-15 and 1-21 to 1-23, but embodiments of the present disclosure are not limited thereto:

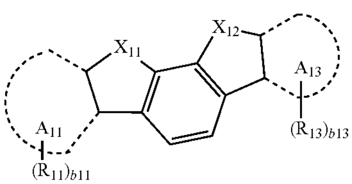

1-11

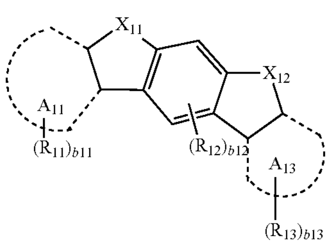

1-12

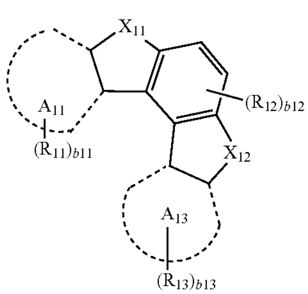

1-13

-continued

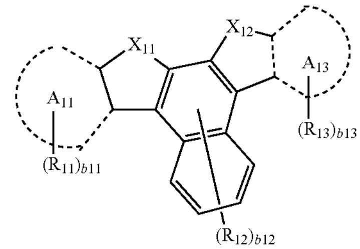

1-14

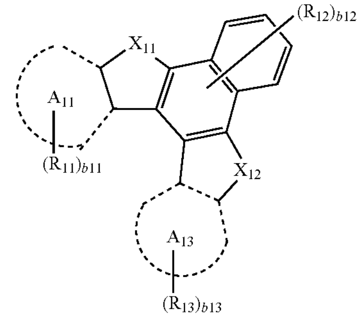

1-15

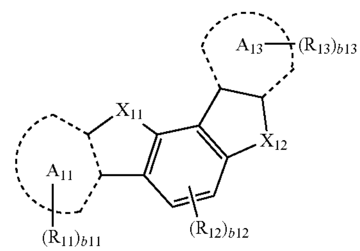

1-21

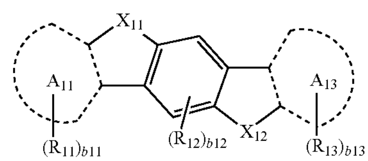

1-22

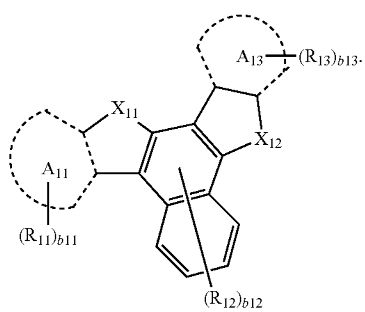

1-23

In Formulae 1-11 to 1-15 and 1-21 to 1-23, $A_{11}$, $A_{13}$, $X_{11}$, $X_{12}$, $R_{11}$ to $R_{13}$, and b11 to b13 may each be the same as described above.

For example, $A_{11}$ and $A_{13}$ in Formulae 1-11 to 1-15 and 1-21 to 1-23 may each independently be selected from a benzene, a naphthalene, an anthracene, and a pyridine.

For example, b12 in Formulae 1-11 to 1-13, 1-21, and 1-22 may be an integer selected from 0 to 2, and b12 in Formulae 1-14, 1-15, and 1-23 may be an integer selected from 0 to 4.

In one or more embodiments, the second compound may be represented by Formula 2-1, but embodiments of the present disclosure are not limited thereto:

Formula 2-1

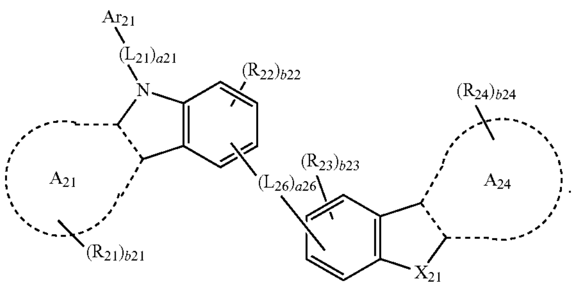

In Formula 2-1, $A_{21}$, $A_{24}$, $X_{21}$, $L_{21}$, $L_{26}$, a21, a26, $Ar_{21}$, $R_{21}$ to $R_{24}$, b21, and b24 may each be the same as described above, and b22 and b23 may each be an integer selected from 0 to 3.

In one or more embodiments, the second compound may be represented by one selected from Formulae 2-11 to 2-15:

Formula 2-11

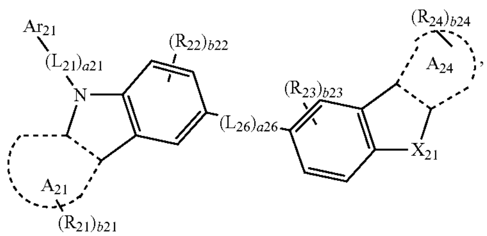

Formula 2-12

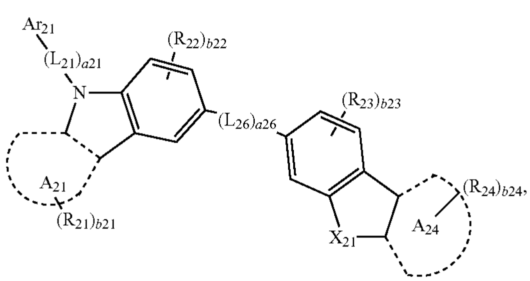

Formula 2-13

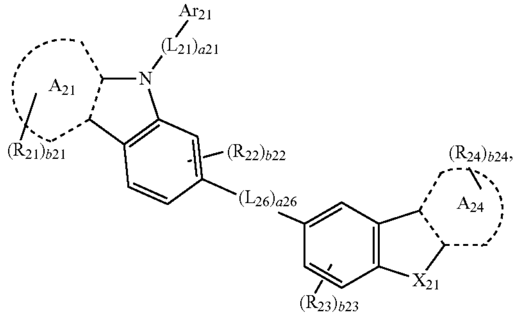

-continued

Formula 2-14

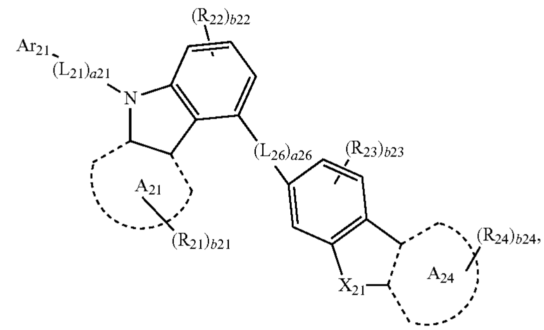

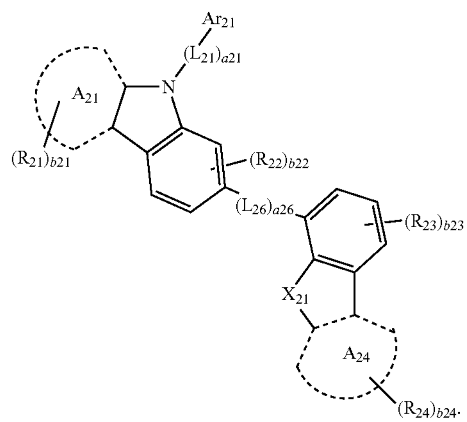

In Formulae 2-11 to 2-15, $X_{21}$, $L_{21}$, $L_{26}$, a21, a26, $Ar_{21}$, $R_{21}$ to $R_{24}$ and b21, and b24 may each be the same as described above, and b22 and b23 may each independently be an integer selected from 0 to 3.

In Formulae 2-11 to 2-15, $A_{21}$ and $A_{24}$ may each independently be selected from a benzene, a naphthalene, a pyridine, a cinnoline, and a naphthyridine.

In one or more embodiments, the third compound may be represented by one selected from Formulae 3A to 3C:

Formula 3A

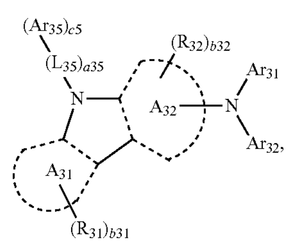

-continued
Formula 3B
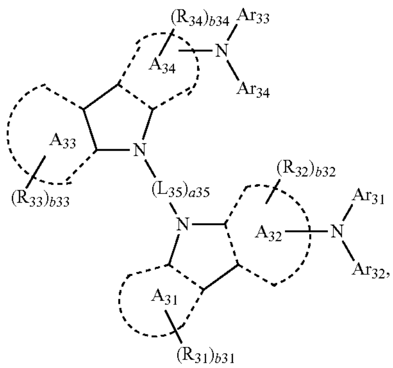
Formula 3C
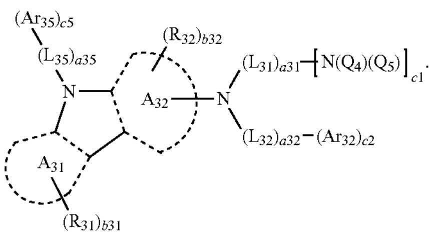
In Formulae 3A to 3C,
$A_{31}$ to $A_{34}$, $L_{31}$, $L_{32}$, $L_{35}$, a31, a32, a35, $Ar_{31}$ to $Ar_{35}$, c1, c2, c5, $R_{31}$ to $R_{34}$, b31 to b34, $Q_4$, and $Q_5$ may each be the same as described above.
In one or more embodiments, the third compound may be represented by one selected from Formulae 3A(1), 3A(2), 3B(1) to 3B(3), and 3C(1):
Formula 3A(1)
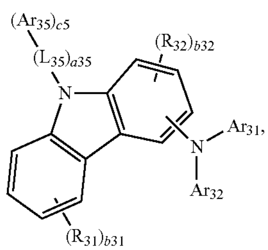
Formula 3A(2)
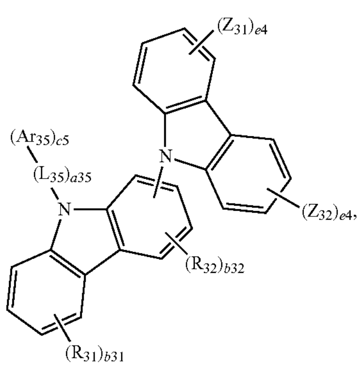
-continued
Formula 3B(1)
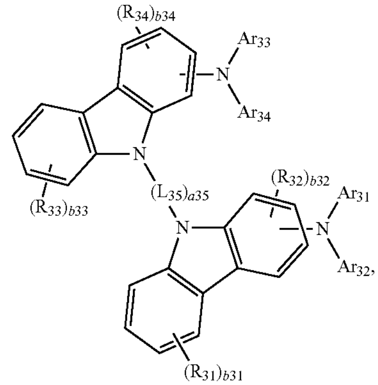
Formula 3B(2)
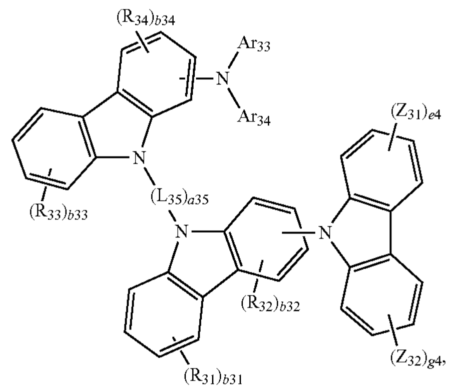
Formula 3B(3)
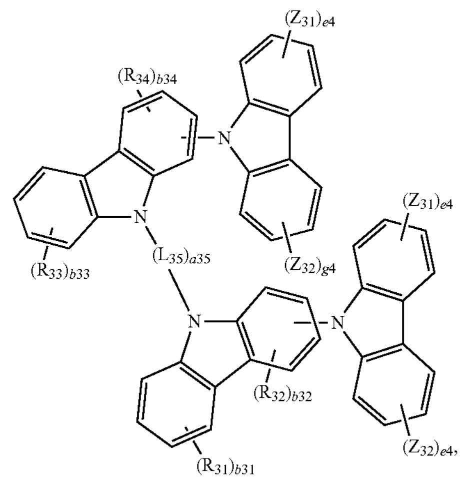
Formula 3C(1)
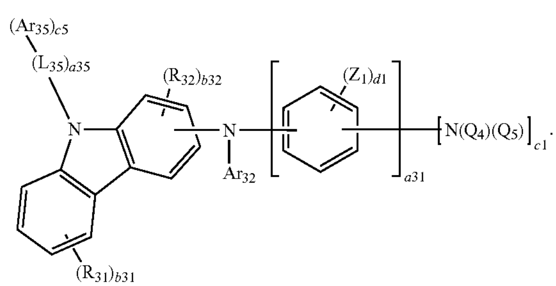

In Formulae 3A(1), 3A(2), 3B(1) to 3B(3), and 3C(1), $L_{35}$, a31, a35, $Ar_{31}$ to $Ar_{35}$, c1, c5, $R_{31}$ to $R_{34}$, $Q_4$, and $Q_5$ may each be the same as described above, b31 and b33 may each independently be an integer selected from 0 to 4; b32 and b34 may each independently be an integer selected from 0 to 3, $Z_1$ may be selected from hydrogen and —N($Q_{44}$)($Q_{45}$), $Q_{44}$, and $Q_{45}$ may each be the same as described above, d1 may be an integer selected from 0 to 4, $Z_{31}$ to $Z_{34}$ may each independently be selected from the group consisting of:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group; and a phenyl group, a biphenyl group, a terphenyl group, a naphthyl group, and a carbazolyl group, and e4 may be an integer selected from 0 to 4.

In one or more embodiments, the first compound may be selected from Compounds 100 to 272 and 301 to 374, the second compound may be selected from Compounds 101A to 212A and 101B to 230B, and the third compound may be selected from Compounds A1 to A27, B1 to B25, C1 to C16, D1 to D9, E1 to E10, and F1 to F32, but embodiments of the present disclosure are not limited thereto:

100

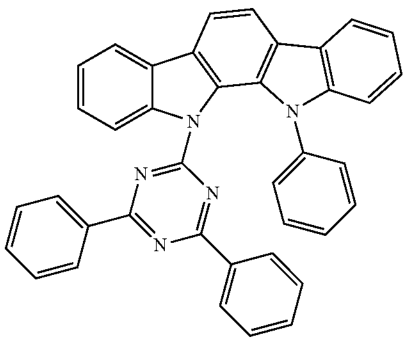

101

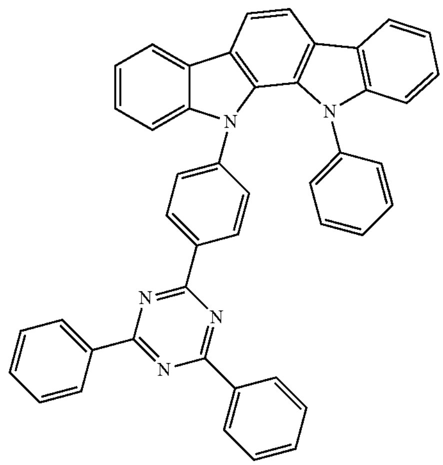

102

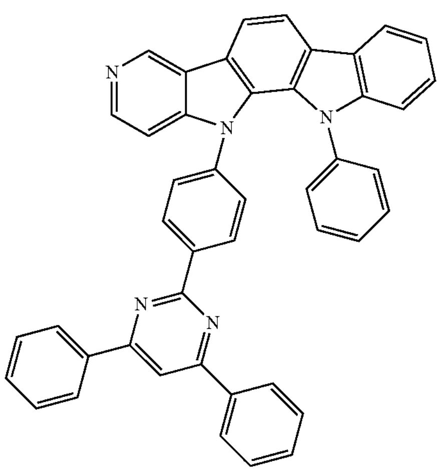

103

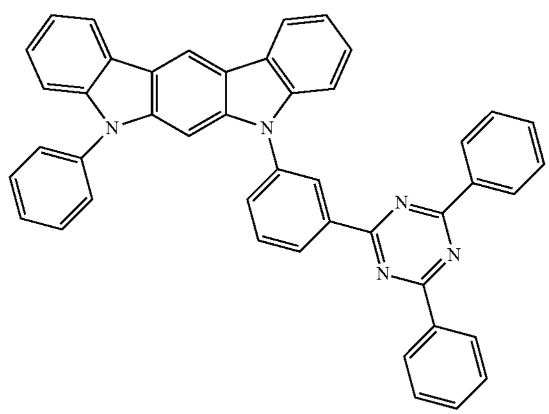

-continued
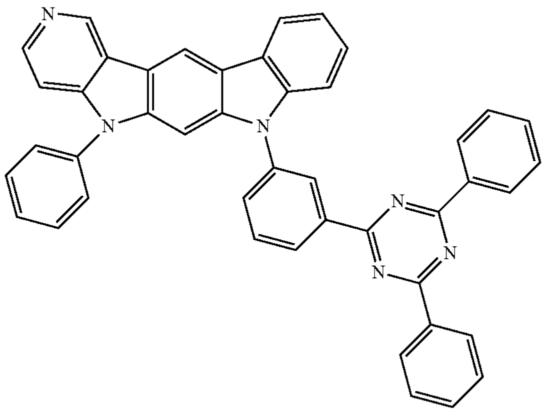
104
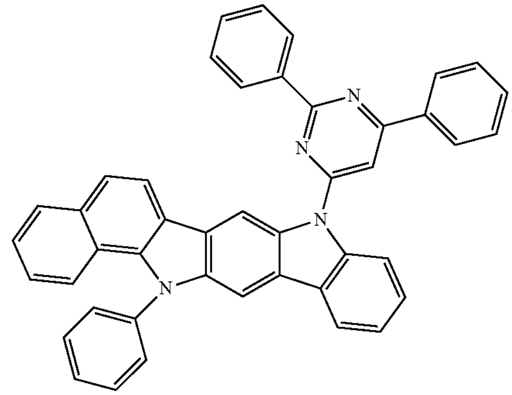
105
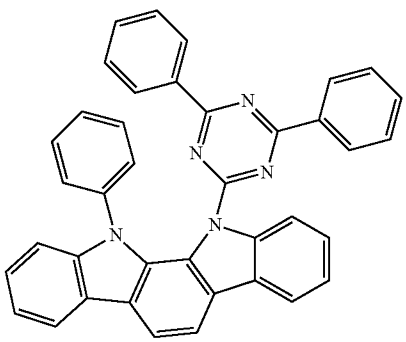
107
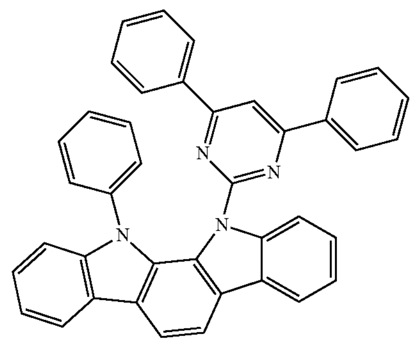
108
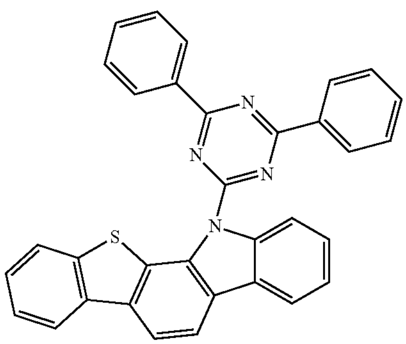
109
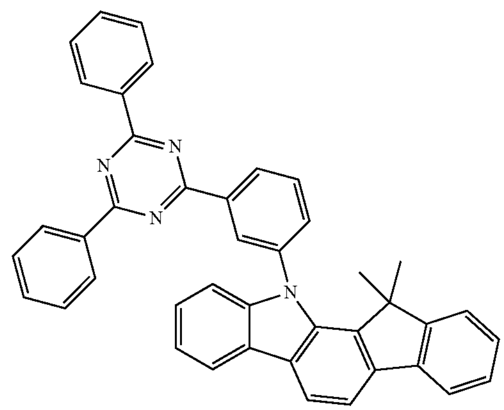
110
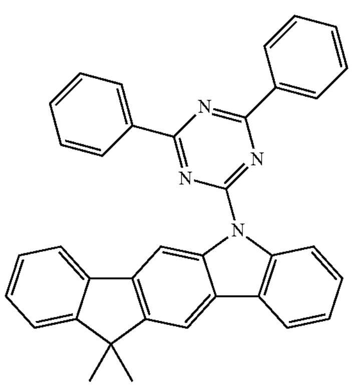
111
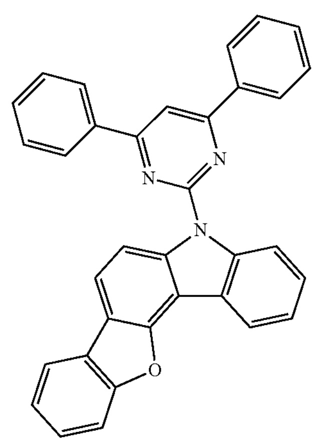
112

-continued
113
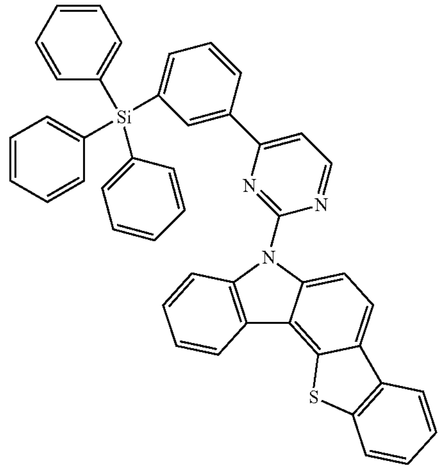
114
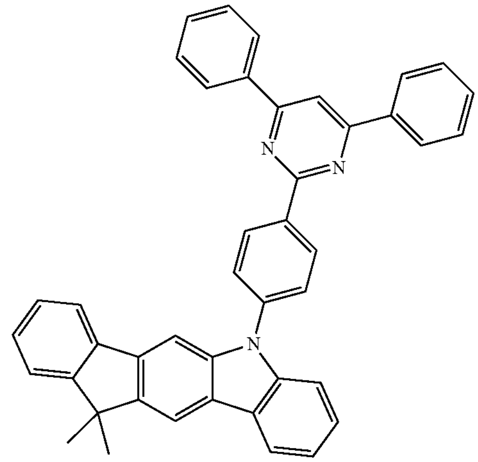
115
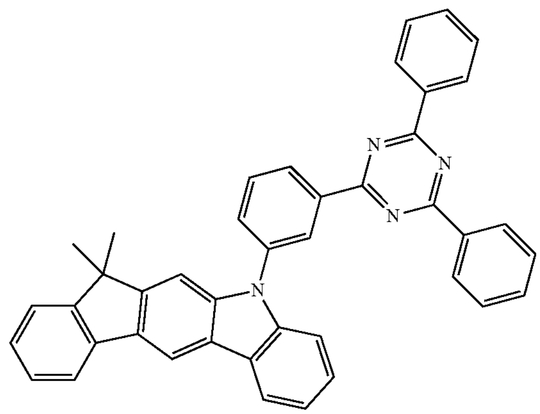
116
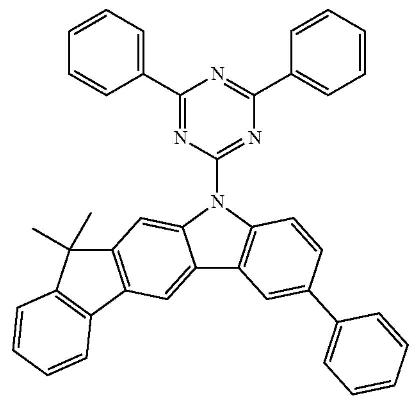
117
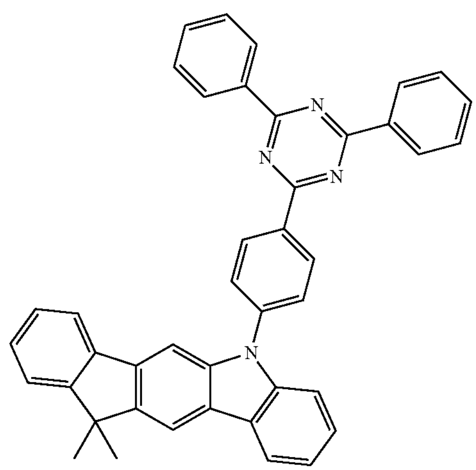
118
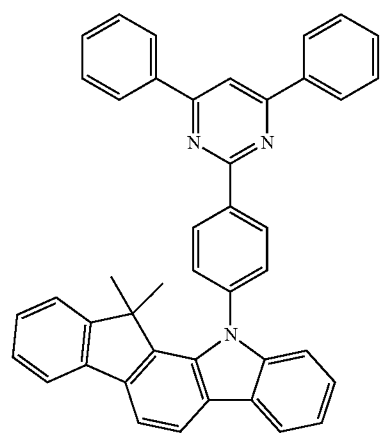

-continued
119
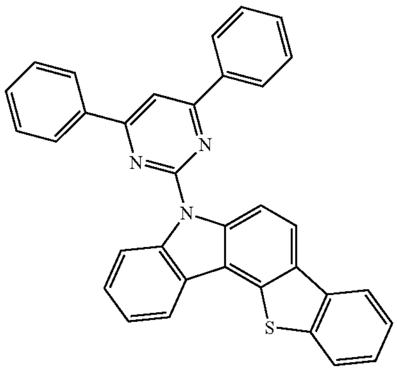
120
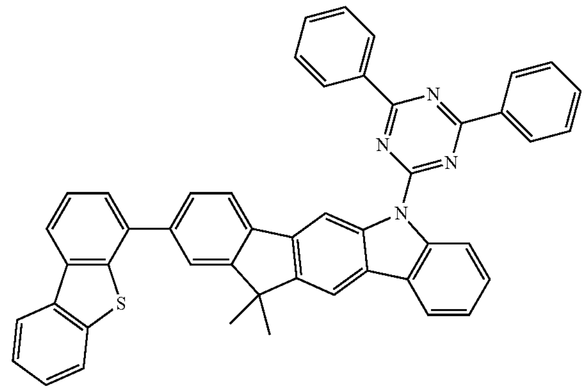
121
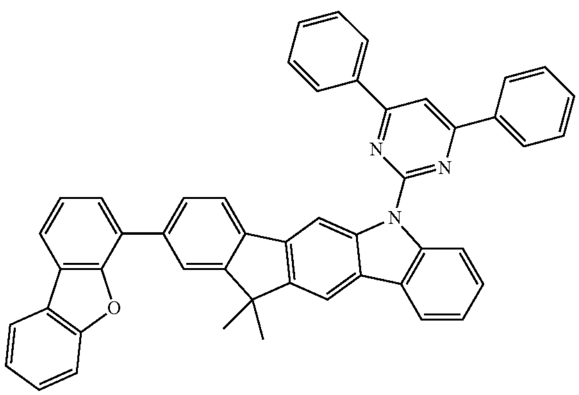
122
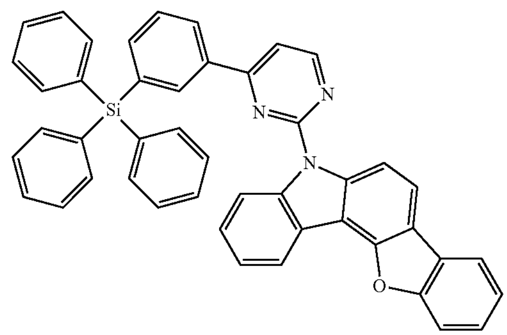
125
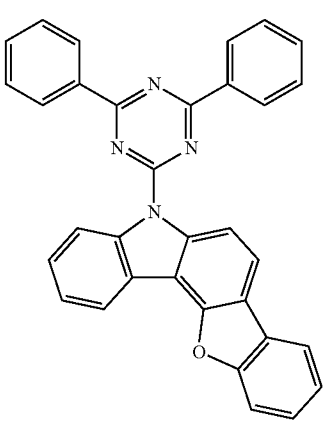
126
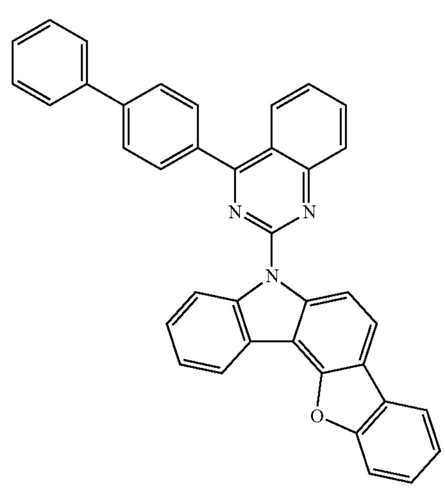

-continued
127
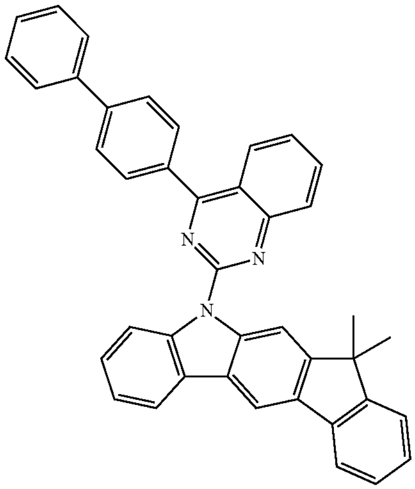
128
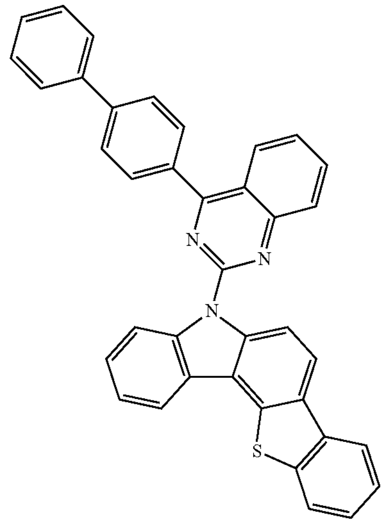
129
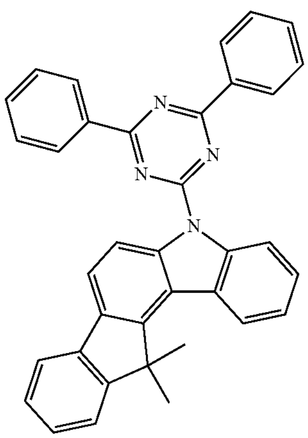
130
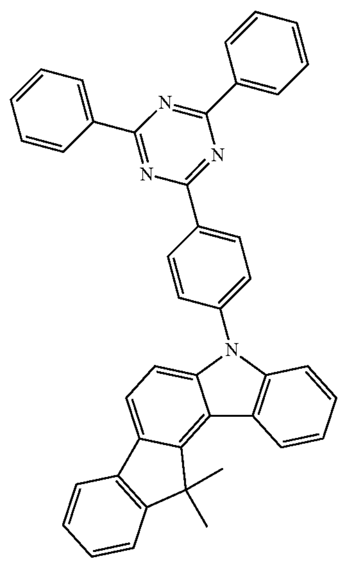
131
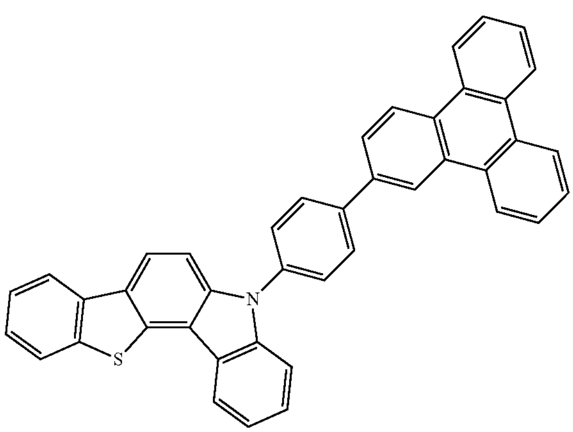
132
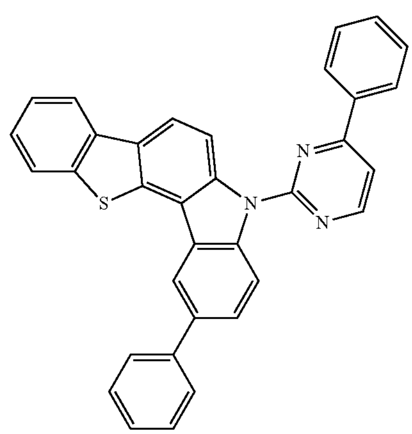

-continued
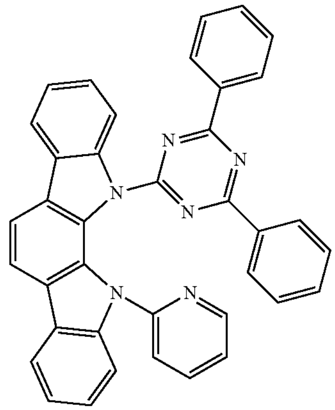
133
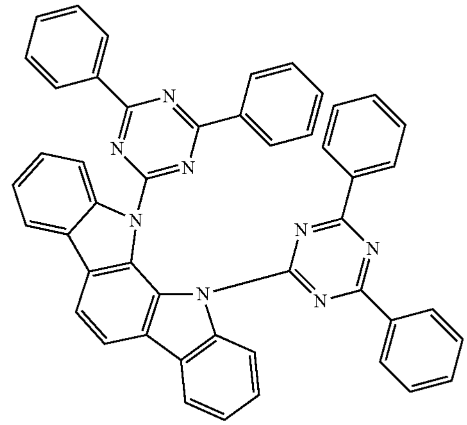
134
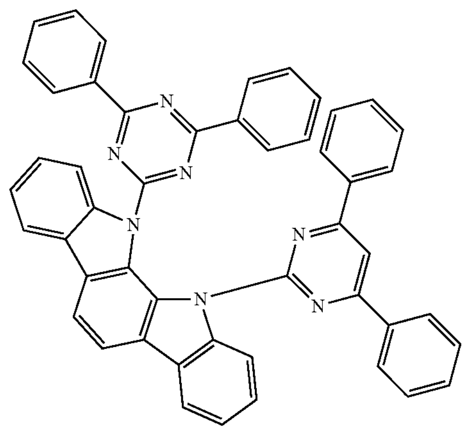
135
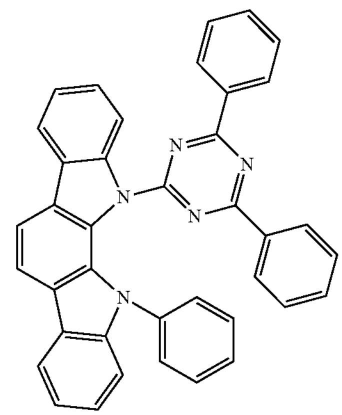
136
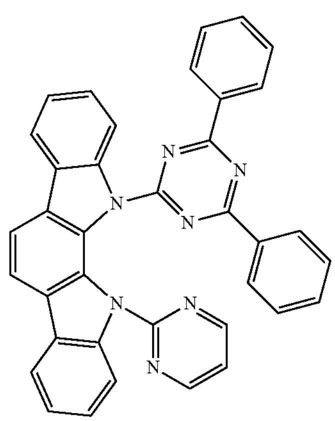
137
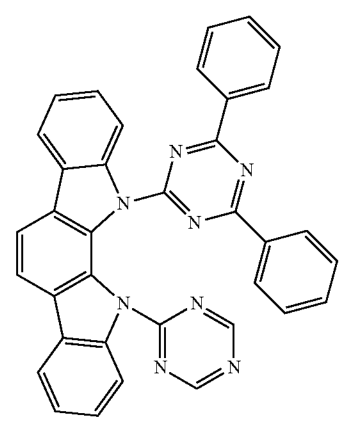
138

-continued
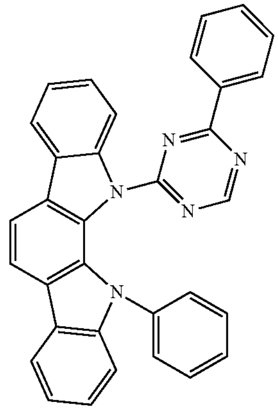
139
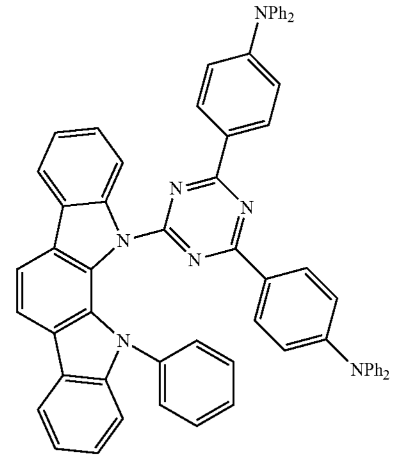
140
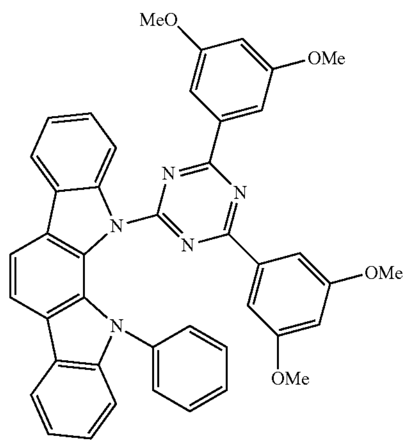
141
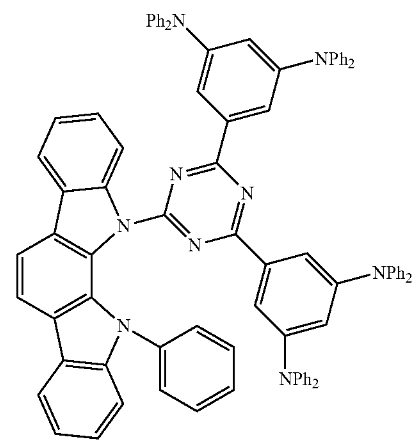
142
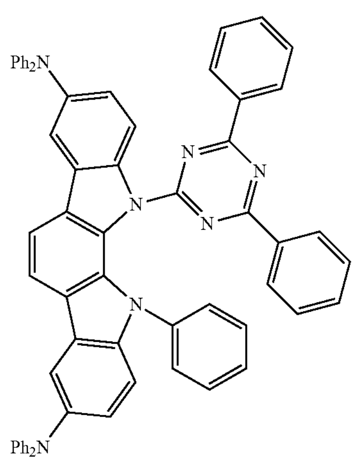
143
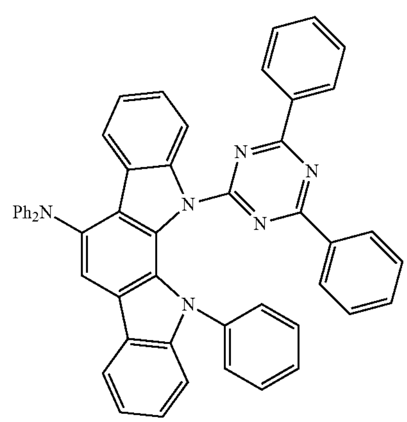
144

-continued
145
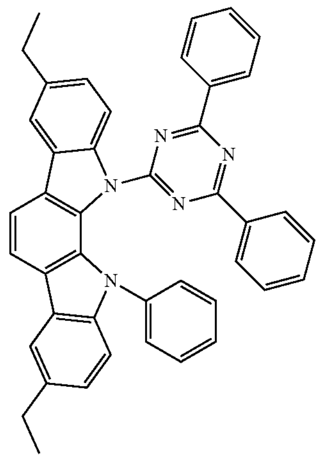
146
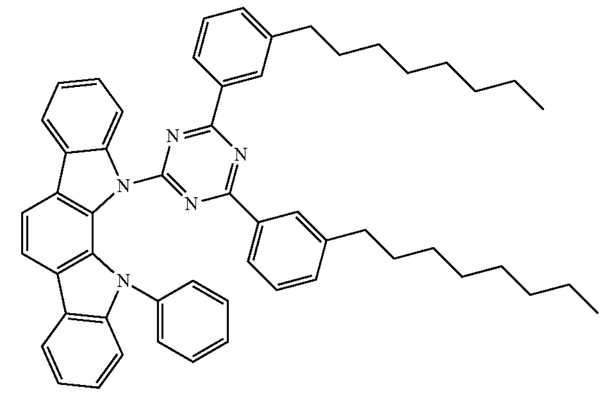
147
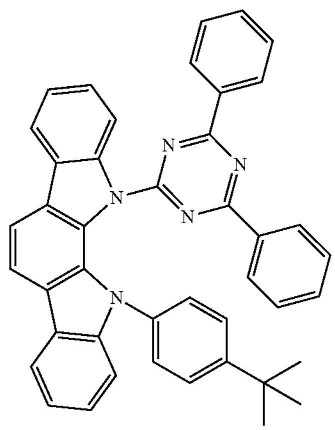
148
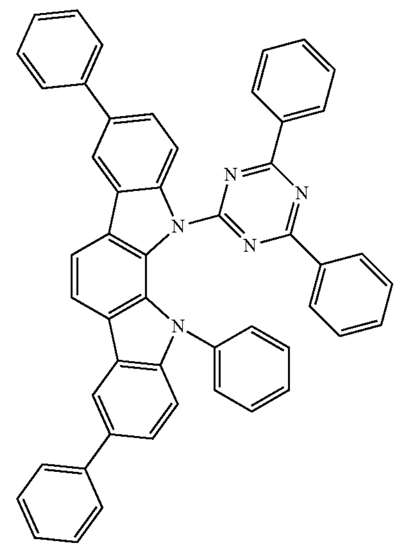
149
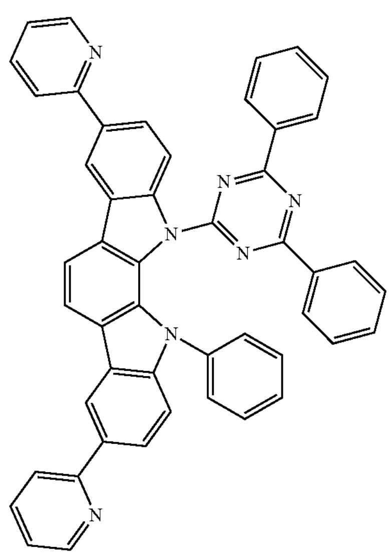
150
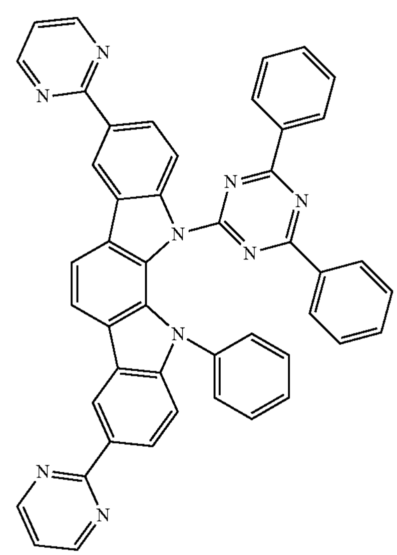

-continued
151
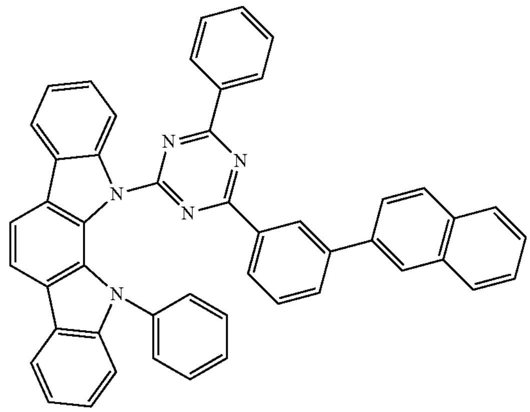
152
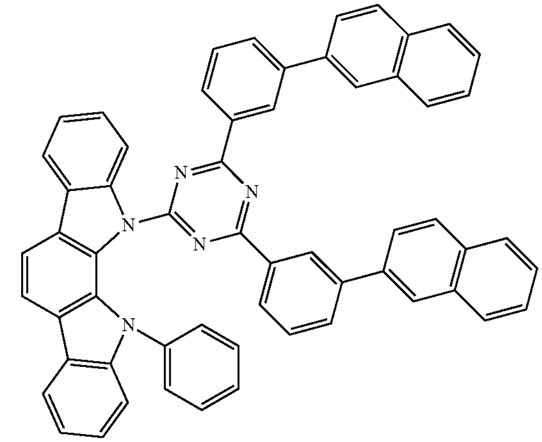
153
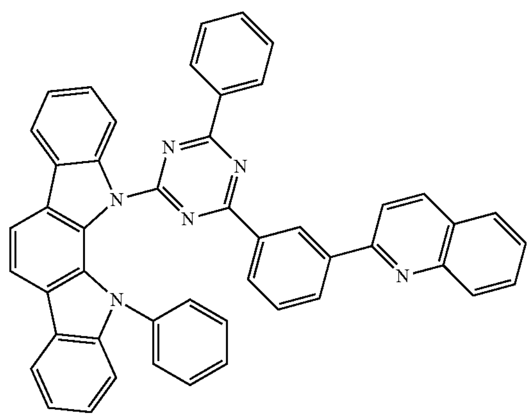
154
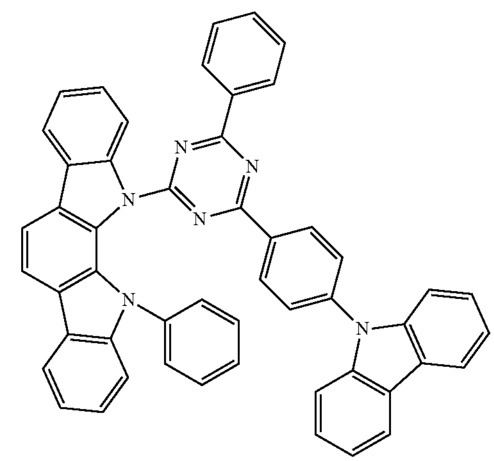
155
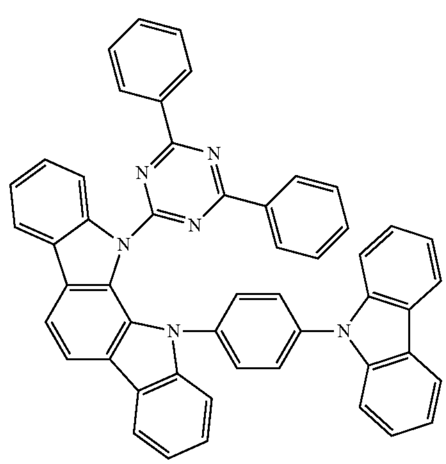
156
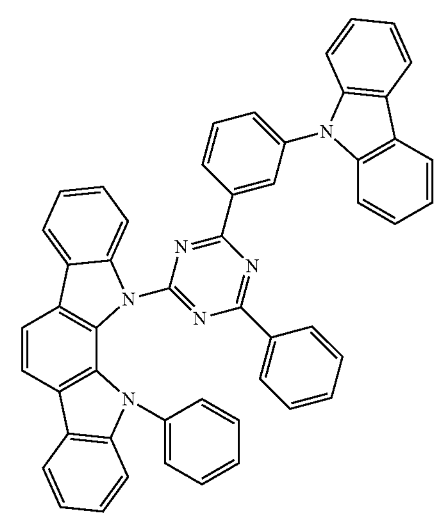

-continued
157
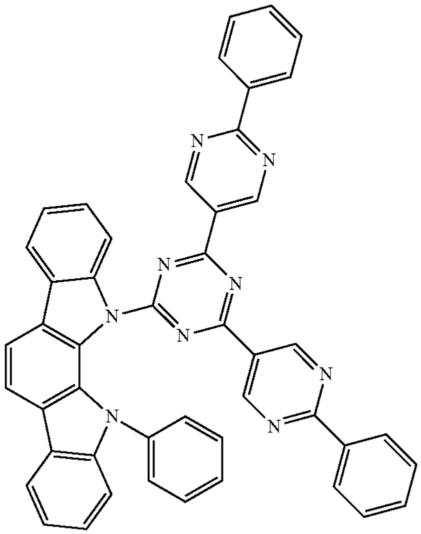
158
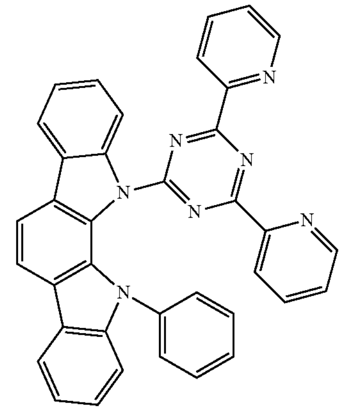
159
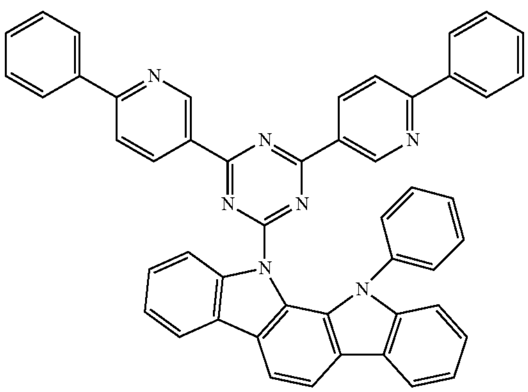
160
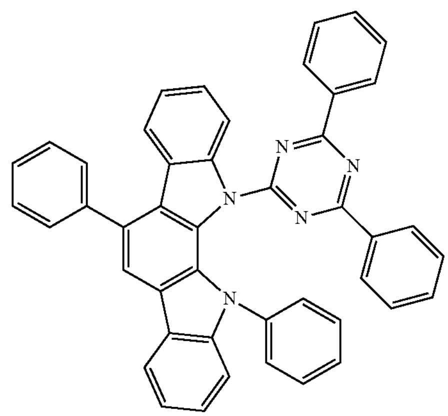
161
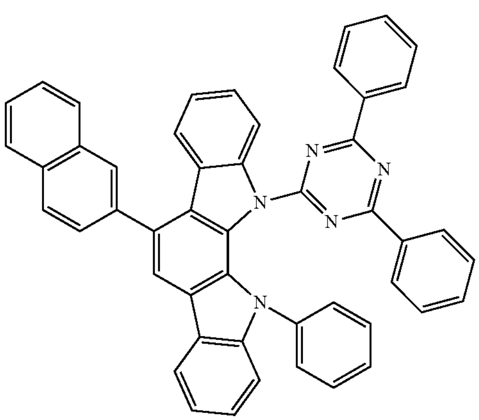
162
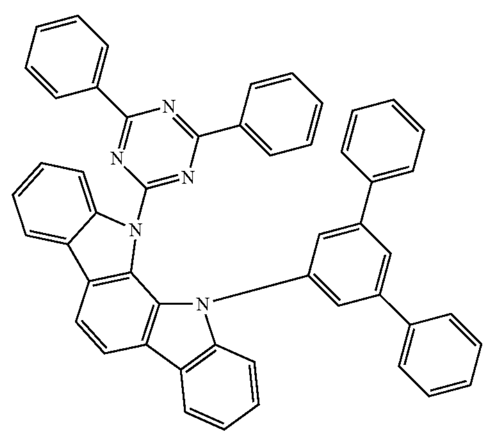

-continued
163
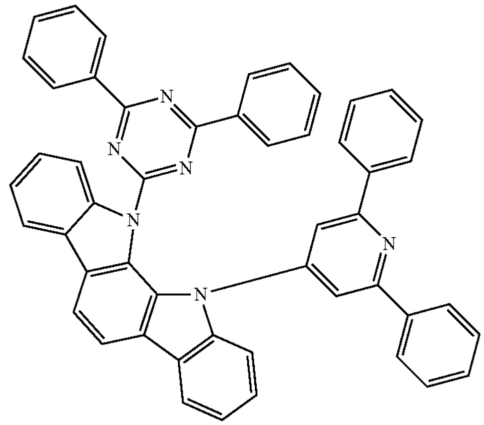
164
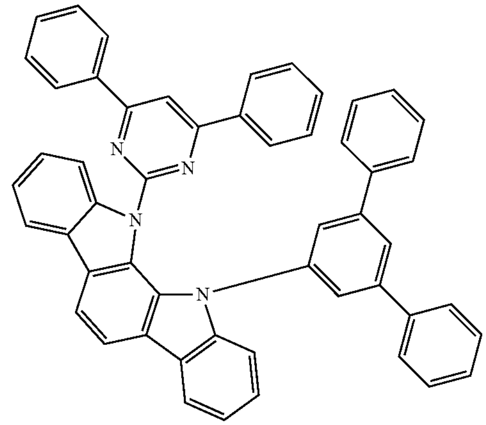
165
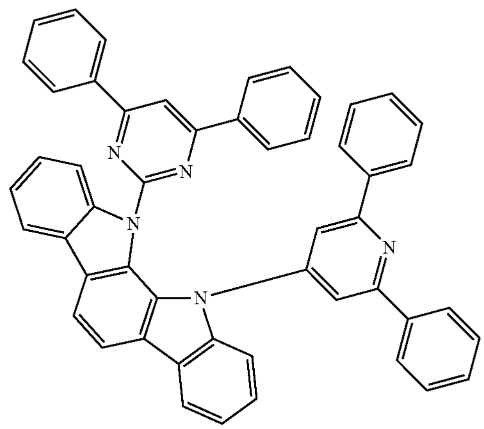
166
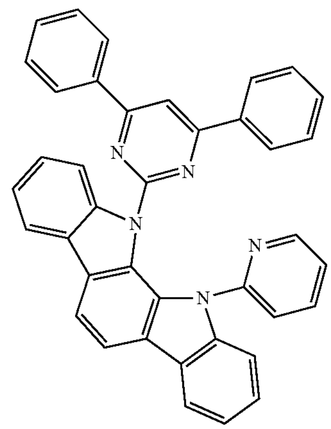
167
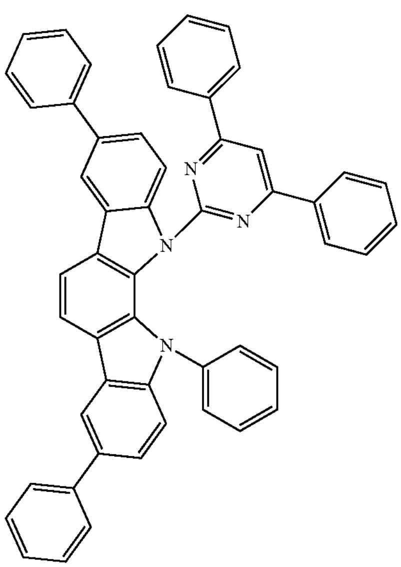
168
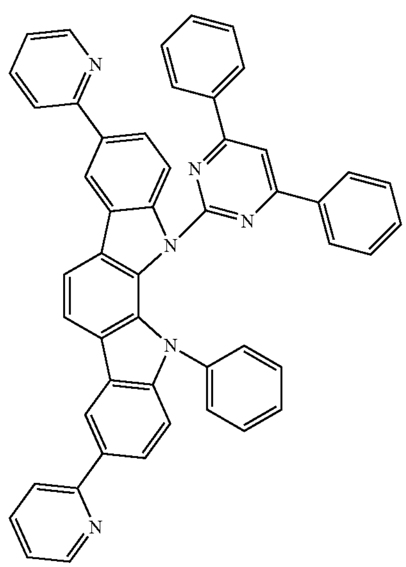

-continued
169
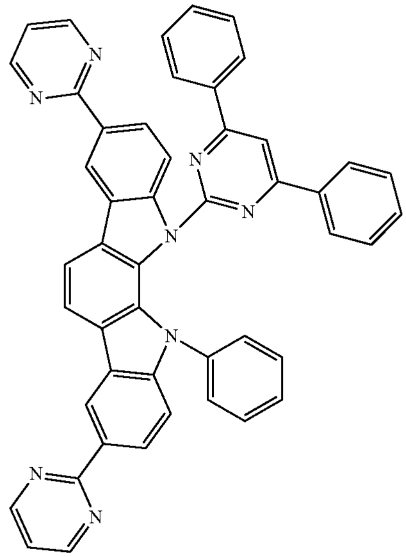
170
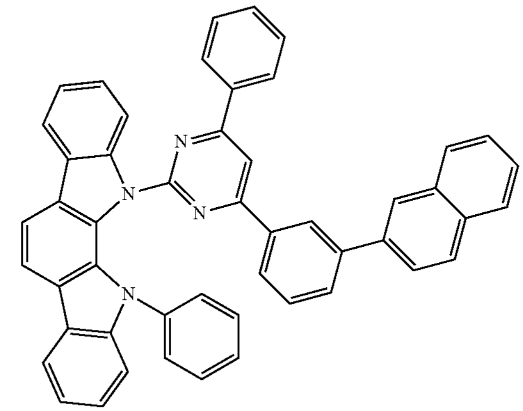
171
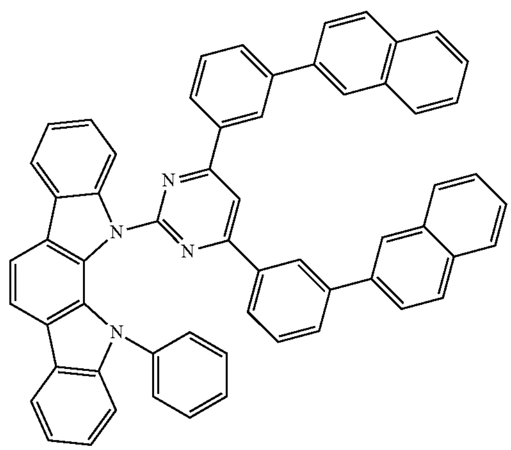
172
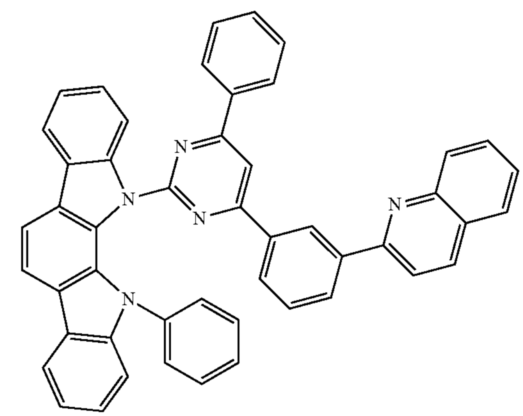
173
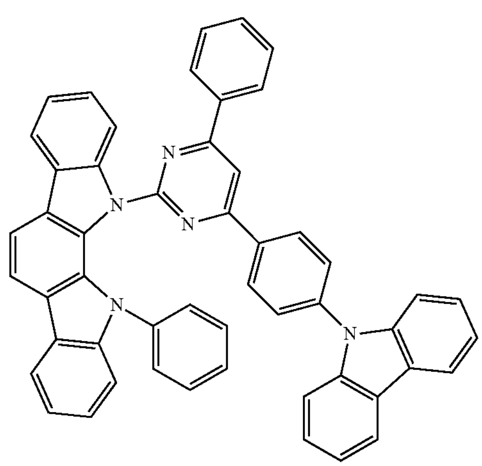
174
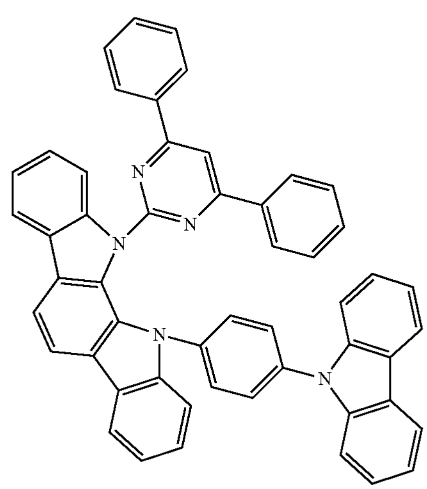

-continued
175
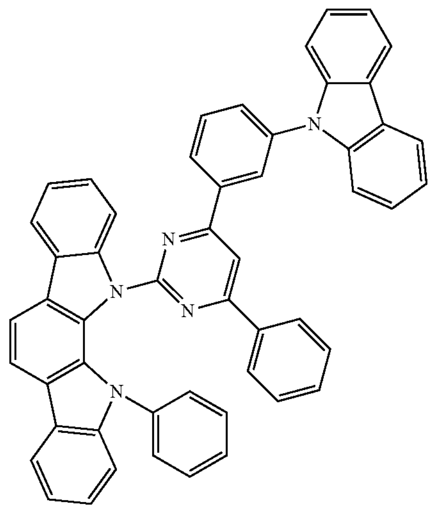
176
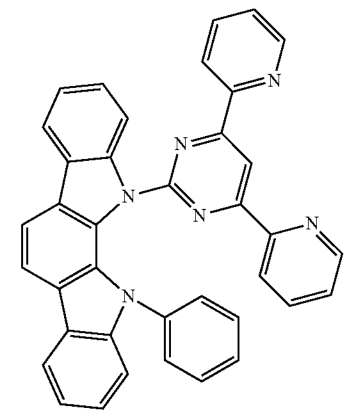
177
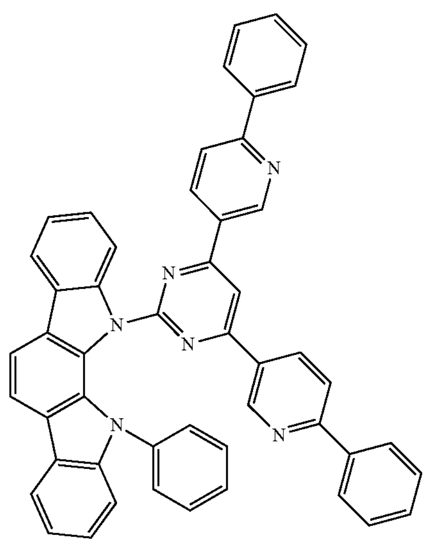
178
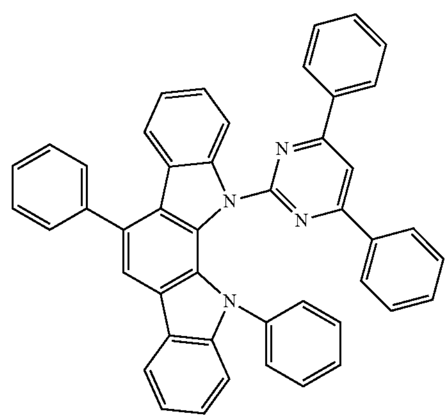
179
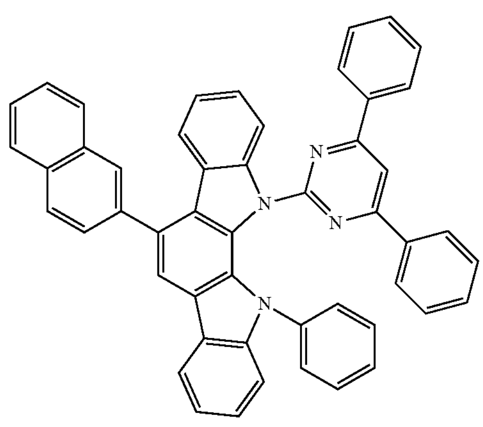
180
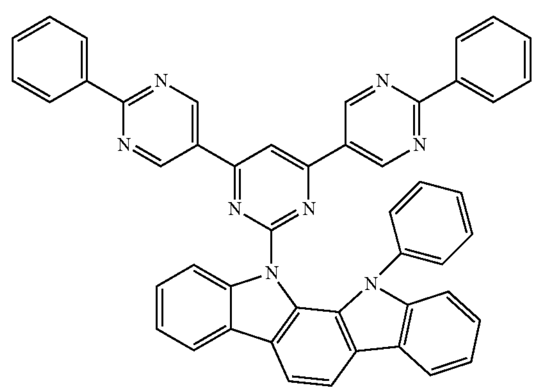

-continued
181
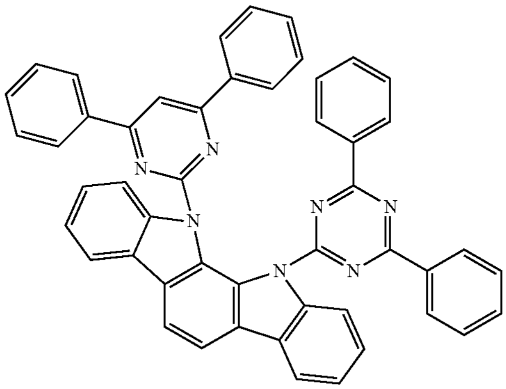
182
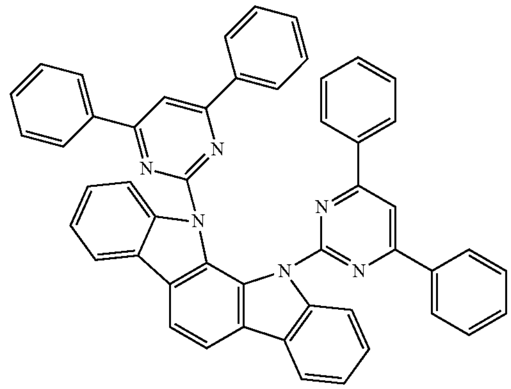
183
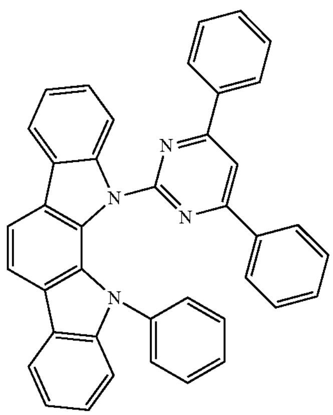
184
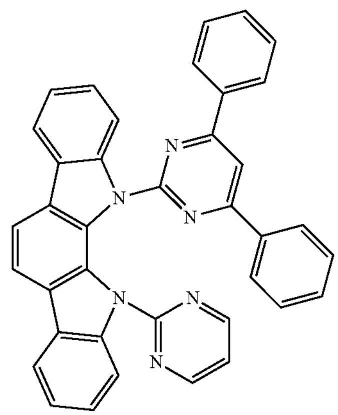
185
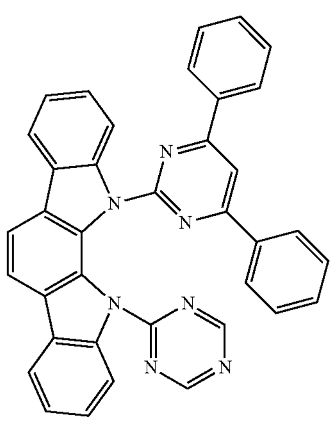
186
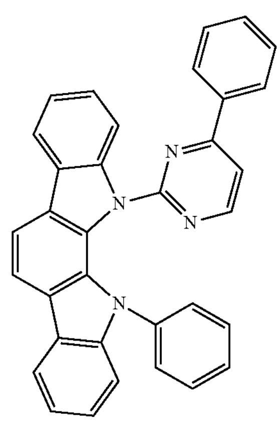

-continued
187
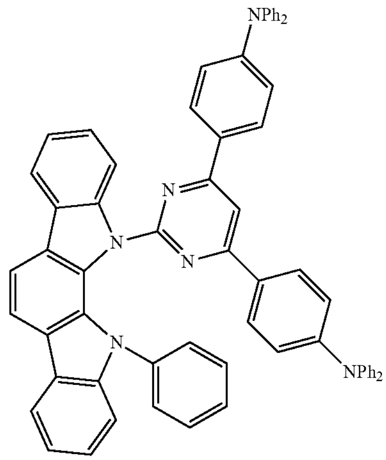
188
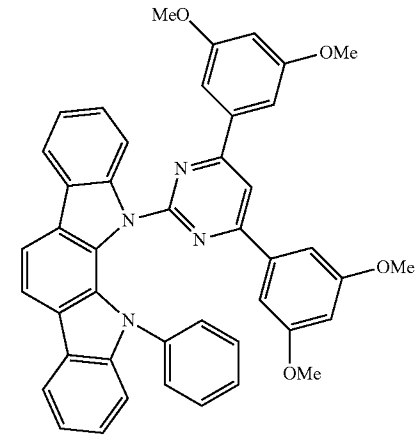
189
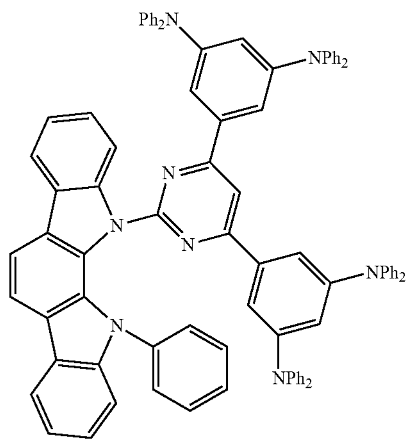
190
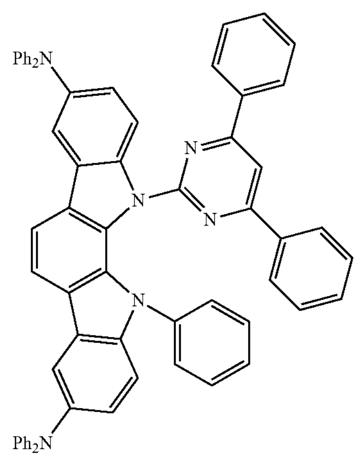
191
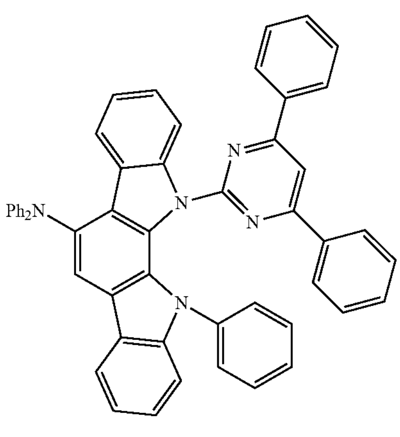
192
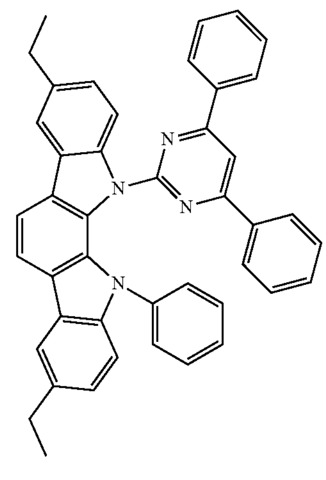

-continued
193
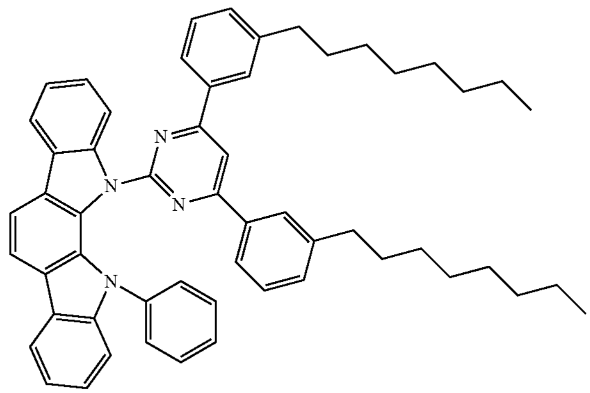
194
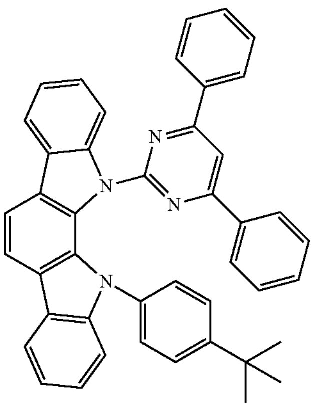
195
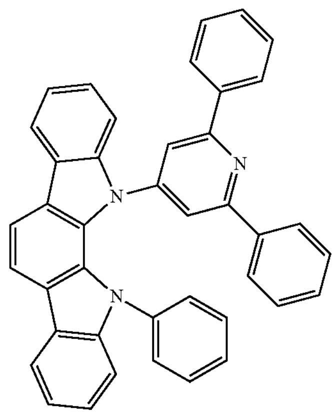
196
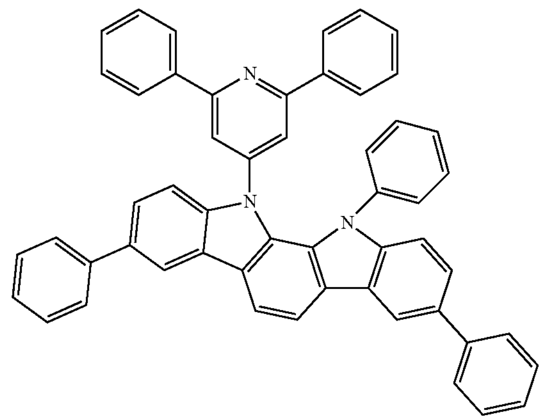
197
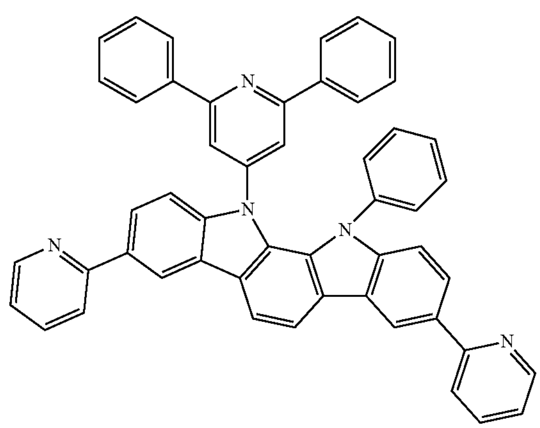
198
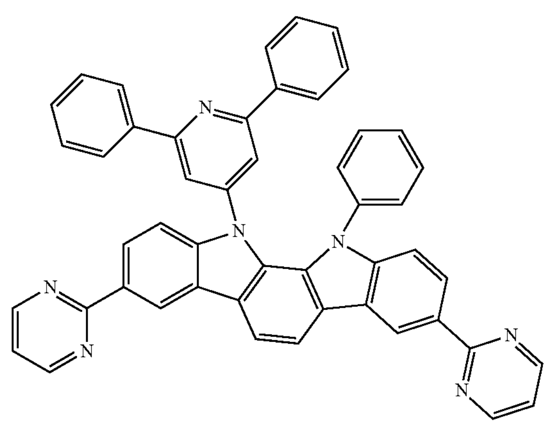

-continued
199
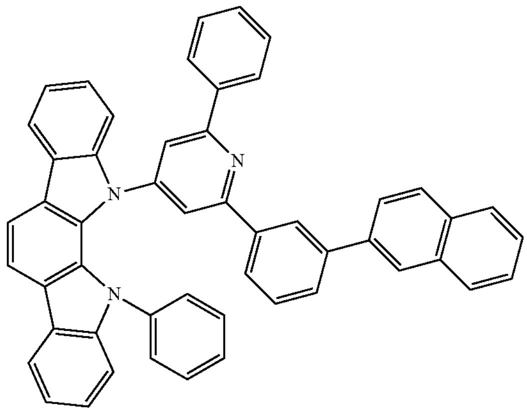
200
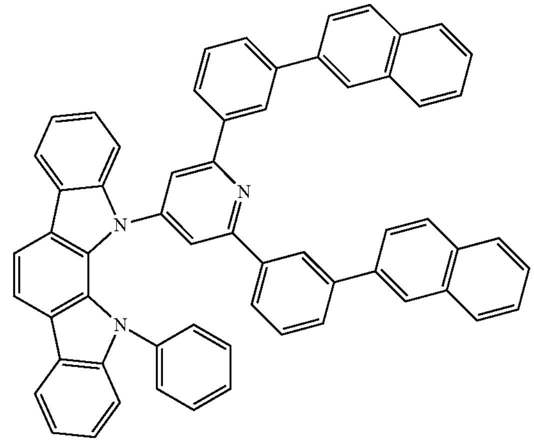
201
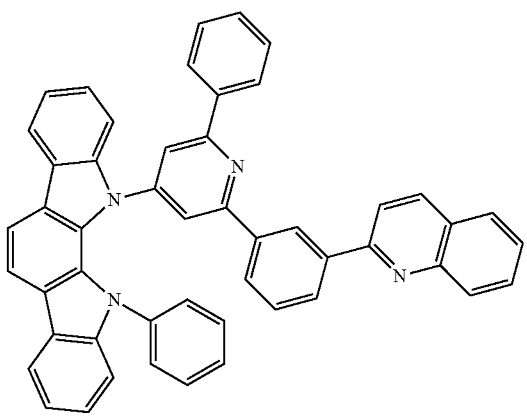
202
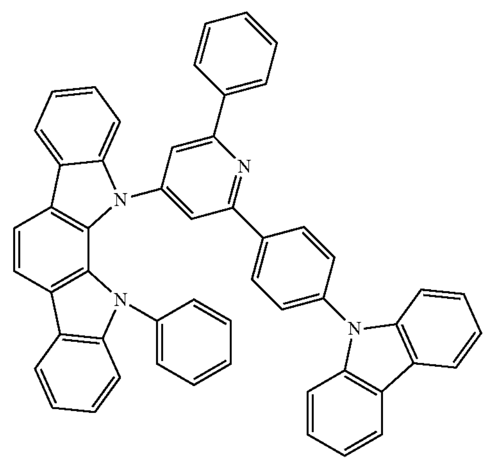
203
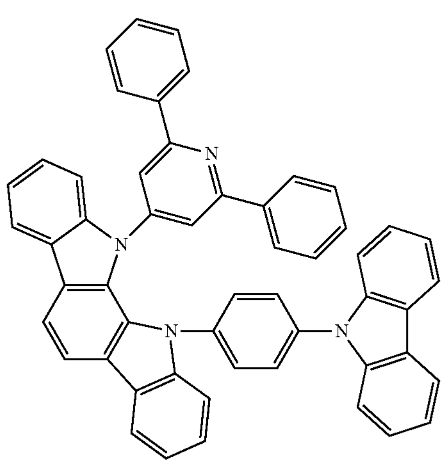
204
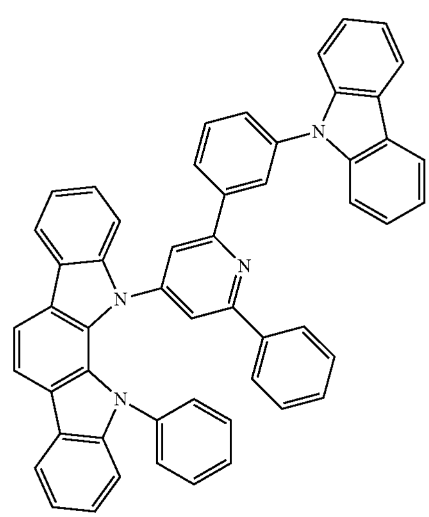

-continued
205
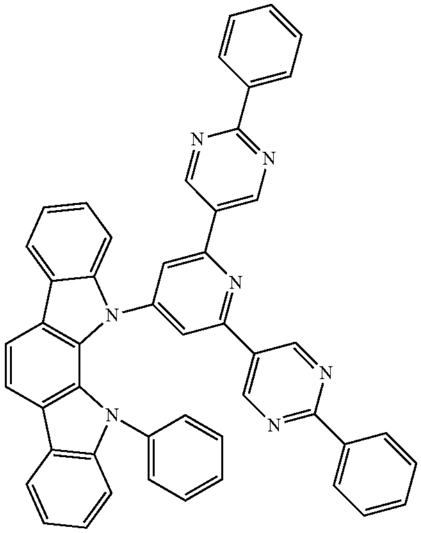
206
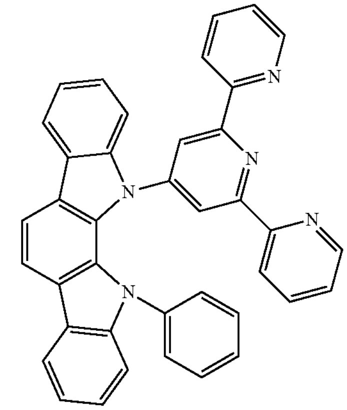
207
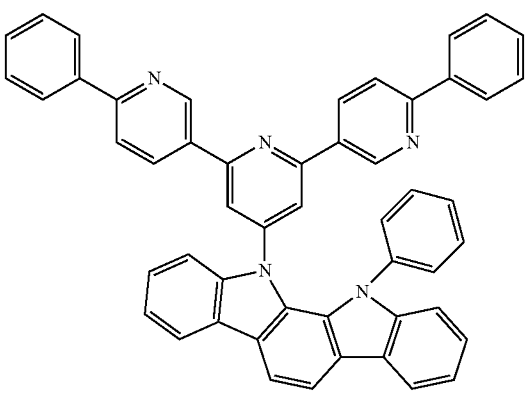
208
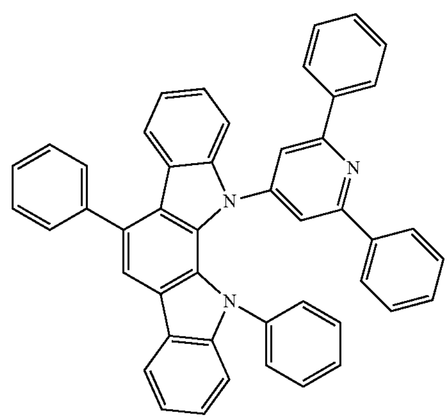
209
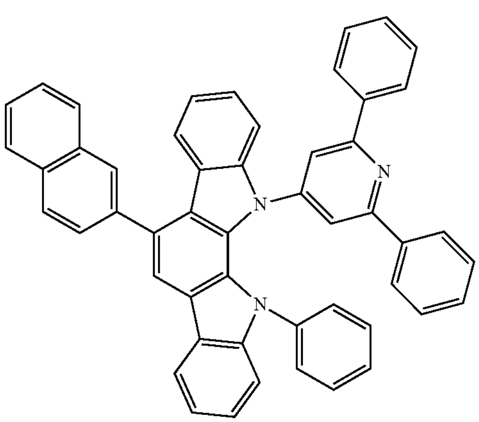
210
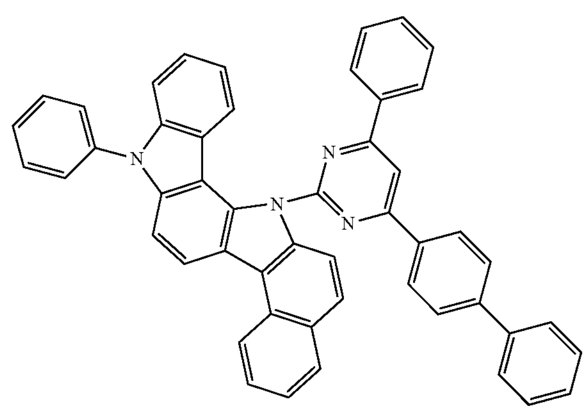

-continued
211
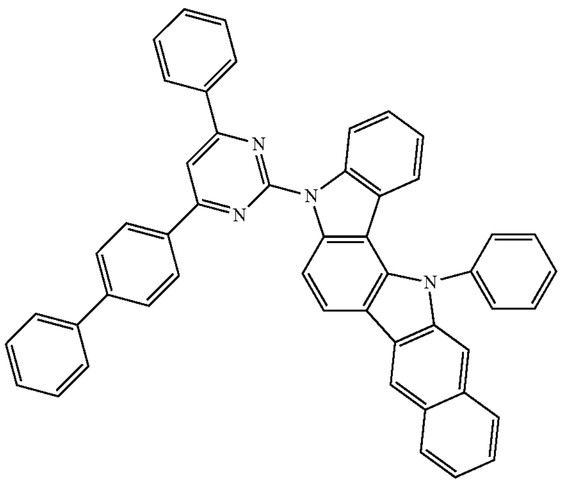
212
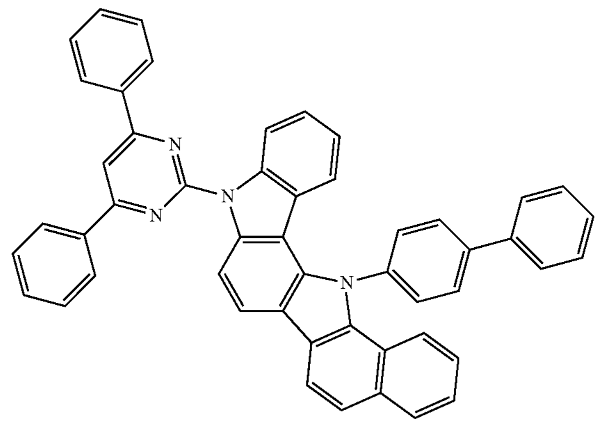
213
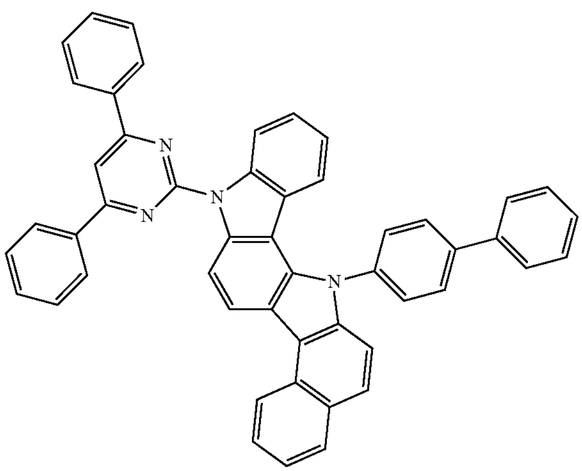
214
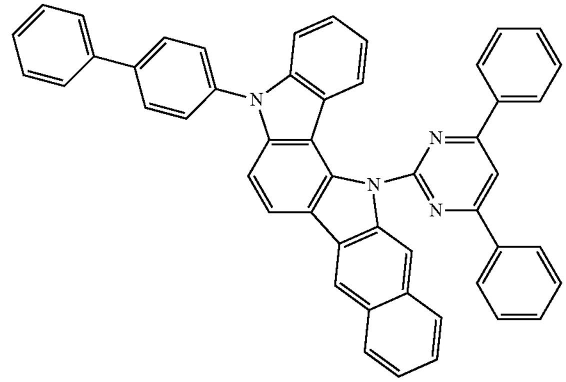
215
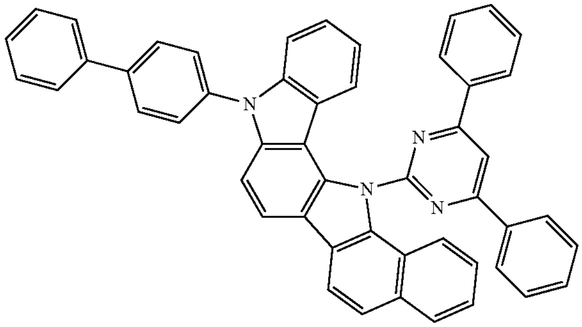
216
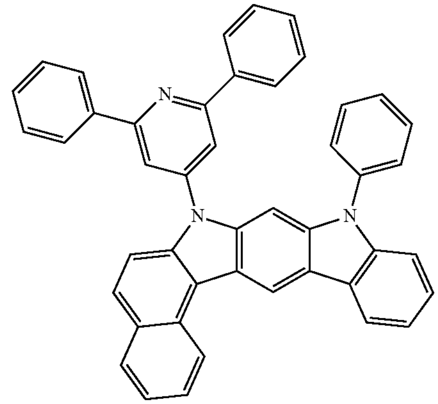

-continued
217
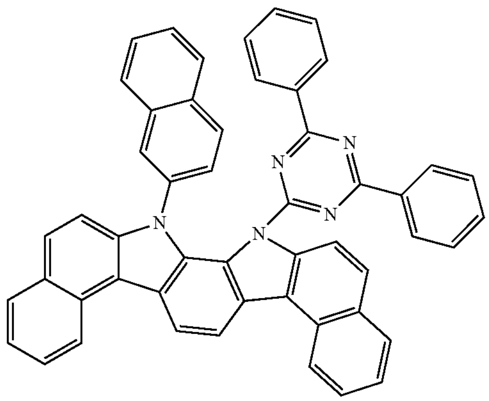
218
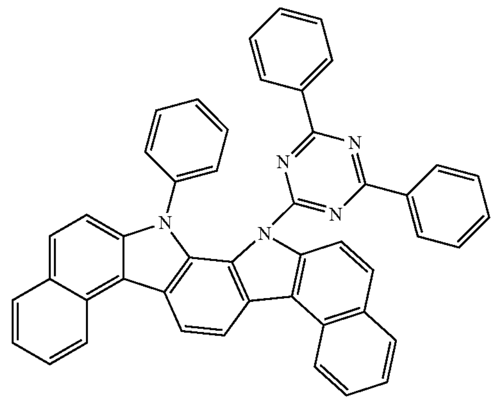
219
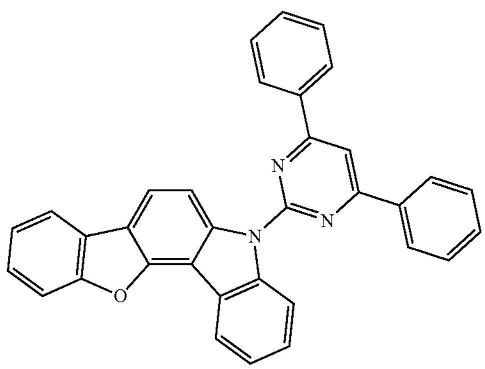
220
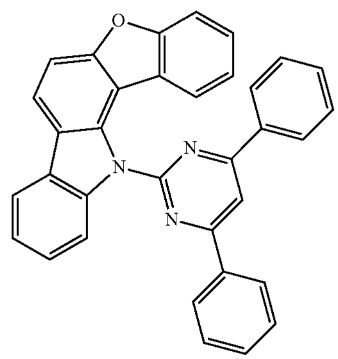
221
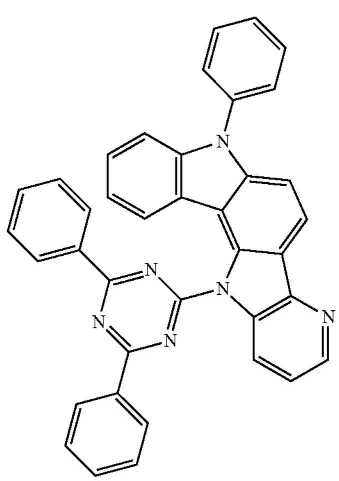
222
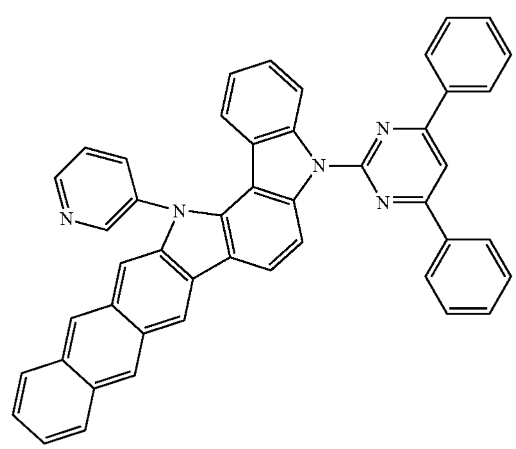

-continued
223
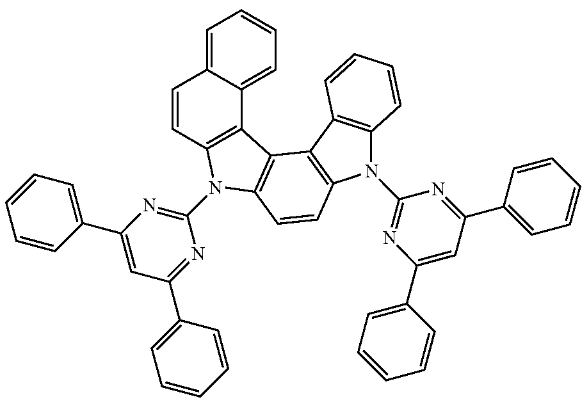
224
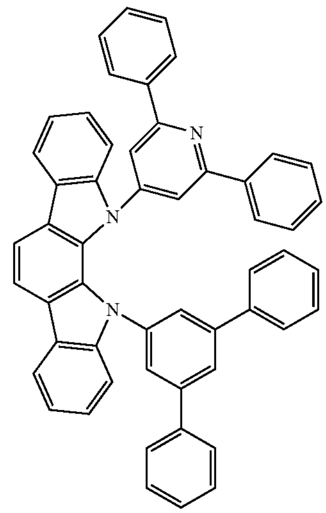
225
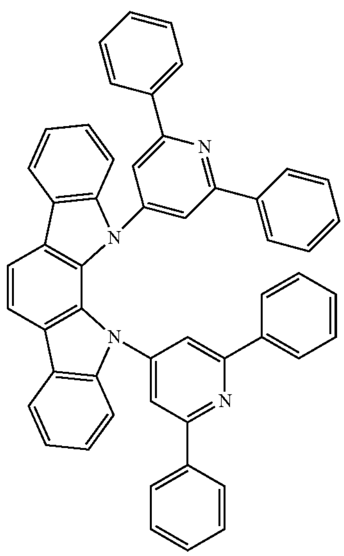
226
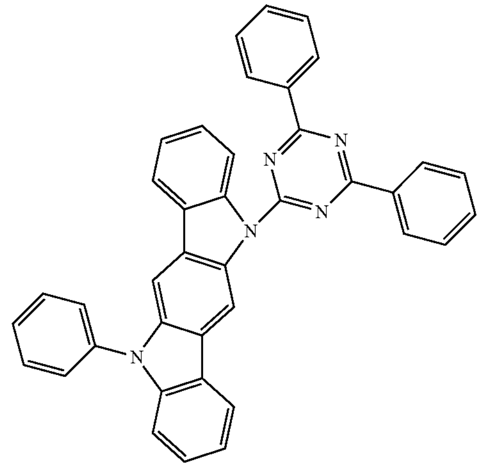
227
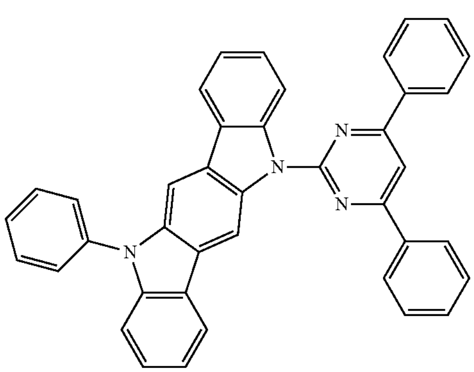
228
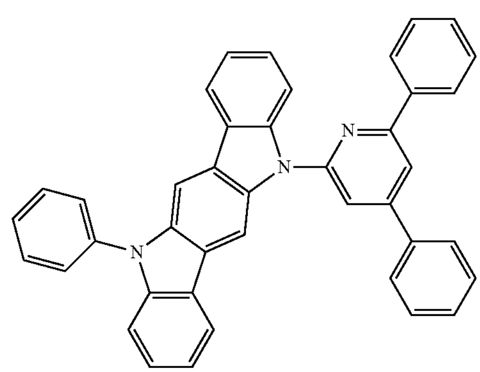

-continued
229
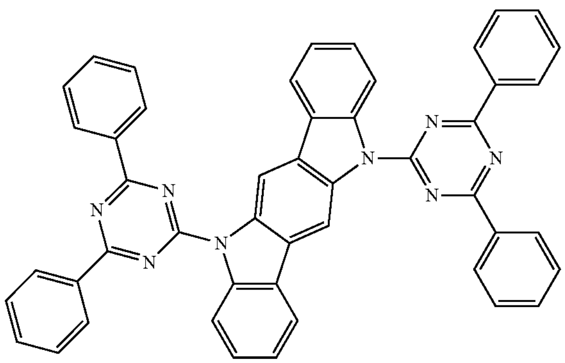
230
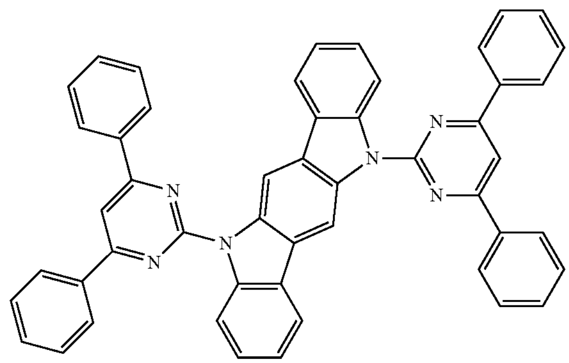
231
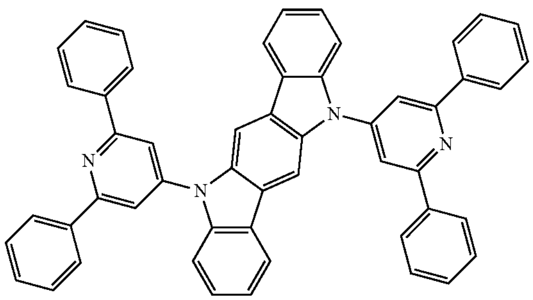
232
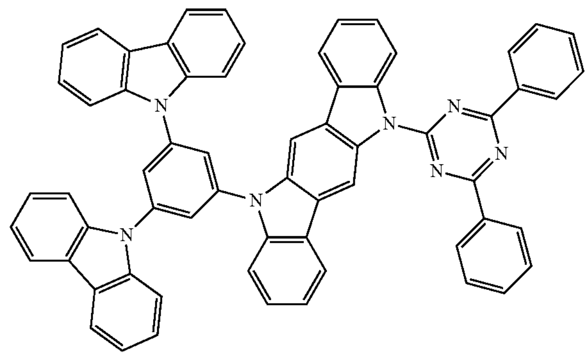
233
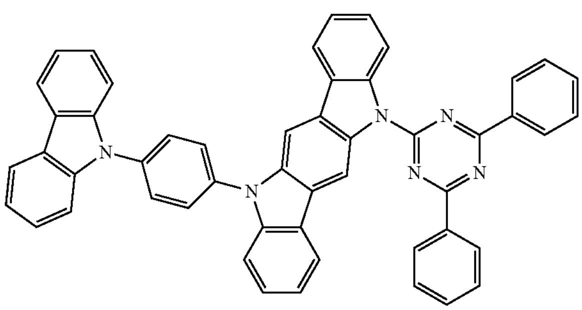
234
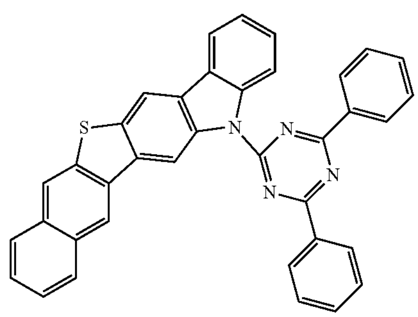
235
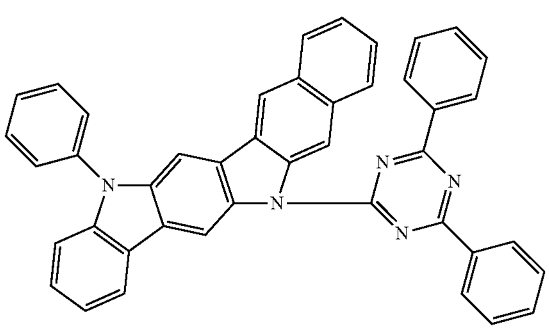
236
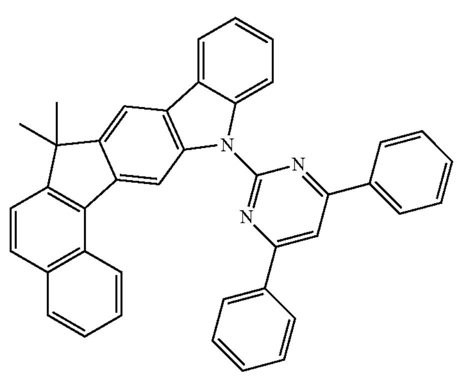

-continued
237
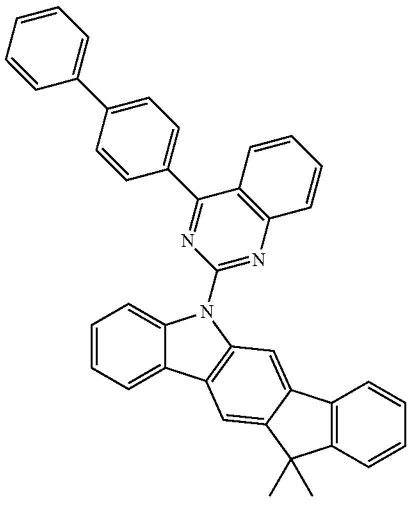
238
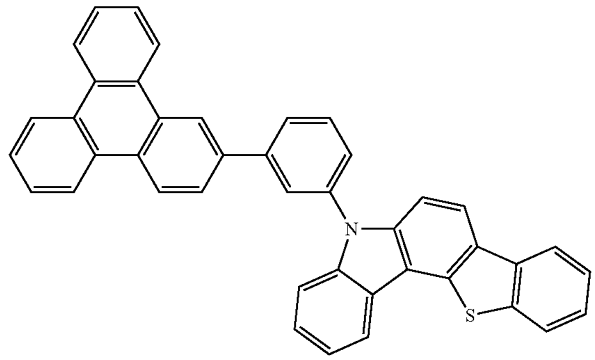
239
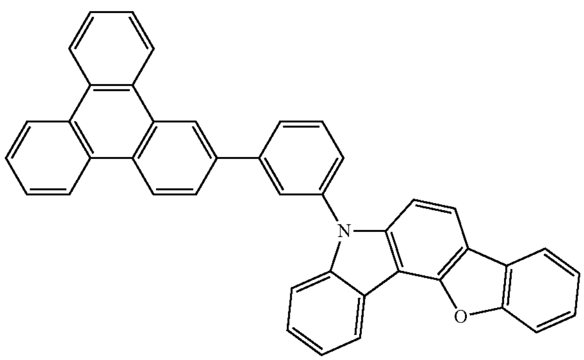
240
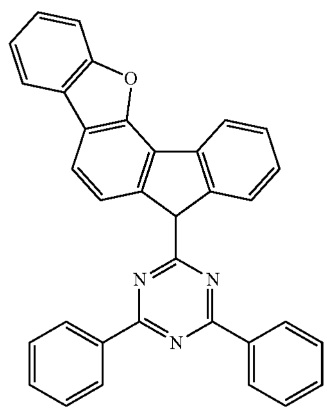
241
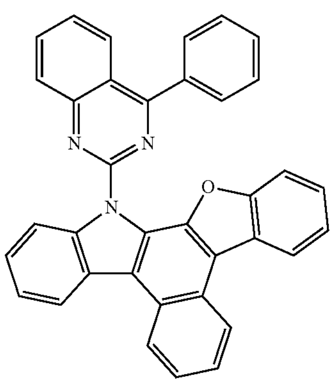
242
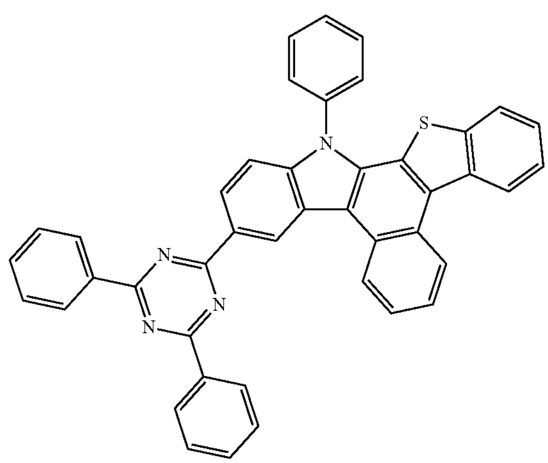

-continued
243
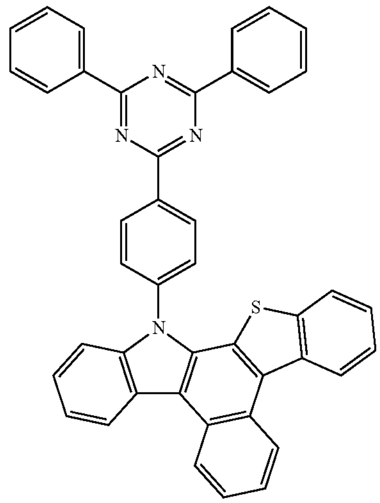
244
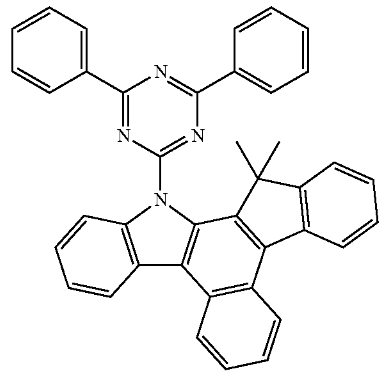
245
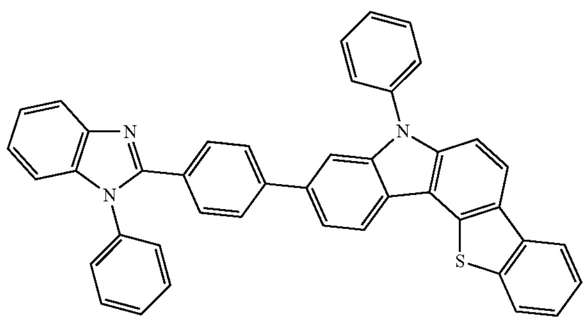
246
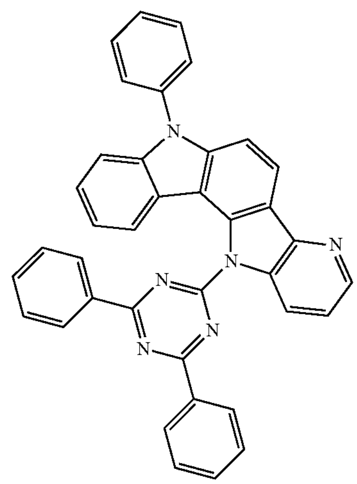
247
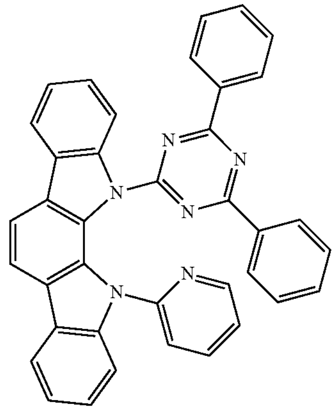
248
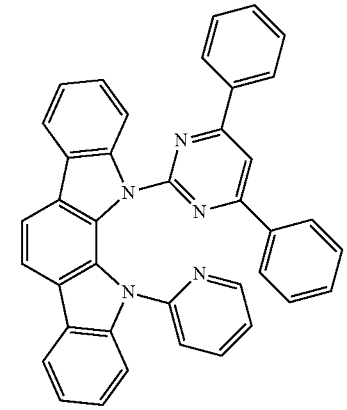

-continued
249
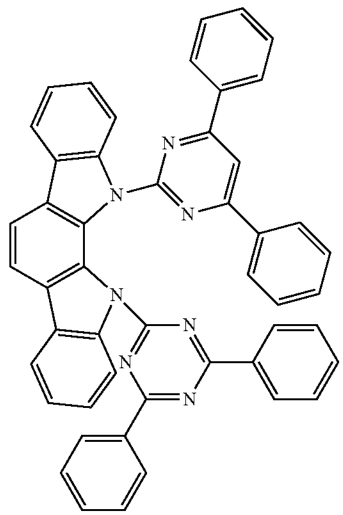
250
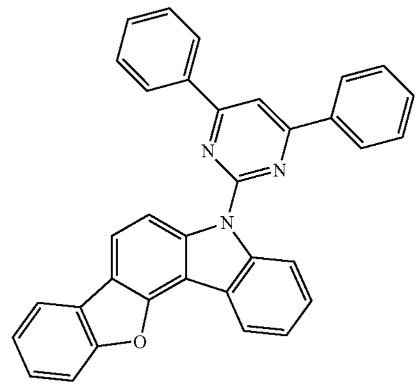
251
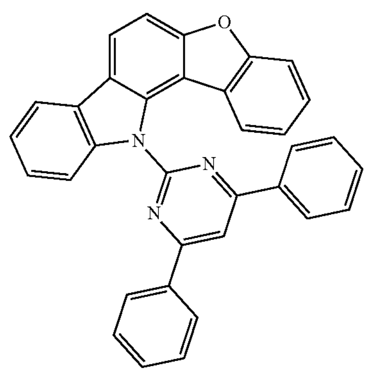
252
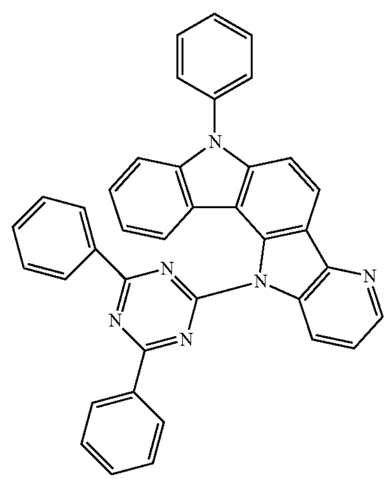
253
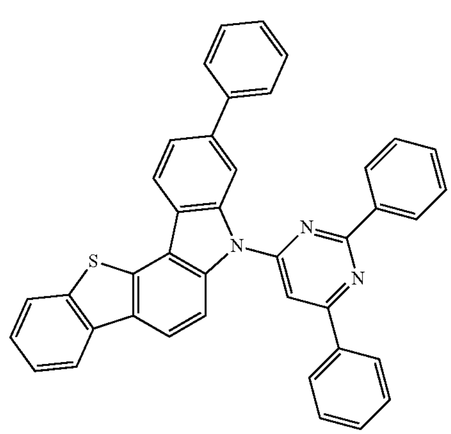
254
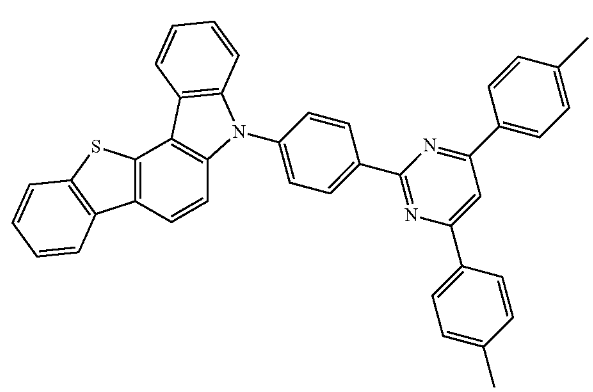

-continued
255
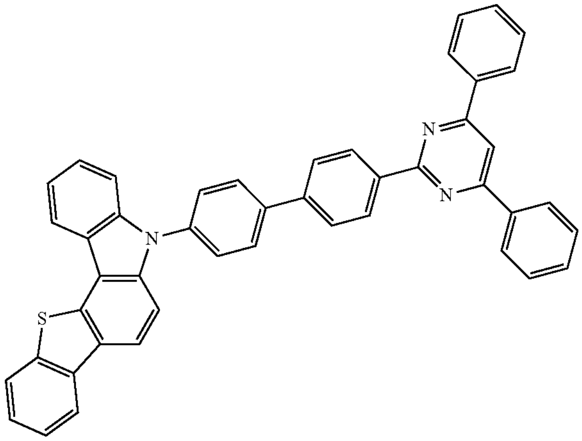
256
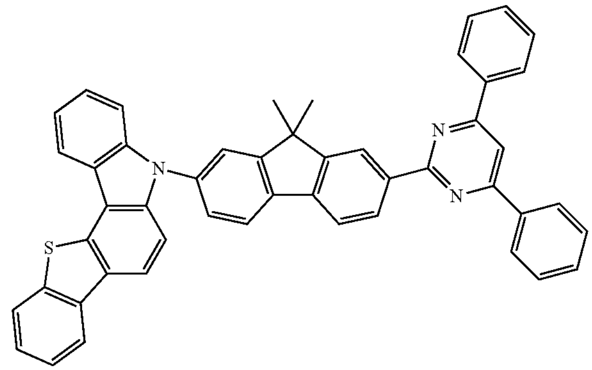
257
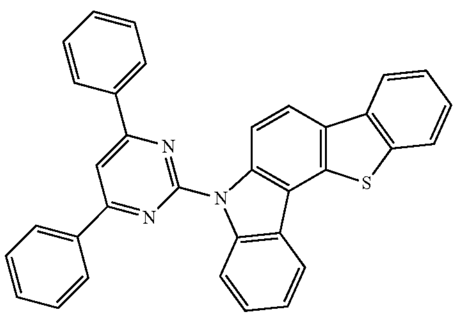
258
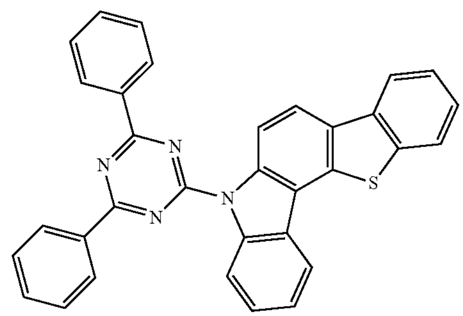
259
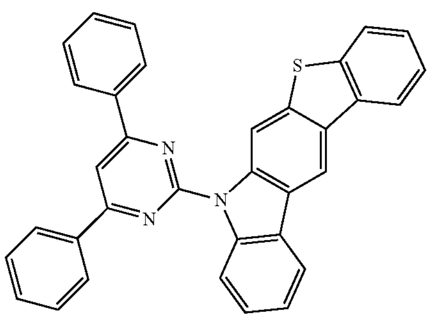
260
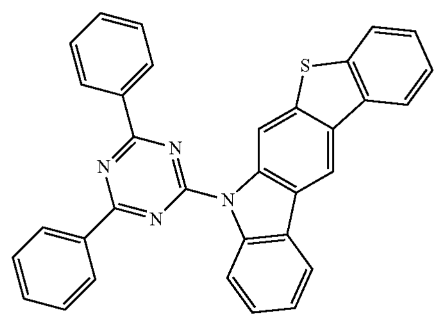
261
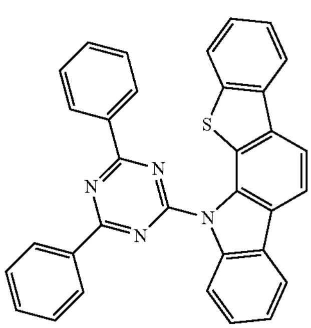
262
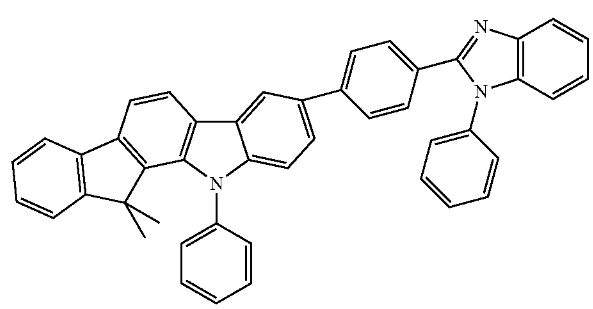

-continued
263
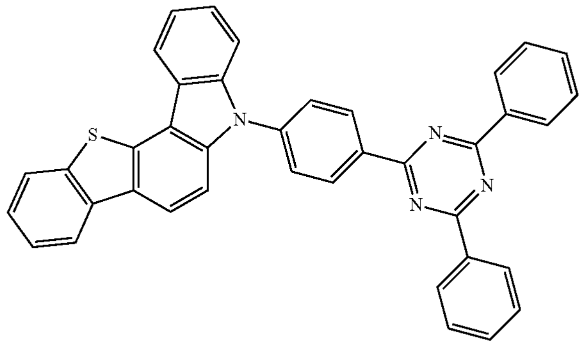
264
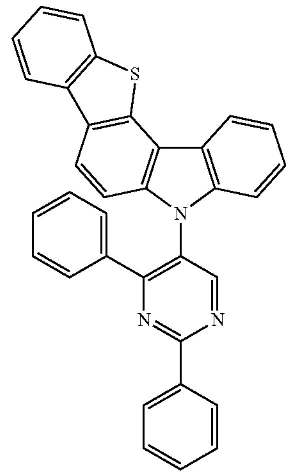
265
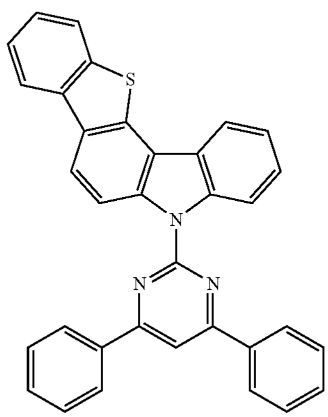
266
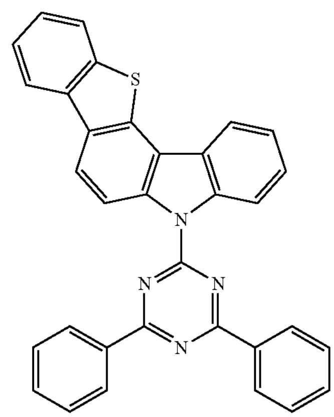
267
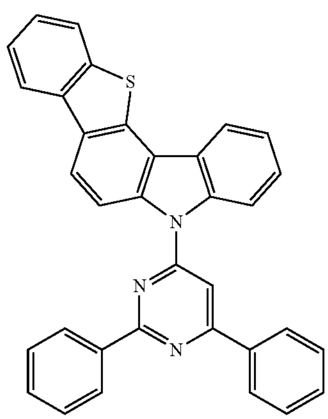
268
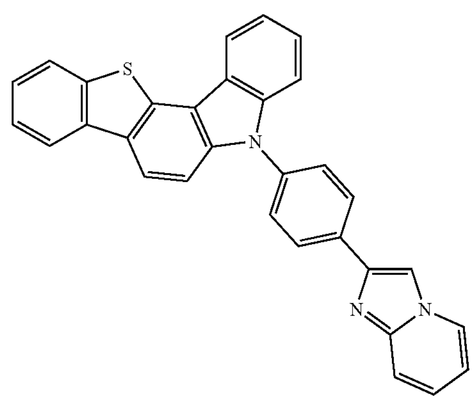

-continued
269
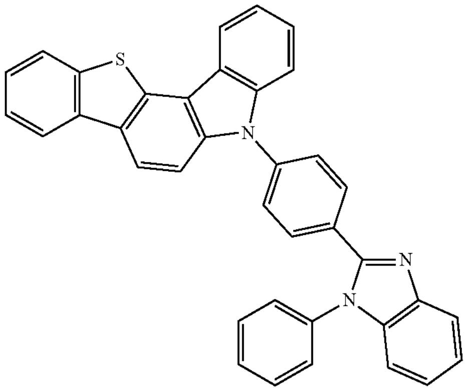
270
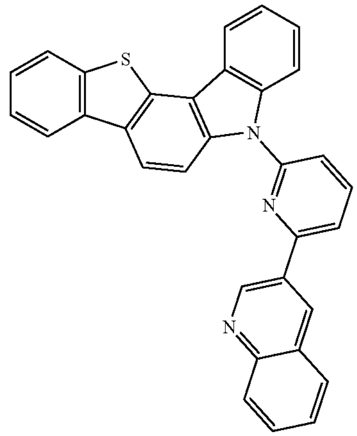
271
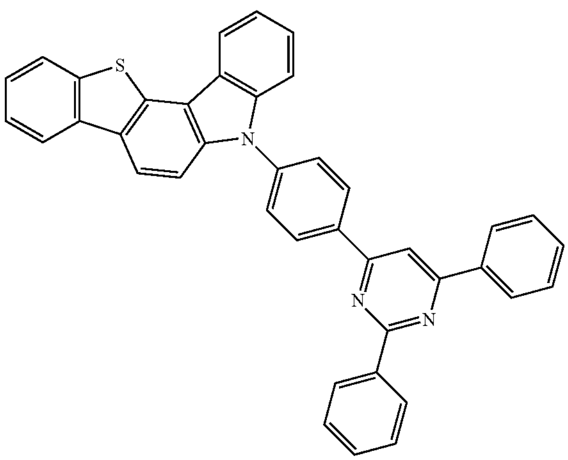
272
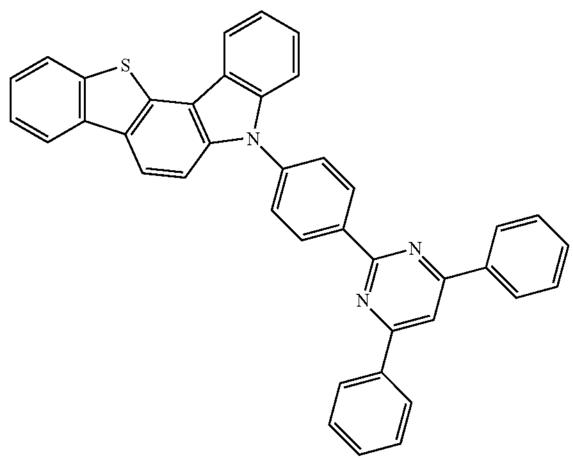
301
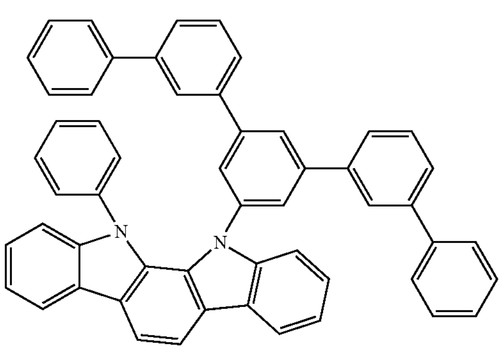
302
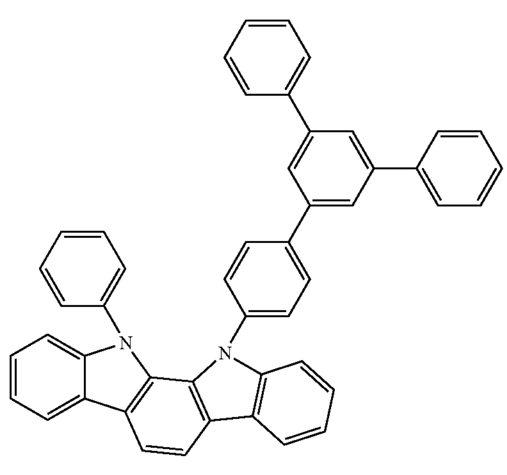

-continued
303
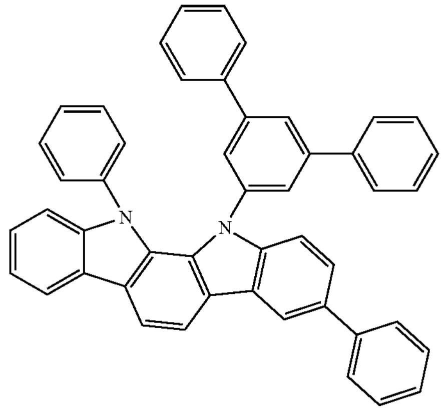
304
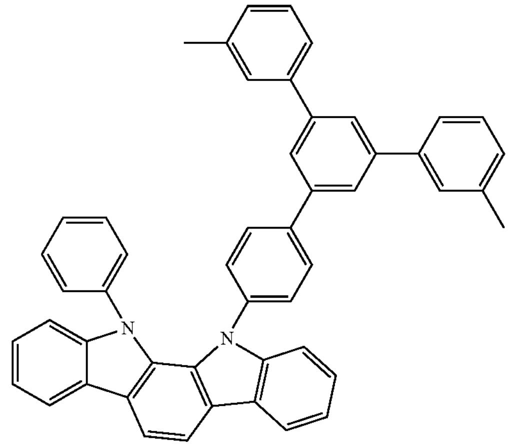
305
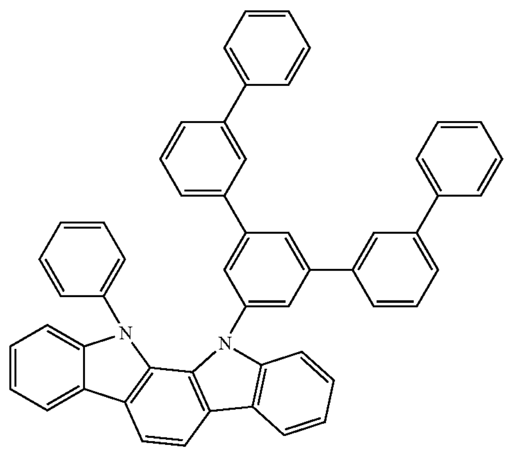
306
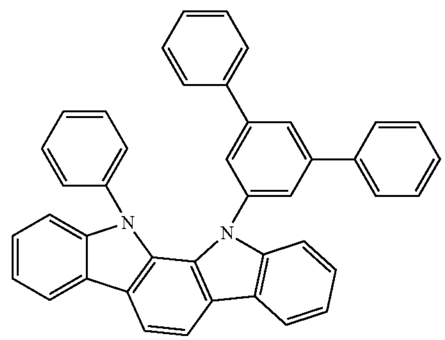
307
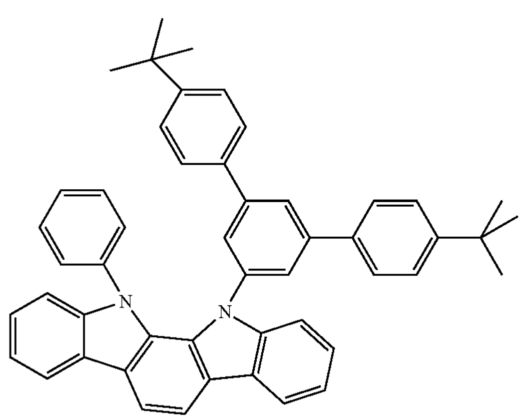
308
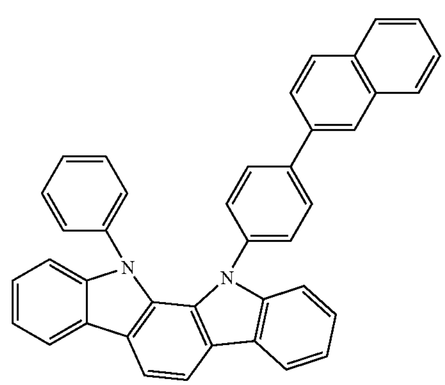

-continued
309
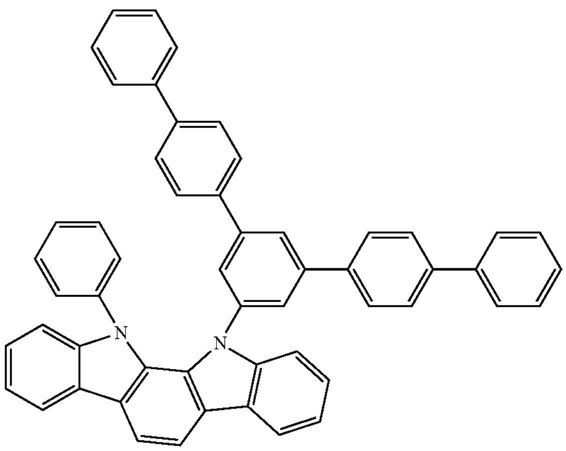
310
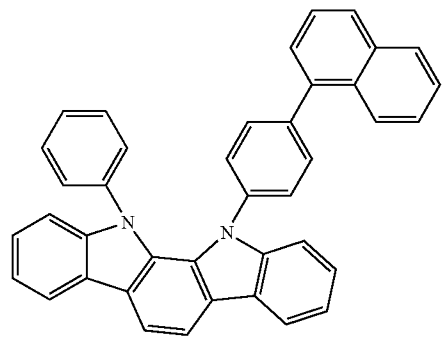
311
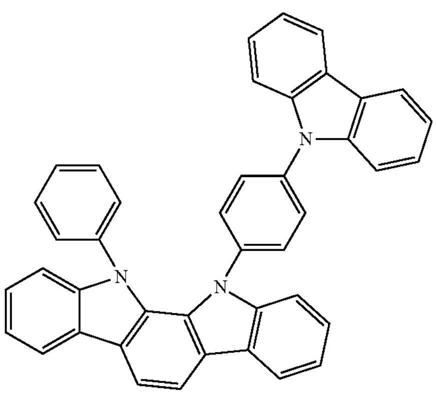
312
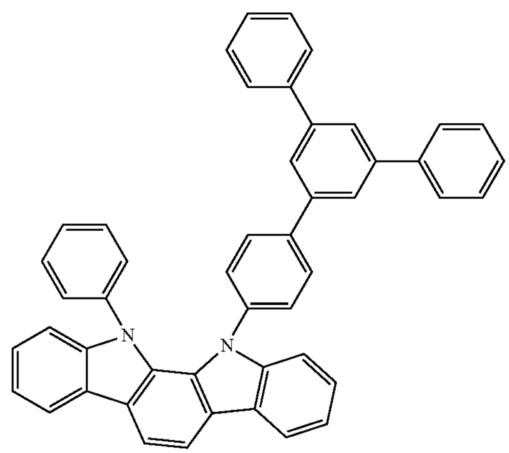
313
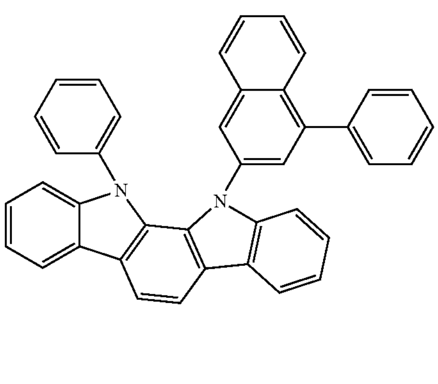
314
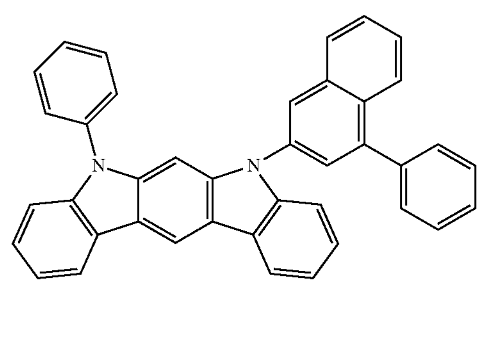

-continued
315
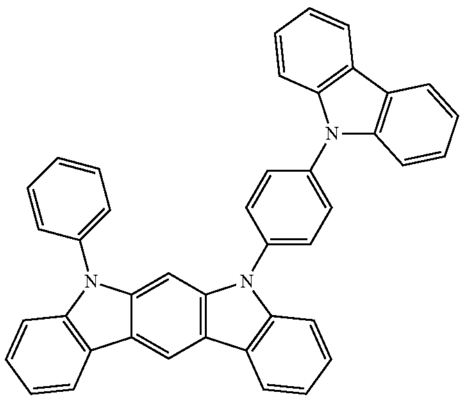
316
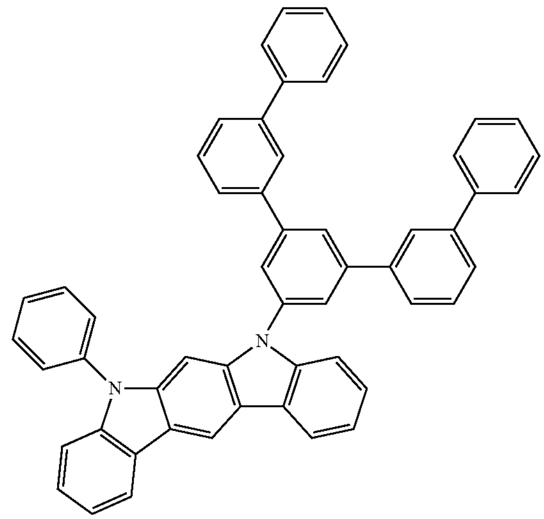
317
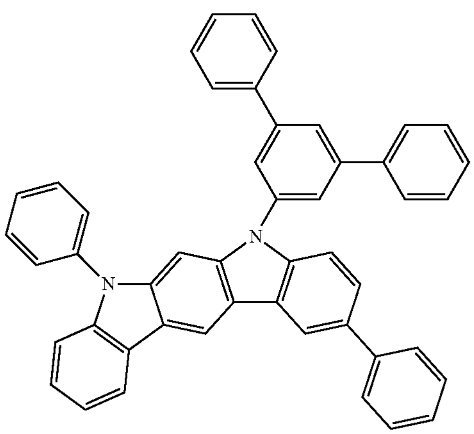
318
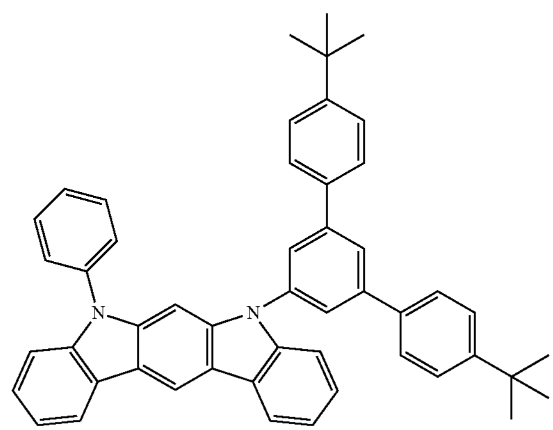
319
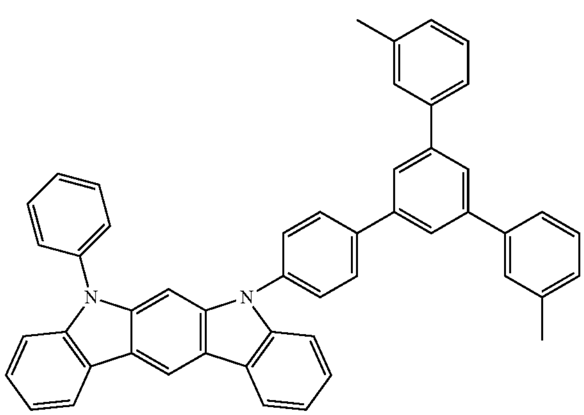
320
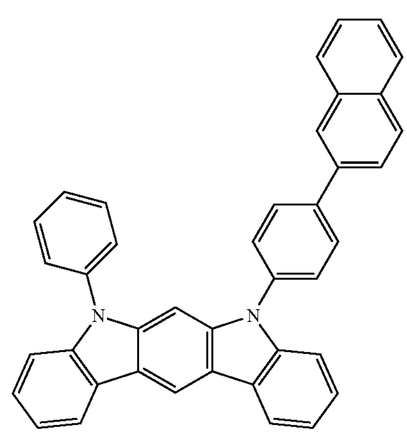

-continued
321
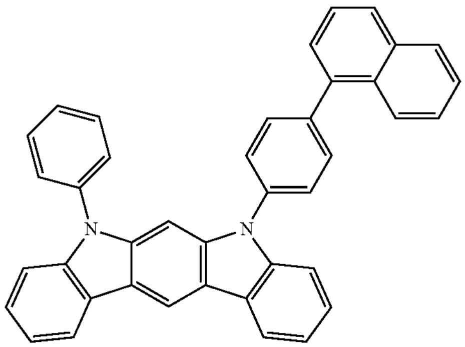
322
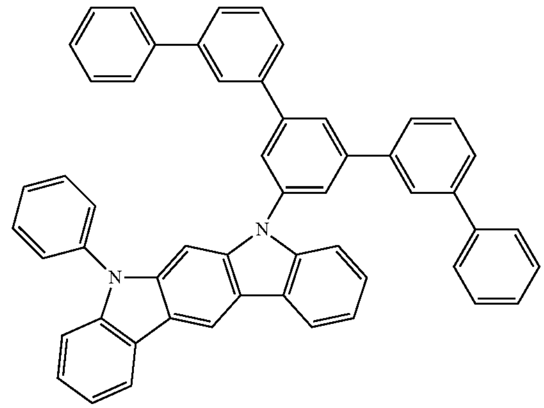
323
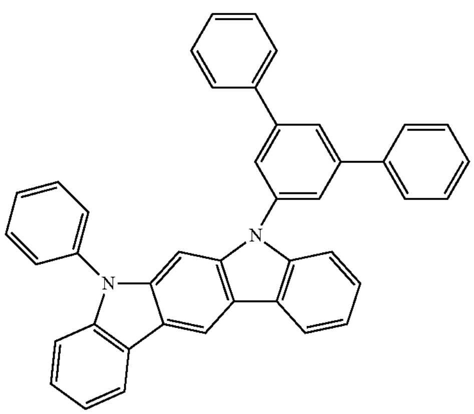
324
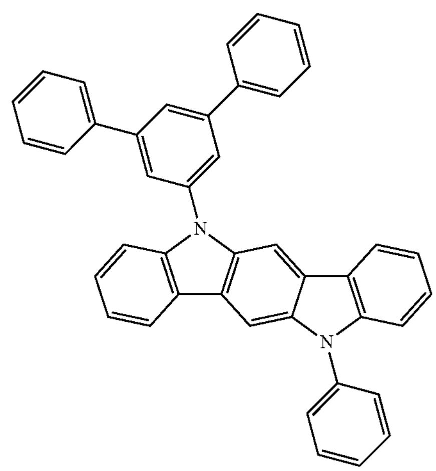
325
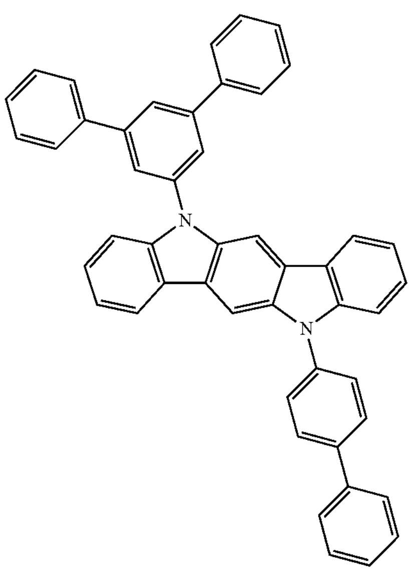
326
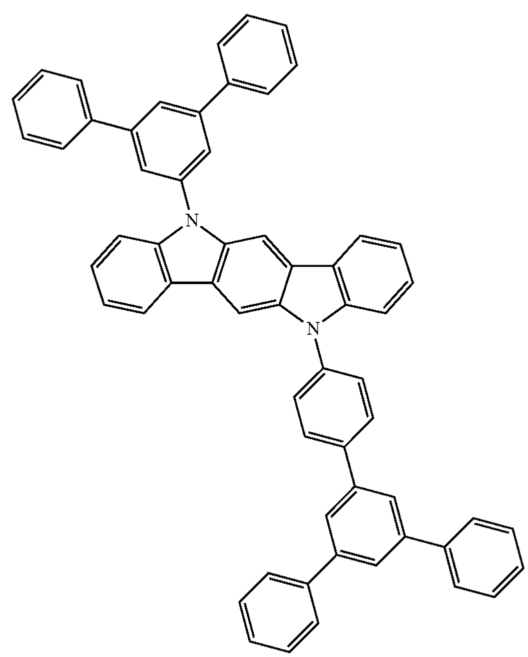

-continued
327
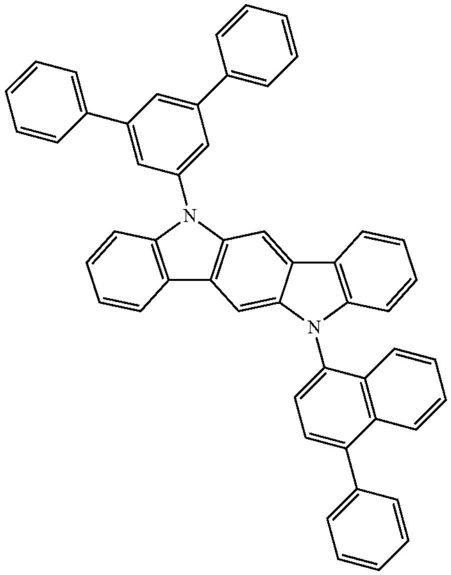
328
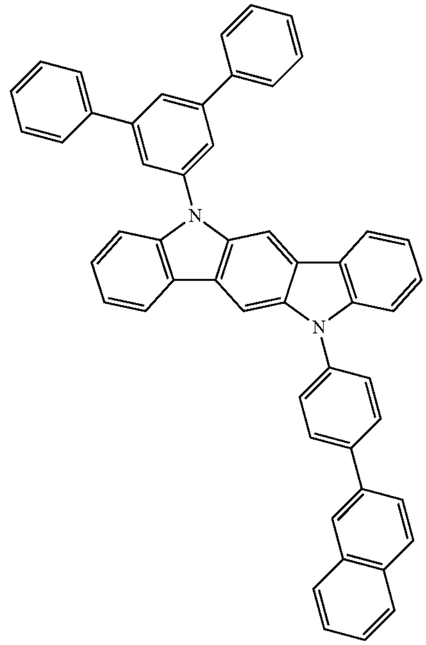
329
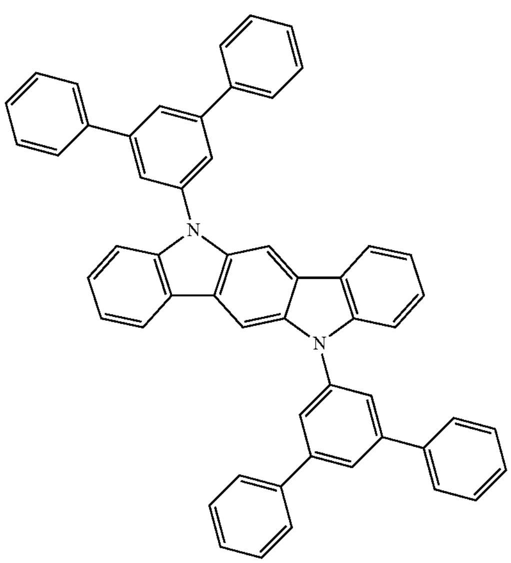
330
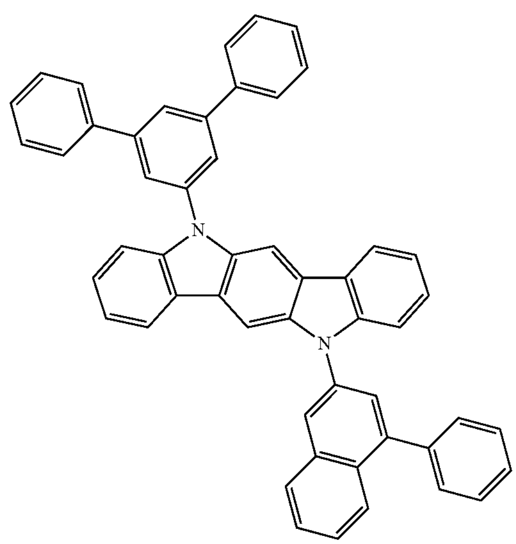

-continued
331
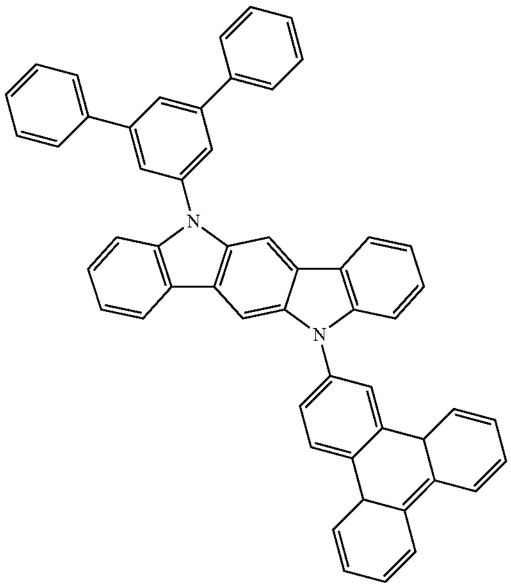
332
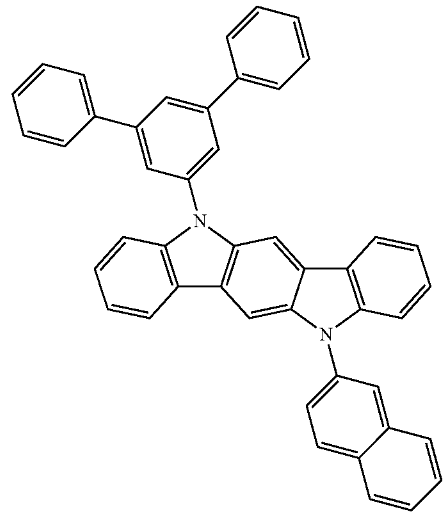
333
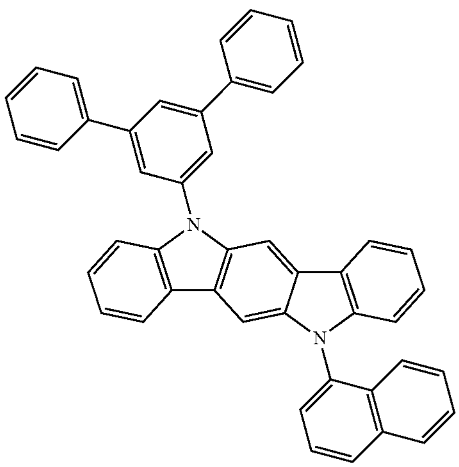
334
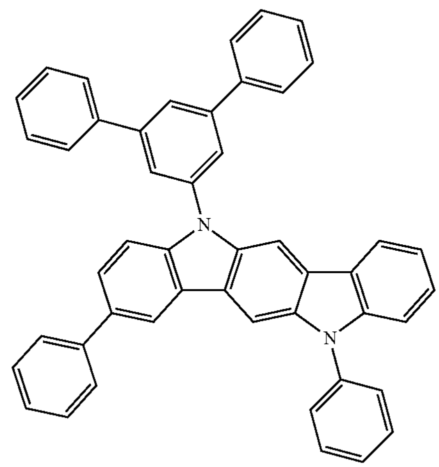
335
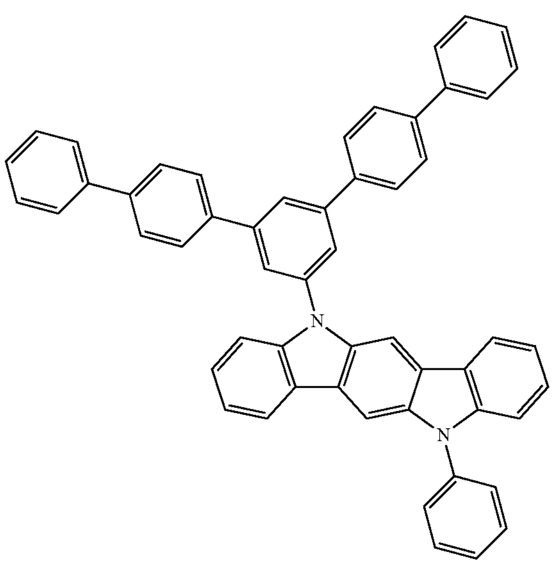
336
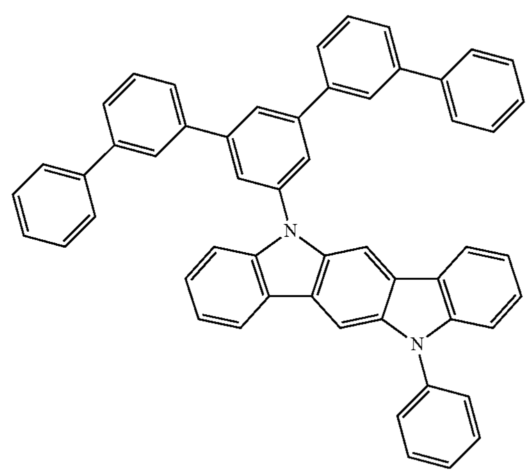

-continued
337
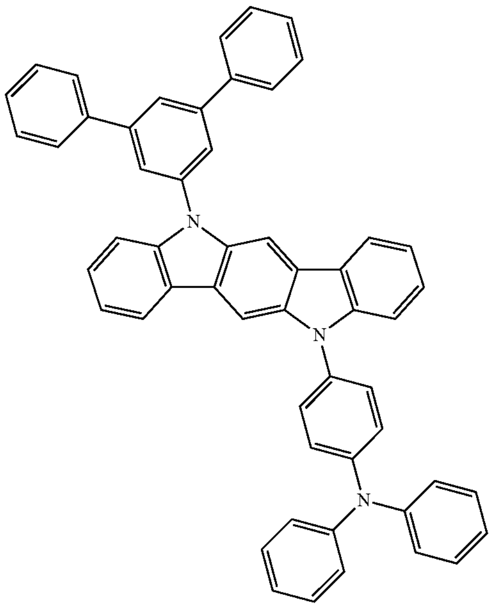
338
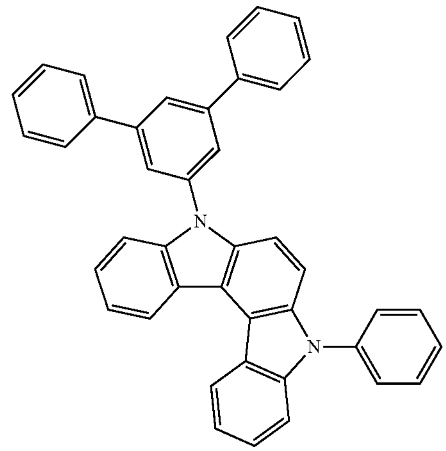
339
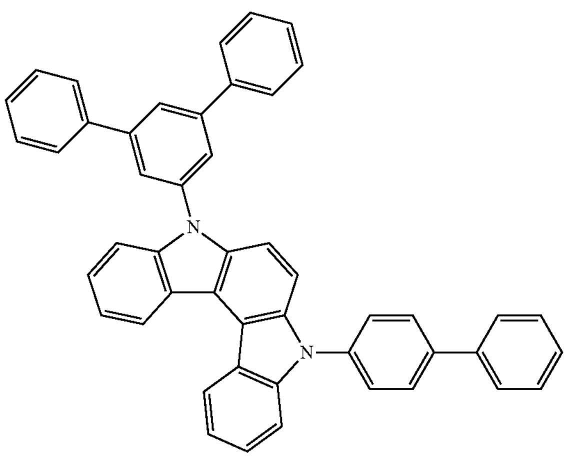
340
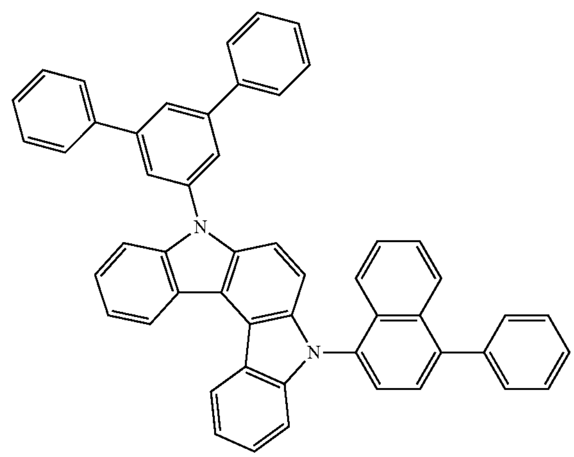
341
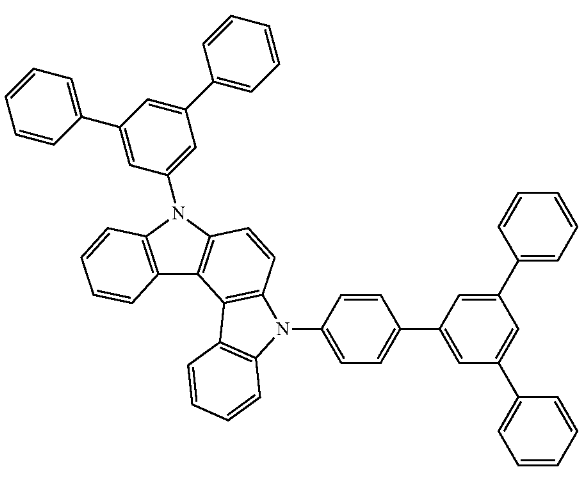
342
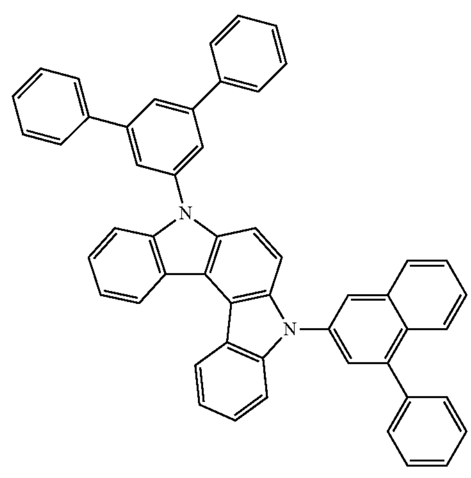

-continued
343
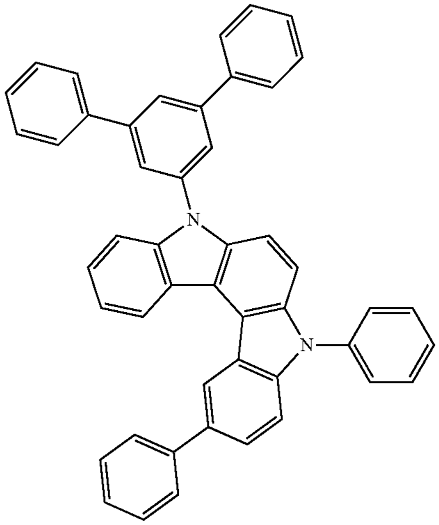
344
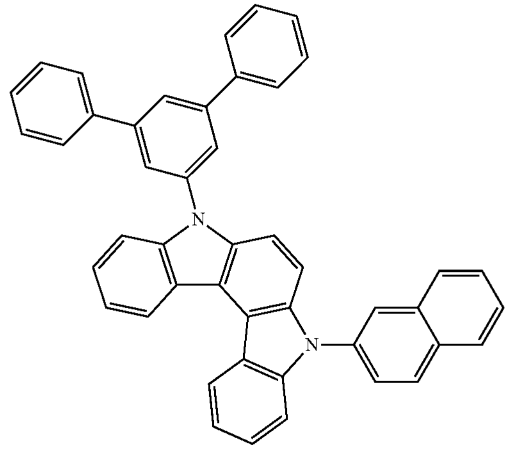
345
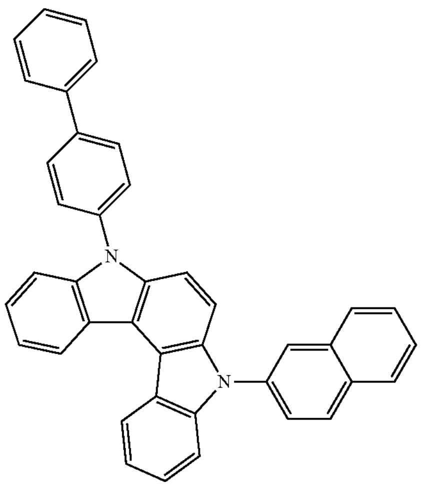
346
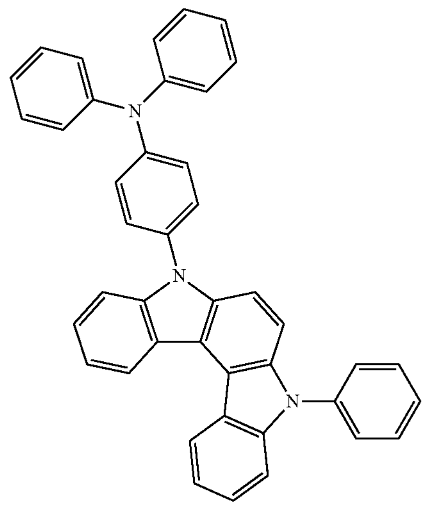
347
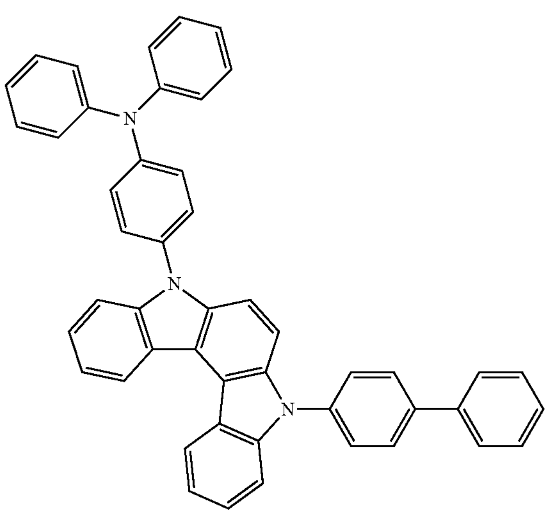
348
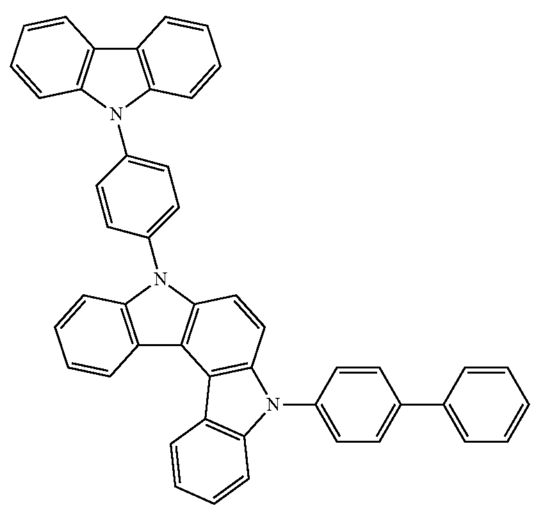

-continued
349
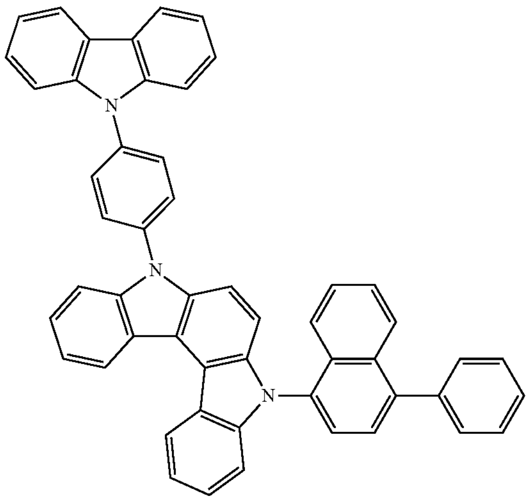
350
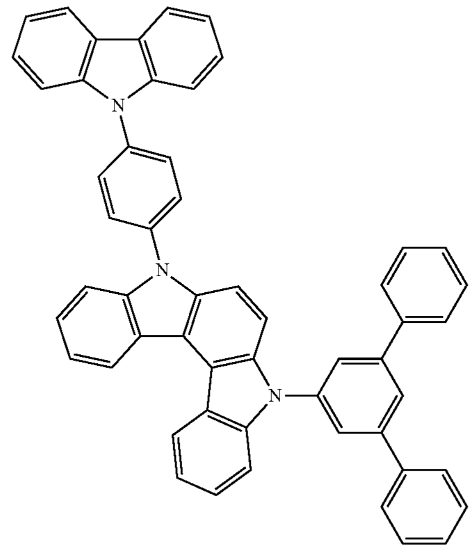
351
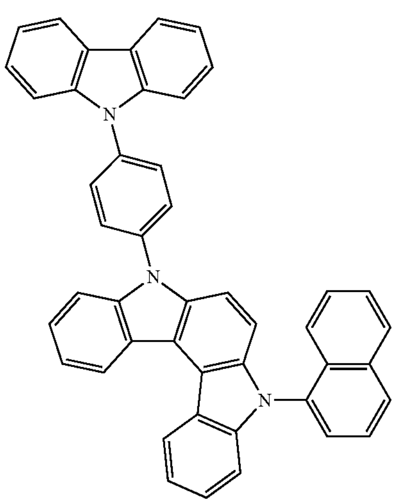
352
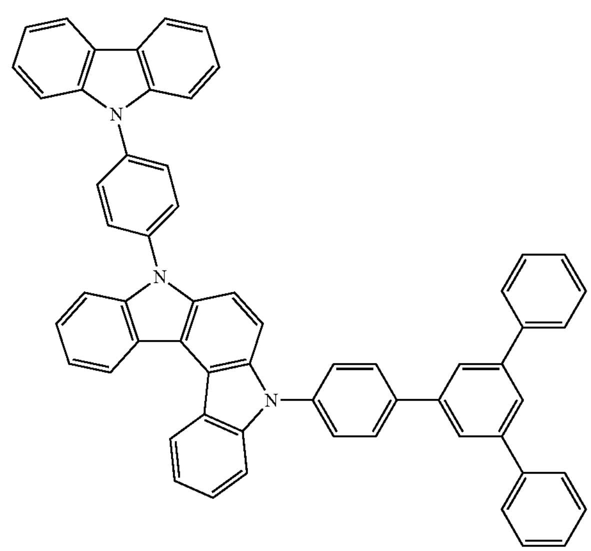

-continued
353
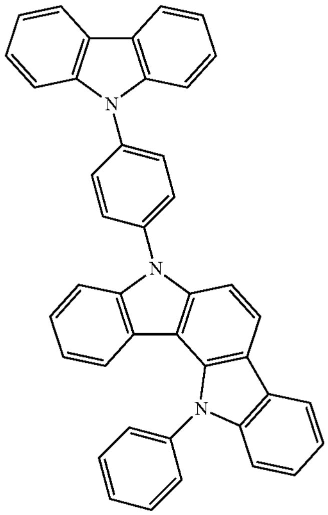
354
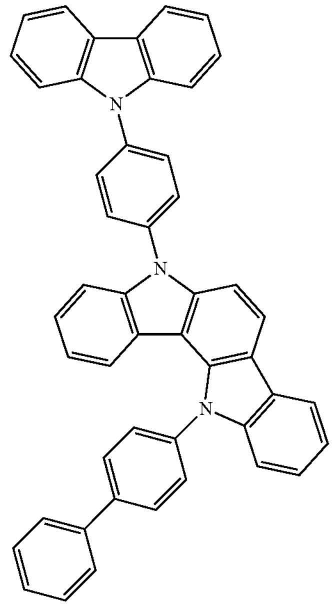
355
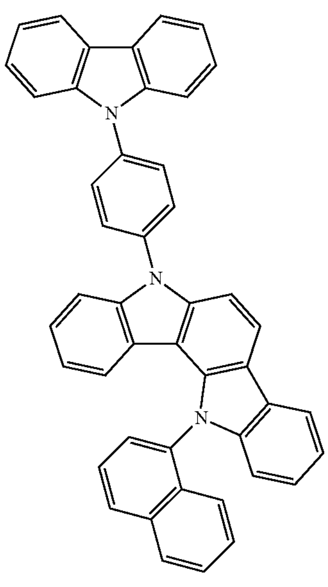
356
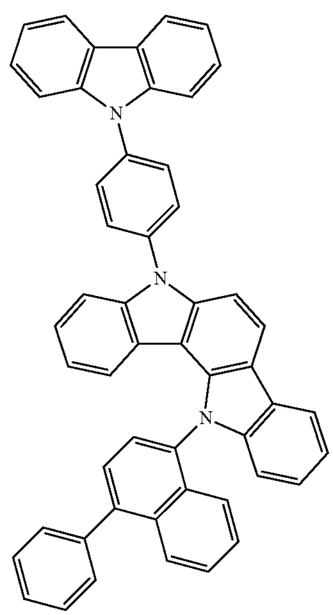

-continued
357
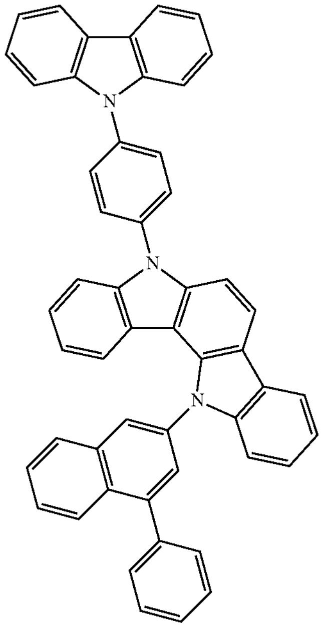
358
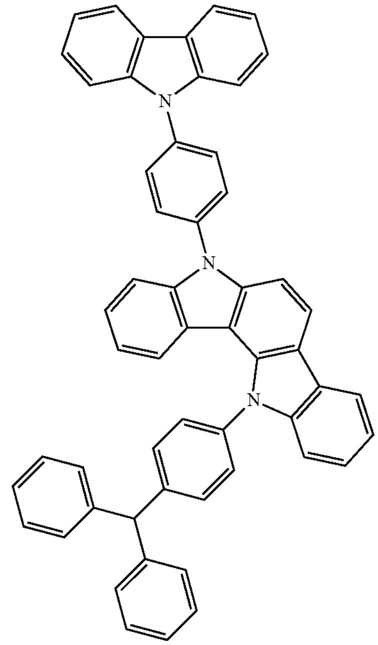
359
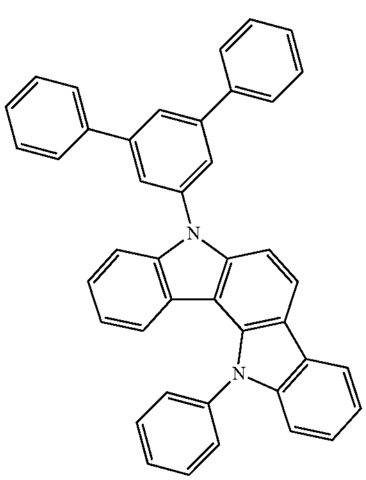
360
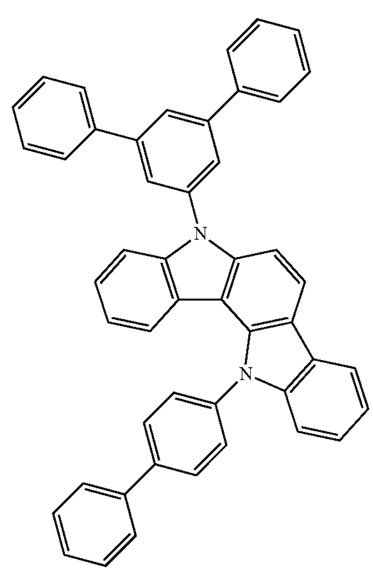

-continued
361
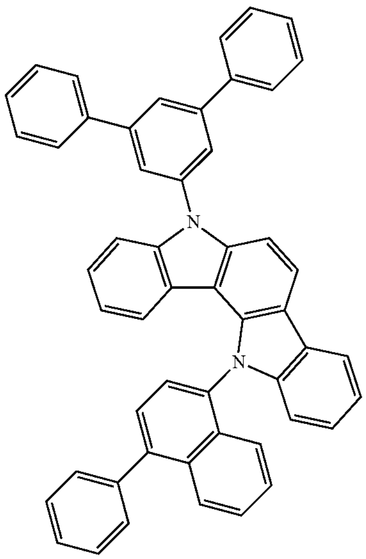
362
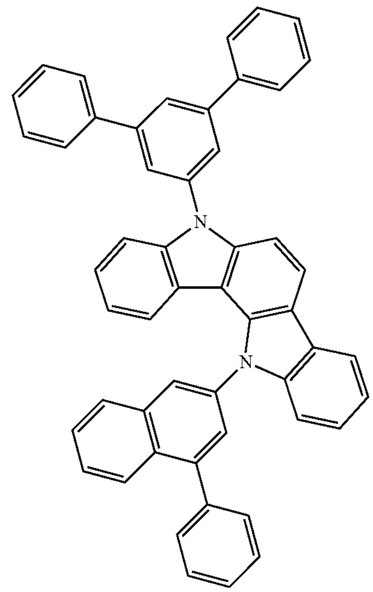
363
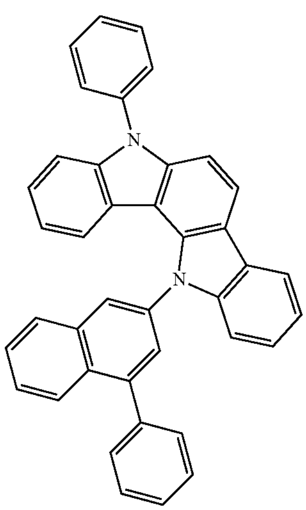
364
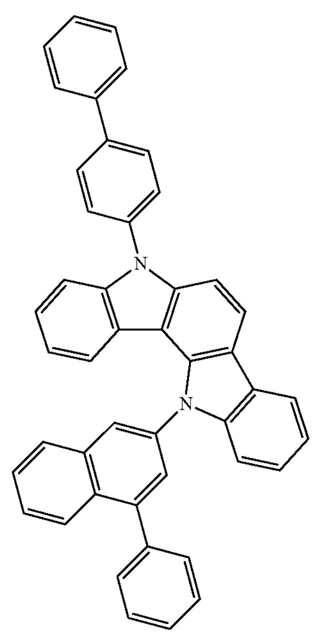

-continued
365
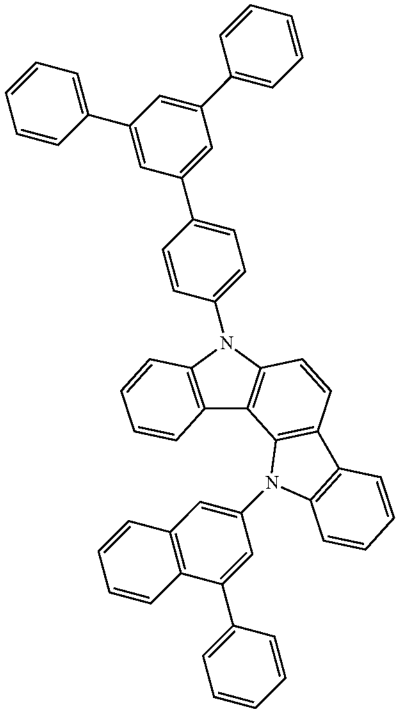
366
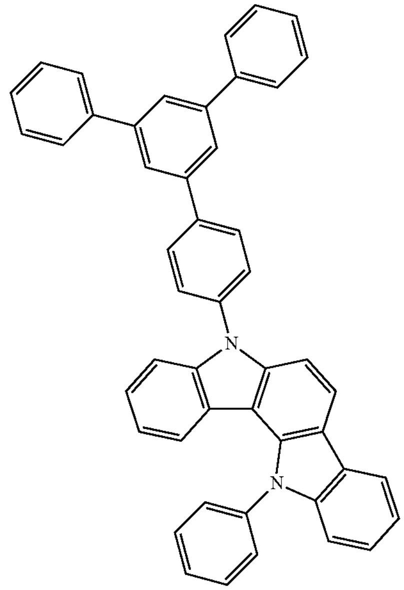
367
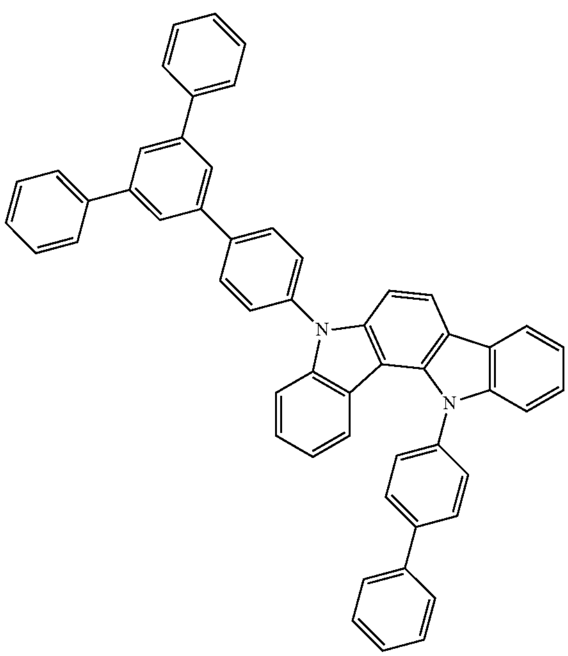
368
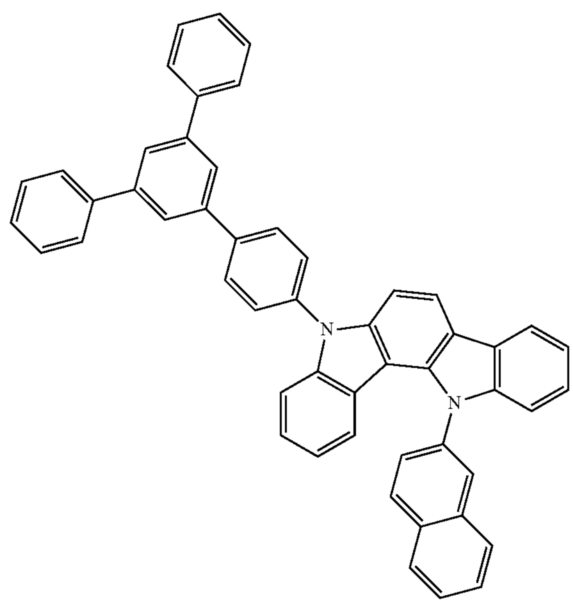

-continued
369
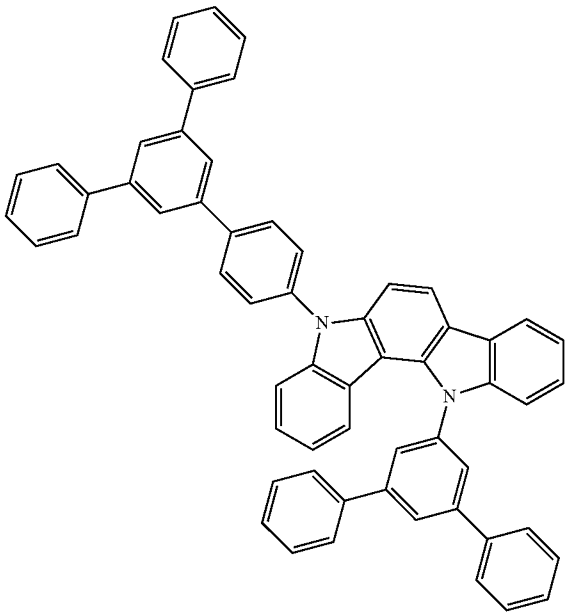
370
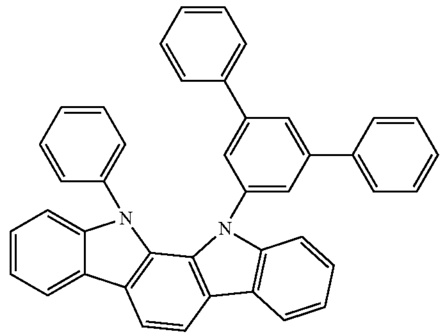
371
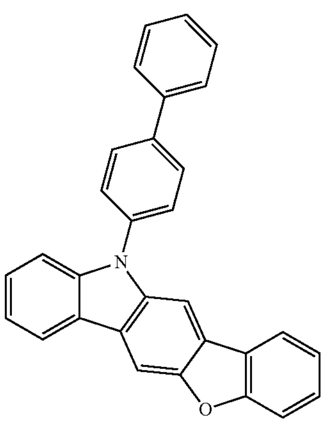
372
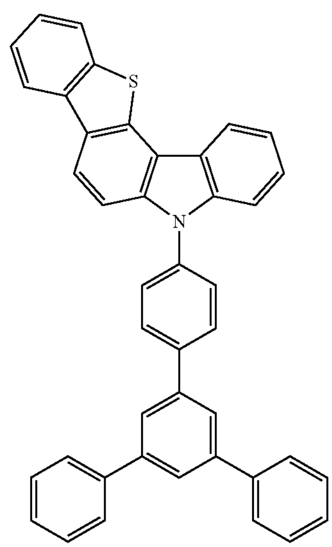

-continued
373
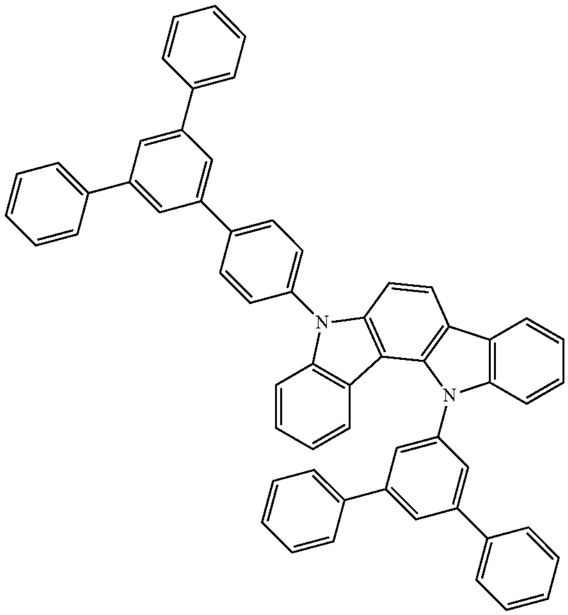
374
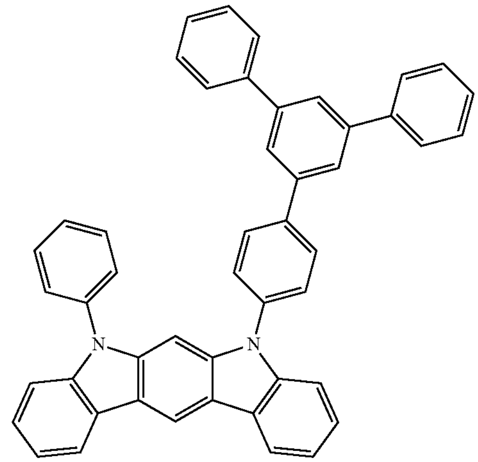
101A
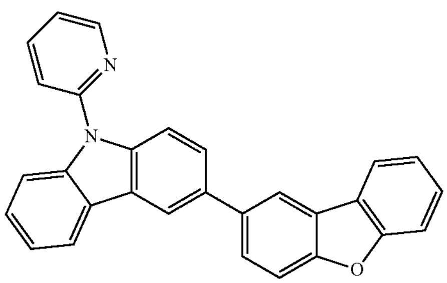
102A
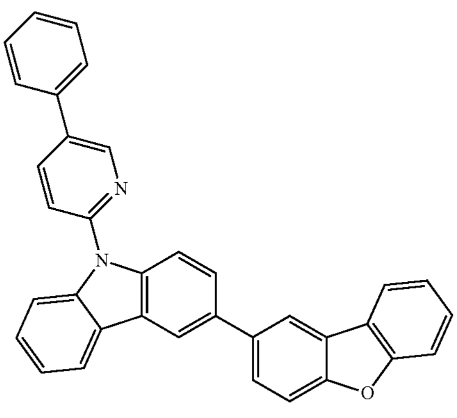
103A
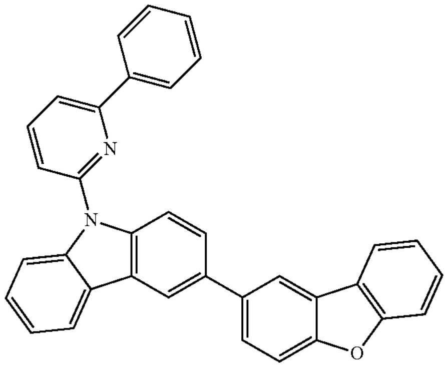
104A
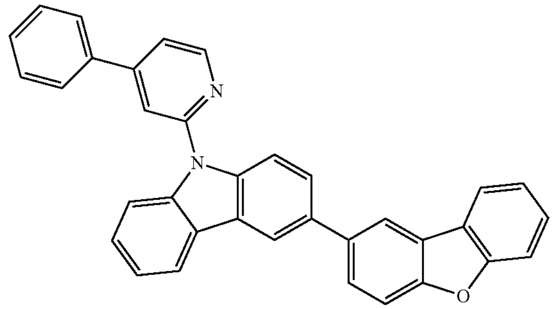

-continued
105A
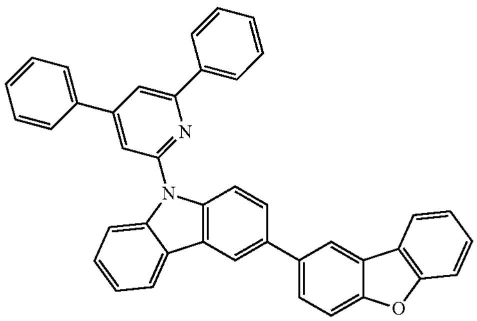
106A
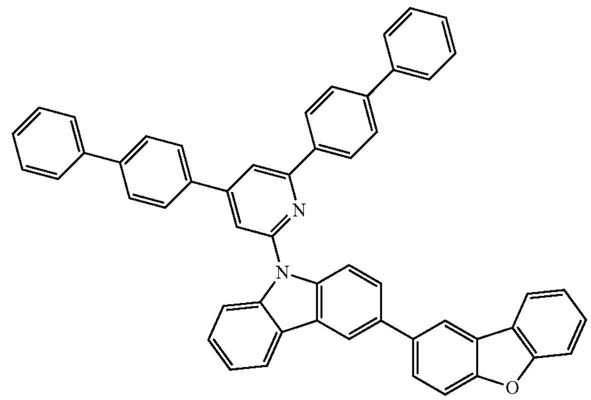
107A
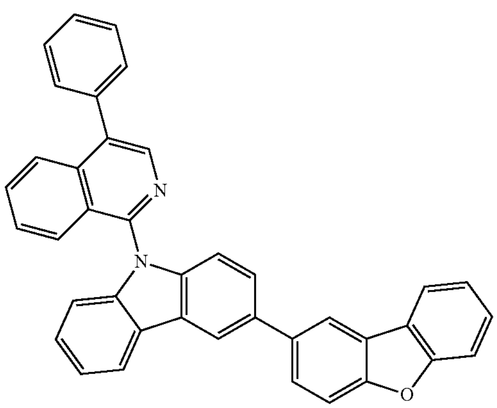
108A
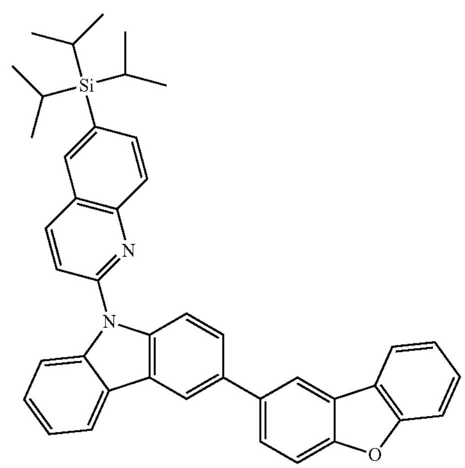
109A
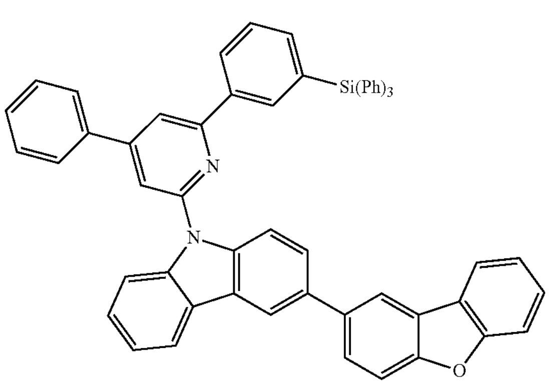
110A
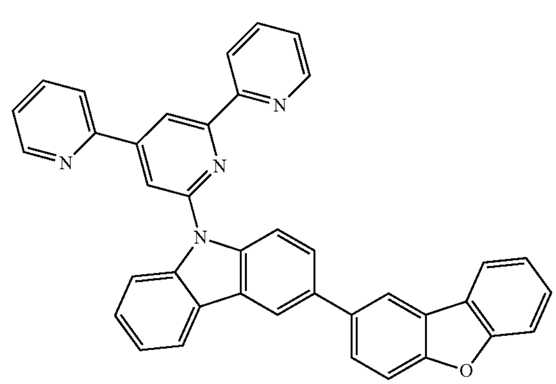

-continued
111A
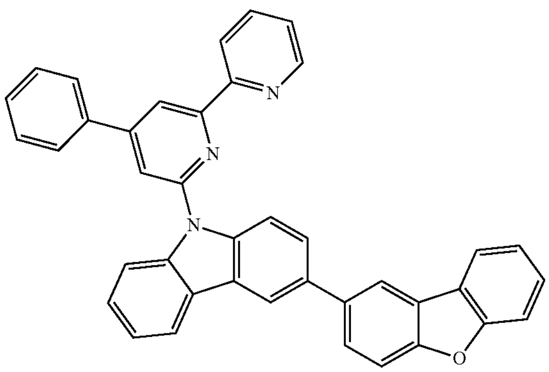
112A
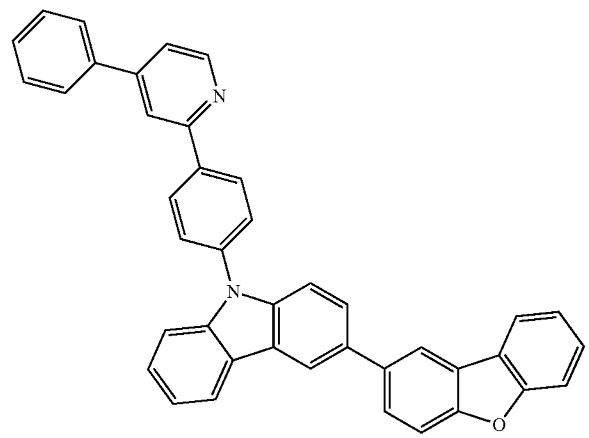
113A
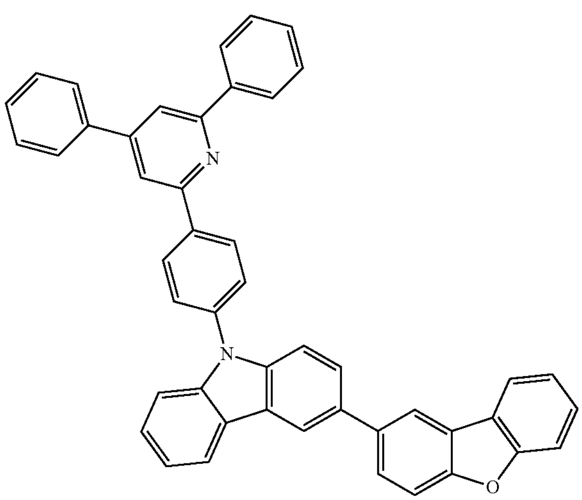
114A
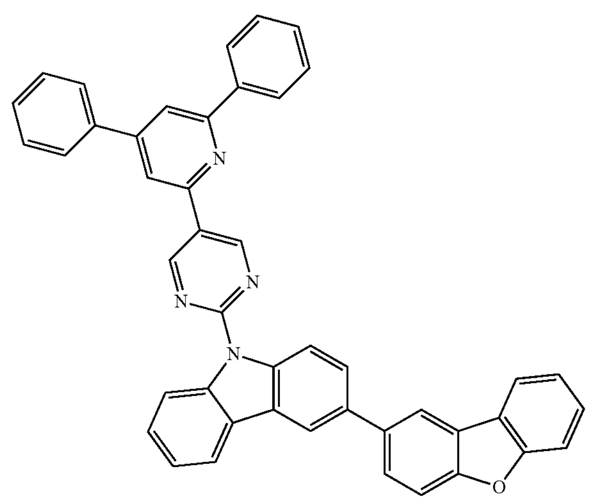
115A
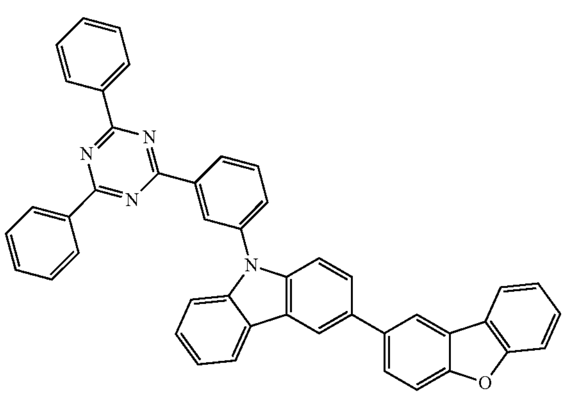
116A
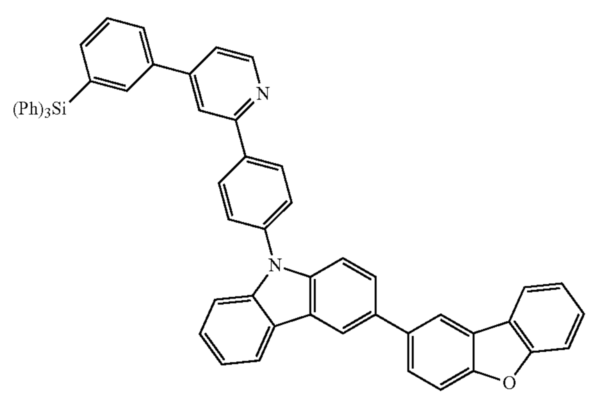

-continued
117A
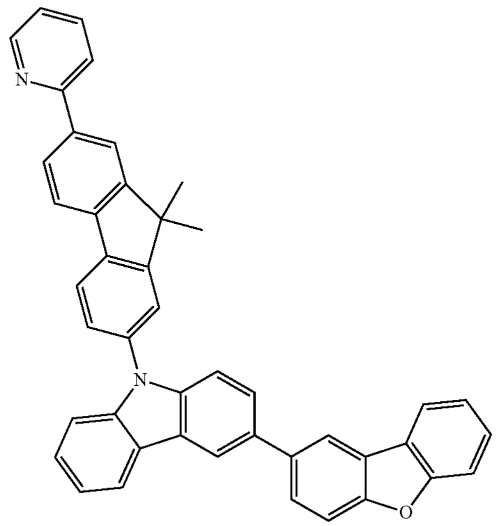
118A
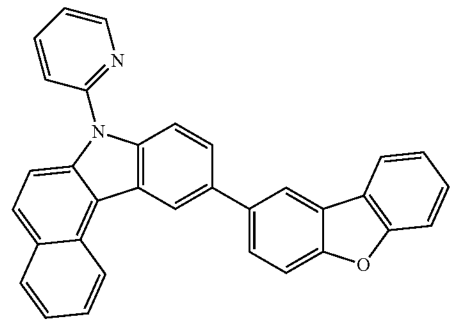
119A
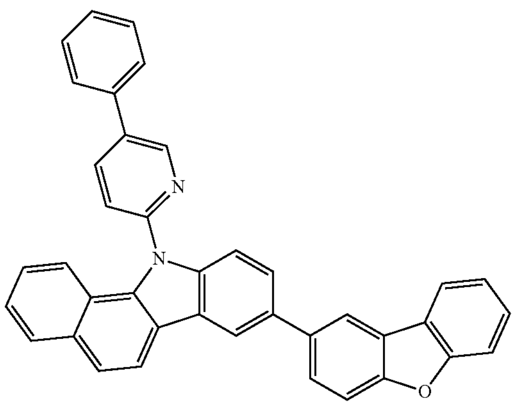
120A
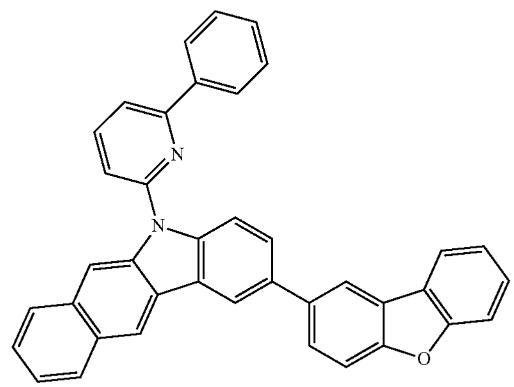
121A
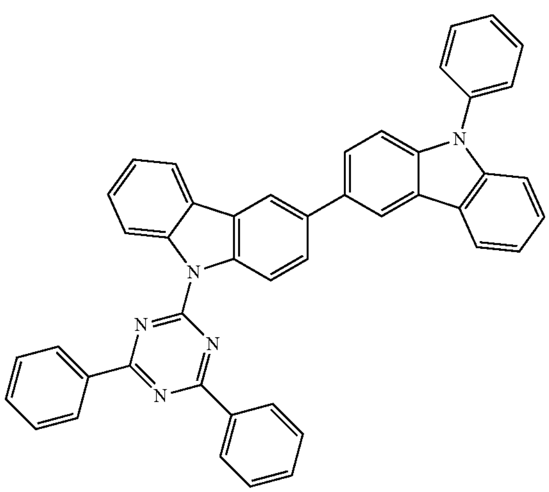
122A
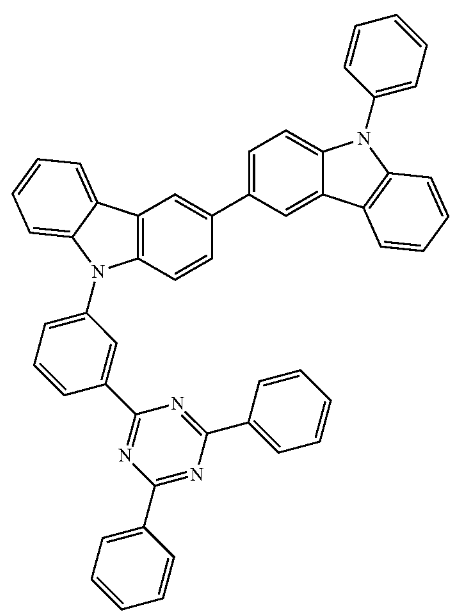

-continued
123A
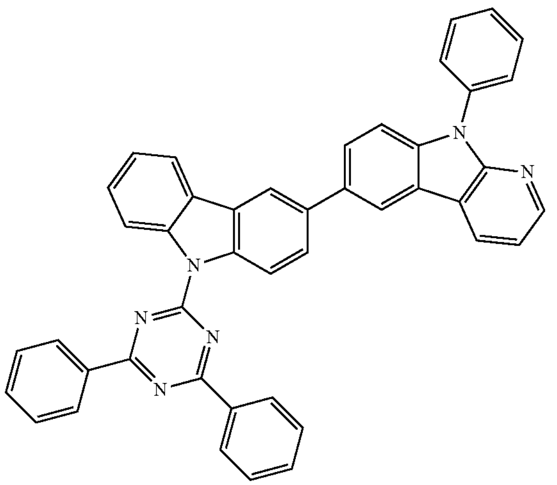
124A
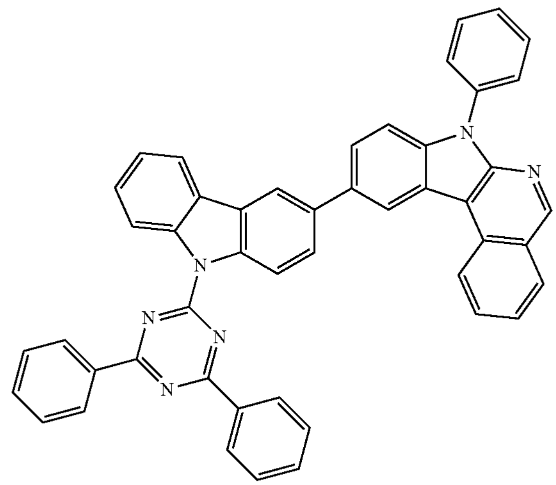
125A
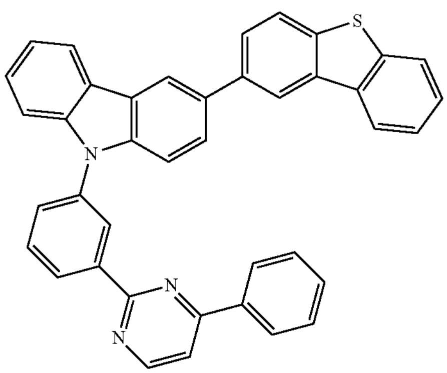
126A
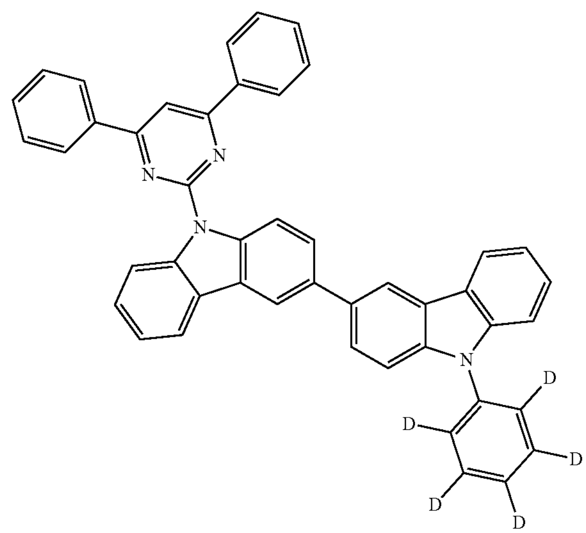
127A
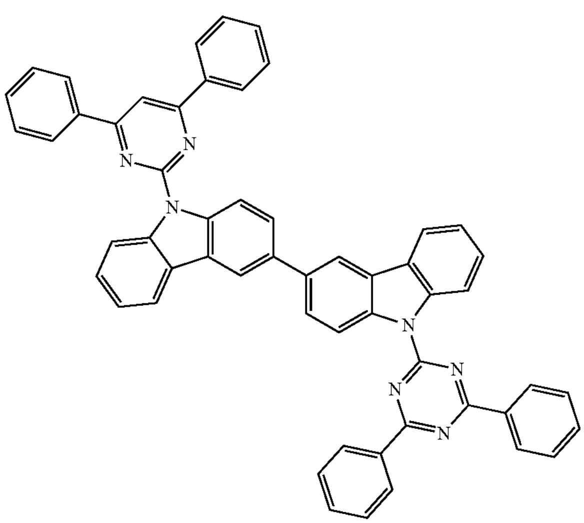
128A
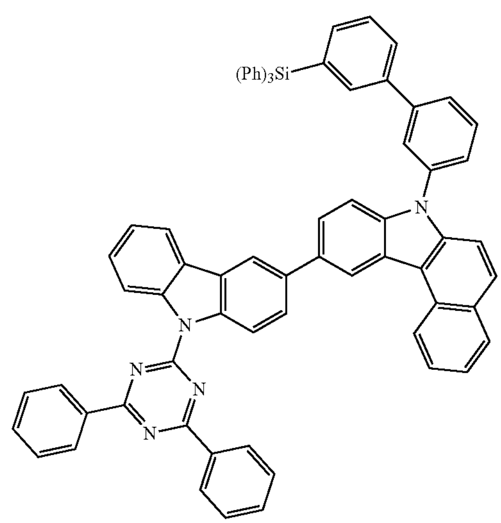

-continued
129A
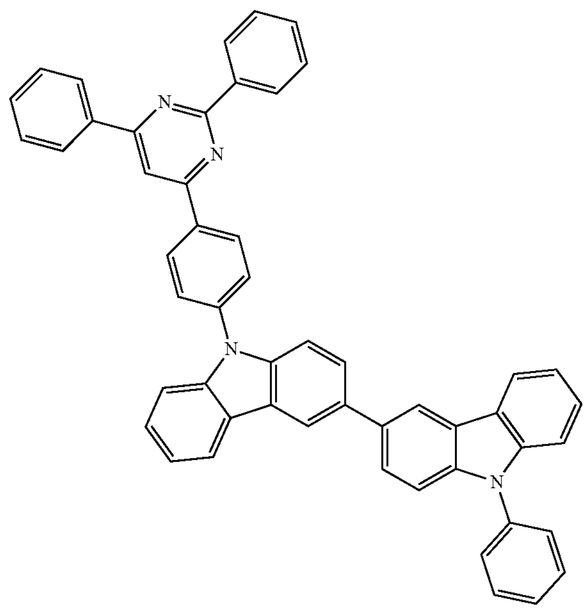
130A
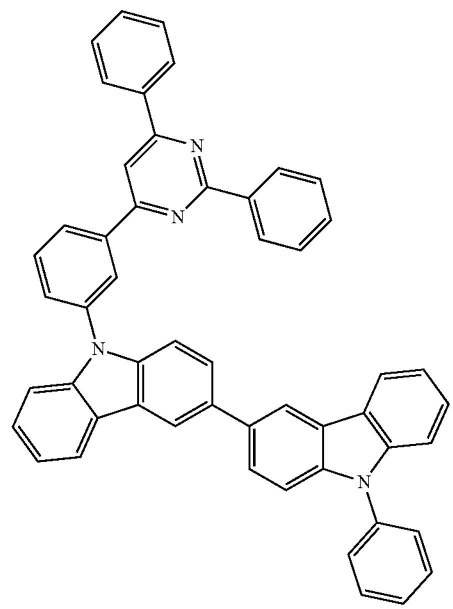
131A
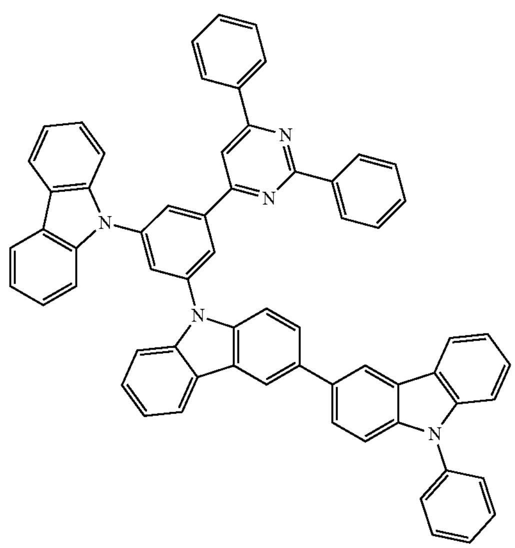
132A
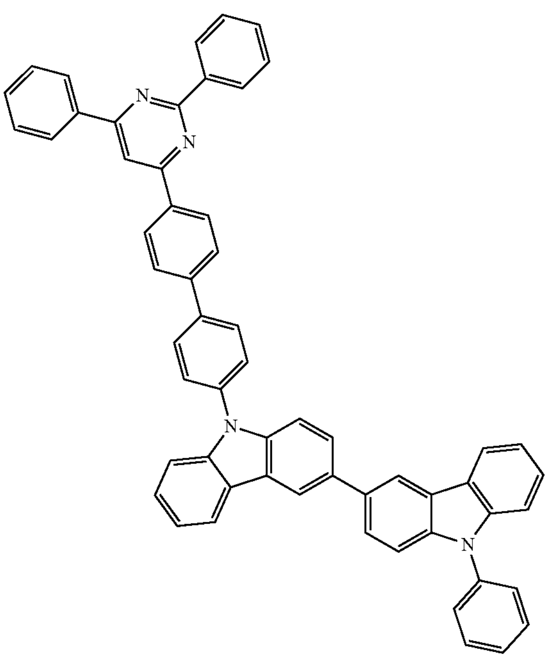

-continued
133A
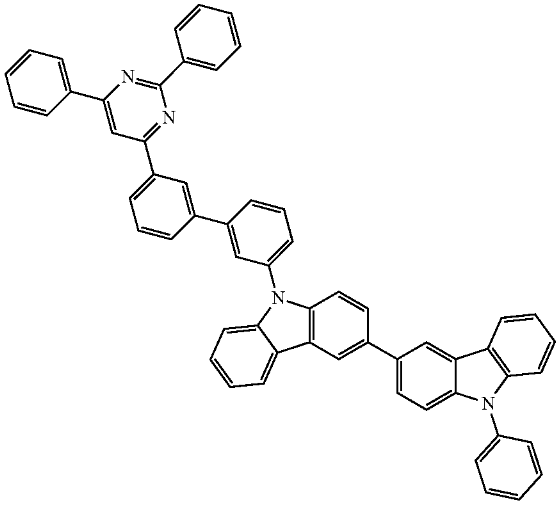
134A
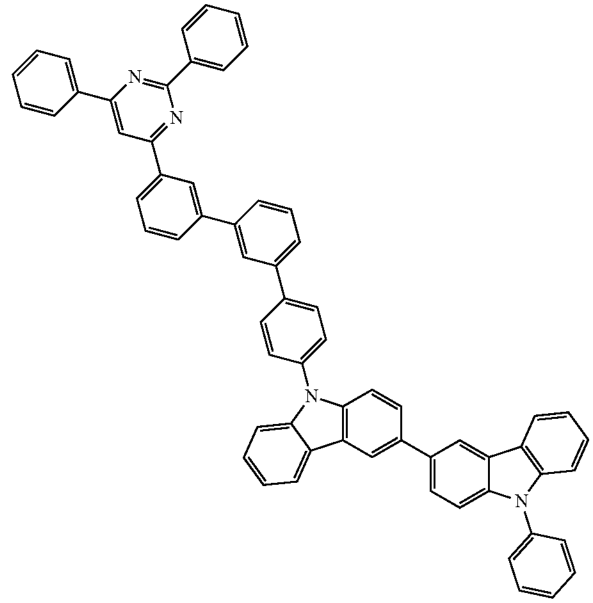
135A
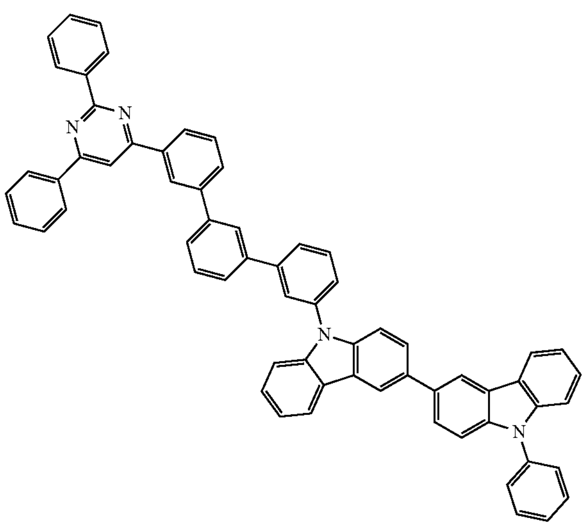
136A
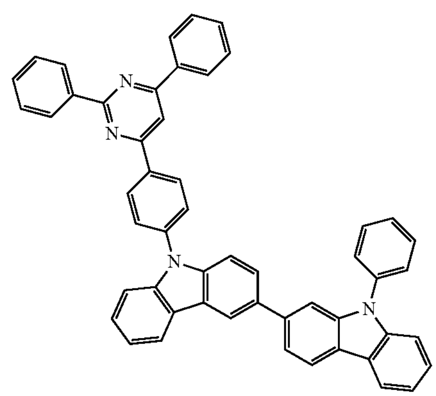

-continued
137A
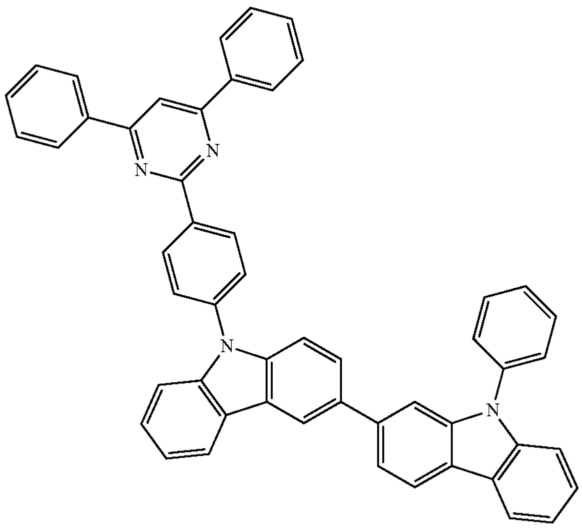
138A
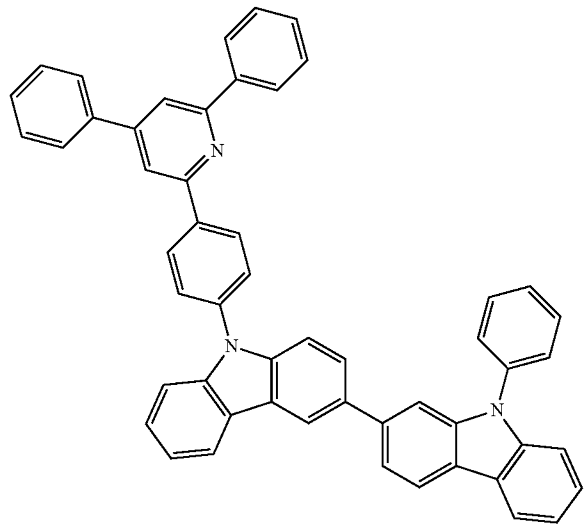
139A
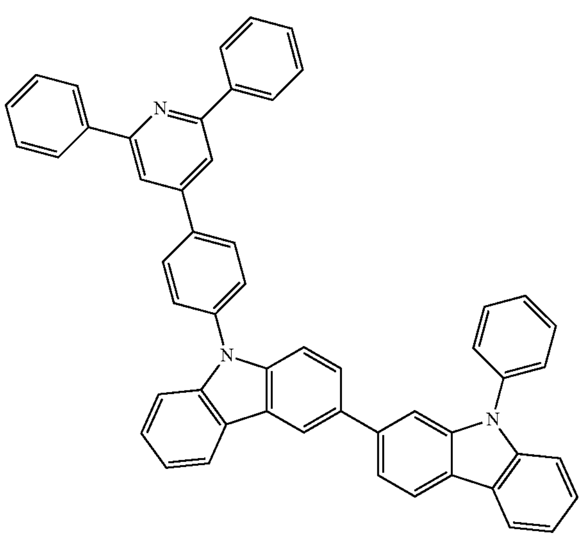
140A
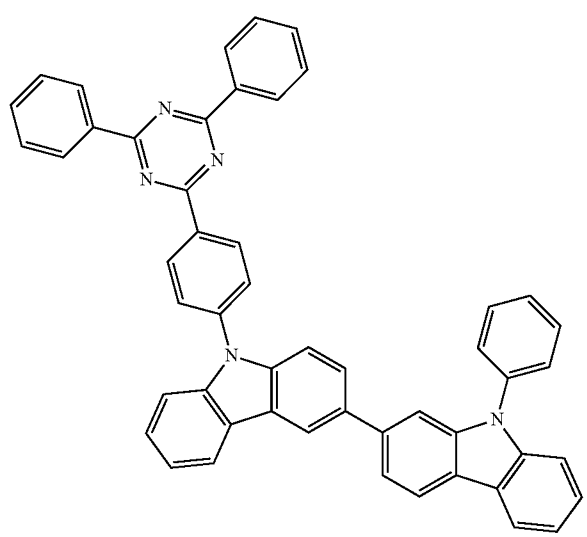

141A
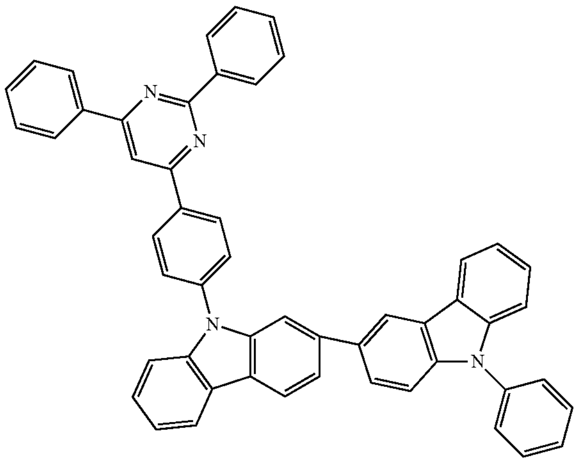
142A
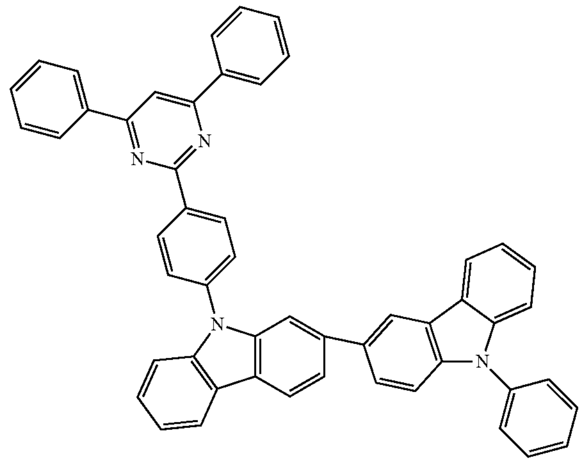
143A
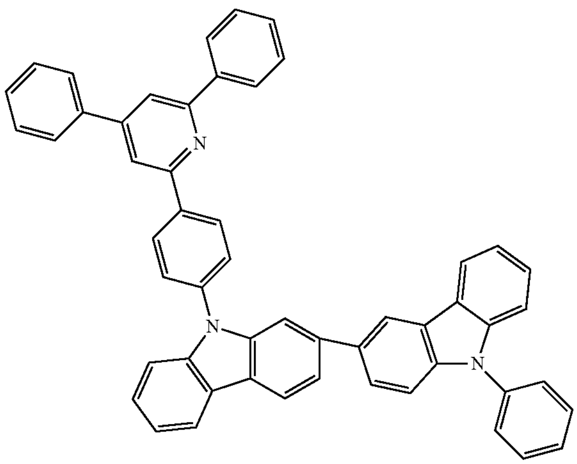
144A
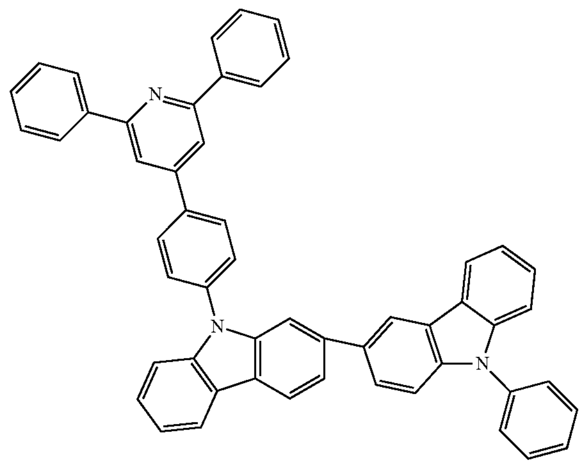
145A
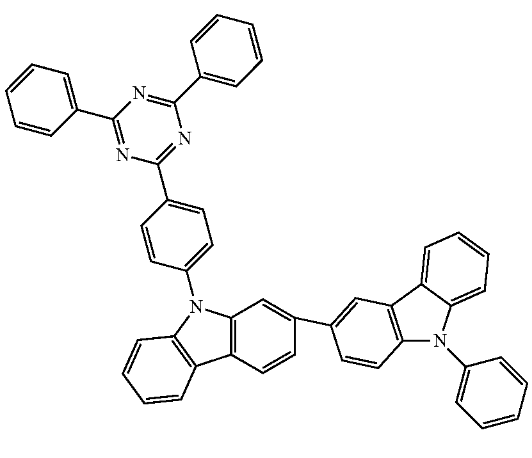
146A
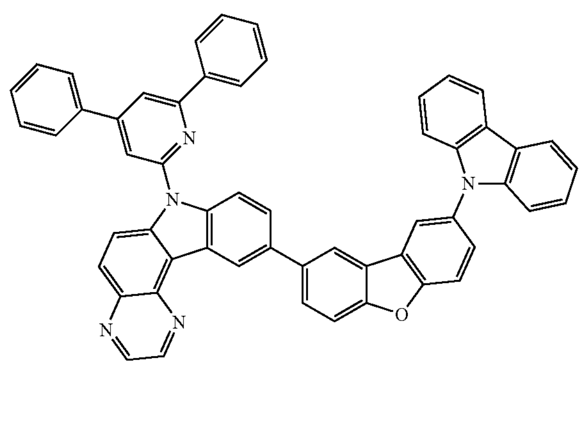

-continued
147A
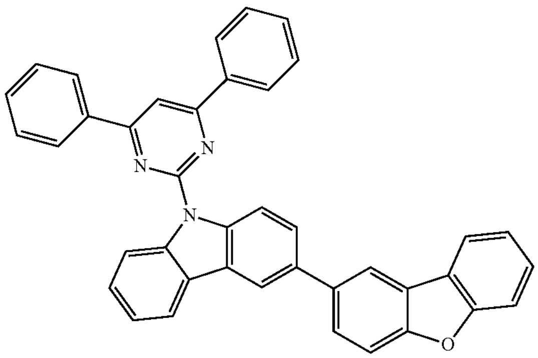
148A
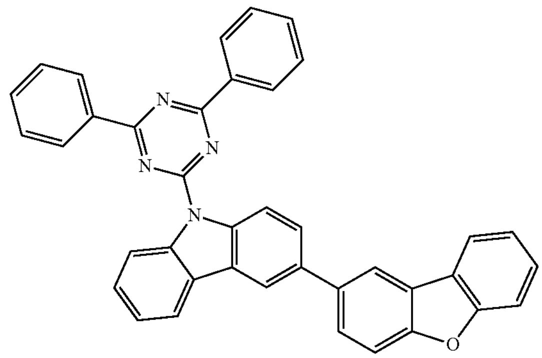
149A
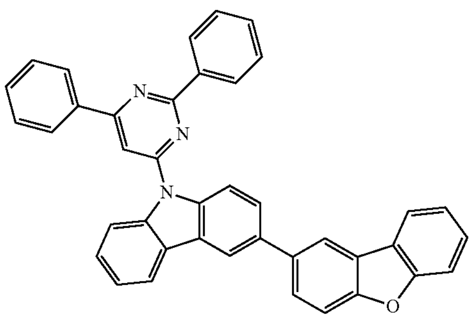
150A
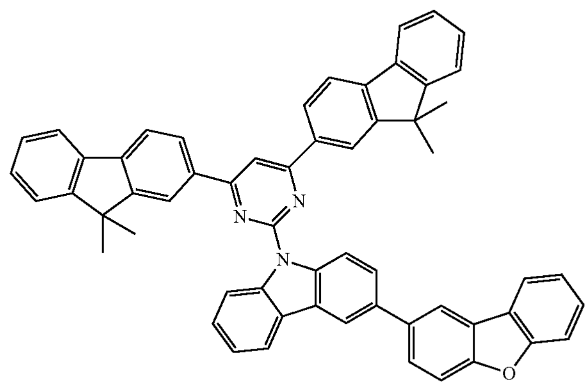
151A
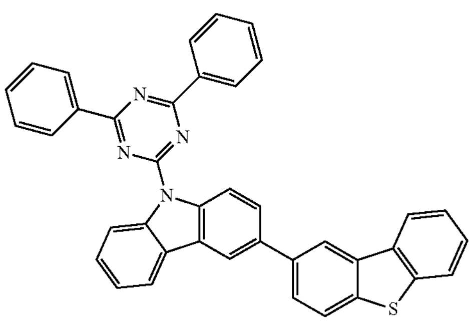
152A
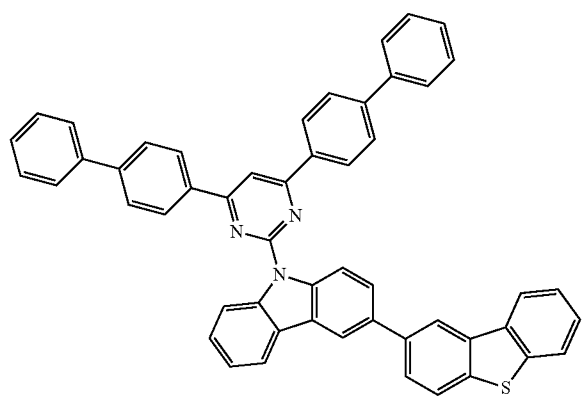
153A
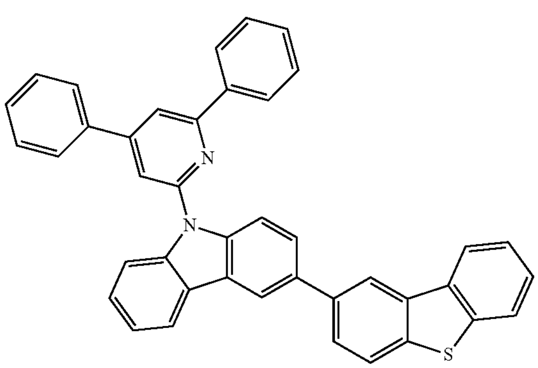
154A
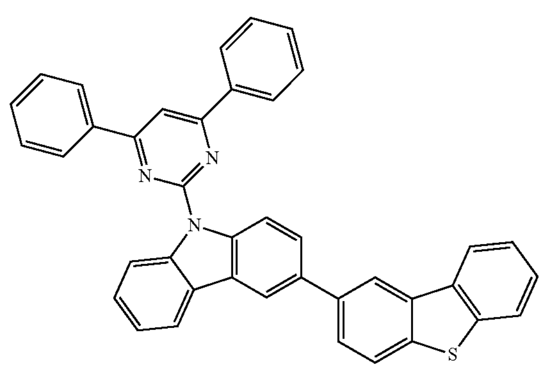

-continued
155A
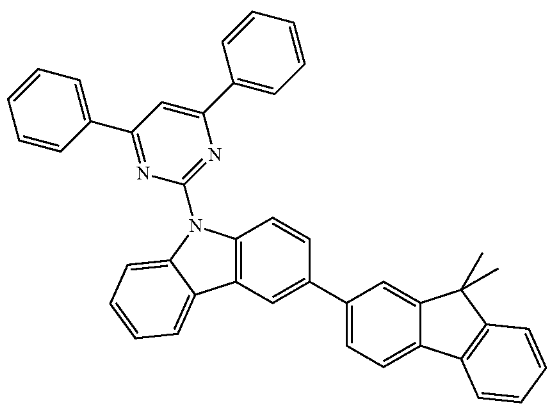
156A
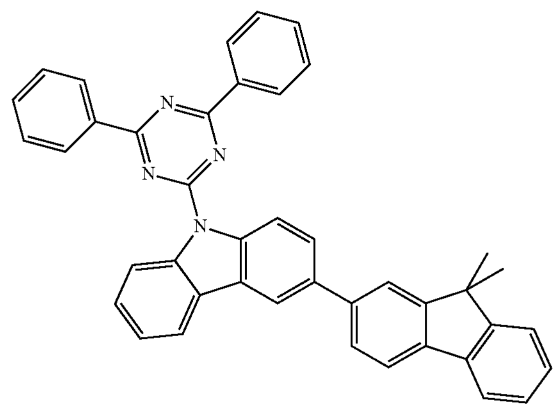
157A
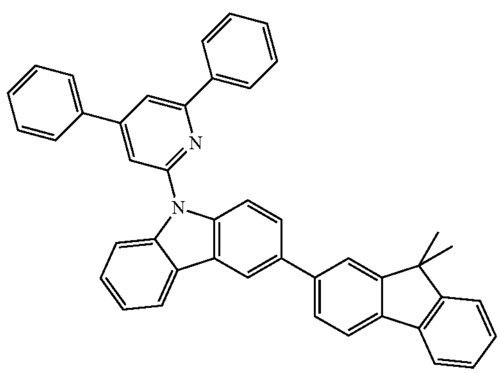
158A
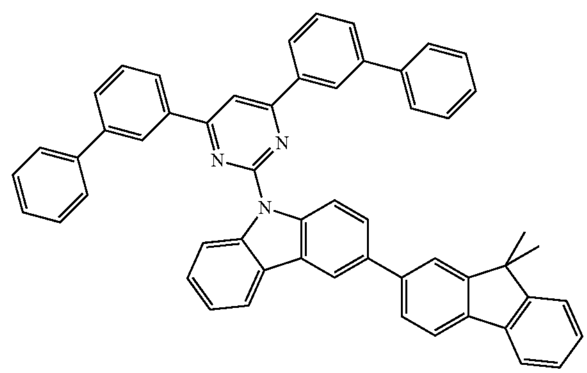
159A
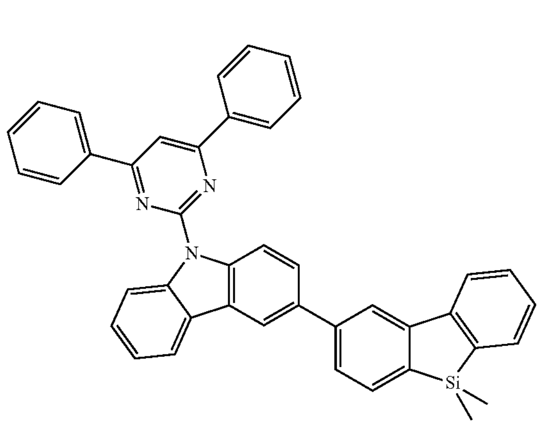
160A
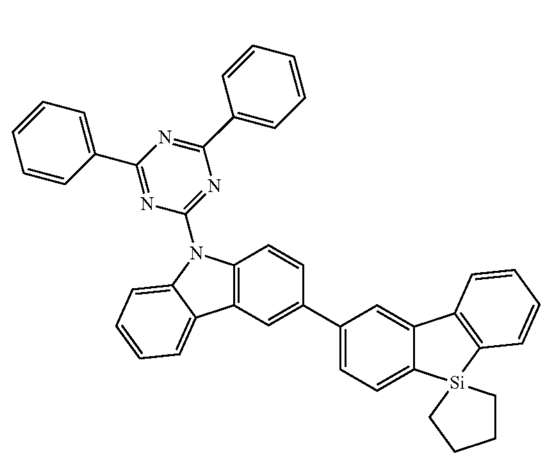

-continued
161A
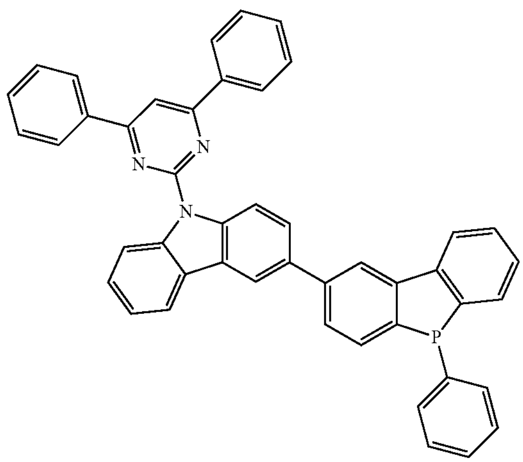
162A
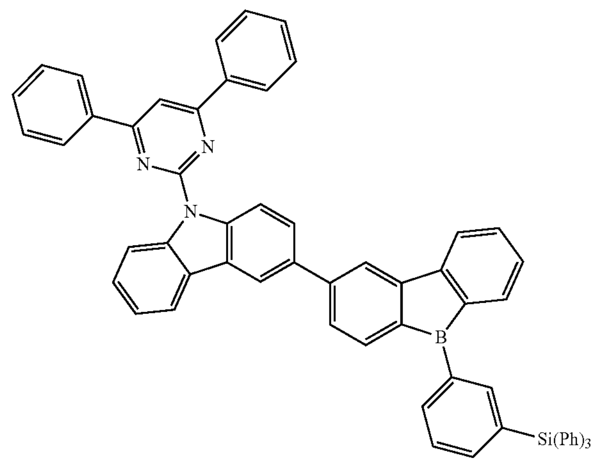
163A
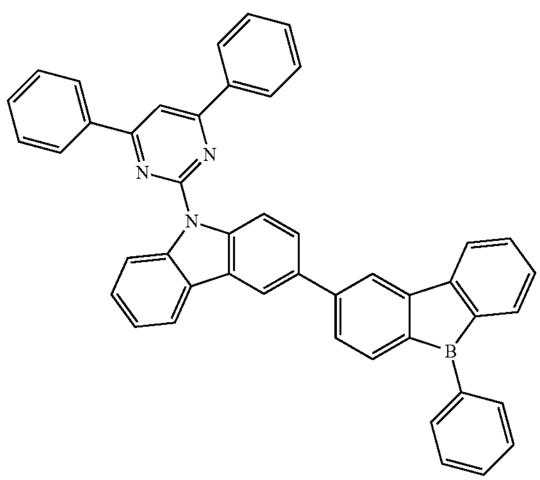
164A
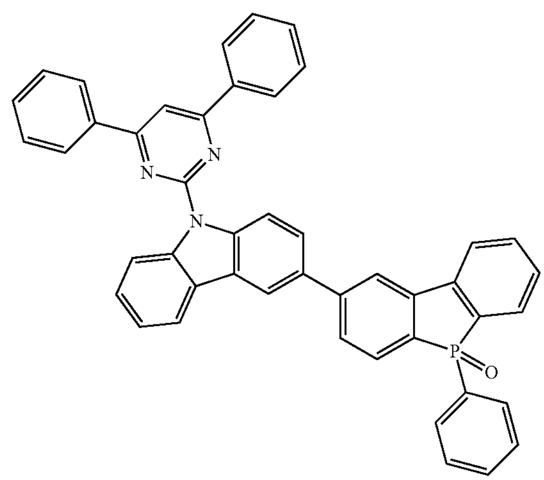
165A
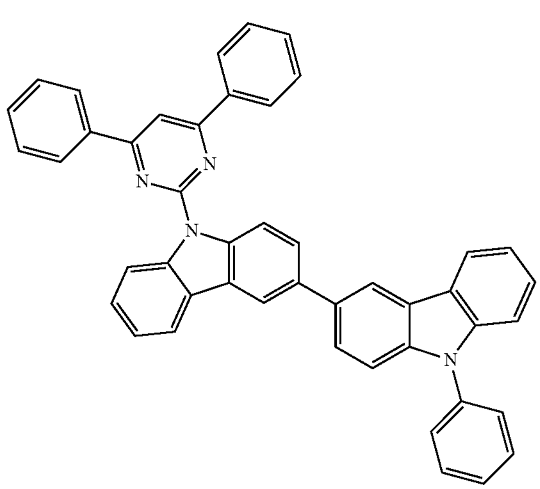
166A
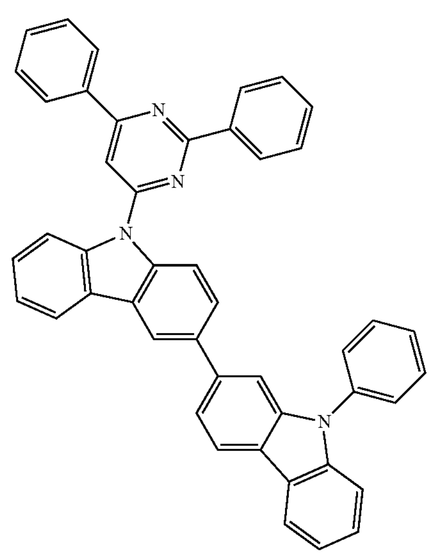

-continued
167A
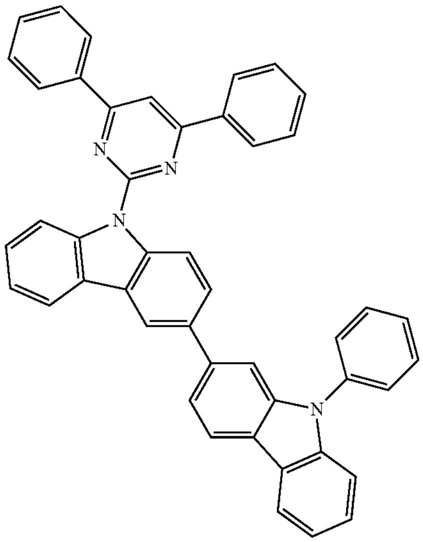
168A
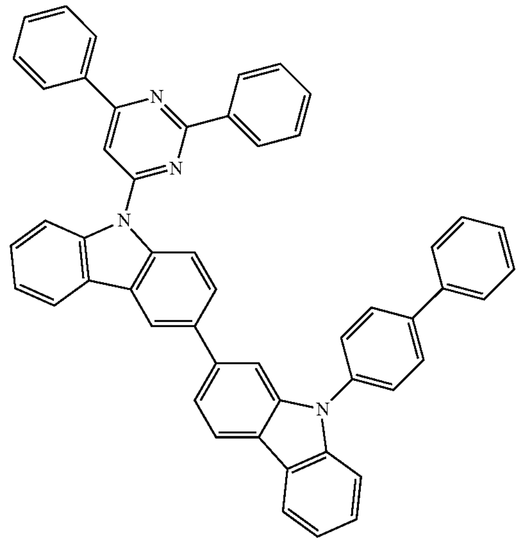
169A
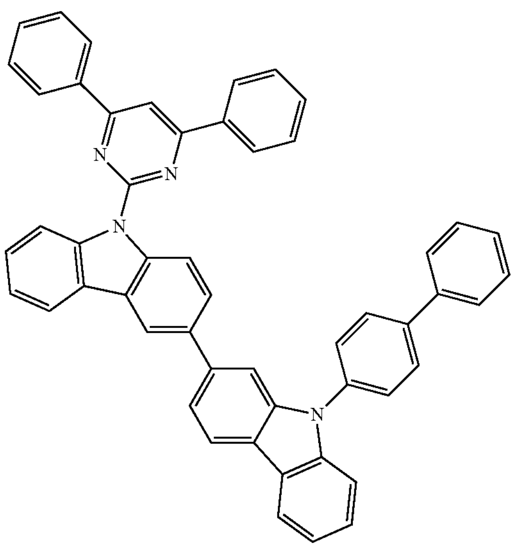
170A
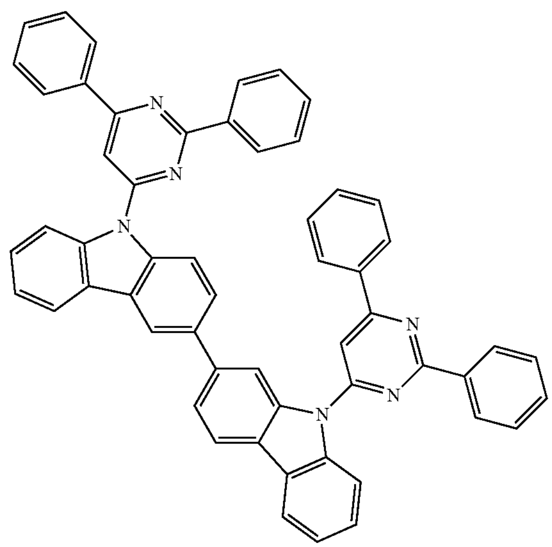
171A
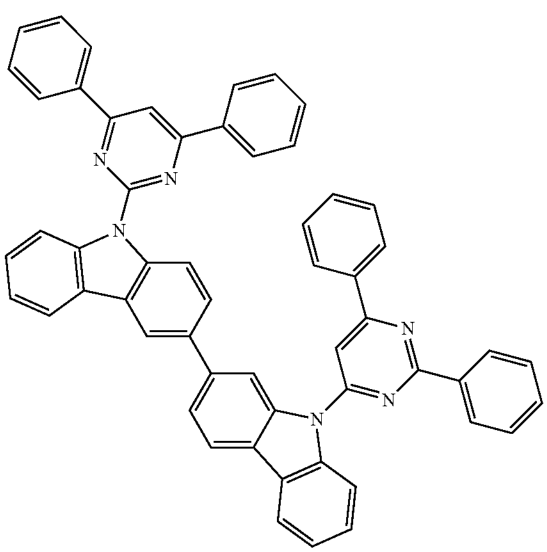
172A
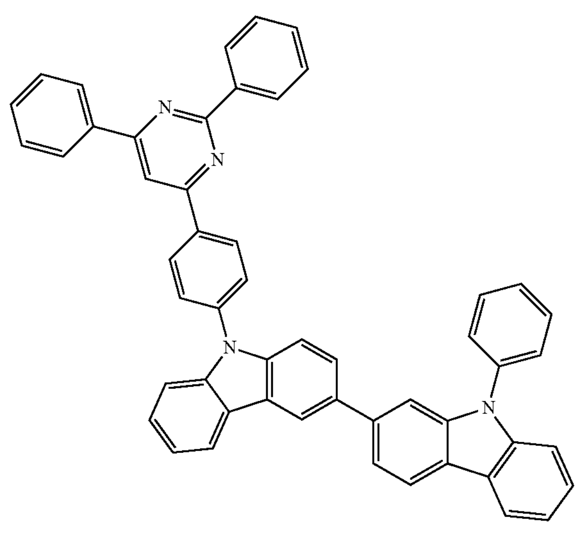

-continued
173A
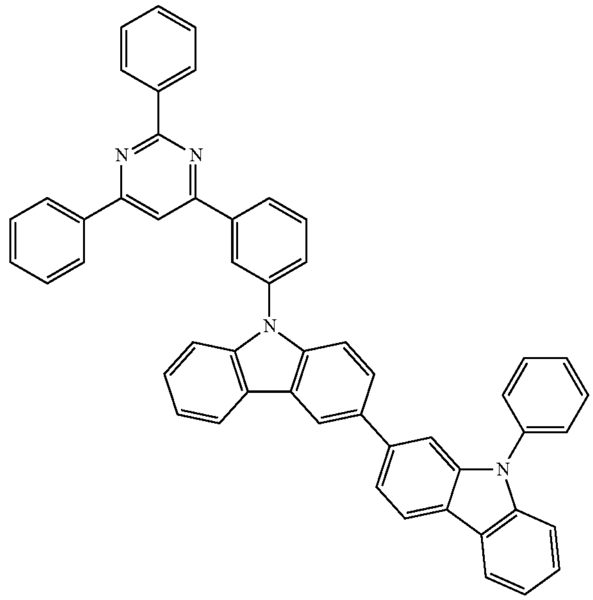
174A
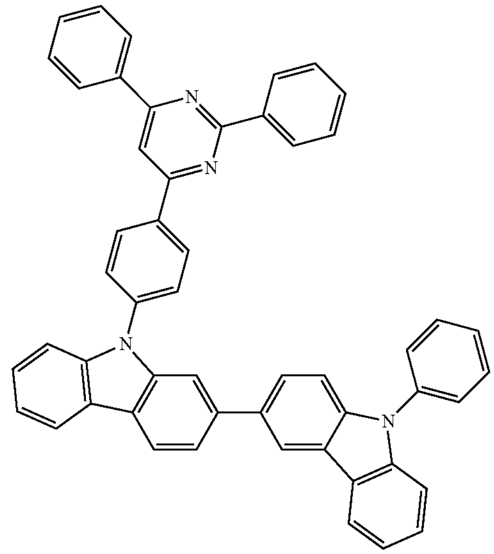
175A
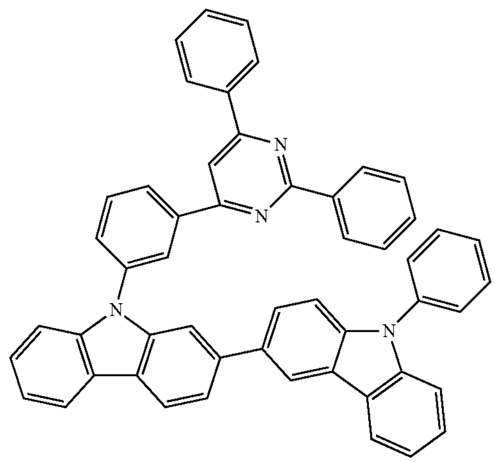
176A
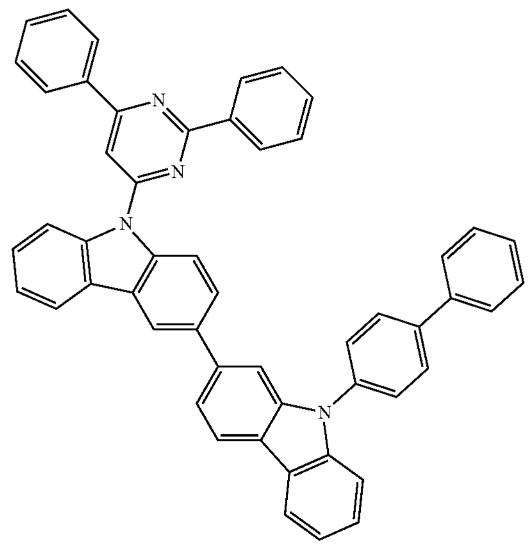
177A
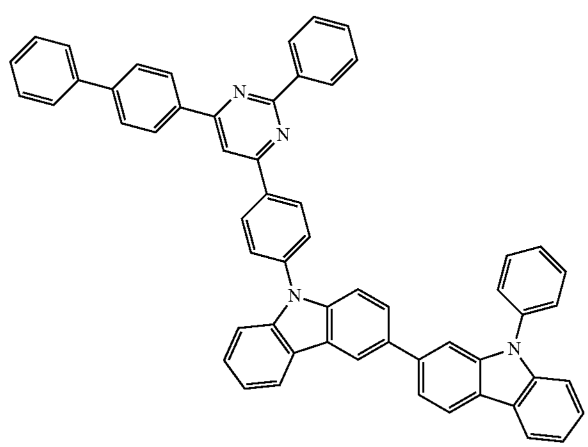
178A
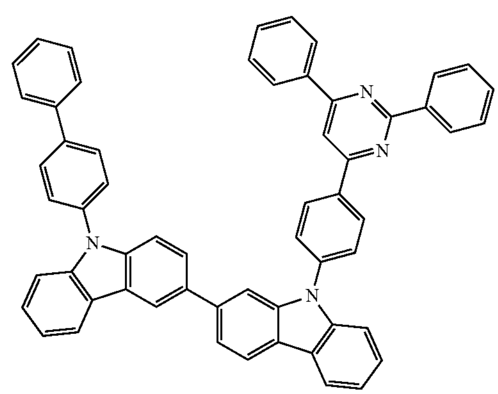

-continued
179A
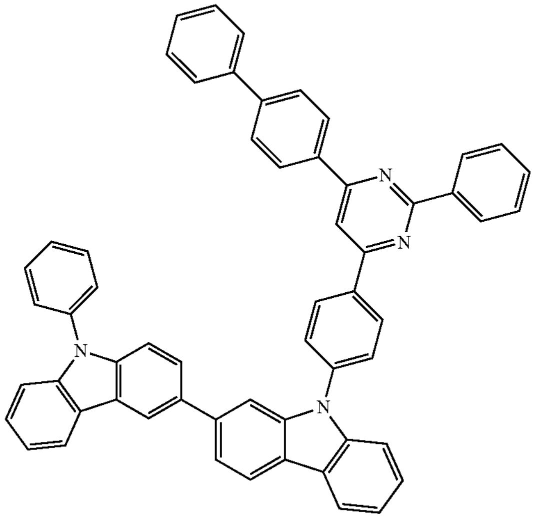
180A
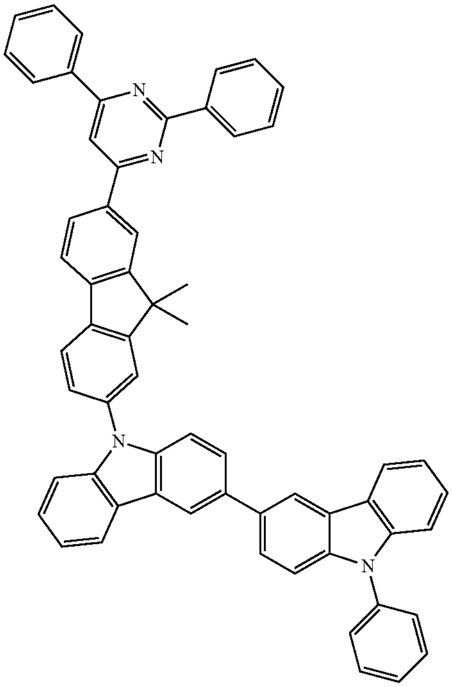
181A
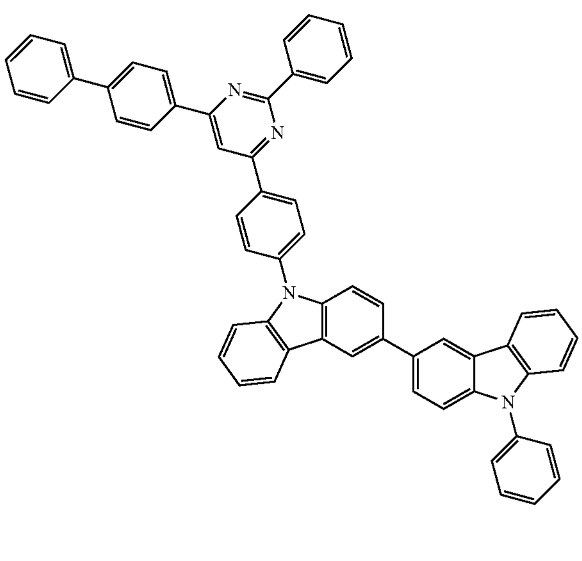
182A
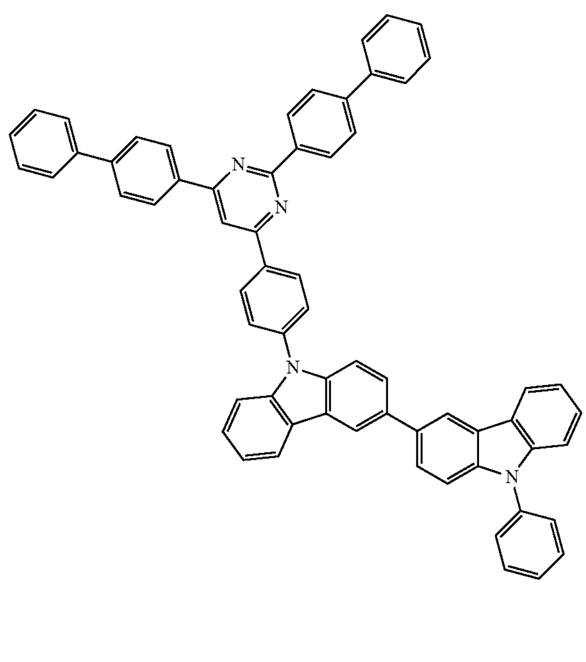

-continued
183A
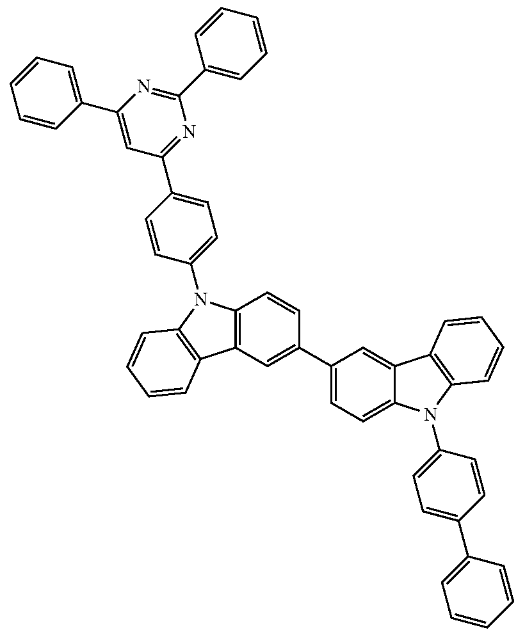
184A
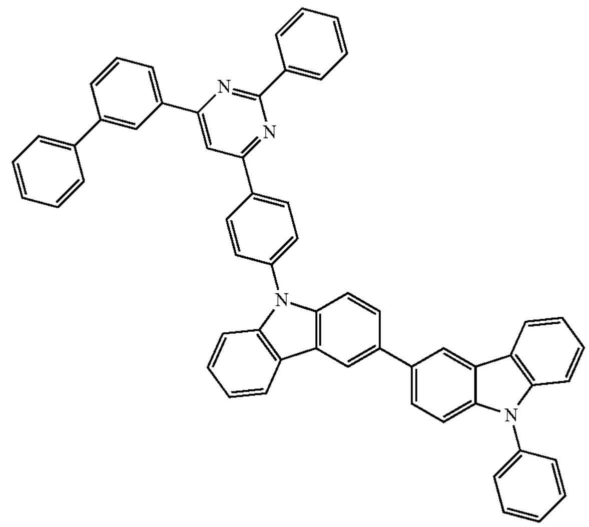
185A
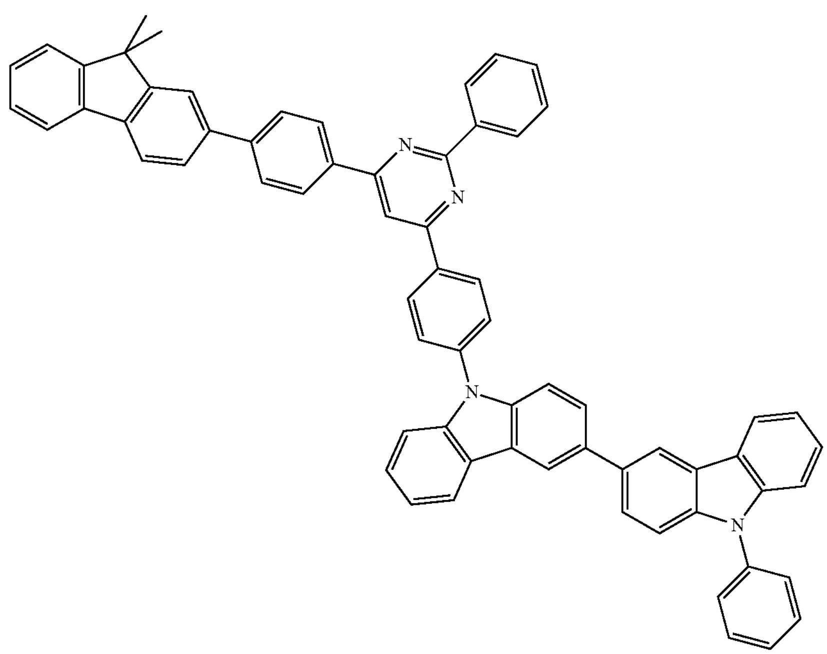

-continued
186A
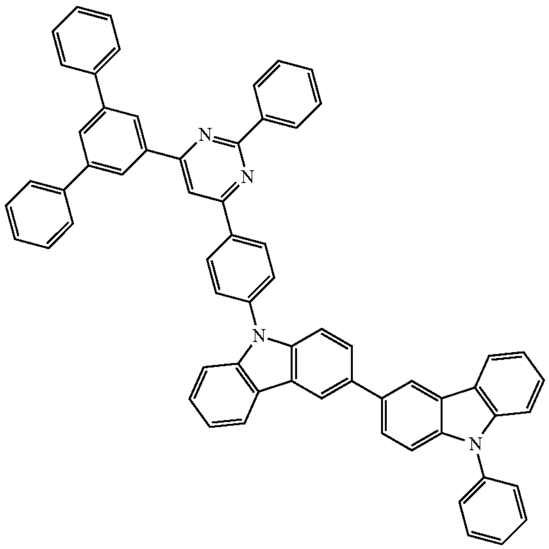
187A
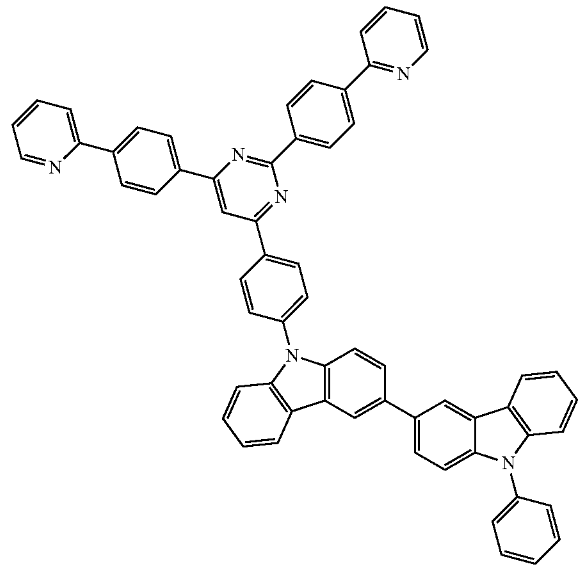
188A
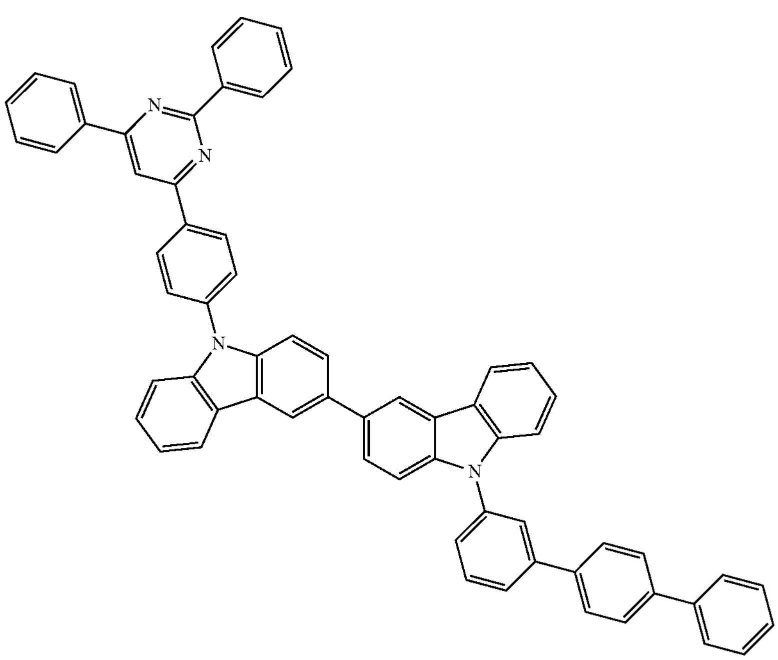

-continued
189A
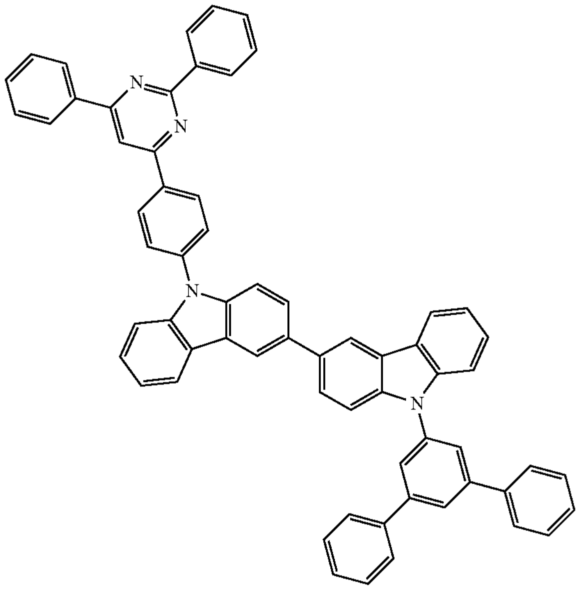
190A
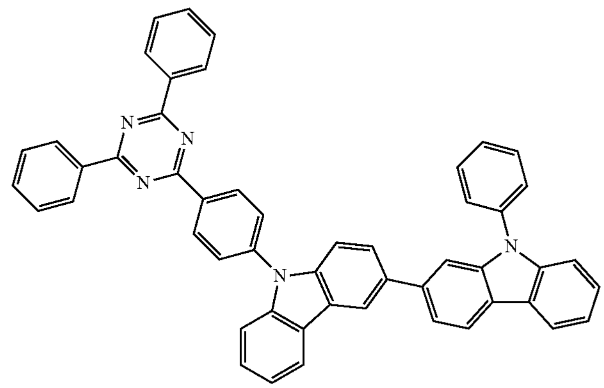
191A
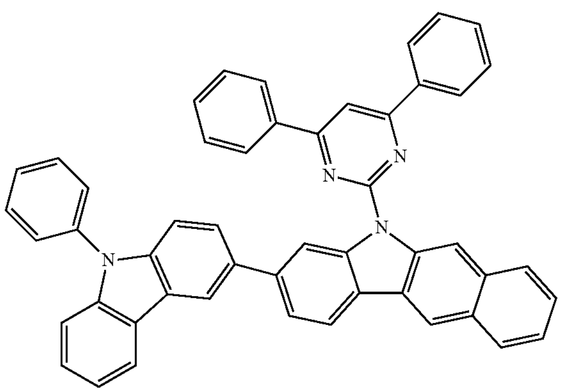
192A
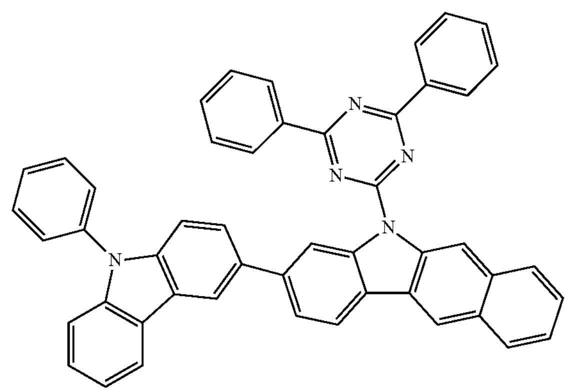
193A
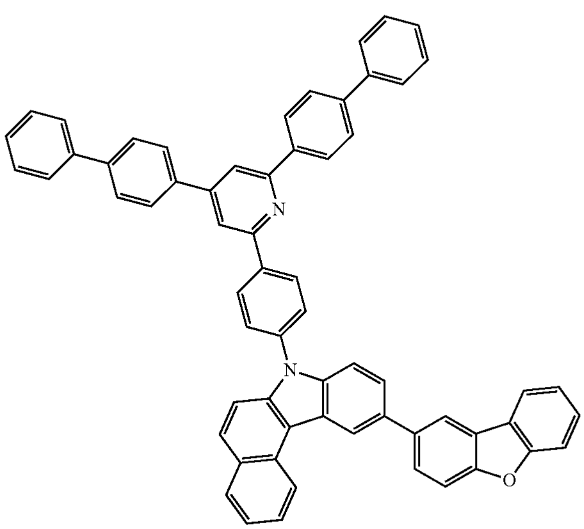
194A
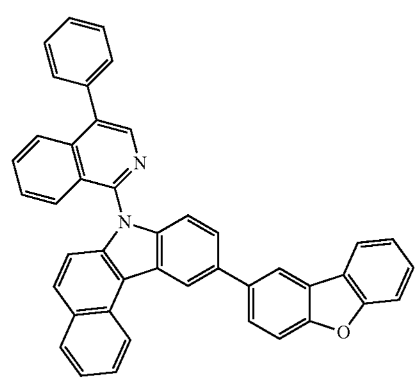

-continued
195A
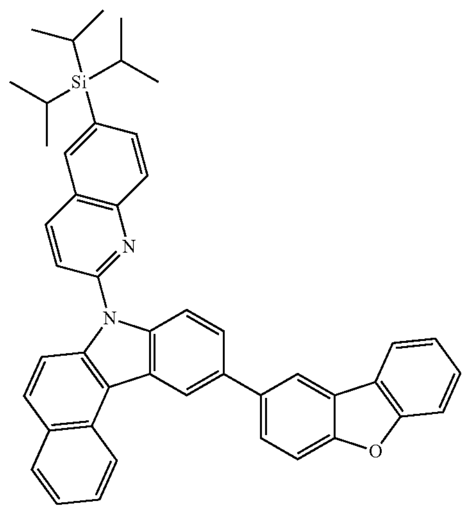
196A
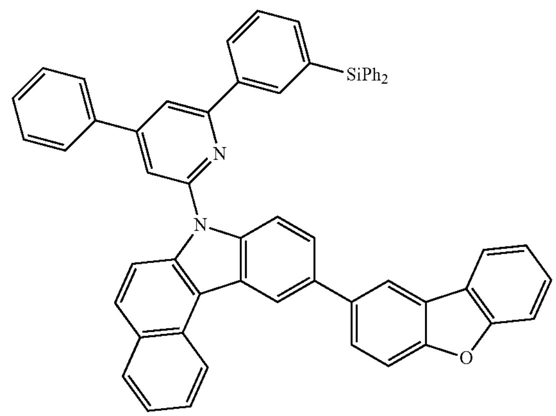
197A
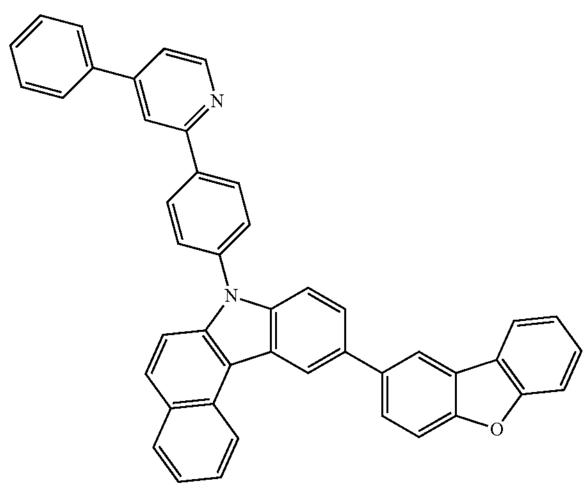
198A
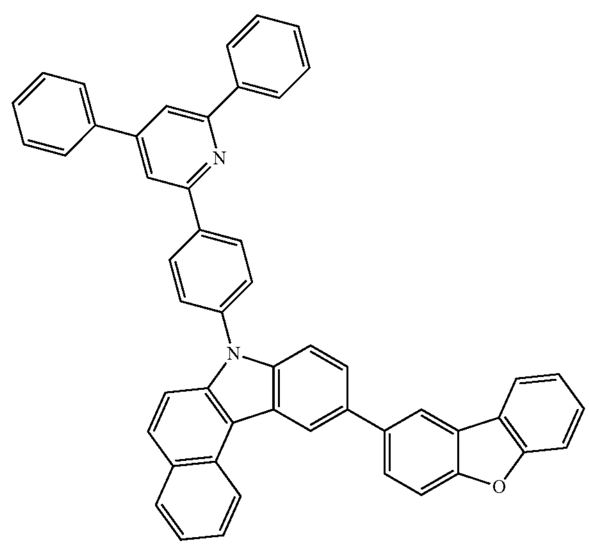
199A
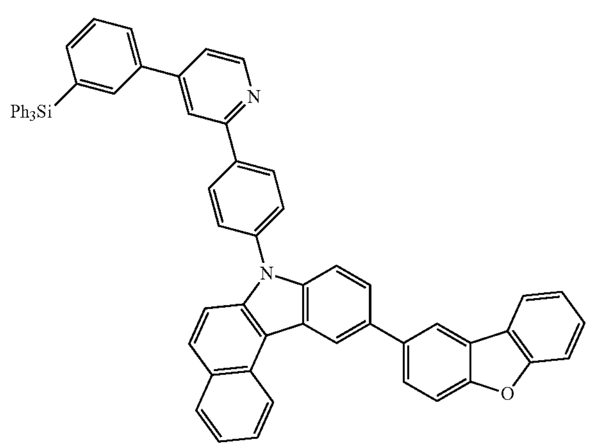
200A
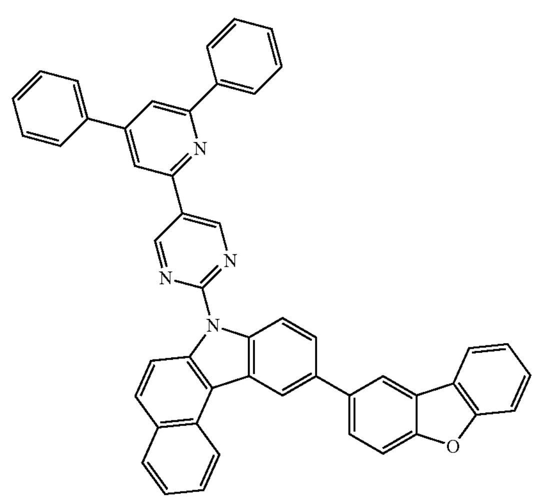

-continued
201A
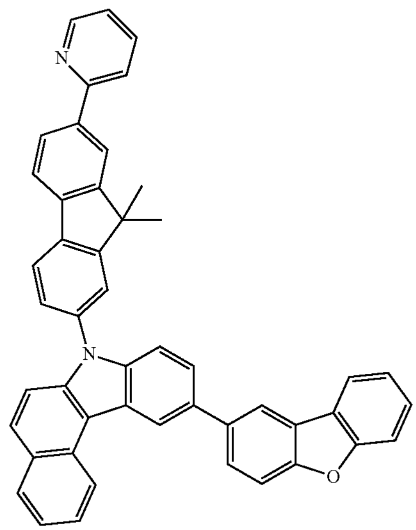
202A
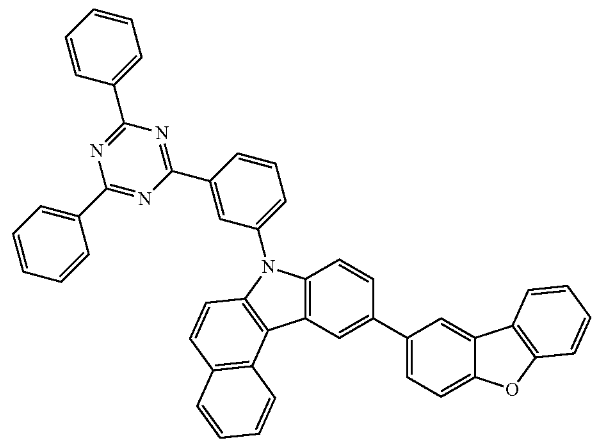
203A
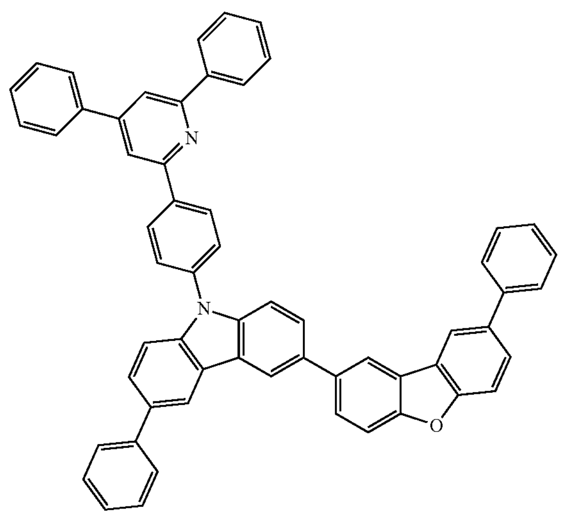
204A
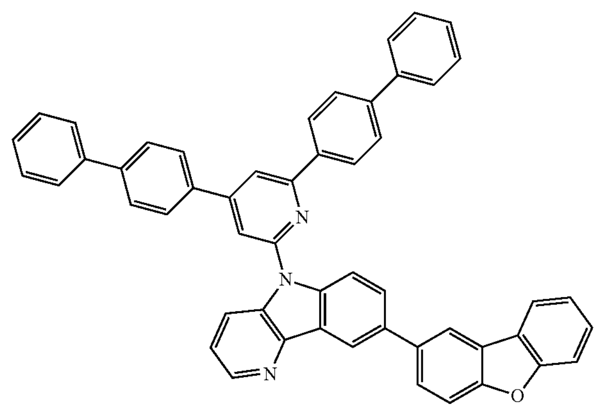
205A
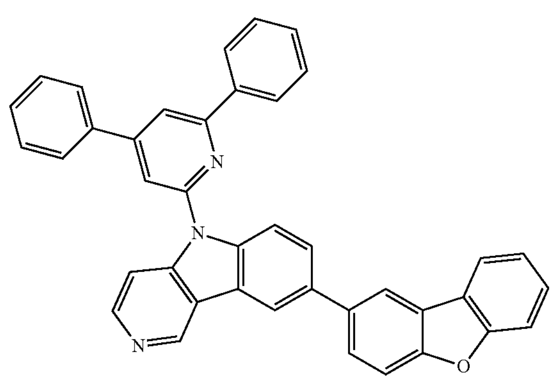
206A
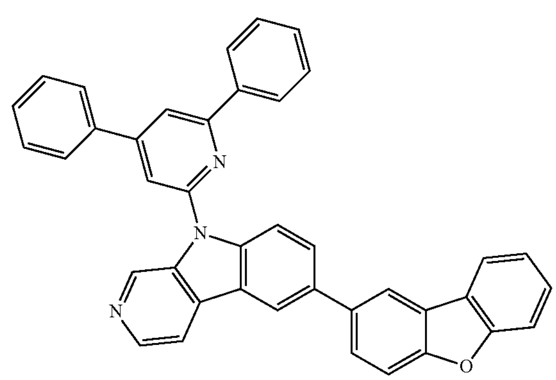

-continued
207A
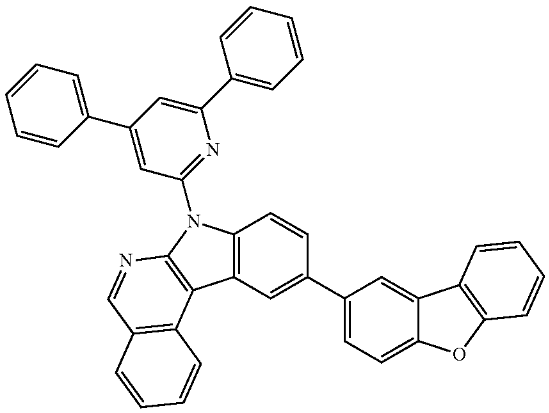
208A
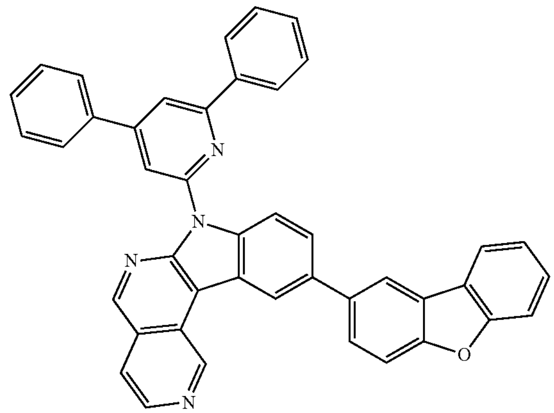
209A
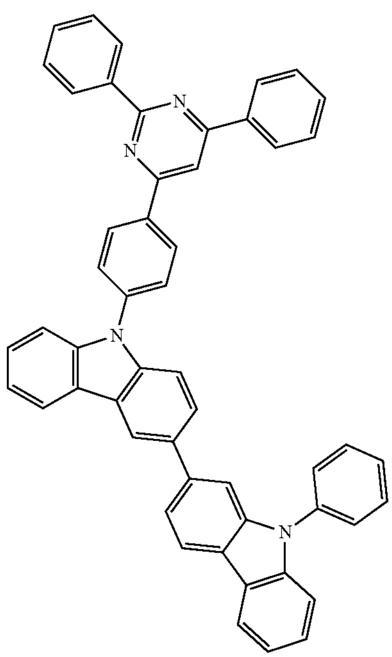
210A
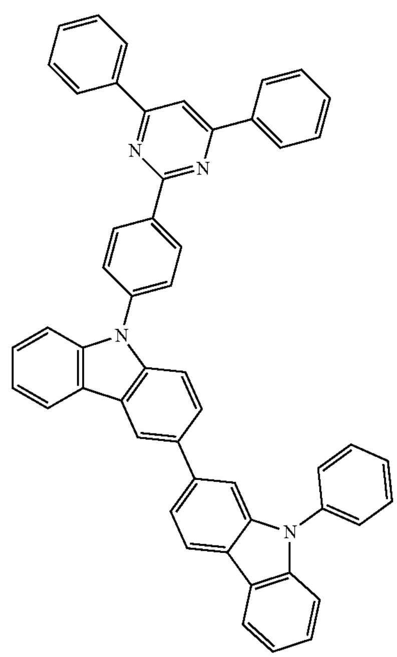

-continued
211A
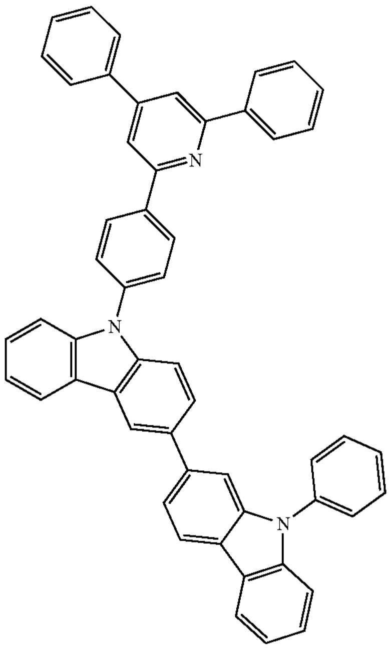
212A
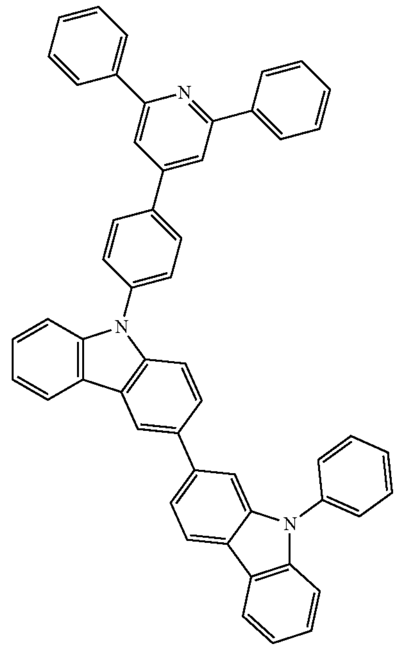
101B
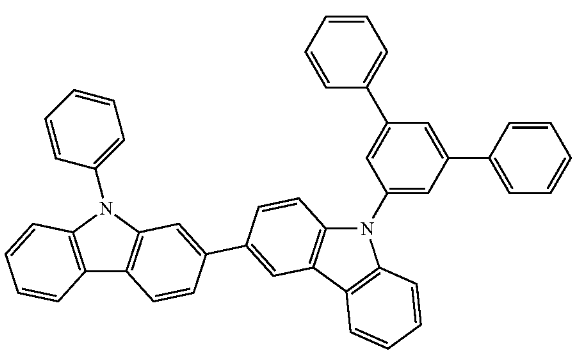
102B
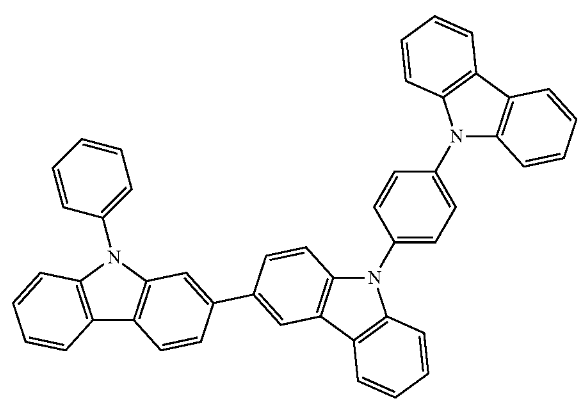
103B
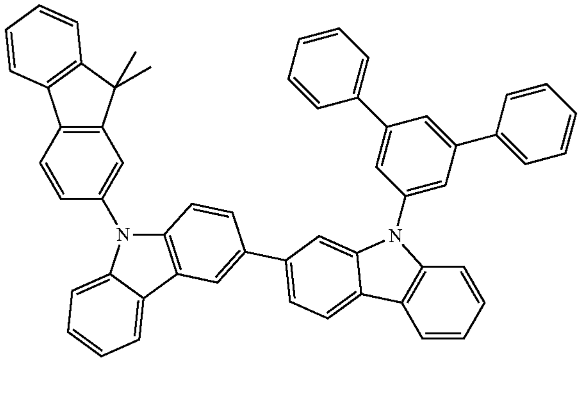
104B
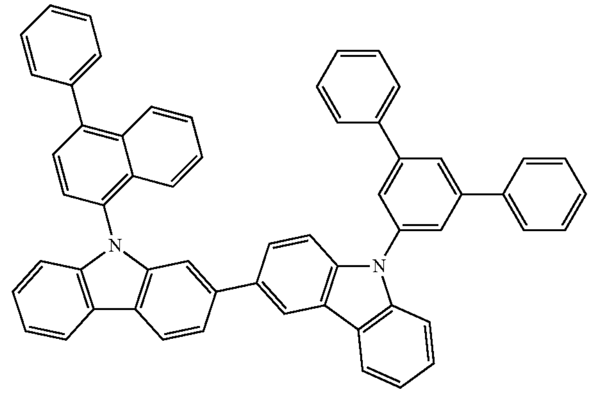

-continued
105B
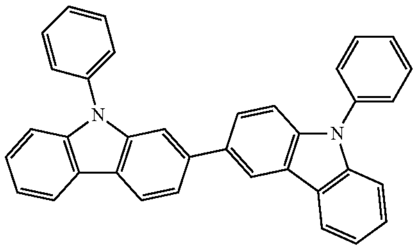
106B
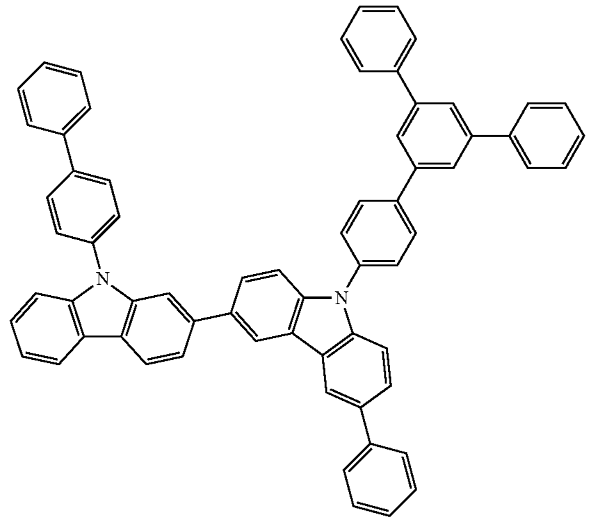
107B
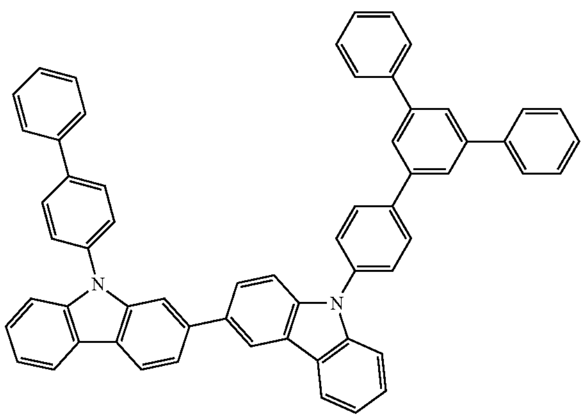
108B
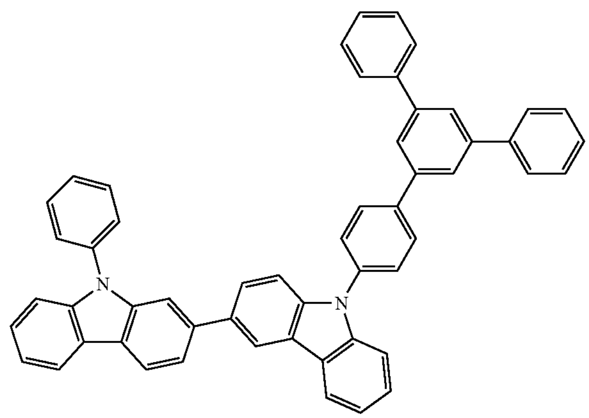
109B
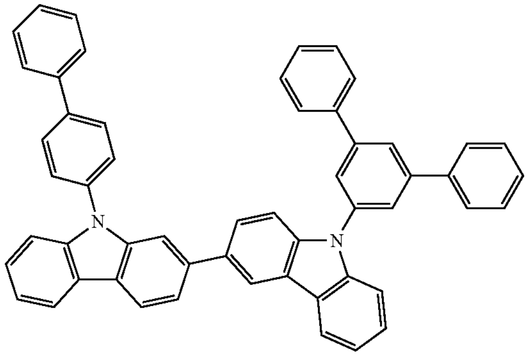
110B
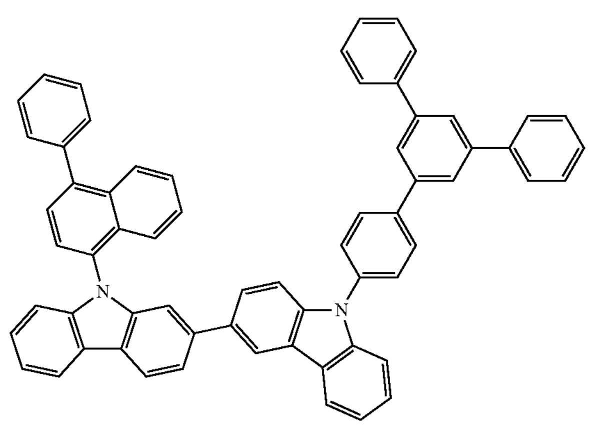

-continued
111B
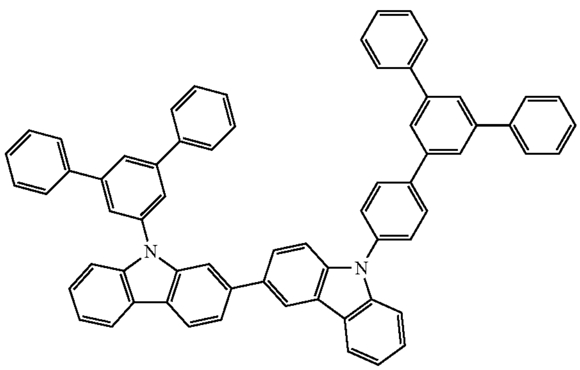
112B
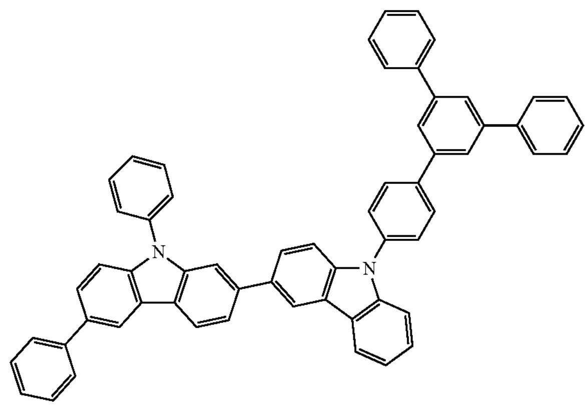
113B
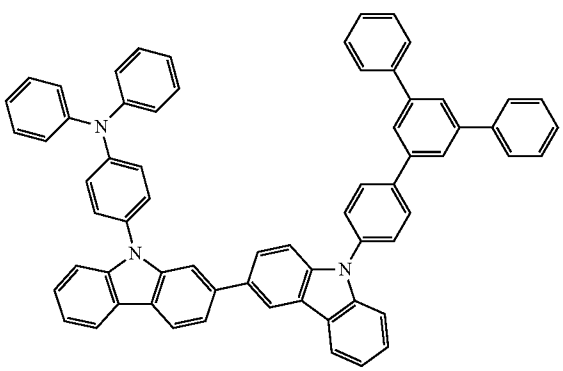
114B
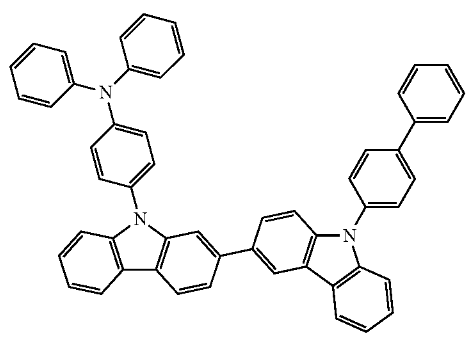
115B
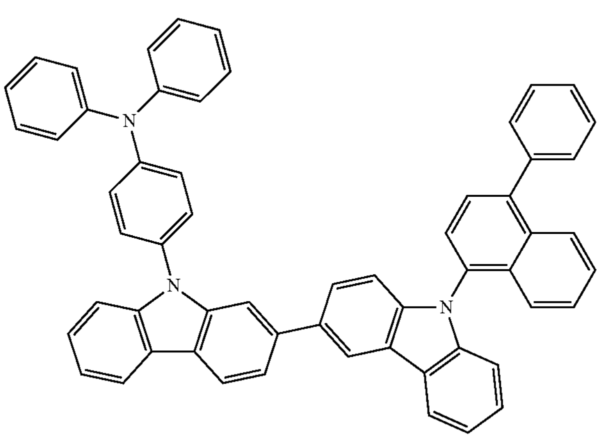

-continued
116B
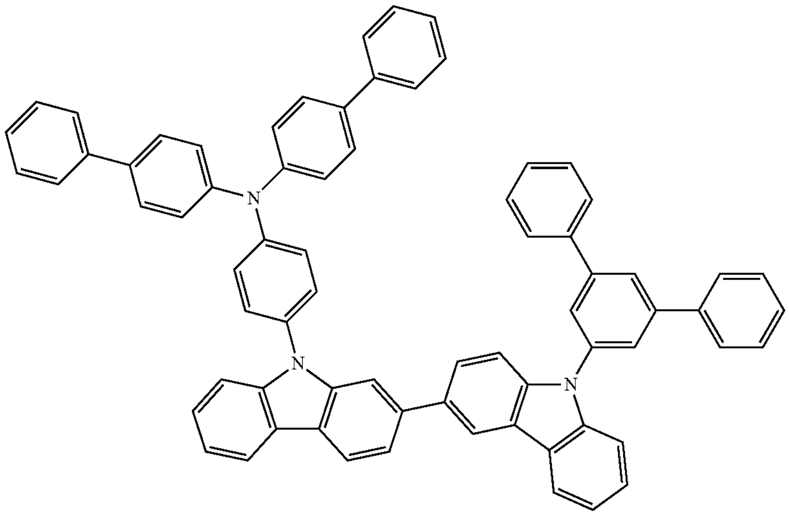
117B
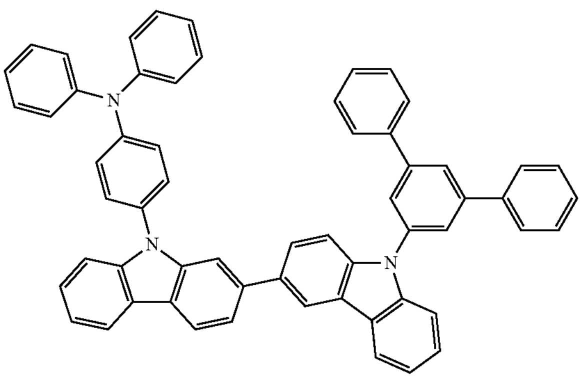
118B
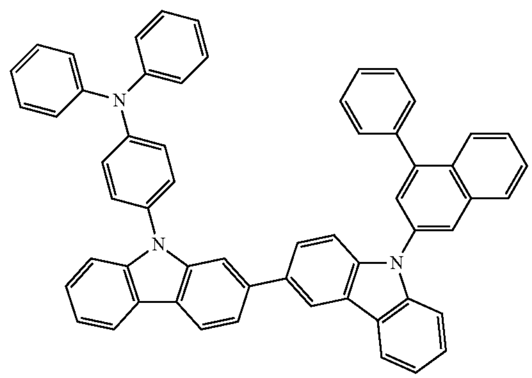
119B
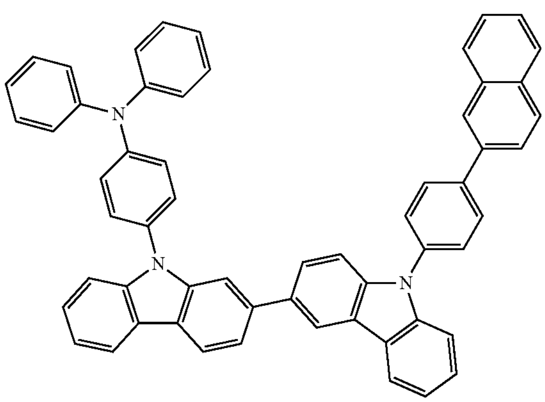
120B
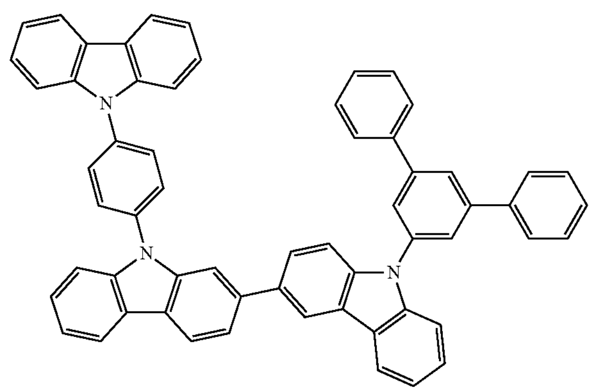

-continued
121B
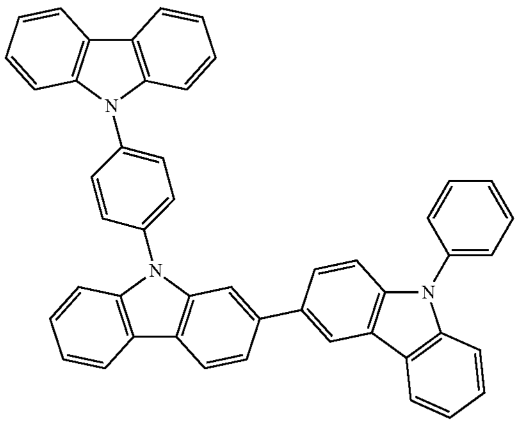
122B
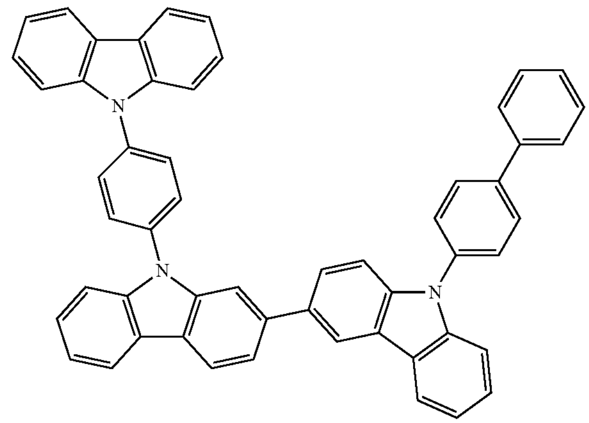
123B
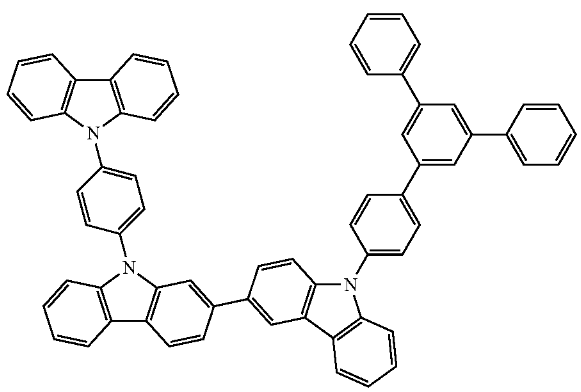
124B
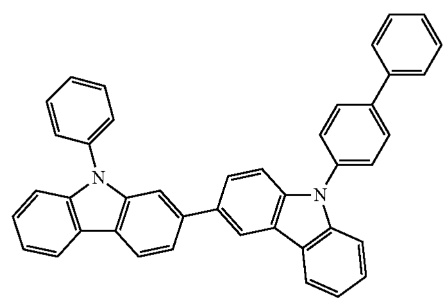
125B
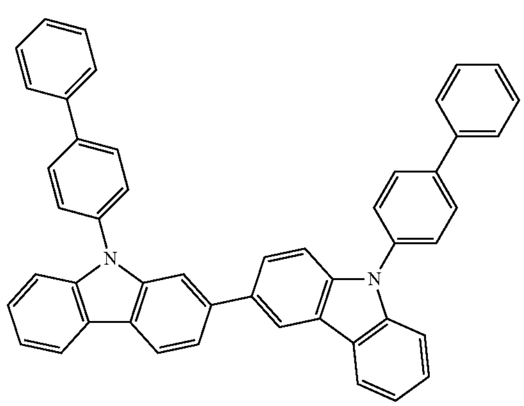
126B
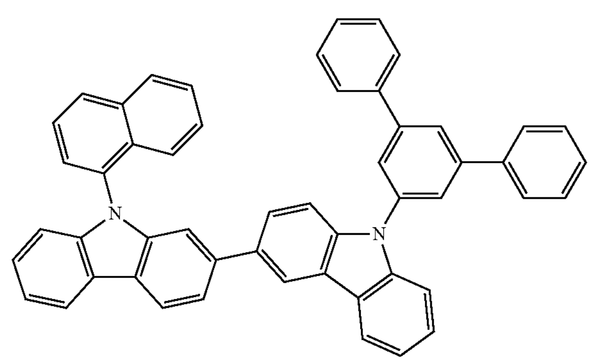

-continued
127B
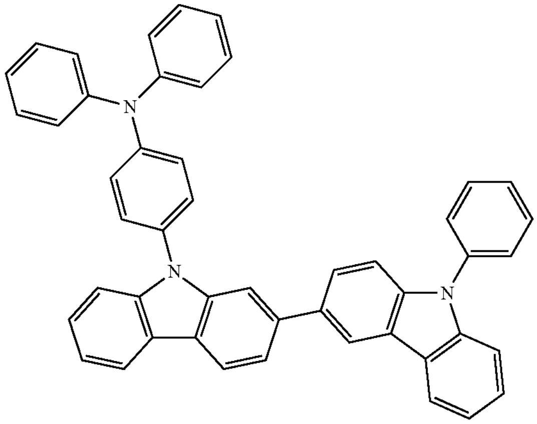
128B
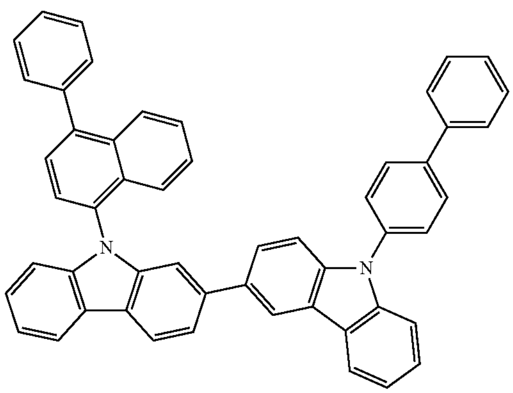
129B
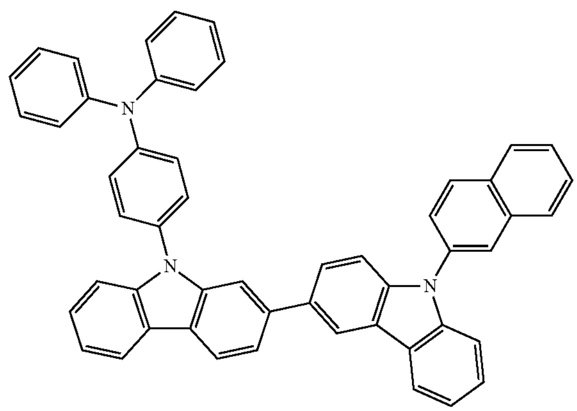
130B
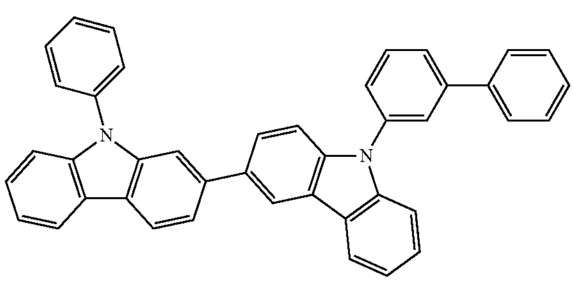
131B
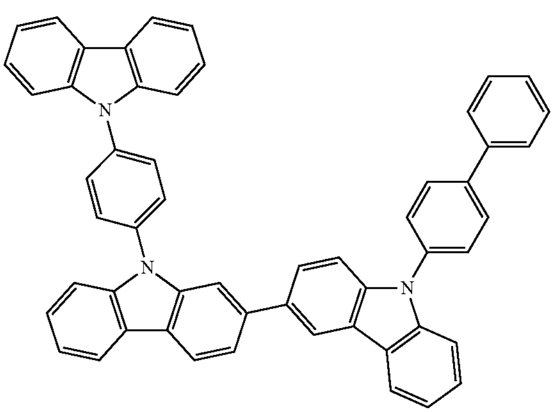

-continued
132B
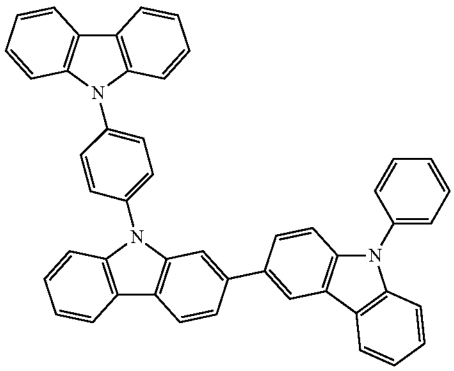
133B
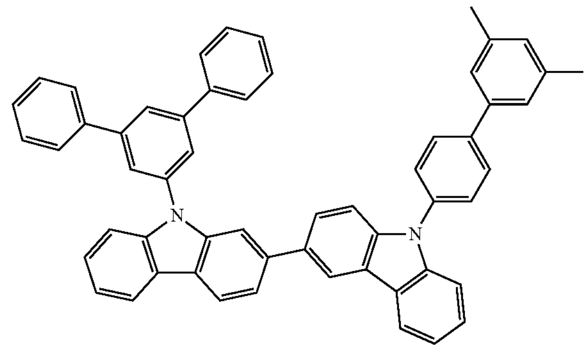
134B
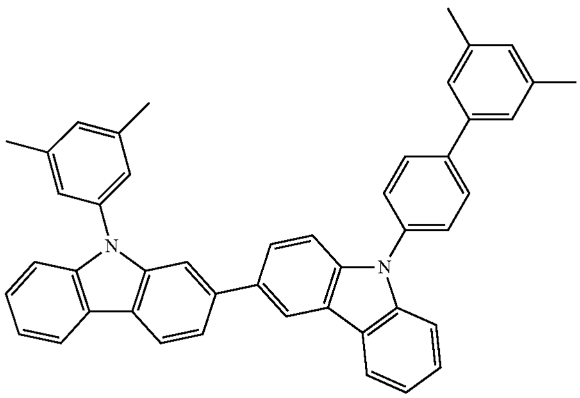
135B
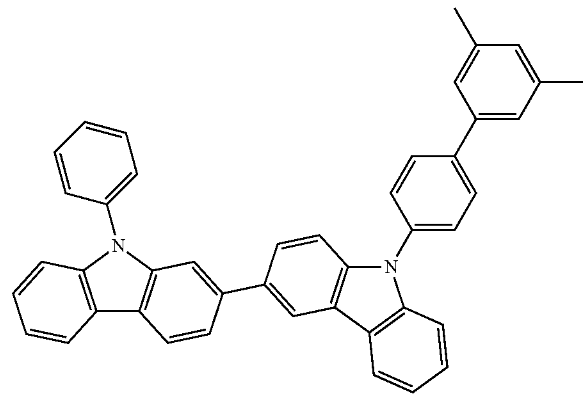
136B
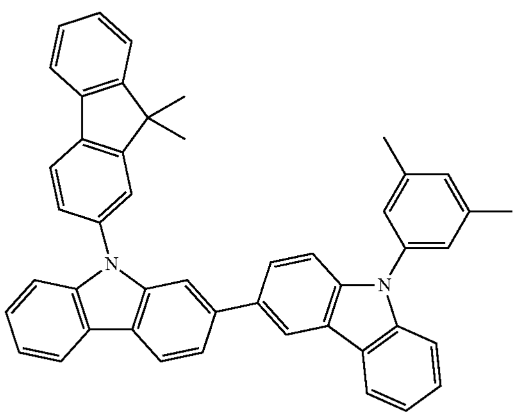
137B
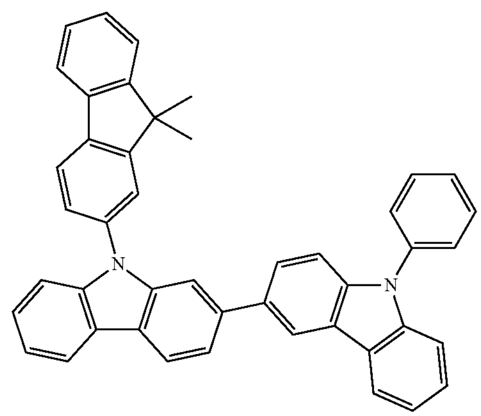
138B
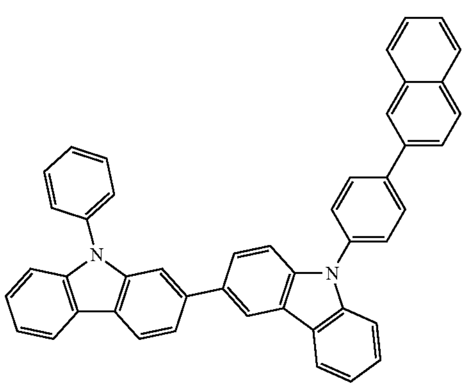
139B
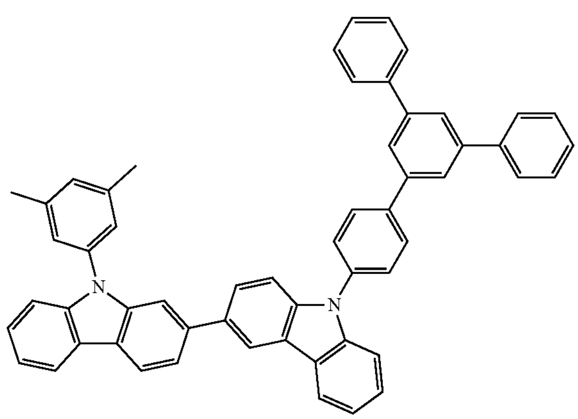

-continued
140B
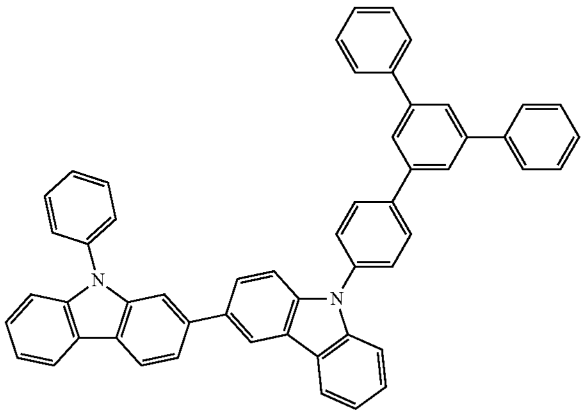
141B
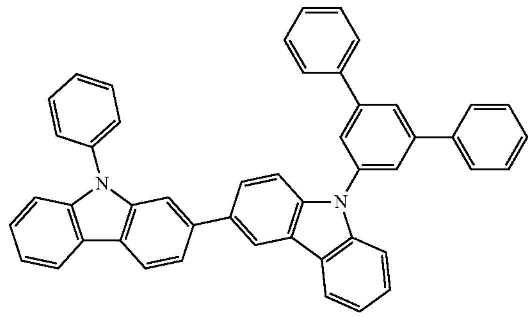
142B
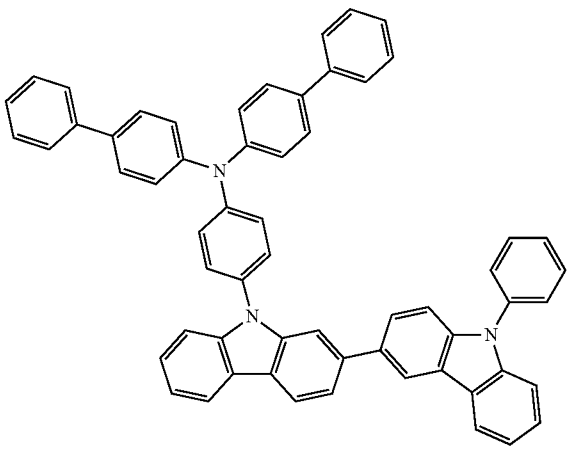
143B
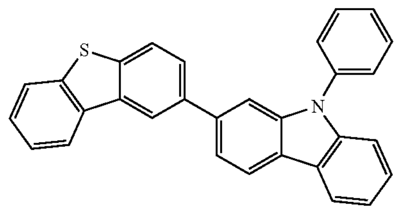
144B
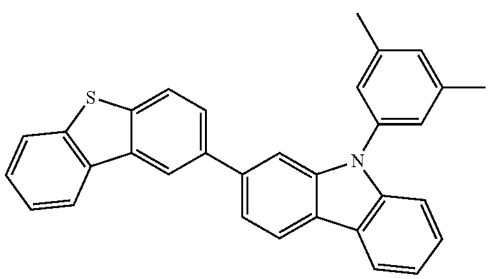
145B
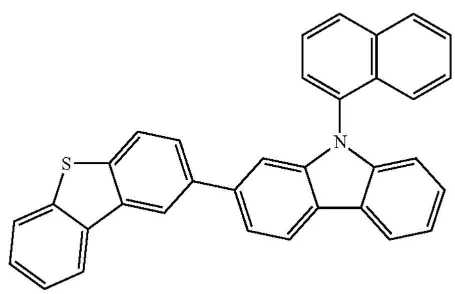
146B
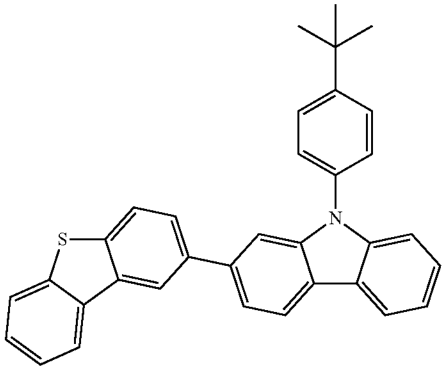
147B
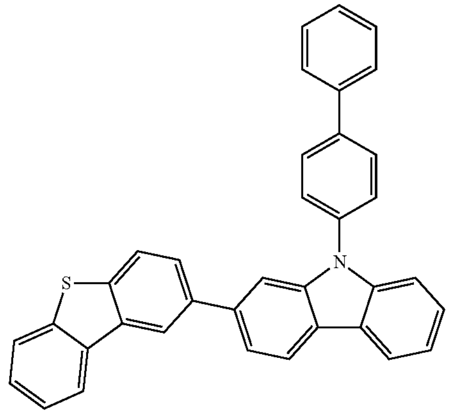

-continued
148B
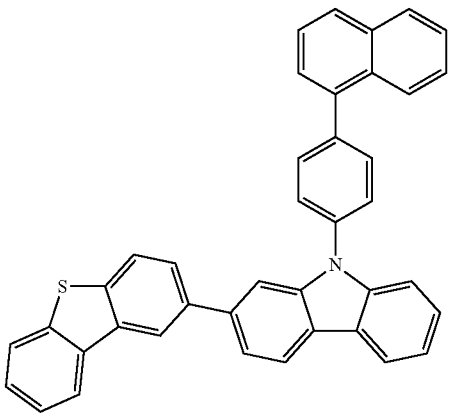
149B
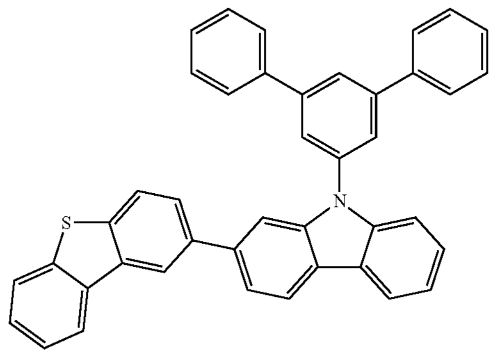
150B
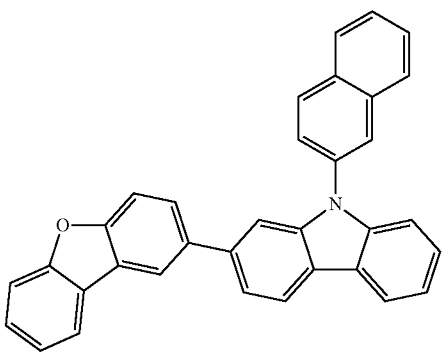
151B
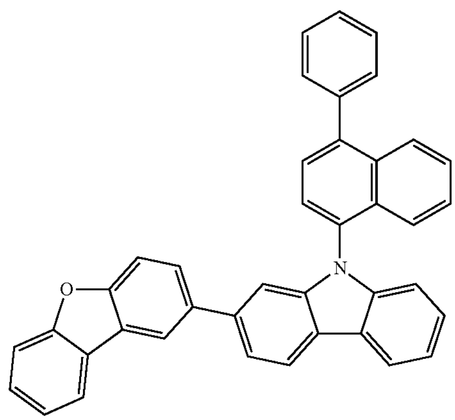
152B
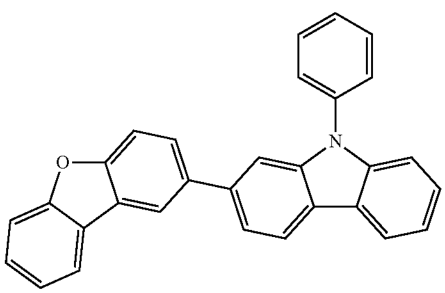
153B
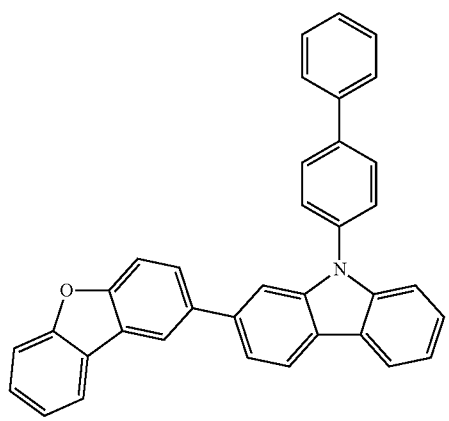
154B
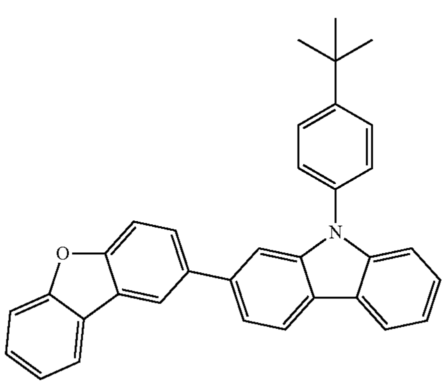
155B
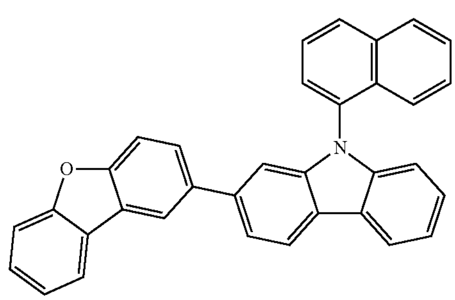

-continued
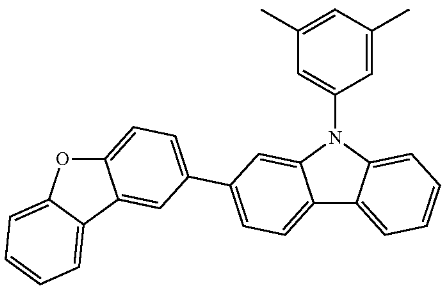
156B
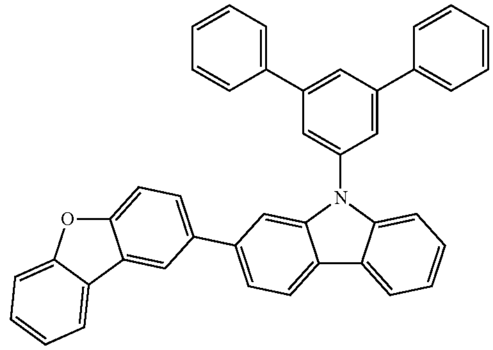
157B
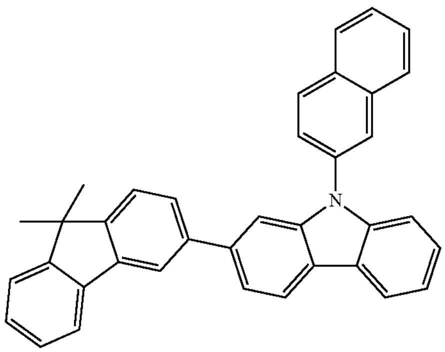
158B
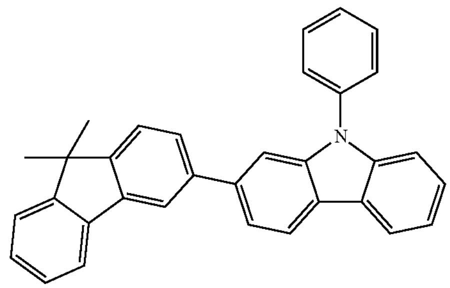
159B
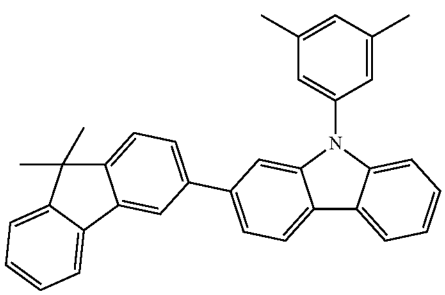
160B
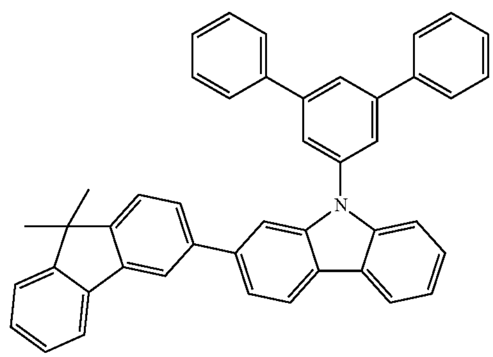
161B
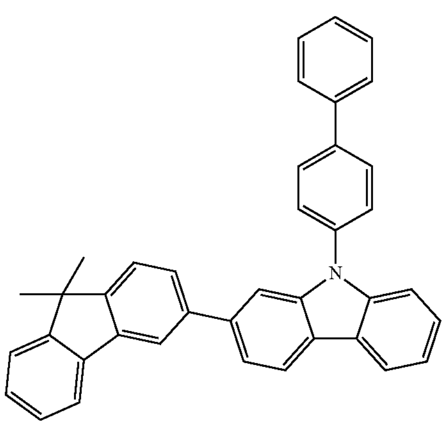
162B
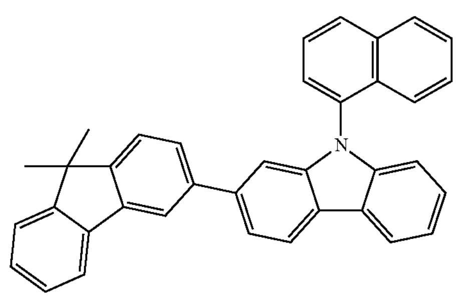
163B -continued
164B
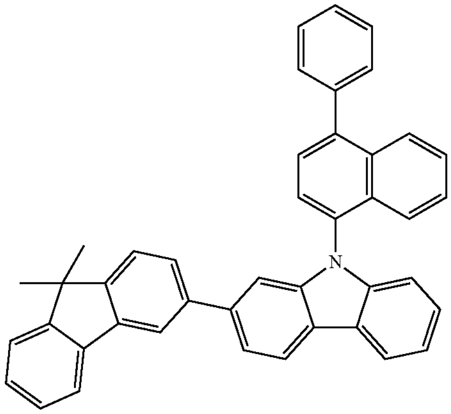
165B
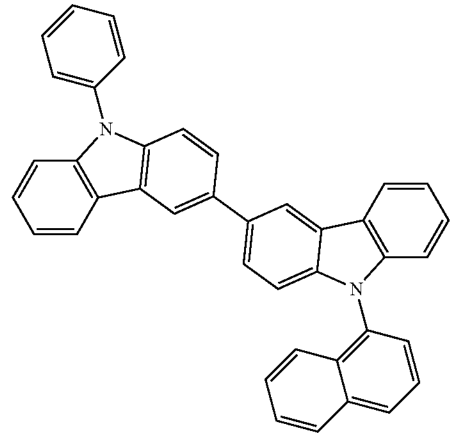
166B
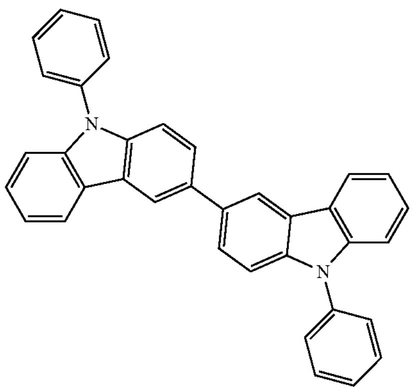
167B
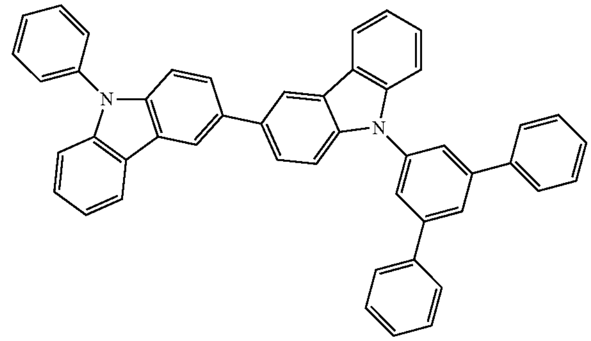
168B
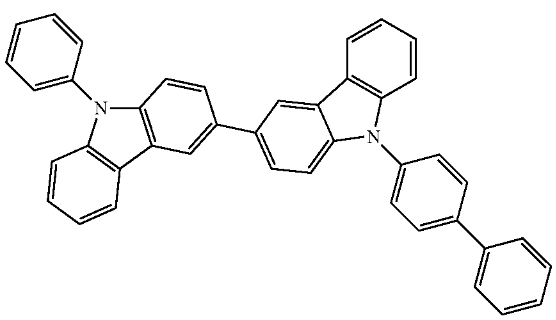
169B
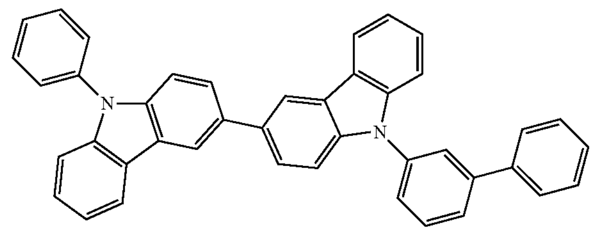
170B
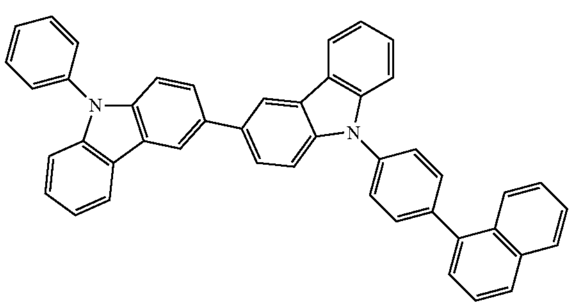
171B
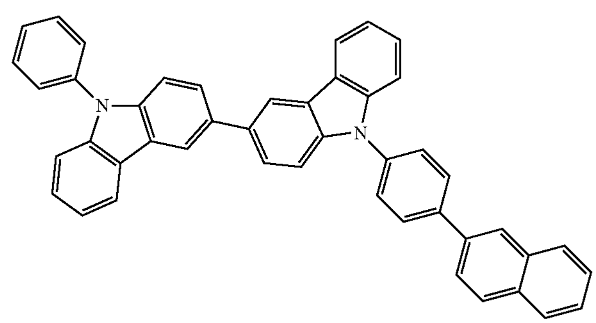

-continued
172B
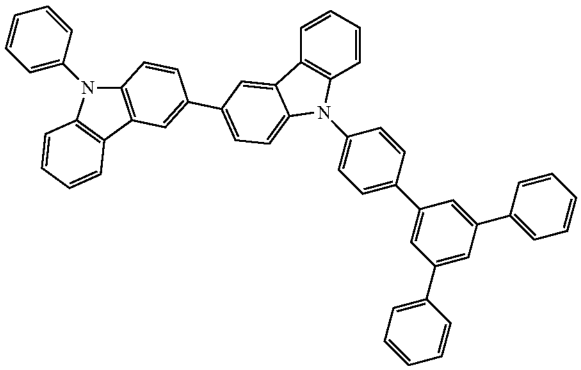
173B
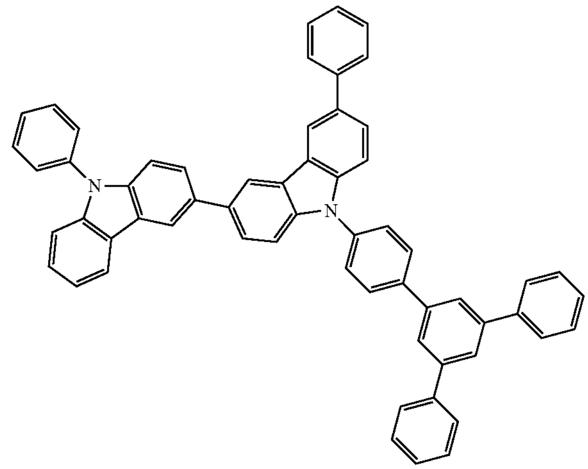
174B
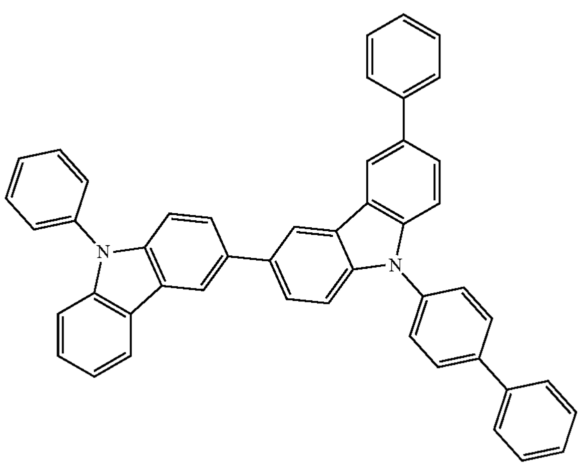
175B
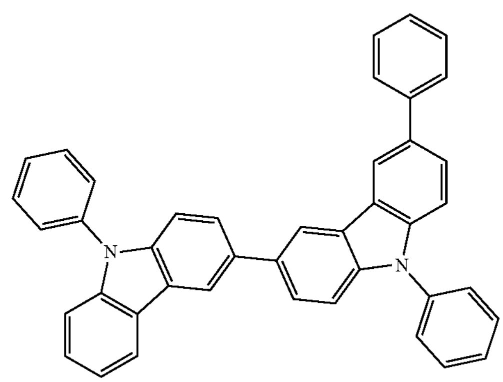
176B
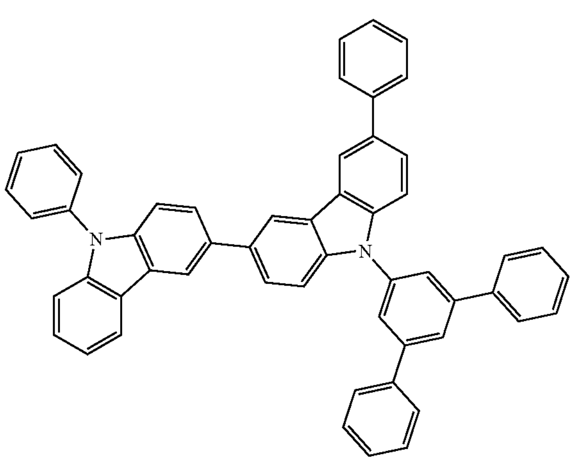
177B
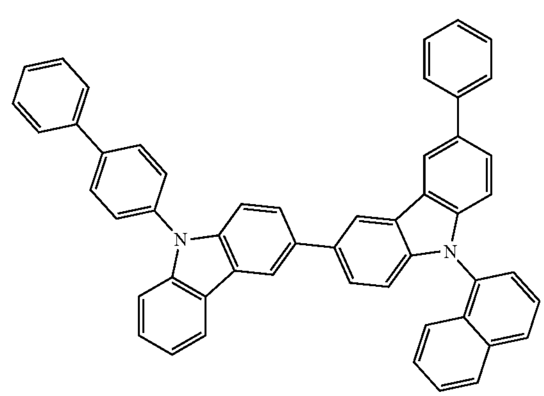

-continued
178B
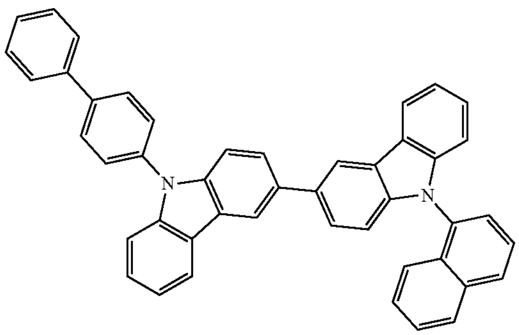
179B
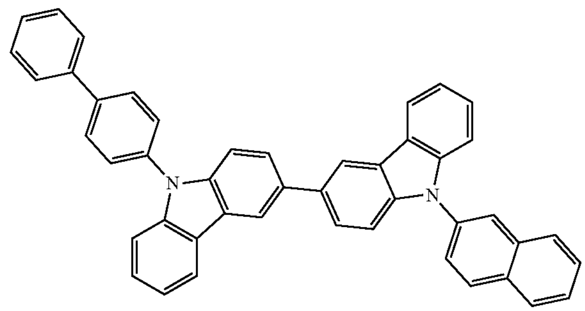
180B
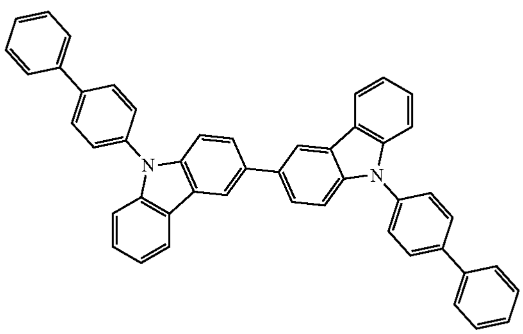
181B
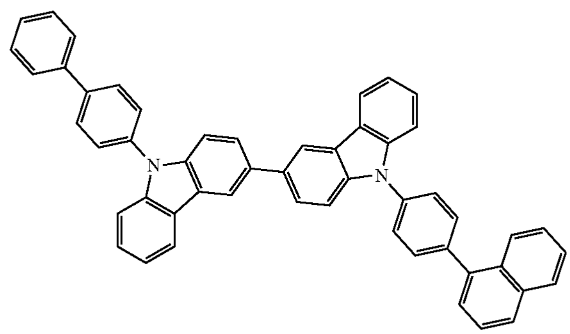
182B
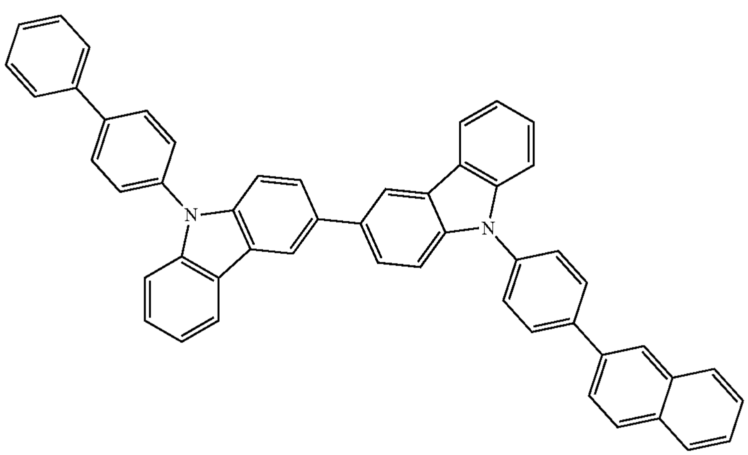

-continued
183B
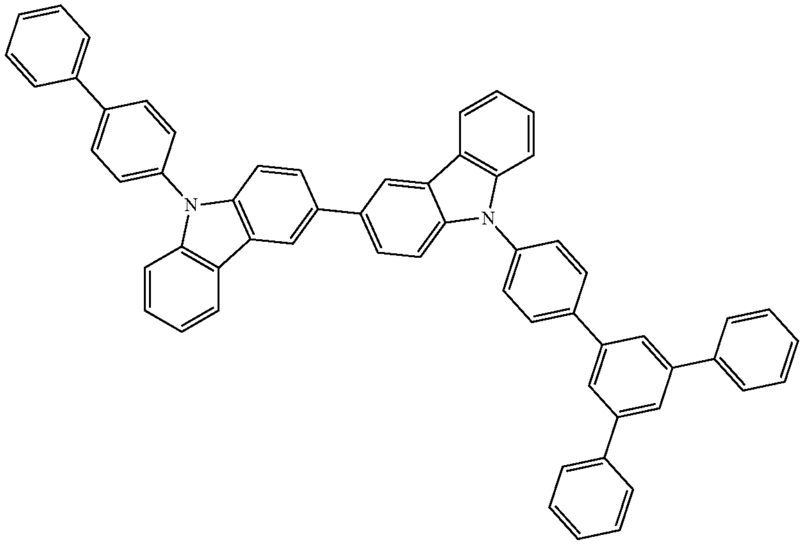
184B
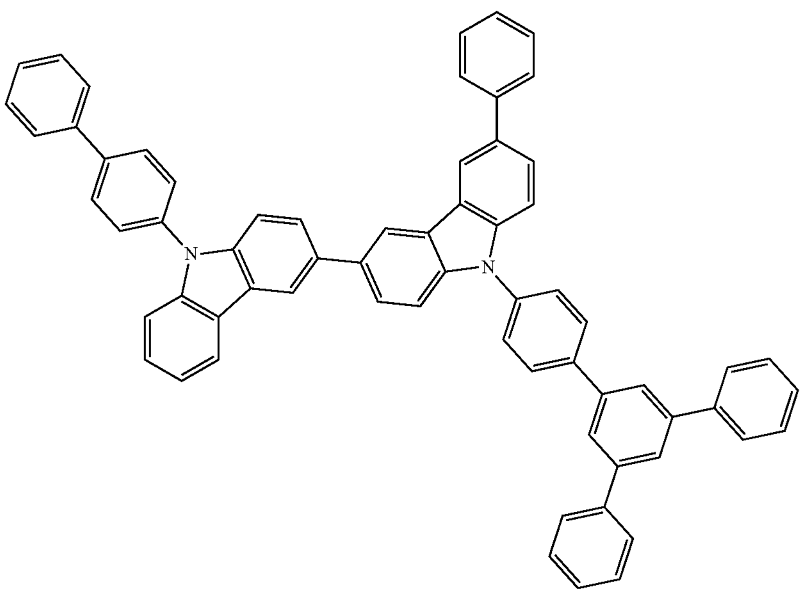
185B
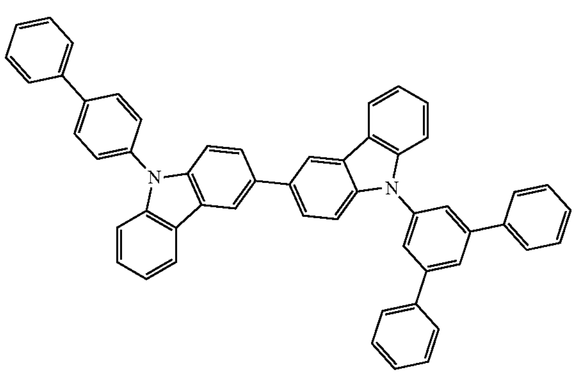
186B
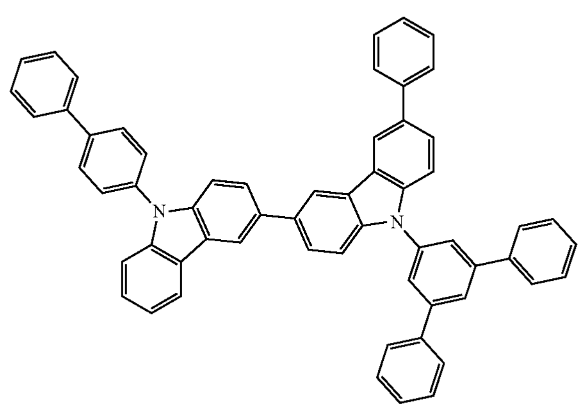

-continued
187B
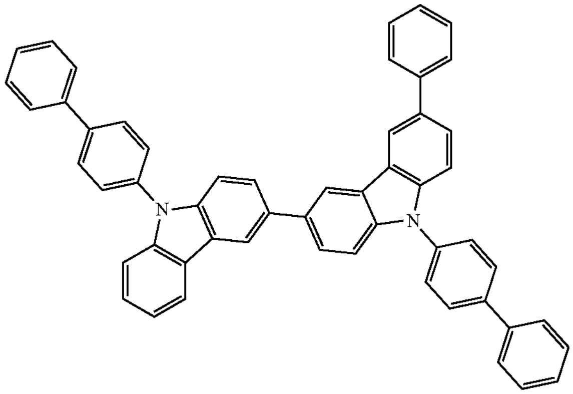
188B
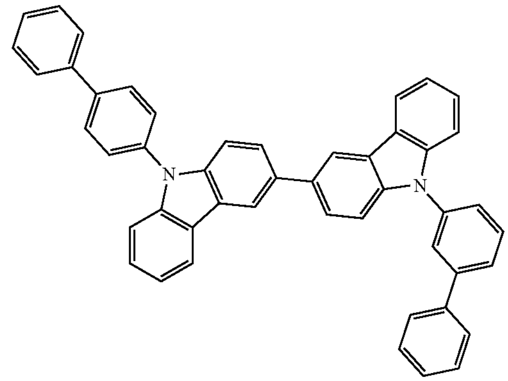
189B
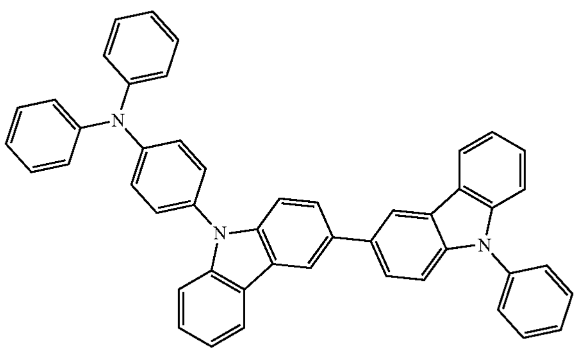
190B
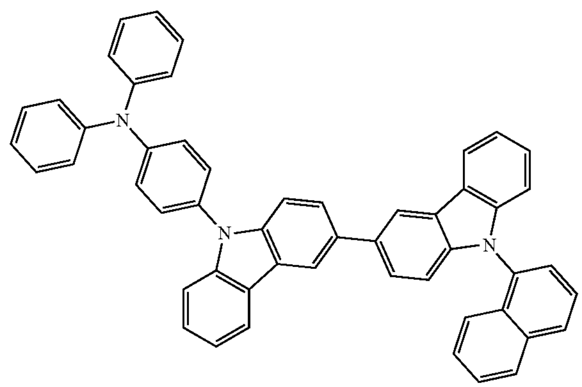
191B
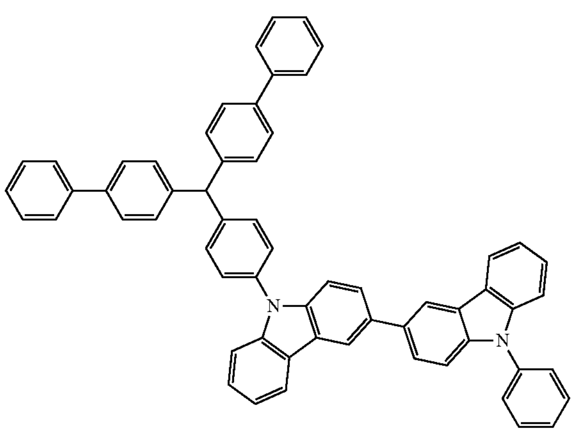
192B
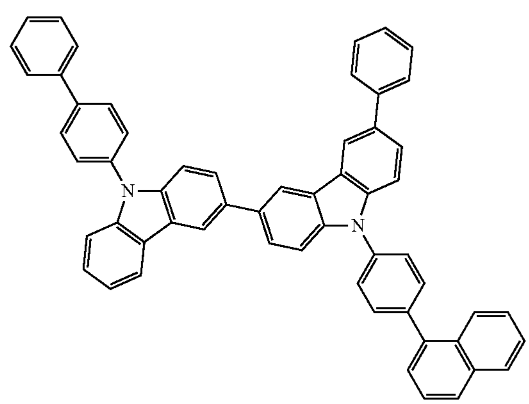

-continued
193B
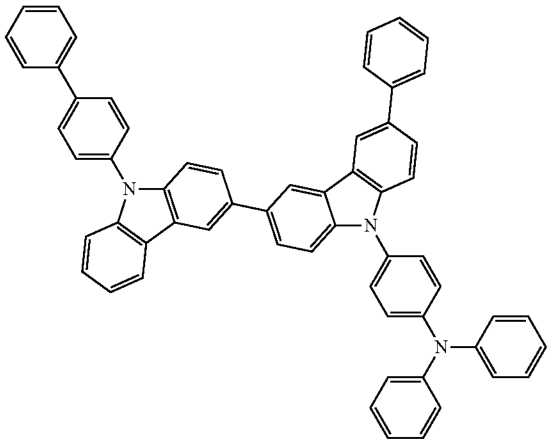
194B
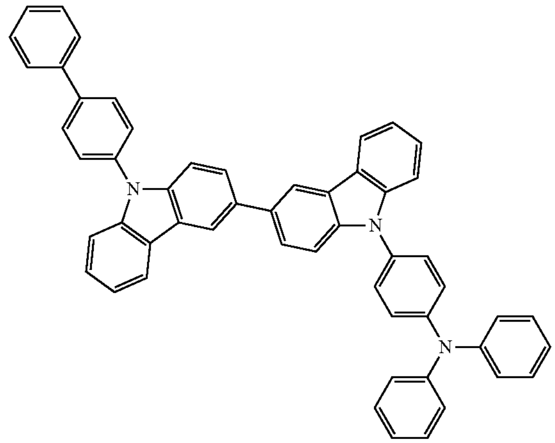
195B
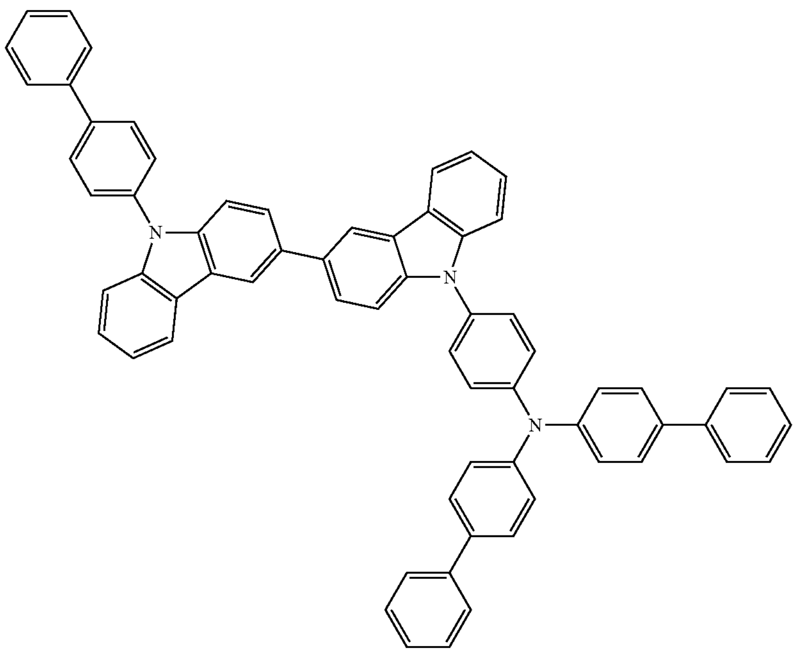
196B
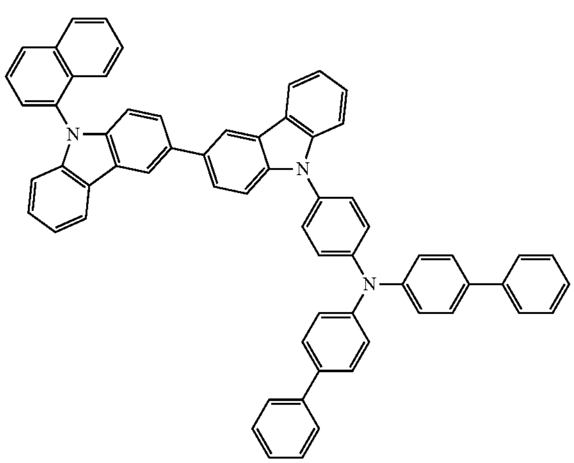
197B
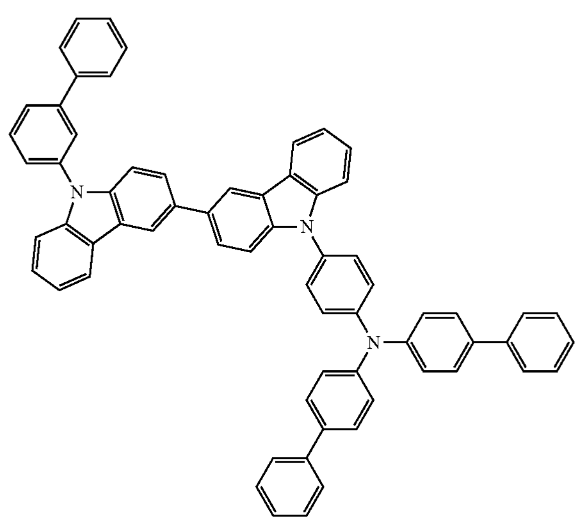

-continued
198B
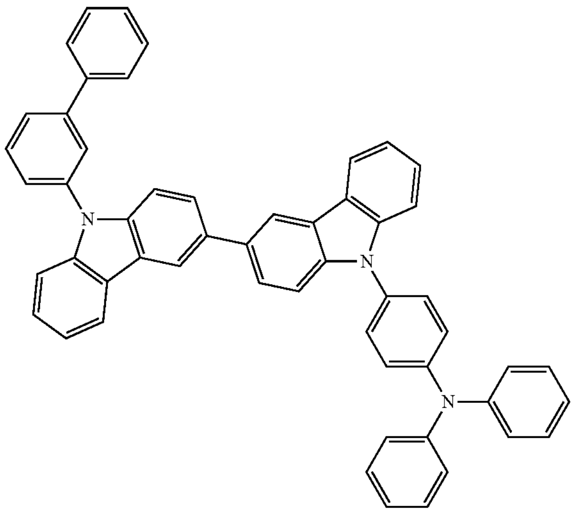
199B
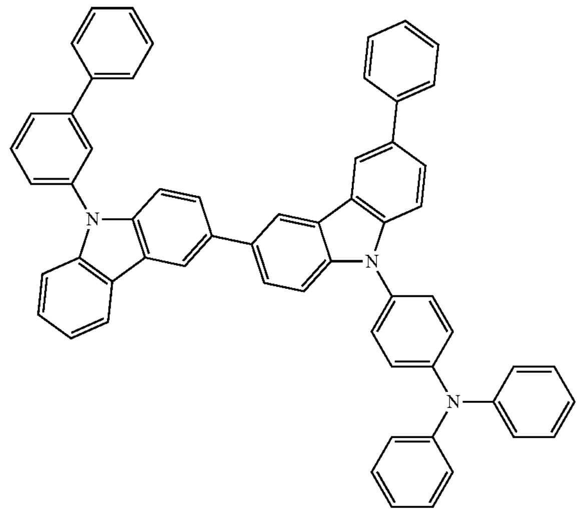
200B
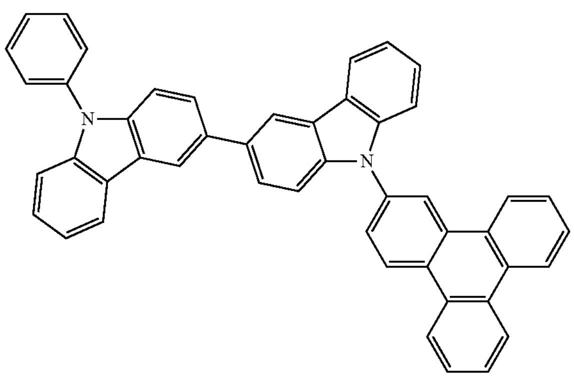
201B
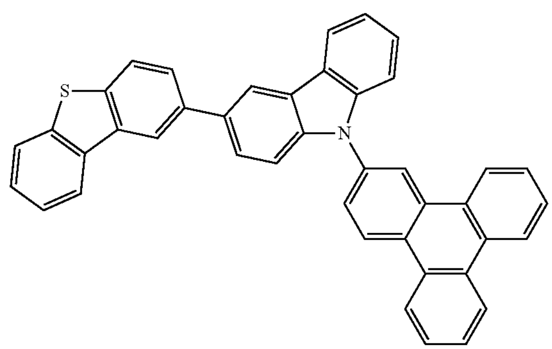
202B
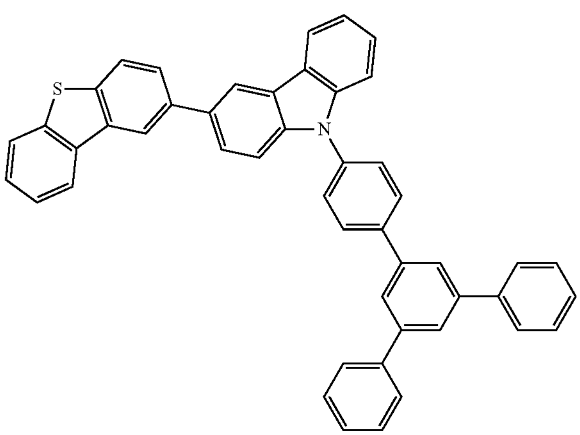
203B
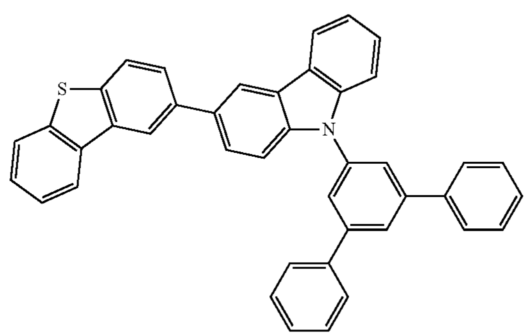

-continued
204B
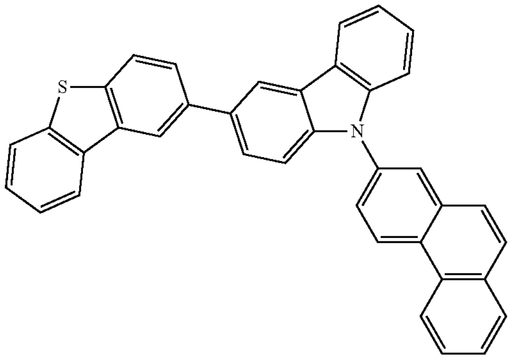
205B
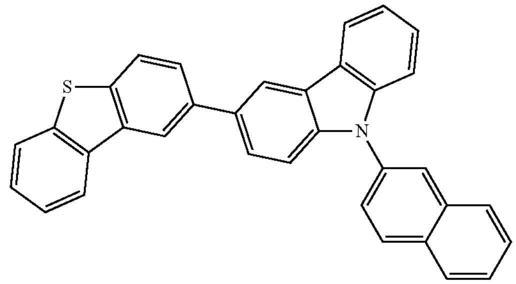
206B
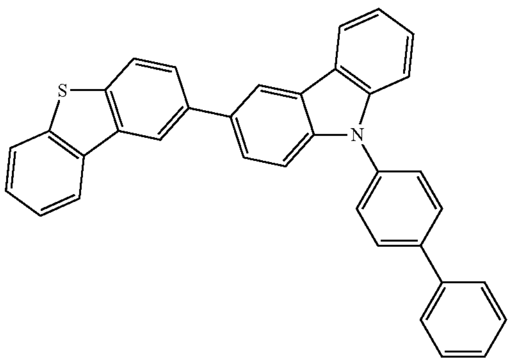
207B
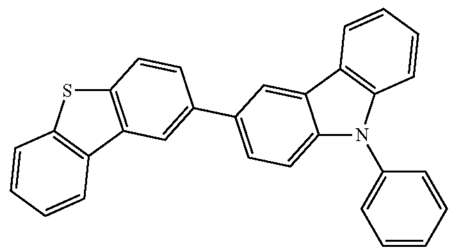
208B
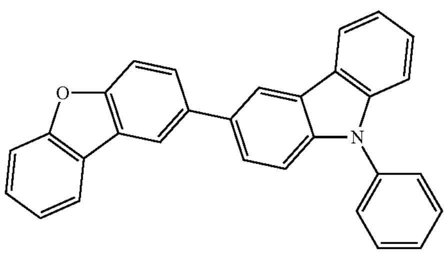
209B
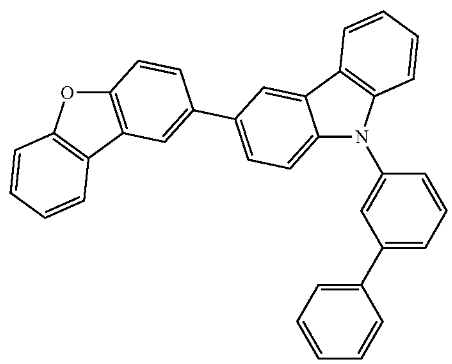
210B
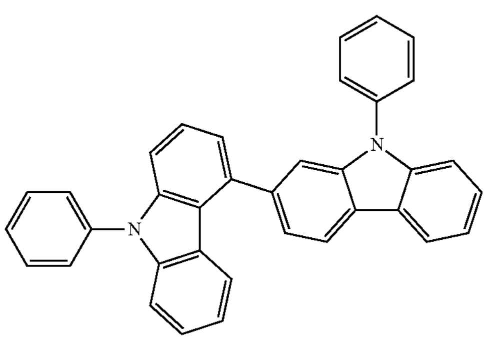
211B
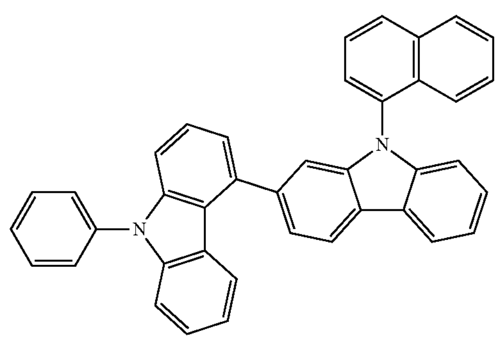

-continued
212B
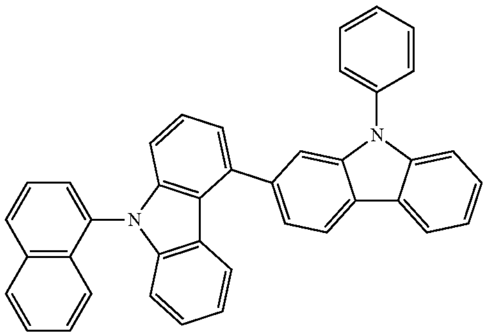
213B
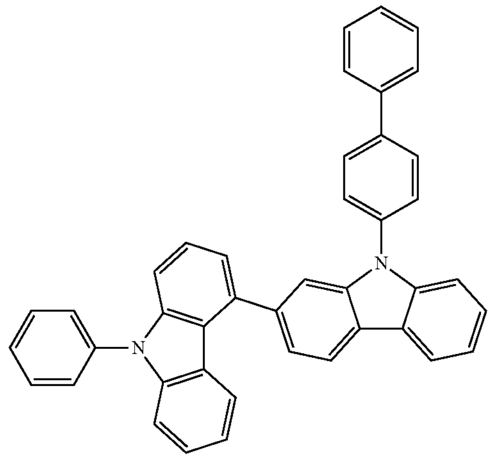
214B
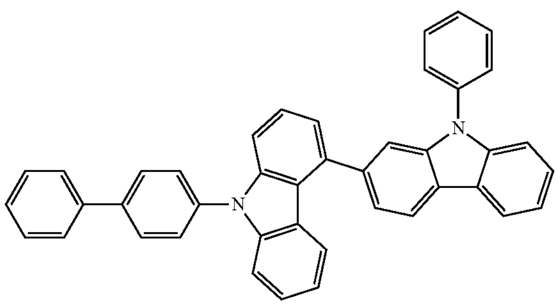
215B
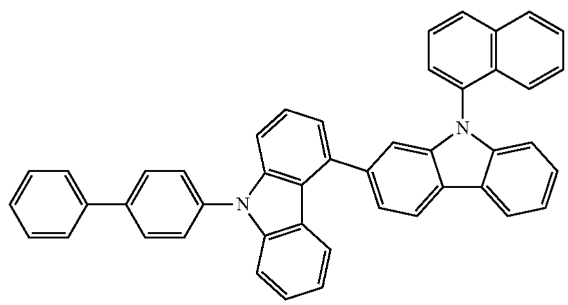
216B
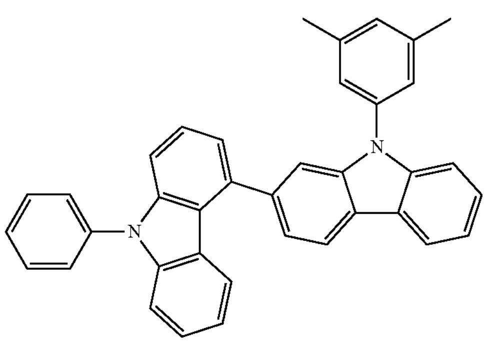
217B
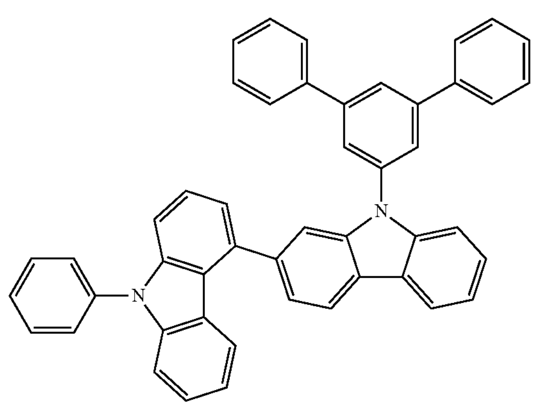

-continued
218B
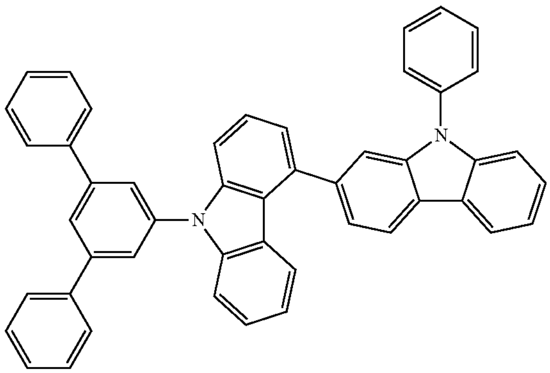
219B
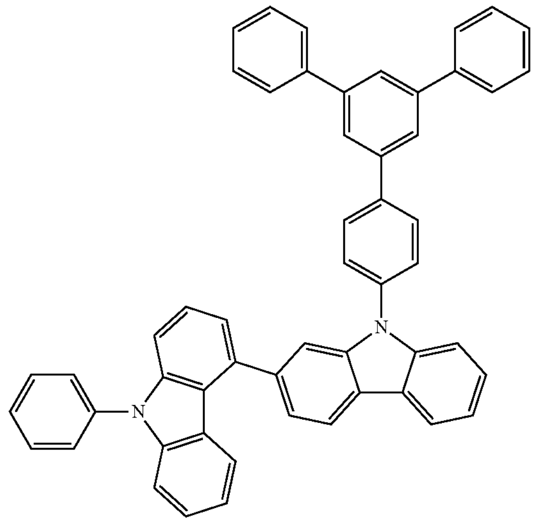
220B
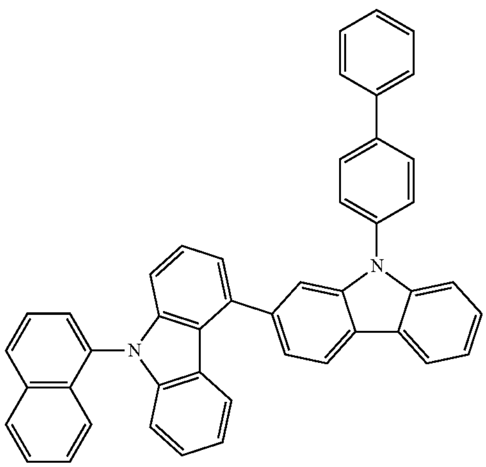
221B
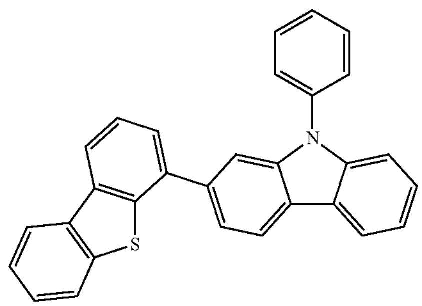
222B
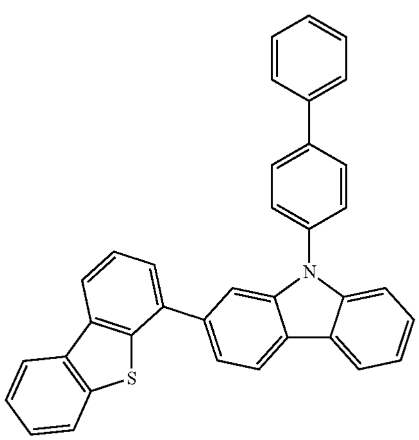
223B
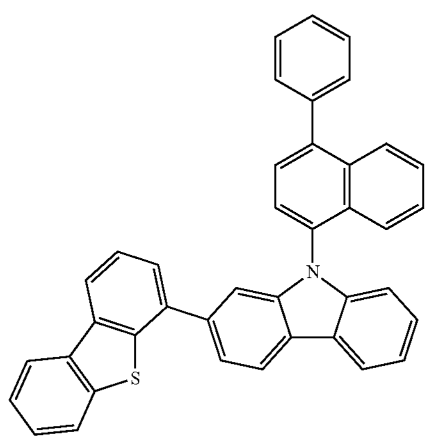

-continued
224B
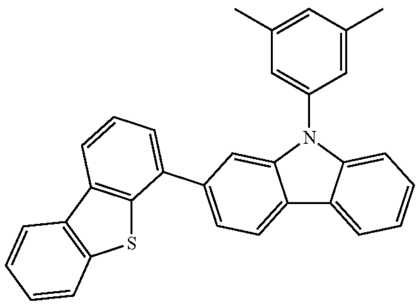
225B
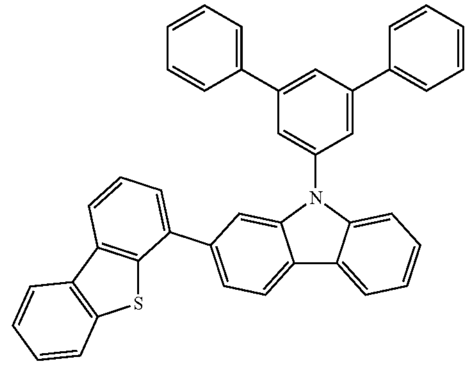
226B
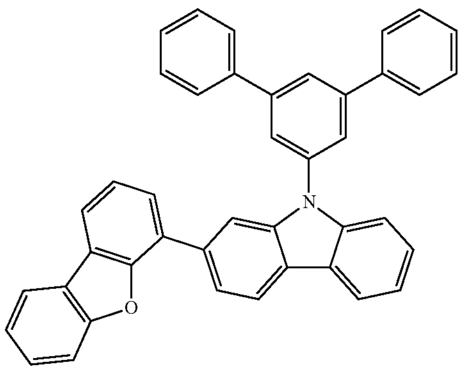
227B
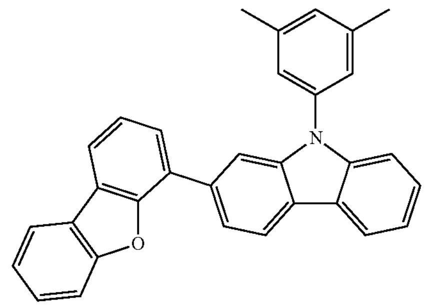
228B
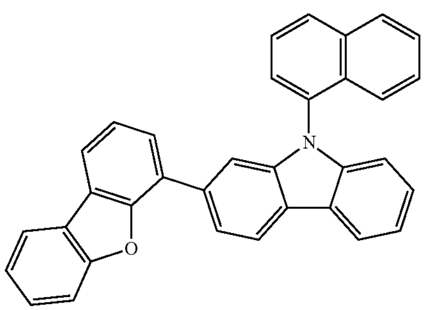
229B
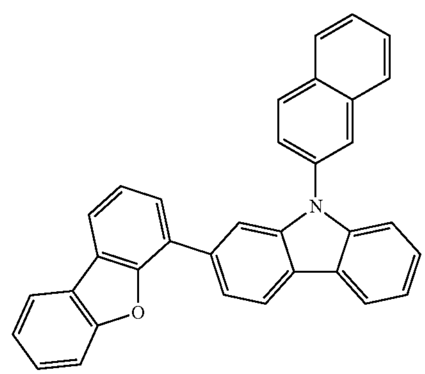
230B
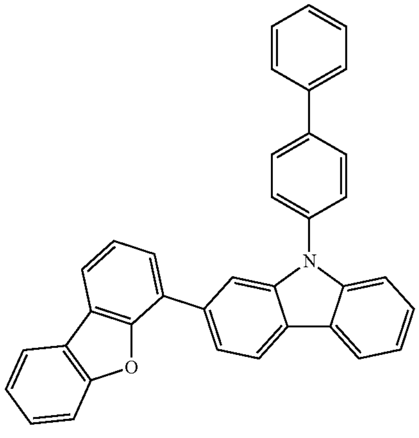
(A1)
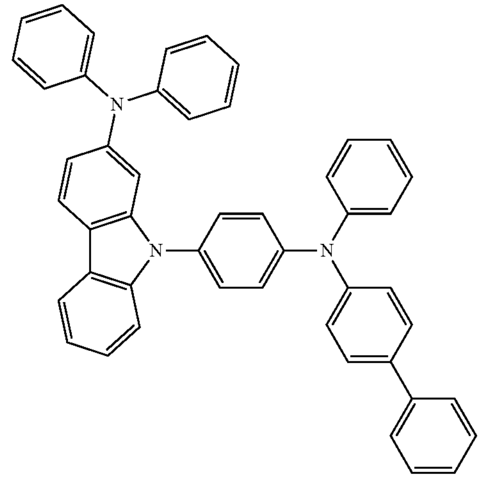

-continued
(A2)
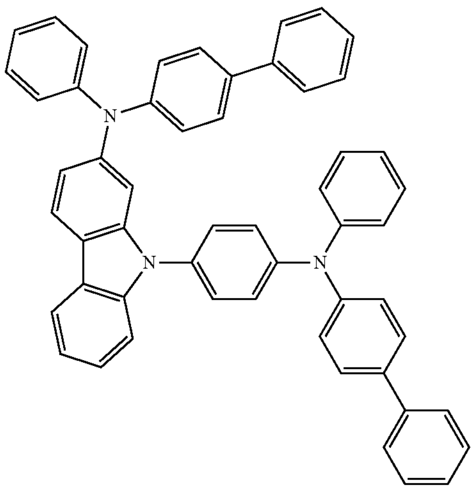
(A3)
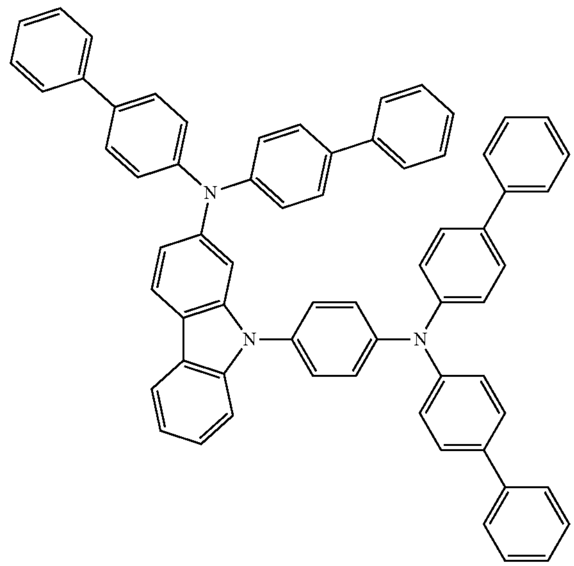
(A4)
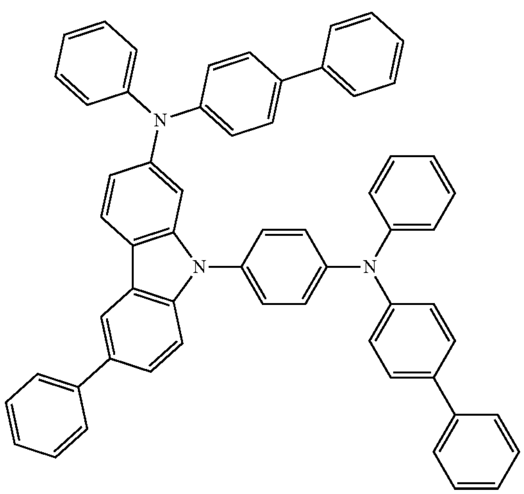
(A5)
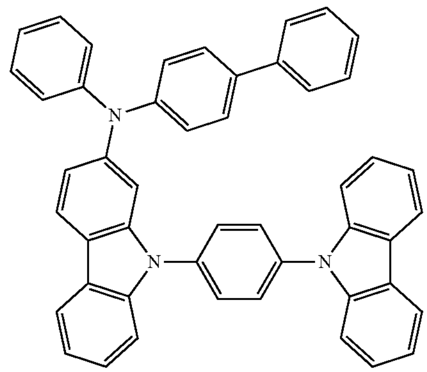
(A6)
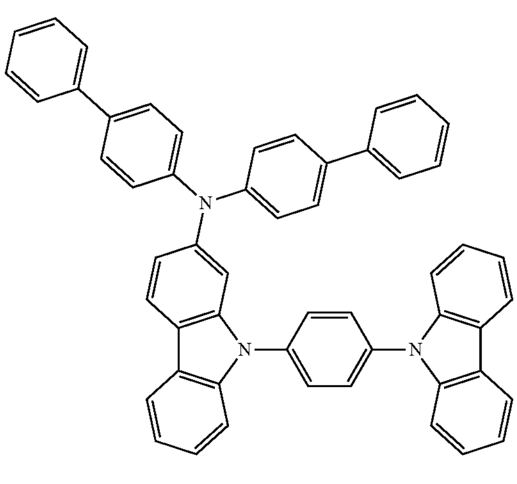
(A7)
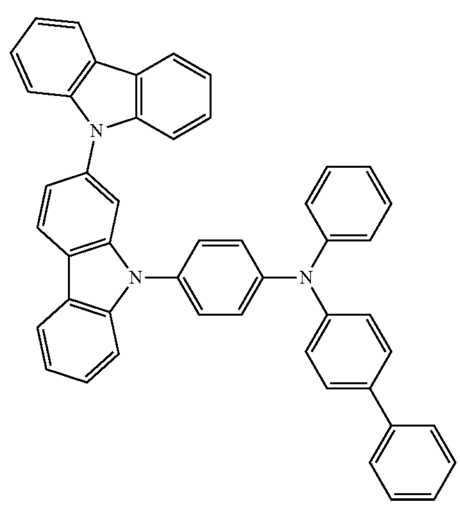

-continued
(A8)
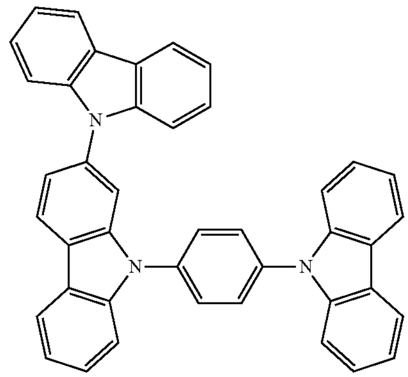
(A9)
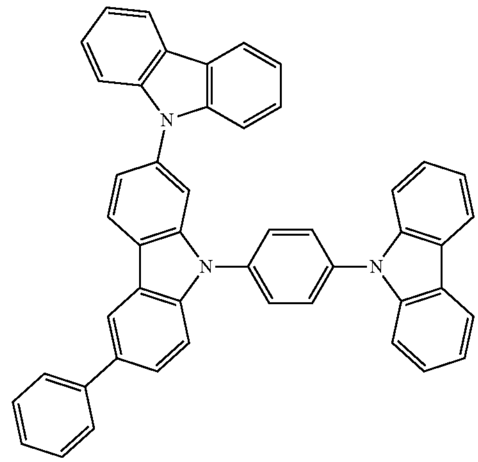
(A10)
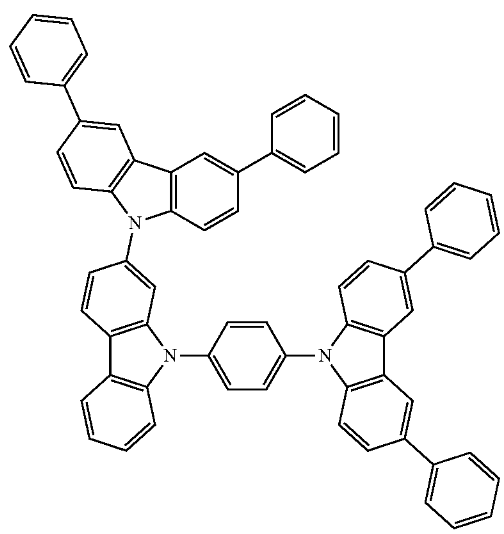
(A11)
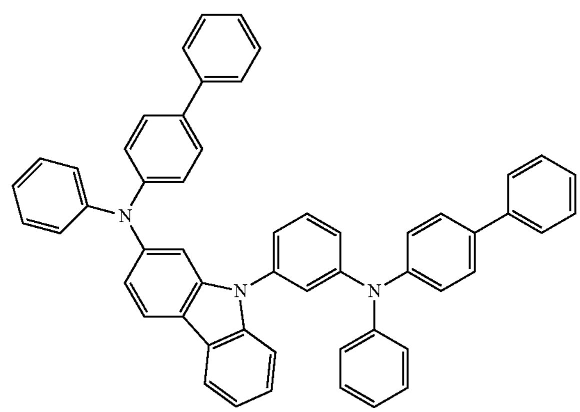
(A12)
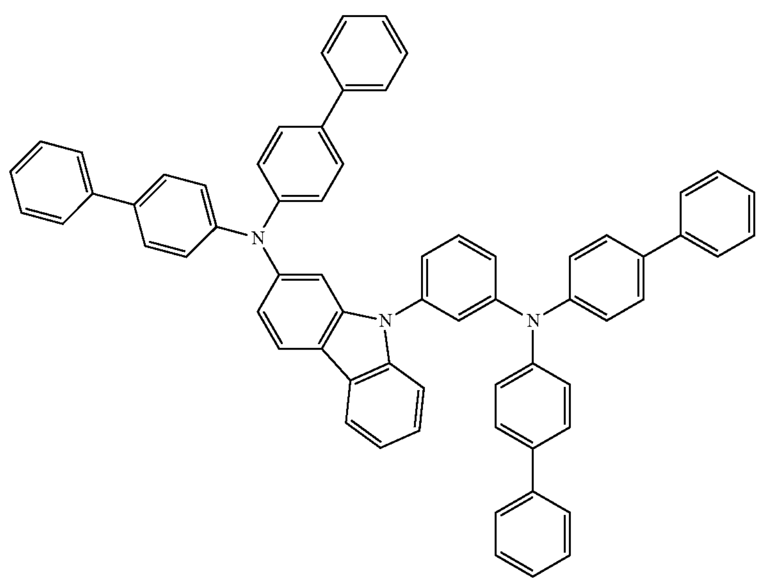

(A13)
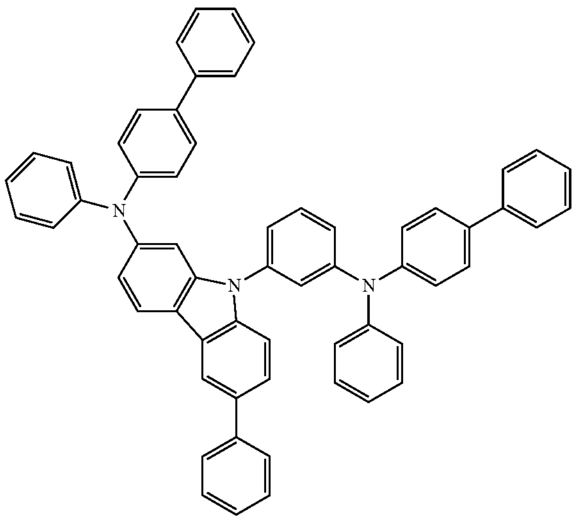
(A14)
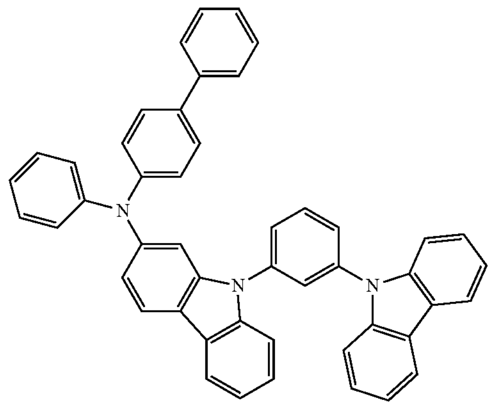
(A15)
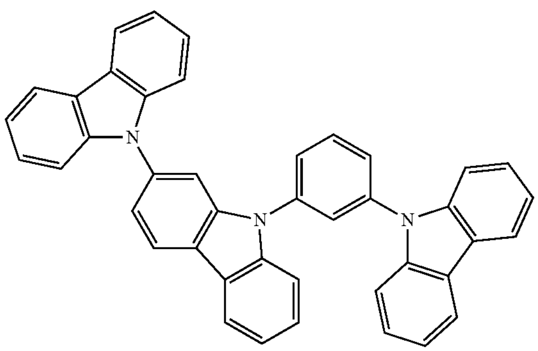
(A16)
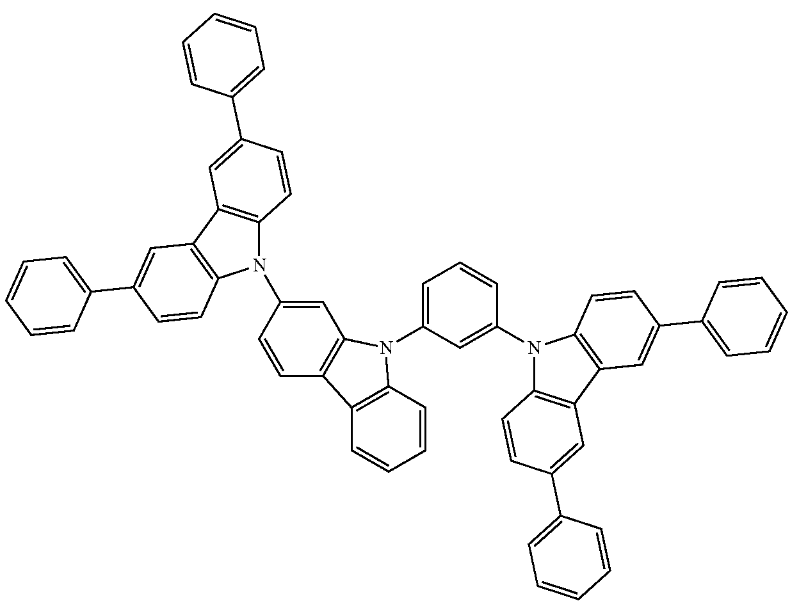

-continued
(A17)
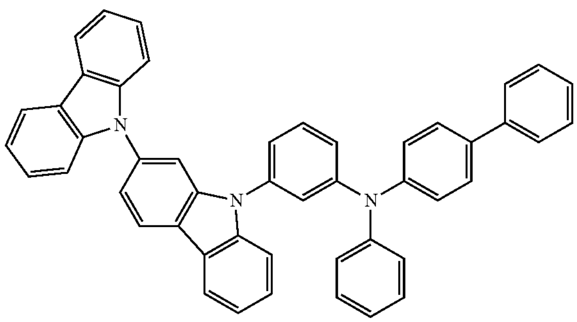
(A18)
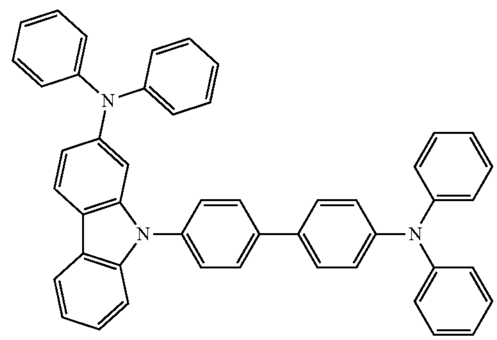
(A19)
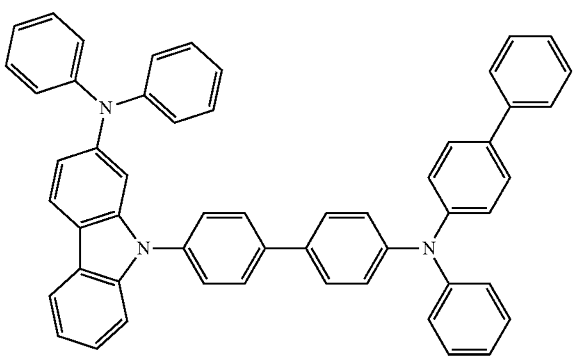
(A20)
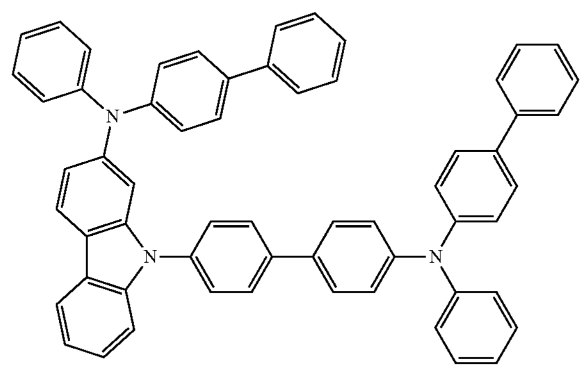
(A21)
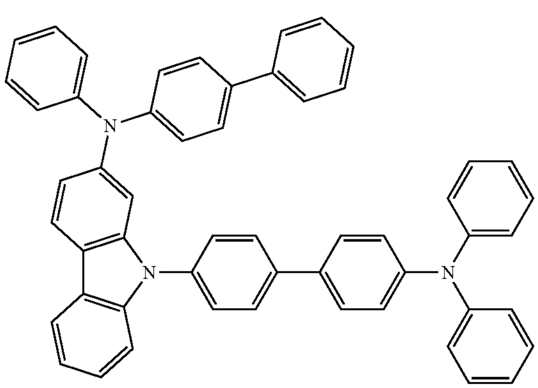
(A22)
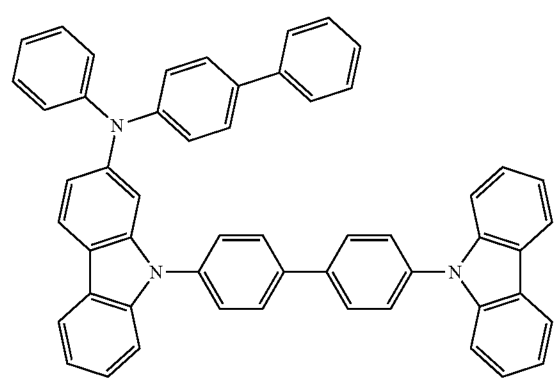
(A23)
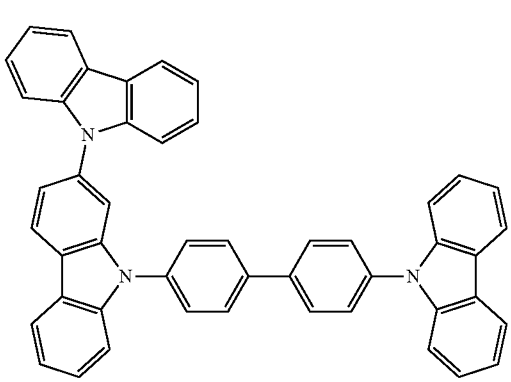
(A24)
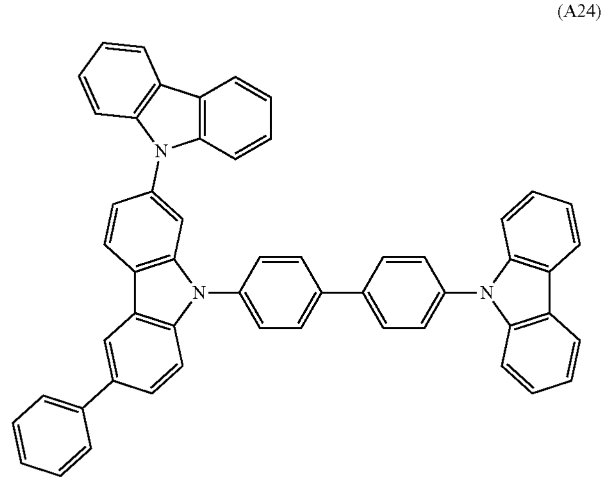

-continued
(A25)
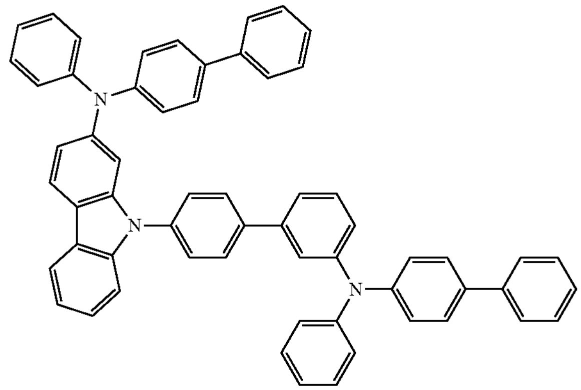
(A26)
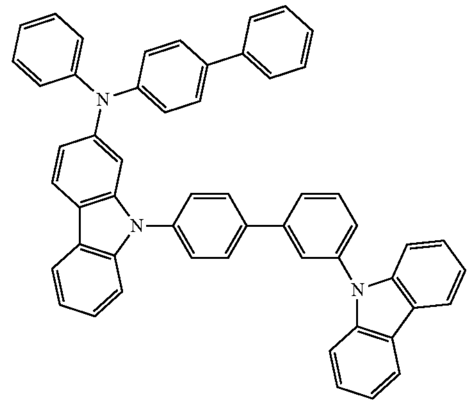
(A27)
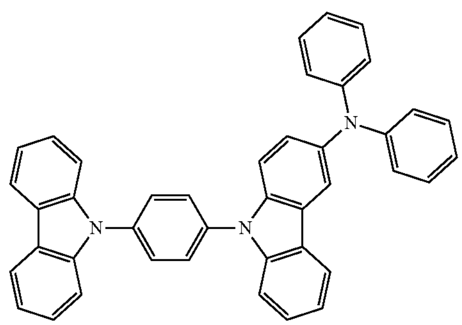
(B1)
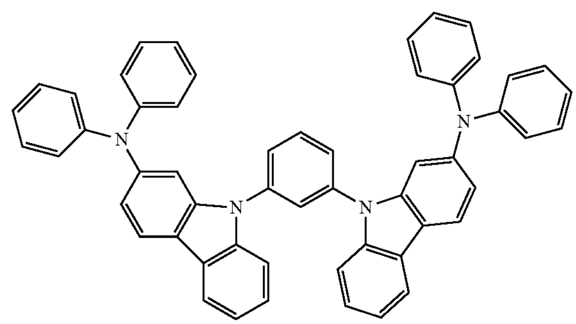
(B2)
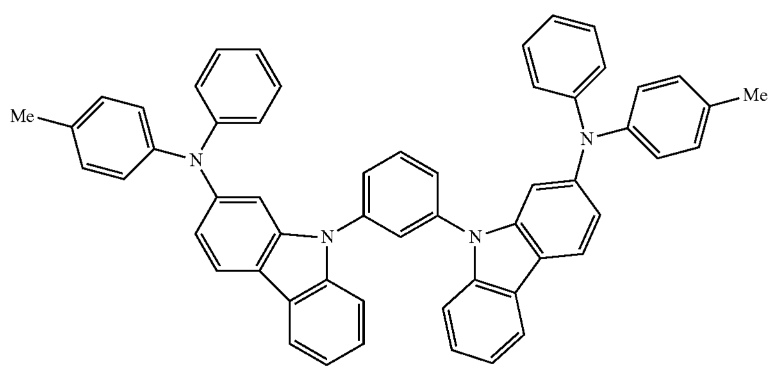
(B3)
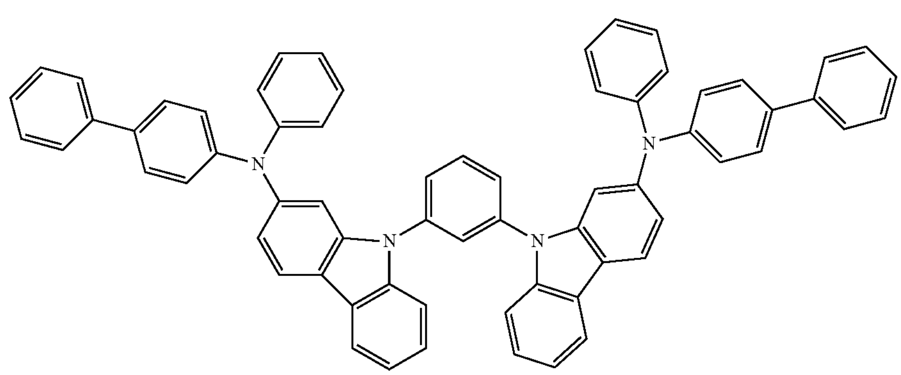

-continued
(B4)
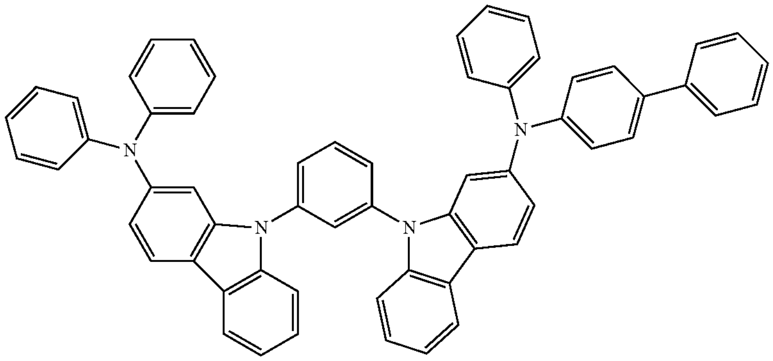
(B5)
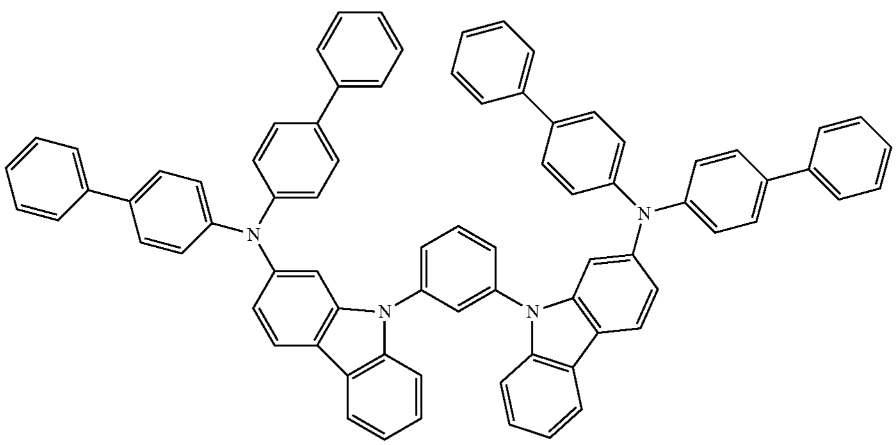
(B6)
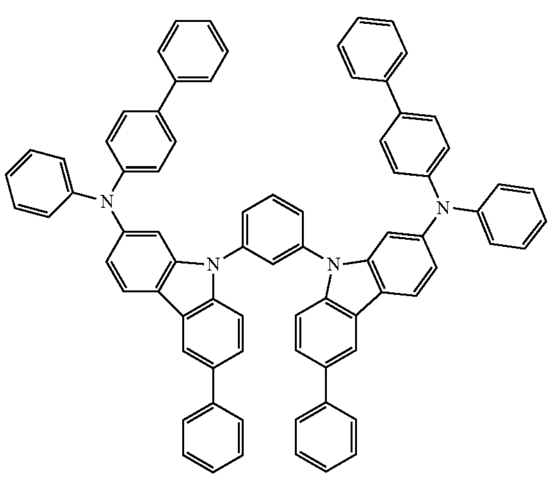
(B7)
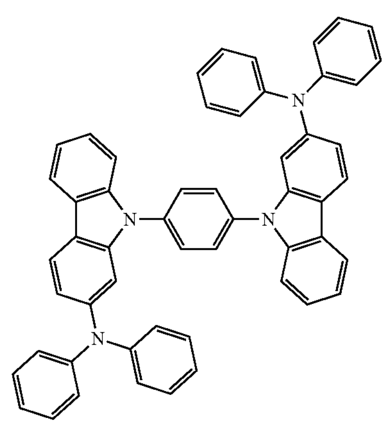

-continued
(B8)
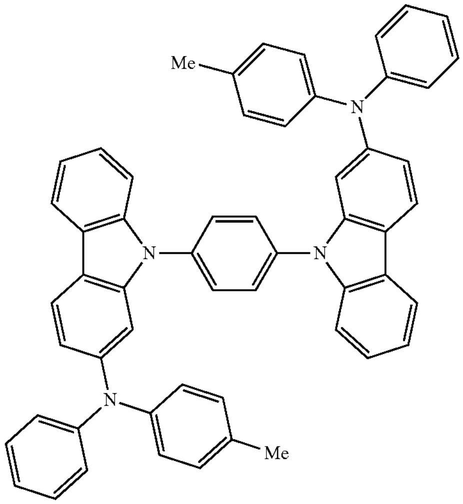
(B9)
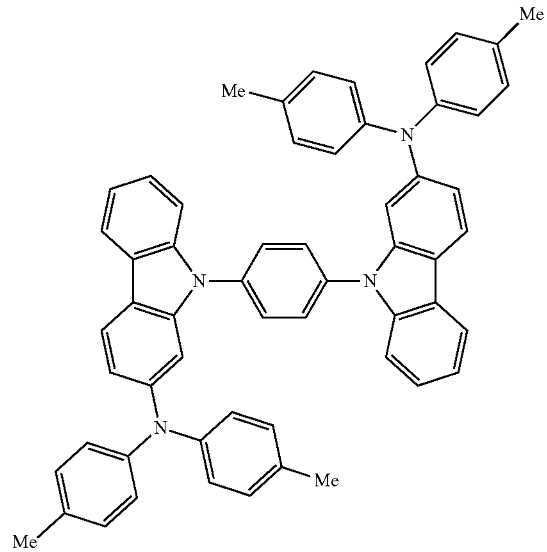
(B10)
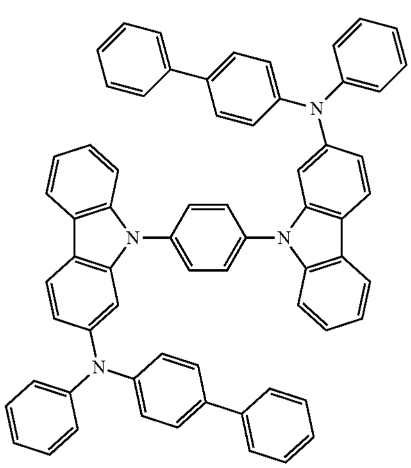
(B11)
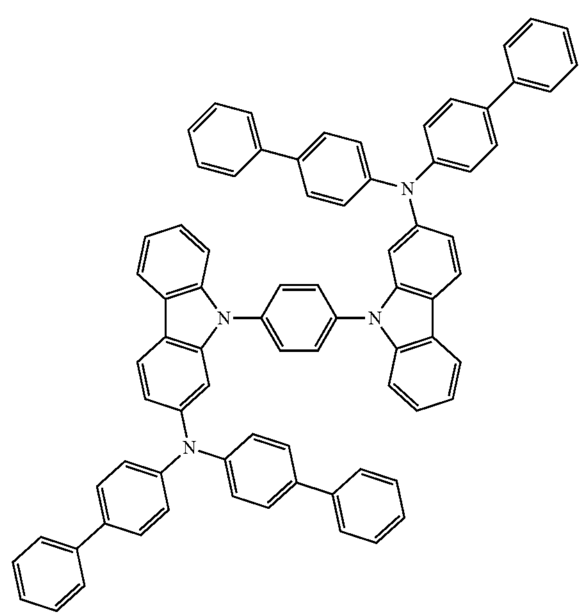

-continued
(B12)
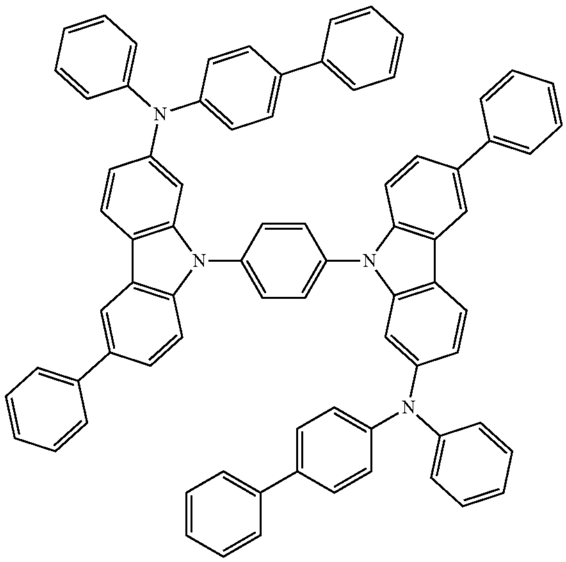
(B13)
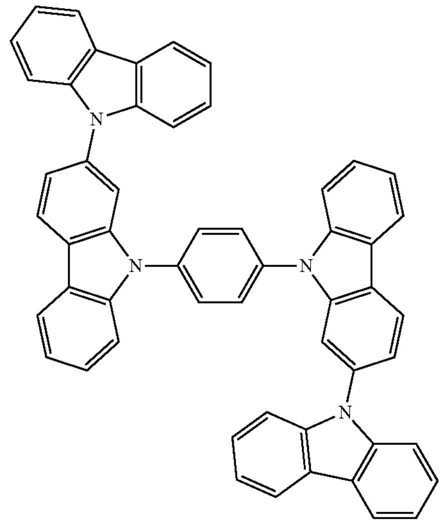
(B14)
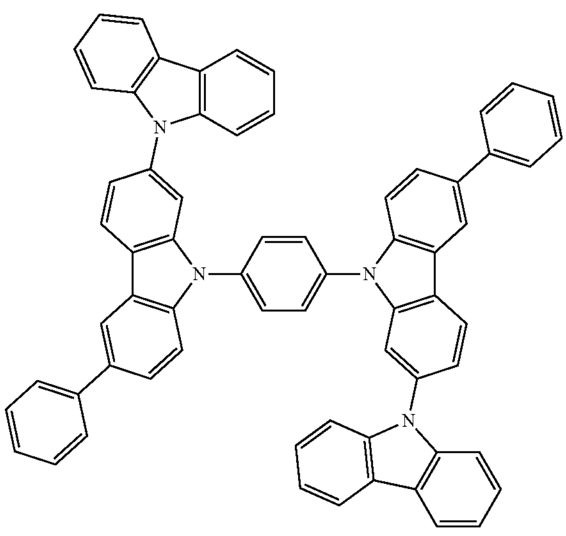
(B15)
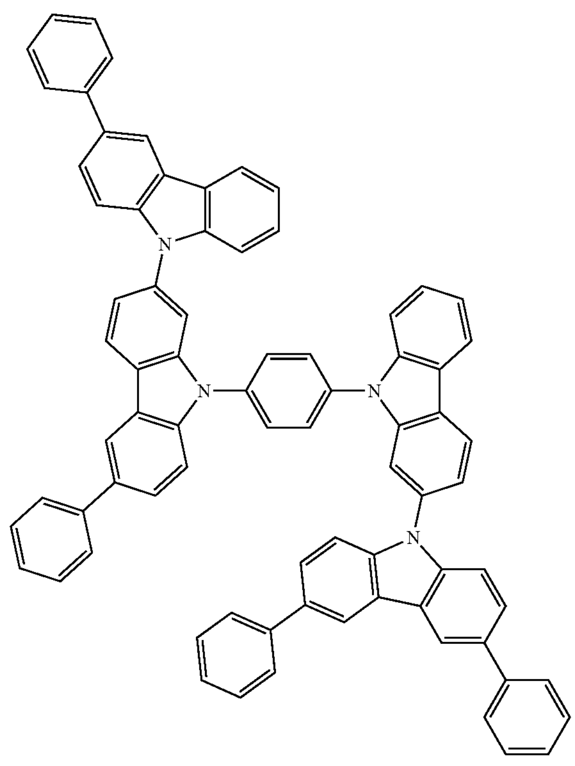

-continued
(B16)
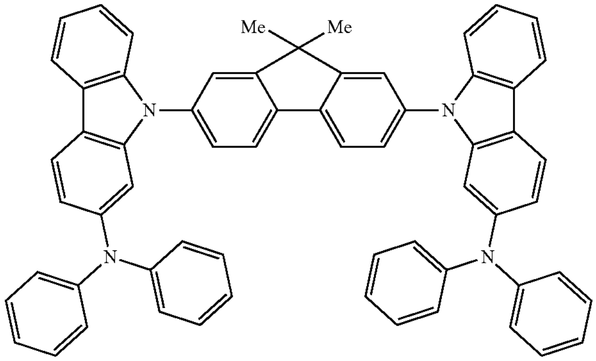
(B17)
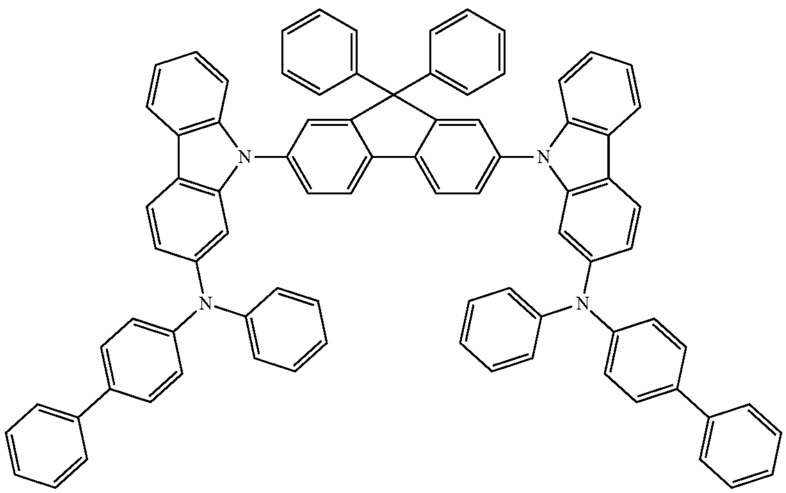
(B18)
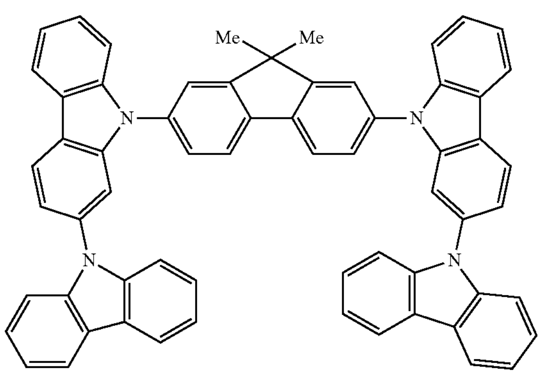
(B19)
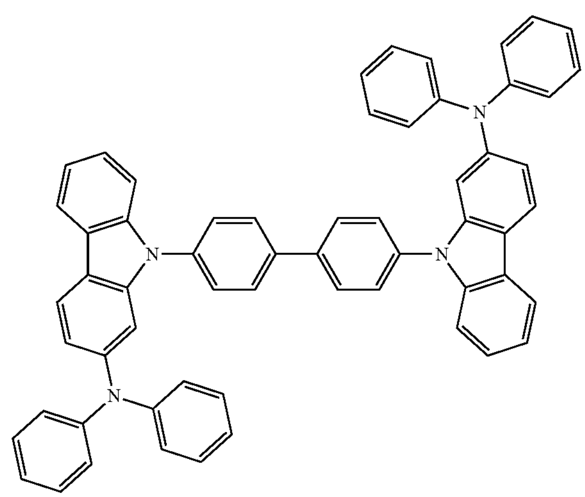

-continued
(B20)
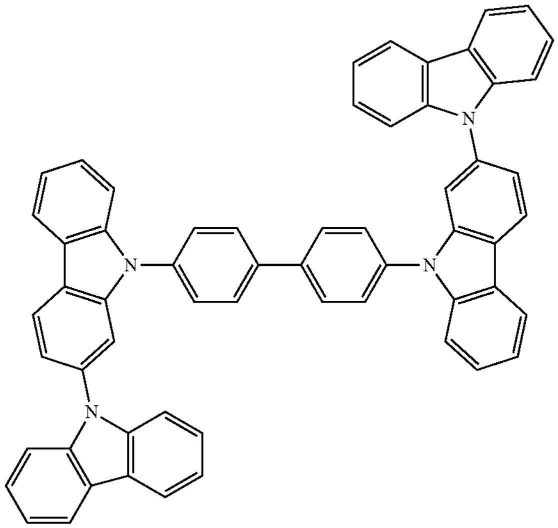
(B21)
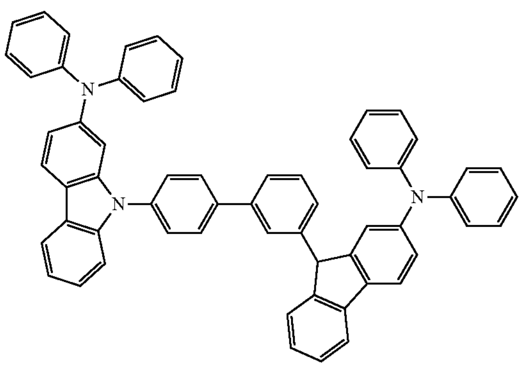
(B22)
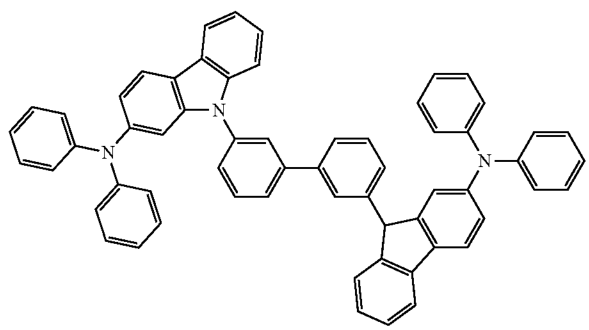
(B23)
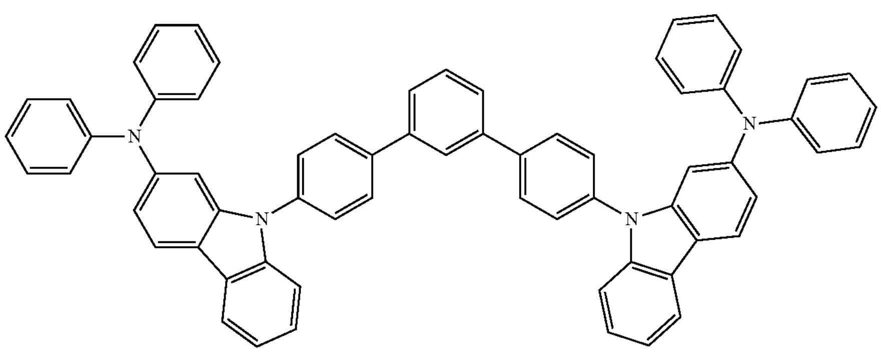
(B24)
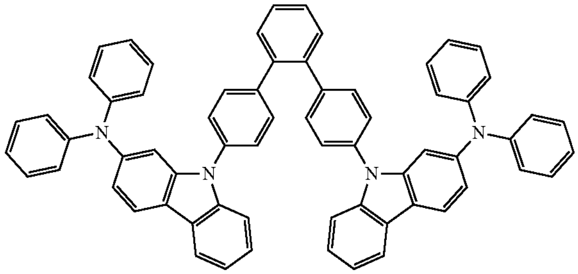
(B25)
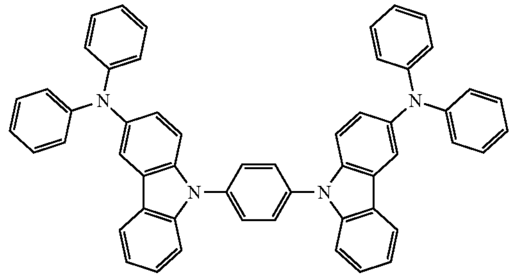

-continued
(C1)
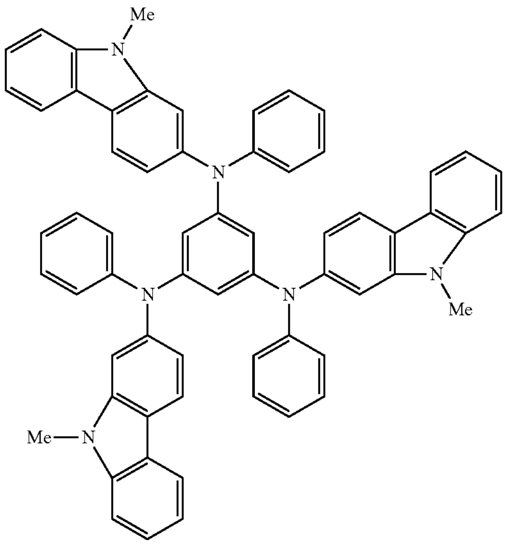
(C2)
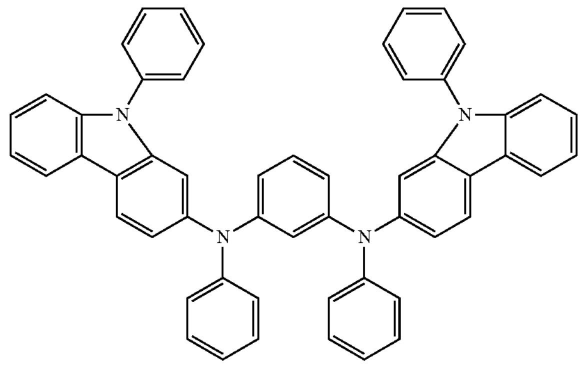
(C-3)
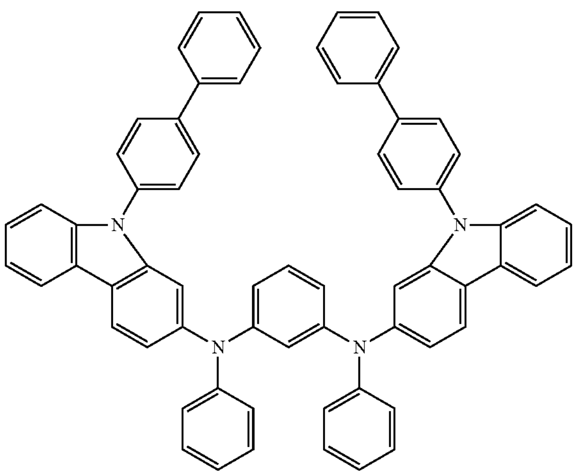
(C-4)
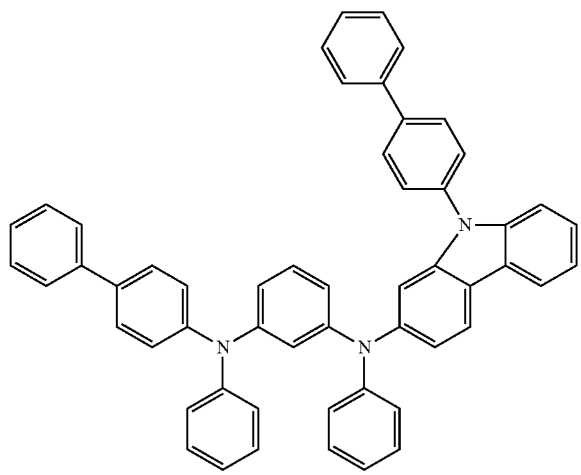
(C-5)
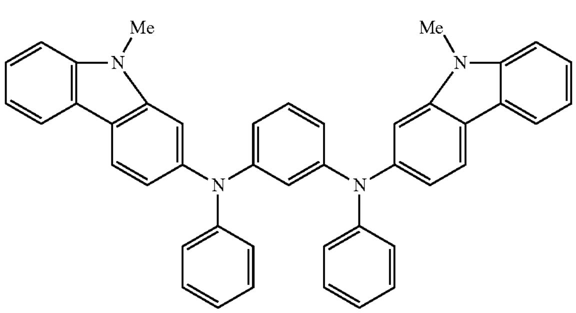
(C-6)
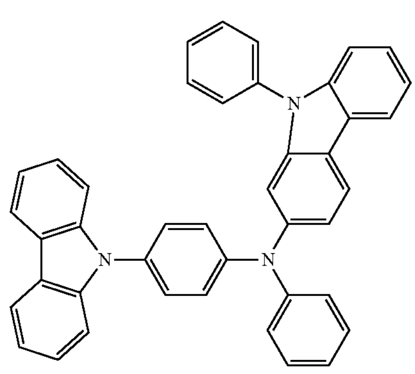

-continued
(C-7)
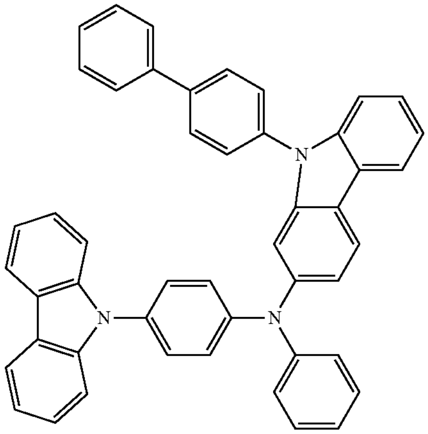
(C-8)
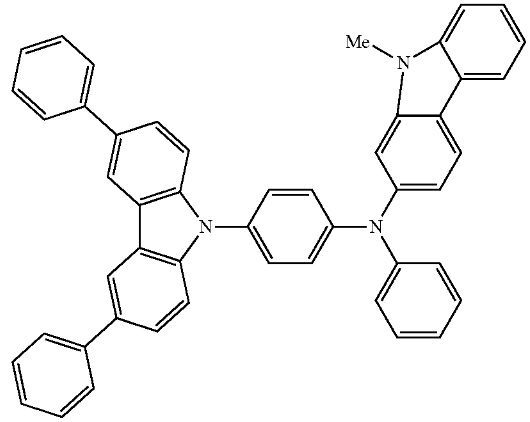
(C-9)
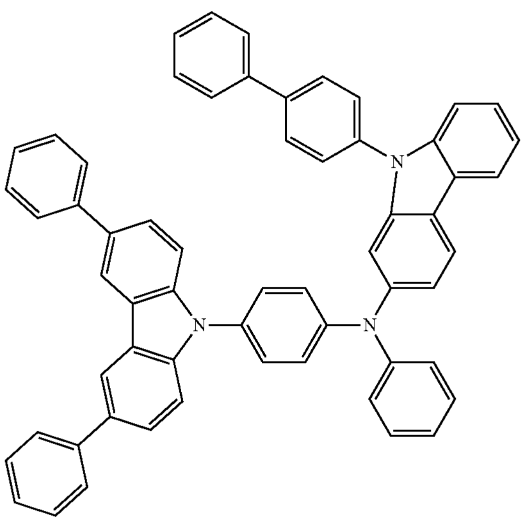
(C-10)
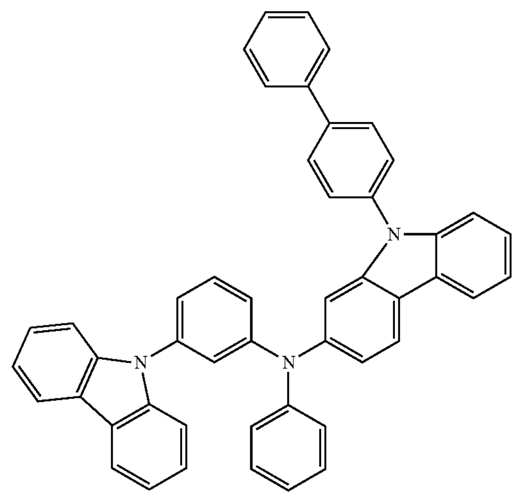
(C-11)
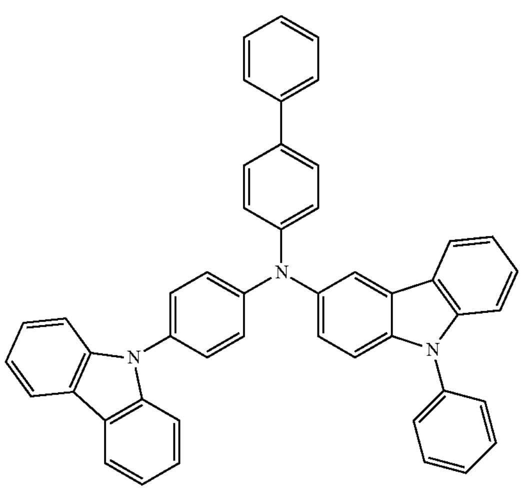
(C-12)
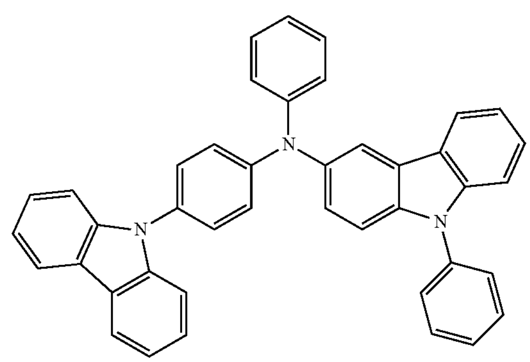

-continued
(C-13)
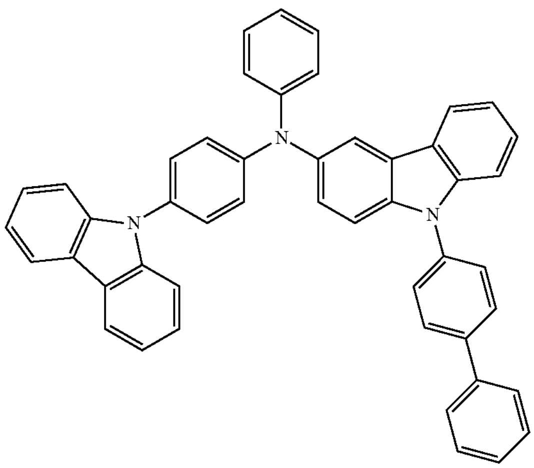
(C-14)
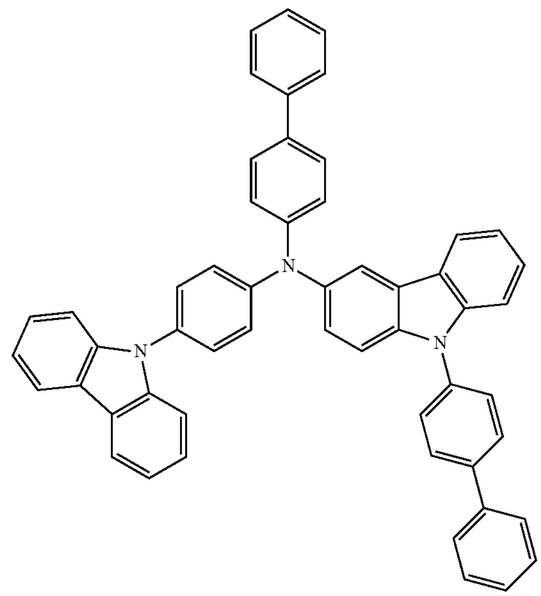
(C15)
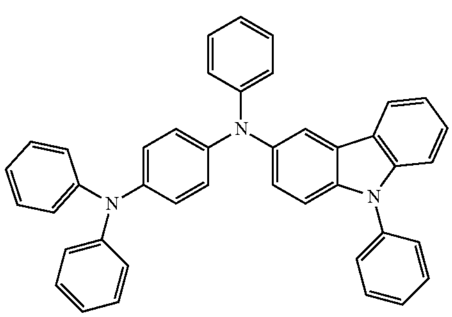
(C16)
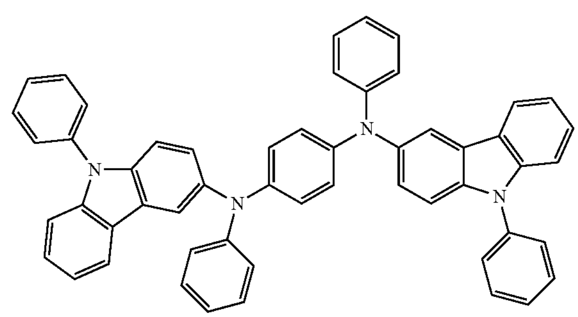
(D1)
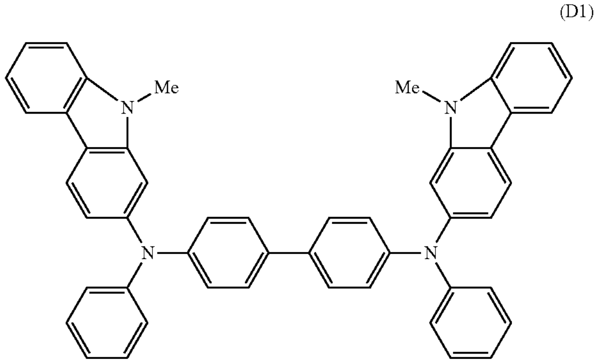
(D2)
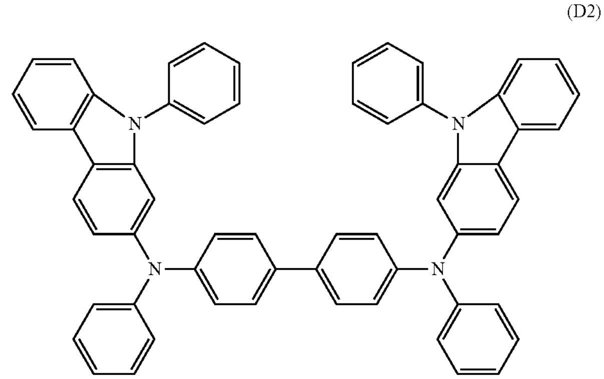

-continued
(D3)
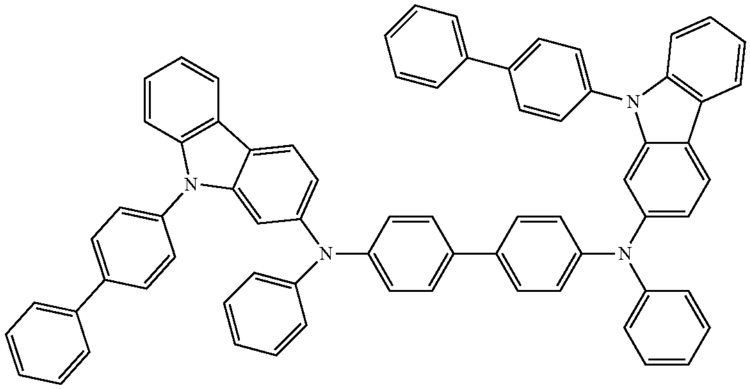
(D4)
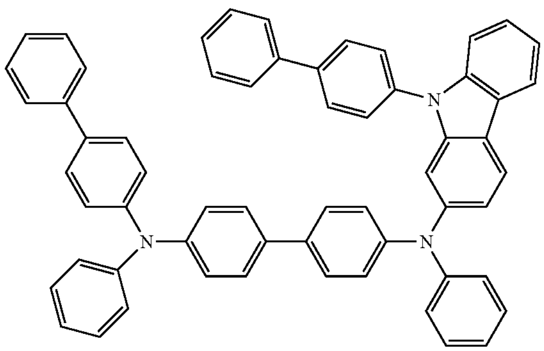
(D5)
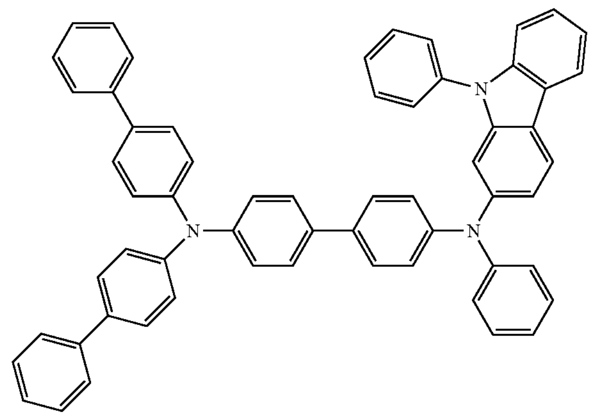
(D6)
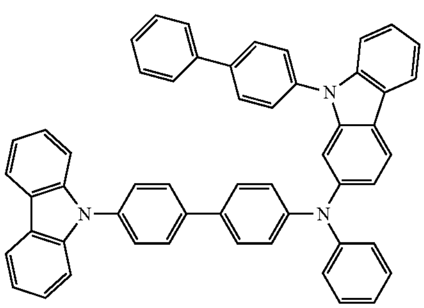
(D7)
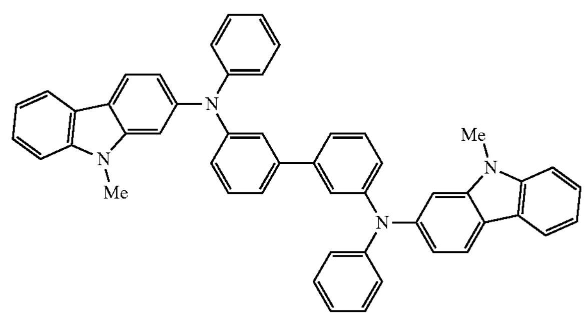
(D8)
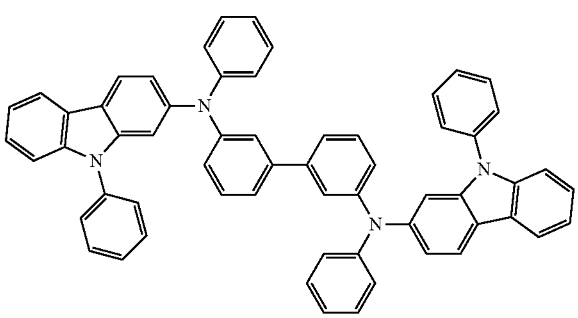
(D9)
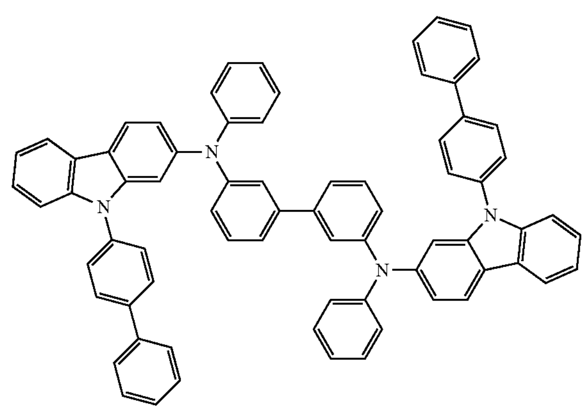

-continued
(E1)
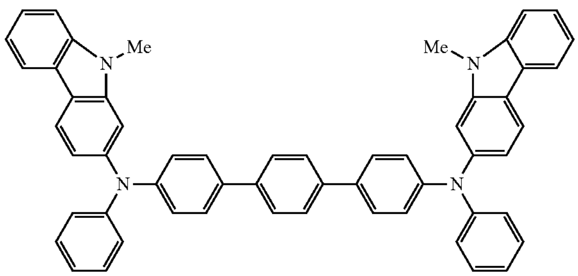
(E2)
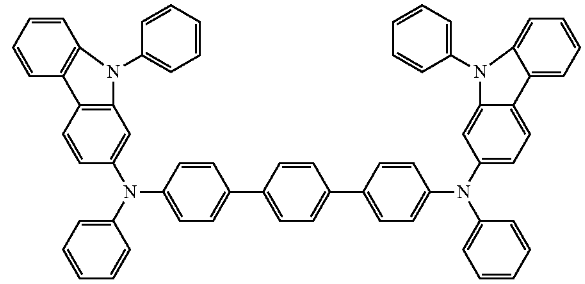
(E3)
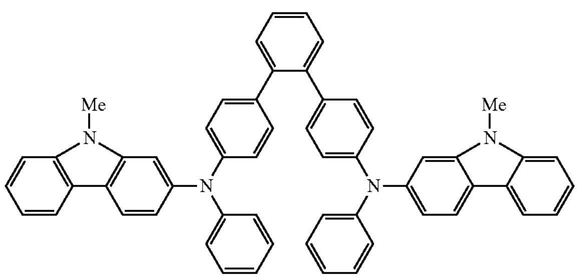
(E4)
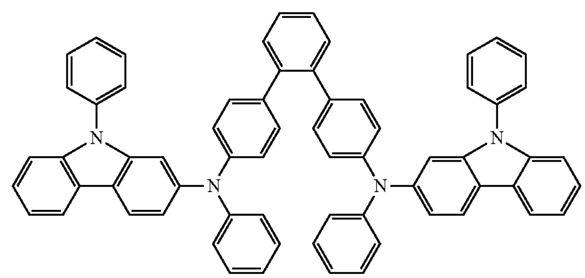
(E5)
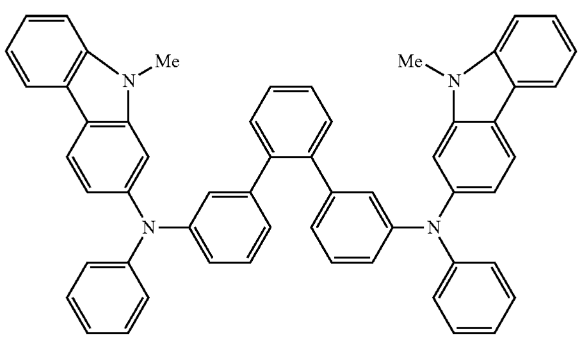
(E6)
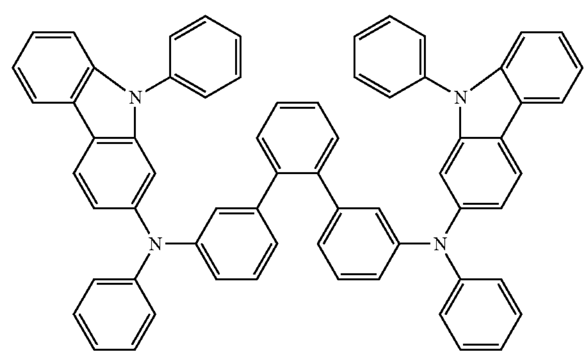
(E7)
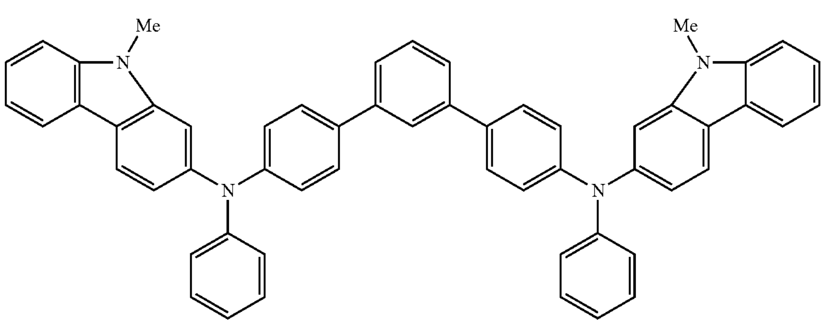

-continued
(E8)
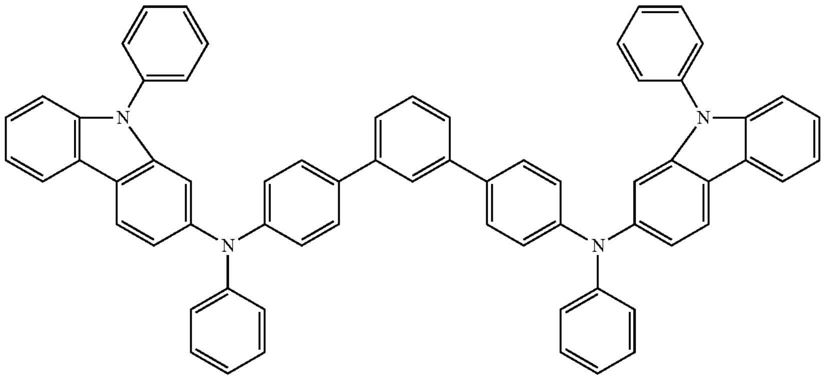
(E9)
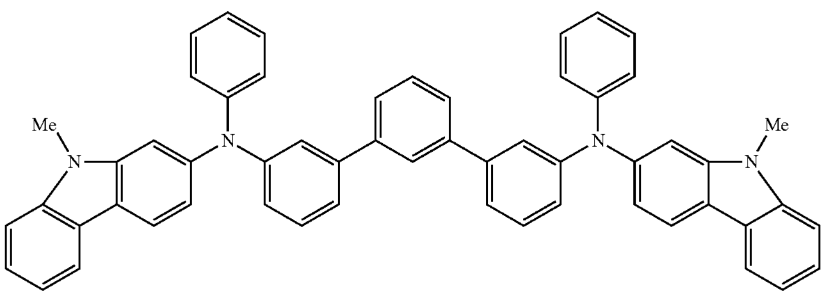
(E10)
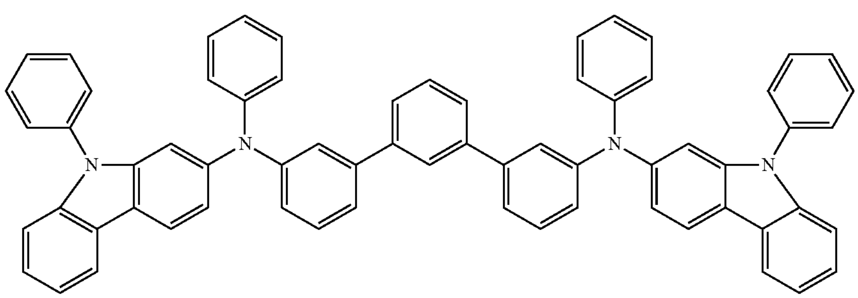
(F1)
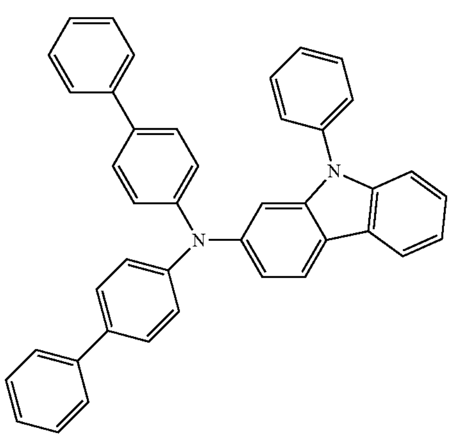
(F2)
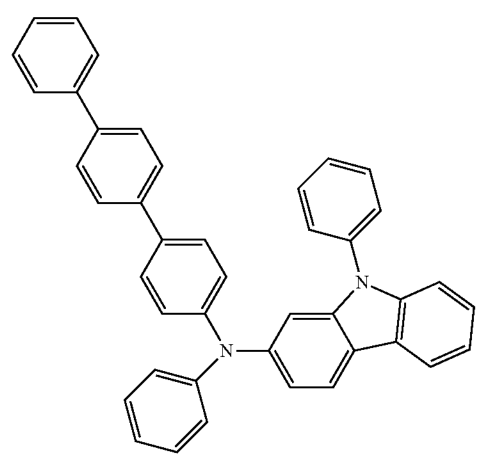

-continued
(F3)
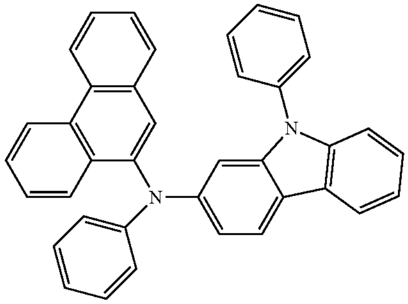
(F4)
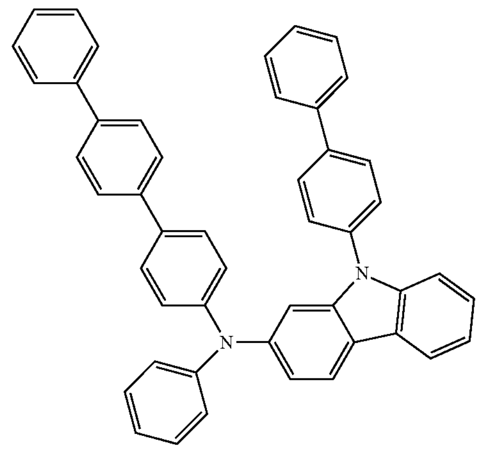
(F5)
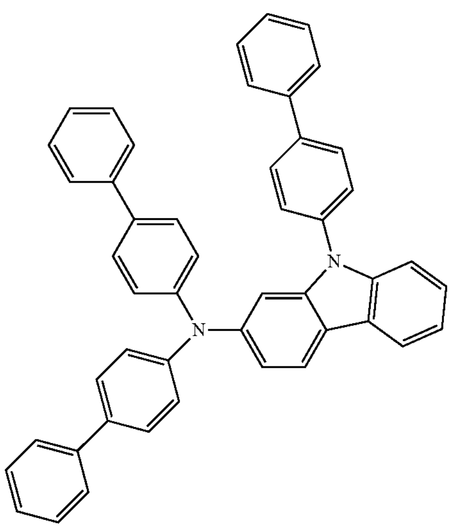
(F6)
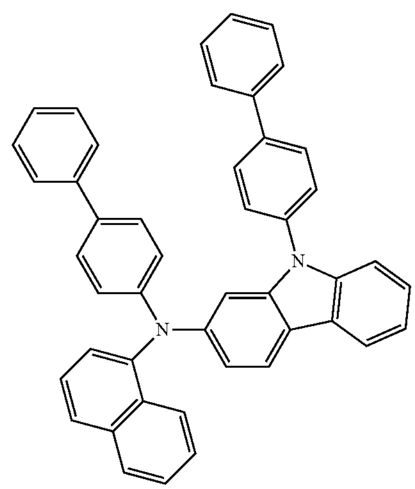
(F7)
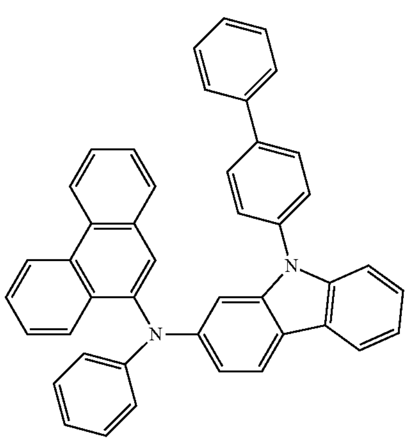
(F8)
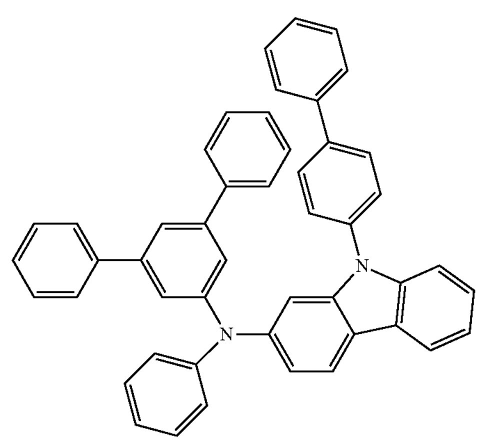

-continued
(F9)
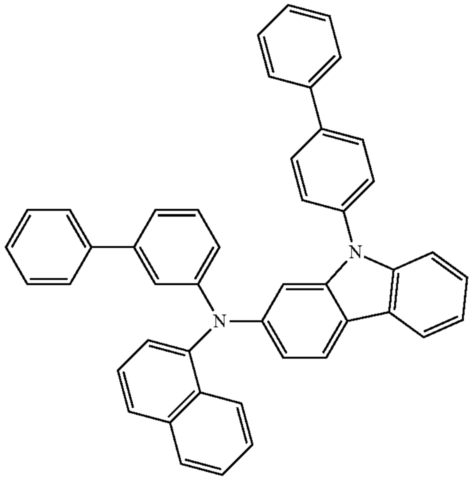
(F10)
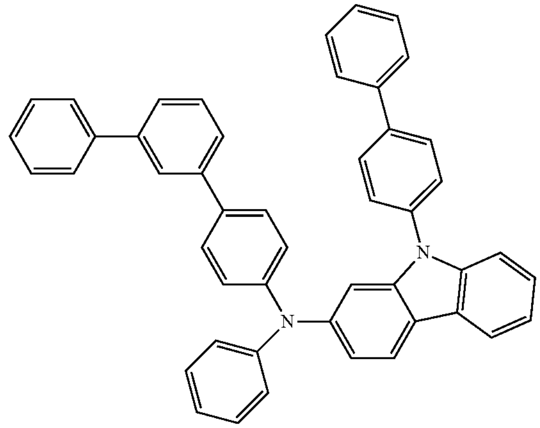
(F11)
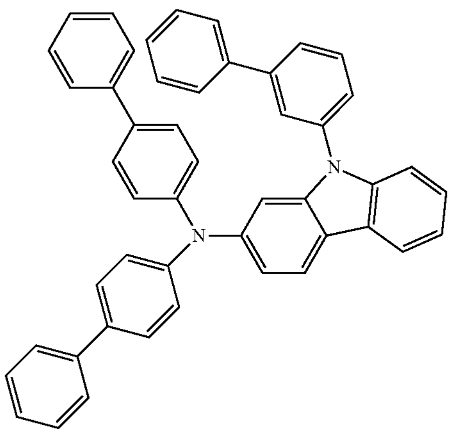
(F12)
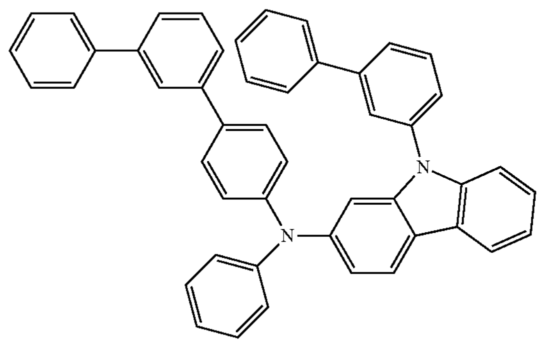
(F13)
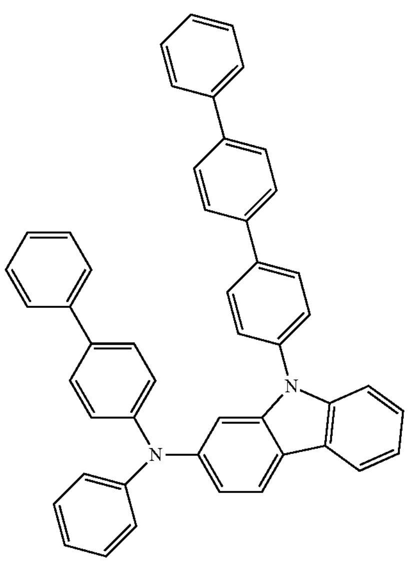
(F14)
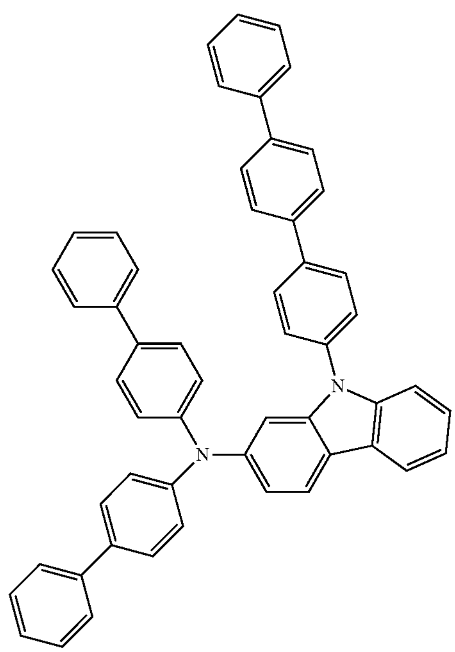

-continued
(F15)
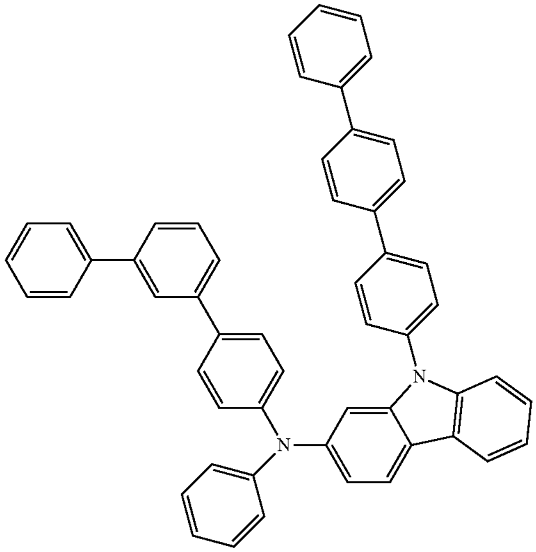
(F16)
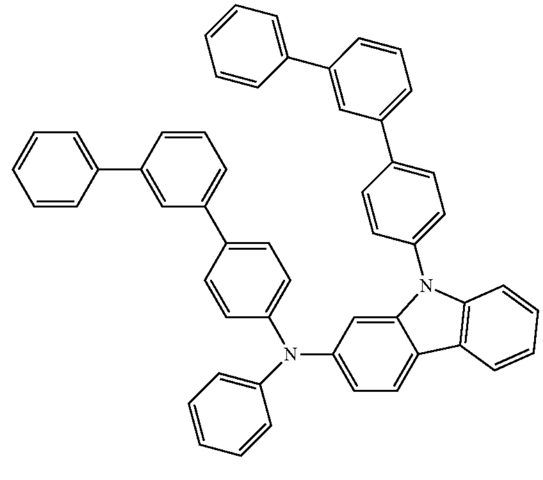
(F17)
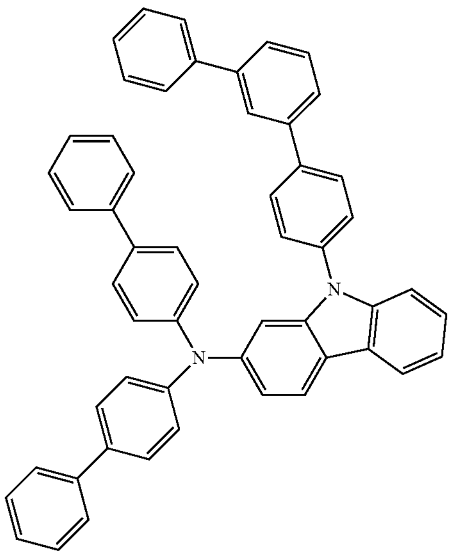
(F18)
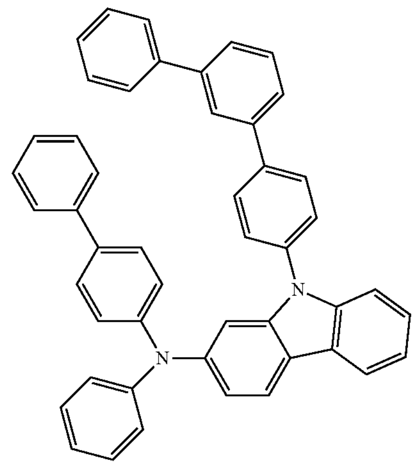
(F19)
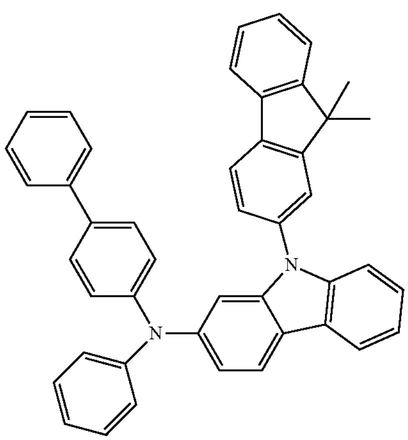
(F20)
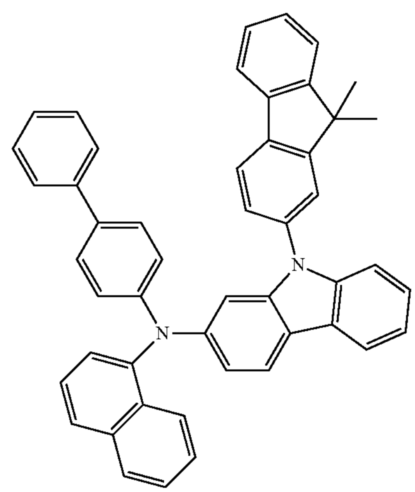

-continued
(F21)
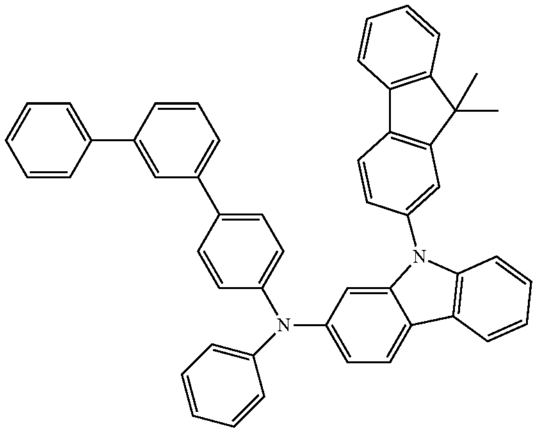
(F22)
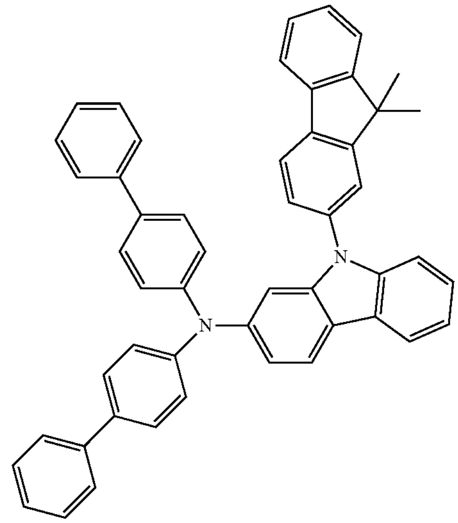
(F23)
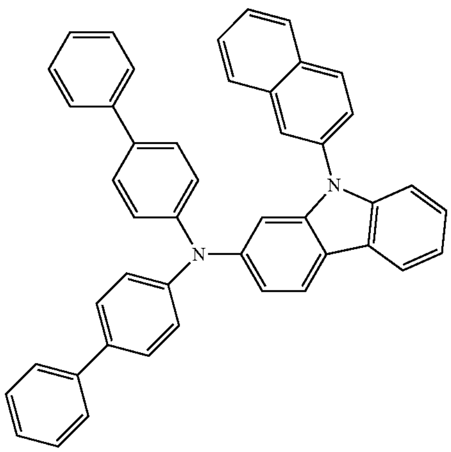
(F24)
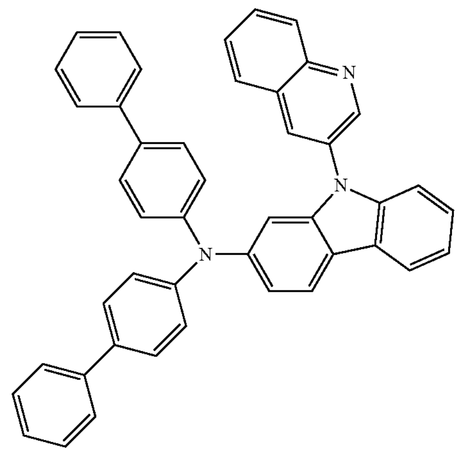
(F25)
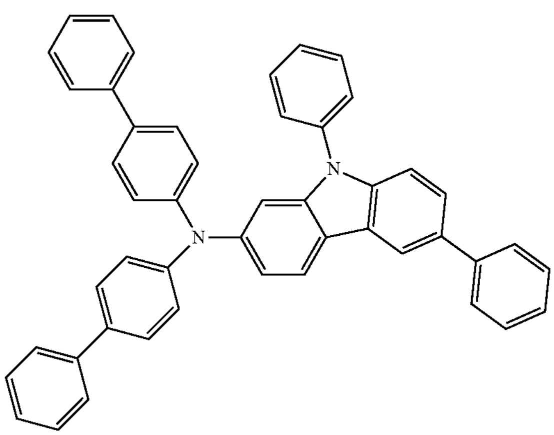
(F26)
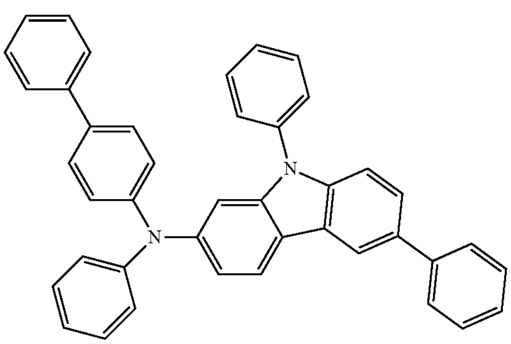

-continued (F27)

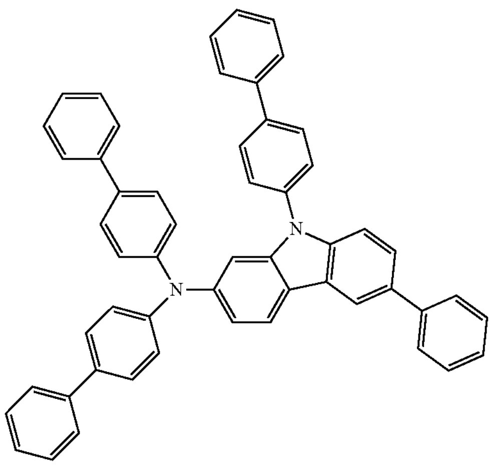

(F28)

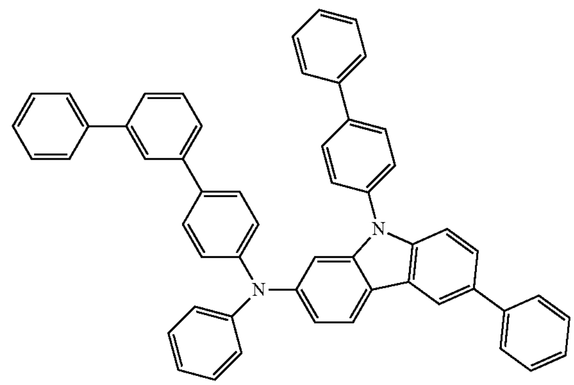

(F29)

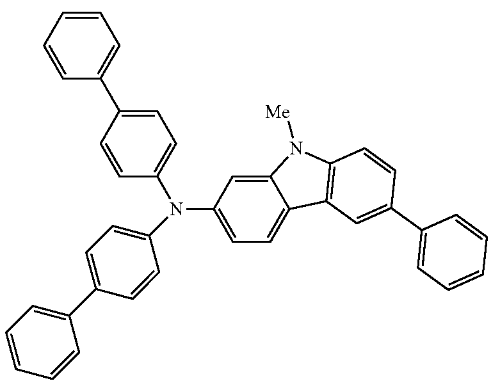

(F30)

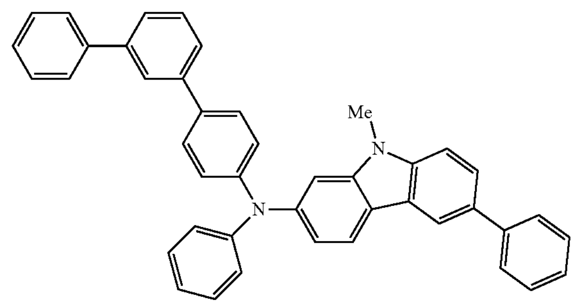

(F31)

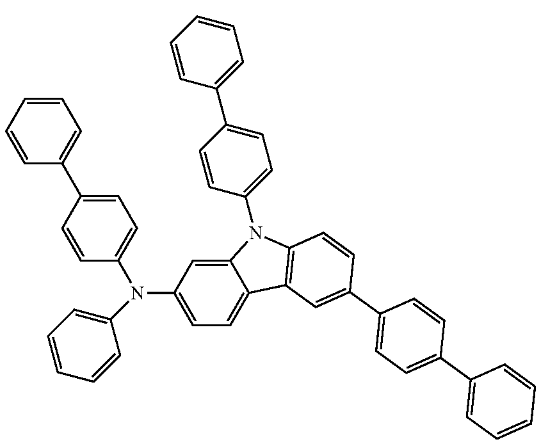

(F32)

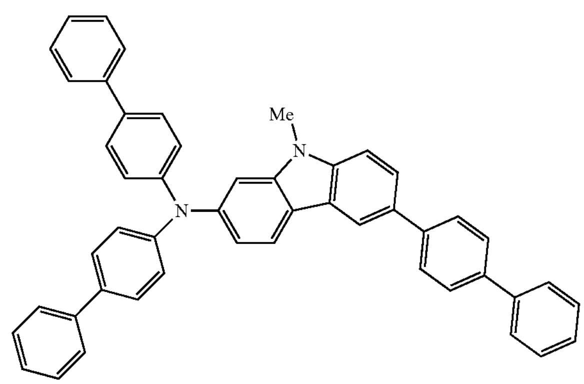

When at least one selected from the first compound (represented by one selected from Formulae 1-1 and 1-2) and the second compound (represented by Formula 2) is used in an organic light-emitting device (for example, as a material for forming an emission layer, such as a host in a phosphorescent emission layer), excitons may be efficiently or suitably formed in the emission layer, thus leading to high efficiency characteristics. When the emission layer includes the first compound and the second compound, the charge balance between holes and electrons may be significantly improved, and high efficiency and a long lifespan may be obtained. However, if a suitable material is not used to form a hole transport region (for example, an emission auxiliary layer), electrons may leak from the emission layer to the hole transport region (for example, to a hole transport layer). Accordingly, a higher driving voltage may be required and the efficiency of an organic light-emitting device may be substantially decreased. Accordingly, when the third compound represented by one selected from Formulae 3-1A and 3-2A is used as a material for forming a hole transport region (for example, an emission auxiliary layer), electrons leaking from the emission layer to the hole transport region (for example, to a hole transport layer) may be minimized or reduced, and accordingly, most of the excitons formed in the emission layer may be able to contribute to emission, leading to high efficiency. Also, deterioration of the material due to current leakage may be reduced, such that a smaller current is needed to obtain the same luminance, thereby enabling a long lifespan.

For example, the emission layer may include at least one compound selected from the first compound and the second compound, and the first compound may be selected from Compounds 100 to 272, and the second compound may be selected from Compounds 101B to 230B; or the first compound may be selected from Compounds 301 to 374, and the second compound may be selected from Compounds 101A to 212A.

The organic layer 150 may further include a hole transport region between the first electrode and the emission layer. The organic layer 150 may further include an electron transport region between the emission layer and the second electrode.

The hole transport region may have a single-layered structure or a multi-layered structure including 2 or more layers. In one or more embodiments, the hole transport region may include a single material or 2 or more different materials.

The hole transport region may include at least one selected from a hole injection layer (HIL), a hole transport layer (HTL), a buffer layer, an electron blocking layer (EBL), and an emission auxiliary layer, and the electron transport region may include at least one selected from a hole blocking layer (HBL), an electron transport layer (ETL), and an electron injection layer (EIL), but embodiments of the structure of the hole transport region are not limited thereto.

The hole transport region may have a structure of hole injection layer/hole transport layer, a structure of hole injection layer/hole transport layer/emission auxiliary layer, a structure of hole injection layer/hole transport layer/buffer layer/emission auxiliary layer, a structure of hole injection layer/emission auxiliary layer, a structure of hole injection layer/buffer layer/emission auxiliary layer, a structure of hole transport layer/emission auxiliary layer, or a structure of hole transport layer/buffer layer/emission auxiliary layer, wherein the layers constituting each of these structures are sequentially stacked on the first electrode 110 in each stated order, but embodiments of the structure of the hole transport region are not limited thereto.

When the hole transport region includes a hole injection layer, the hole injection layer may be formed on the first electrode 110 using one or more suitable methods selected from vacuum deposition, spin coating, casting, a Langmuir-Blodgett (LB) method, ink-jet printing, laser-printing, and laser-induced thermal imaging. The hole transport layer, the emission auxiliary layer, and the buffer layer may each be formed in the same manner used to form the hole injection layer.

When the hole injection layer is formed by vacuum deposition, for example, the vacuum deposition may be performed at a deposition temperature of about 100 to about 500° C., at a vacuum degree of about $10^{-8}$ to about $10^{-3}$ torr, and at a deposition rate of about 0.01 to about 100 Å/sec, depending on the compound to be deposited in the hole injection layer, and the structure of the hole injection layer to be formed.

When the hole injection layer is formed by spin coating, the spin coating may be performed at a coating rate of about 2,000 rpm to about 5,000 rpm and at a temperature of about 80° C. to 200° C., depending on the compound to be deposited in the hole injection layer, and the structure of the hole injection layer to be formed.

The hole transport layer, the emission auxiliary layer, and the buffer layer may each be formed in the same manner used to form the hole injection layer.

For example, the hole transport region may include the third compound.

For example, the hole transport region may include the emission auxiliary layer, and the emission auxiliary layer may include the third compound.

The hole transport region may further include, in addition to the third compound, at least one selected from m-MTDATA, TDATA, 2-TNATA, NPB, β-NPB, TPD, Spiro-TPD, Spiro-NPB, methylated-NPB, TAPC, HMTPD, DNTPD, TCTA (4,4',4"-tris(N-carbazolyl)triphenylamine), PANI/DBSA (polyaniline/dodecylbenzenesulfonic acid), PEDOT/PSS (poly(3,4-ethylenedioxythiophene)/poly(4-styrenesulfonate)), PANI/CSA (polyaniline/camphor sulfonic acid), PANI/PSS (polyaniline/poly(4-styrenesulfonate)), and compounds represented by Formulae 201 and 202:

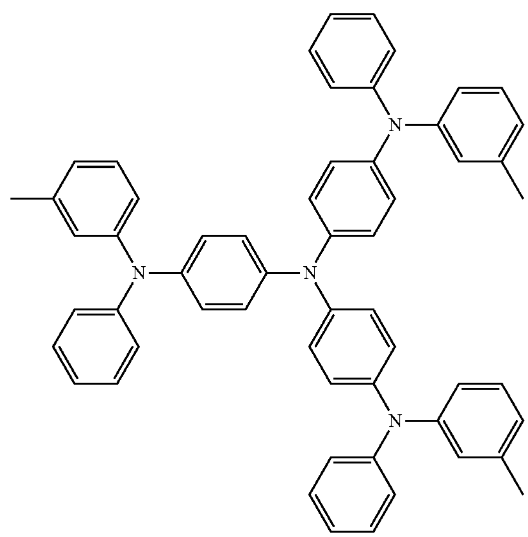

m-MTDATA

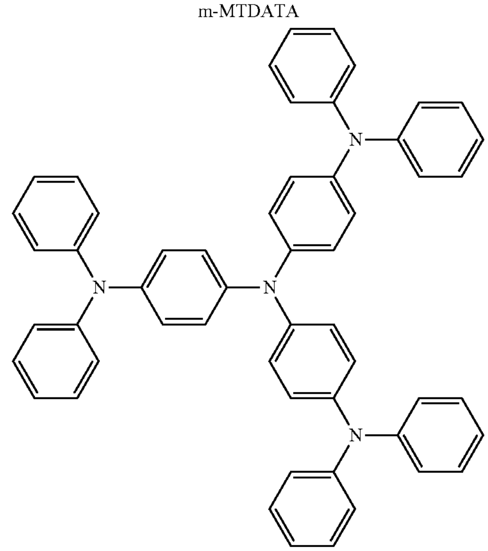

TDATA

-continued
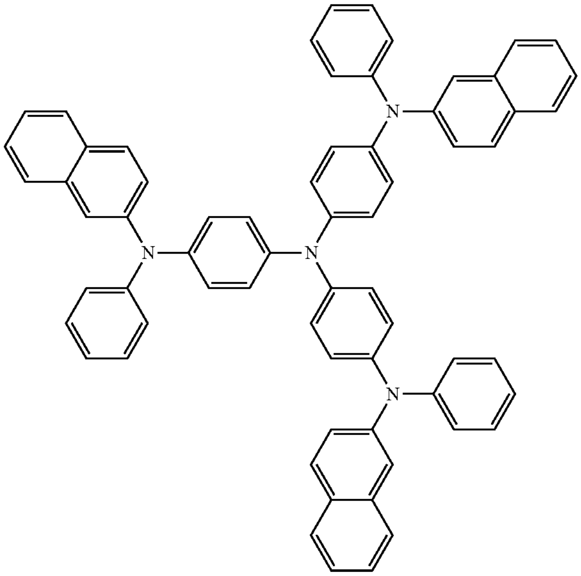
2-TNATA
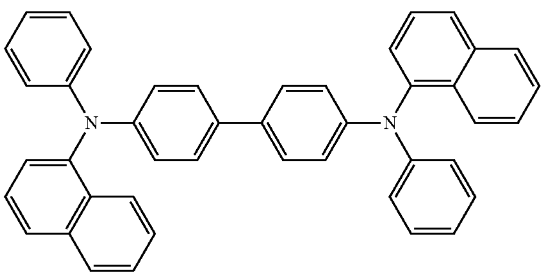
NPB
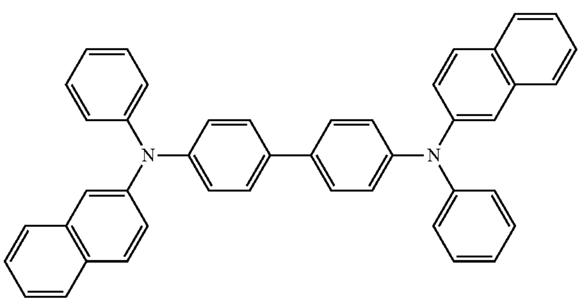
β-NPB
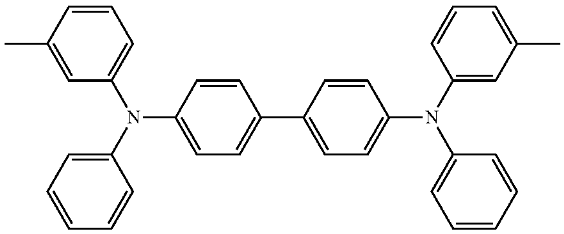
TPD
-continued
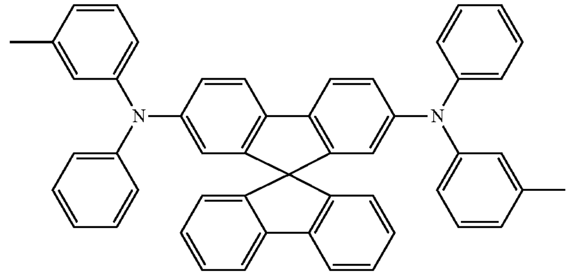
Spiro-TPD
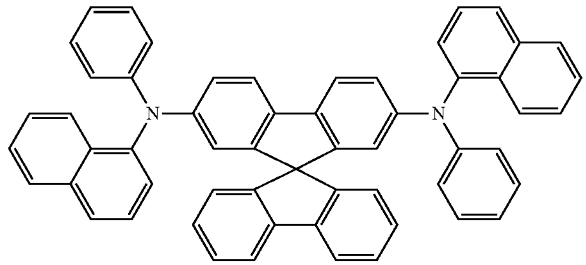
Spiro-NPB
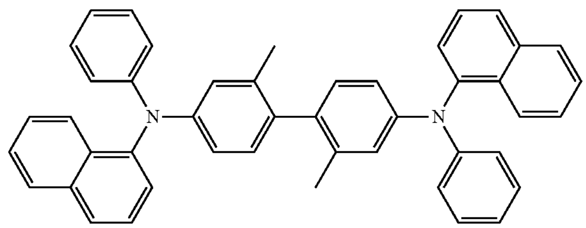
methylated NPB
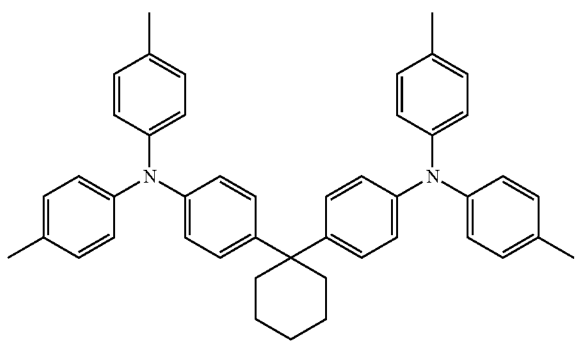
TAPC
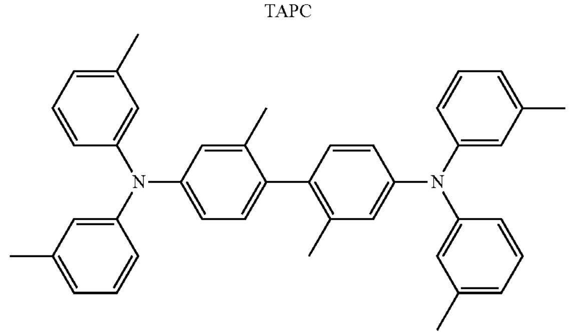
HMTPD -continued

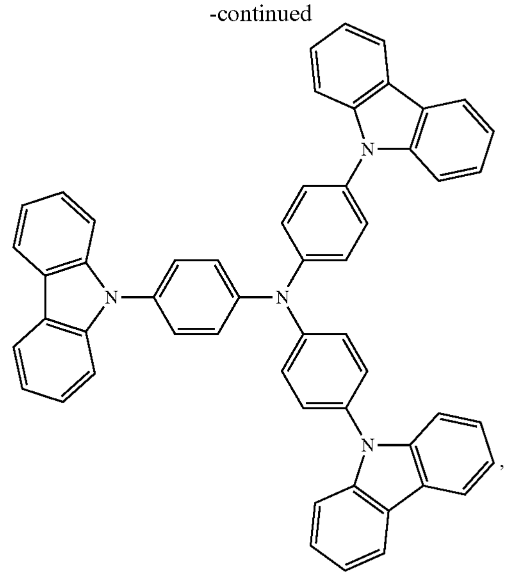

TCTA

Formula 201

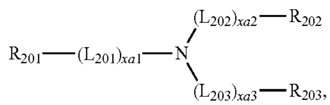

Formula 202

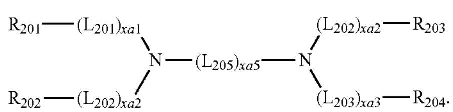

In Formula 201 and 202, $L_{201}$ to $L_{205}$ may each be the same as described herein in connection with $L_{11}$;

xa1 to xa4 may each independently be selected from 0, 1, 2, and 3;

xa5 may be selected from 1, 2, 3, 4, and 5; and $R_{201}$ to $R_{204}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formulae 201 and 202, $L_{201}$ to $L_{205}$ may each independently be selected from the group consisting of:

a phenylene group, a naphthylene group, a fluorenylene group, a spiro-fluorenylene group, a benzofluorene group, a dibenzofluorene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group;

xa1 to xa4 may each independently be selected from 0, 1, and 2;

xa5 may be selected from 1, 2, and 3; and $R_{201}$ to $R_{204}$ may each independently be selected from the group consisting of:

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, but embodiments of the present disclosure are not limited thereto.

The compound represented by Formula 201 may be represented by Formula 201A:

Formula 201A

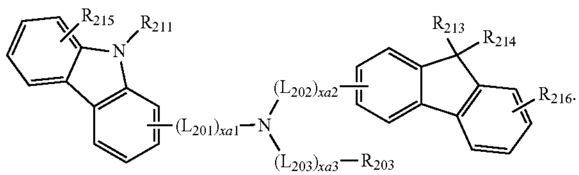

In some embodiments, the compound represented by Formula 201 may be represented by Formula 201A-1, but embodiments of the present disclosure are not limited thereto:

Formula 201A-1

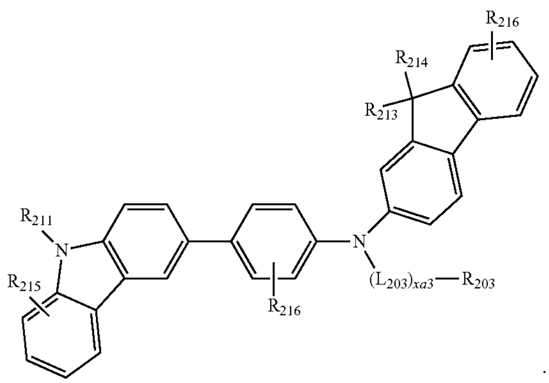

In some embodiments, the compound represented by Formula 202 may be represented by Formula 202A, but embodiments of the present disclosure are not limited thereto:

Formula 202A

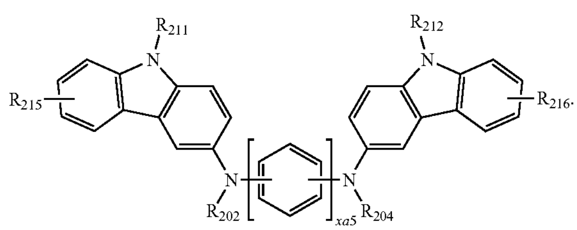

In Formulae 201A, 201A-1, and 202A, $L_{201}$ to $L_{203}$, xa1 to xa3, xa5, and $R_{202}$ to $R_{204}$ may each be the same as described above, $R_{211}$ and $R_{212}$ may each be the same as described herein in connection with $R_{203}$, and $R_{213}$ to $R_{216}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$aryloxy group, a $C_6$-$C_{60}$arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group.

For example, in Formulae 201A, 201A-1, and 202A, $L_{201}$ to $L_{203}$ may each independently be selected from the group consisting of:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa1 to xa3 may each independently be selected from 0 and 1;

$R_{203}$, $R_{204}$, $R_{211}$, and $R_{212}$ may each independently be selected from the group consisting of:

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group and a triazinyl group;

$R_{213}$ and $R_{214}$ may each independently be selected from the group consisting of:

a $C_1$-$C_{20}$ alkyl group, a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{215}$ and $R_{216}$ may each independently be selected from the group consisting of:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xa5 may be selected from 1 and 2.

$R_{213}$ and $R_{214}$ in Formulae 201A and 201A-1 may be linked (e.g., coupled) to each other to form a saturated or unsaturated ring.

The compound represented by Formula 201 and the compound represented by Formula 202 may include Compounds HT1 to HT20, but embodiments of the present disclosure are not limited thereto:
HT1
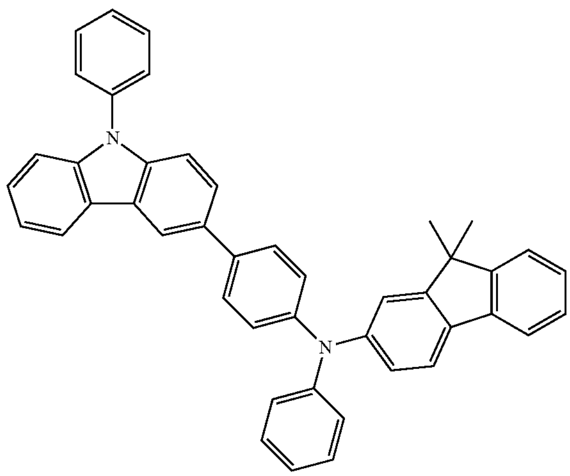
HT2
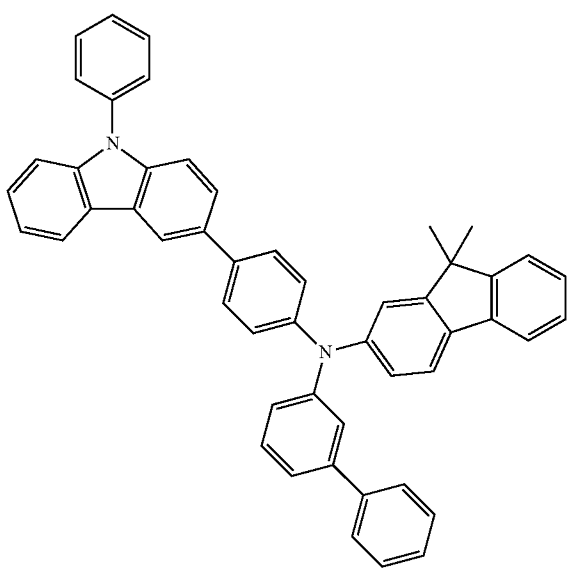
-continued
HT3
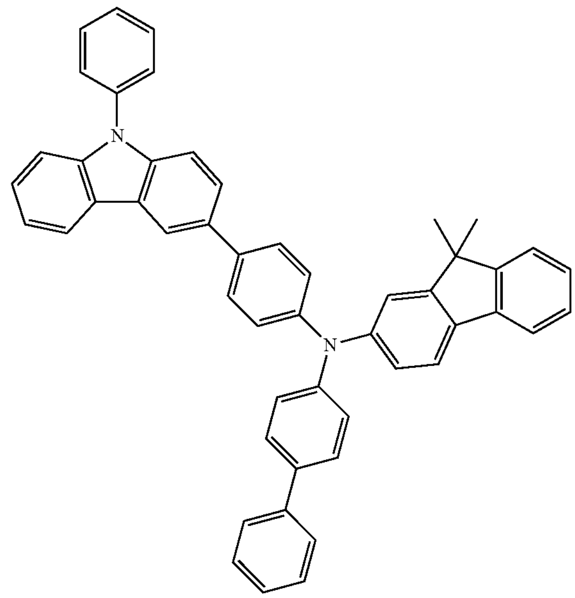
HT4
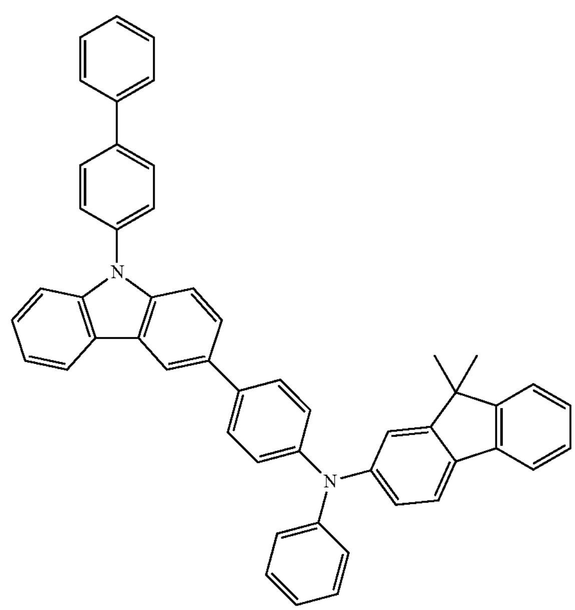

-continued
HT5
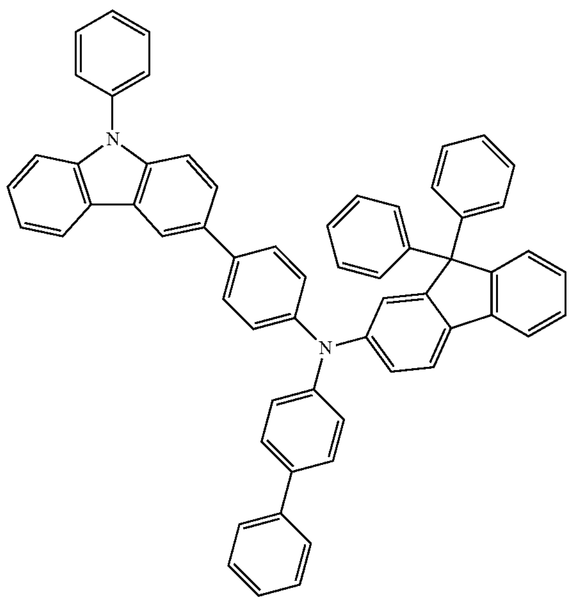
HT6
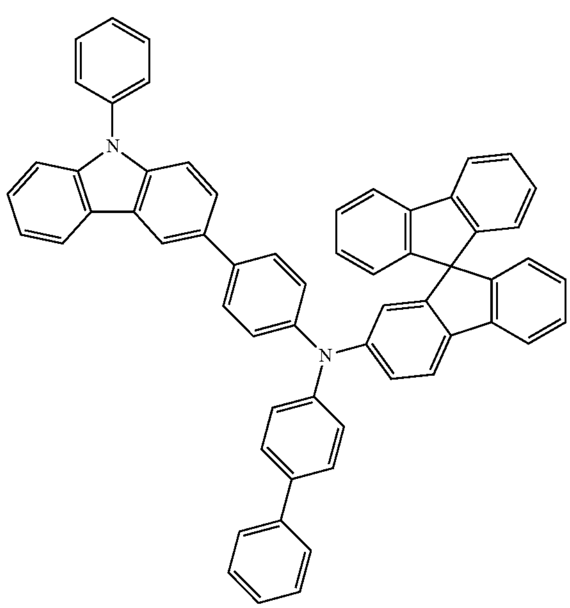
-continued
HT7
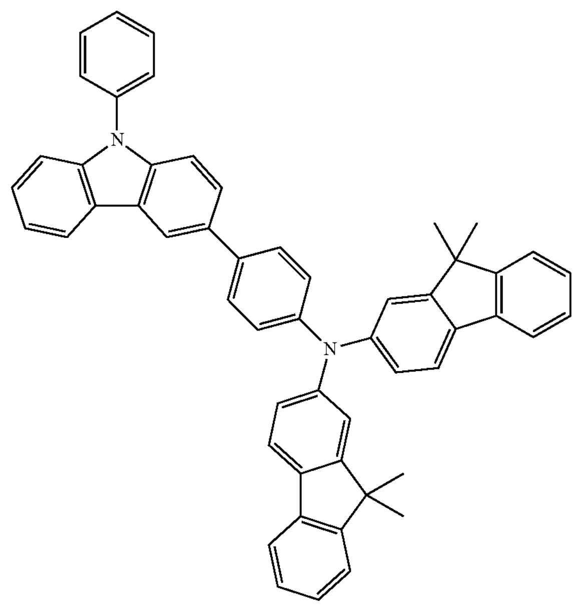
HT8
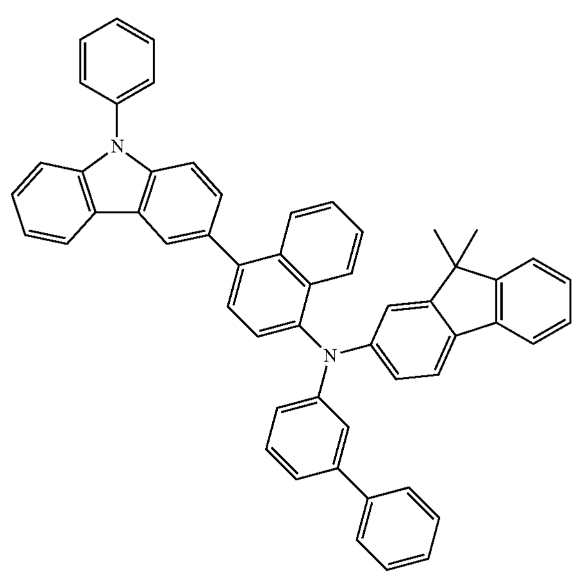

-continued
HT9
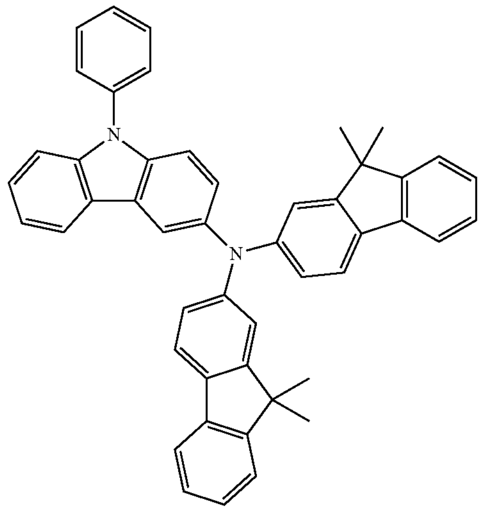
HT10
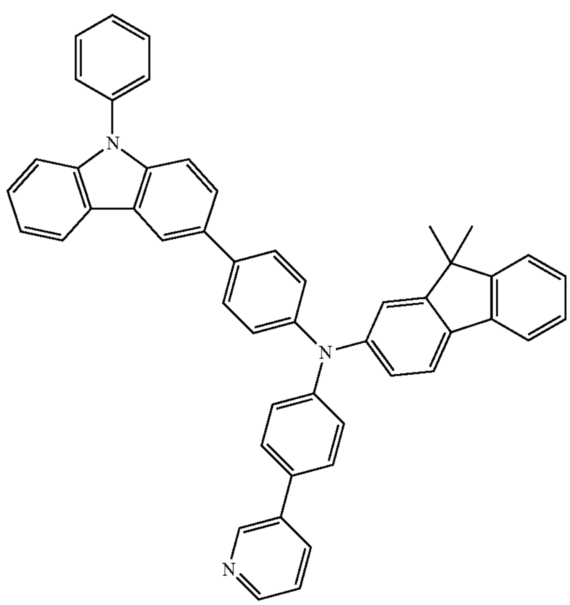
-continued
HT11
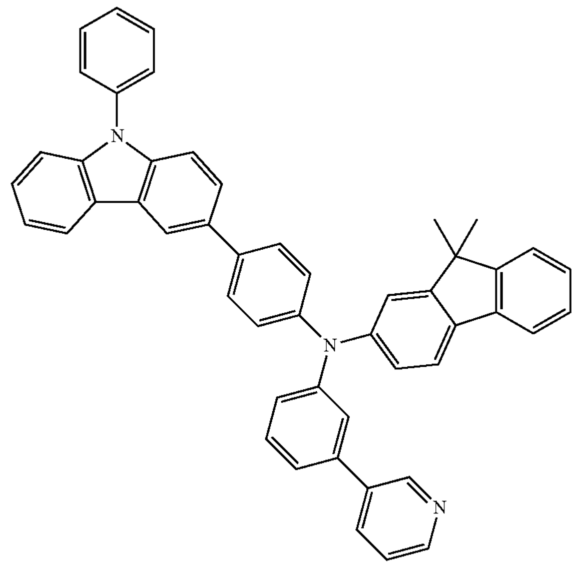
HT12
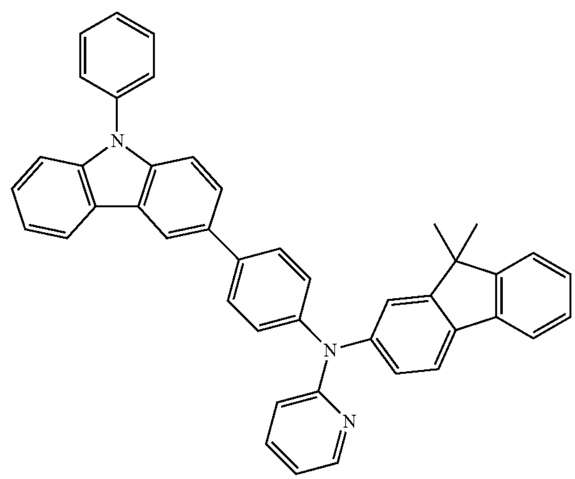
HT13
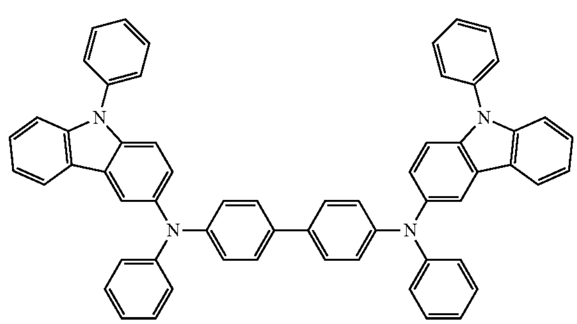

-continued

HT14

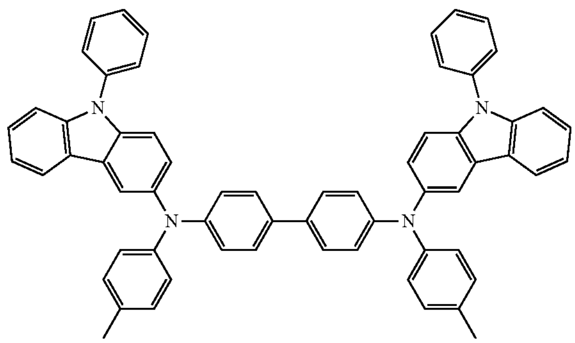

HT15

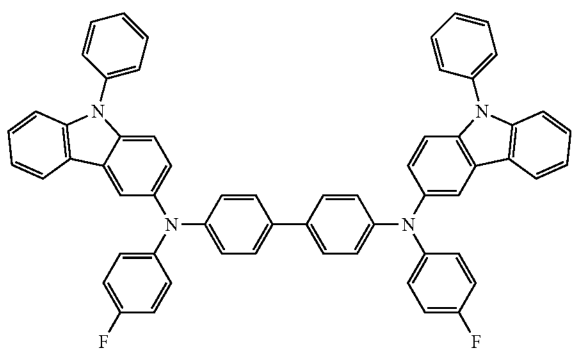

HT16

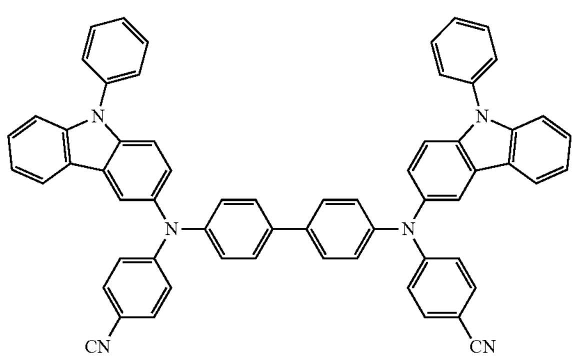

HT17

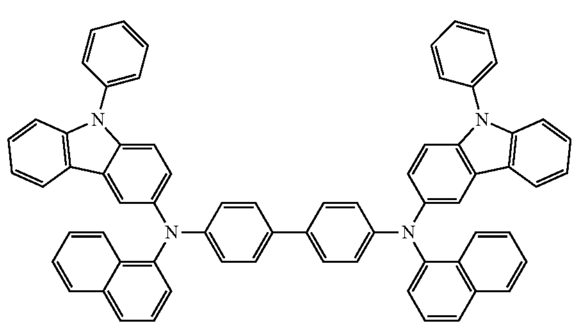

-continued

HT18

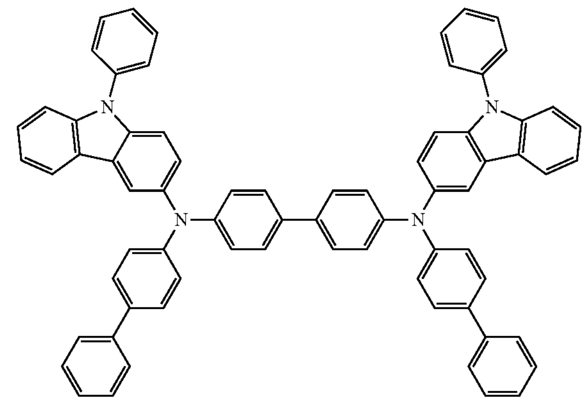

HT19

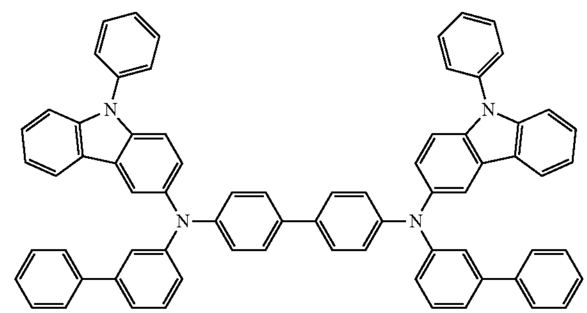

HT20

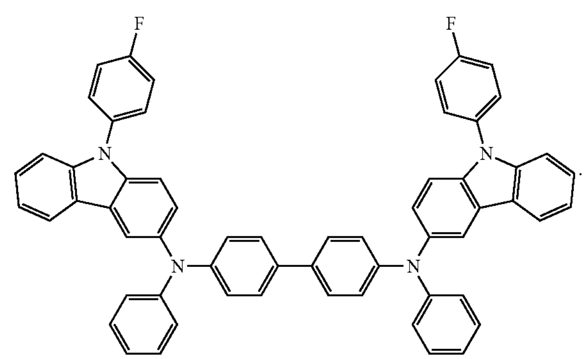

The thickness of the hole transport region may be about 100 Å to about 10,000 Å, and in some embodiments, about 100 Å to about 1,000 Å. When the hole transport region includes a hole injection layer and a hole transport layer, the thickness of the hole injection layer may be about 100 Å to about 10,000 Å, and in some embodiments, about 100 Å to about 1,000 Å. The thickness of the hole transport layer may be about 50 Å to about 2,000 Å, and in some embodiments, about 100 Å to about 1,500 Å. When the thicknesses of the hole transport region, the hole injection layer, and the hole transport layer are within these ranges, satisfactory hole transporting characteristics may be obtained without a substantial increase in driving voltage.

When the hole transport region includes an emission auxiliary layer, the thickness of the emission auxiliary layer may be about 10 Å to about 2,000 Å, and in some embodiments, about 50 Å to about 1,000 Å. When the thickness of the emission auxiliary layer is within these ranges, the hole transport layer may have satisfactory hole transporting ability without a substantial increase in driving voltage.

The hole transport region may further include, in addition to these materials, a charge-generation material for the improvement of conductive properties. The charge-generation material may be homogeneously or non-homogeneously dispersed in the hole transport region.

The p-dopant may be one selected from a quinone derivative, a metal oxide, and a cyano group-containing compound, but embodiments of the present disclosure are not limited thereto. Non-limiting examples of the p-dopant may include a quinone derivative (such as tetracyanoquinonedimethane (TCNQ)) a metal oxide (such as a tungsten oxide and/or a molybdenum oxide), Compound HT-D1, and Compound HT-D2, but embodiments of the present disclosure are not limited thereto.

Compound HT-D1

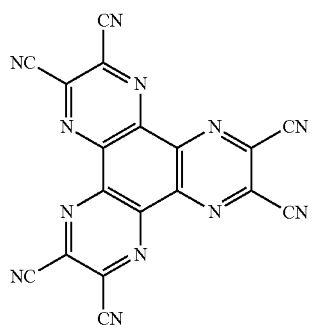

Compound HT-D2

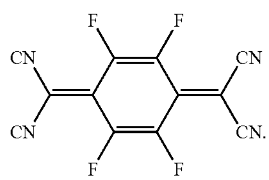

The hole transport region may further include, in addition to the hole injection layer and the hole transport layer, at least one selected from a buffer layer, an emission auxiliary layer, and an electron blocking layer. Since the buffer layer may compensate for an optical resonance distance according to a wavelength of light emitted from the emission layer (e.g., be used to adjust the optical resonance distance to match the wavelength of light emitted from the emission layer), the light-emission efficiency of a formed organic light-emitting device may be improved. Materials that are included in the hole transport region may also be included in the buffer layer. The electron blocking layer may prevent or reduce injection of electrons from the electron transport region.

When the hole transport region includes the emission auxiliary layer, the emission auxiliary layer may directly contact the emission layer, but embodiments of the present disclosure are not limited thereto.

An emission layer may be formed on the first electrode 110 or on the hole transport region using one or more suitable methods selected from vacuum deposition, spin coating, casting, a LB method, ink-jet printing, laser-printing, and laser-induced thermal imaging. When the emission layer is formed by vacuum deposition and/or spin coating, the deposition and coating conditions used for the emission layer may be similar to the deposition and coating conditions used for the hole injection layer.

When the organic light-emitting device 10 is a full color organic light-emitting device, the emission layer 150 may be patterned into a red emission layer, a green emission layer, or a blue emission layer, according to a sub pixel. In some embodiments, the emission layer 150 may have a stacked structure including a red emission layer, a green emission layer, and a blue emission layer, or may include a red-light emission material, a green-light emission material, and a blue-light emission material, which may be mixed with each other in a single layer to thereby emit white light.

The emission layer may include a host and a dopant.

The emission layer may include at least one compound selected from the first compound and the second compound.

The first compound and the second compound may each act as a host in the emission layer.

For example, the emission layer may include the first compound, and the emission auxiliary layer may include the third compound; or the emission layer may include the second compound, and the emission auxiliary layer may include the third compound.

In one or more embodiments, the emission layer may include the first compound and the second compound, and the emission auxiliary layer may include the third compound;

the emission layer may include a first host selected from the first compound and a second host selected from the second compound, and the emission auxiliary layer may include the third compound;

the emission layer may include a third host and a fourth host, each selected from the first compound, the third host and the fourth host are different from each other, and the emission auxiliary layer may include the third compound; or the emission layer may include a fifth host and a sixth host, each selected from the second compound, the fifth host and the sixth host are different from each other, and the emission auxiliary layer may include the third compound, but embodiments of the present disclosure are not limited thereto.

The emission layer may include, in addition to at least one compound selected from the first compound and the second compound, at least one selected from TPBi, TBADN, ADN, CBP, CDBP, and TCP:

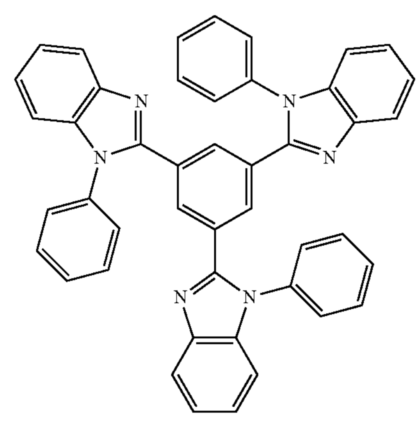

TPBi

-continued

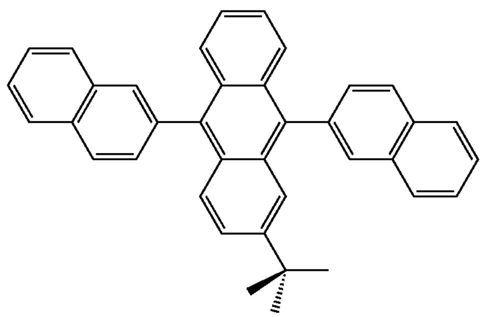

TBADN

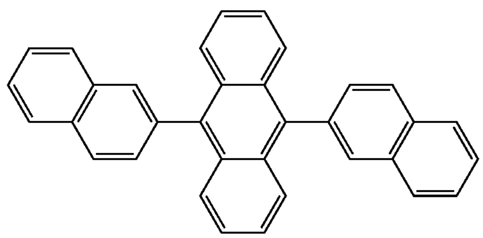

ADN

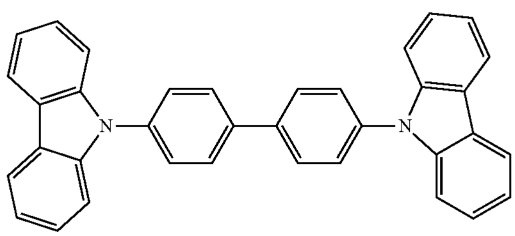

CBP

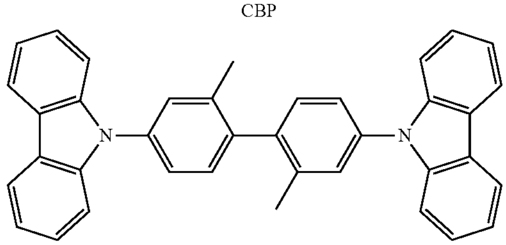

CDBP

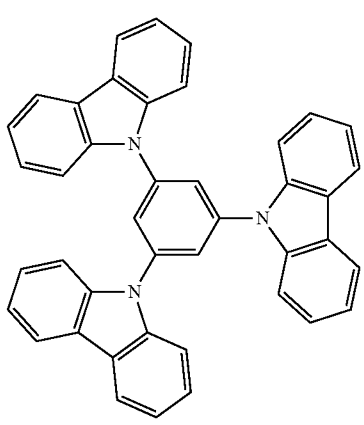

TCP

The dopant may further include at least one selected from a fluorescent dopant and a phosphorescent dopant.

The phosphorescent dopant may include an organometallic complex represented by Formula 401:

Formula 401

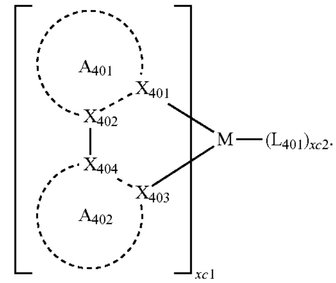

In Formula 401,

M may be selected from iridium (Ir), platinum (Pt), osmium (Os), titanium (Ti), zirconium (Zr), hafnium (Hf), europium (Eu), terbium (Tb), and thulium (Tm);

$X_{401}$ to $X_{404}$ may each independently be selected from nitrogen and carbon;

rings $A_{401}$ and $A_{402}$ may each independently be selected from a substituted or unsubstituted benzene, a substituted or unsubstituted naphthalene, a substituted or unsubstituted fluorene, a substituted or unsubstituted spiro-fluorene, a substituted or unsubstituted indene, a substituted or unsubstituted pyrrole, a substituted or unsubstituted thiophene, a substituted or unsubstituted furan, a substituted or unsubstituted imidazole, a substituted or unsubstituted pyrazole, a substituted or unsubstituted thiazole, a substituted or unsubstituted isothiazole, a substituted or unsubstituted oxazole, a substituted or unsubstituted isoxazole, a substituted or unsubstituted pyridine, a substituted or unsubstituted pyrazine, a substituted or unsubstituted pyrimidine, a substituted or unsubstituted pyridazine, a substituted or unsubstituted quinoline, a substituted or unsubstituted isoquinoline, a substituted or unsubstituted benzoquinoline, a substituted or unsubstituted quinoxaline, a substituted or unsubstituted quinazoline, a substituted or unsubstituted carbazole, a substituted or unsubstituted benzimidazole, a substituted or unsubstituted benzofuran, a substituted or unsubstituted benzothiophene, a substituted or unsubstituted isobenzothiophene, a substituted or unsubstituted benzoxazole, a substituted or unsubstituted isobenzoxazole, a substituted or unsubstituted triazole, a substituted or unsubstituted oxadiazole, a substituted or unsubstituted triazine, a substituted or unsubstituted dibenzofuran, and a substituted or unsubstituted dibenzothiophene;

at least one substituent of the substituted benzene, substituted naphthalene, substituted fluorene, substituted spiro-fluorene, substituted indene, substituted pyrrole, substituted thiophene, substituted furan, substituted imidazole, substituted pyrazole, substituted thiazole, substituted isothiazole, substituted oxazole, substituted isoxazole, substituted pyridine, substituted pyrazine, substituted pyrimidine, substituted pyridazine, substituted quinoline, substituted isoquinoline, substituted benzoquinoline, substituted quinoxaline, substituted quinazoline, substituted carbazole, substituted benzimidazole, substituted benzofuran, substituted benzothiophene, substituted isobenzothiophene, substituted benzoxazole, substituted isobenzoxazole, substituted triazole, substituted oxadiazole, substituted triazine, substituted dibenzofuran, and substituted dibenzothiophene may be selected from the group consisting of:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —N($Q_{401}$)($Q_{402}$), —Si($Q_{403}$)($Q_{404}$)($Q_{405}$), and —B($Q_{406}$)($Q_{407}$), a $C_3$-$C_{10}$ cycloalkyl group, a $C_1$-$C_{10}$heterocycloalkyl, $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group;

a $C_3$-$C_{10}$ cycloalkyl group, a $C_1$-$C_{10}$heterocycloalkyl, $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{411}$)($Q_{412}$), —Si($Q_{413}$)($Q_{414}$)($Q_{415}$), and —B($Q_{416}$)($Q_{417}$), —N($Q_{421}$)($Q_{422}$), —Si($Q_{423}$)($Q_{424}$)($Q_{425}$), and —B($Q_{426}$)($Q_{427}$), $L_{401}$ may be an organic ligand;

xc1 may be selected from 1, 2, and 3;

xc2 may be selected from 0, 1, 2, and 3, wherein $Q_{401}$ to $Q_{407}$, $Q_{411}$ to $Q_{417}$, and $Q_{421}$ to $Q_{427}$ may each independently be selected from hydrogen, $C_1$-$C_{60}$ alkyl group, a $C_2$-$C_{60}$ alkenyl group, a $C_6$-$C_{60}$ aryl group, and a $C_1$-$C_{60}$ heteroaryl group; and $L_{401}$ may be a monovalent, divalent, or trivalent organic ligand. For example, $L_{401}$ may be selected from a halogen ligand (for example, Cl and/or F), a diketone ligand (for example, acetylacetonate, 1,3-diphenyl-1,3-propandionate, 2,2,6,6-tetramethyl-3,5-heptandionate, and/or hexafluoroacetonate), a carboxylic acid ligand (for example, picolinate, dimethyl-3-pyrazolecarboxylate, and/or benzoate), a carbon monoxide ligand, an isonitrile ligand, a cyano ligand, and a phosphorous ligand (for example, phosphine and/or phosphite), but embodiments of the present disclosure are not limited thereto.

When $A_{401}$ in Formula 401 has two or more substituents, the substituents of $A_{401}$ may be linked (e.g., coupled) to each other to form a saturated or unsaturated ring.

When $A_{402}$ in Formula 401 has two or more substituents, the substituents of $A_{402}$ may be linked (e.g., coupled) to each other to form a saturated or unsaturated ring.

When xc1 in Formula 401 is 2 or more, a plurality of ligands

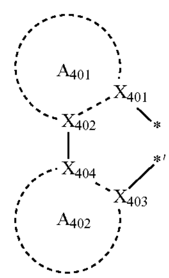

in Formula 401 may be identical to or different from each other. When xc1 in Formula 401 is 2 or more, $A_{401}$ and $A_{402}$ may be connected to $A_{401}$ and $A_{402}$, respectively, of other neighboring ligands with or without a linker (for example, a $C_1$-$C_5$ alkylene group, a $C_2$-$C_5$ alkenylene group, —N(R')— (wherein R' is a $C_1$-$C_{10}$ alkyl group or a $C_6$-$C_{20}$ aryl group) and/or —C(=O)—) therebetween.

The phosphorescent dopant may include at least one selected from Compounds PD1 to PD76, but embodiments of the present disclosure are not limited thereto:

PD1

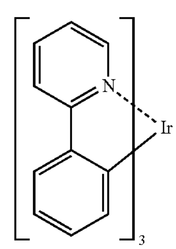

PD2

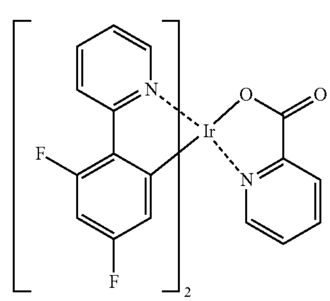

-continued
PD3
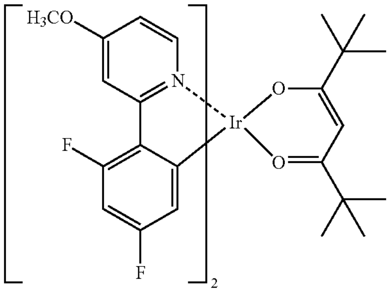
PD4
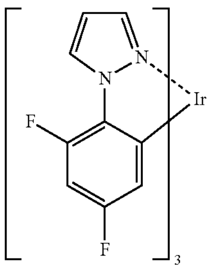
PD5
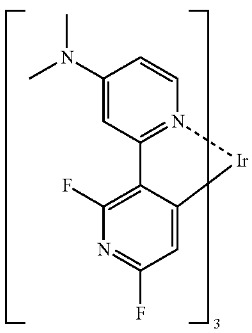
PD6
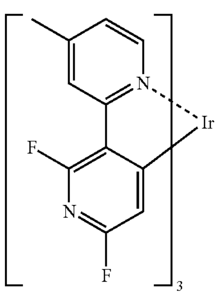
PD7
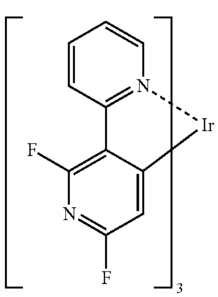
-continued
PD8
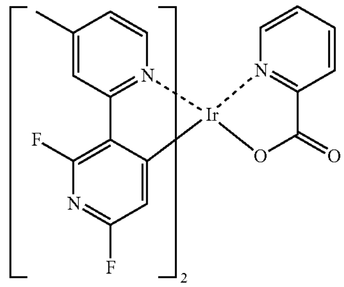
PD9
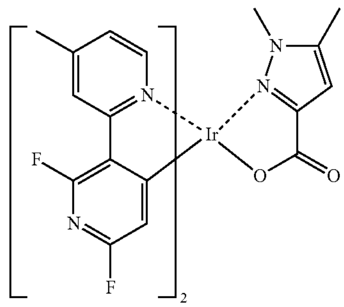
PD10
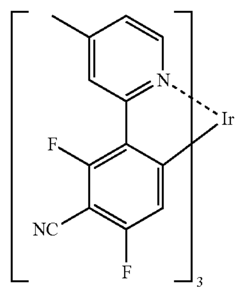
PD11
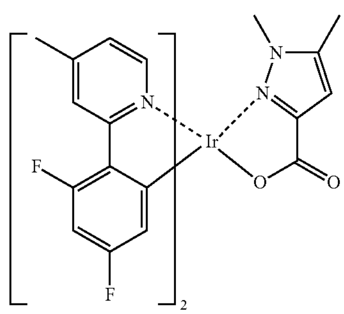
PD12
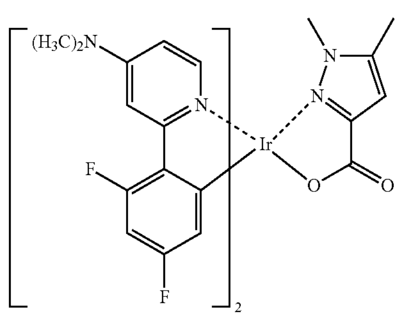

-continued
PD13
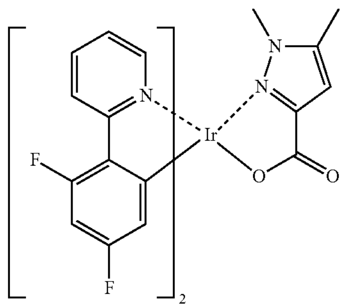
PD14
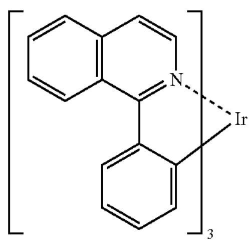
PD15
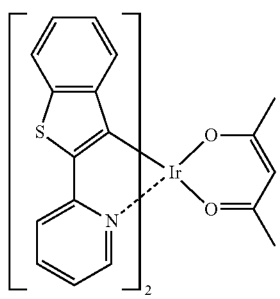
PD16
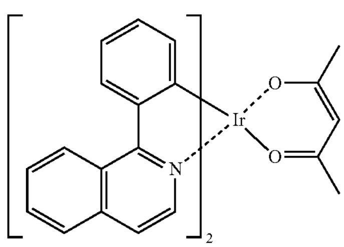
PD17
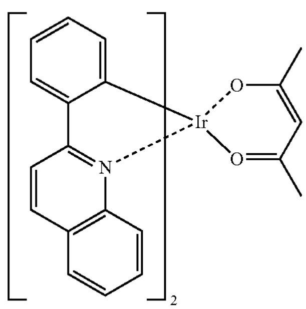
-continued
PD18
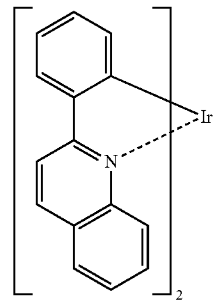
PD19
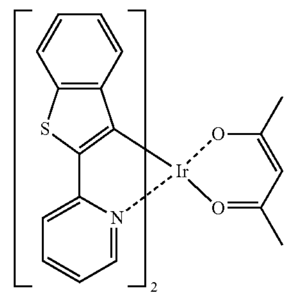
PD20
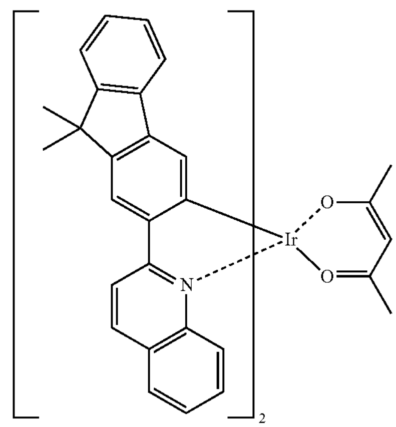
PD21
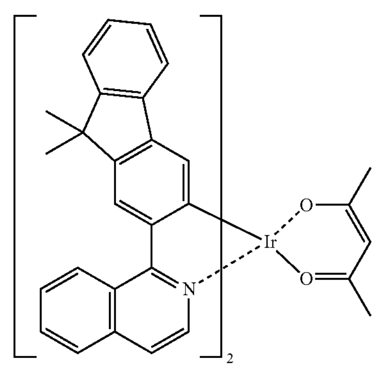
PD22
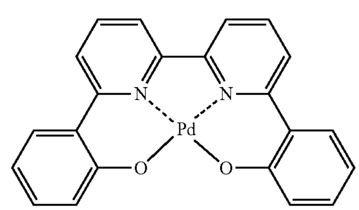

-continued
PD23
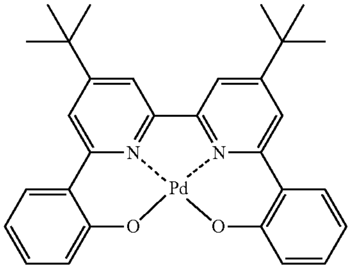
PD24
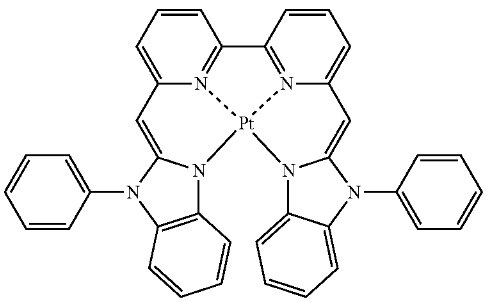
PD25
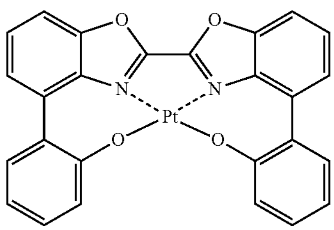
PD26
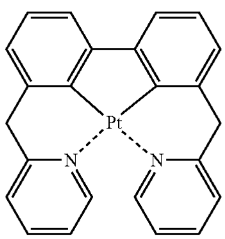
PD27
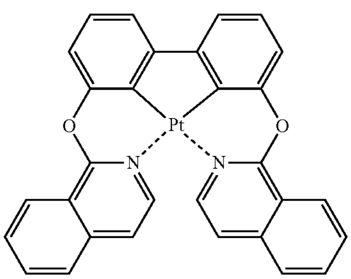
PD28
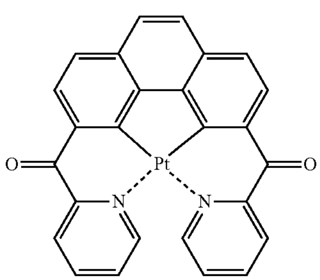
-continued
PD29
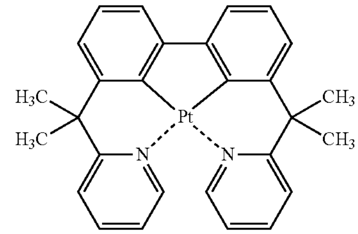
PD30
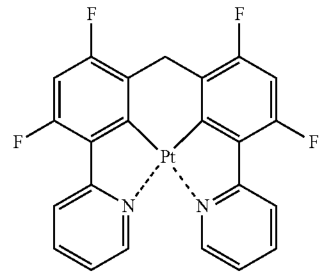
PD31
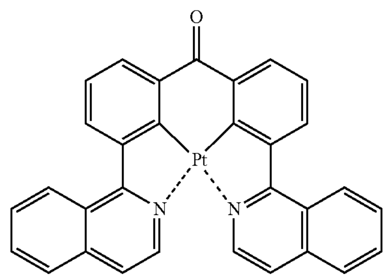
PD32
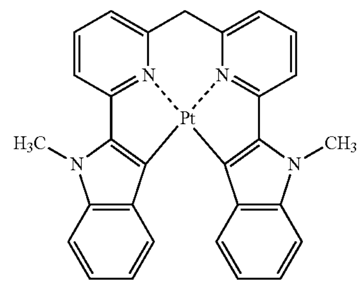
PD33
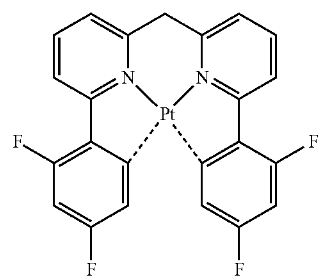
PD34
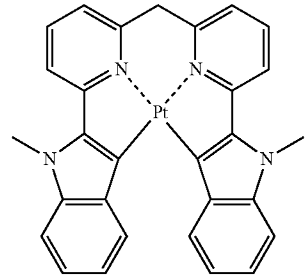

PD35
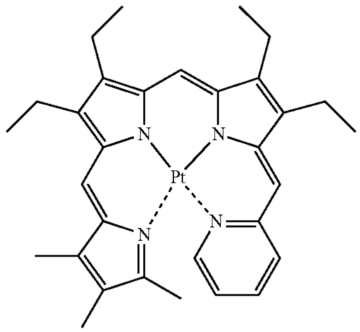
PD36
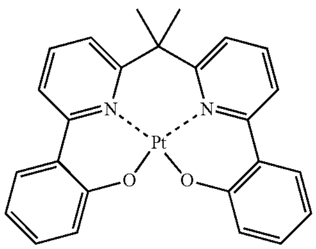
PD37
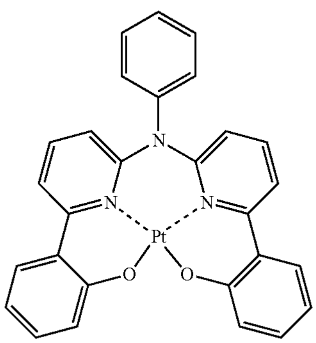
PD38
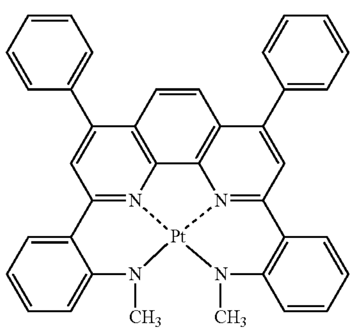
PD39
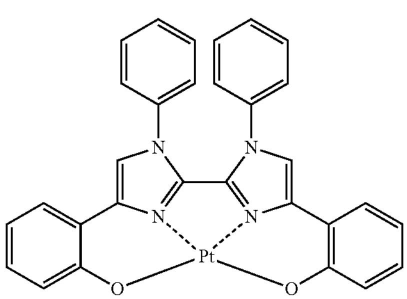
PD40
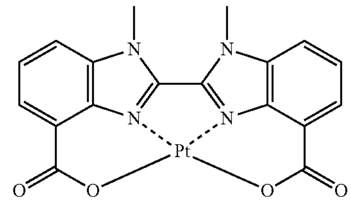
PD41
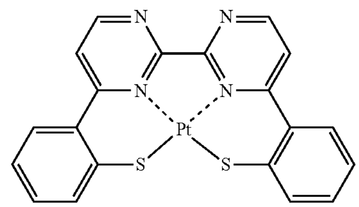
PD42
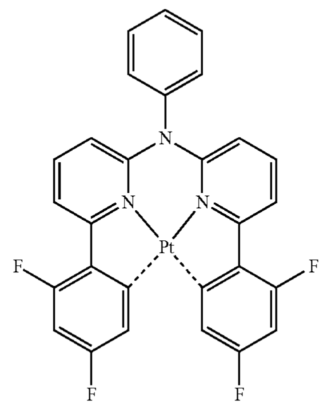
PD43
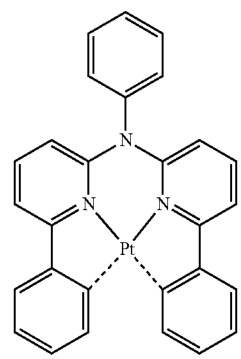
PD44
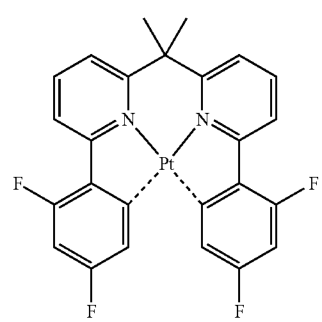

-continued
PD45
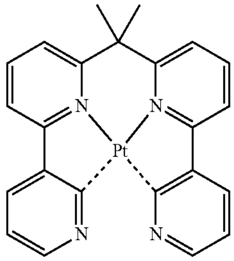
PD46
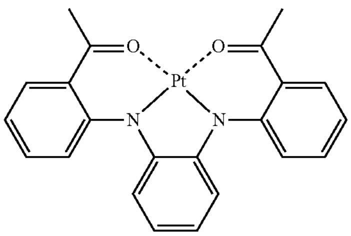
PD47
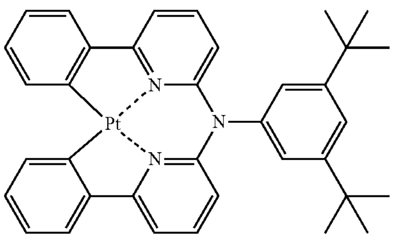
PD48
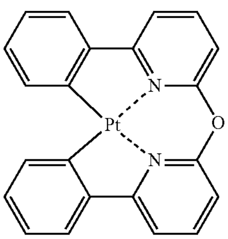
PD49
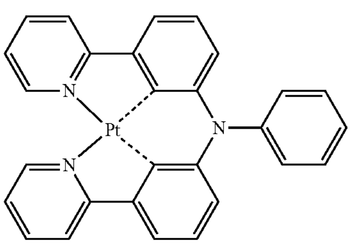
PD50
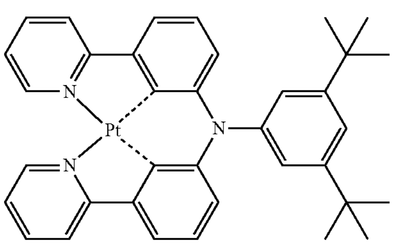
-continued
PD51
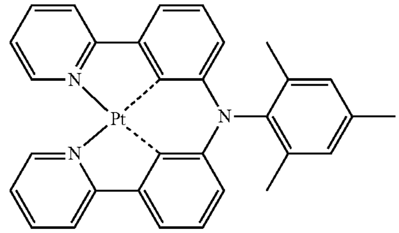
PD52
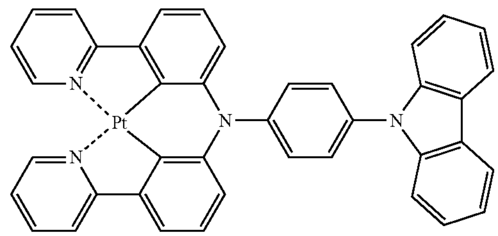
PD53
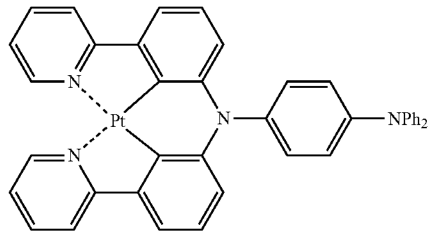
PD54
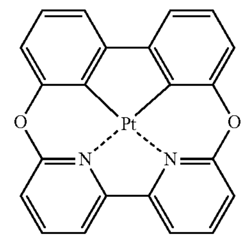
PD55
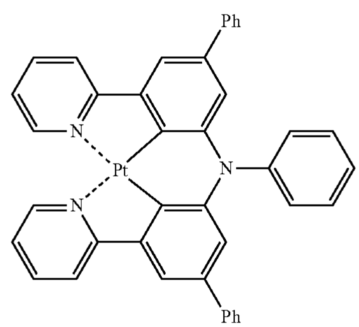
PD56
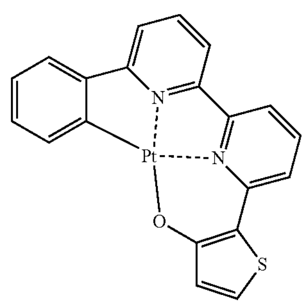

-continued
PD57
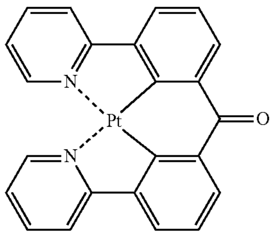
PD58
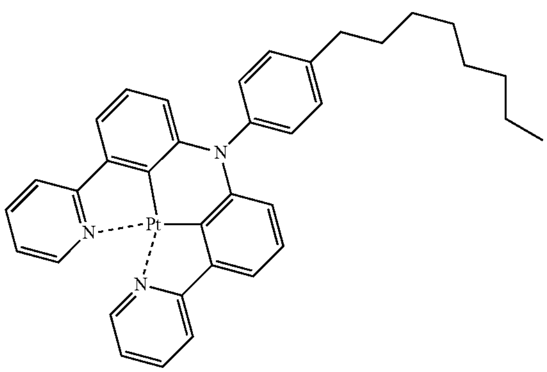
PD59
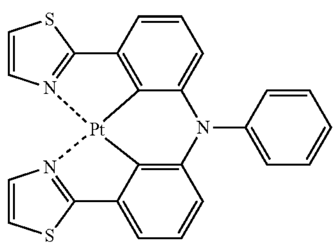
PD60
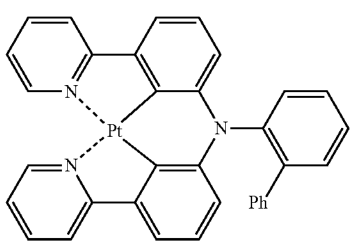
PD61
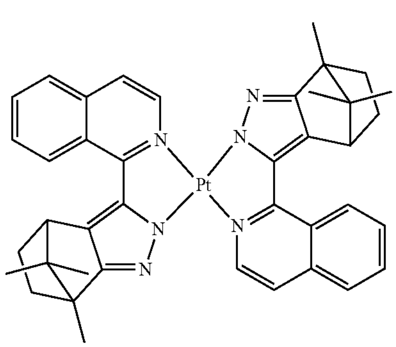
-continued
PD62
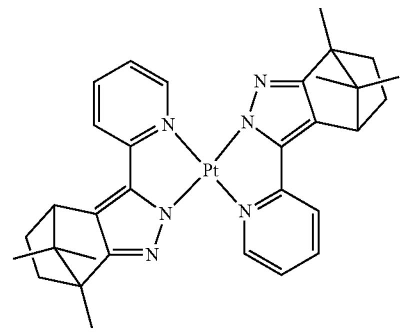
PD63
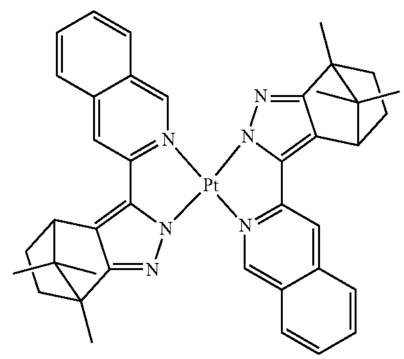
PD64
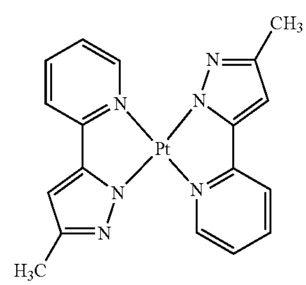
PD65
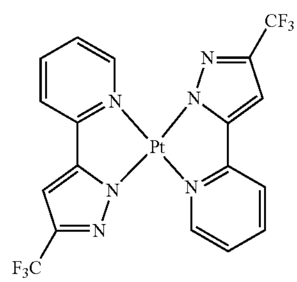
PD66
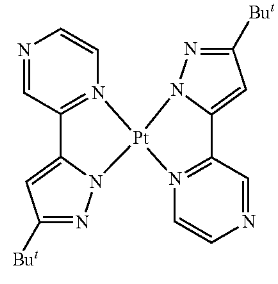

-continued
PD67
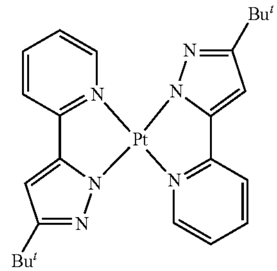
PD68
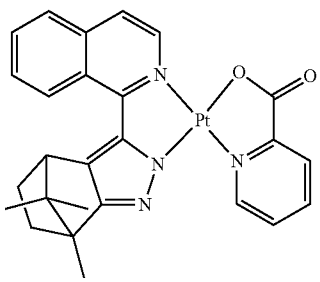
PD69
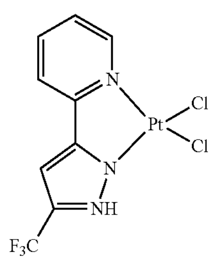
PD70
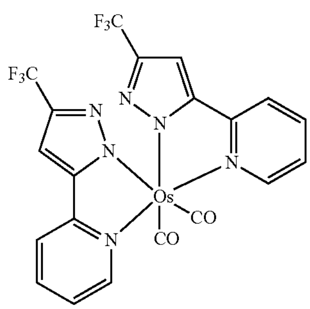
PD71
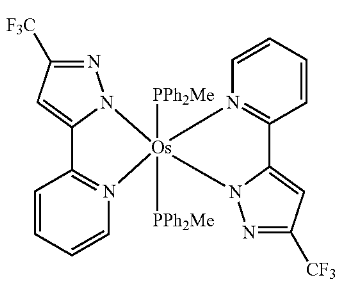
-continued
PD72
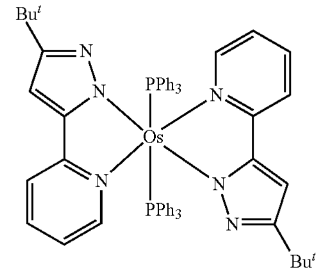
PD73
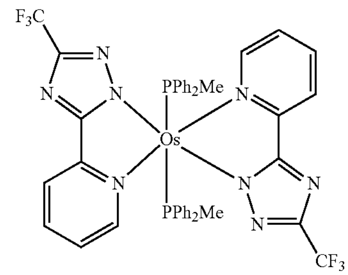
PD74
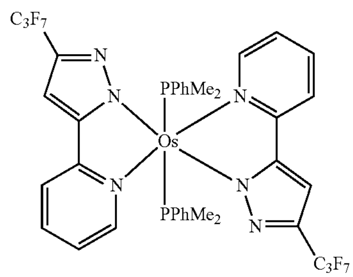
PD75
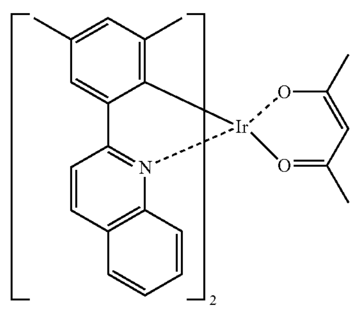
PD76
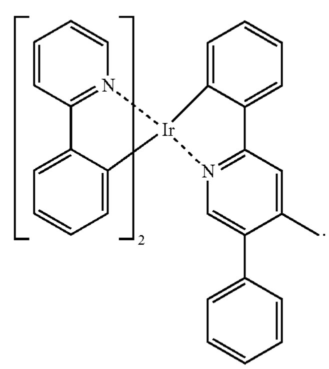
In one or more embodiments, the phosphorescent dopant may include PtOEP:

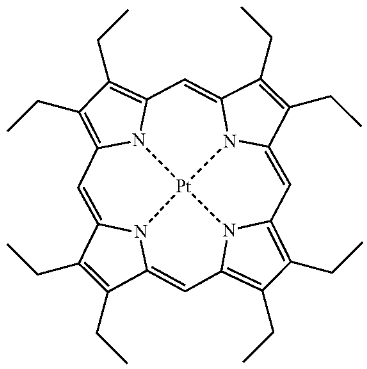

PtOEP .

In one or more embodiments, the fluorescent dopant may include a compound represented by Formula 501:

Formula 501

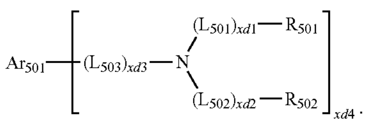

In Formula 501, $Ar_{501}$ may be selected from a naphthalene, a heptalene, a fluorenene, a spiro-fluorenene, a benzofluorenene, a dibenzofluorenene, a phenalene, a phenanthrene, an anthracene, a fluoranthene, a triphenylene, a pyrene, a chrysene, a naphthacene, a picene, a perylene, a pentaphene, an indenoanthracene; and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, naphthacene, a picene, a perylene, a pentaphene, and an indenoanthracene, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group and —Si($Q_{501}$)($Q_{502}$)($Q_{503}$) (wherein $Q_{501}$ to $Q_{503}$ may each be independently selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group), $L_{501}$ to $L_{503}$ may each be the same as described herein in connection with $L_{201}$;

$R_{501}$ and $R_{502}$ may each independently be selected from the group consisting of:

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, a triazinyl group, a dibenzofuranyl group, a dibenzothiophenyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group and a dibenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group and a dibenzothiophenyl group, xd1 to xd3 may each independently be selected from 0, 1, 2, and 3, and xd4 may be selected from 1, 2, 3 and 4.

The fluorescent dopant may include at least one selected from Compounds FD1 to FD8:

FD1

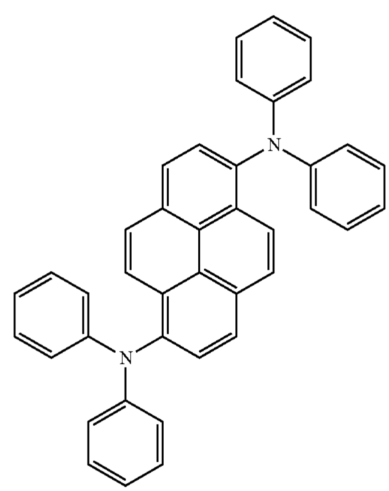

-continued
FD2
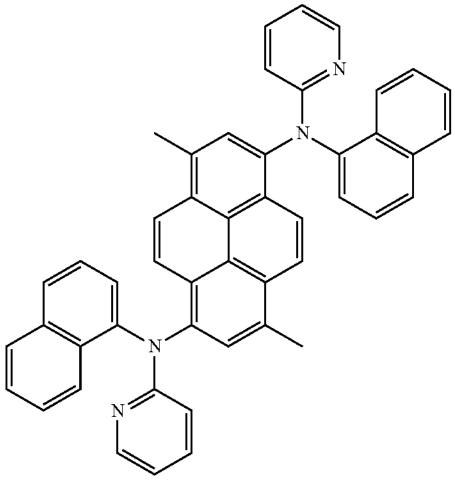
FD3
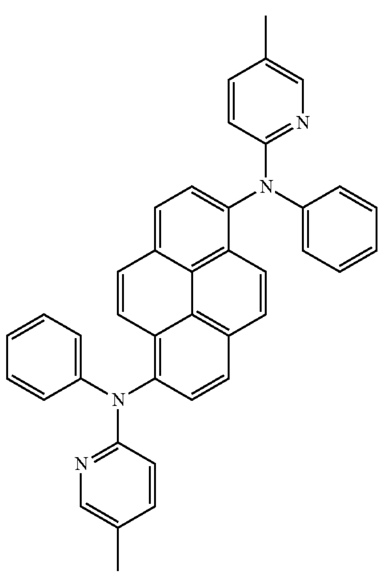
-continued
FD4
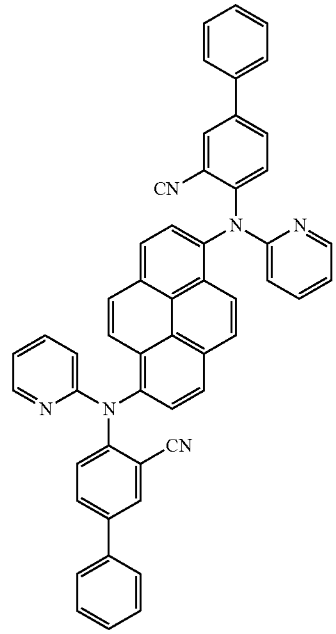
FD5
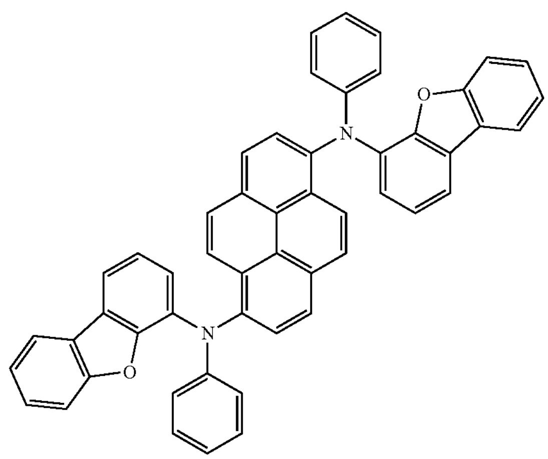
FD6
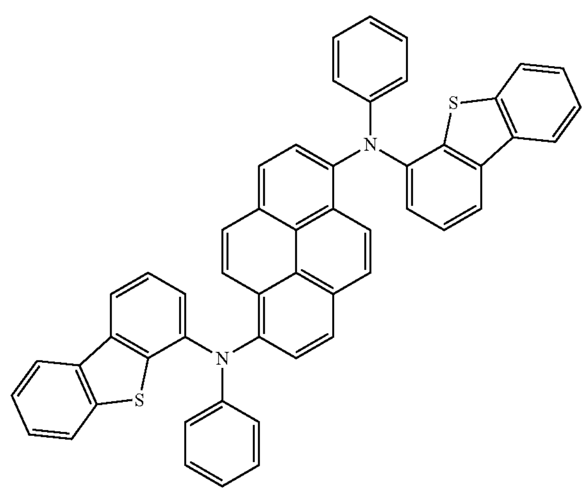

-continued

FD7

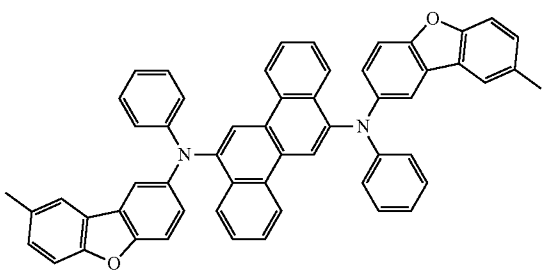

FD8

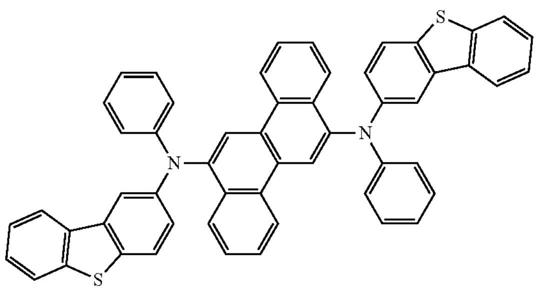

The amount of the dopant in the emission layer may be, in general, about 0.01 to about 15 parts by weight based on 100 parts by weight of the host, but embodiments of the present disclosure are not limited thereto.

The weight ratio of the first host to the second host, the weight ratio of the third host to the fourth host, and the weight ratio of the fifth host to the sixth host in the emission layer may each independently be 99:1 to 1:99, and in some embodiments, 80:20 to 20:80. In some embodiments, the weight ratio of the first host to the second host, the weight ratio of the third host to the fourth host, and the weight ratio of the fifth host to the sixth host in the emission layer may each independently be 50:50, but embodiments of these weight ratios are not limited thereto.

The thickness of the emission layer may be about 100 Å to about 1,000 Å, and in some embodiments, about 200 Å to about 600 Å. When the thickness of the emission layer is within these ranges, excellent light-emission characteristics may be obtained without a substantial increase in driving voltage.

An electron transport region may be on the emission layer.

The electron transport region may include at least one selected from a hole blocking layer, an electron transport layer (ETL), and an electron injection layer, but embodiments of the present disclosure are not limited thereto.

When the electron transport region includes a hole blocking layer, the hole blocking layer may be formed on the emission layer using one or more suitable methods selected from vacuum deposition, spin coating, casting, a Langmuir-Blodgett (LB) method, ink-jet printing, laser-printing, and/or laser-induced thermal imaging. When the hole blocking layer is formed by vacuum deposition and/or spin coating, the deposition and coating conditions used for the hole blocking layer may be similar to the deposition and coating conditions used for the hole injection layer.

The hole blocking layer may include, for example, at least one selected from BCP and Bphen, but embodiments of the present disclosure are not limited thereto.

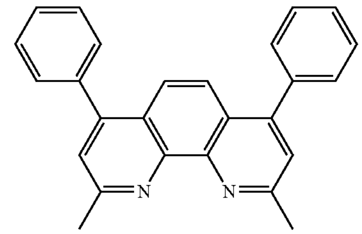

BCP

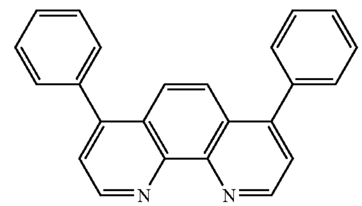

Bphen .

The thickness of the hole blocking layer may be about 20 Å to about 1,000 Å, and in some embodiments, about 30 Å to about 300 Å. When the thickness of the hole blocking layer is within these ranges, the hole blocking layer may have improved hole blocking ability without a substantial increase in driving voltage.

The electron transport region may include an electron transport layer. The electron transport layer may be formed on the emission layer or on the hole blocking layer using one or more suitable methods selected from vacuum deposition, spin coating, casting, a LB method, ink-jet printing, laser-printing, and laser-induced thermal imaging. When an electron transport layer is formed by vacuum deposition and/or spin coating, the deposition and coating conditions used for the electron transport layer may be similar to the deposition and coating conditions used for the hole injection layer.

The electron transport layer may further include at least one selected from BCP, Bphen, $Alq_3$, Balq, TAZ, and NTAZ:

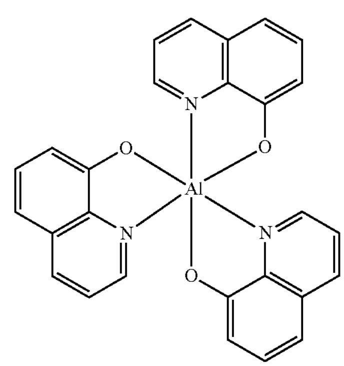

$Alq_3$

-continued

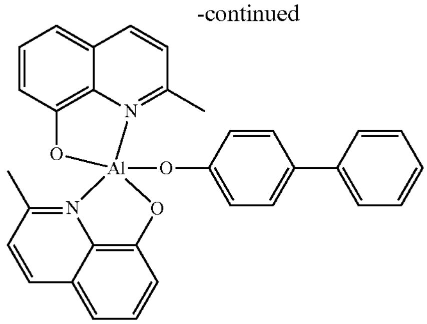

BAlq

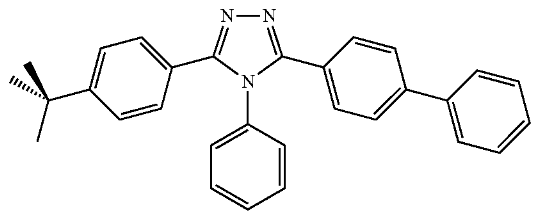

TAZ

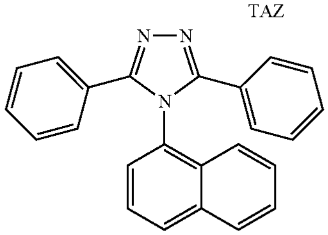

NTAZ

In one or more embodiments, the electron transport layer may further include at least one selected from compounds represented by Formula 601:

$Ar_{601}$-[$(L_{601})_{xe1}$-$E_{601}$]$_{xe2}$. Formula 601

In Formula 601, $Ar_{601}$ may be the same as described herein in connection with $Ar_{301}$;

$L_{601}$ may be the same as described herein in connection with $L_{201}$;

$E_{601}$ may be selected from the group consisting of:

a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group; and a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group;

xe1 may be selected from 0, 1, 2, and 3; and xe2 may be selected from 1, 2, 3, and 4.

In one or more embodiments, the electron transport layer may include at least one compound represented by Formula 602:

Formula 602

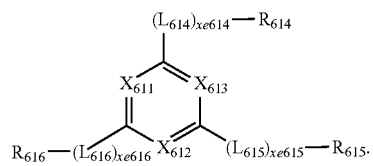

In Formula 602, $X_{611}$ may be selected from N and C-$(L_{611})_{xe611}$-$R_{611}$, $X_{612}$ may be selected from N and C-$(L_{612})_{xe612}$-$R_{612}$, $X_{613}$ may be selected from N and C-$(L_{613})_{xe613}$-$R_{613}$, and at least one selected from $X_{611}$ to $X_{613}$ may be N;

$L_{611}$ to $L_{616}$ may each be the same as described herein in connection with $L_{201}$;

$R_{611}$ to $R_{616}$ may each independently be selected from the group consisting of:

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group and a triazinyl group; and xe611 to xe616 may each independently be selected from 0, 1, 2, and 3.

The compound represented by Formula 601 and the compound represented by Formula 602 may each include at least one selected from Compounds ET1 to ET15:

ET1

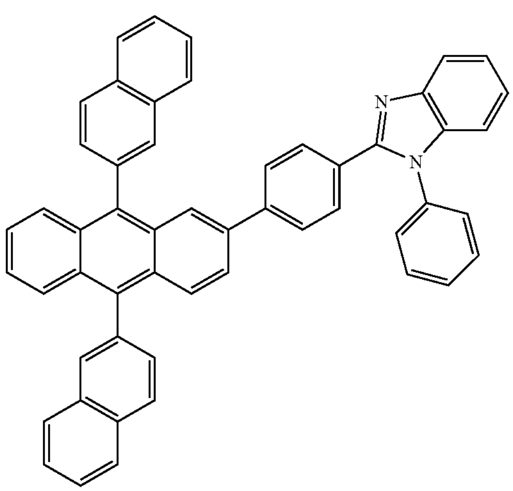

-continued

ET2

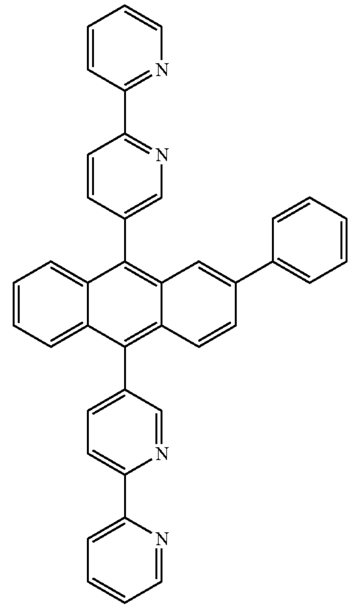

ET3

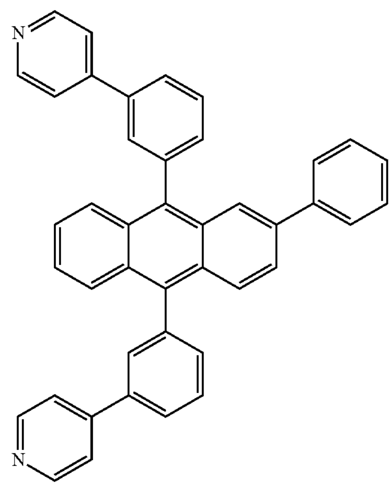

ET4

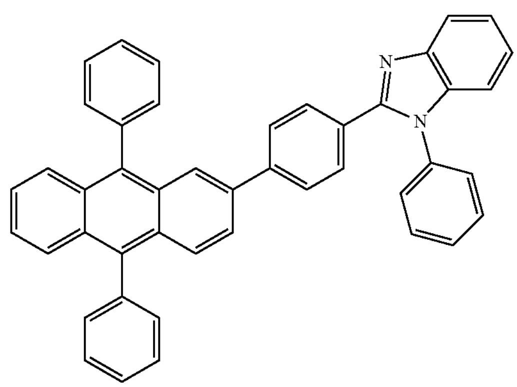

-continued
ET5
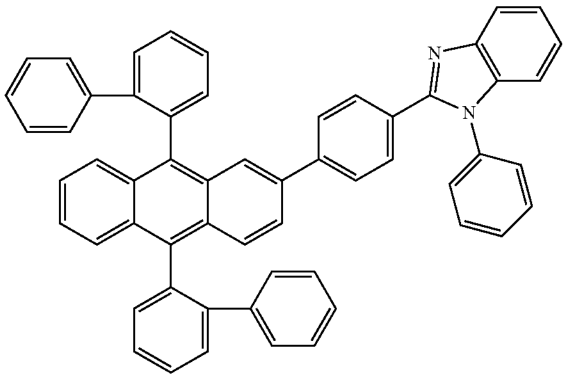
ET6
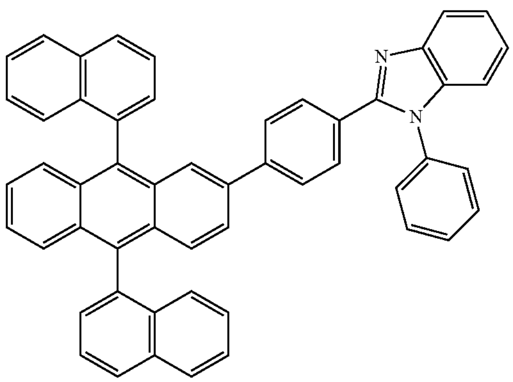
ET7
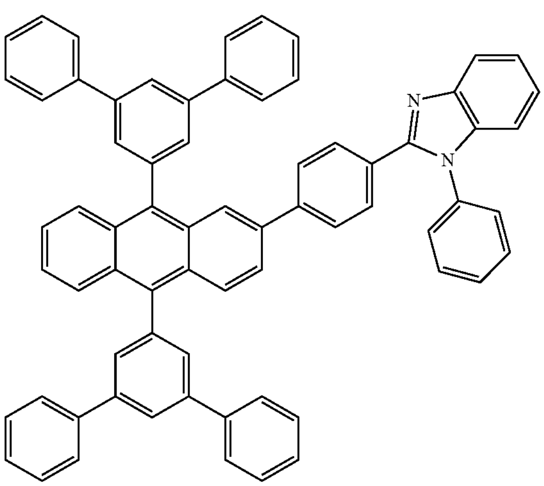
-continued
ET8
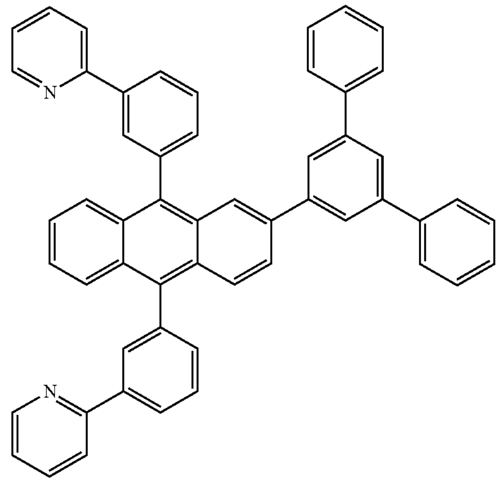
ET9
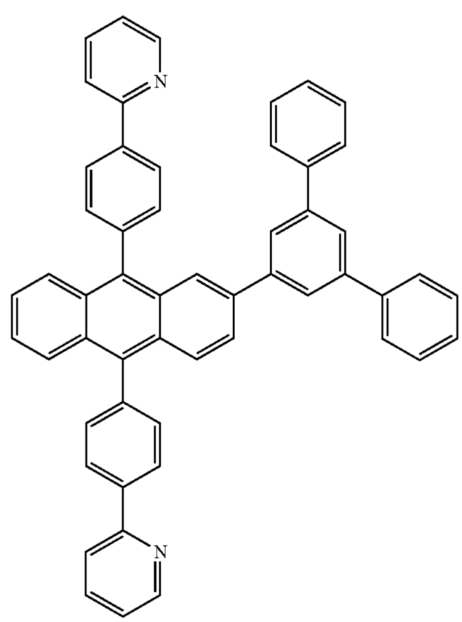

ET10

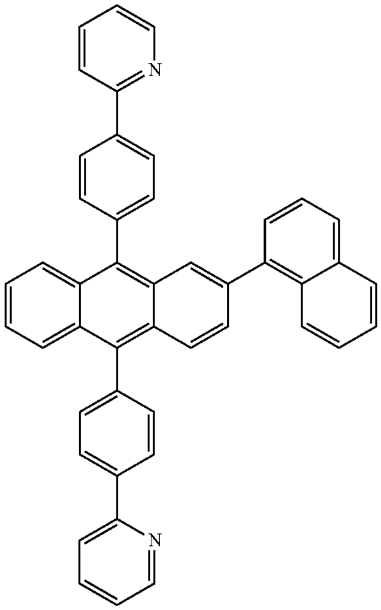

ET11

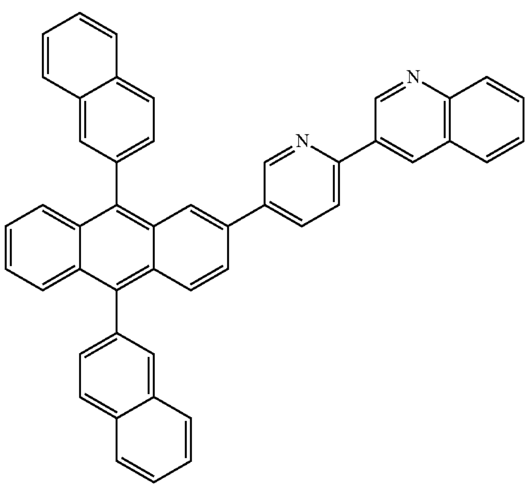

ET12

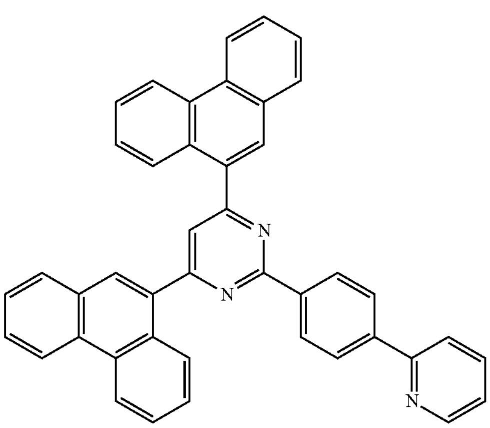

ET13

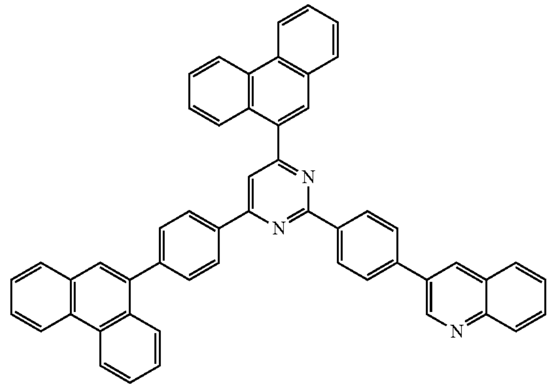

ET14

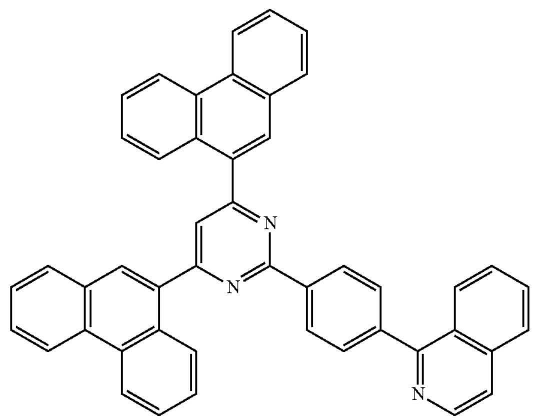

ET15

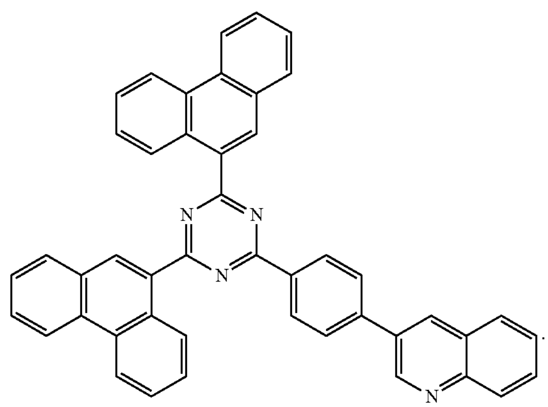

The thickness of the electron transport layer may be about 100 Å to about 1,000 Å, and in some embodiments, about 150 Å to about 500 Å. When the thickness of the electron transport layer is within these ranges described above, the electron transport layer may have satisfactory electron transport characteristics without a substantial increase in driving voltage.

Also, the electron transport layer may further include, in addition to the materials described above, a metal-containing material.

The Li complex may include, for example, Compound ET-D1 (lithium quinolate, LiQ) and/or ET-D2:

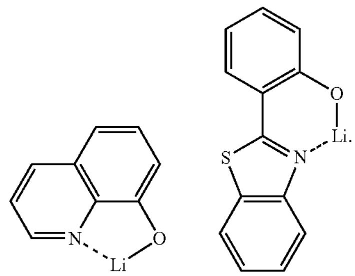

ET-D1 ET-D2

The electron transport region may include an electron injection layer that facilitates injection of electrons from the second electrode 190.

The electron injection layer may be formed on the electron transport layer using one or more suitable methods selected from vacuum deposition, spin coating, casting, a LB method, ink-jet printing, laser-printing, and laser-induced thermal imaging. When an electron injection layer is formed by vacuum deposition and/or spin coating, the deposition and coating conditions used for the electron injection layer may be similar to the deposition and coating conditions used for the hole injection layer.

The electron injection layer may include at least one selected from LiF, NaCl, CsF, $Li_2O$, BaO, and LiQ.

The thickness of the electron injection layer may be about 1 Å to about 100 Å, and in some embodiments, about 3 Å to about 90 Å. When the thickness of the electron injection layer is within these ranges, the electron injection layer may have satisfactory electron injection characteristics without a substantial increase in driving voltage.

The second electrode 190 may be on the organic layer 150. The second electrode 190 may be a cathode that is an electron injection electrode, and in this regard, the material for forming the second electrode 190 may be a material having a low work function. Non-limiting examples of such material may include a metal, an alloy, an electrically conductive compound, and a mixture thereof. Non-limiting examples of the second electrode 190 may include lithium (Li), magnesium (Mg), aluminum (Al), aluminum-lithium (Al—Li), calcium (Ca), magnesium-indium (Mg—In), and magnesium-silver (Mg—Ag). In some embodiments, the material for forming the second electrode 190 may be ITO and/or IZO. The second electrode 190 may be a reflective electrode, a semi-transmissive electrode, or a transmissive electrode.

Hereinbefore, the organic light-emitting device has been described with reference to the drawing, but embodiments of the present disclosure are not limited thereto.

The term "$C_1$-$C_{60}$ alkyl group" as used herein refers to a linear or branched aliphatic hydrocarbon monovalent group having 1 to 60 carbon atoms, and non-limiting examples thereof may include a methyl group, an ethyl group, a propyl group, an isobutyl group, a sec-butyl group, a tert-butyl group, a pentyl group, an iso-amyl group, and a hexyl group. The term "$C_1$-$C_{60}$ alkylene group" as used herein refers to a divalent group having substantially the same structure as the $C_1$-$C_{60}$ alkyl group.

The term "$C_1$-$C_{60}$ alkoxy group" as used herein refers to a monovalent group represented by —O-$A_{101}$ (wherein $A_{101}$ is the $C_1$-$C_{60}$ alkyl group), and non-limiting examples thereof may include a methoxy group, an ethoxy group, and an isopropyloxy group.

The term "$C_2$-$C_{60}$ alkenyl group" as used herein refers to a hydrocarbon group having at least one carbon-carbon double bond in the body (e.g., middle) or at the terminus of the $C_2$-$C_{60}$ alkyl group, and non-limiting examples thereof may include an ethenyl group, a propenyl group, and a butenyl group. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a hydrocarbon group having at least one carbon-carbon triple bond in the body (e.g., middle) or at the terminus of the $C_2$-$C_{60}$ alkyl group, and non-limiting examples thereof may include an ethynyl group and a propynyl group. The term "$C_2$-$C_{60}$ alkynylene group" as used herein refers to a divalent group having substantially the same structure as the $C_2$-$C_{60}$ alkynyl group.

The term "$C_3$-$C_{10}$ cycloalkyl group" as used herein refers to a monovalent hydrocarbon monocyclic group having 3 to 10 carbon atoms, and non-limiting examples thereof may include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a monovalent monocyclic group having at least one heteroatom selected from N, O, Si, P, and S as a ring-forming atom in addition to 1 to 10 carbon atoms, and non-limiting examples thereof may include a tetrahydrofuranyl group and a tetrahydrothiophenyl group. The term "$C_1$-$C_{10}$ heterocycloalkylene group" as used herein refers to a divalent group having substantially the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one double bond in the ring thereof, and does not have aromaticity. Non-limiting examples thereof may include a cyclopentenyl group, a cyclohexenyl group, and a cycloheptenyl group. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, silicon (Si), phosphorus (P), and S as a ring-forming atom, 1 to 10 carbon atoms, and at least one double bond in its ring. Non-limiting examples of the $C_1$-$C_{10}$ heterocycloalkenyl group may include a 2,3-hydrofuranyl group and a 2,3-hydrothiophenyl group. The term "$C_1$-$C_{10}$ heterocycloalkenylene group" as used herein refers to a divalent group having substantially the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ group" as used herein refers to a divalent group having a carbocyclic aromatic system having 6 to 60 carbon atoms. Non-limiting examples of the $C_6$-$C_{60}$ aryl group may include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused (e.g., coupled) to each other.

The term "$C_1$-$C_{60}$ heteroaryl group" as used herein refers to a monovalent group having a carbocyclic aromatic system that has at least one heteroatom selected from N, O, Si, P, and S as a ring-forming atom in addition to 1 to 60 carbon atoms. The term "$C_1$-$C_{60}$ heteroarylene group" as used herein refers to a divalent group having a carbocyclic aromatic system that has at least one heteroatom selected from N, O, Si, P, and S as a ring-forming atom, in addition to 1 to 60 carbon atoms. Non-limiting examples of the $C_1$-$C_{60}$ heteroaryl group may include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused (e.g., coupled) to each other.

The term "$C_6$-$C_{60}$ aryloxy group" as used herein indicates —O-$A_{102}$ (wherein $A_{102}$ is the $C_6$-$C_{60}$ aryl group), and the term "$C_6$-$C_{60}$ arylthio group" as used herein indicates —S-$A_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) that has two or more rings condensed (e.g., coupled) to each other, only carbon atoms as ring forming atoms, and non-aromaticity in the entire molecular structure. A non-limiting example of the monovalent non-aromatic condensed polycyclic group may be a fluorenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group (that has two or more rings condensed (e.g., coupled) to each other, has a heteroatom selected from N, O, Si, P, and S in addition to carbon atoms for example, 1 to 60 carbon atoms) as ring forming atoms, and has non-aromaticity in the entire molecular structure. A non-limiting example of the monovalent non-aromatic condensed heteropolycyclic group may be a carbazolyl group. The term "divalent non-aromatic condensed heteropolycyclic group" as used herein refers to a divalent group having substantially the same structure as the monovalent non-aromatic condensed heteropolycyclic group.

As used herein, at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from the group consisting of:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{21}$)($Q_{22}$)($Q_{23}$), —N($Q_{24}$)($Q_{25}$), and —B($Q_{26}$)($Q_{27}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{31}$)($Q_{32}$)($Q_{33}$), —N($Q_{34}$)($Q_{35}$), and —B($Q_{36}$)($Q_{37}$), —Si($Q_{41}$)($Q_{42}$)($Q_{43}$), —N($Q_{44}$)($Q_{45}$), and —B($Q_{46}$)($Q_{47}$), wherein $Q_1$ to $Q_7$, $Q_{11}$ to $Q_{17}$, $Q_{21}$ to $Q_{27}$, $Q_{31}$ to $Q_{37}$, and $Q_{41}$ to $Q_{47}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group; and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkoxy group, a phenyl group, a biphenyl group, a terphenyl group, and a naphthyl group.

The term "Ph" as used herein represents a phenyl group, the term "Me" as used herein represents a methyl group, the term "Et" as used herein represents an ethyl group, and the term "ter-Bu" or "But" as used herein represents a tert-butyl group.

The term "biphenyl group" as used herein may refer to a monovalent group including two benzenes linked to each other via a single bond, and the term "terphenyl group" as used herein may refer to a monovalent group including three benzenes linked to one another via two single bonds.

Hereinafter, an organic light-emitting device according to an embodiment of the present disclosure will be described in more detail with reference to Synthesis Examples and Examples.

EXAMPLE

Example 1-1

An anode having a structure of ITO/Ag/ITO (70 Å/1000 Å/70 Å) deposited on a glass substrate was cut to a size of 50 millimeters (mm)×50 mm×0.4 mm, sonicated in isopropyl alcohol and water for 10 minutes each, cleaned by exposure to ultraviolet rays for 10 minutes, and then exposed to ozone. The glass substrate was mounted on a vacuum-deposition device.

HT13 was deposited on the anode to form a hole injection layer having a thickness of about 700 Å. Compound HT3 was deposited on the hole injection layer to form a hole transport layer having a thickness of about 800 Å. Compound F1 was deposited on the hole transport layer to form an emission auxiliary layer having a thickness of about 750 Å. Compound 235 (as a host) and Compound PD75 (as a dopant) were then co-deposited on the emission auxiliary layer at a weight ratio of about 100:3 to form an emission layer having a thickness of about 400 Å.

Compound ET1 and ET-D1 were co-deposited on the emission layer at a weight ratio of about 100:100 (e.g., 1:1) to form an electron transport layer having a thickness of 360 Å. LiQ was then deposited on the electron transport layer to form an electron injection layer having a thickness of 10 Å. Next, Mg and Ag were co-deposited on the electron injection layer to form a cathode having a thickness of 1,200 Å, thereby completing the manufacture of an organic light-emitting device.

Examples 1-2 to 1-20 and Comparative Examples 1-1 to 1-6

Additional organic light-emitting devices were manufactured in the same manner as in Example 1-1, except that the compounds shown in Table 1 were used to form each emission layer and emission auxiliary layer.

TABLE 1

| | Host | Emission auxiliary layer material | Emission auxiliary layer Thickness | Dopant | Weight ratio (host:dopant) |
|---|---|---|---|---|---|
| Example 1-1 | 235 | F1 | 750 Å | PD75 | 100:3 |
| Example 1-2 | 241 | F1 | 750 Å | PD75 | 100:3 |
| Example 1-3 | 235 | C7 | 750 Å | PD75 | 100:3 |
| Example 1-4 | 223 | C7 | 750 Å | PD75 | 100:3 |
| Example 1-5 | 226 | A6 | 350 Å | PD76 | 100:10 |
| Example 1-6 | 101 | A6 | 350 Å | PD76 | 100:10 |
| Example 1-7 | 259 | A6 | 350 Å | PD76 | 100:10 |
| Example 1-8 | 237 | A6 | 350 Å | PD76 | 100:10 |
| Example 1-9 | 226 | B1 | 350 Å | PD76 | 100:10 |
| Example 1-10 | 101 | B1 | 350 Å | PD76 | 100:10 |
| Example 1-11 | 259 | B1 | 350 Å | PD76 | 100:10 |
| Example 1-12 | 237 | B1 | 350 Å | PD76 | 100:10 |
| Example 1-13 | 226 | A2 | 350 Å | PD76 | 100:10 |
| Example 1-14 | 101 | A2 | 350 Å | PD76 | 100:10 |
| Example 1-15 | 259 | A2 | 350 Å | PD76 | 100:10 |
| Example 1-16 | 237 | A2 | 350 Å | PD76 | 100:10 |
| Example 1-17 | 226 | C11 | 350 Å | PD76 | 100:10 |
| Example 1-18 | 101 | C11 | 350 Å | PD76 | 100:10 |
| Example 1-19 | 259 | C11 | 350 Å | PD76 | 100:10 |
| Example 1-20 | 237 | C11 | 350 Å | PD76 | 100:10 |
| Comparative Example 1-1 | 235 | NPB | 750 Å | PD75 | 100:3 |
| Comparative Example 1-2 | 241 | NPB | 750 Å | PD75 | 100:3 |
| Comparative Example 1-3 | 226 | NPB | 350 Å | PD76 | 100:10 |
| Comparative Example 1-4 | 101 | NPB | 350 Å | PD76 | 100:10 |
| Comparative Example 1-5 | 259 | NPB | 350 Å | PD76 | 100:10 |
| Comparative Example 1-6 | 237 | NPB | 350 Å | PD76 | 100:10 |

Example 2-1

An anode having a structure of ITO/Ag/ITO (70 Å/1000 Å/70 Å) deposited on a glass substrate was cut to a size of 50 mm×50 mm×0.4 mm, sonicated in isopropyl alcohol and water for 10 minutes each, cleaned by exposure to ultraviolet rays for 10 minutes, and then exposed to ozone. The glass substrate was mounted on a vacuum-deposition device.

HT13 was deposited on the anode to form a hole injection layer having a thickness of about 700 Å. Compound HT3 was deposited on the hole injection layer to form a hole transport layer having a thickness of about 800 Å. Compound F1 was deposited on the hole transport layer to form an emission auxiliary layer having a thickness of about 750 Å. Compound 191A (as a host) and Compound PD75 (as a dopant) were then co-deposited on the emission auxiliary layer at a weight ratio of about 100:3 to form an emission layer having a thickness of about 400 Å.

Thereafter, Compound ET1 and ET-D1 were co-deposited on the emission layer at a weight ratio of about 100:100 (e.g., 1:1) to form an electron transport layer having a thickness of 360 Å. LiQ was then deposited on the electron transport layer to form an electron injection layer having a thickness of 10 Å. Mg and Ag were next co-deposited on the electron injection layer to form a cathode having a thickness of 1200 Å, thereby completing the manufacture of an organic light-emitting device.

Examples 2-2 to 2-20 and Comparative Examples 2-1 to 2-6

Organic light-emitting devices were manufactured in the same manner as in Example 2-1, except that the compounds shown in Table 2 were used to form each emission layer and emission auxiliary layer.

TABLE 2

| | Host | Emission auxiliary layer material | Emission auxiliary layer Thickness | Dopant | Weight ratio (host:dopant) |
|---|---|---|---|---|---|
| Example 2-1 | 191A | F1 | 750 Å | PD75 | 100:3 |
| Example 2-2 | 202A | F1 | 750 Å | PD75 | 100:3 |
| Example 2-3 | 191A | C7 | 750 Å | PD75 | 100:3 |
| Example 2-4 | 202A | C7 | 750 Å | PD75 | 100:3 |
| Example 2-5 | 154A | A6 | 350 Å | PD76 | 100:10 |
| Example 2-6 | 121A | A6 | 350 Å | PD76 | 100:10 |
| Example 2-7 | 210A | A6 | 350 Å | PD76 | 100:10 |
| Example 2-8 | 156A | A6 | 350 Å | PD76 | 100:10 |
| Example 2-9 | 154A | B1 | 350 Å | PD76 | 100:10 |
| Example 2-10 | 121A | B1 | 350 Å | PD76 | 100:10 |
| Example 2-11 | 210A | B1 | 350 Å | PD76 | 100:10 |
| Example 2-12 | 156A | B1 | 350 Å | PD76 | 100:10 |
| Example 2-13 | 154A | A2 | 350 Å | PD76 | 100:10 |
| Example 2-14 | 121A | A2 | 350 Å | PD76 | 100:10 |
| Example 2-15 | 210A | A2 | 350 Å | PD76 | 100:10 |
| Example 2-16 | 156A | A2 | 350 Å | PD76 | 100:10 |
| Example 2-17 | 154A | C11 | 350 Å | PD76 | 100:10 |
| Example 2-18 | 121A | C11 | 350 Å | PD76 | 100:10 |
| Example 2-19 | 210A | C11 | 350 Å | PD76 | 100:10 |
| Example 2-20 | 156A | C11 | 350 Å | PD76 | 100:10 |
| Comparative Example 2-1 | 191A | NPB | 750 Å | PD75 | 100:3 |
| Comparative Example 2-2 | 202A | NPB | 750 Å | PD75 | 100:3 |
| Comparative Example 2-3 | 154A | NPB | 350 Å | PD76 | 100:10 |
| Comparative Example 2-4 | 121A | NPB | 350 Å | PD76 | 100:10 |
| Comparative Example 2-5 | 212A | NPB | 350 Å | PD76 | 100:10 |
| Comparative Example 2-6 | 156A | NPB | 350 Å | PD76 | 100:10 |

Example 3-1

An anode having a structure of ITO/Ag/ITO (70 Å/1000 Å/70 Å) deposited on a glass substrate was cut to a size of 50 mm×50 mm×0.4 mm, sonicated in isopropyl alcohol and water for 10 minutes each, cleaned by exposure to ultraviolet rays for 10 minutes, and then exposed to ozone. The glass substrate was mounted on a vacuum-deposition device.

HT13 was deposited on the anode to form a hole injection layer having a thickness of about 700 Å. Compound HT3 was deposited on the hole injection layer to form a hole transport layer having a thickness of about 800 Å. Compound A6 was deposited on the hole transport layer to form an emission auxiliary layer having a thickness of about 350 Å. Compound 226 (as a first host), Compound 172B (as a second host), and Compound PD76 (as a dopant) were then co-deposited on the emission auxiliary layer at a weight ratio of about 50:50:10 to form an emission layer having a thickness of about 400 Å.

Thereafter, Compound ET1 and ET-D1 were co-deposited on the emission layer at a weight ratio of about 100:100 to form an electron transport layer having a thickness of 360 Å. LiQ was then deposited on the electron transport layer to form an electron injection layer having a thickness of 10 Å. Mg and Ag were next co-deposited on the electron injection layer to form a cathode having a thickness of 1200 Å, thereby completing the manufacture of an organic light-emitting device.

Examples 3-2 to 3-24 and Comparative Examples 3-1 to 3-6

Additional organic light-emitting devices were manufactured in the same manner as in Example 3-1, except that the compounds shown in Table 3 were used to form each emission layer and emission auxiliary layer.

TABLE 3

| | First host | Second host | Emission auxiliary layer material | Dopant | Weight ratio (First host:Second host:Dopant) |
|---|---|---|---|---|---|
| Example 3-1 | 226 | 172B | A6 | PD76 | 50:50:10 |
| Example 3-2 | 119 | 125B | A6 | PD76 | 50:50:10 |
| Example 3-3 | 237 | 226B | A6 | PD76 | 50:50:10 |
| Example 3-4 | 371 | 190A | A6 | PD76 | 50:50:10 |
| Example 3-5 | 306 | 155A | A6 | PD76 | 50:50:10 |
| Example 3-6 | 338 | 151A | A6 | PD76 | 50:50:10 |
| Example 3-7 | 226 | 172B | B1 | PD76 | 50:50:10 |
| Example 3-8 | 119 | 125B | B1 | PD76 | 50:50:10 |
| Example 3-9 | 237 | 226B | B1 | PD76 | 50:50:10 |
| Example 3-10 | 374 | 121A | B1 | PD76 | 50:50:10 |
| Example 3-11 | 306 | 190A | B1 | PD76 | 50:50:10 |
| Example 3-12 | 338 | 151A | B1 | PD76 | 50:50:10 |
| Example 3-13 | 226 | 172B | A2 | PD76 | 50:50:10 |
| Example 3-14 | 119 | 125B | A2 | PD76 | 50:50:10 |
| Example 3-15 | 237 | 226B | A2 | PD76 | 50:50:10 |
| Example 3-16 | 374 | 121A | A2 | PD76 | 50:50:10 |
| Example 3-17 | 306 | 190A | A2 | PD76 | 50:50:10 |
| Example 3-18 | 338 | 151A | A2 | PD76 | 50:50:10 |
| Example 3-19 | 226 | 172B | C11 | PD76 | 50:50:10 |
| Example 3-20 | 119 | 125B | C11 | PD76 | 50:50:10 |
| Example 3-21 | 237 | 226B | C11 | PD76 | 50:50:10 |
| Example 3-22 | 237 | 121A | C11 | PD76 | 50:50:10 |
| Example 3-23 | 374 | 190A | C11 | PD76 | 50:50:10 |
| Example 3-24 | 338 | 151A | C11 | PD76 | 50:50:10 |
| Comparative Example 3-1 | 226 | 172B | NPB | PD76 | 50:50:10 |
| Comparative Example 3-2 | 119 | 125B | NPB | PD76 | 50:50:10 |
| Comparative Example 3-3 | 237 | 226B | NPB | PD76 | 50:50:10 |
| Comparative Example 3-4 | 374 | 121A | NPB | PD76 | 50:50:10 |
| Comparative Example 3-5 | 306 | 190A | NPB | PD76 | 50:50:10 |
| Comparative Example 3-6 | 338 | 151A | NPB | PD76 | 50:50:10 |

Evaluation Example 1

The driving voltage, current density, efficiency, and lifespan of each organic light-emitting device manufactured in Examples 1-1 to 1-20, 2-1 to 2-20, and 3-1 to 3-24 and Comparative Example 1-1 to 1-6, 2-1 to 2-6, and 3-1 to 3-6 were evaluated using a Keithley 2400 SMU, a Minolta CS-1000A luminance meter, and a PR650 (Spectroscan) Source Measurement Unit (available from PhotoResearch). The T97 lifespan value indicates the time elapsed for the initial luminance (about 9000 cd/$m^2$) to reduce by 97%. The evaluation results are shown in Tables 4 to 6.

TABLE 4

| | First compound | Second compound | Third compound | Driving voltage (V) | Current density (mA/$cm^2$) | Efficiency (cd/A) | $T_{97}$ (hr) |
|---|---|---|---|---|---|---|---|
| Example 1-1 | 235 | — | F1 | 4.1 | 10 | 38.5 | 489 |
| Example 1-2 | 241 | — | F1 | 4.3 | 10 | 38.1 | 512 |

TABLE 4-continued

| | First compound | Second compound | Third compound | Driving voltage (V) | Current density ($mA/cm^2$) | Efficiency (cd/A) | $T_{97}$ (hr) |
|---|---|---|---|---|---|---|---|
| Example 1-3 | 235 | — | C7 | 4.2 | 10 | 38.8 | 492 |
| Example 1-4 | 223 | — | C7 | 4.4 | 10 | 38.2 | 531 |
| Example 1-5 | 226 | — | A6 | 4.2 | 10 | 95.7 | 143 |
| Example 1-6 | 101 | — | A6 | 4.2 | 10 | 96.5 | 138 |
| Example 1-7 | 259 | — | A6 | 4.3 | 10 | 97.2 | 135 |
| Example 1-8 | 237 | — | A6 | 4.4 | 10 | 95.9 | 142 |
| Example 1-9 | 226 | — | B1 | 4.1 | 10 | 96.7 | 127 |
| Example 1-10 | 101 | — | B1 | 4.1 | 10 | 96.1 | 122 |
| Example 1-11 | 259 | — | B1 | 4.3 | 10 | 95.3 | 135 |
| Example 1-12 | 237 | — | B1 | 4.3 | 10 | 97.2 | 140 |
| Example 1-13 | 226 | — | A2 | 4.2 | 10 | 94.9 | 122 |
| Example 1-14 | 101 | — | A2 | 4.1 | 10 | 95.2 | 124 |
| Example 1-15 | 259 | — | A2 | 4.4 | 10 | 96.3 | 126 |
| Example 1-16 | 237 | — | A2 | 4.4 | 10 | 95.0 | 135 |
| Example 1-17 | 226 | — | C11 | 4.2 | 10 | 96.2 | 124 |
| Example 1-18 | 101 | — | C11 | 4.2 | 10 | 96.6 | 137 |
| Example 1-19 | 259 | — | C11 | 4.4 | 10 | 95.4 | 120 |
| Example 1-20 | 237 | — | C11 | 4.3 | 10 | 97.1 | 134 |
| Comparative Example 1-1 | 235 | — | NPB | 4.2 | 10 | 28.6 | 376 |
| Comparative Example 1-2 | 241 | — | NPB | 4.4 | 10 | 29.1 | 381 |
| Comparative Example 1-3 | 226 | — | NPB | 4.1 | 10 | 75.2 | 51 |
| Comparative Example 1-4 | 101 | — | NPB | 4.1 | 10 | 74.3 | 62 |
| Comparative Example 1-5 | 259 | — | NPB | 4.2 | 10 | 72.1 | 47 |
| Comparative Example 1-6 | 237 | — | NPB | 4.3 | 10 | 74.9 | 64 |

TABLE 5

| | First compound | Second compound | Third compound | Driving voltage (V) | Current density ($mA/cm^2$) | Efficiency (cd/A) | $T_{97}$ (hr) |
|---|---|---|---|---|---|---|---|
| Example 2-1 | — | 191A | F1 | 4.4 | 10 | 40.1 | 520 |
| Example 2-2 | — | 202A | F1 | 4.3 | 10 | 41.2 | 503 |
| Example 2-3 | — | 191A | C7 | 4.1 | 10 | 39.7 | 488 |
| Example 2-4 | — | 202A | C7 | 4.2 | 10 | 40.5 | 510 |
| Example 2-5 | — | 154A | A6 | 4.3 | 10 | 96.5 | 132 |
| Example 2-6 | — | 121A | A6 | 4.2 | 10 | 97.7 | 127 |
| Example 2-7 | — | 210A | A6 | 4.4 | 10 | 97.6 | 145 |
| Example 2-8 | — | 156A | A6 | 4.2 | 10 | 96.8 | 140 |
| Example 2-9 | — | 154A | B1 | 4.3 | 10 | 98.7 | 133 |
| Example 2-10 | — | 121A | B1 | 4.1 | 10 | 97.3 | 138 |
| Example 2-11 | — | 210A | B1 | 4.2 | 10 | 96.9 | 145 |
| Example 2-12 | — | 156A | B1 | 4.1 | 10 | 99.1 | 142 |
| Example 2-13 | — | 154A | A2 | 4.3 | 10 | 96.2 | 129 |
| Example 2-14 | — | 121A | A2 | 4.2 | 10 | 95.9 | 121 |
| Example 2-15 | — | 210A | A2 | 4.3 | 10 | 97.4 | 140 |
| Example 2-16 | — | 156A | A2 | 4.2 | 10 | 97.1 | 128 |
| Example 2-17 | — | 154A | C11 | 4.4 | 10 | 97.6 | 133 |

TABLE 5-continued

| | First compound | Second compound | Third compound | Driving voltage (V) | Current density ($mA/cm^2$) | Efficiency (cd/A) | $T_{97}$ (hr) |
|---|---|---|---|---|---|---|---|
| Example 2-18 | — | 121A | C11 | 4.2 | 10 | 96.8 | 136 |
| Example 2-19 | — | 210A | C11 | 4.3 | 10 | 98.4 | 141 |
| Example 2-20 | — | 156A | C11 | 4.1 | 10 | 97.7 | 144 |
| Comparative Example 2-1 | — | 191A | NPB | 4.4 | 10 | 28.8 | 362 |
| Comparative Example 2-2 | — | 202A | NPB | 4.3 | 10 | 29.4 | 349 |
| Comparative Example 2-3 | — | 154A | NPB | 4.4 | 10 | 78.2 | 65 |
| Comparative Example 2-4 | — | 121A | NPB | 4.2 | 10 | 76.4 | 71 |
| Comparative Example 2-5 | — | 212A | NPB | 4.3 | 10 | 77.1 | 61 |
| Comparative Example 2-6 | — | 156A | NPB | 4.2 | 10 | 75.8 | 54 |

TABLE 6

| | First compound | Second compound | Third compound | Driving voltage (V) | Current density ($mA/cm^2$) | Efficiency (cd/A) | $T_{97}$ (hr) |
|---|---|---|---|---|---|---|---|
| Example 3-1 | 226 | 172B | A6 | 4.2 | 10 | 93.1 | 172 |
| Example 3-2 | 119 | 125B | A6 | 4.4 | 10 | 94.2 | 175 |
| Example 3-3 | 237 | 226B | A6 | 4.4 | 10 | 94.7 | 182 |
| Example 3-4 | 371 | 190A | A6 | 4.3 | 10 | 95.3 | 167 |
| Example 3-5 | 306 | 155A | A6 | 4.3 | 10 | 93.8 | 164 |
| Example 3-6 | 338 | 151A | A6 | 4.3 | 10 | 93.5 | 181 |
| Example 3-7 | 226 | 172B | B1 | 4.3 | 10 | 94.5 | 179 |
| Example 3-8 | 119 | 125B | B1 | 4.5 | 10 | 96.4 | 175 |
| Example 3-9 | 237 | 226B | B1 | 4.4 | 10 | 94.7 | 168 |
| Example 3-10 | 374 | 121A | B1 | 4.2 | 10 | 95.9 | 175 |
| Example 3-11 | 306 | 190A | B1 | 4.3 | 10 | 94.6 | 183 |
| Example 3-12 | 338 | 151A | B1 | 4.2 | 10 | 93.5 | 170 |
| Example 3-13 | 226 | 172B | A2 | 4.1 | 10 | 95.1 | 182 |
| Example 3-14 | 119 | 125B | A2 | 4.3 | 10 | 94.5 | 189 |
| Example 3-15 | 237 | 226B | A2 | 4.4 | 10 | 93.8 | 191 |
| Example 3-16 | 374 | 121A | A2 | 4.3 | 10 | 94.2 | 185 |
| Example 3-17 | 306 | 190A | A2 | 4.2 | 10 | 96.1 | 171 |
| Example 3-18 | 338 | 151A | A2 | 4.1 | 10 | 94.7 | 185 |
| Example 3-19 | 226 | 172B | C11 | 4.1 | 10 | 94.6 | 177 |
| Example 3-20 | 119 | 125B | C11 | 4.4 | 10 | 95.1 | 169 |
| Example 3-21 | 237 | 226B | C11 | 4.3 | 10 | 95.4 | 188 |
| Example 3-22 | 237 | 121A | C11 | 4.3 | 10 | 95.8 | 176 |
| Example 3-23 | 374 | 190A | C11 | 4.2 | 10 | 94.2 | 184 |
| Example 3-24 | 338 | 151A | C11 | 4.2 | 10 | 93.9 | 180 |
| Comparative Example 3-1 | 226 | 172B | NPB | 4.3 | 10 | 70.6 | 102 |
| Comparative Example 3-2 | 119 | 125B | NPB | 4.5 | 10 | 72.5 | 115 |
| Comparative Example 3-3 | 237 | 226B | NPB | 4.5 | 10 | 71.6 | 121 |
| Comparative Example 3-4 | 374 | 121A | NPB | 4.4 | 10 | 74.7 | 104 |

TABLE 6-continued

| | First compound | Second compound | Third compound | Driving voltage (V) | Current density ($mA/cm^2$) | Efficiency (cd/A) | $T_{97}$ (hr) |
|---|---|---|---|---|---|---|---|
| Comparative Example 3-5 | 306 | 190A | NPB | 4.3 | 10 | 73.4 | 108 |
| Comparative Example 3-6 | 338 | 151A | NPB | 4.3 | 10 | 72.2 | 116 |

Referring to Tables 4 to 6, it was found that the organic light-emitting devices manufactured in Examples 1-1 to 1-20, 2-1 to 2-20, and 3-1 to 3-24 each exhibited high efficiency and long lifespan characteristics compared with the organic light-emitting devices manufactured in Comparative Examples 1-1 to 1-6, 2-1 to 2-6, and 3-1 to 3-6.

An organic light-emitting device according to embodiments of the present disclosure may have high efficiency and a long lifespan.

It should be understood that the example embodiments described herein should be considered in a descriptive sense only and not for purposes of limitation. Descriptions of features or aspects within each example embodiment should typically be considered as being available for other similar features or aspects in other example embodiments.

The use of "may" when describing embodiments of the present disclosure refers to "one or more embodiments of the present disclosure". In addition, as used herein, the terms "use", "using", and "used" may be considered synonymous with the terms "utilize", "utilizing", and "utilized", respectively.

As used herein, the terms "substantially", "about", and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While one or more example embodiments have been described with reference to the drawing, it will be understood by those of ordinary skill in the art that various changes in form and details may be made therein without departing from the spirit and scope as defined by the following claims and equivalents thereof.

What is claimed is:

1. An organic light-emitting device comprising:

a first electrode;

a second electrode; and an organic layer comprising an emission layer between the first electrode and the second electrode, and a hole transport region between the first electrode and the emission layer, the hole transport region comprising a hole injection layer, a hole transport layer, and an emission auxiliary layer, the organic layer comprising: a first compound and a second compound; in addition to a third compound, the emission layer comprises the first compound and the second compound, wherein the emission auxiliary layer comprises the third compound, wherein the hole transport layer comprises a compound different from the third compound, wherein the first compound is represented by one selected from Formulae 1-12, 1-13, 1-15, and 1-22, the second compound is represented by Formula 2, and the third compound is selected from Compounds A1, A4 to A27, B1 to B6, B8, B9, B11 to B25, C1, C2, C4, C5, C7 to C16, D1, D2, D4 to D9, E1 to E6, E8, E9, E10, and F2 to F7, F9, F10, F12 to F30, and F32:

1-12

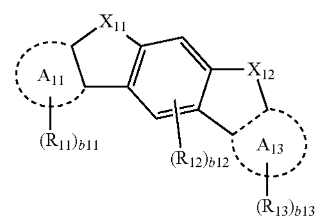

1-13

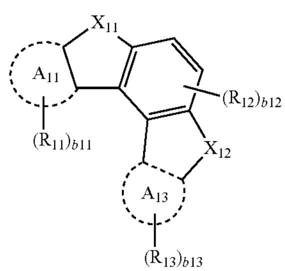

1-15

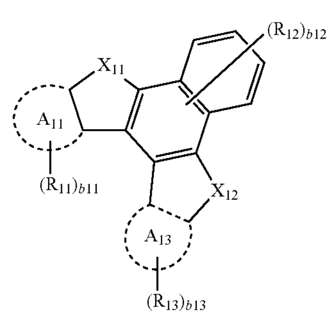

1-22
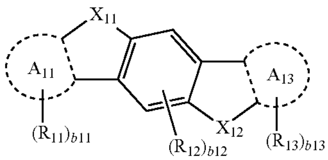
Formula 2
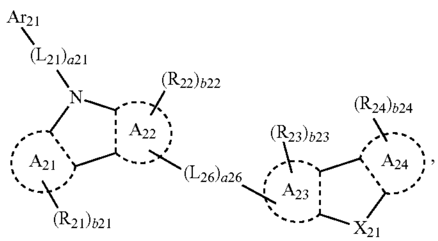
(A1)
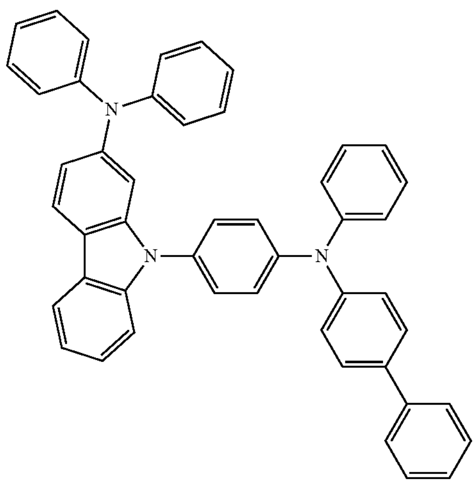
(A4)
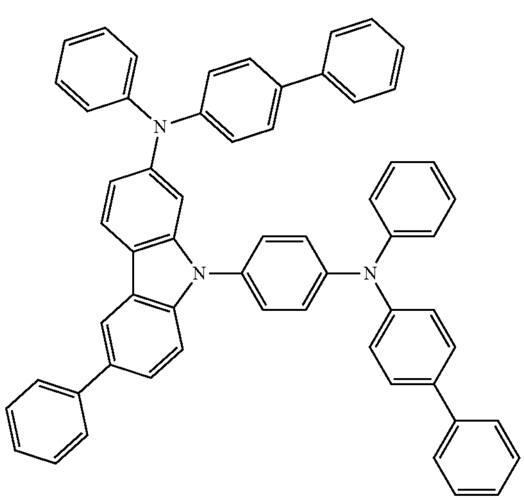
(A5)
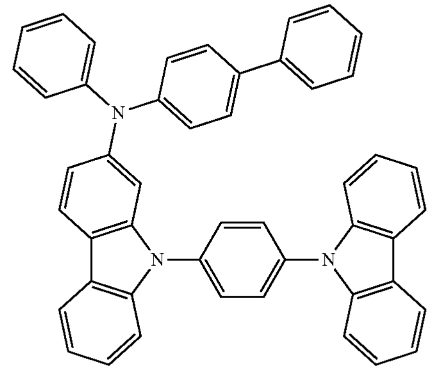
(A6)
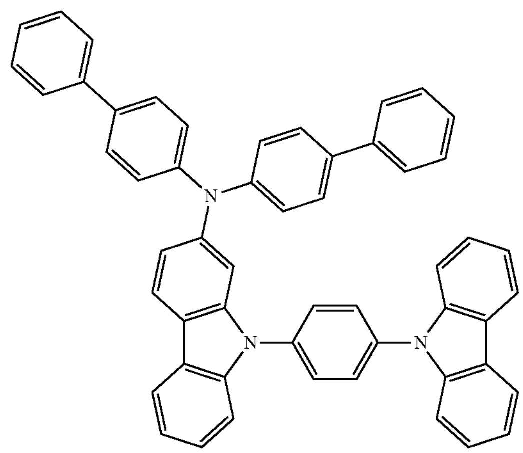
(A7)
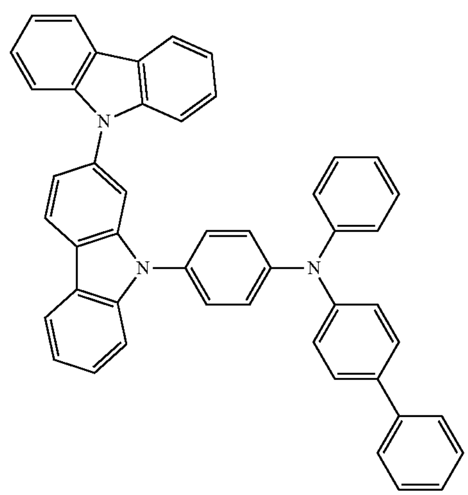

-continued
(A8)
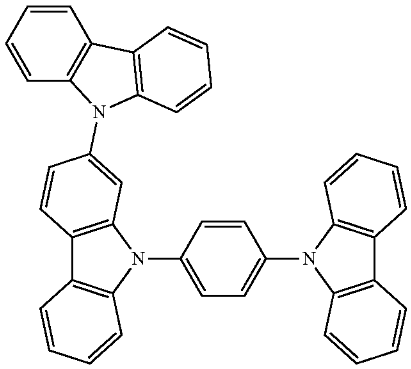
(A9)
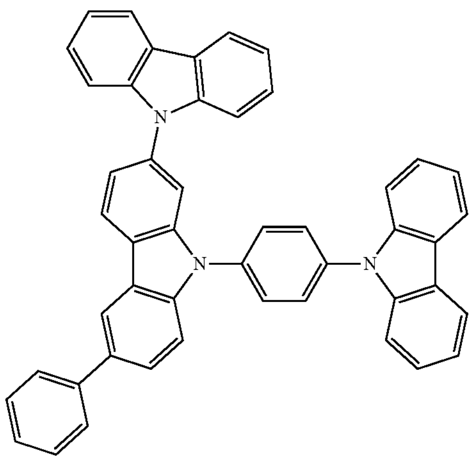
(A10)
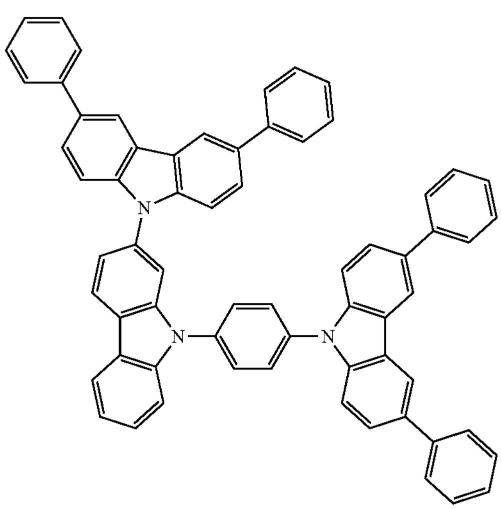
-continued
(A11)
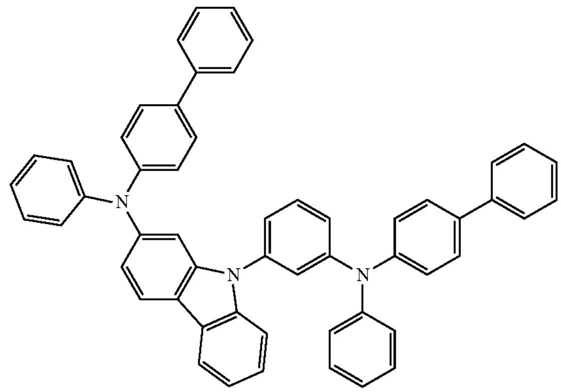
(A12)
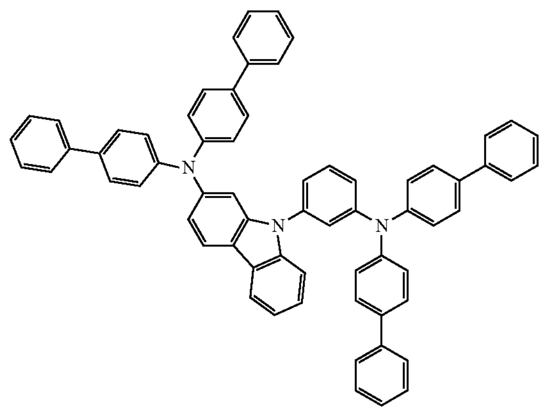
(A13)
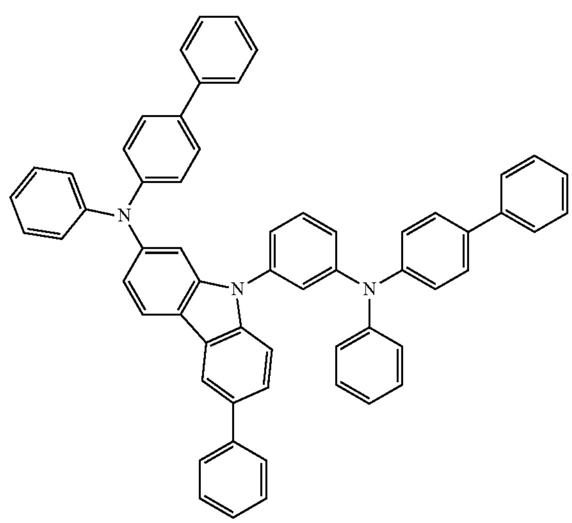

-continued
(A14)
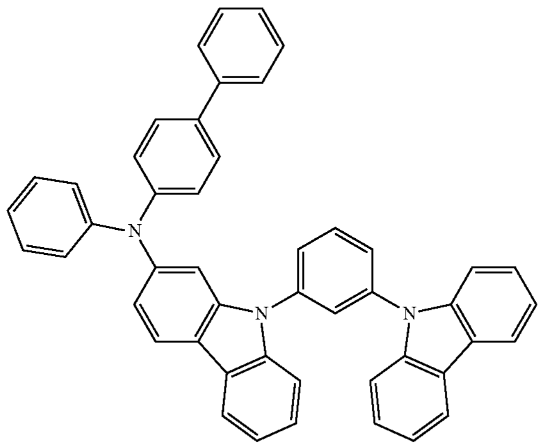
(A15)
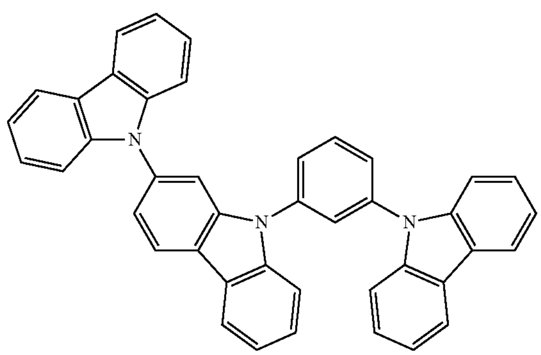
(A16)
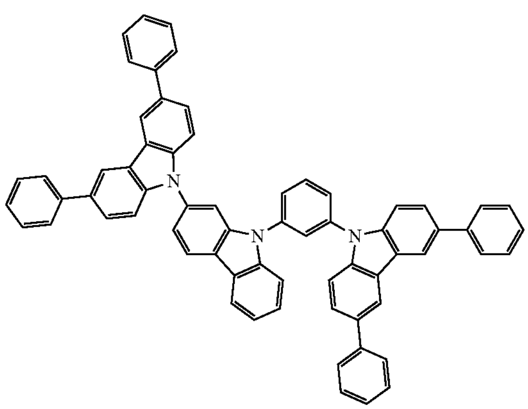
(A17)
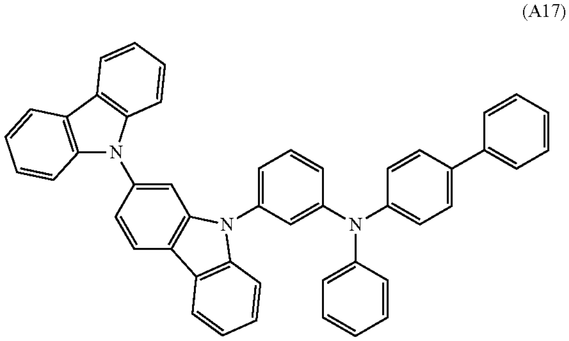
-continued
(A18)
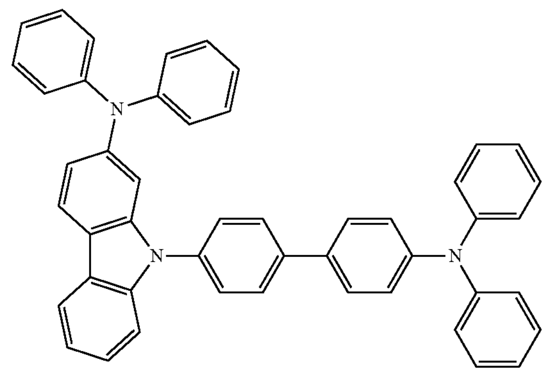
(A19)
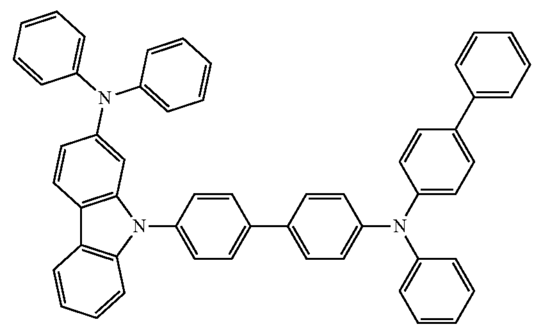
(A20)
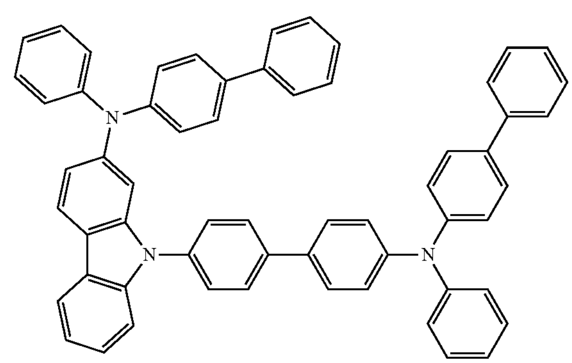
(A21)
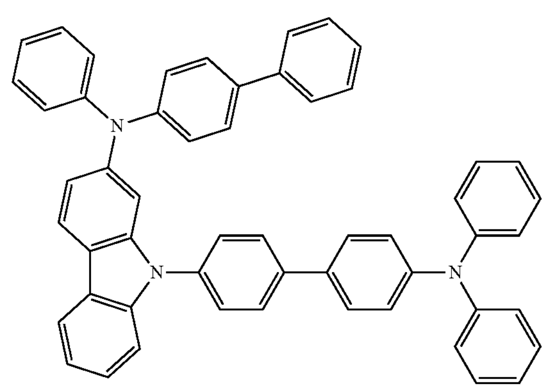

-continued
(A22)
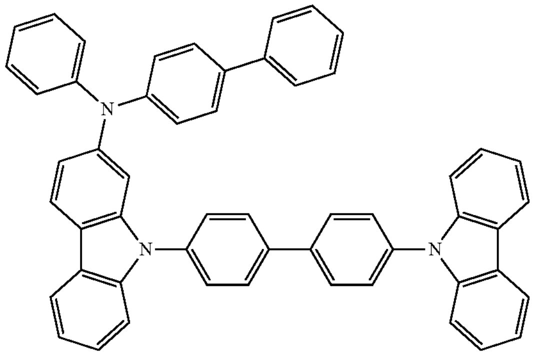
(A23)
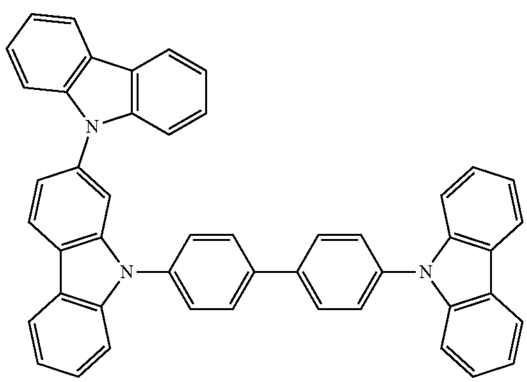
(A24)
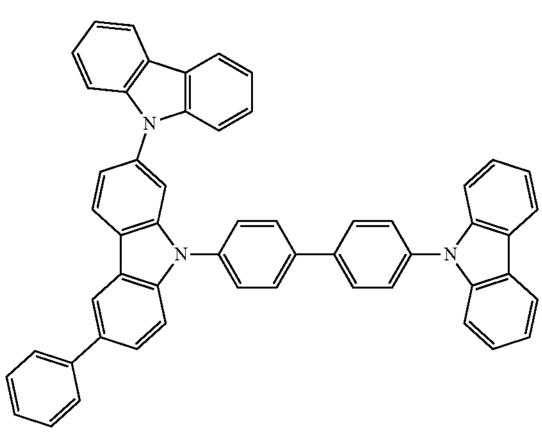
-continued
(A25)
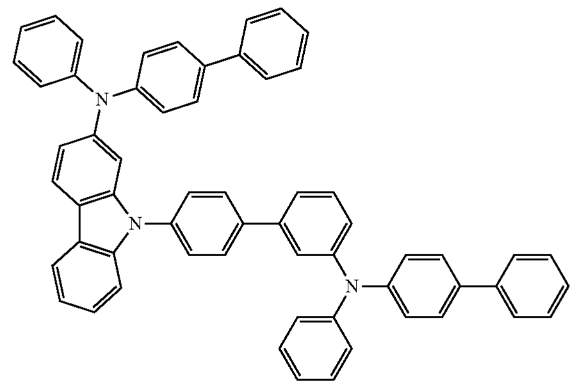
(A26)
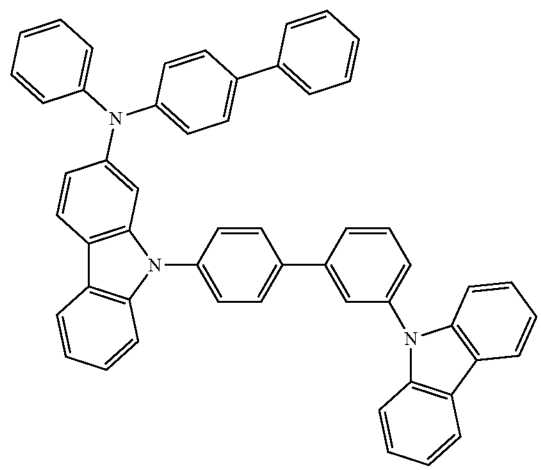
(A27
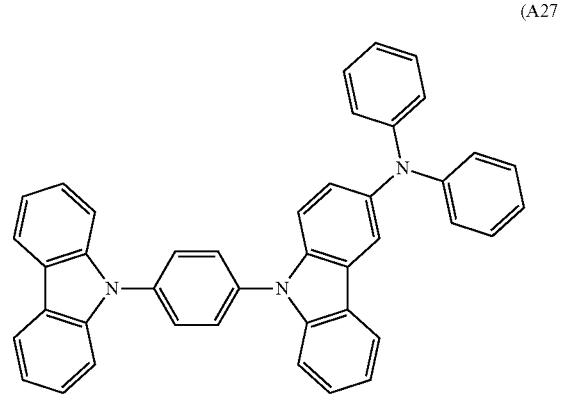

(B1)
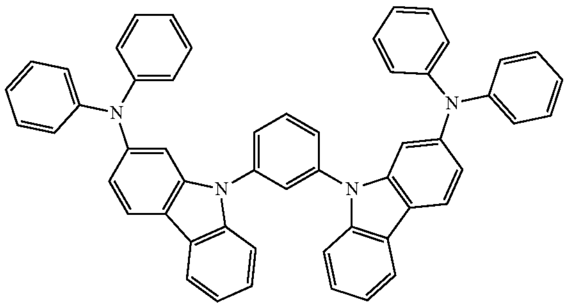
(B2)
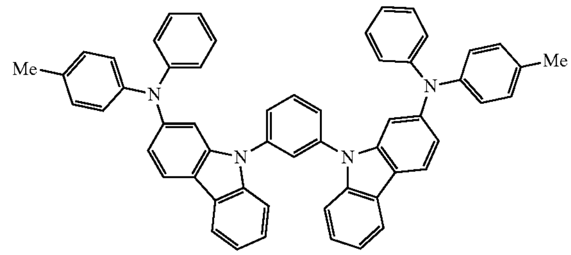
(B3)
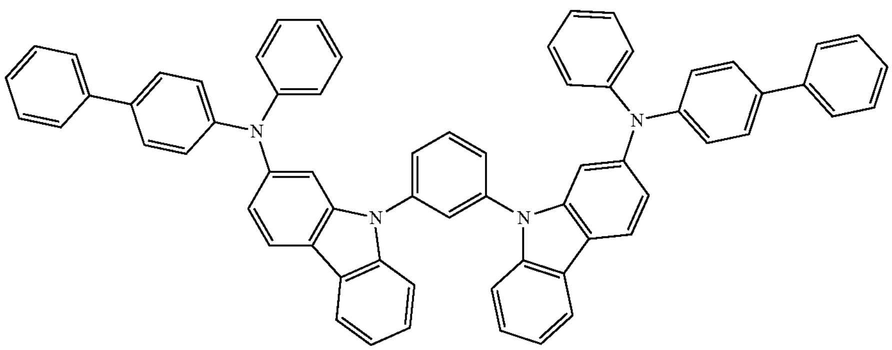
(B4)
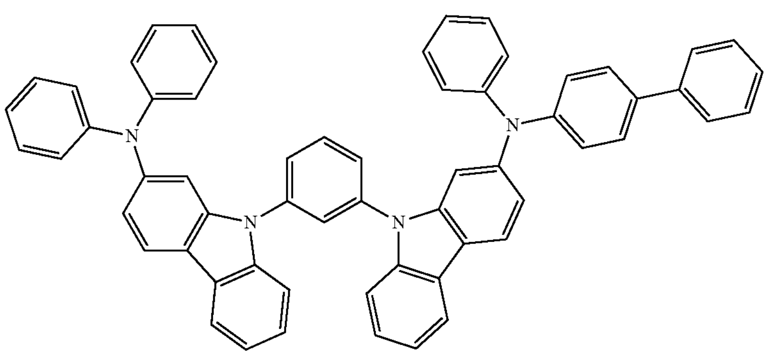
(B5)
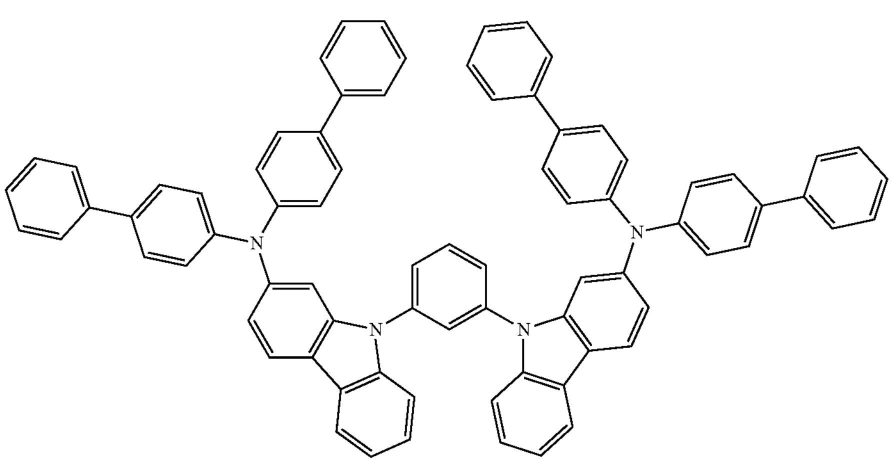

-continued
(B6)
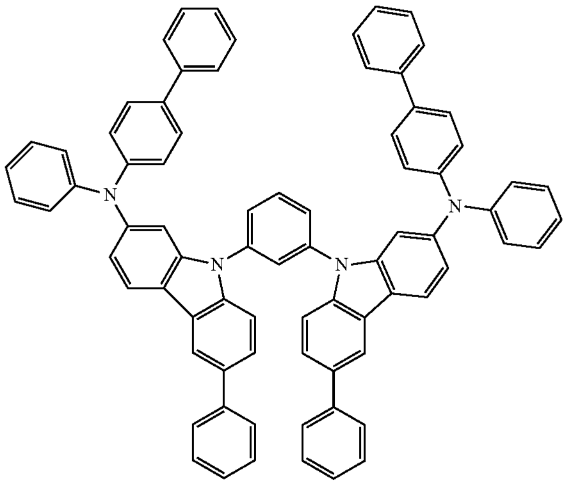
(B8)
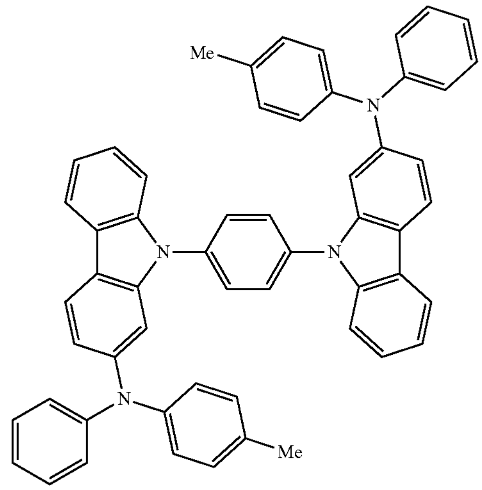
(B9)
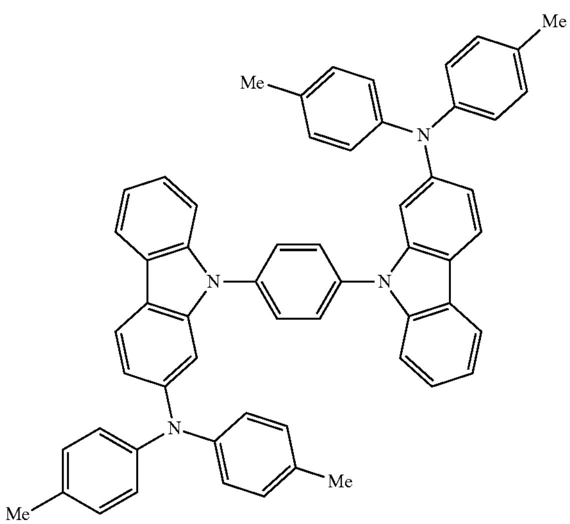
(B11)
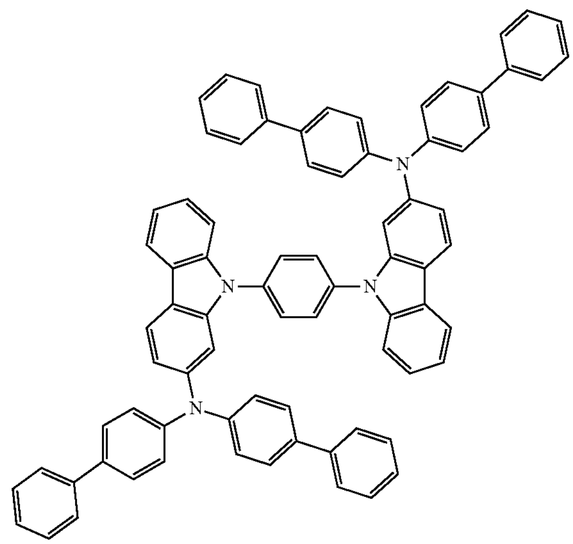
(B12)
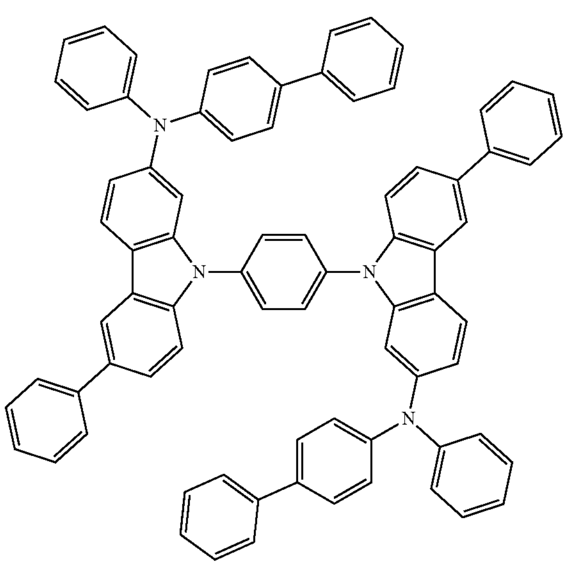
(B13)
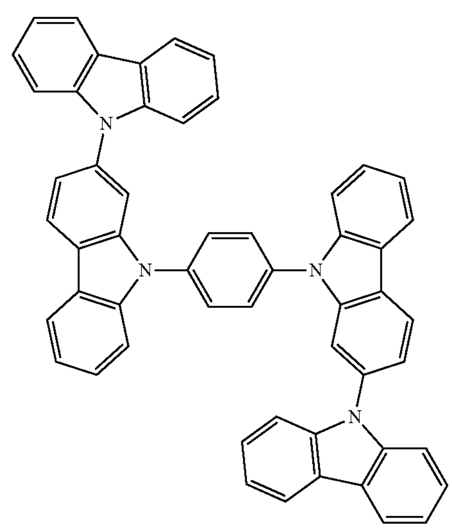

-continued
(B14)
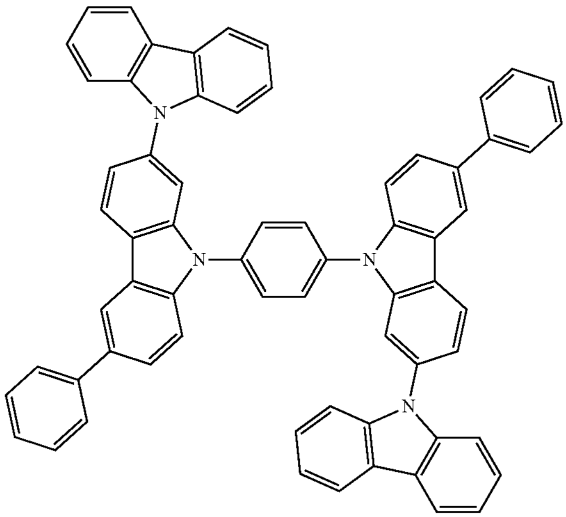
(B15)
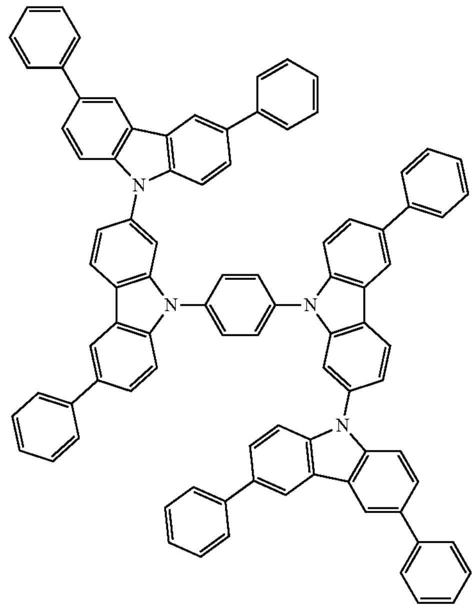
(B16)
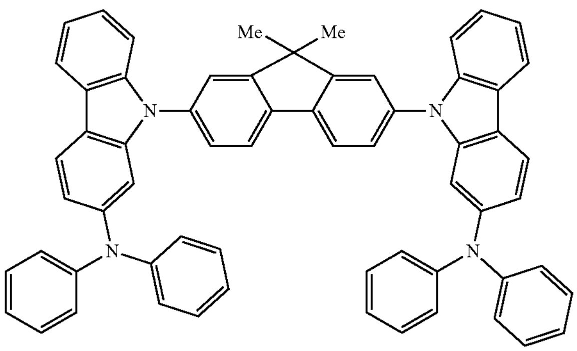
(B17)
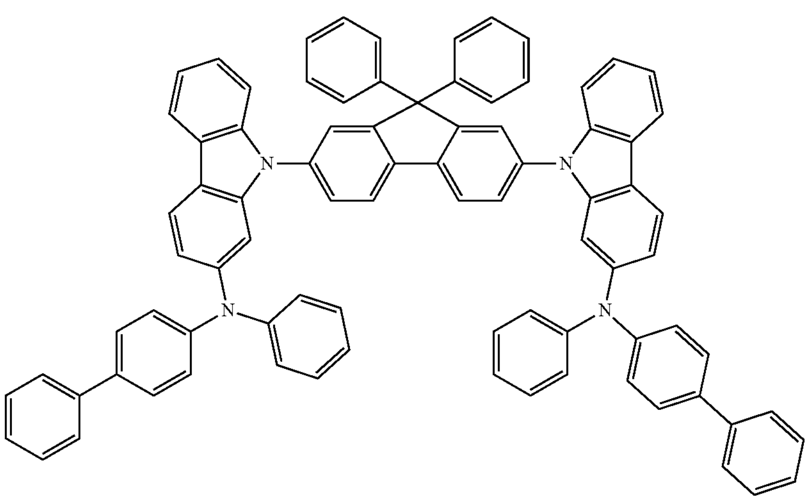

-continued
(B18)
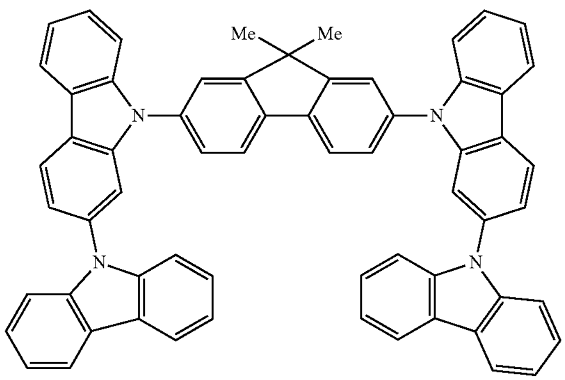
(B19)
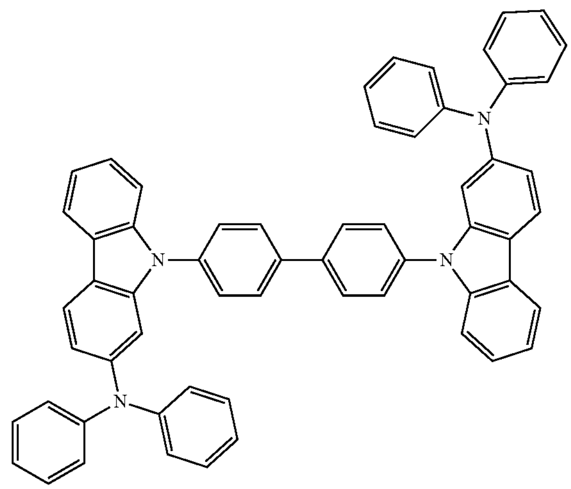
(B20)
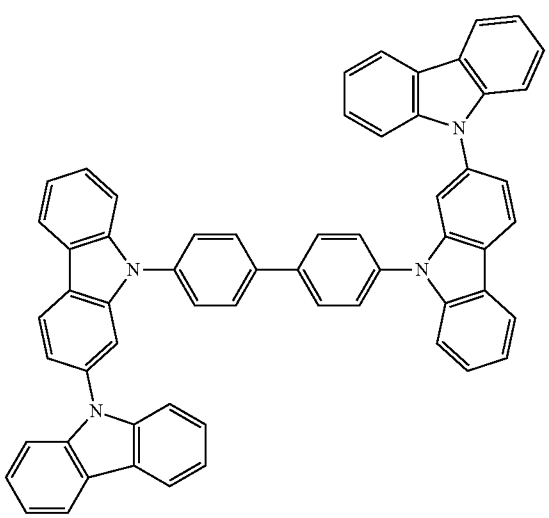
(B21)
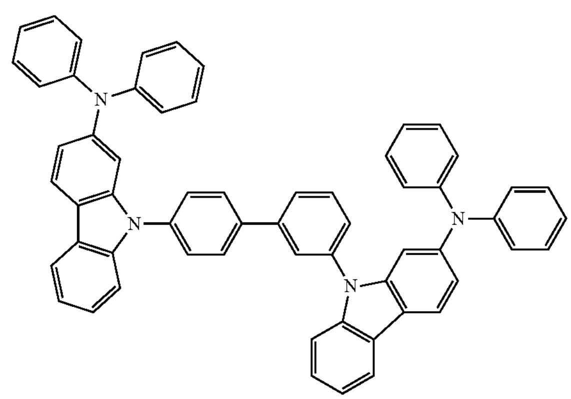
(B22)
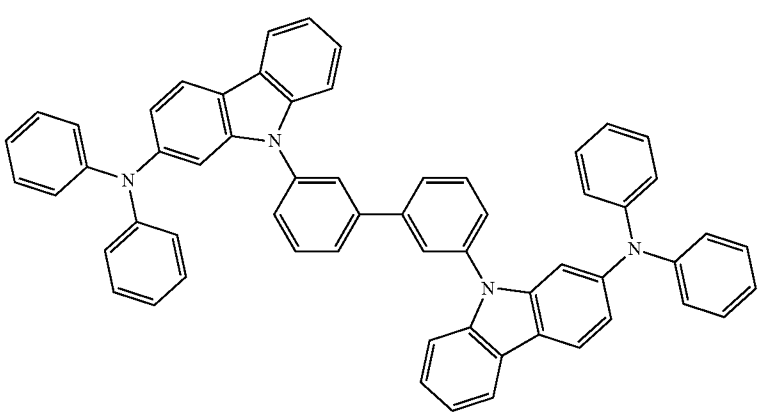

-continued
(B23)
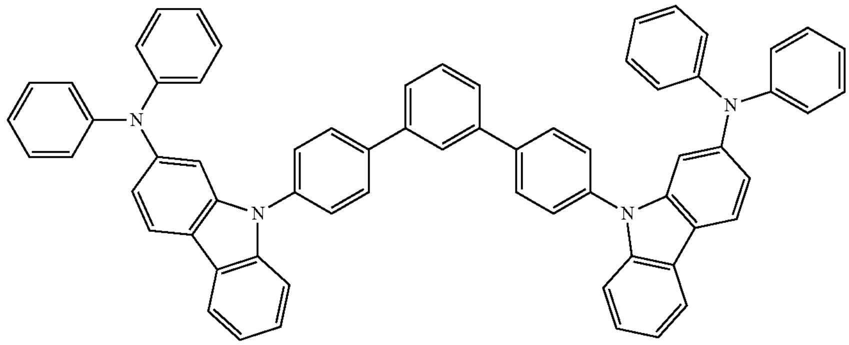
(B24)
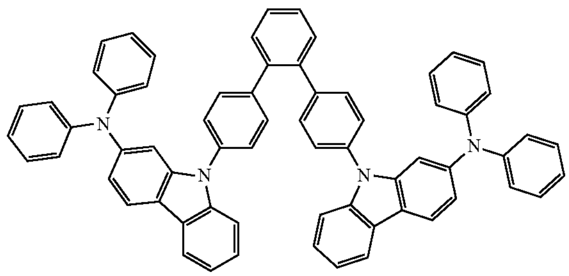
(B25)
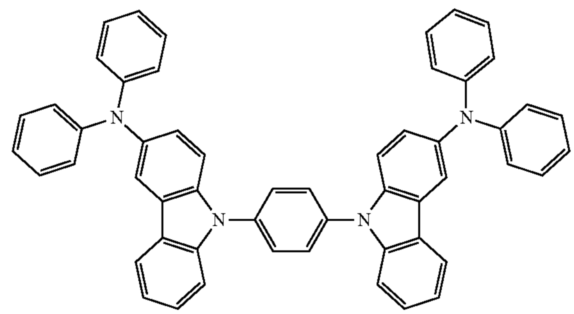
(C1)
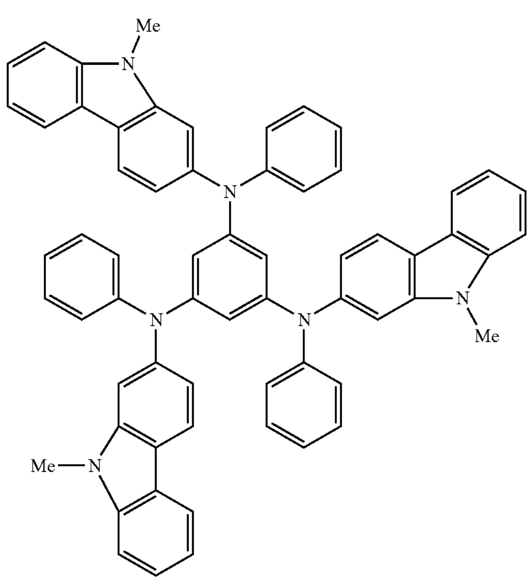
-continued
(C2)
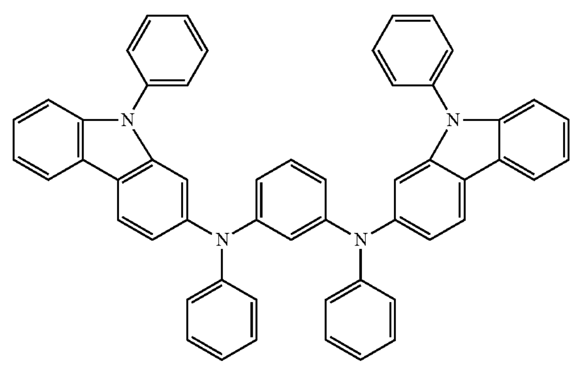
(C4)
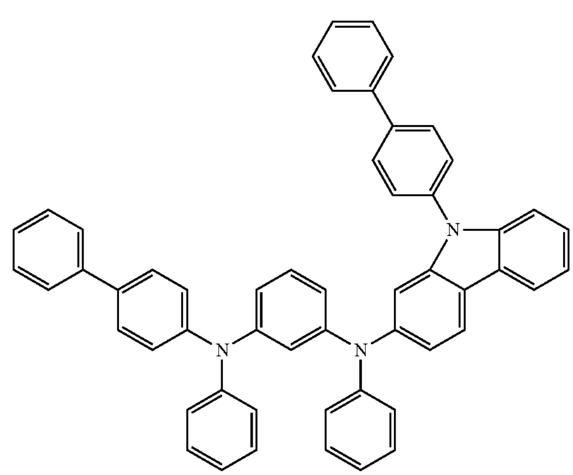

-continued
(C5)
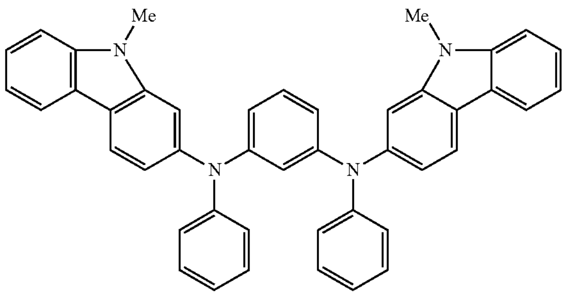
(C7)
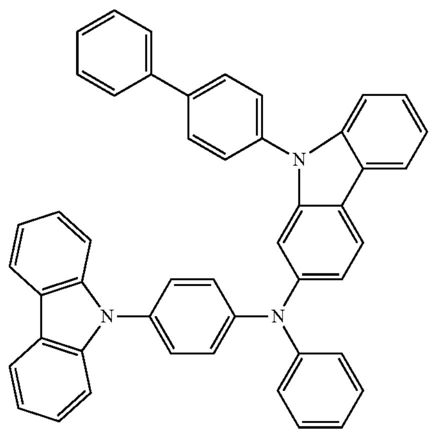
(C8)
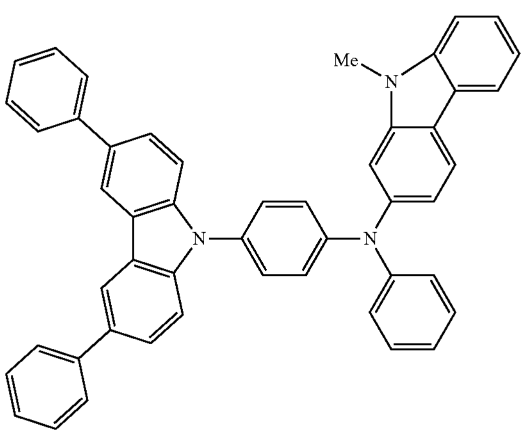
-continued
(C9)
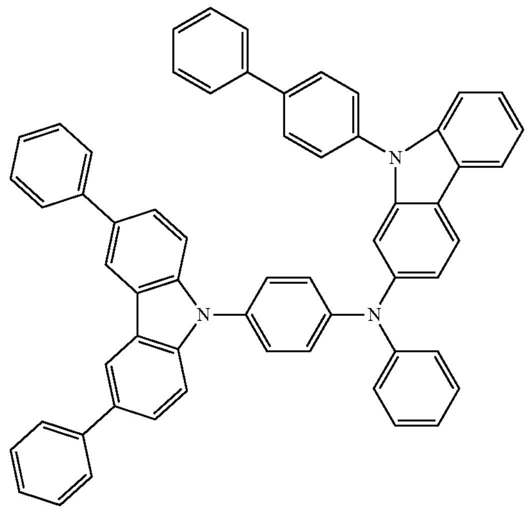
(C10)
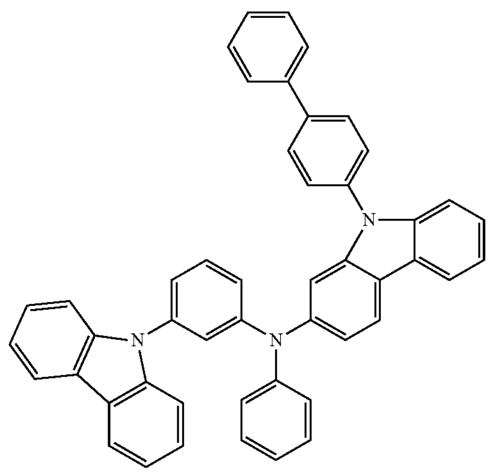
(C11)
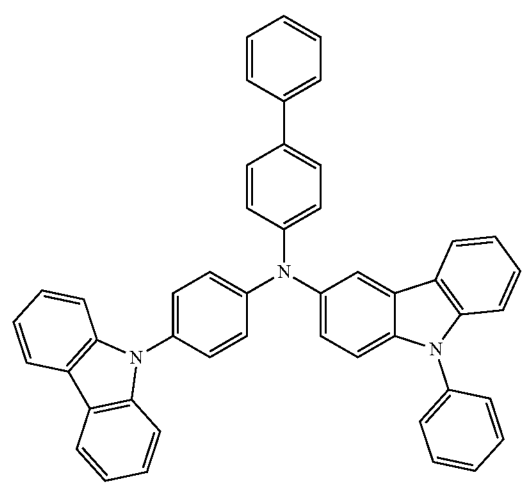

-continued
(C12)
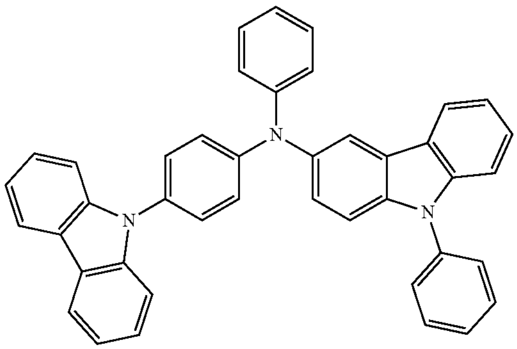
(C13)
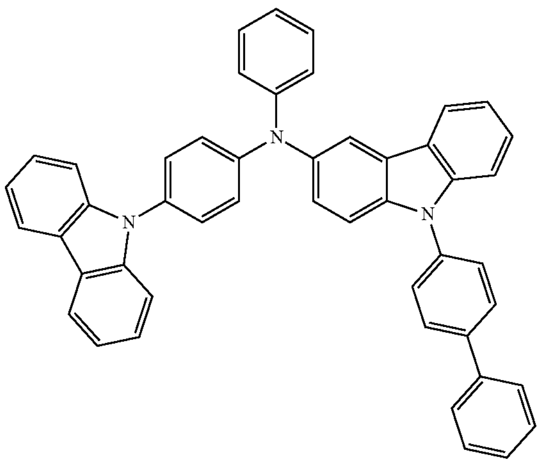
(C14)
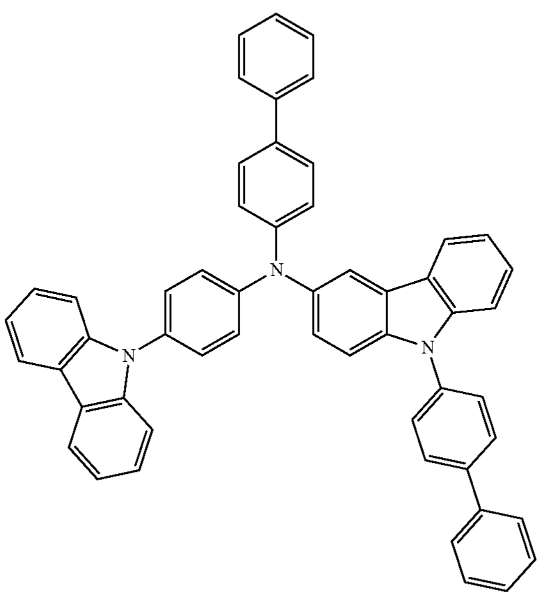
-continued
(C15)
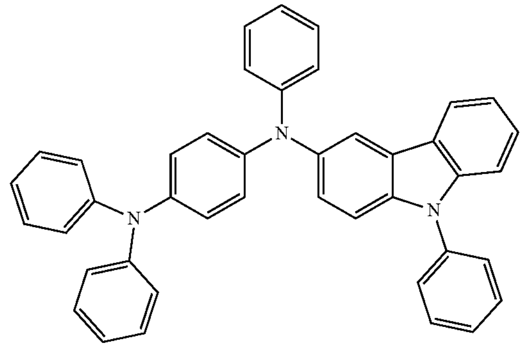
(C16)
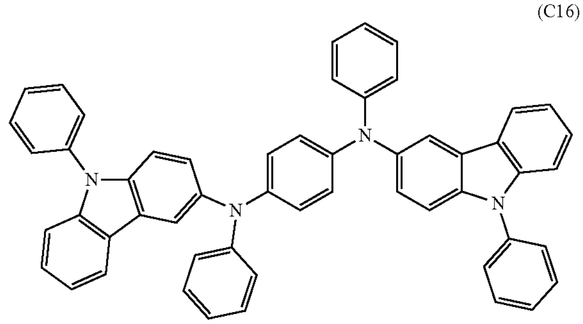 [SMILES: c1ccc(N(c2ccc(N(c3ccccc3)c3ccc4c(c3)c3ccccc3n4-c3ccccc3)cc2)c2ccc3c(c2)c2ccccc2n3-c2ccccc2)cc1]
(D1)
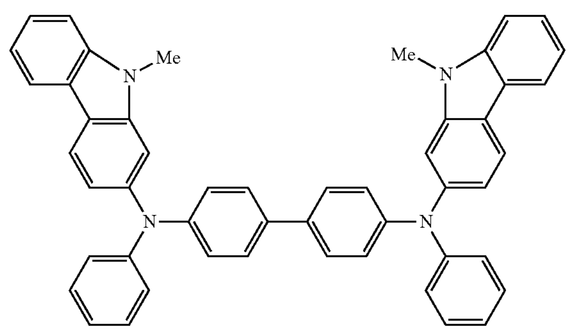
(D2)
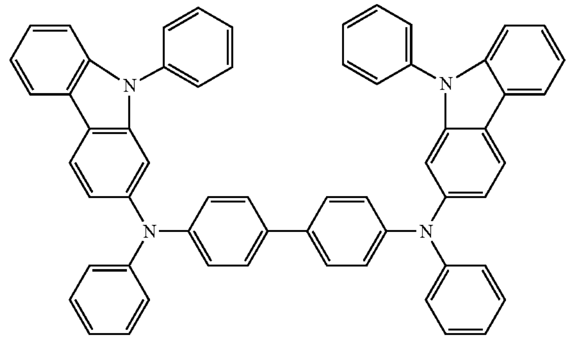

-continued
(D4)
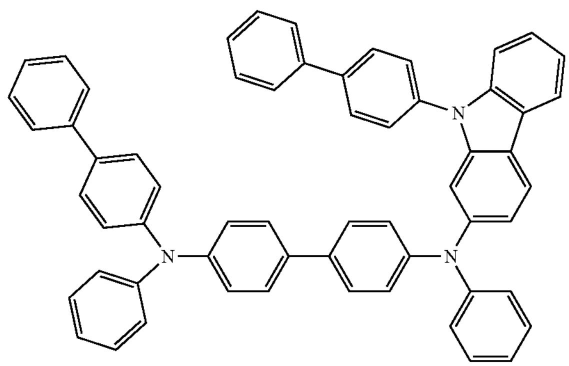
(D5)
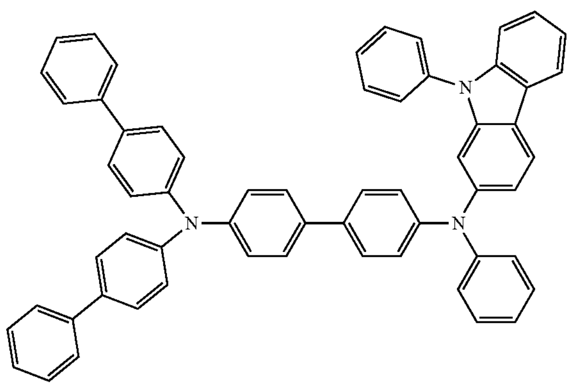
(D6)
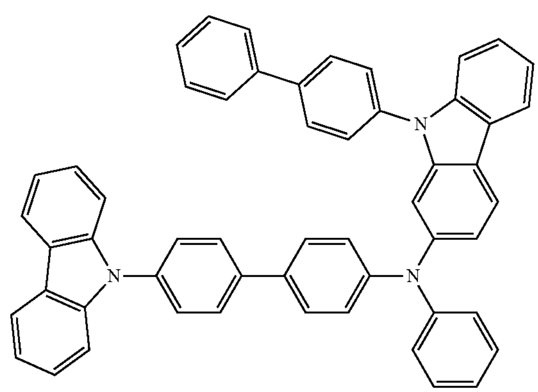
-continued
(D7)
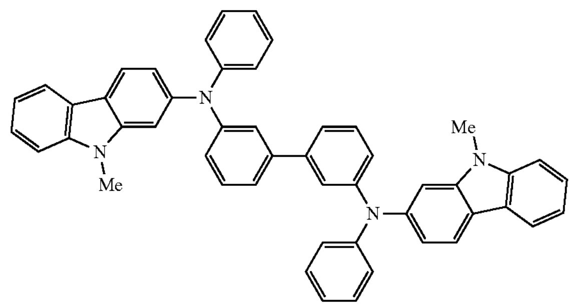
(D8)
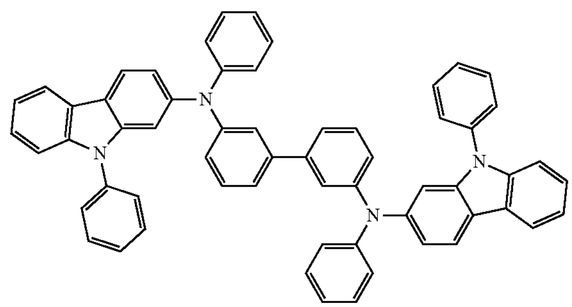
(D9)
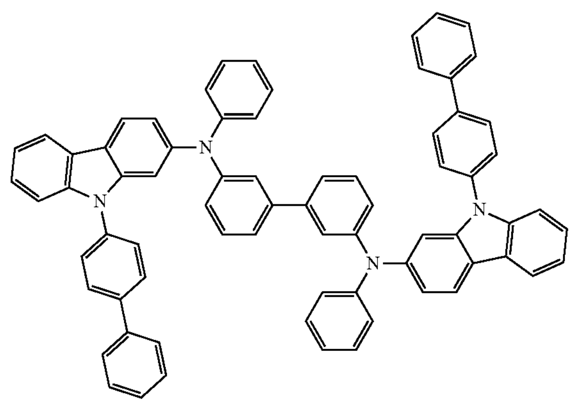
(E1)
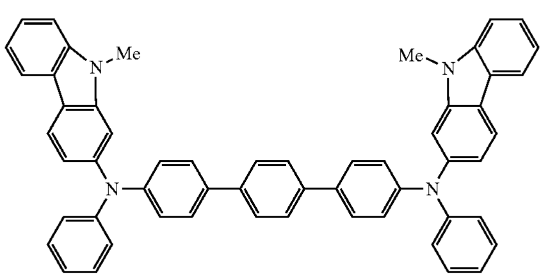
(E2)
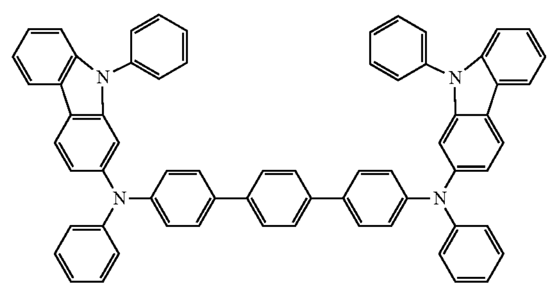

-continued
(E3)
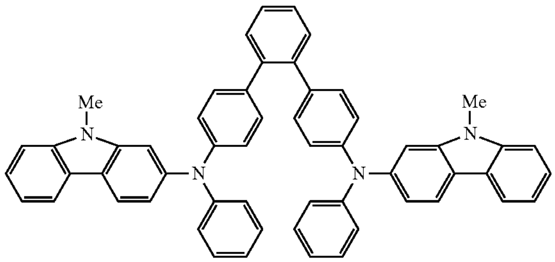
(E4)
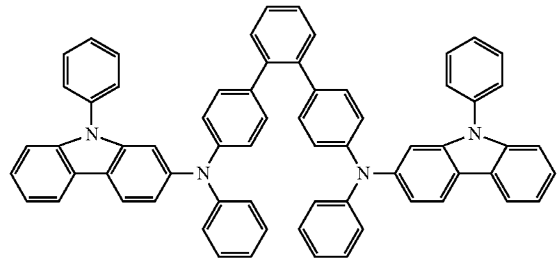
(E5)
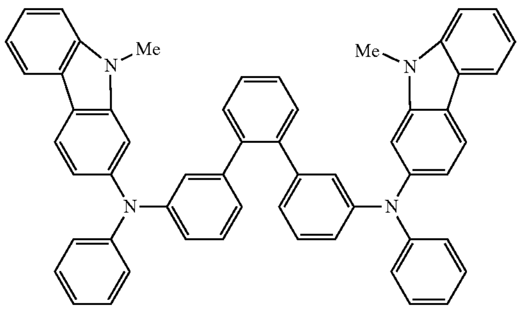
(E6)
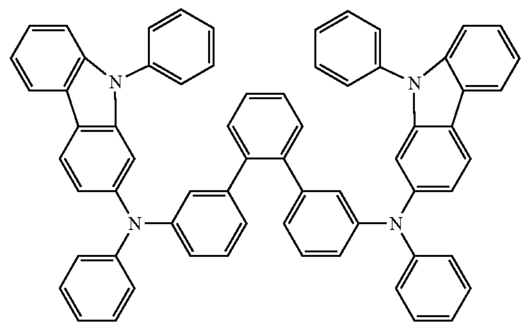
(E8)
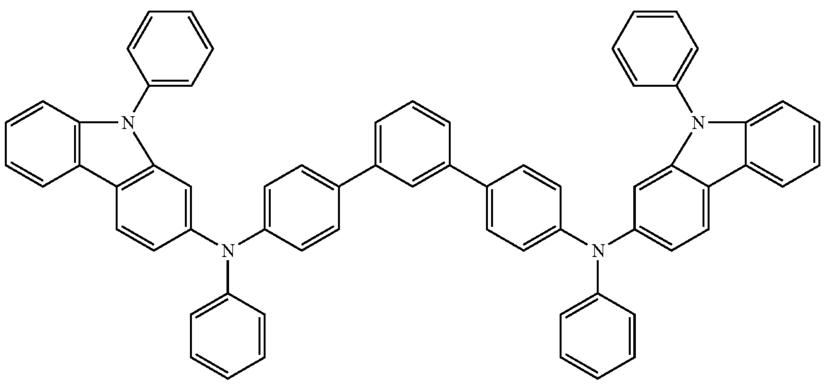
(E9)
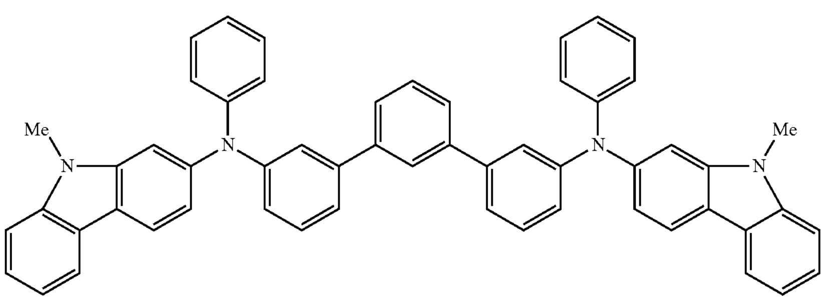
(E10)
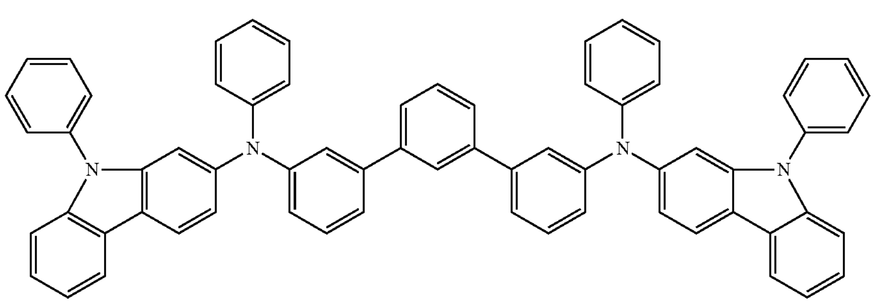

(F2)
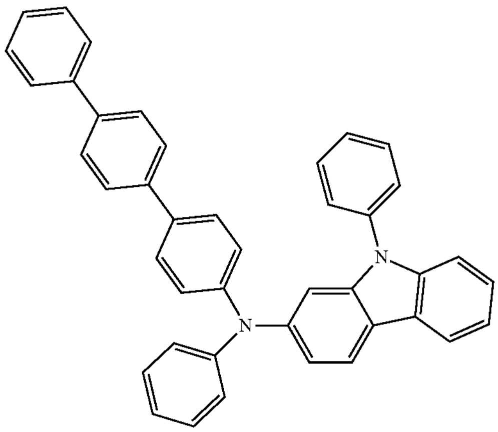
(F3)
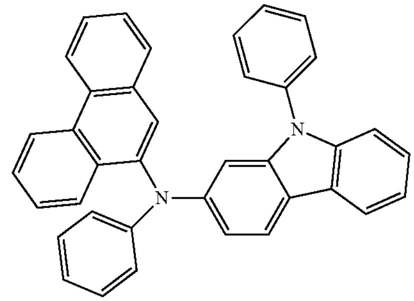
(F4)
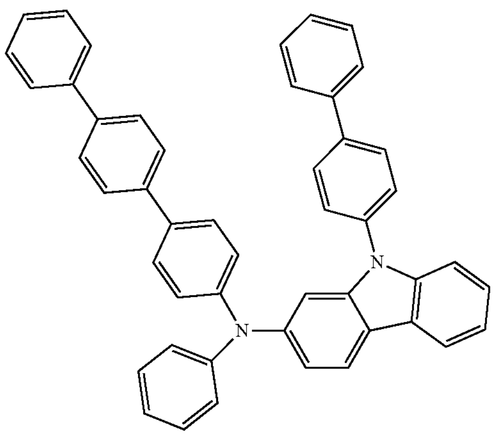
(F5)
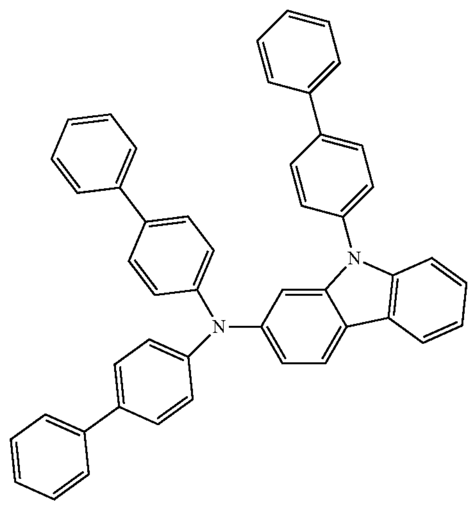
(F6)
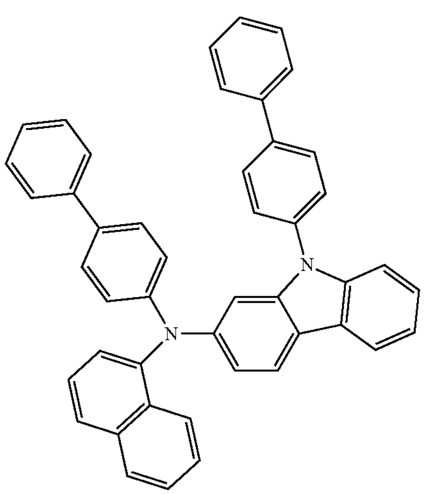
(F7)
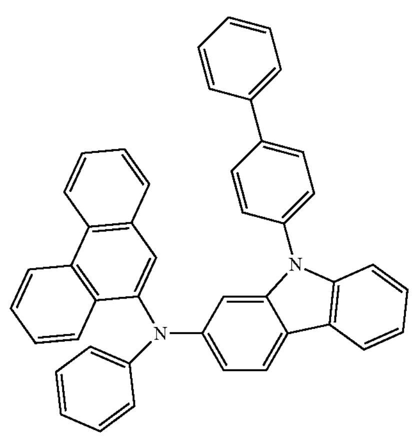

-continued
(F9)
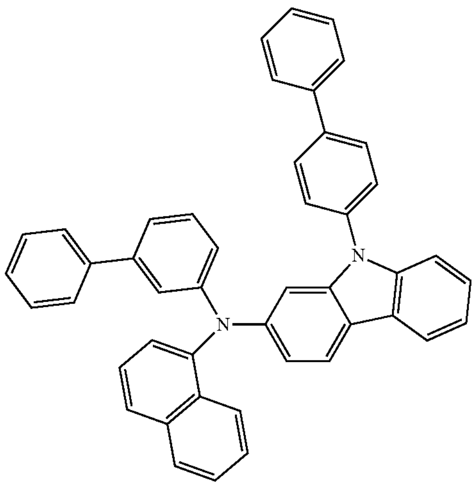
(F10)
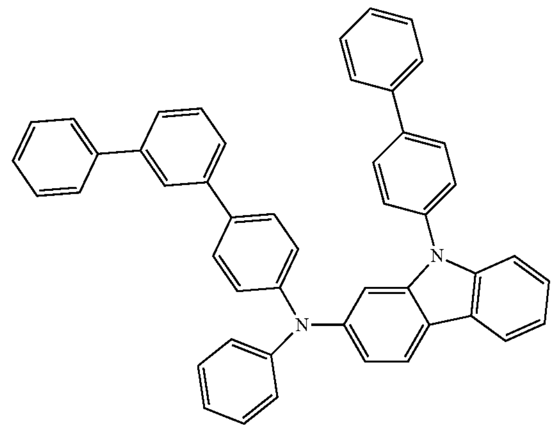
(F12)
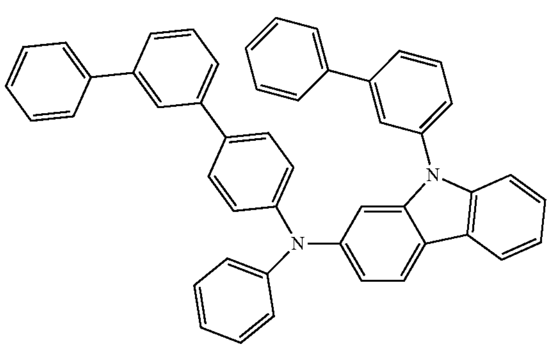
(F13)
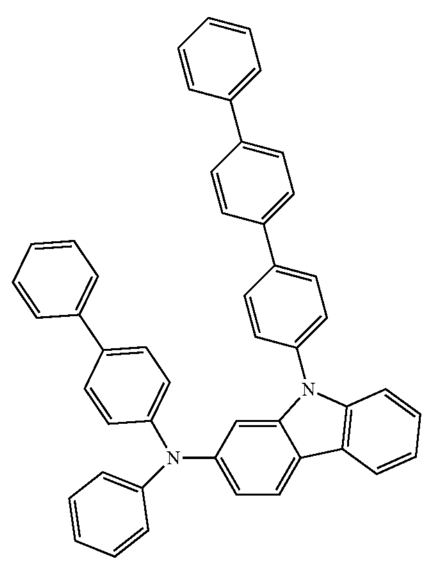

-continued
(F14)
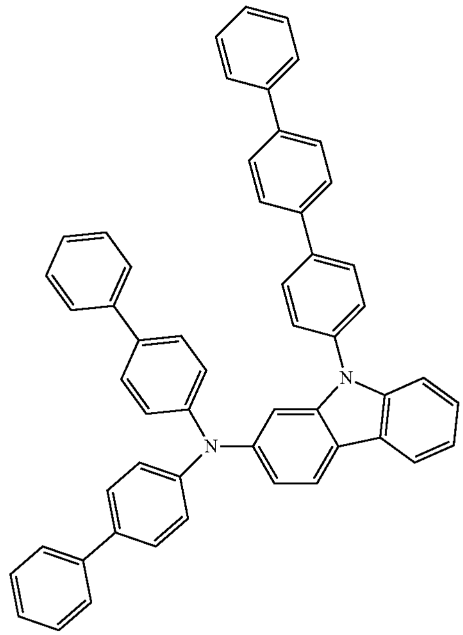
(F15)
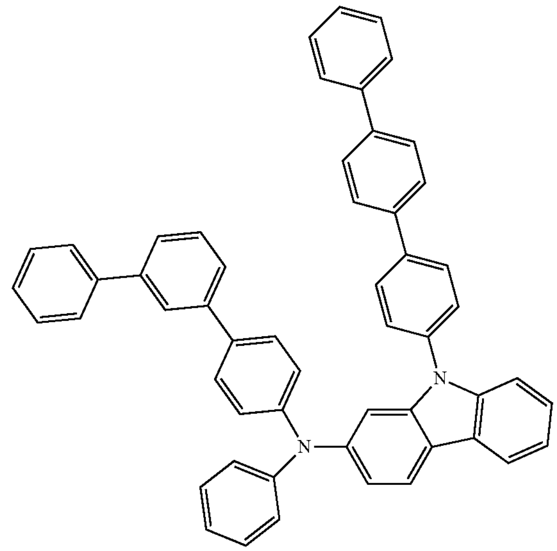
(F16)
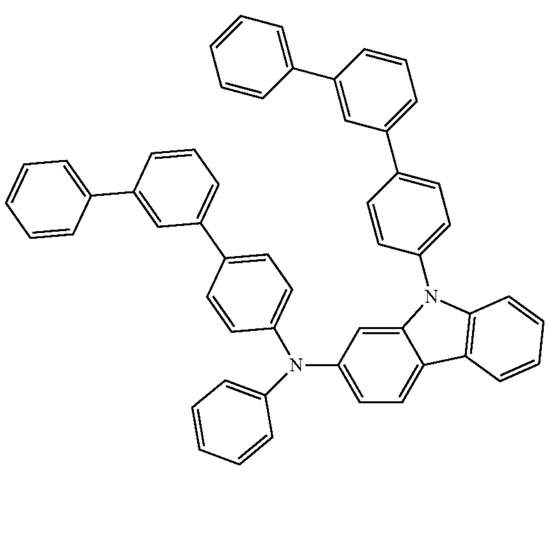
(F17)
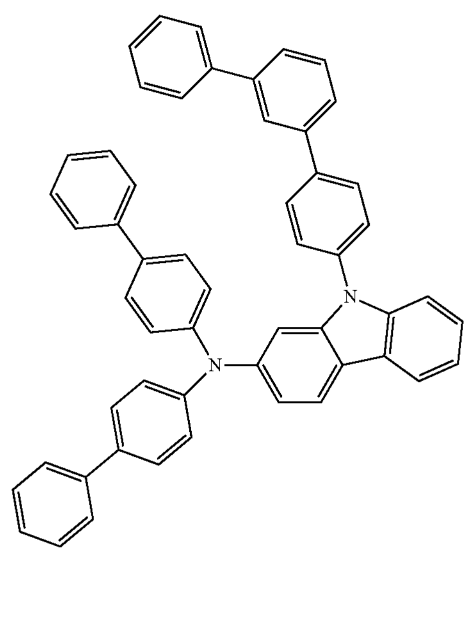

-continued
(F18)
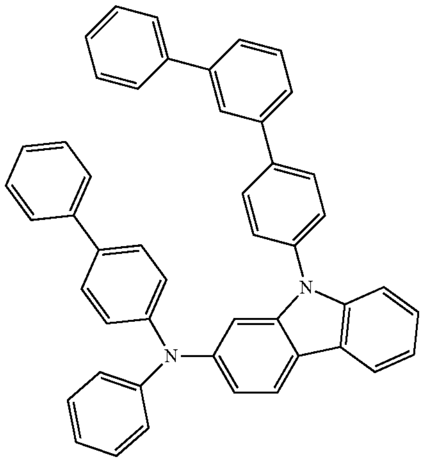
(F19)
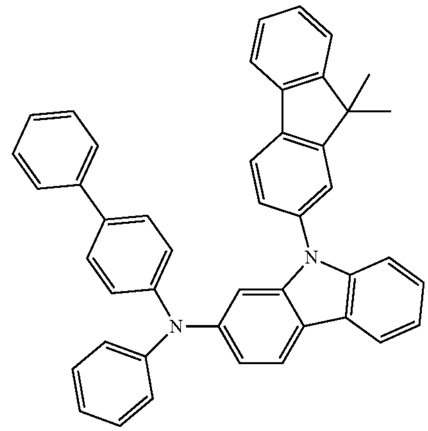
(F20)
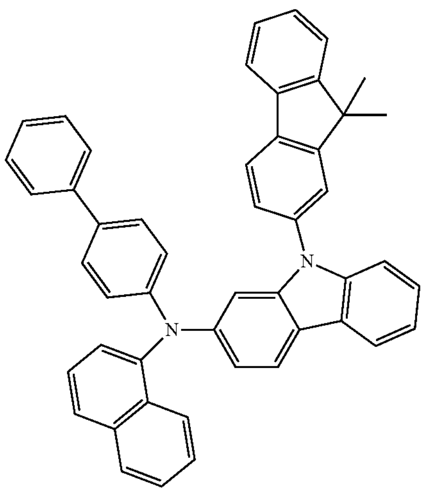
(F21)
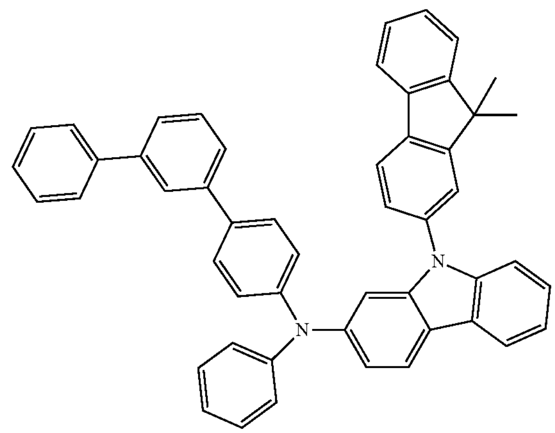
(F22)
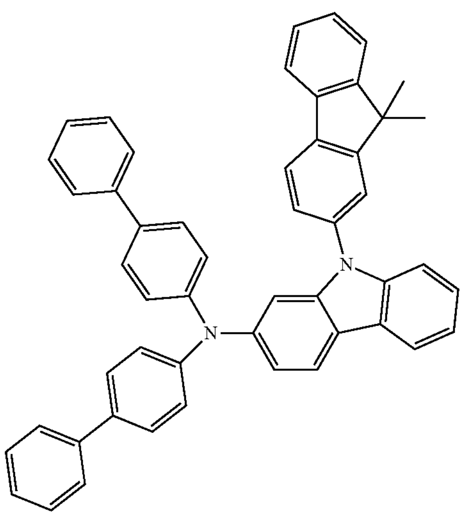
(F23)
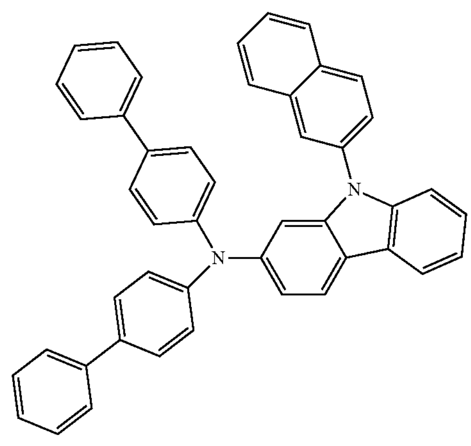

-continued
(F24)
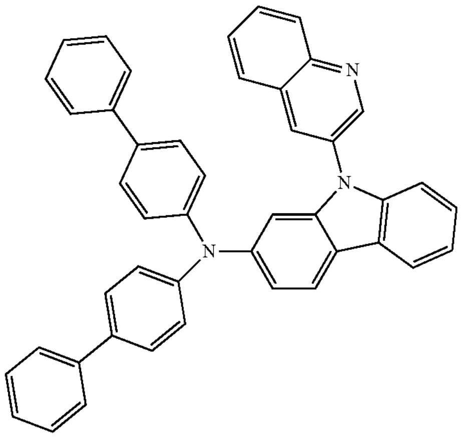
(F25)
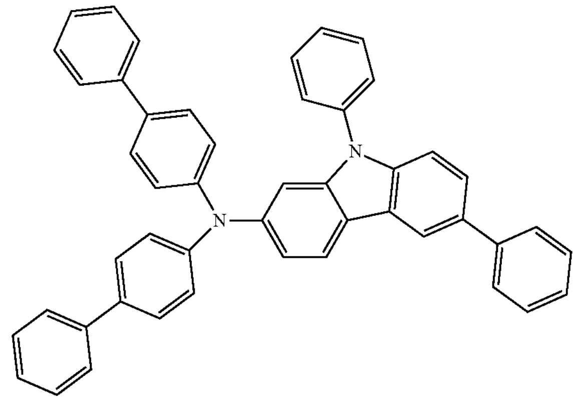
(F26)
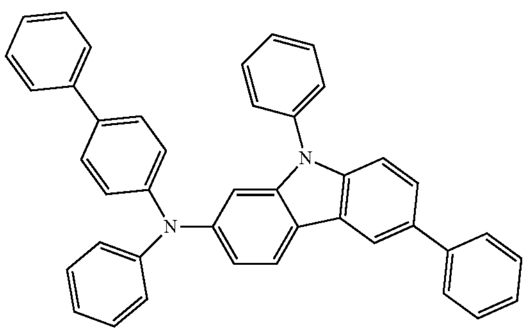
(F27)
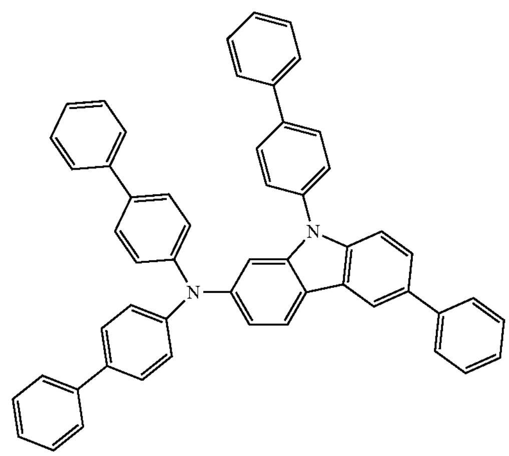
(F28)
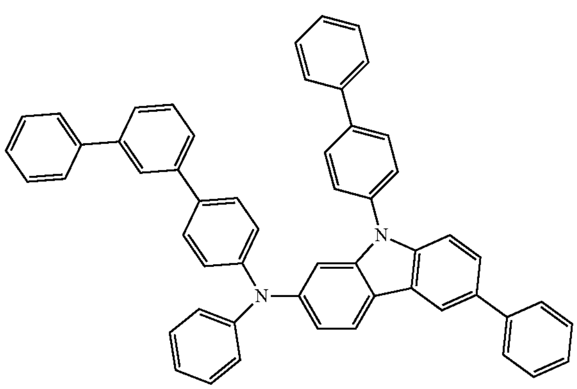
(F29)
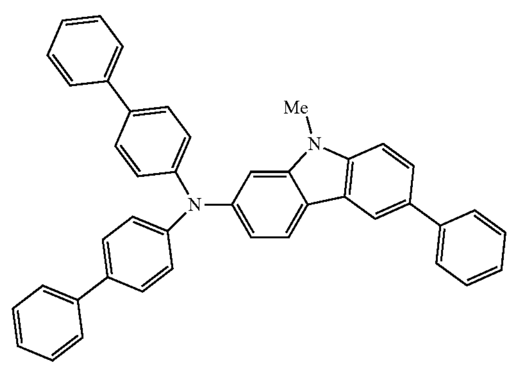

-continued (F30)

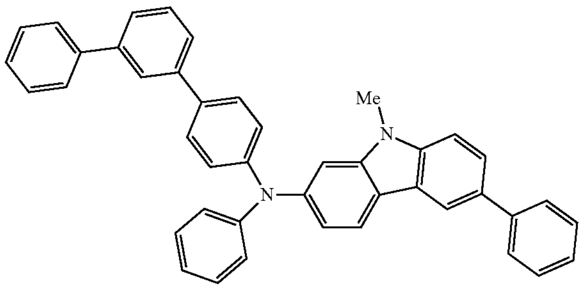

(F32)

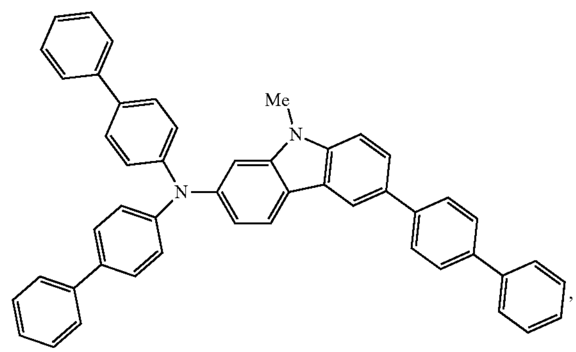

wherein, in Formulae 1-12, 1-13, 1-15, 1-22, and 2, $A_{21}$ to $A_{24}$ are each independently selected from a $C_5$-$C_{20}$ carbocyclic group and a $C_1$-$C_{20}$ heterocyclic group, $X_{11}$ is $N[(L_{11})_{a11}$-$Ar_{11}]$, $X_{12}$ is selected from $N[(L_{12})_{a12}$-$Ar_{12}]$, $C(Ar_{14})(Ar_{16})$, O, and S, $X_{21}$ is selected from $N[(L_{22})_{a22}$-$Ar_{22}]$, $C(Ar_{23})(Ar_{24})$, O, and S, a11 and a12 are each independently an integer selected from 1 to 5, $A_{11}$ and $A_{13}$ are each independently selected from a benzene, a naphthalene, a phenanthrene, an anthracene, a pyridine, a pyrimidine, a quinoline, an isoquinoline, naphthyridine, a quinoxaline, a phthalazine, a quinazoline, and a cinnoline, $L_{11}$, $L_{12}$, $L_{21}$, $L_{22}$, and $L_{26}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, wherein, when $X_{12}$ is $N[(L_{12})_{a12}$-$Ar_{12}]$, and $A_{11}$ and $A_{13}$ are each a benzene, $L_{11}$ and $L_{12}$ are each independently selected from a pentalenylene group, an indenylene group, an azulenylene group, a heptalenylene group, an indacenylene group, an acenaphthylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiazolylene group, an isothiazolylene group, an oxazolylene group, an isoxazolylene group, an isoindolylene group, an indolylene group, an indazolylene group, a purinylene group, a benzoquinolinylene group, a phthalazinylene group, a naphthyridinylene group, a quinoxalinylene group, a cinnolinylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a tetrazolylene group, a dibenzofuranylene group, a dibenzothiophenylene group, a benzocarbazolylene group, a dibenzocarbazolylene group, a thiatriazolines group, an imidazopyridinylene group, an imidazopyrimidinylene group; and a pentalenylene group, an indenylene group, an azulenylene group, a heptalenylene group, an indacenylene group, an acenaphthylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiazolylene group, an isothiazolylene group, an oxazolylene group, an isoxazolylene group, an isoindolylene group, an indolylene group, an indazolylene group, a purinylene group, a benzoquinolinylene group, a phthalazinylene group, a naphthyridinylene group, a quinoxalinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a tetrazolylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a biphenyl group, a terphenyl group, a pentalenyl group, an indenyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyrazinyl group, a pyridazinyl group, an isoindolyl group, an indolyl group, an indazolyl group, a purinyl group, a benzoquinolinyl group, a phthalazinyl group, a naphthyridinyl group, a quinoxalinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group, and when $X_{12}$ is $C(Ar_{14})(Ar_{16})$, O, or S, $L_{11}$ is selected from a pentalenylene group, an indenylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridazinylene group, an isoindolylene group, an indolylene group, an indazolylene group, a purinylene group, a benzoquinolinylene group, a phthalazinylene group, a naphthyridinylene group, a quinoxalinylene group, a cinnolinylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a dibenzofuranylene group, a dibenzothiophenylene group, a benzocarbazolylene group, a dibenzocarbazolylene group, a thiadiazolylene group, an imidazopyridinylene group, an imidazopyrimidinylene group; and a pentalenylene group, an indenylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridazinylene group, an isoindolylene group, an indolylene group, an indazolylene group, a purinylene group, a benzoquinolinylene group, a phthalazinylene group, a naphthyridinylene group, a quinoxalinylene group, a cinnolinylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyrazinyl group, a pyridazinyl group, an isoindolyl group, an indolyl group, an indazolyl group, a purinyl group, a benzoquinolinyl group, a phthalazinyl group, a naphthyridinyl group, a quinoxalinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group, a21, a22, and a26 are each independently an integer selected from 0 to 5, $Ar_{11}$ and $Ar_{12}$ are each independently selected from a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, and —$B(Q_6)(Q_7)$, and $Ar_{14}$, $Ar_{16}$, and $Ar_{21}$ to $Ar_{24}$ are each independently selected from a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_4)(Q_5)$, and —$B(Q_6)(Q_7)$, provided that:

when $X_{12}$ is $N[(L_{12})_{a12}$-$Ar_{12}]$ and $A_{11}$ and $A_{13}$ are each a benzene, $Ar_{11}$ and $Ar_{12}$ are each independently selected from a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiazolyl group, an isothiazolyl group, an oxazolyl group, an isoxazolyl group, an isoindolyl group, an indolyl group, an indazolyl group, a purinyl group, a benzoquinolinyl group, a phthalazinyl group, a naphthyridinyl group, a quinoxalinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a tetrazolyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, an imidazopyrimidinyl group, —$Si(Q_1)(Q_2)(Q_3)$; and a phenyl group, a biphenyl group, a terphenyl group, a pentalenyl group, an indenyl group, a naphthyl group, an azulenyl group, a heptalenyl group, an indacenyl group, an acenaphthyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiazolyl group, an isothiazolyl group, an oxazolyl group, an isoxazolyl group, an isoindolyl group, an indolyl group, an indazolyl group, a purinyl group, a benzoquinolinyl group, a phthalazinyl group, a naphthyridinyl group, a quinoxalinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a tetrazolyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, and an imidazopyrimidinyl group, each substituted with at least one selected from deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyrazinyl group, a pyridazinyl group, an isoindolyl group, an indolyl group, an indazolyl group, a purinyl group, a benzoquinolinyl group, a phthalazinyl group, a naphthyridinyl group, a quinoxalinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, a dibenzosilolyl group, and —$Si(Q_{41})(Q_{42})(Q_{43})$, provided that when one of $Ar_{11}$ and $Ar_{12}$ is an unsubstituted phenyl group, an unsubstituted naphthyl group, an unsubstituted biphenyl group, a phenyl group substituted with at least one selected from a phenyl group and a naphthyl group, or a naphthyl group substituted with at least one selected from a phenyl group and a naphthyl group, the other of $Ar_{11}$ and $Ar_{12}$ is further substituted with at least one selected from deuterium, —Cl, —Br, —I, a hydroxyl group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkoxy group, a cyclopentyl group, a cyclohexyl group, a cycloheptyl group, a cyclopentenyl group, a cyclohexenyl group, a terphenyl group, a pentalenyl group, an indenyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyrazinyl group, a pyridazinyl group, an isoindolyl group, an indolyl group, an indazolyl group, a purinyl group, a benzoquinolinyl group, a phthalazinyl group, a naphthyridinyl group, a quinoxalinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, a dibenzosilolyl group, —$Si(Q_{41})(Q_{42})(Q_{43})$, a tolyl group, and a t-butyl phenyl group, and when $X_{12}$ is $C(Ar_{14})(Ar_{16})$, O, or S, and $A_{11}$ and $A_{13}$ are each a benzene or a naphthalene, $Ar_{11}$ is selected from a $C_1$-$C_{20}$ alkyl group and a $C_1$-$C_{20}$ alkoxy group;

a pentalenyl group, an indenyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridazinyl group, an isoindolyl group, an indolyl group, an indazolyl group, a purinyl group, a benzoquinolinyl group, a phthalazinyl group, a naphthyridinyl group, a quinoxalinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, an imidazopyrimidinyl group, —$Si(Q_1)(Q_2)(Q_3)$, —$N(Q_4)(Q_5)$; and a pentalenyl group, an indenyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridazinyl group, an isoindolyl group, an indolyl group, an indazolyl group, a purinyl group, a benzoquinolinyl group, a phthalazinyl group, a naphthyridinyl group, a quinoxalinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyrazinyl group, a pyridazinyl group, an isoindolyl group, an indolyl group, an indazolyl group, a purinyl group, a benzoquinolinyl group, a phthalazinyl group, a naphthyridinyl group, a quinoxalinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, a dibenzosilolyl group, —$Si(Q_{41})(Q_{42})(Q_{43})$, and —$N(Q_{44})(Q_{45})$;

$R_{11}$ to $R_{13}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted monovalent non-aromatic condensed polycyclic group, a substituted or unsubstituted monovalent non-aromatic condensed heteropolycyclic group, —Si($Q_{11}$)($Q_{12}$)($Q_{13}$), —N($Q_{14}$)($Q_{15}$), and —B($Q_{16}$)($Q_{17}$);

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, an indolyl group, a pyridinyl group, a pyrazinyl group, a pyrimidinyl group, a pyridazinyl group, a quinoxalinyl group, a carbazolyl group, a triazinyl group, a dibenzofuranyl group, a dibenzothiophenyl group, a benzocarbazolyl group, a dibenzocarbazolyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, an indolyl group, a pyridinyl group, a pyrazinyl group, a pyrimidinyl group, a pyridazinyl group, a quinoxalinyl group, a carbazolyl group, a triazinyl group, a dibenzofuranyl group, a dibenzothiophenyl group, a benzocarbazolyl group, and a dibenzocarbazolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, and a naphthyl group; and —Si($Q_{11}$)($Q_{12}$)($Q_{13}$) and —N($Q_{14}$)($Q_{15}$), $R_{21}$ to $R_{24}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{11}$)($Q_{12}$)($Q_{13}$), —N($Q_{14}$)($Q_{15}$), and —B($Q_{16}$)($Q_{17}$), b11 to b13, and b21 to b24 are each independently an integer selected from 0 to 8, and at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from the group consisting of:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{21}$)($Q_{22}$)($Q_{23}$), —N($Q_{24}$)($Q_{25}$), and —B($Q_{26}$)($Q_{27}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{31}$)($Q_{32}$)($Q_{33}$), —N($Q_{34}$)($Q_{35}$), and —B($Q_{36}$)($Q_{37}$); and Si($Q_{41}$)($Q_{42}$)($Q_{43}$), —N($Q_{44}$)($Q_{45}$), and —B($Q_{46}$)($Q_{47}$), wherein $Q_1$ to $Q_7$, $Q_{11}$ to $Q_{17}$, $Q_{21}$ to $Q_{27}$, $Q_{31}$ to $Q_{37}$, and $Q_{41}$ to $Q_{47}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group; and a $C_6$-$C_6$ aryl group, a $C_1$-$C_{60}$ heteroaryl group, a monovalent non-aromatic condensed polycyclic group and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkoxy group, a phenyl group, a biphenyl group, a terphenyl group, and a naphthyl group, and $Q_4$ and $Q_5$ are optionally linked to each other to form a saturated or unsaturated ring.

2. The organic light-emitting device of claim 1, wherein:

$A_{21}$ to $A_{24}$ are each independently selected from a benzene, a naphthalene, a phenanthrene, an anthracene, a pyridine, a pyrimidine, a quinoline, an isoquinoline, naphthyridine, a quinoxaline, a phthalazine, a quinazoline, and a cinnoline.

3. The organic light-emitting device of claim 1, wherein:

$L_{11}$, $L_{12}$, $L_{21}$, $L_{22}$, and $L_{26}$ are each independently selected from the group consisting of:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, an imidazopyrimidinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group.

4. The organic light-emitting device of claim 1, wherein:

$L_{11}$, $L_{12}$, $L_{21}$, $L_{22}$, and $L_{26}$ are each independently selected from groups represented by Formulae 3-1 to 3-34, wherein, when $X_{12}$ is $N[(L_{12})_{a12}$-$Ar_{12}]$, and $A_{11}$ and $A_{13}$ are each a benzene, $L_{11}$ and $L_{12}$ are each independently selected from groups represented by Formulae 3-4, 3-5, 3-9, 3-10, 3-26, and 3-34, when $X_{12}$ is $C(Ar_{14})(Ar_{16})$, O, or S, $L_{11}$ and $L_{12}$ are each independently selected from groups represented by Formulae 3-26 to 3-28 and 3-32 to 3-34:

3-1

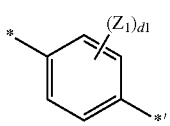

3-2

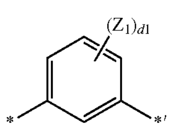

3-3

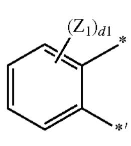

3-4

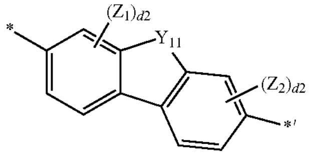

-continued 3-5

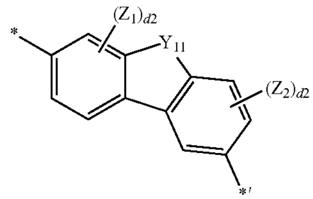

3-6

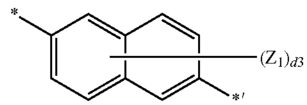

3-7

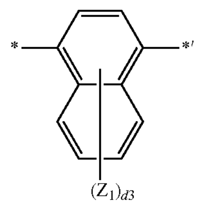

3-8

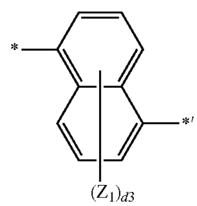

3-9

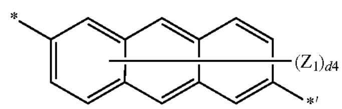

3-10

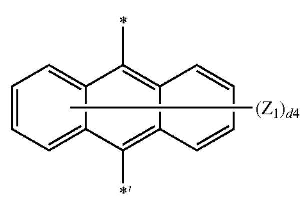

3-11

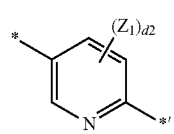

3-12

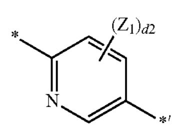

3-13

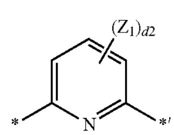

3-14

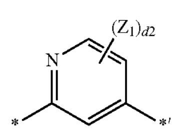

-continued
3-15
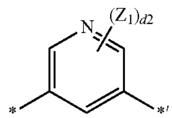
3-16
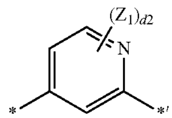
3-17
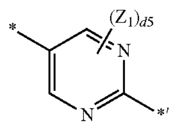
3-18
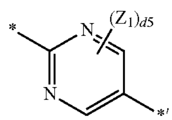
3-19
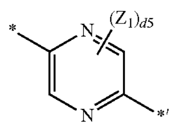
3-20
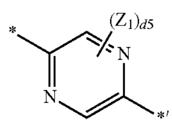
3-21
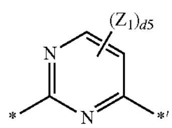
3-22
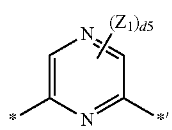
3-23
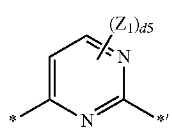
3-24
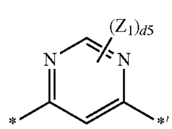
3-25
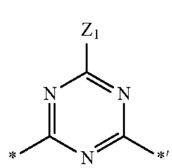
-continued
3-26
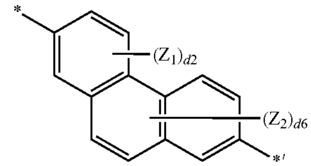
3-27
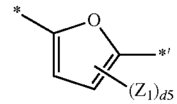
3-28
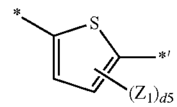
3-29
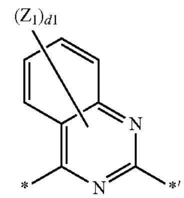
3-30
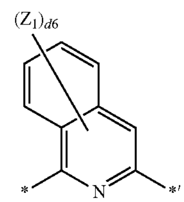
3-31
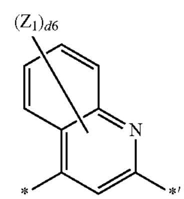
3-32
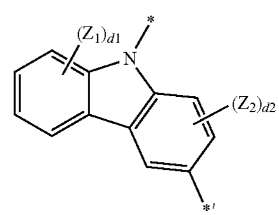
3-33
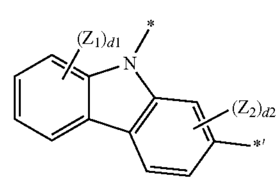
3-34
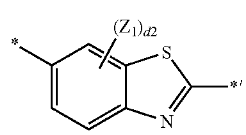
wherein, in Formulae 3-1 to 3-34,
$Y_{11}$ is selected from O, S, S(=O), $S(=O)_2$, $C(Z_3)(Z_4)$, $N(Z_5)$, and $Si(Z_6)(Z_7)$, $Z_1$ to $Z_7$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a biphenyl group, a terphenyl group, a naphthyl group, an anthracenyl group, a pyrenyl group, a phenanthrenyl group, a fluorenyl group, a carbazolyl group, a benzocarbazolyl group, a dibenzocarbazolyl group, and —$N(Q_{44})(Q_{45})$, and d1 is an integer selected from 1 to 4, d2 is an integer selected from 1 to 3, d3 is an integer selected from 1 to 6, d4 is an integer selected from 1 to 8, d5 is selected from 1 and 2, d6 is an integer selected from 1 to 5, and * and *' each indicate a binding site to a neighboring atom.

5. The organic light-emitting device of claim 1, wherein:

$Ar_{11}$, $Ar_{12}$, $Ar_{14}$, $Ar_{16}$, and $Ar_{21}$ to $Ar_{24}$ are each independently selected from the group consisting of:

a $C_1$-$C_{20}$ alkyl group, a $C_1$-$C_{20}$ alkoxy group;

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, an imidazopyrimidinyl group, —$Si(Q_1)(Q_2)(Q_3)$, —$N(Q_4)(Q_5)$; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, a dibenzosilolyl group, —$Si(Q_{41})(Q_{42})(Q_{43})$, and —$N(Q_{44})(Q_{45})$, wherein, when $A_{11}$ and $A_{13}$ are each a benzene, $Ar_{11}$ and $Ar_{12}$ are the same as described above, wherein $Q_1$ to $Q_5$ and $Q_{41}$ to $Q_{45}$ are each independently selected from the group consisting of:

a $C_1$-$C_{10}$ alkyl group, a $C_1$-$C_{10}$ alkoxy group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a carbazolyl group, a benzofuranyl group, a benzothiophenyl group, a dibenzofuranyl group, a dibenzothiophenyl group, a benzocarbazolyl group, a dibenzocarbazolyl group, a dibenzosilolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group, each substituted with at least one selected from deuterium, —F, —Cl, —Br, —I, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, and a naphthyl group, wherein $Ar_{11}$ and $Ar_{12}$ are not —$N(Q_4)(Q_5)$, and are not substituted with —$N(Q_4)(Q_5)$.

6. The organic light-emitting device of claim 1, wherein:

$Ar_{11}$, $Ar_{12}$, $Ar_{14}$, $Ar_{16}$ and $Ar_{21}$ to $Ar_{24}$ are each independently selected from the group consisting of:

a $C_1$-$C_{10}$ alkyl group, a $C_1$-$C_{10}$ alkoxy group;

—$Si(Q_1)(Q_2)(Q_3)$, —$N(Q_4)(Q_5)$; and groups represented by Formulae 5-1 to 5-49 and 7-1 to 7-10, wherein $Ar_{11}$ and $Ar_{12}$ are not —$N(Q_4)(Q_5)$, wherein, when $X_{12}$ is $N[(L_{12})_{a12}$-$Ar_{12}]$, and $A_{11}$ and $A_{13}$ are each a benzene, $Ar_{11}$ and $Ar_{12}$ are each independently selected from the group consisting of a $C_1$-$C_{10}$ alkoxy group, —$Si(Q_1)(Q_2)(Q_3)$, and groups represented by Formulae 5-9 to 5-24, 5-28 to 5-49, and 7-1 to 7-9, provided that when one of $Ar_{11}$ and $Ar_{12}$ is a group represented by one selected from Formulae 7-1 to 7-3, the other of $Ar_{11}$ and $Ar_{12}$ is a group represented by one selected from Formulae 5-9 to 5-49 and 7-4 to 7-9, and when $X_{12}$ is $C(Ar_{14})(Ar_{16})$, O, or S, and $A_{11}$ and $A_{13}$ are each a benzene or a naphthalene, $Ar_{11}$ and $Ar_{12}$ are each independently selected from the group consisting of a $C_1$-$C_{10}$ alkyl group, a $C_1$-$C_{10}$ alkoxy group, —$Si(Q_1)(Q_2)(Q_3)$, —$N(Q_4)(Q_5)$, and groups represented by Formulae 5-9 to 5-24, 5-28 to 5-49, 7-4 to 7-9:

5-1

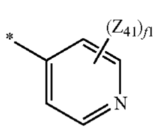

5-2

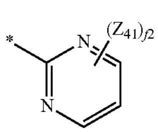

-continued 5-3

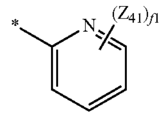

5-4

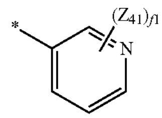

5-5

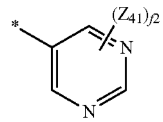

5-6

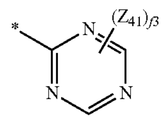

5-7

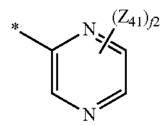

5-8

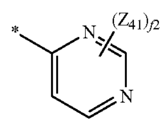

5-9

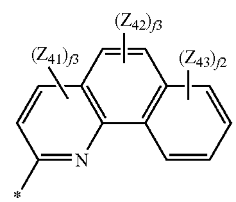

5-10

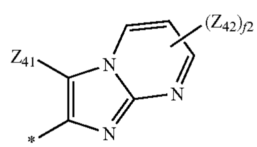

5-11

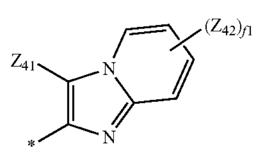

5-12

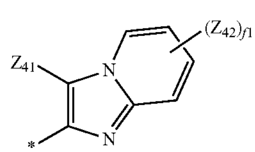

5-13

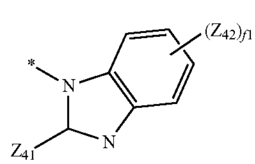

-continued
5-14
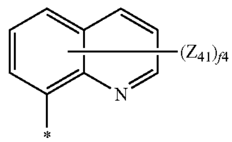
5-15
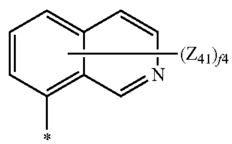
5-16
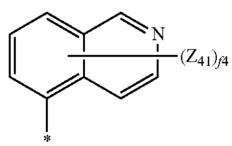
5-17
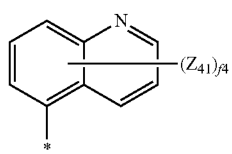
5-18
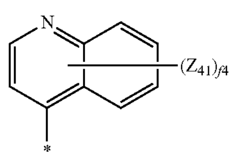
5-19
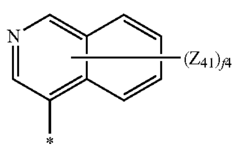
5-20
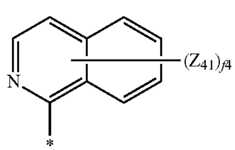
5-21
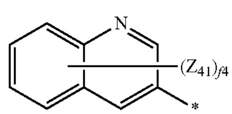
5-22
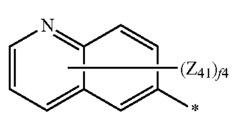
5-22
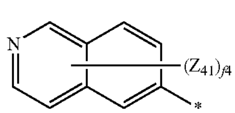
5-23
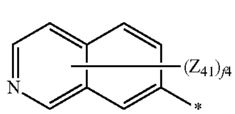
-continued
5-24
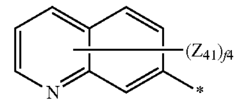
5-25
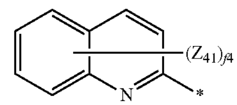
5-26
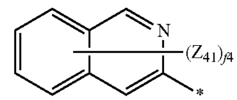
5-27
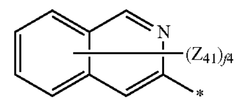
5-28
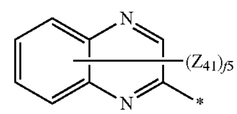
5-29
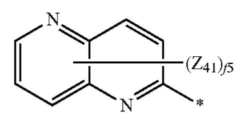
5-30
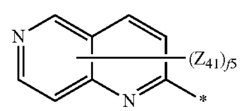
5-31
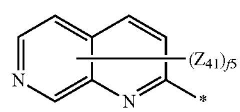
5-32
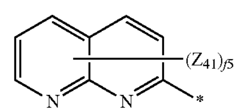
5-33
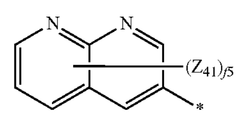
5-34
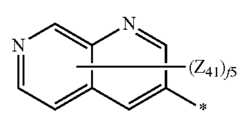
5-35
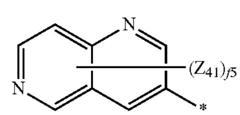
5-36
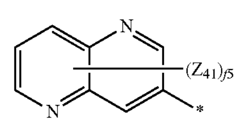
5-37
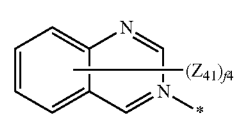

-continued
5-38
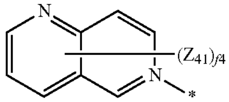
5-39
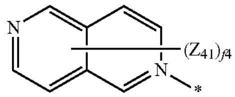
5-40
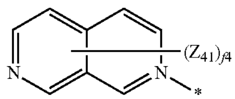
5-41
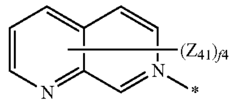
5-42
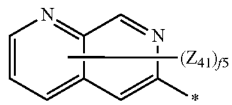
5-43
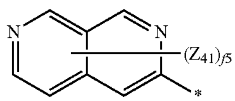
5-44
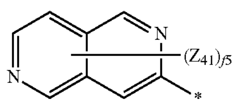
5-45
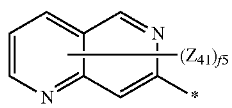
5-46
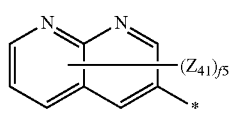
5-47
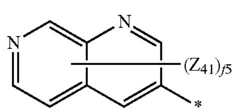
5-48
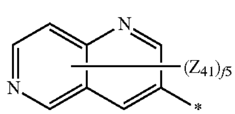
5-49
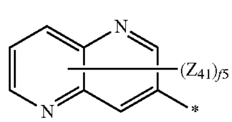
7-1
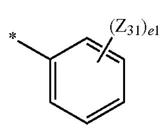
7-2
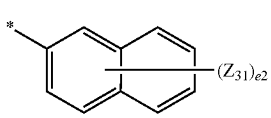
-continued
7-3
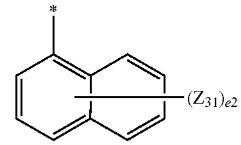
7-4
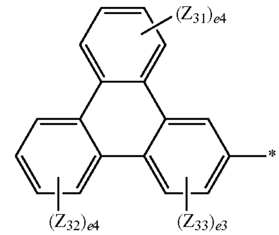
7-5
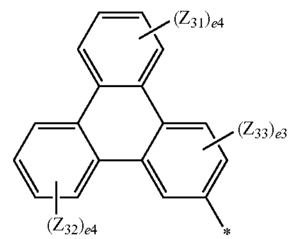
7-6
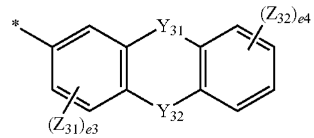
7-7
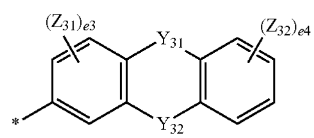
7-8
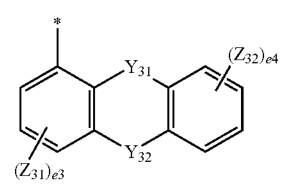
7-9
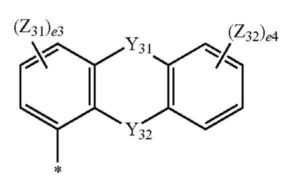
7-10
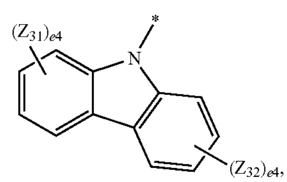
wherein, in Formulae 5-1 to 5-29, $Z_{41}$ to $Z_{43}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, —Si($Q_{41}$)($Q_{42}$)($Q_{43}$), —N($Q_{44}$)($Q_{45}$);

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group and an imidazopyrimidinyl group, f1 is an integer selected from 1 to 4, f2 is an integer selected from 1 to 3, f3 is an integer selected from 1 and 2, f4 is an integer selected from 1 to 6, and f5 is an integer selected from 1 to 5;

in Formulae 7-1 to 7-10, $Y_{31}$ and $Y_{32}$ are each independently selected from a single bond, O, S, C($Z_{34}$)($Z_{35}$), N($Z_{36}$), and Si($Z_{37}$)($Z_{38}$), provided that $Y_{31}$ and $Y_{32}$ are not both single bonds;

$Z_{31}$ to $Z_{38}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, —Si($Q_{41}$)($Q_{42}$)($Q_{43}$), —N($Q_{44}$)($Q_{45}$);

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a carbazolyl group, a benzofuranyl group, a benzothiophenyl group, a dibenzofuranyl group, and a dibenzothiophenyl group, e1 is an integer selected from 1 to 5, e2 is an integer selected from 1 to 7, e3 is an integer selected from 1 to 3, e4 is an integer selected from 1 to 4, and * and *' each indicate a binding site to a neighboring atom, wherein $Q_1$ to $Q_5$ and $Q_{41}$ to $Q_{45}$ are each independently selected from the group consisting of:

a $C_1$-$C_{10}$ alkyl group, a $C_1$-$C_{10}$ alkoxy group;

a phenyl group, a biphenyl group, a terphenyl group, a naphthyl group, a carbazolyl group; and a phenyl group, a biphenyl group, a terphenyl group, a naphthyl group, and a carbazolyl group, each substituted with at least one selected from a $C_1$-$C_{10}$ alkyl group, a $C_1$-$C_{10}$ alkoxy group, a phenyl group, a biphenyl group, a terphenyl group, and a naphthyl group.

7. The organic light-emitting device of claim 1, wherein:

$R_{11}$ to $R_{13}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, an indolyl group, a pyridinyl group, a pyrazinyl group, a pyrimidinyl group, a pyridazinyl group, a quinoxalinyl group, a carbazolyl group, a triazinyl group, a dibenzofuranyl group, a dibenzothiophenyl group, a benzocarbazolyl group, a dibenzocarbazolyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, an indolyl group, a pyridinyl group, a pyrazinyl group, a pyrimidinyl group, a pyridazinyl group, a quinoxalinyl group, a carbazolyl group, a triazinyl group, a dibenzofuranyl group, a dibenzothiophenyl group, a benzocarbazolyl group, and a dibenzocarbazolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, and a naphthyl group; and —Si($Q_{11}$)($Q_{12}$)($Q_{13}$) and —N($Q_{14}$)($Q_{15}$), $R_{21}$ to $R_{24}$ are each independently selected from the group consisting of:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, an indolyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, a benzocarbazolyl group, a dibenzocarbazolyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, an indolyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, a benzocarbazolyl group, and a dibenzocarbazolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, and a naphthyl group; and —$Si(Q_{11})(Q_{12})(Q_{13})$ and —$N(Q_{14})(Q_{15})$, wherein $Q_{11}$ to $Q_{15}$ are each independently selected from a $C_1$-$C_{10}$ alkyl group, a $C_1$-$C_{10}$ alkoxy group, a phenyl group, a biphenyl group, a terphenyl group, and a naphthyl group.

8. The organic light-emitting device of claim 1, wherein: the second compound is represented by Formula 2-1:

Formula 2-1

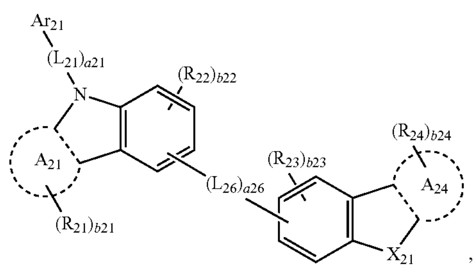

wherein, in Formula 2-1, $A_{21}$, $A_{24}$, $X_{21}$, $L_{21}$, $L_{26}$, a21, a26, $Ar_{21}$, $R_{21}$ to $R_{24}$, b21, and b24 are each the same as described above, and b22 and b23 are each independently an integer selected from 0 to 3.

9. The organic light-emitting device of claim 1, wherein: the second compound is represented by one selected from Formulae 2-11 to 2-15:

Formula 2-11

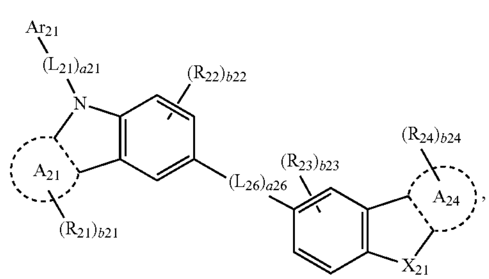

Formula 2-12

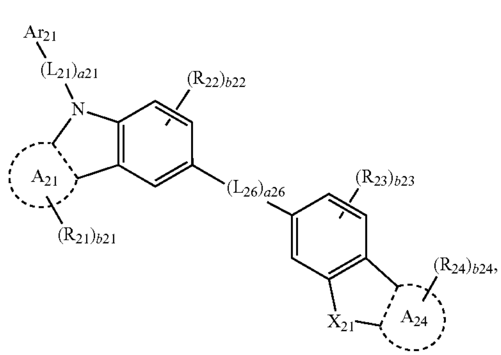

-continued

Formula 2-13

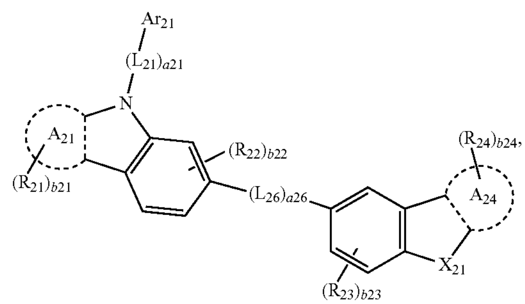

Formula 2-14

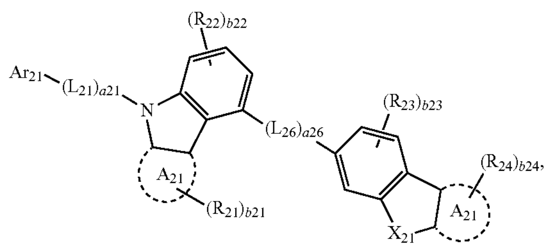

Formula 2-15

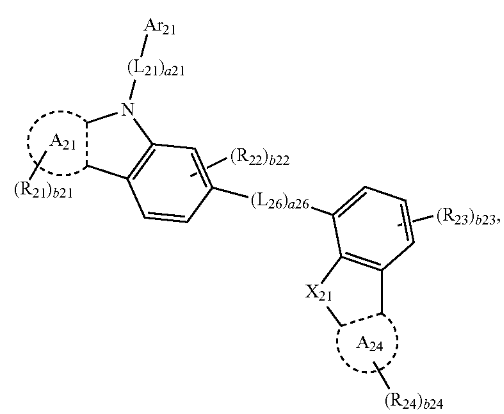

wherein, in Formulae 2-11 to 2-15, $X_{21}$, $L_{21}$, $L_{26}$, a21, a26, $Ar_{21}$, $R_{21}$ to $R_{24}$, b21, and b24 are each the same as described above, and b22 and b23 are each independently an integer selected from 0 to 3.

10. The organic light-emitting device of claim 1, wherein: the second compound is selected from Compounds 101A-212A and 101B-230B:

101A
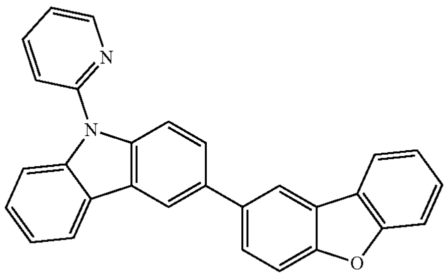
102A
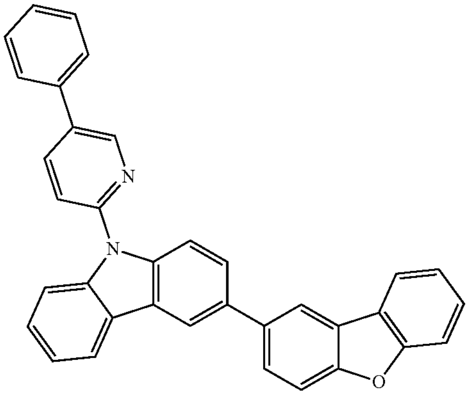
103A
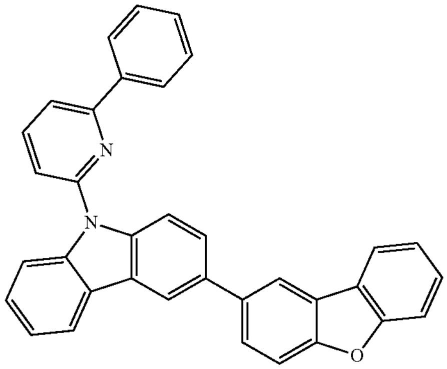
104A
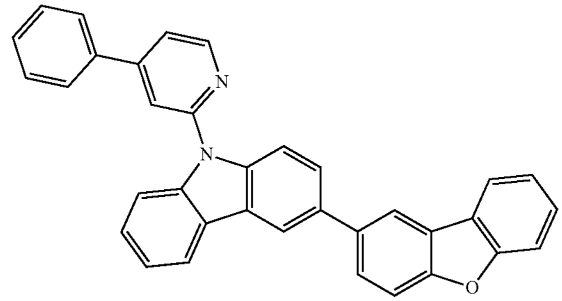
105A
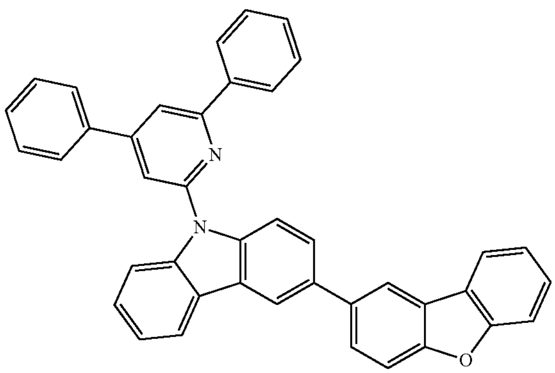
106A
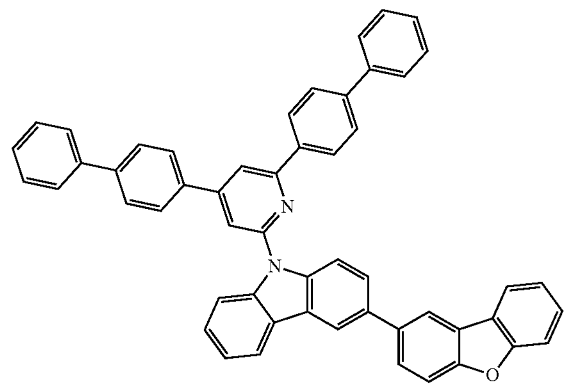
107A
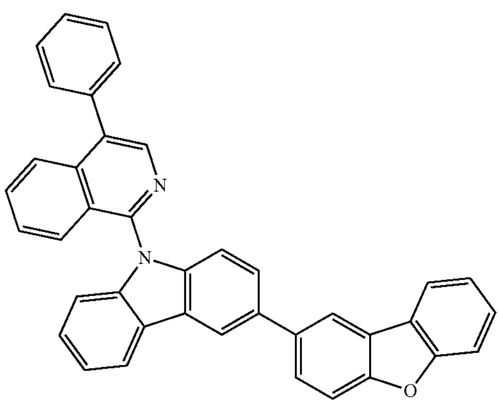
108A
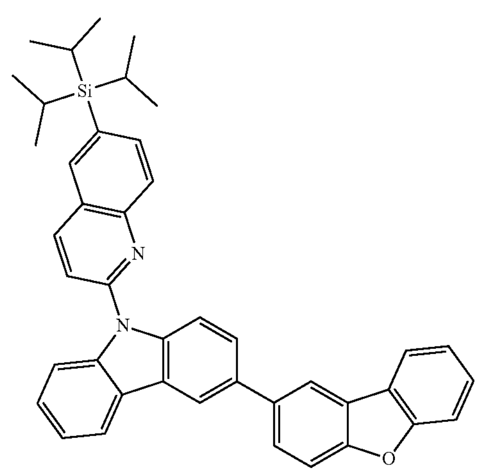

-continued
109A
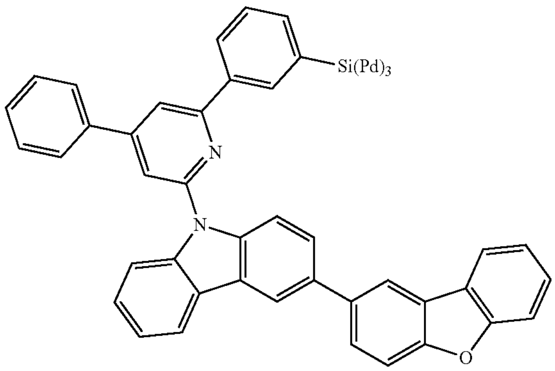
110A
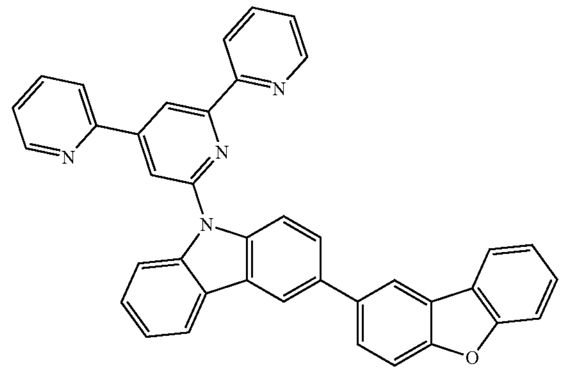
111A
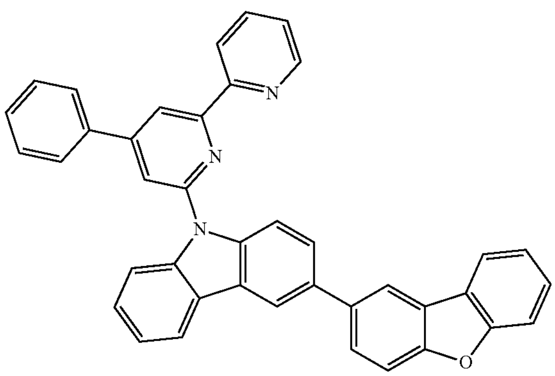
112A
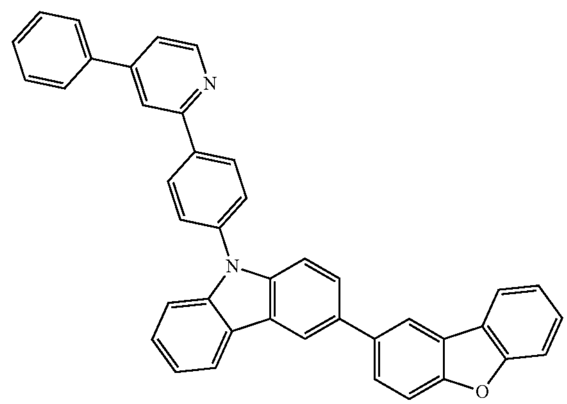
113A
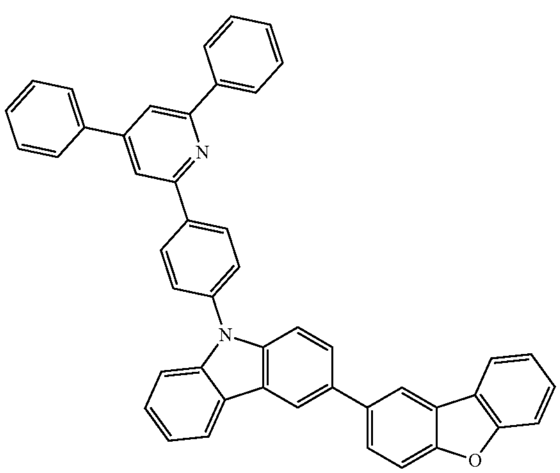
114A
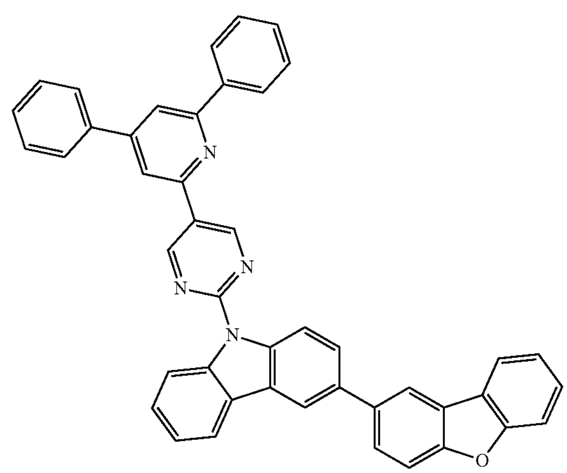

-continued
115A
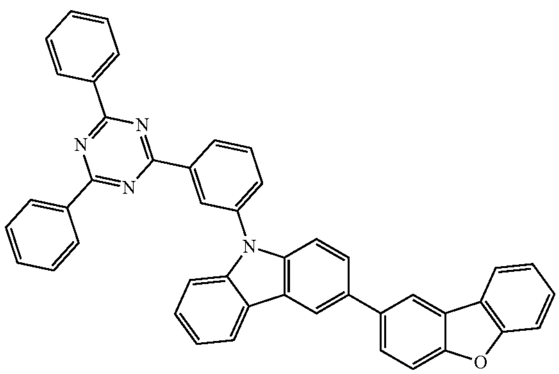
116A
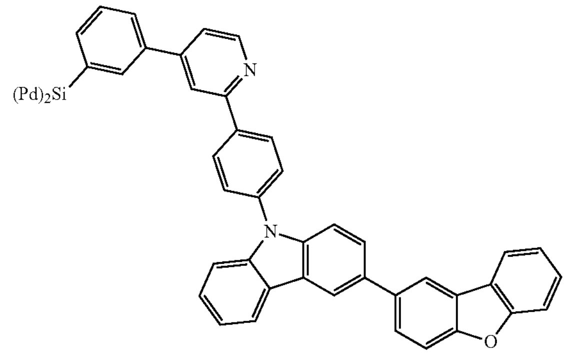
133A
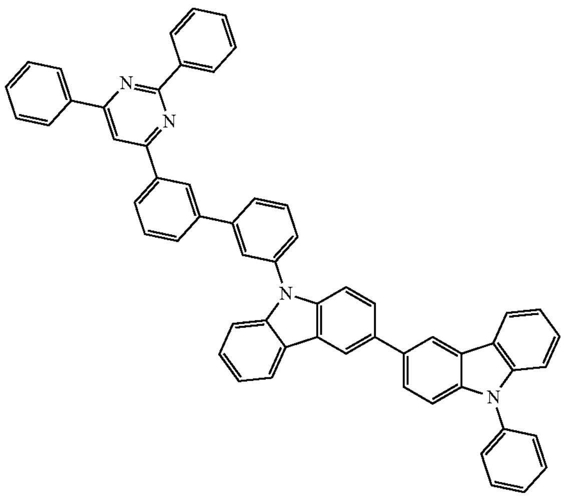
134A
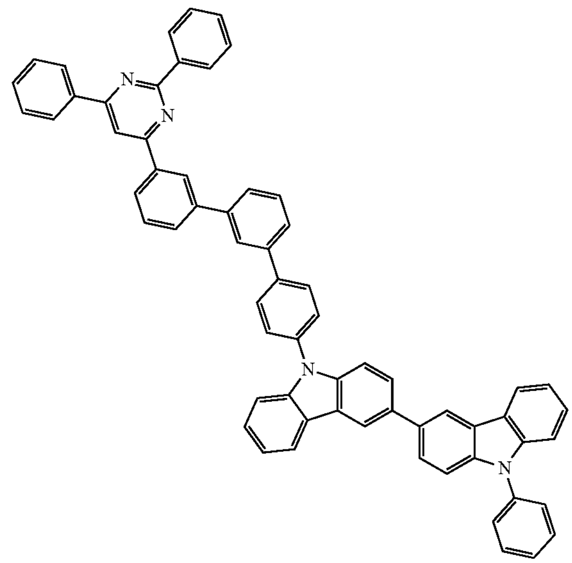
135A
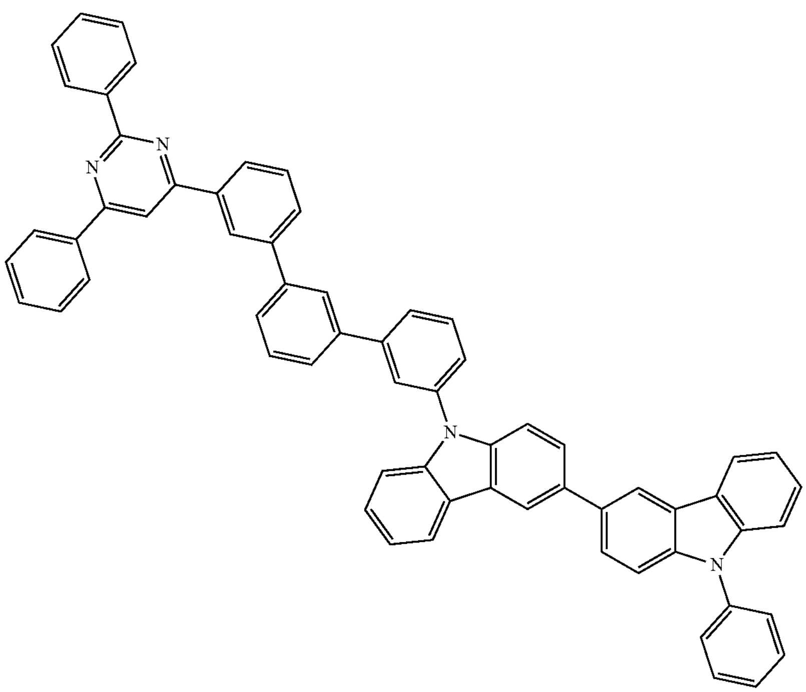

-continued
136A
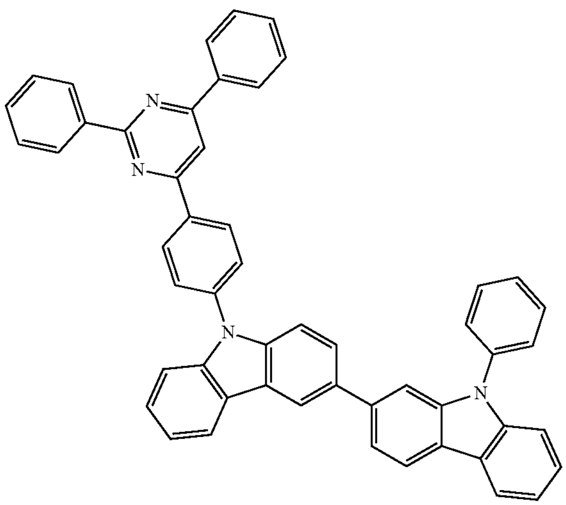
137A
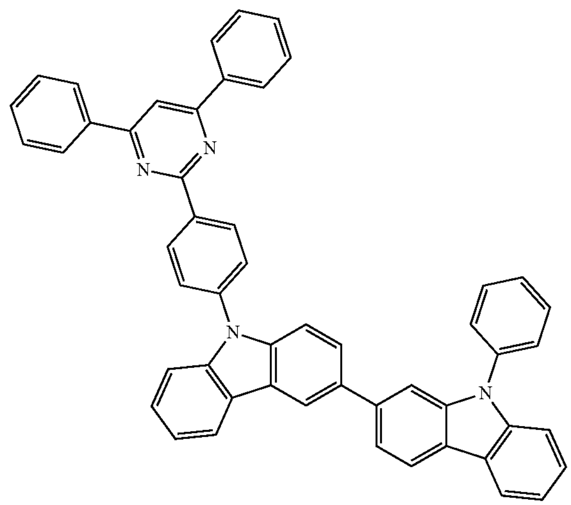
138A
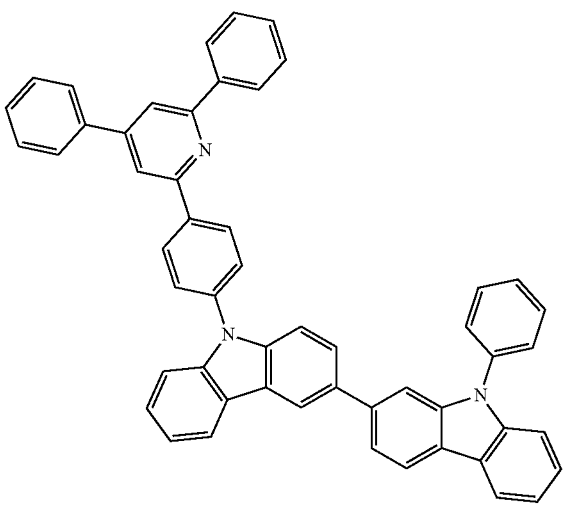
139A
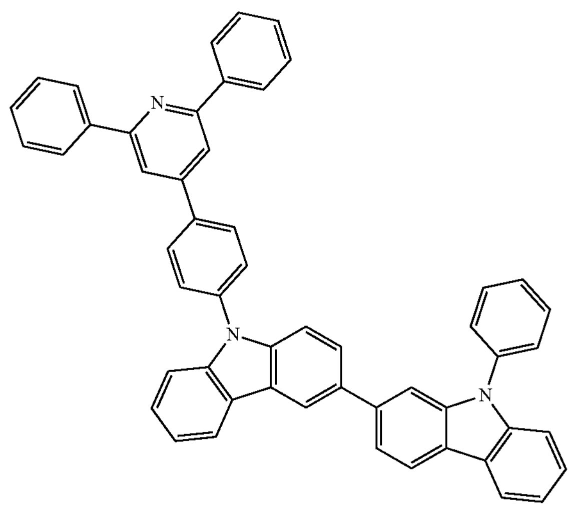
140A
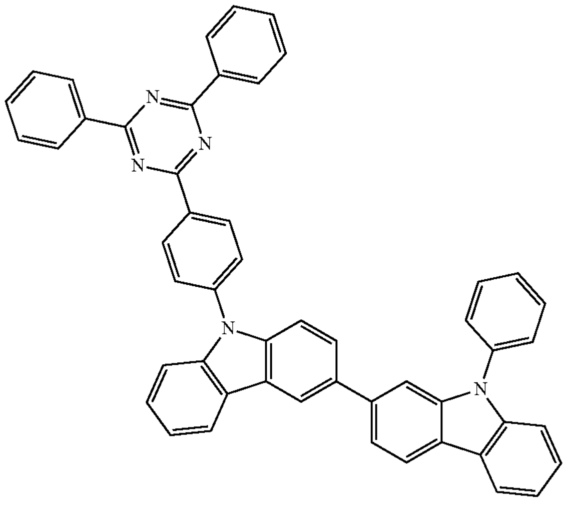
141A
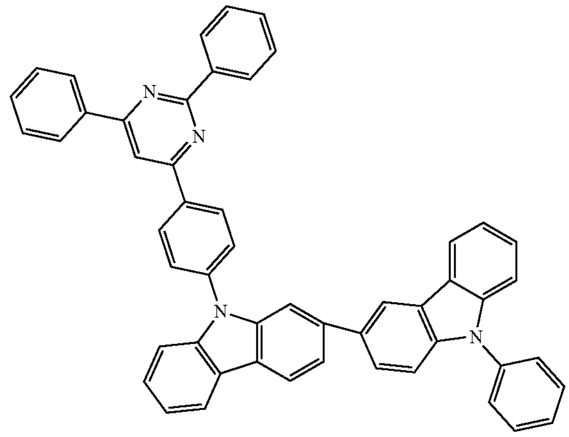

-continued
142A
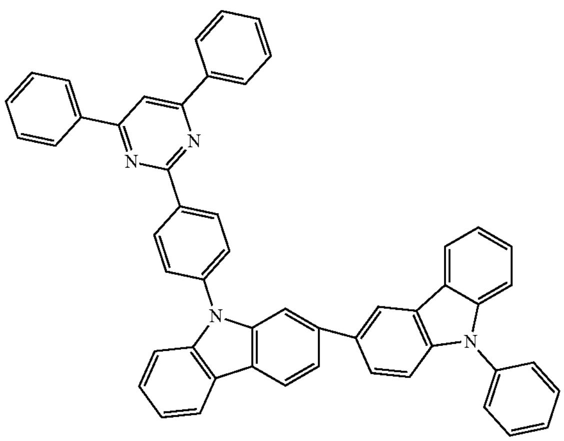
143A
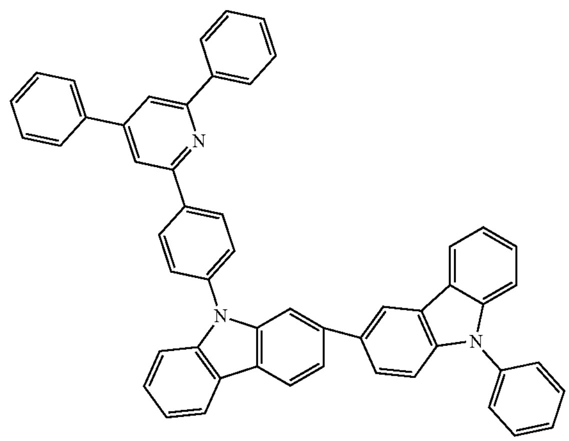
144A
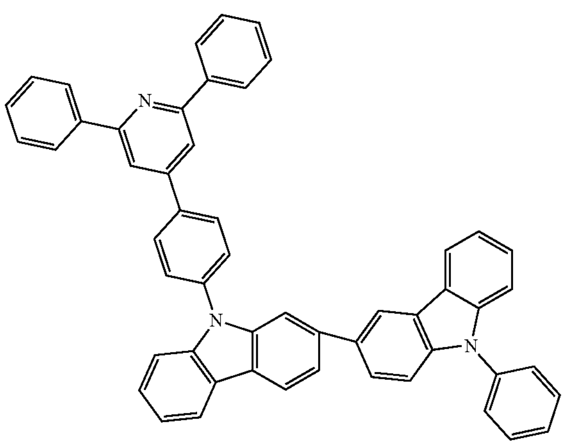
145A
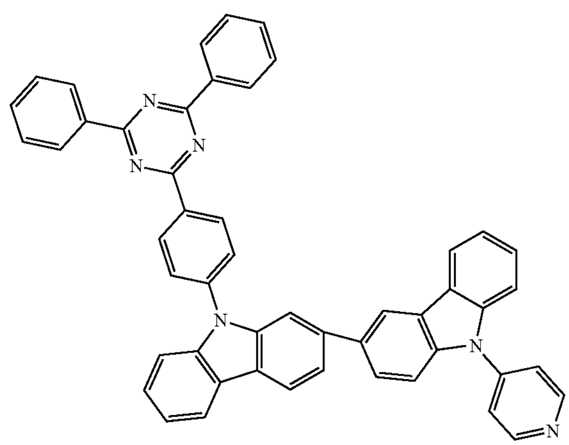
146A
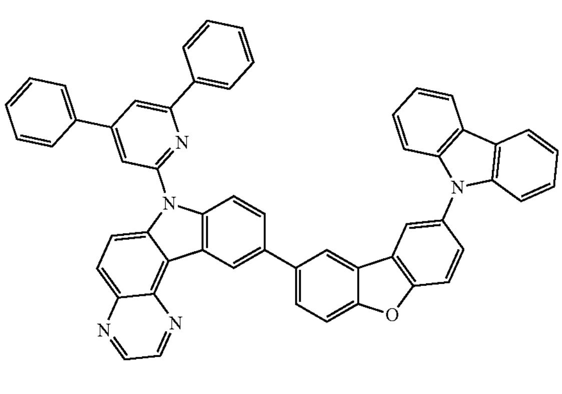
147A
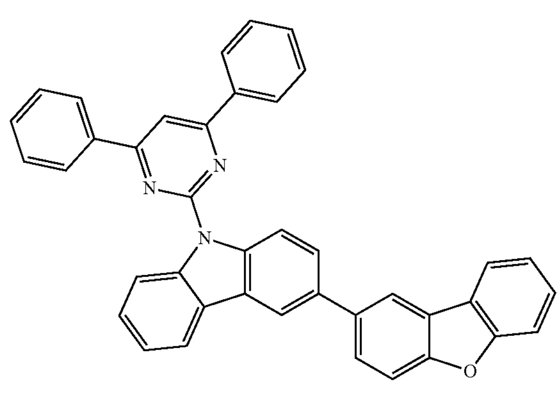

-continued
148A
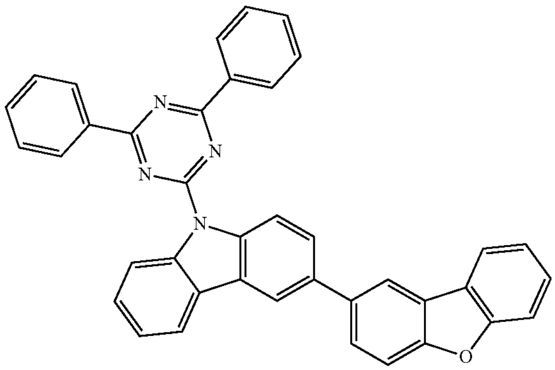
149A
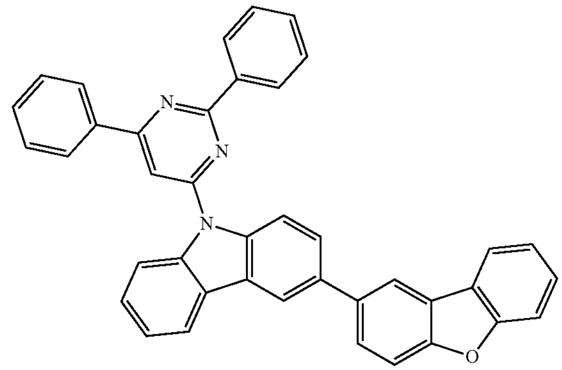
150A
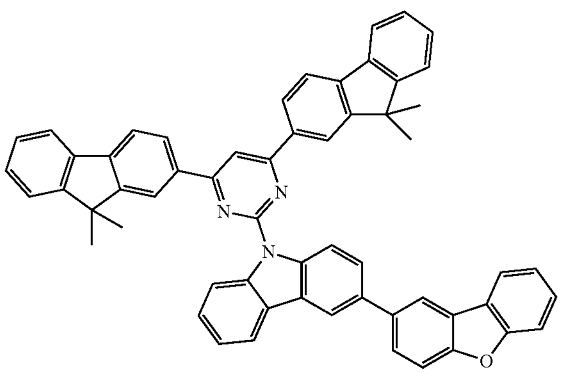
151A
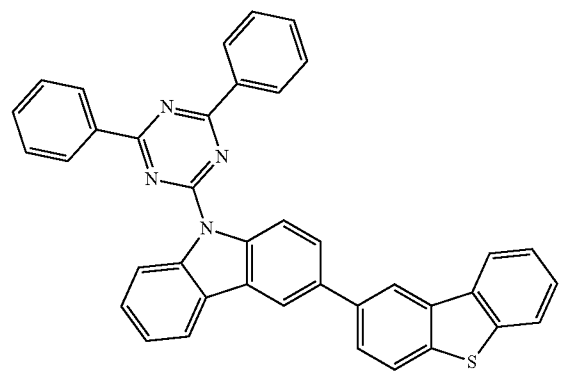
152A
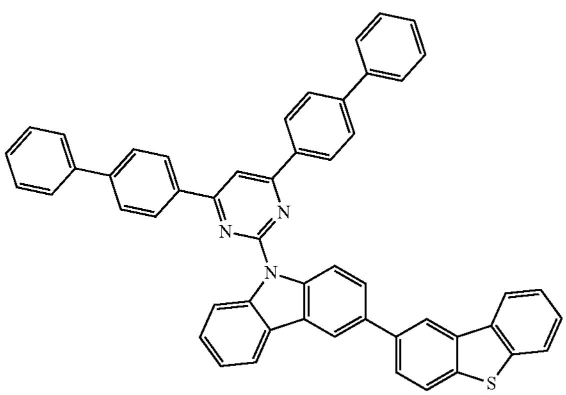
153A
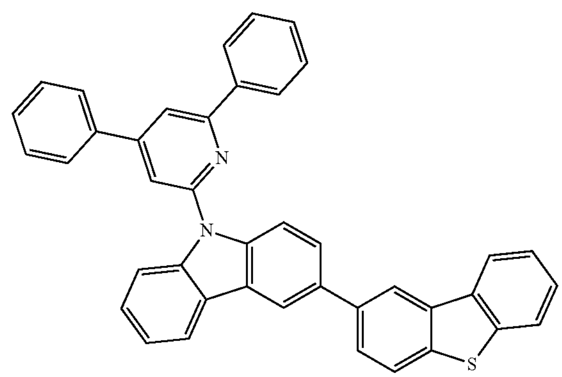
154A
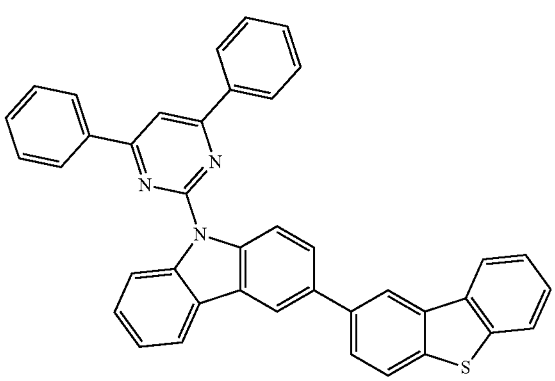
155A
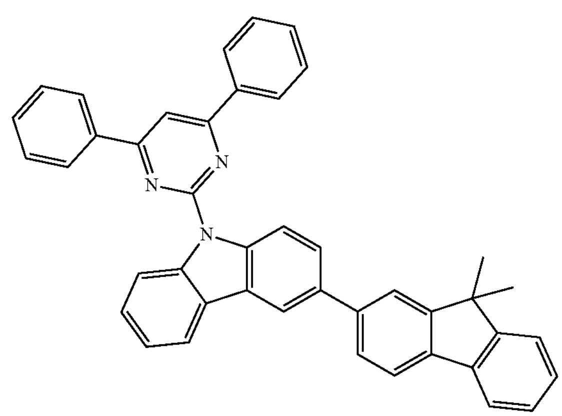

-continued
156A
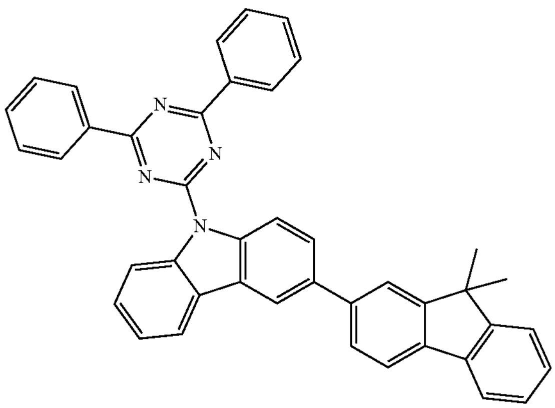
157A
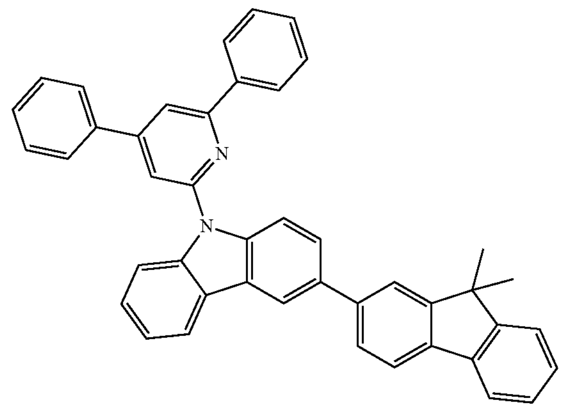
158A
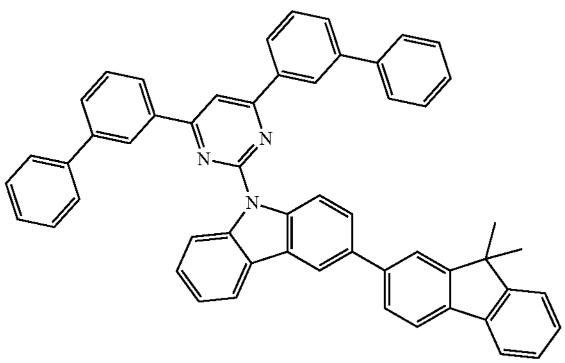
159A
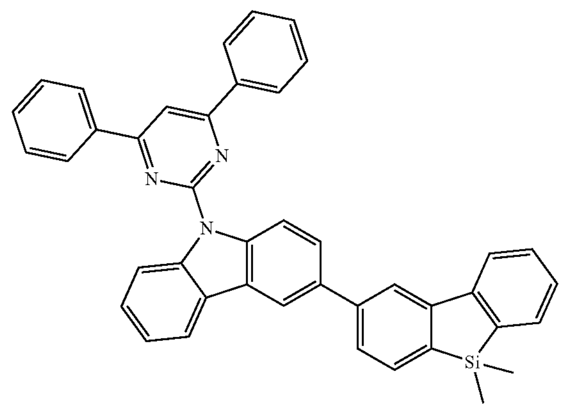
160A
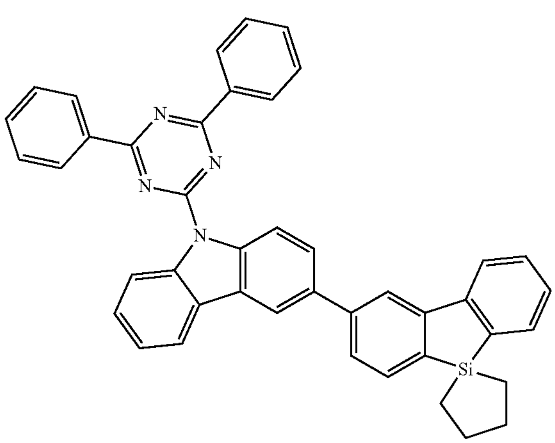
161A
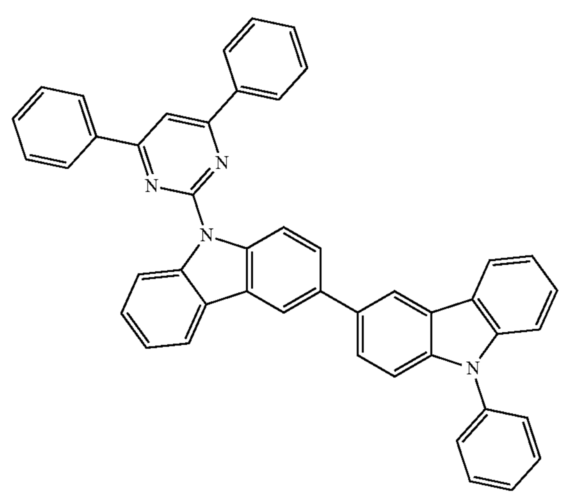

-continued
162A
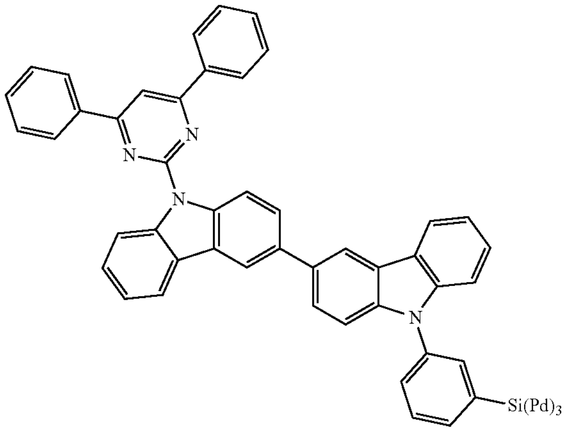
163A
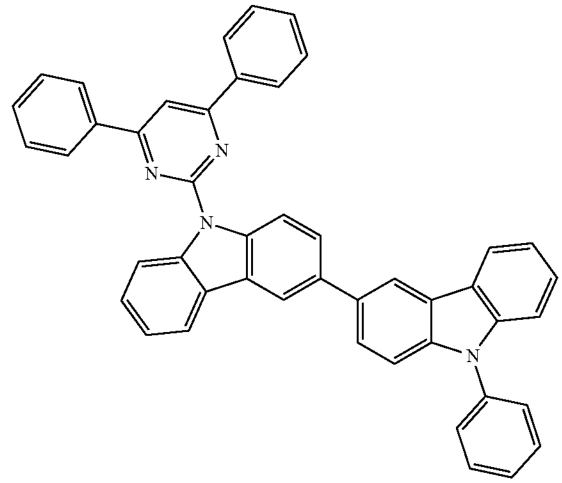
164A
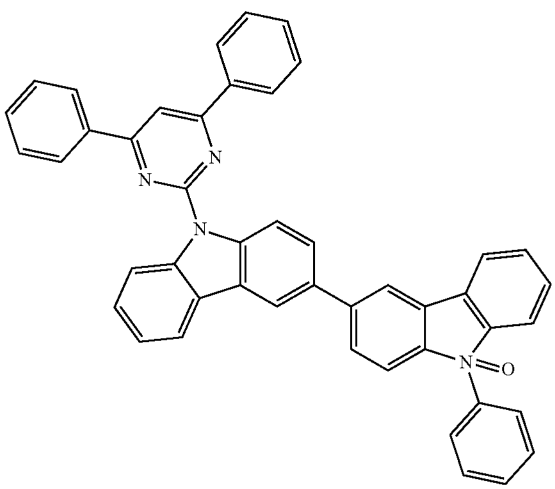
165A
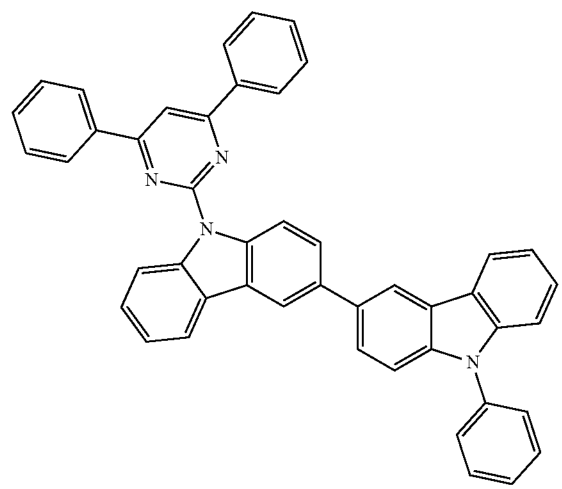
166A
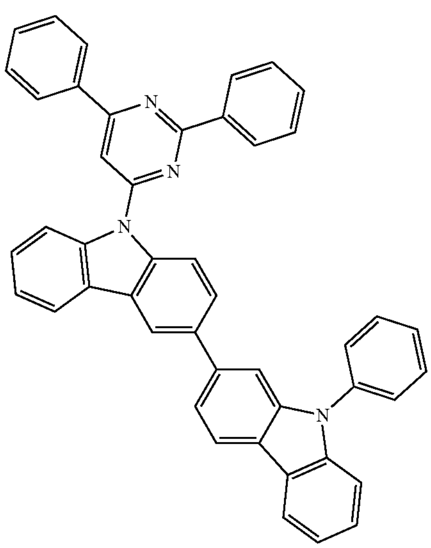
167A
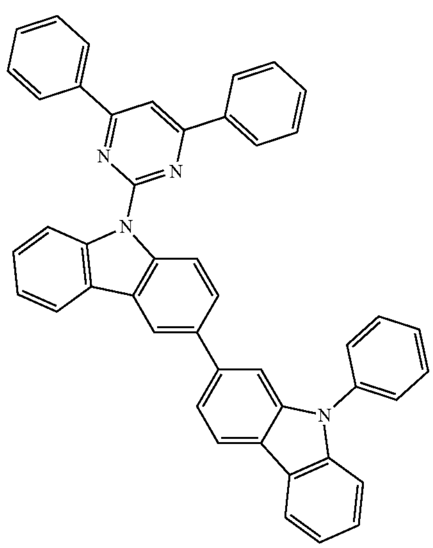

-continued
168A
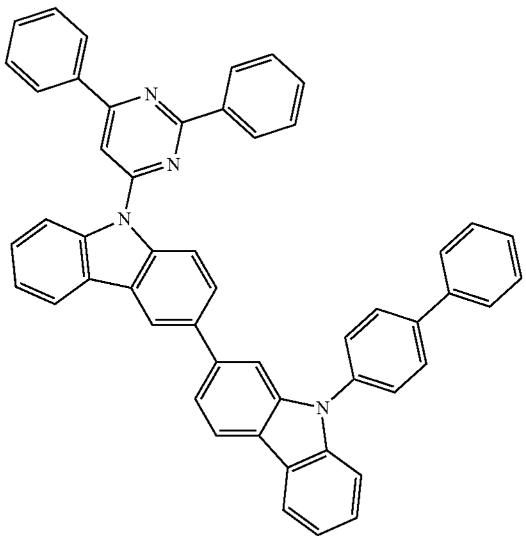
169A
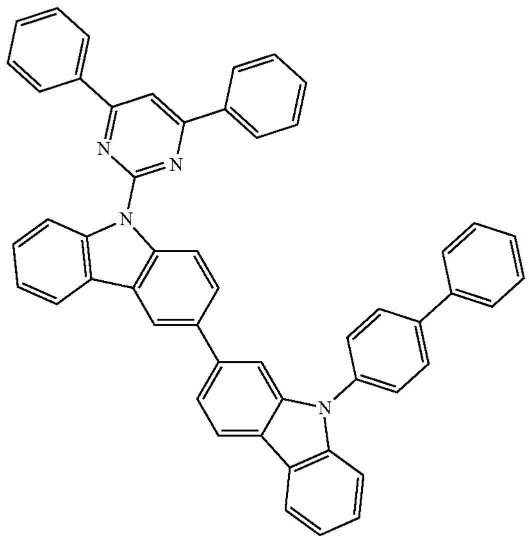
170A
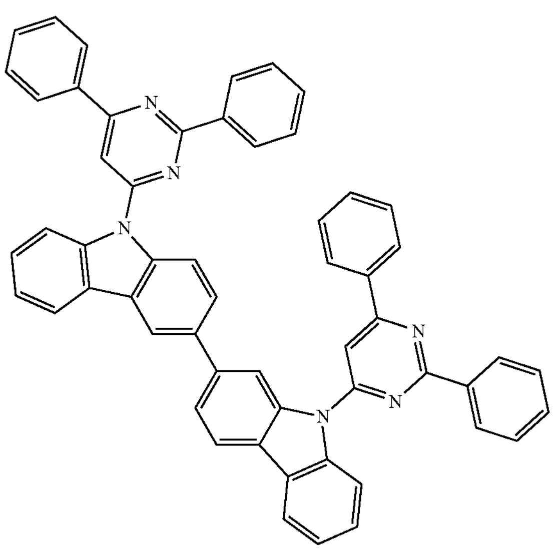
171A
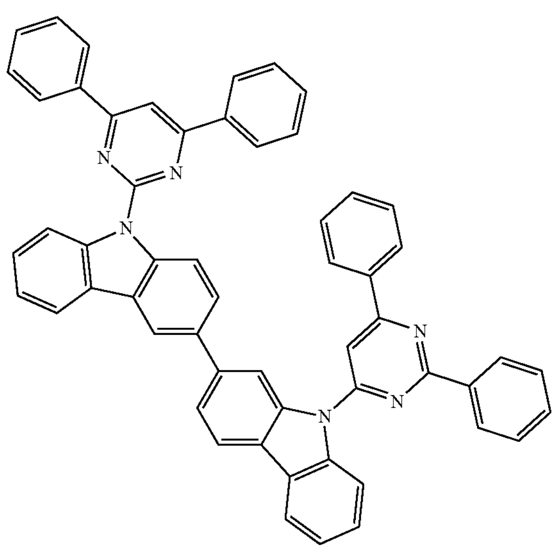

-continued
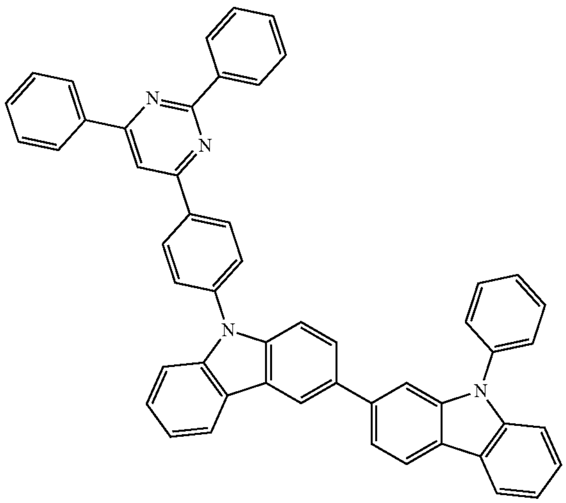
172A
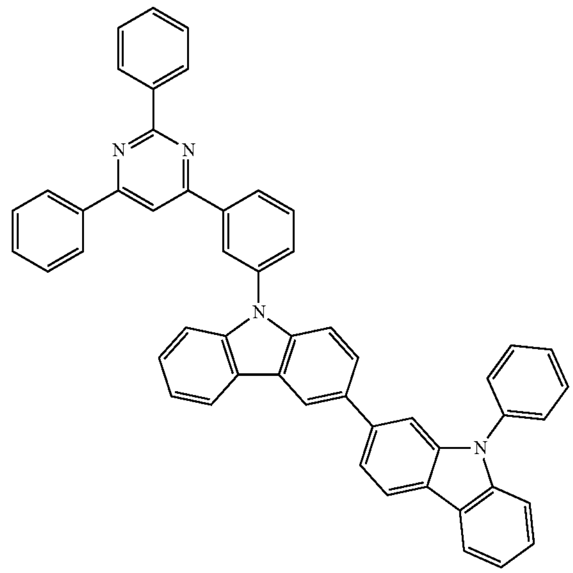
173A
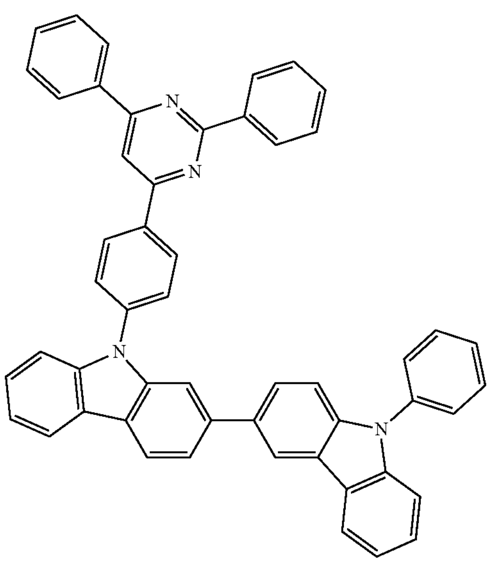
174A
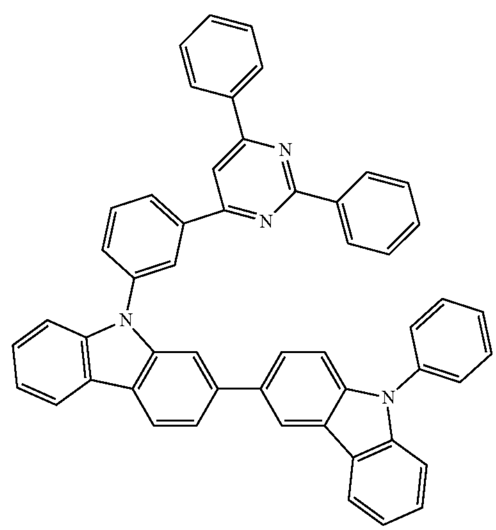
175A -continued
176A
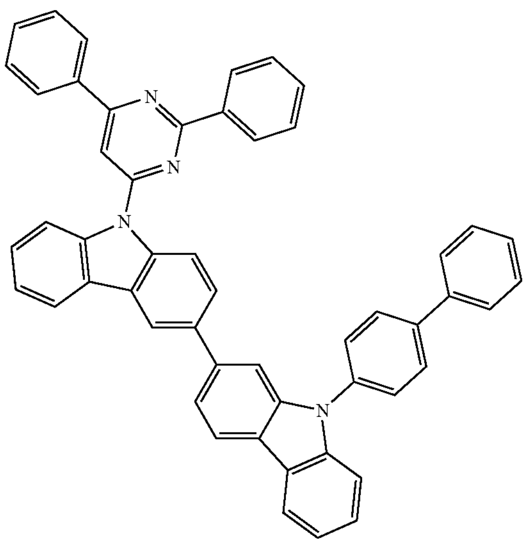
177A
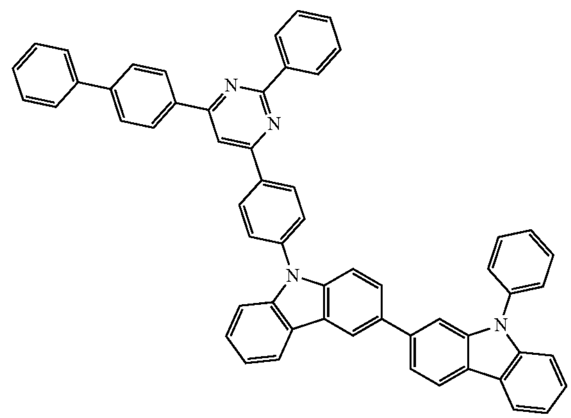
178A
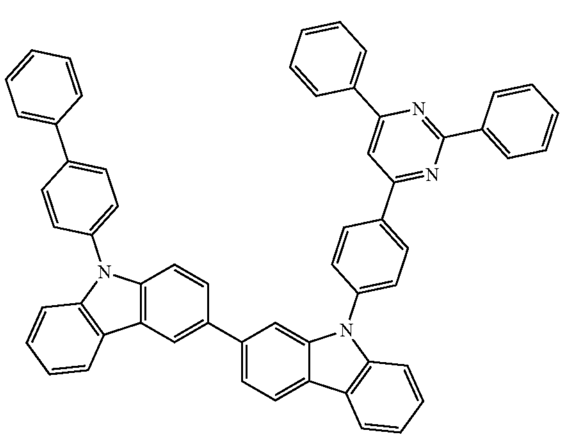
179A
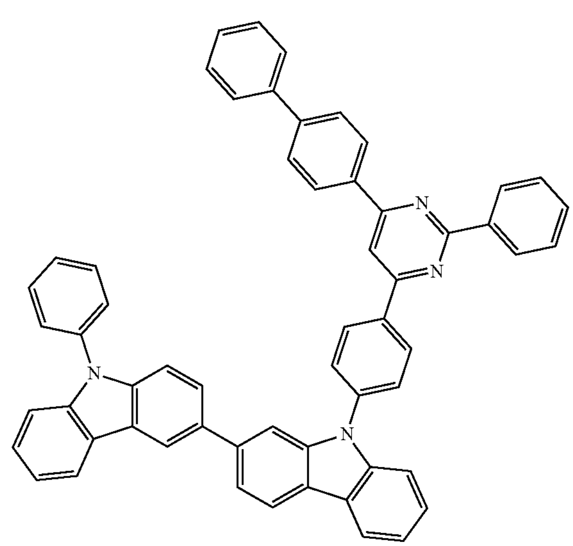

-continued
180A
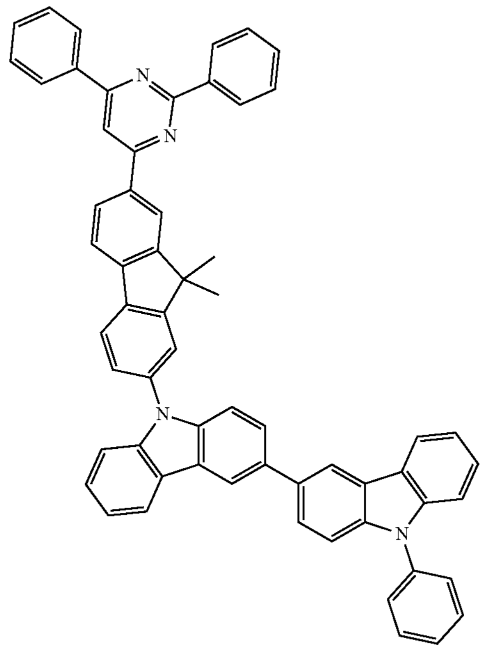
181A
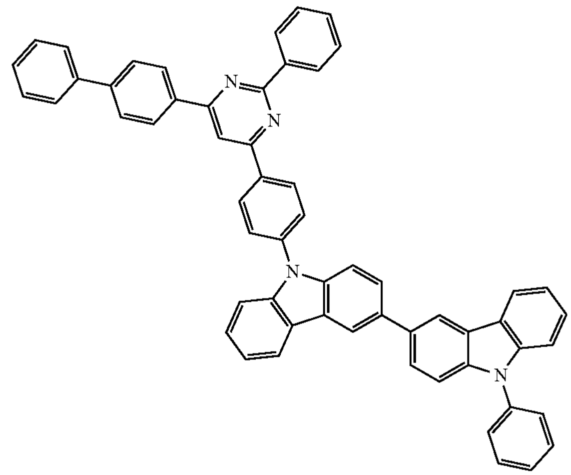
182A
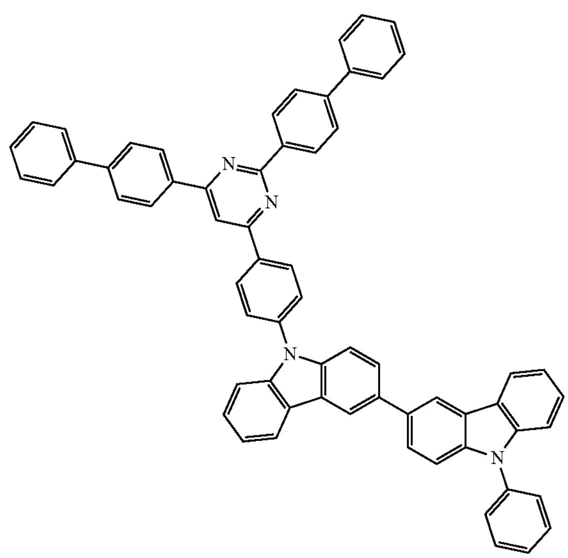
183A
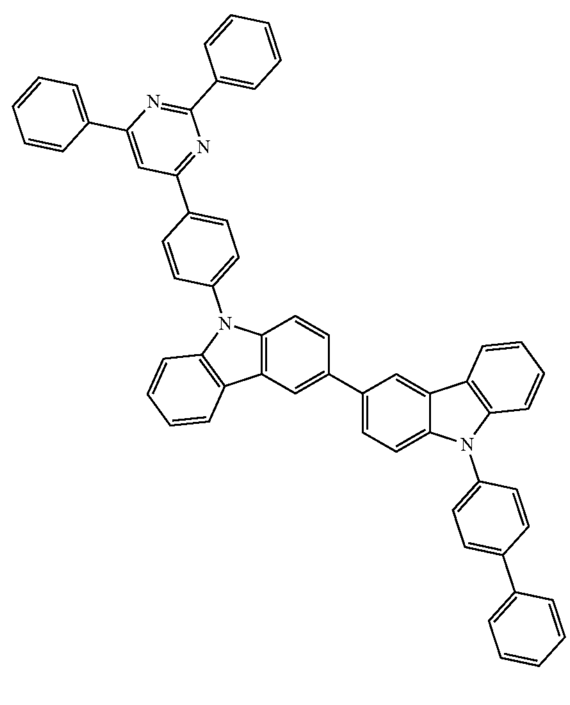

-continued
184A
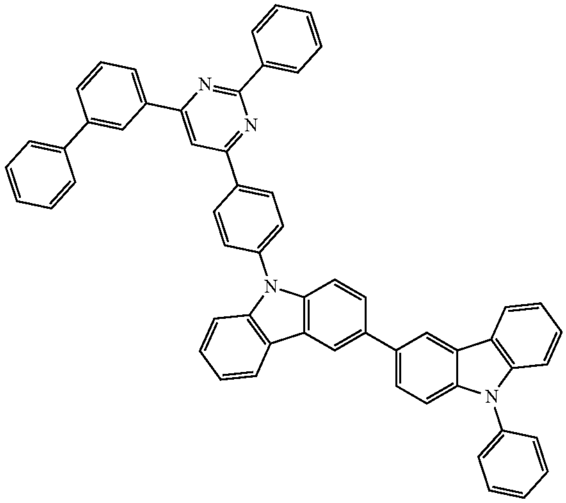
185A
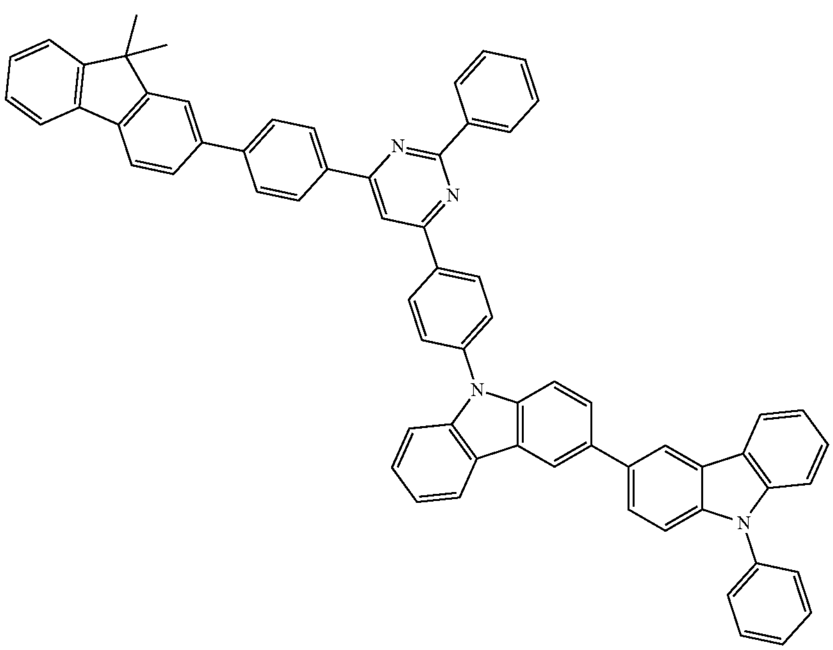

-continued
186A
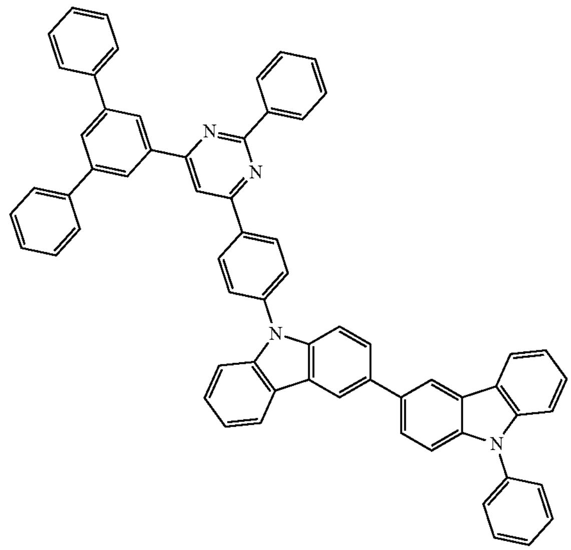
187A
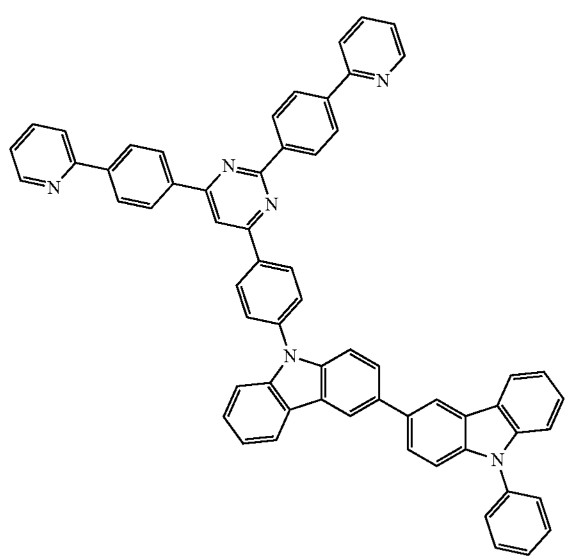

-continued
188A
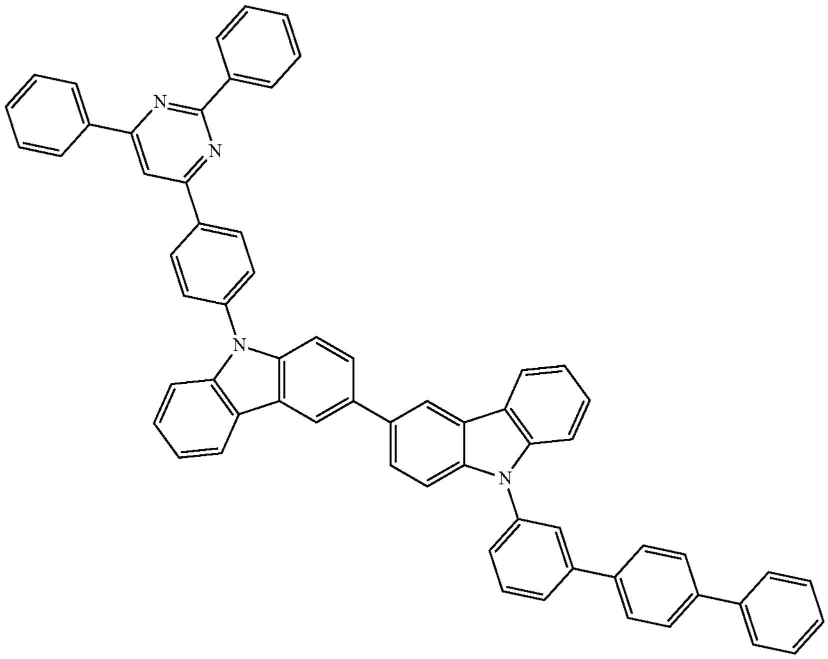
189A
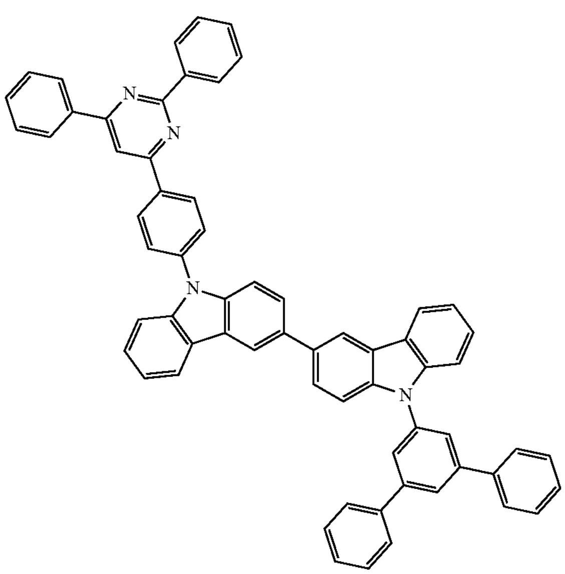
190A
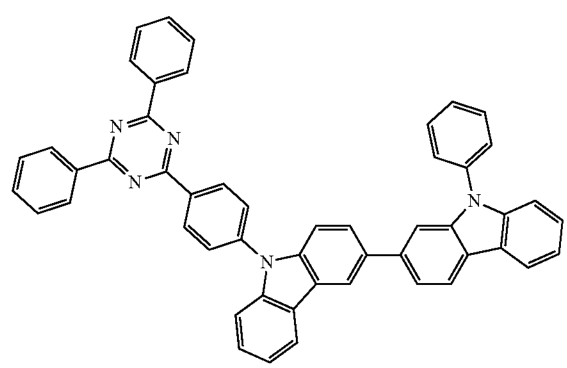

-continued
191A
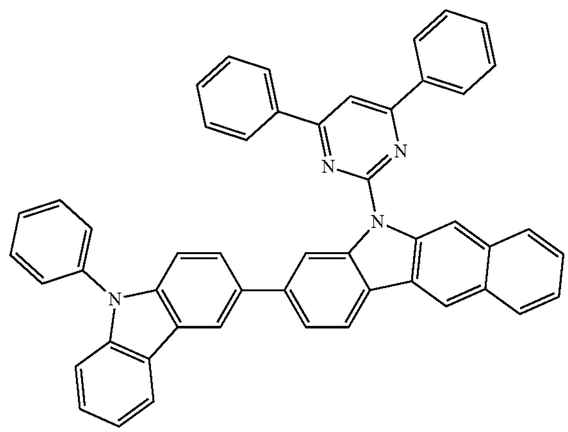
192A
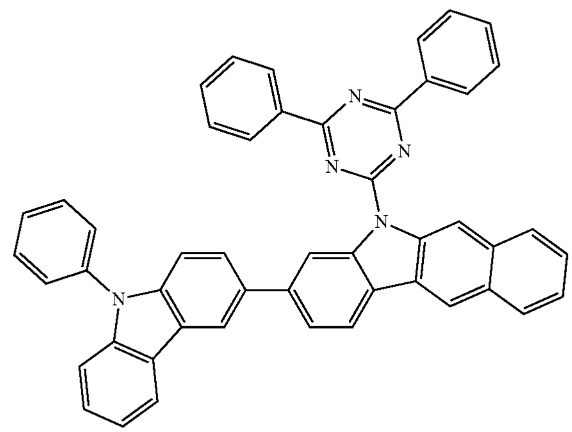
193A
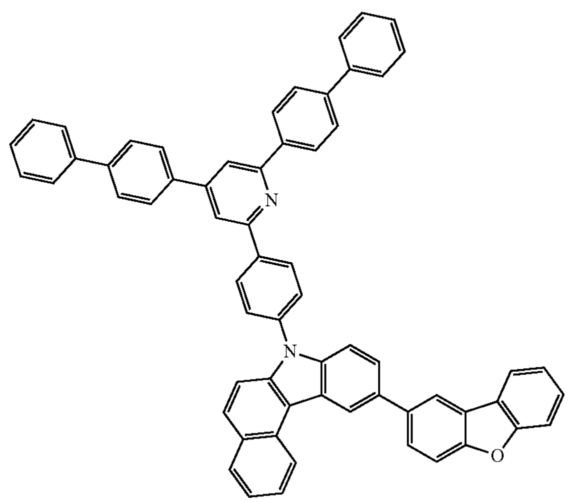
194A
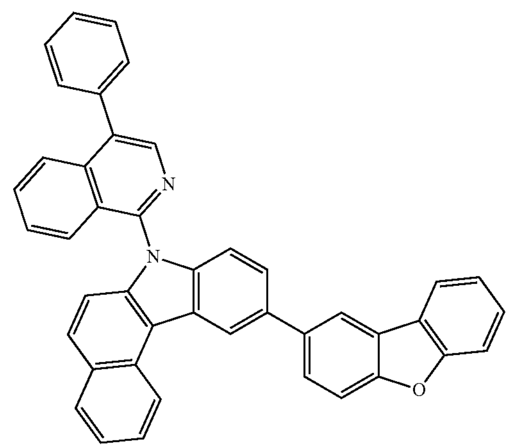
195A
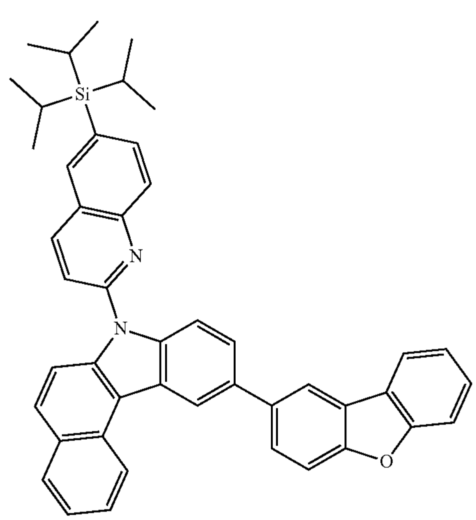
196A
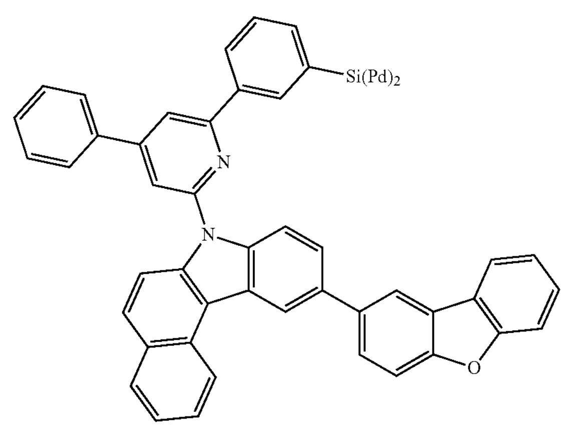

-continued
197A
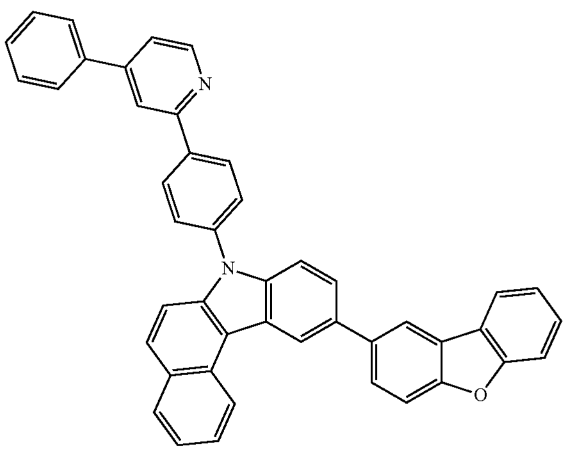
198A
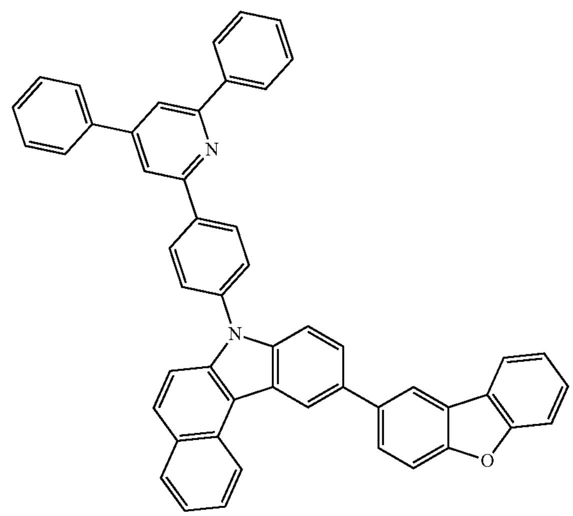
199A
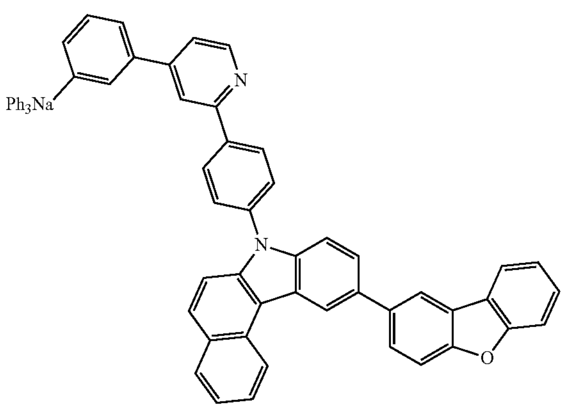
200A
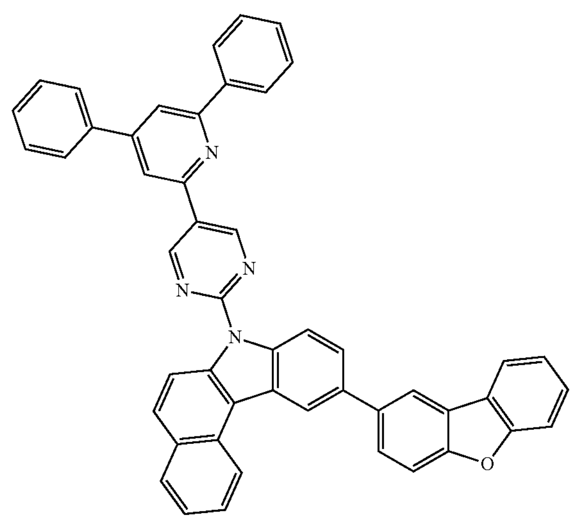
201A
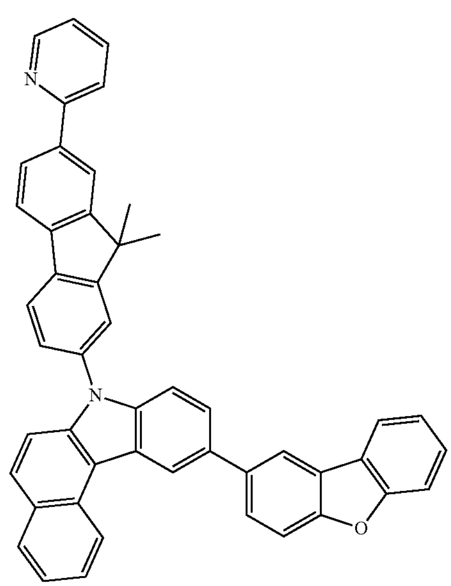
202A
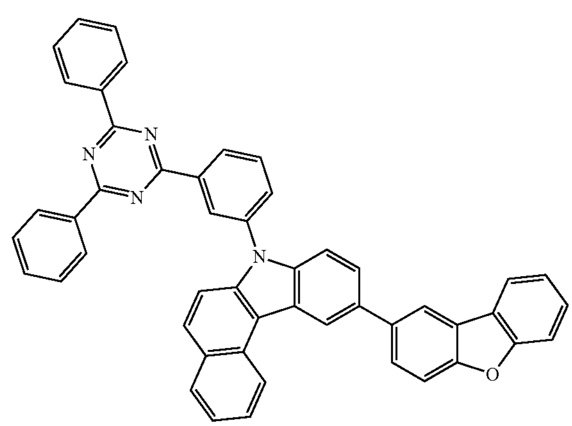

-continued
203A
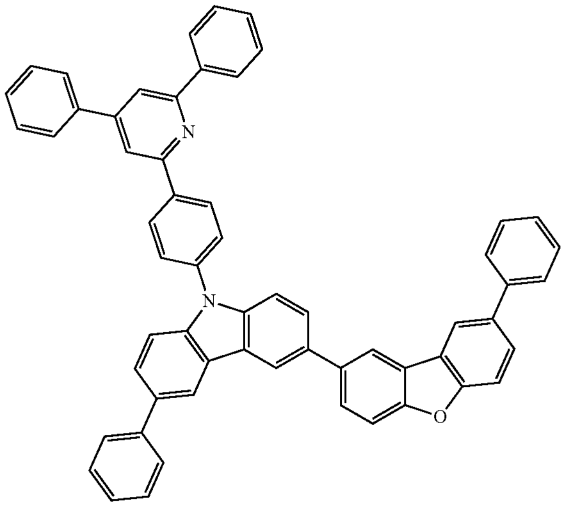
204A
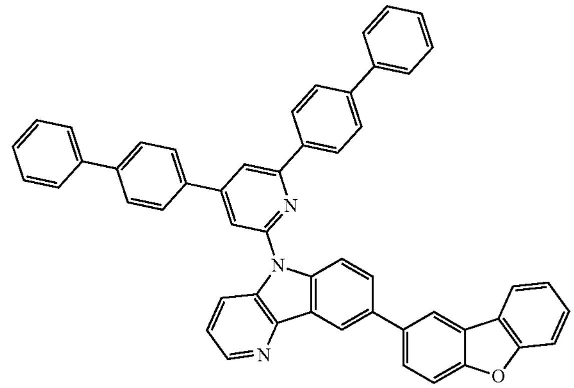
205A
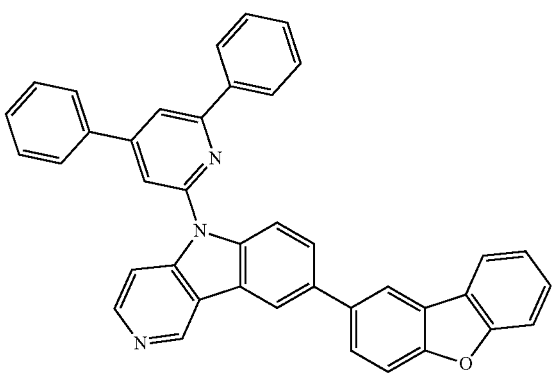
206A
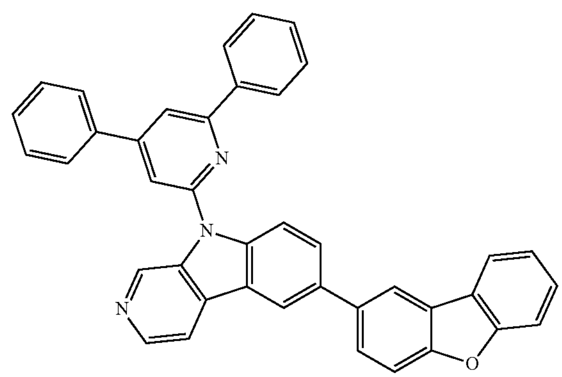
207A
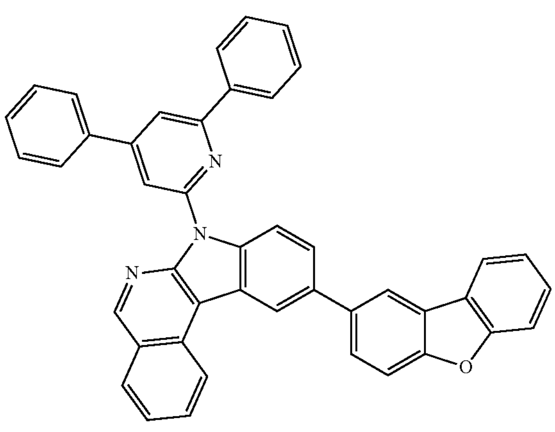
208A
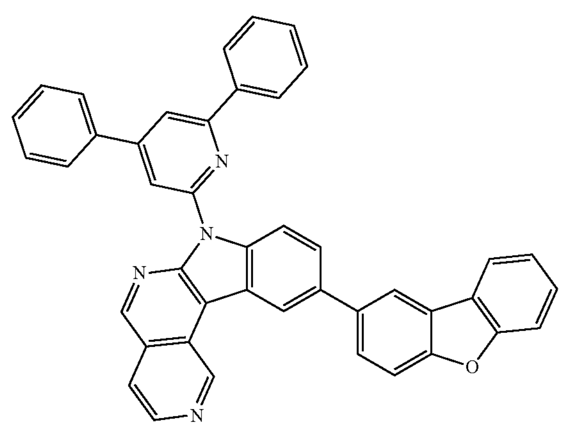

-continued
209A
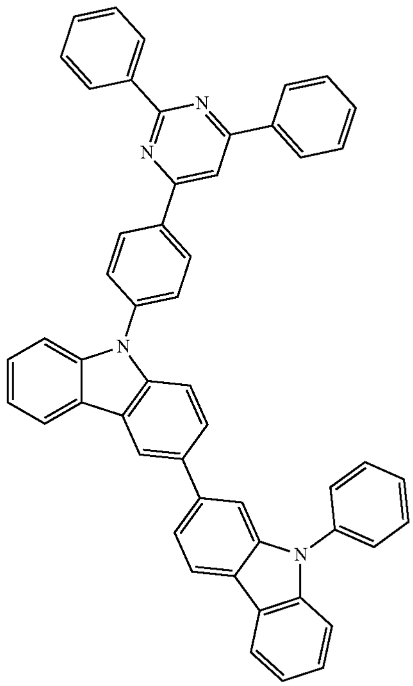
210A
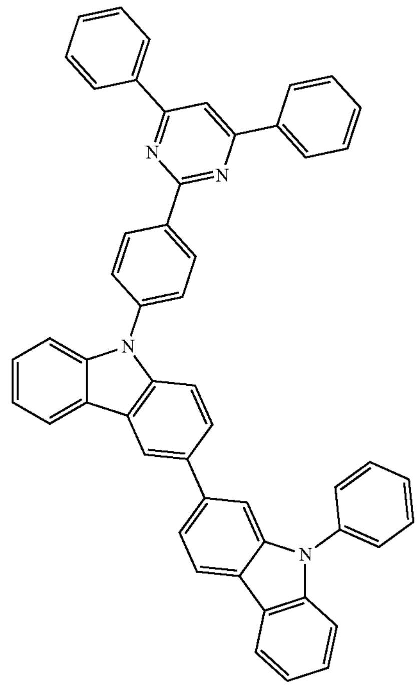
211A
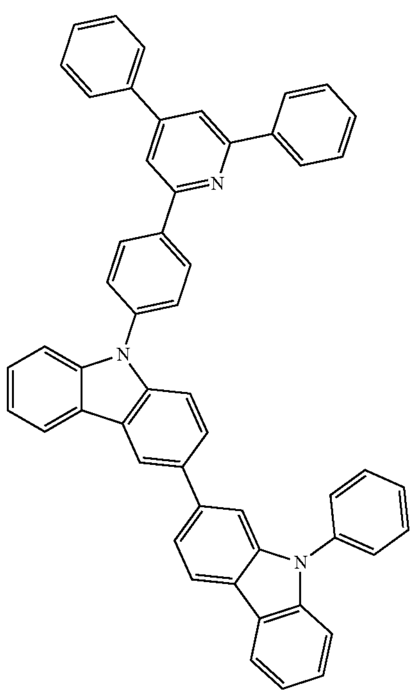
212A
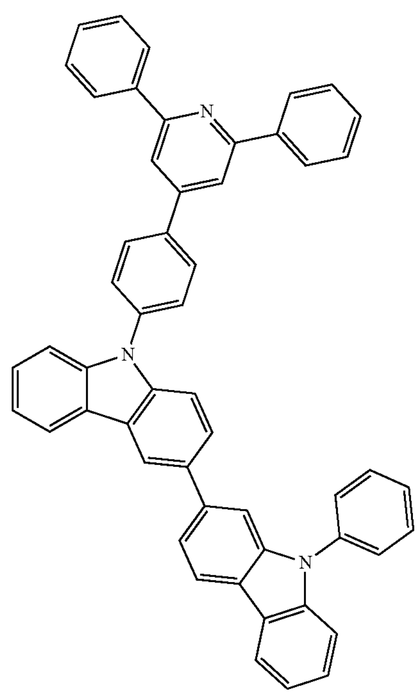

-continued
117A
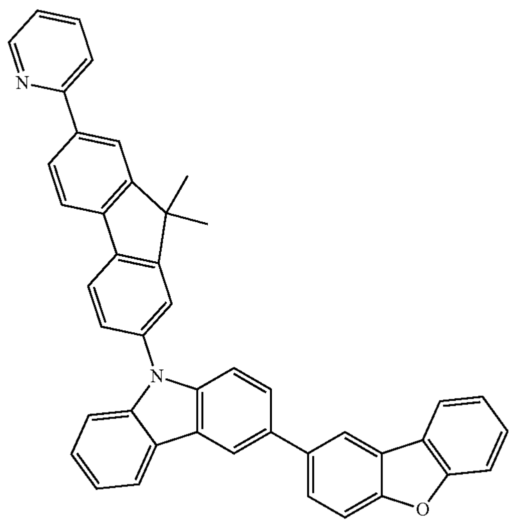
118A
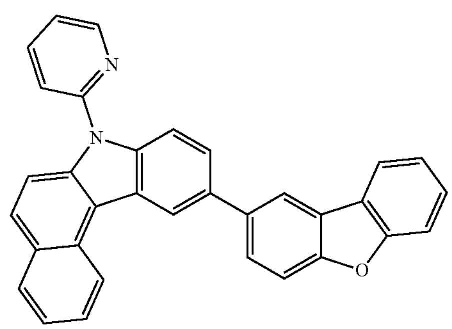
119A
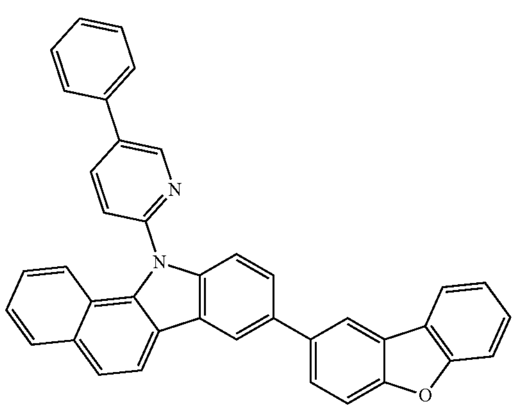
120A
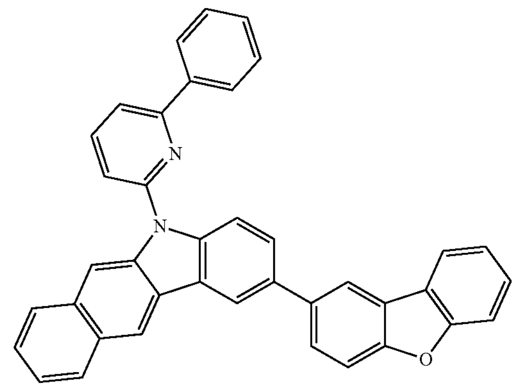
121A
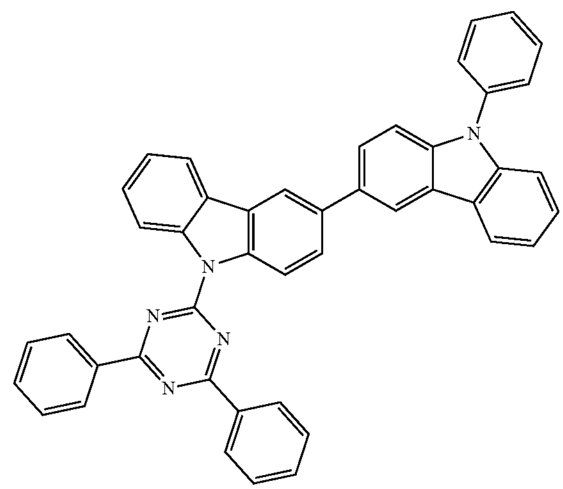
122A
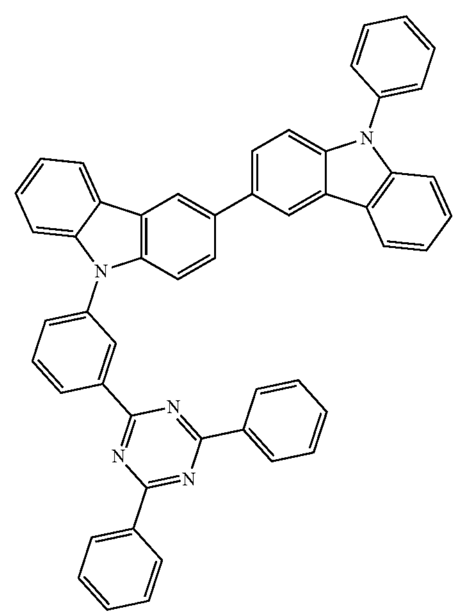

-continued
123A
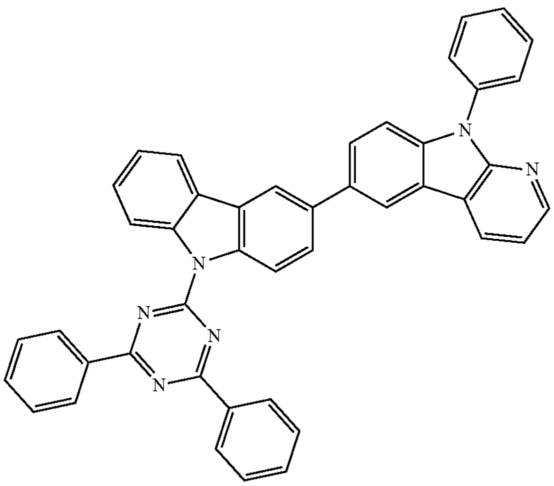
124A
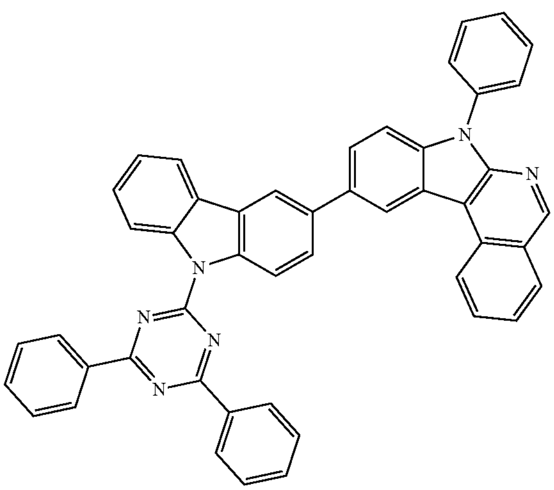
125A
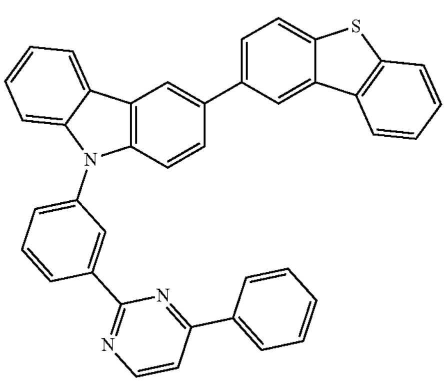
-continued
126A
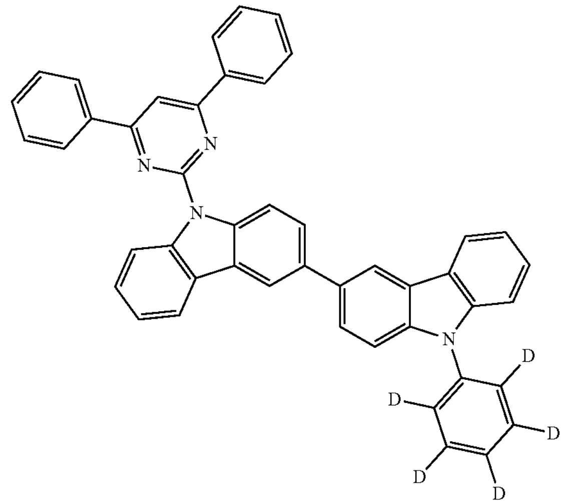
127A
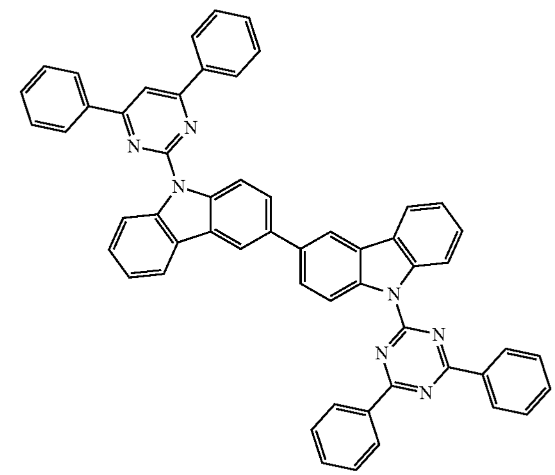
128A
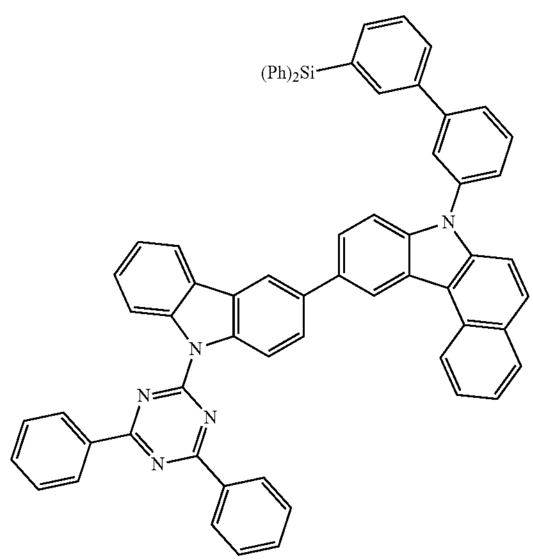

-continued
129A
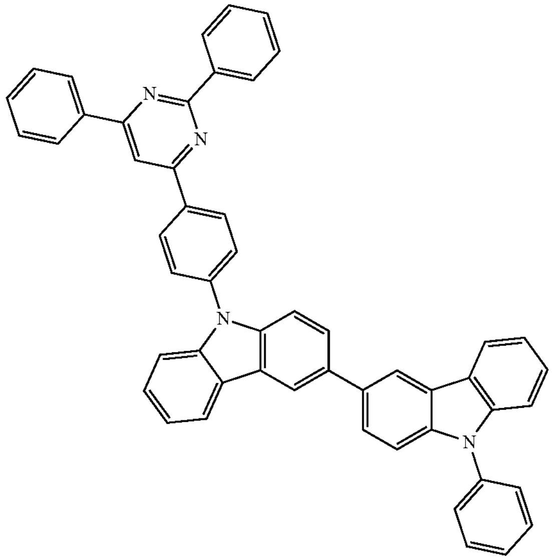
130A
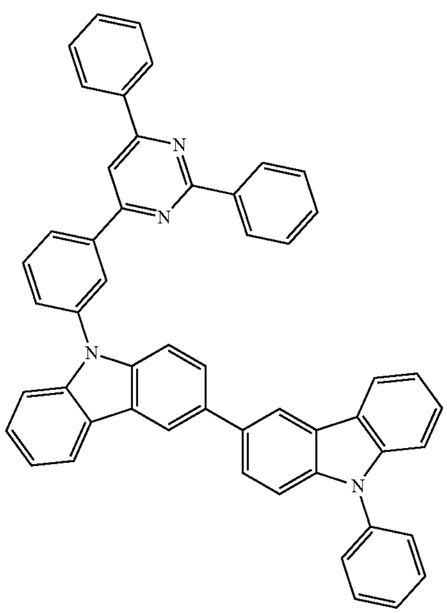
-continued
131A
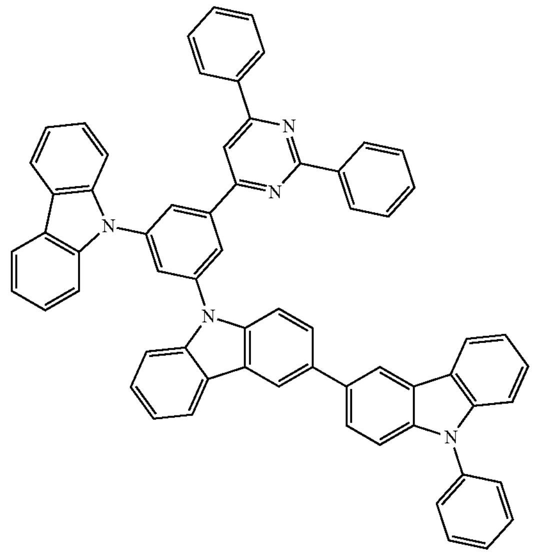
132A
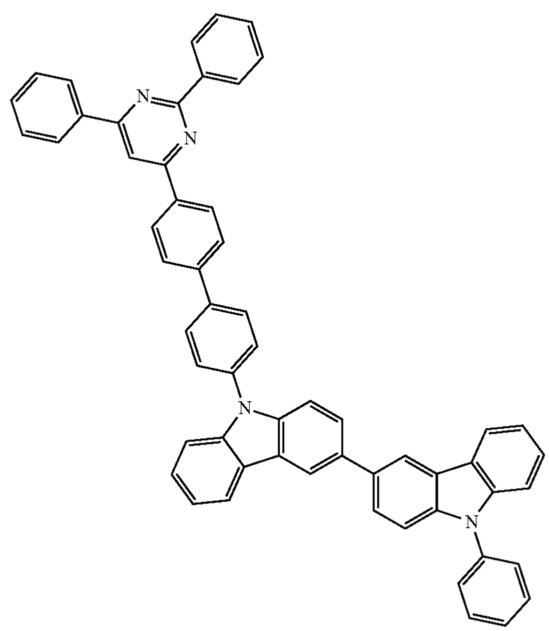

101B
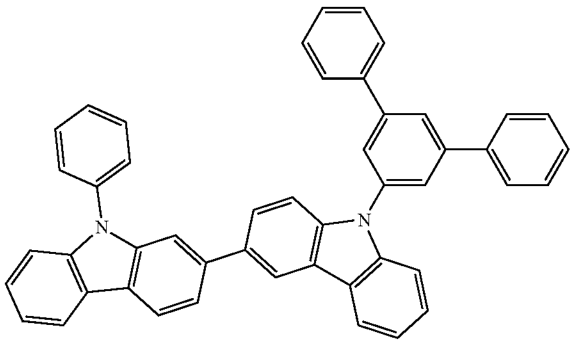
102B
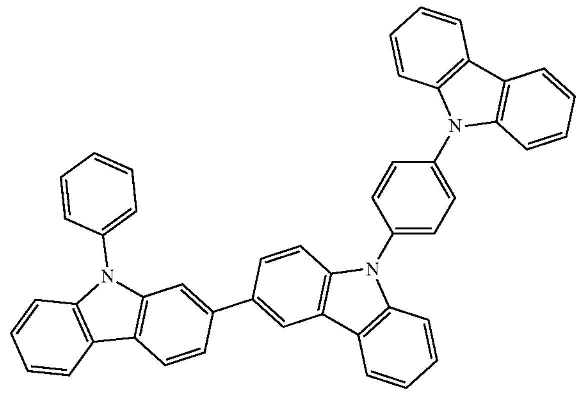
103B
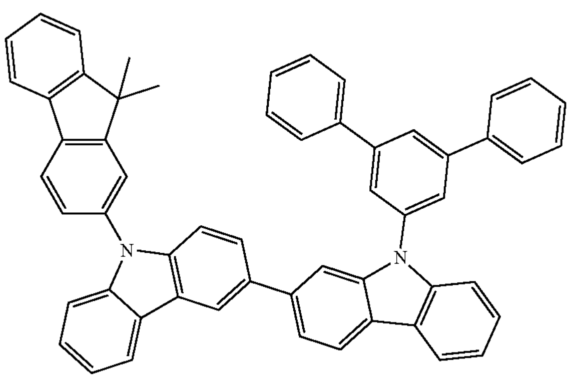
104B
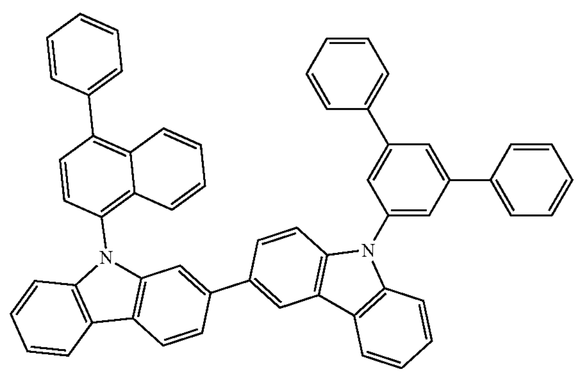
105B
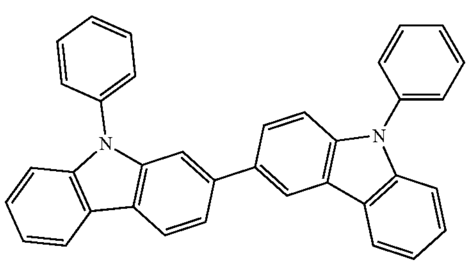
106B
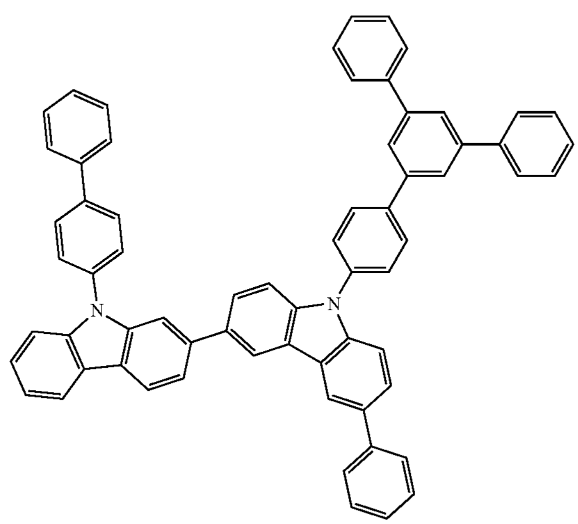

-continued
107B
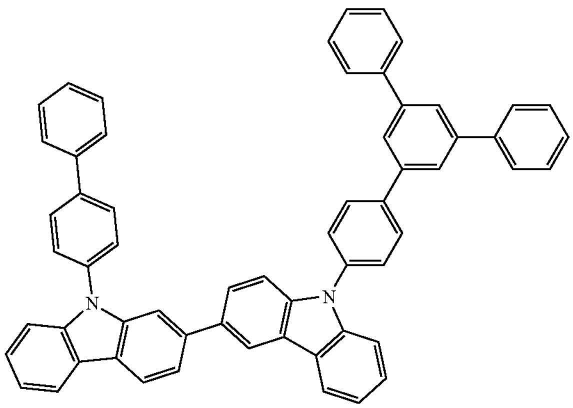
108B
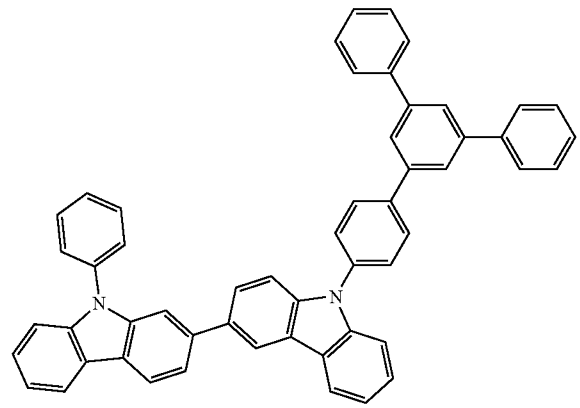
109B
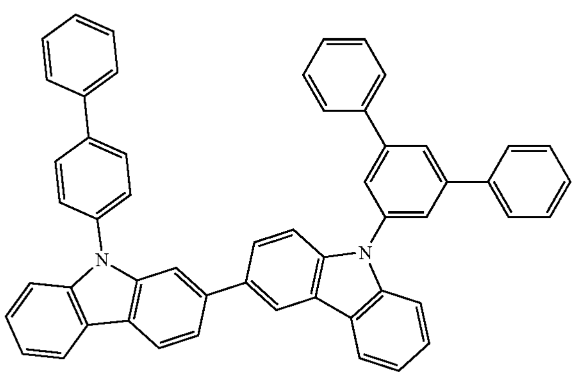
110B
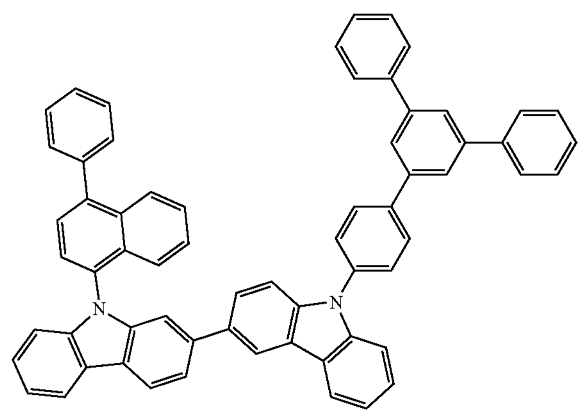
111B
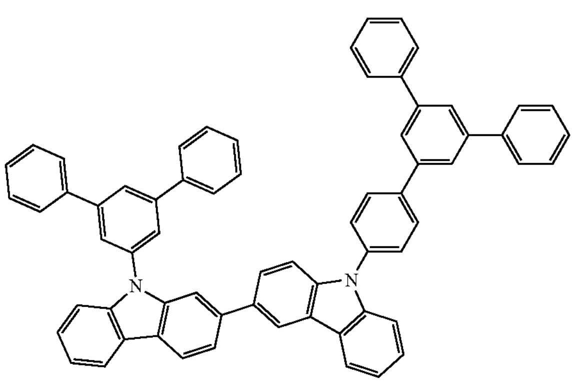
112B
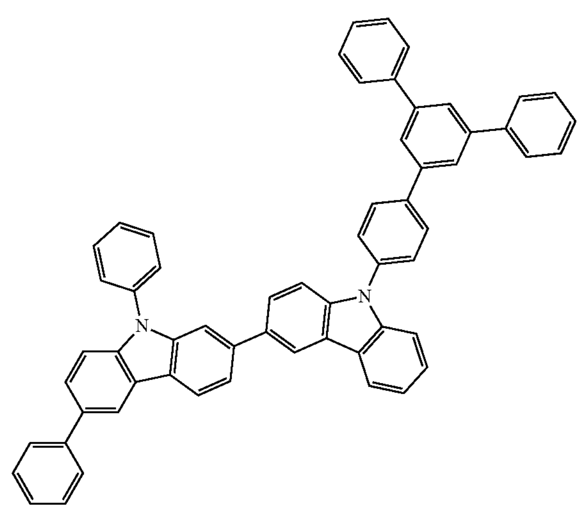

-continued
113B
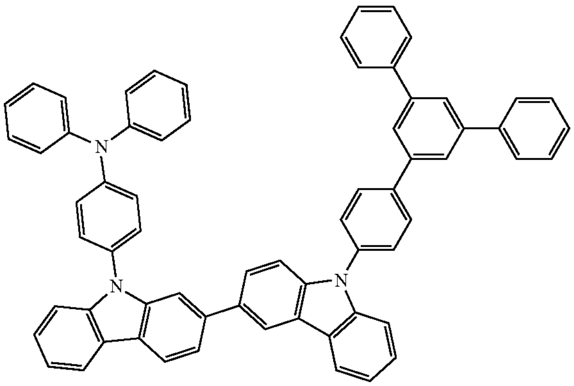
114B
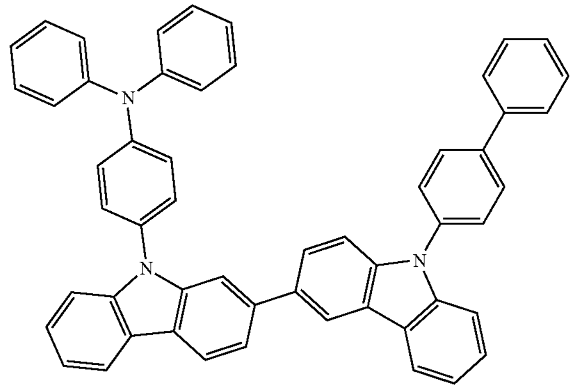
115B
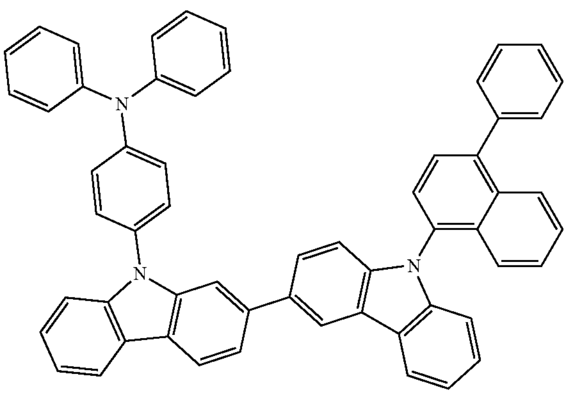
116B
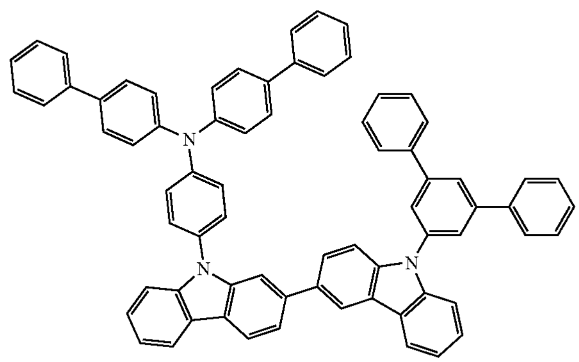
117B
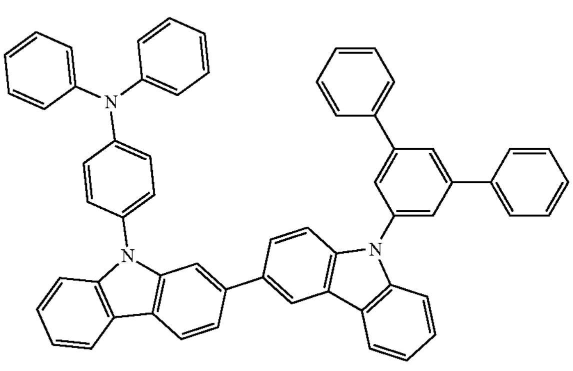
118B
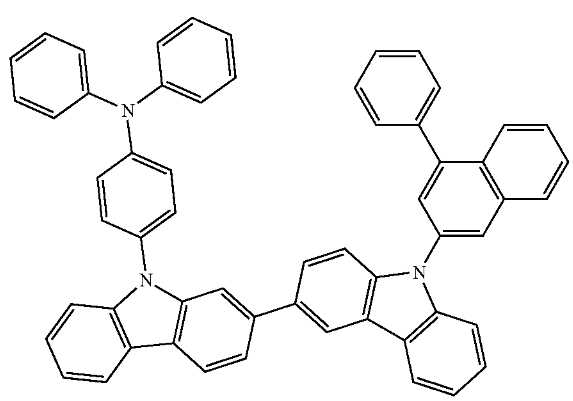

-continued
119B
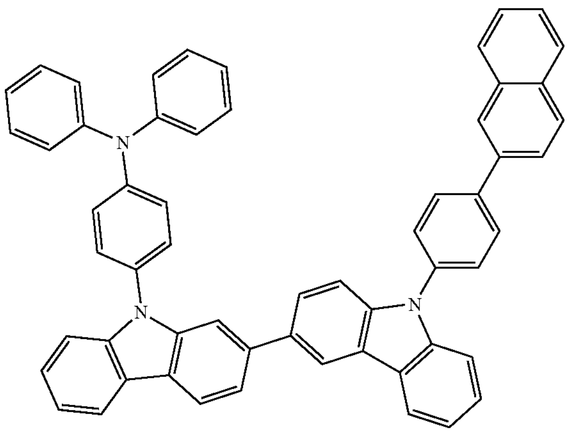
120B
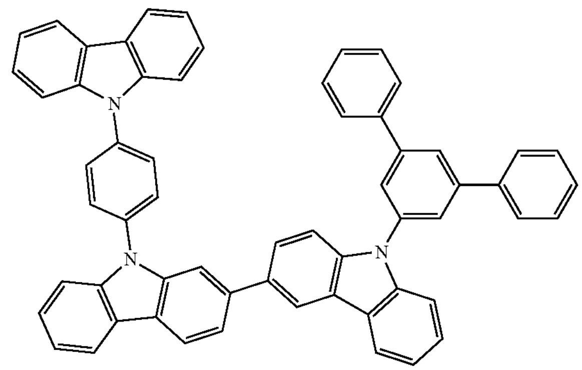
121B
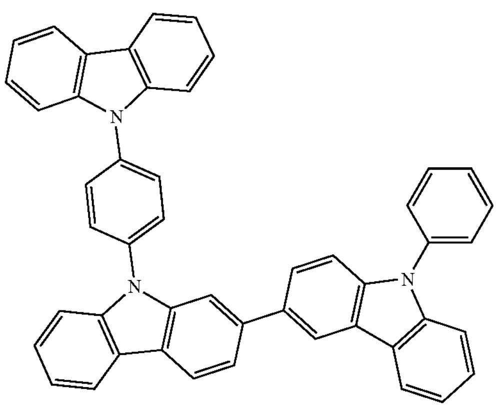
122B
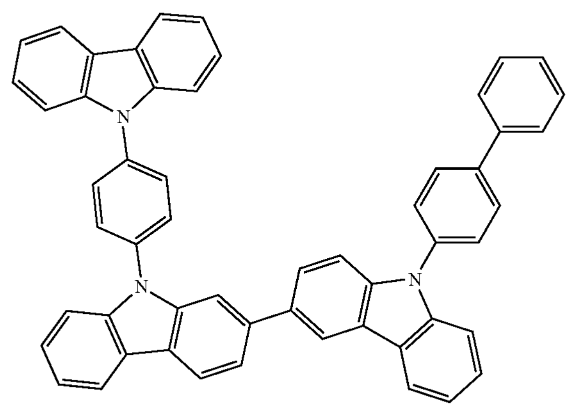
123B
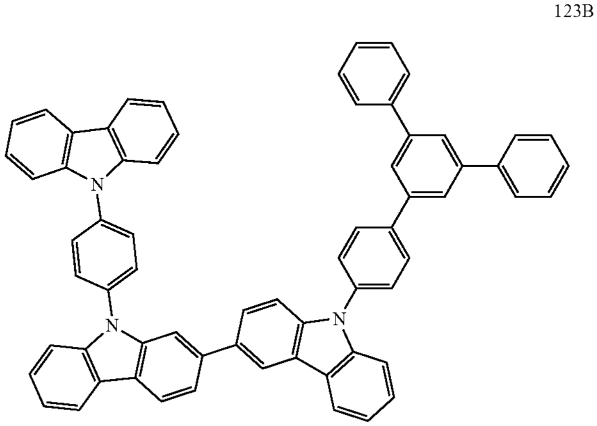
124B
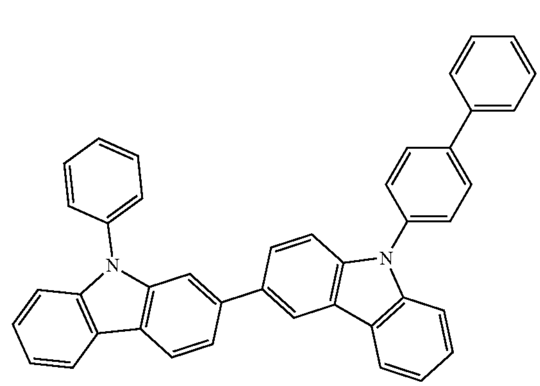

-continued
125B
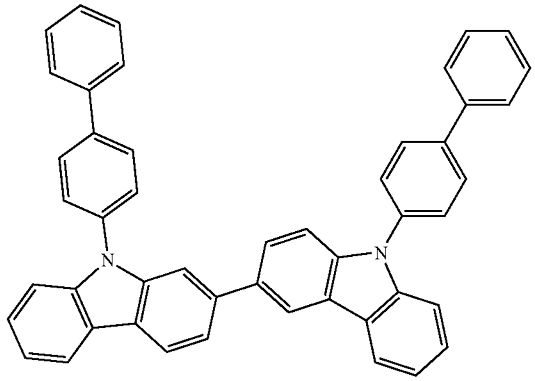
126B
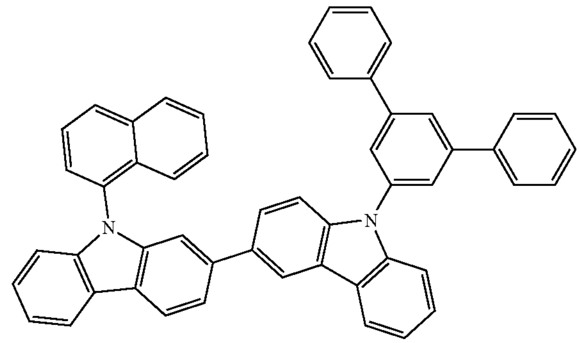
127B
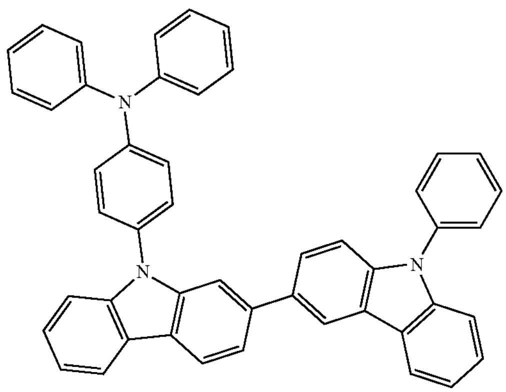
128B
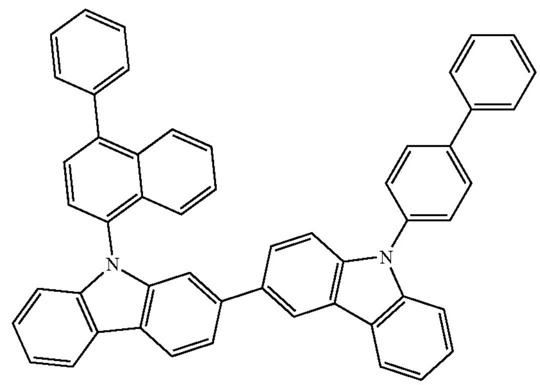
129B
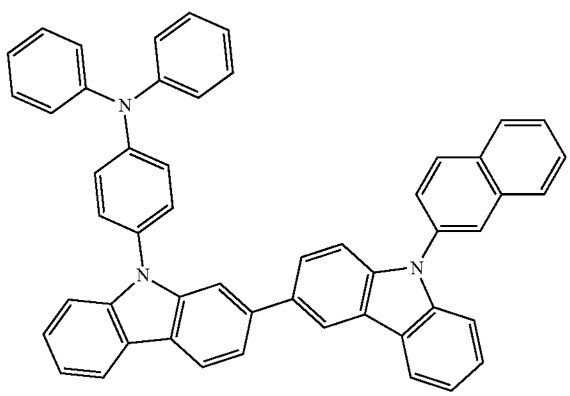
130B
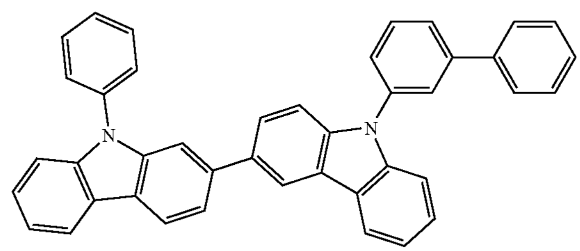
131B
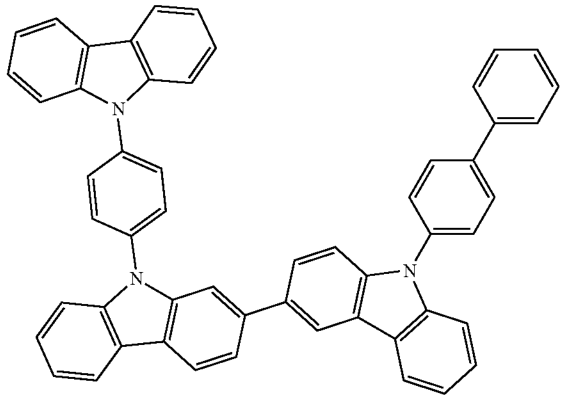
132B
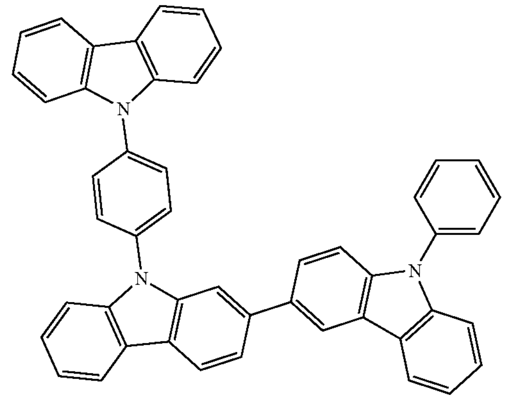

-continued
133B
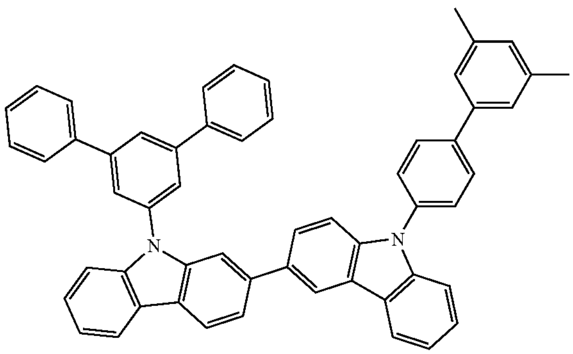
134B
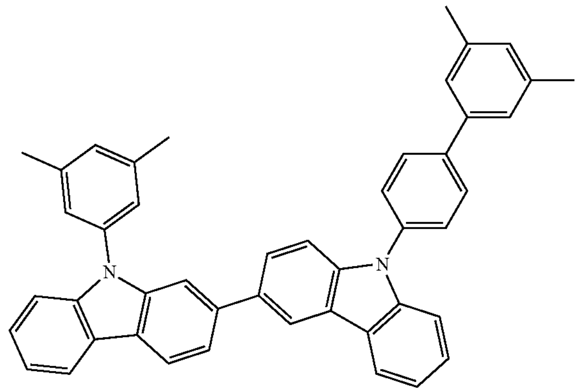
135B
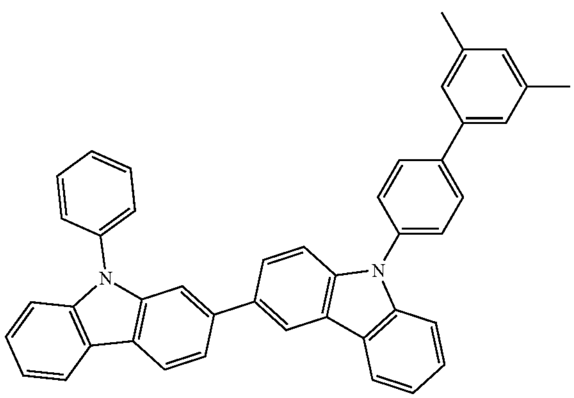
136B
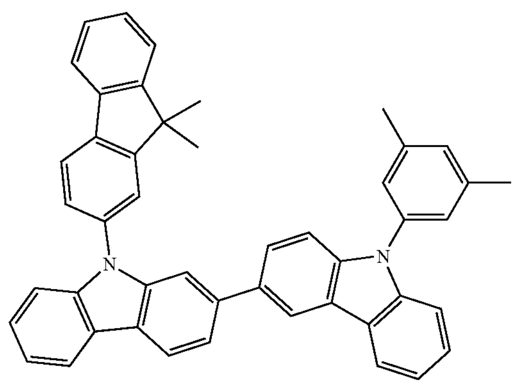
137B
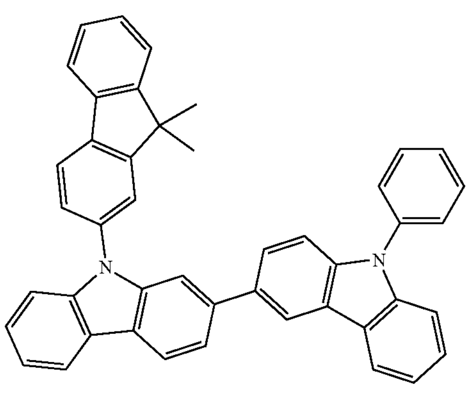
138B
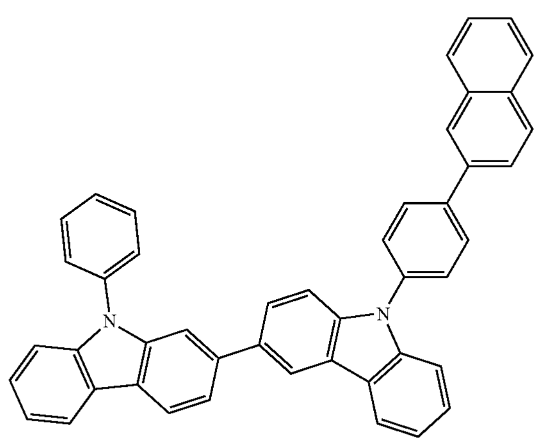

-continued
139B
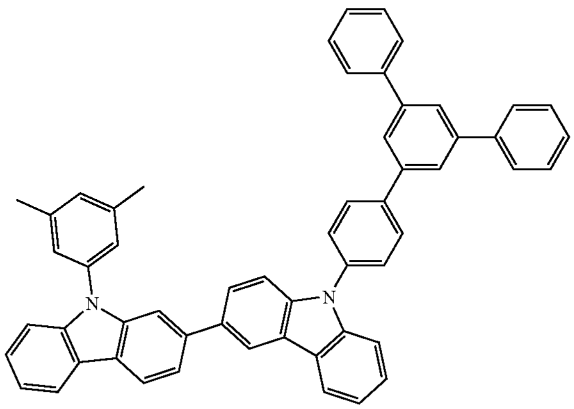
140B
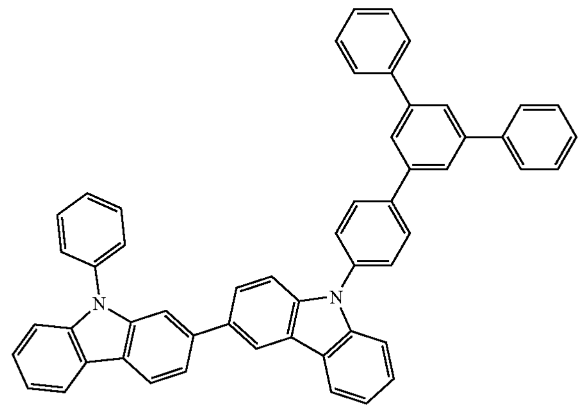
141B
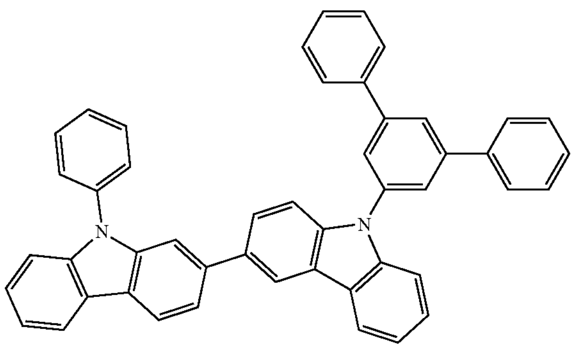
142B
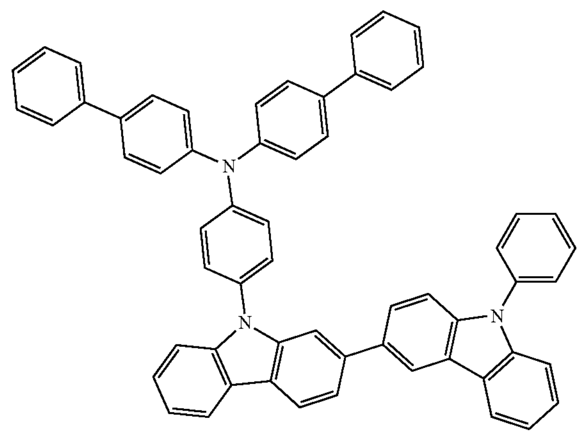
143B
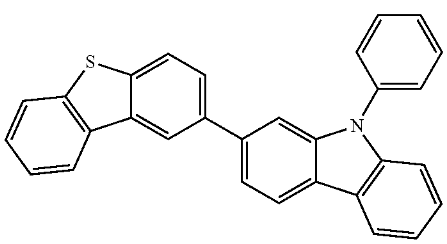
144B
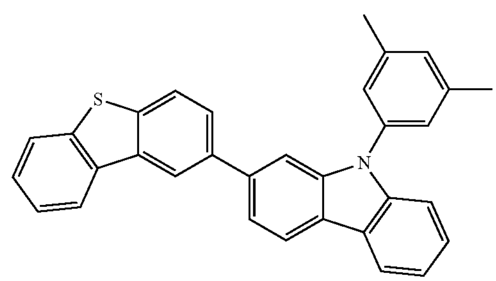
145B
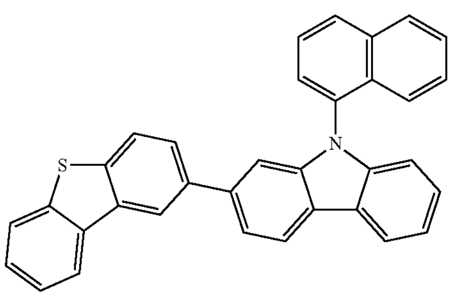
157B
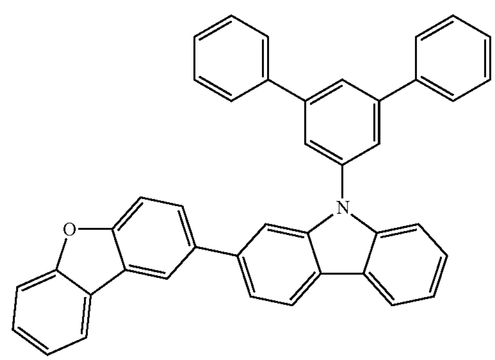

-continued
146B
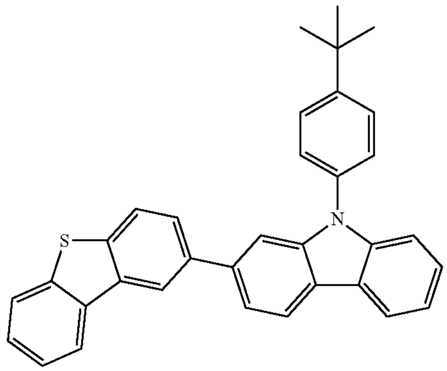
147B
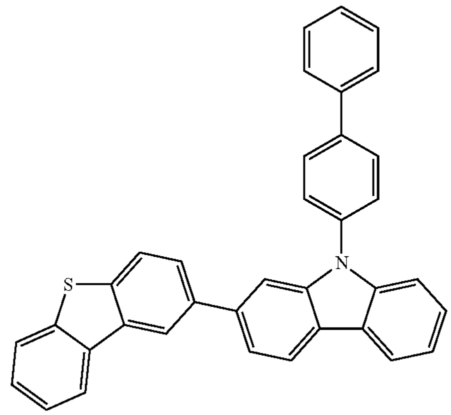
148B
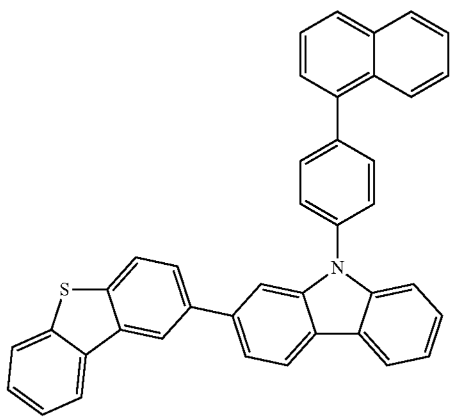
160B
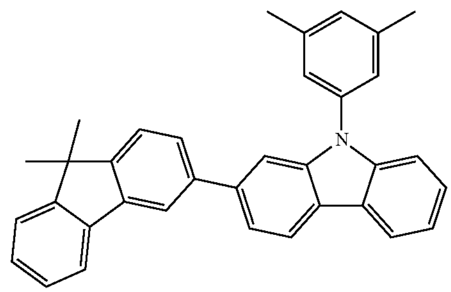
149B
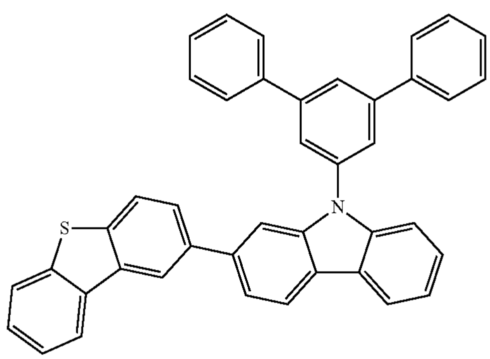
150B
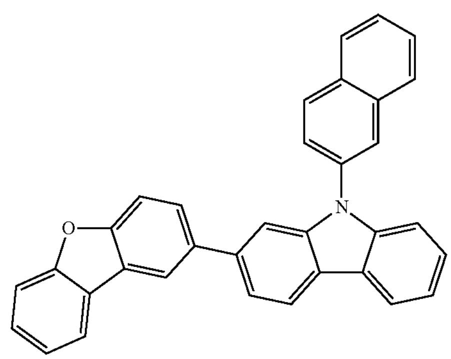
151B
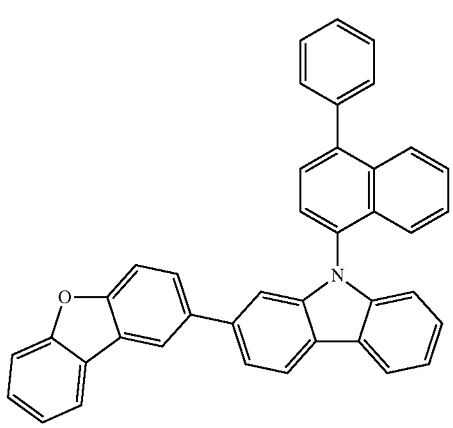
163B
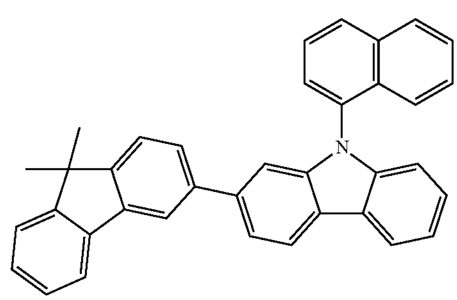

-continued
152B
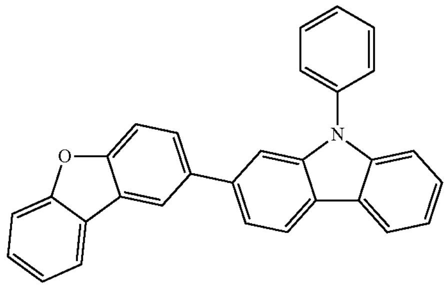
153B
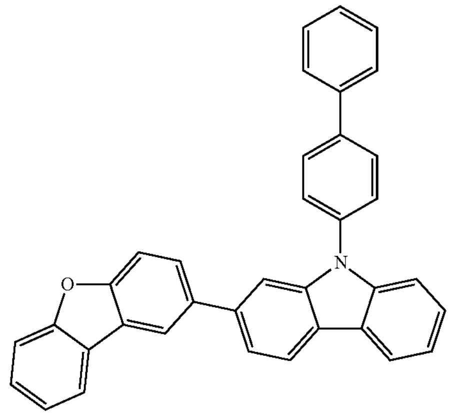
154B
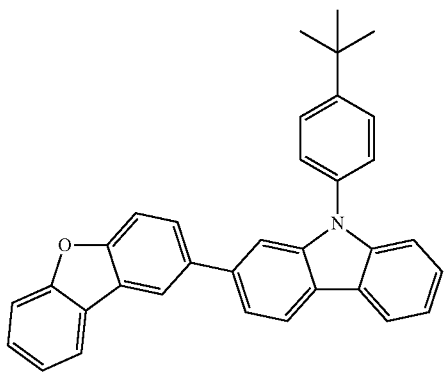
155B
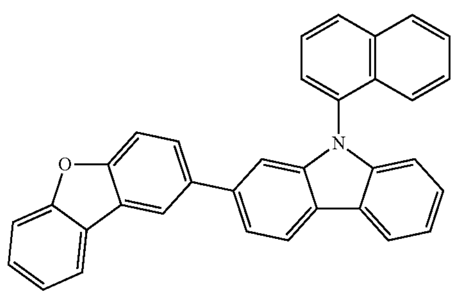
156B
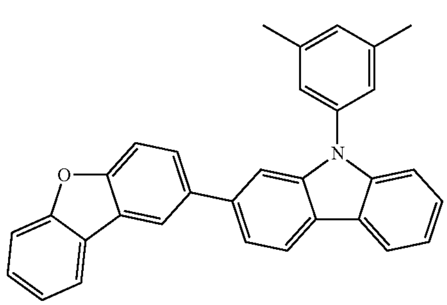
-continued
158B
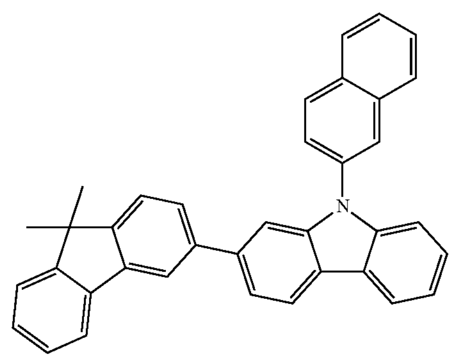
159B
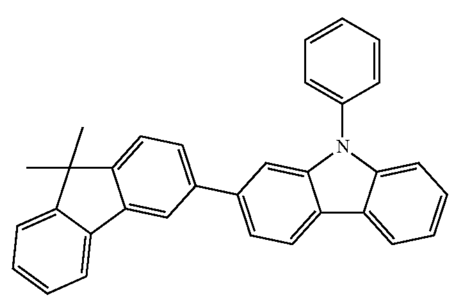

-continued
161B
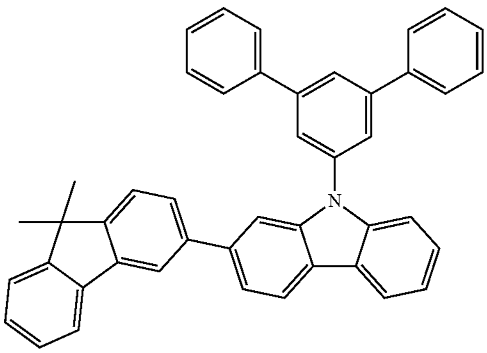
162B
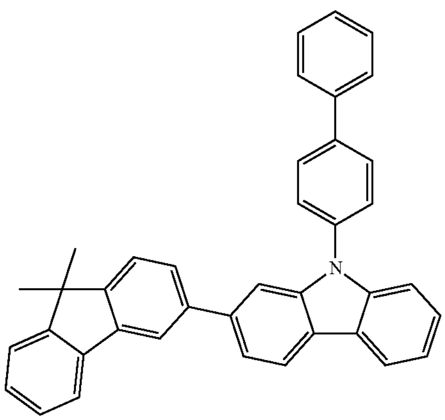
164B
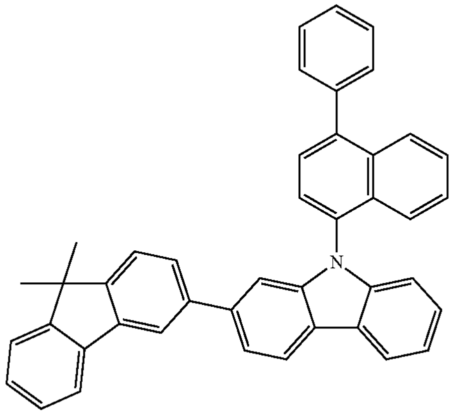
-continued
165B
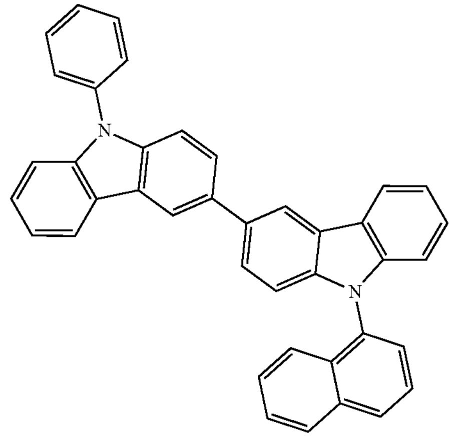
166B
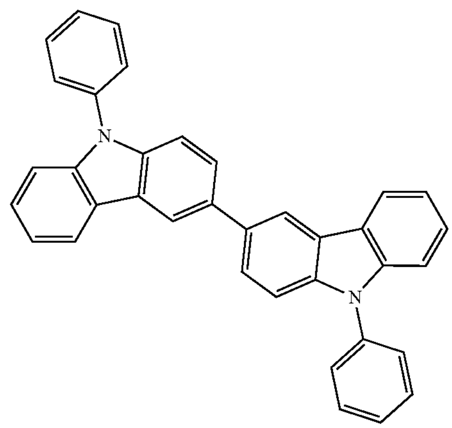
167B
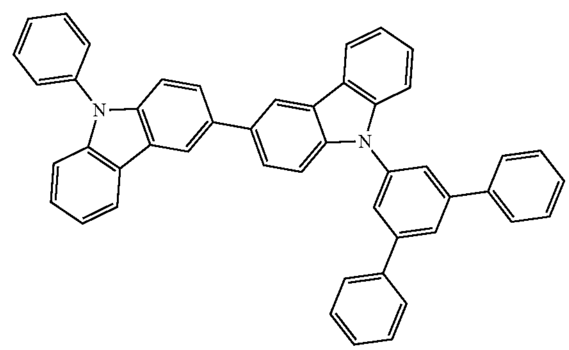
168B
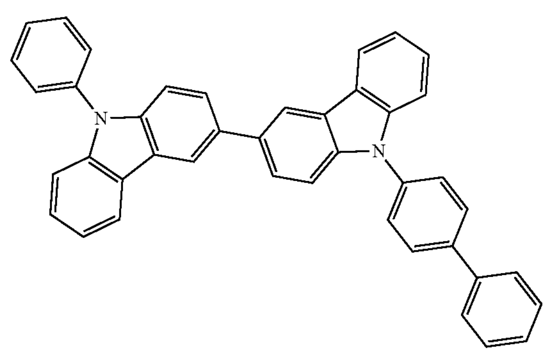

-continued
169B
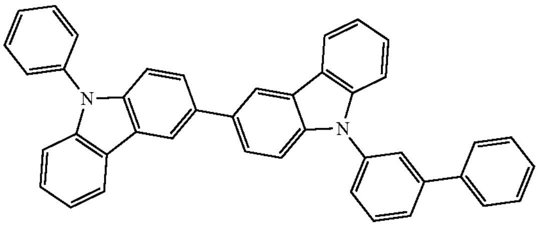
170B
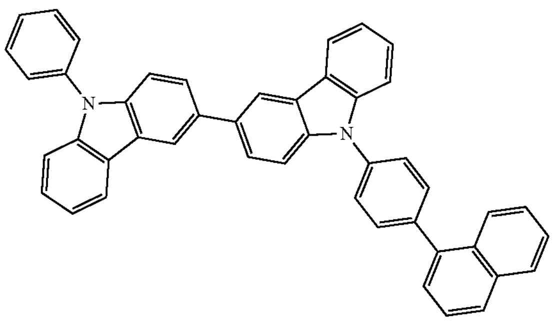
171B
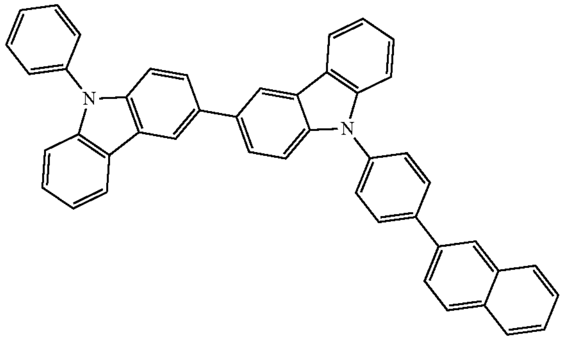
172B
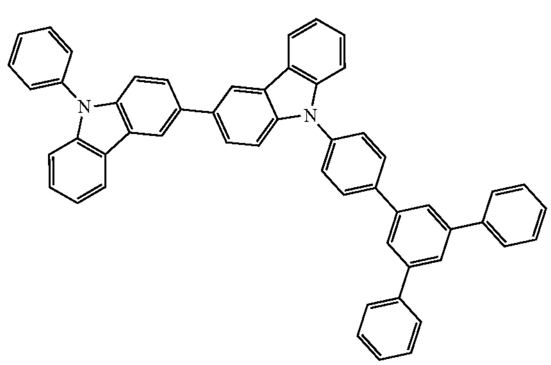
-continued
173B
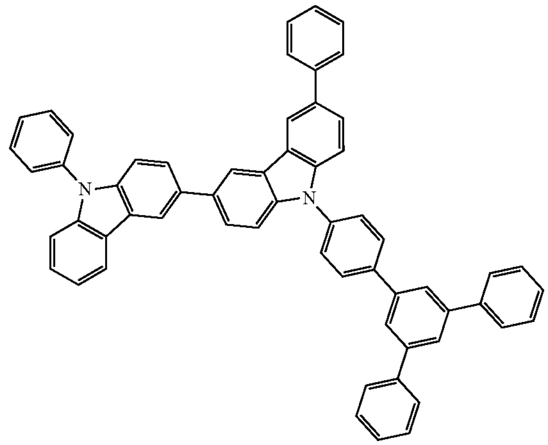
174B
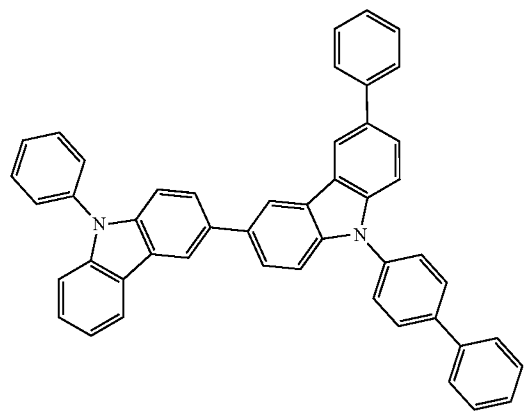
175B
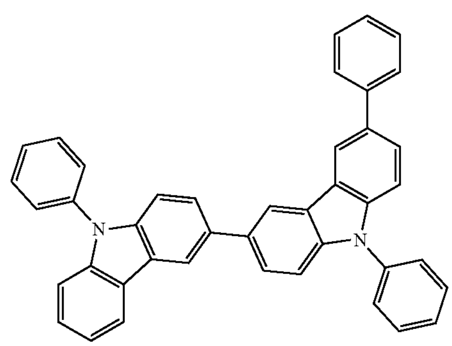

-continued
176B
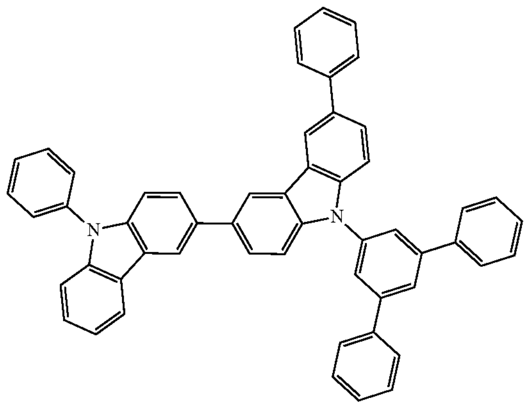
177B
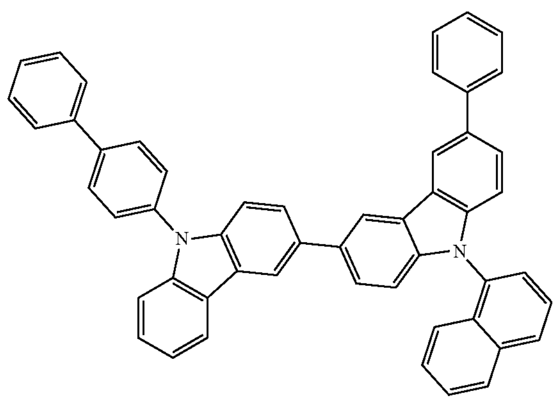
178B
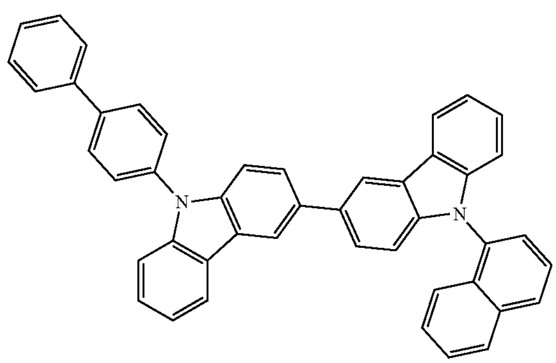
179B
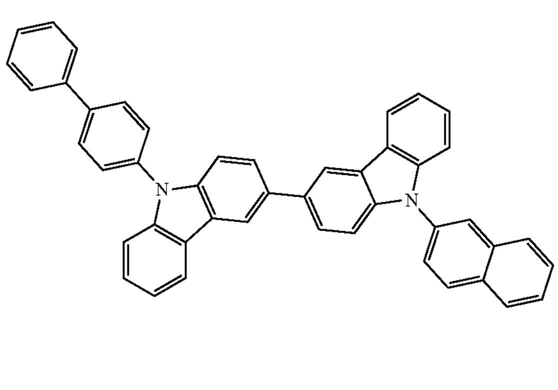
-continued
180B
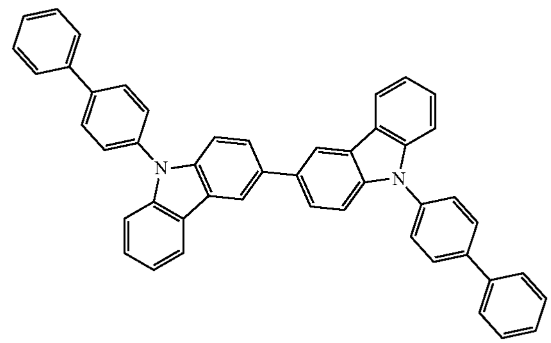
181B
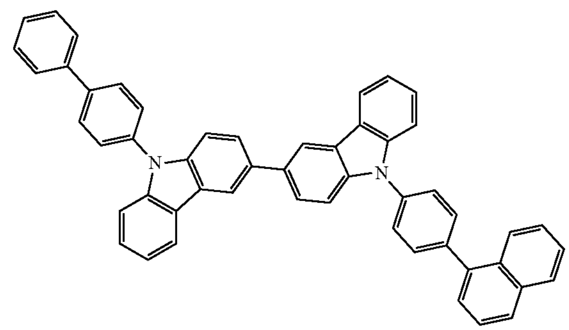
183B
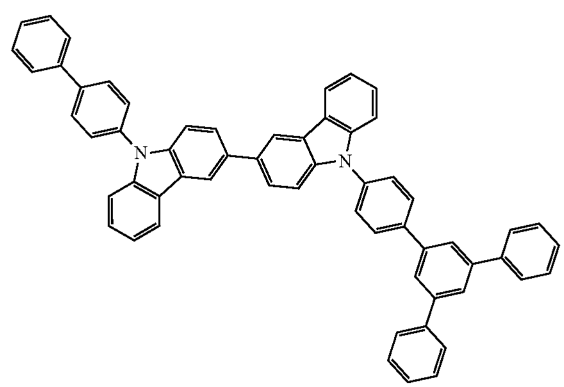
184B
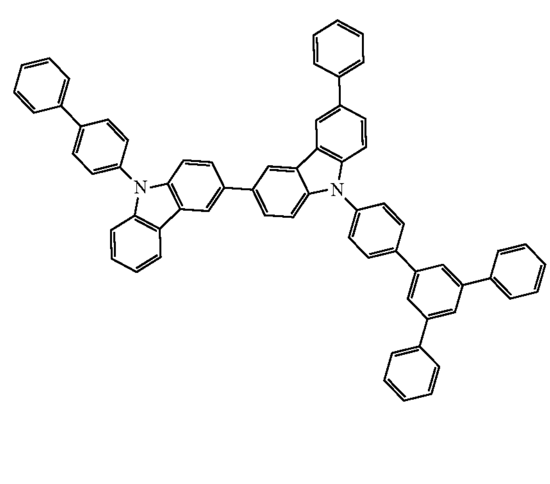

186B
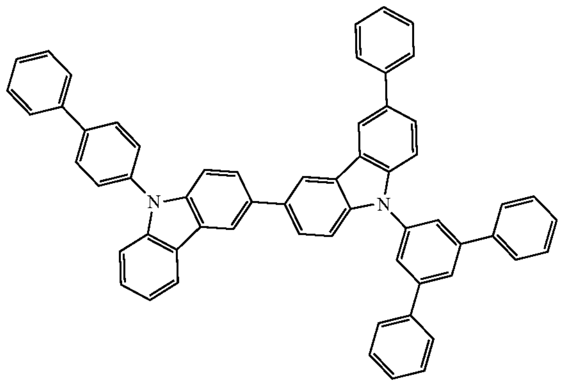
187B
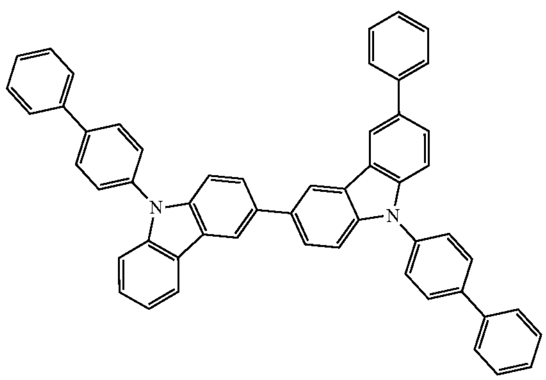
189B
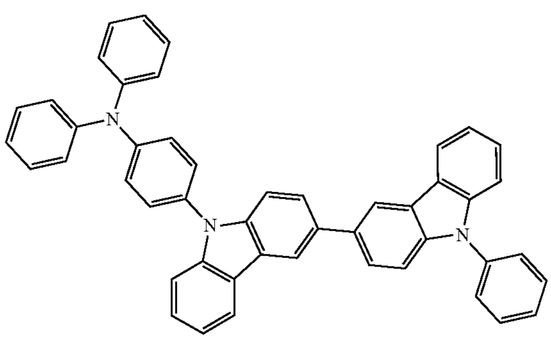
190B
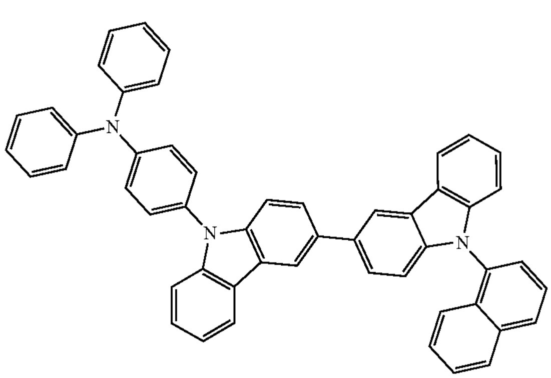
182B
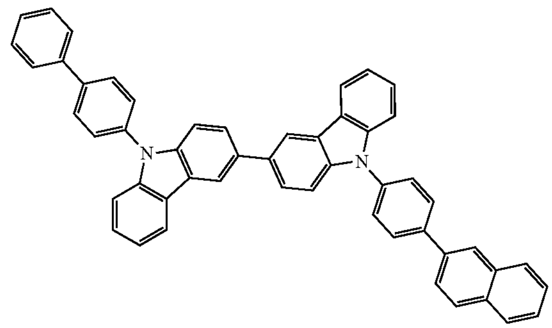
193B
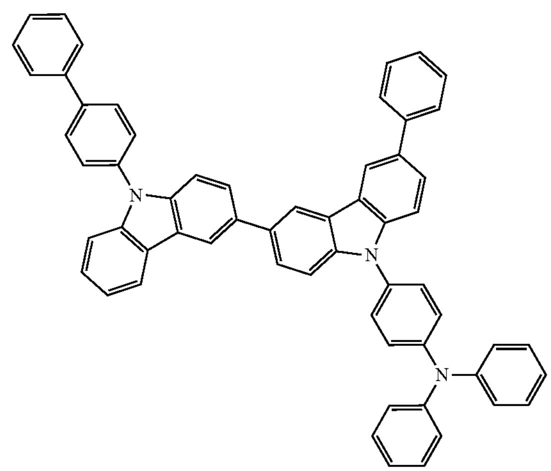
185B
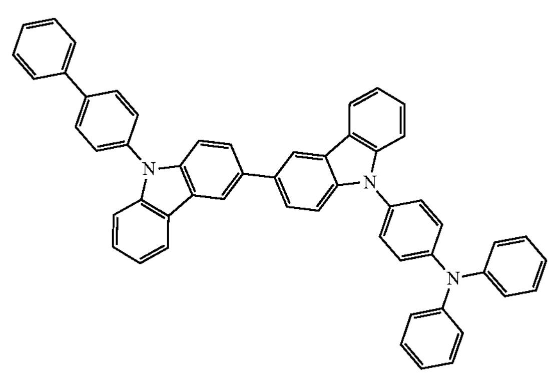

196B
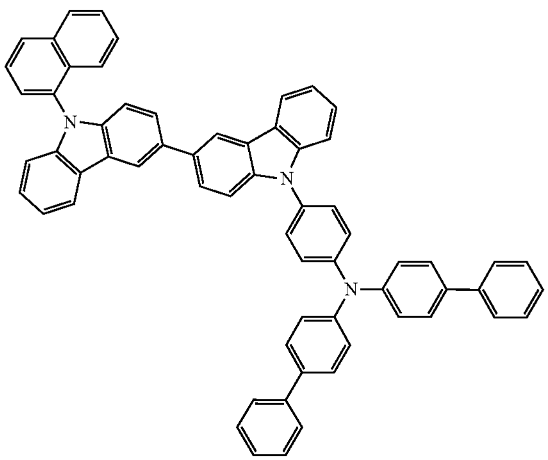
188B
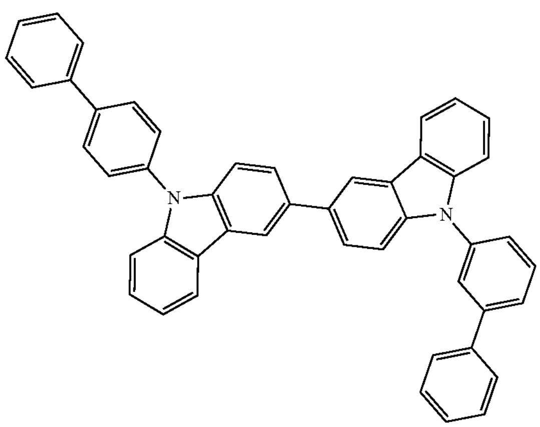
199B
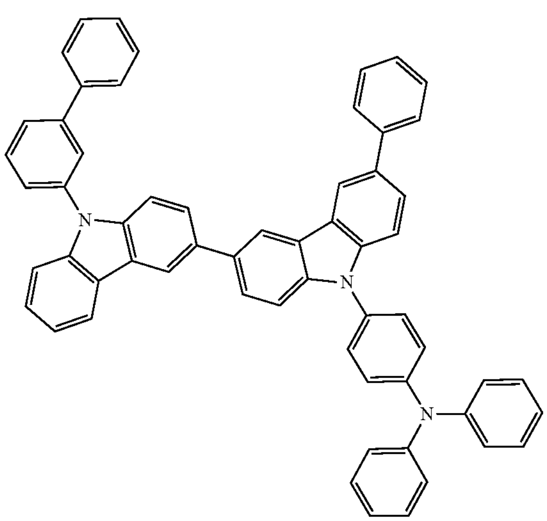
191B
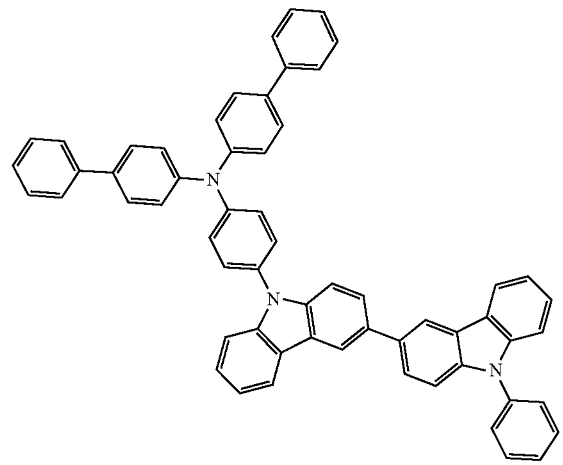
192B
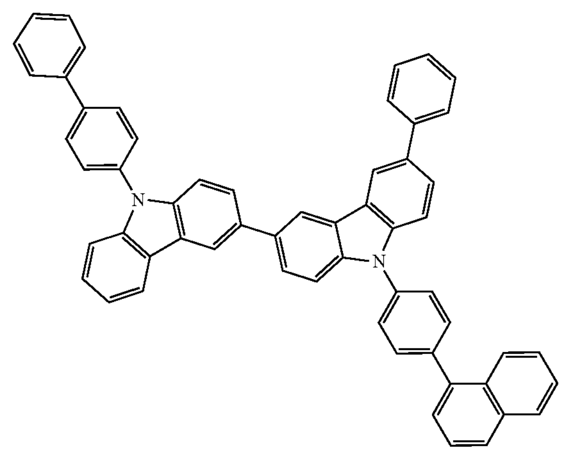
194B
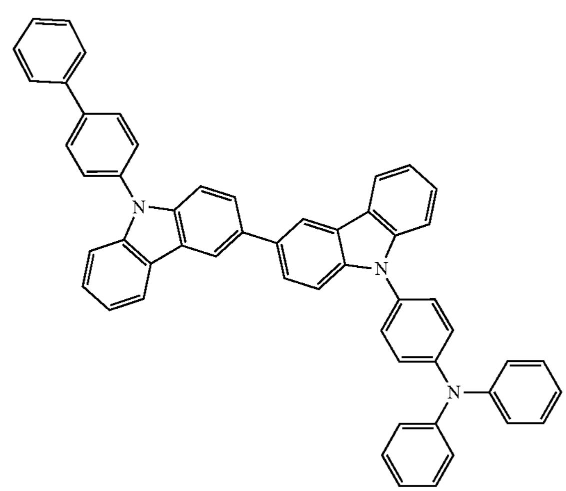

-continued
195B
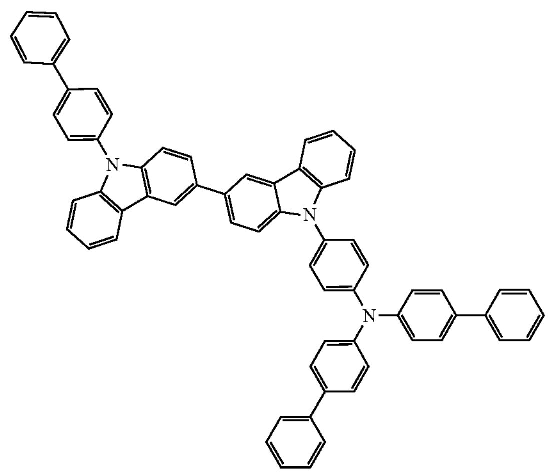
202B
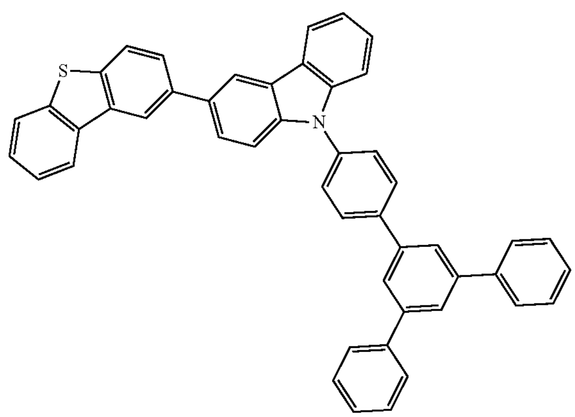
197B
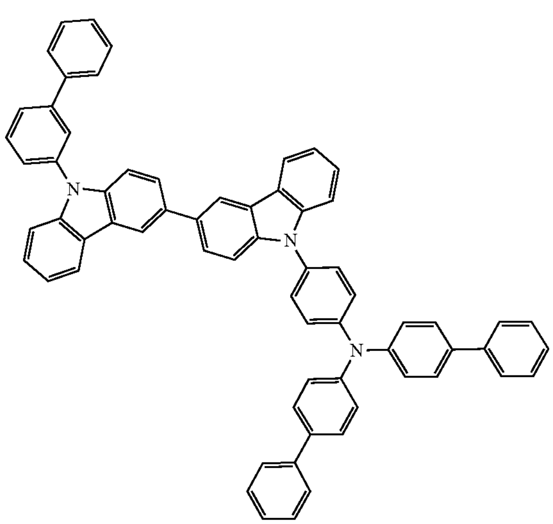
-continued
198B
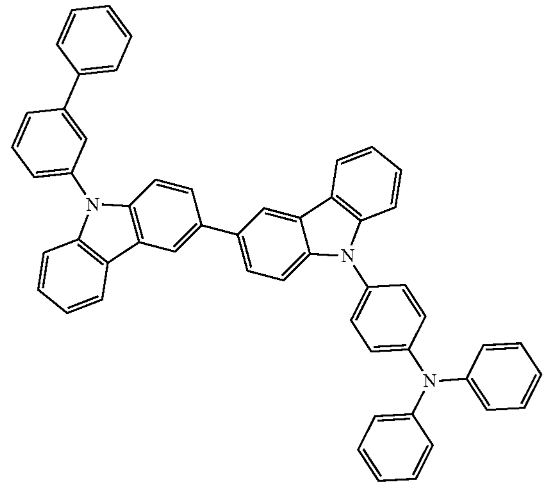
205B
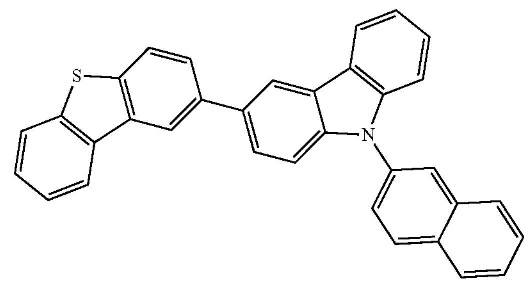
208B
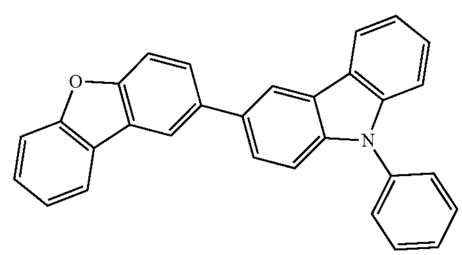
211B
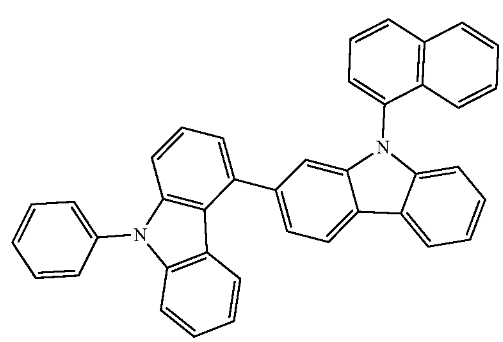

-continued
200B
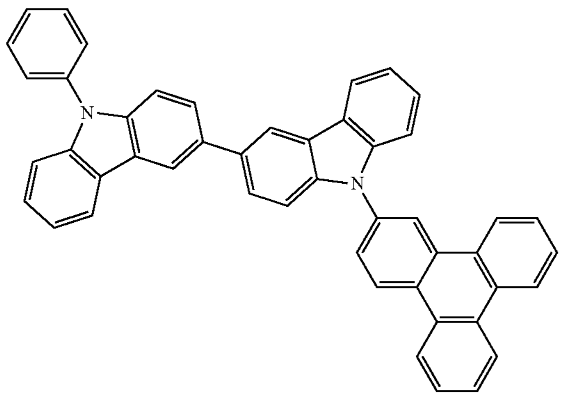
201B
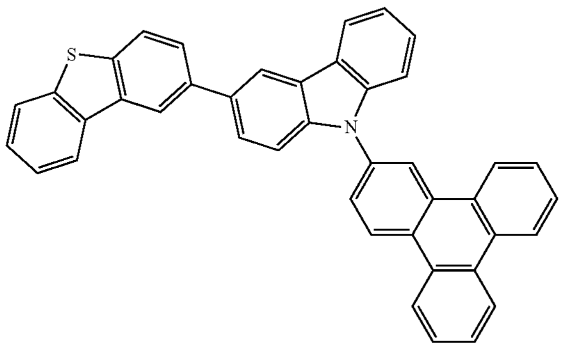
214B
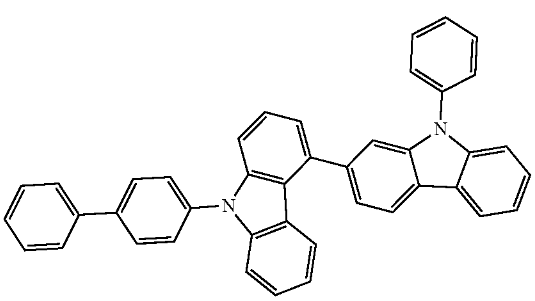
203B
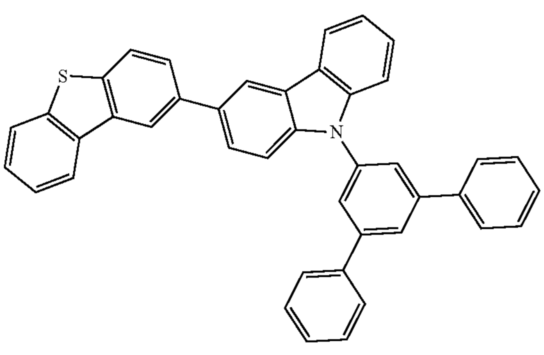
-continued
204B
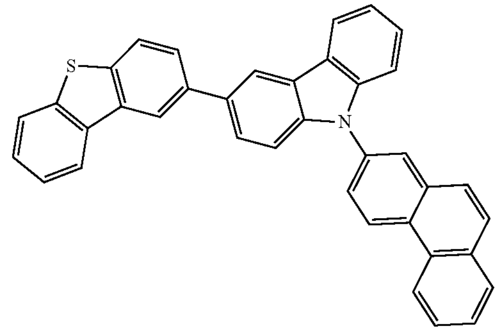
217B
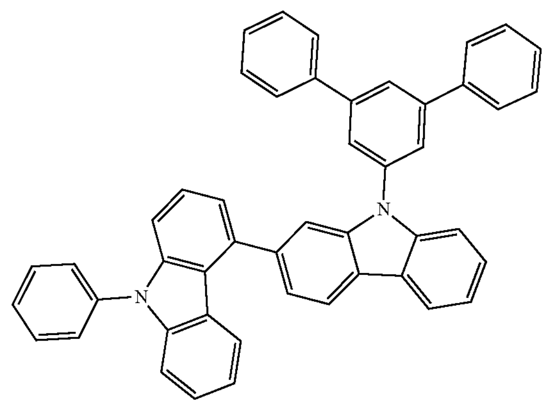
206B
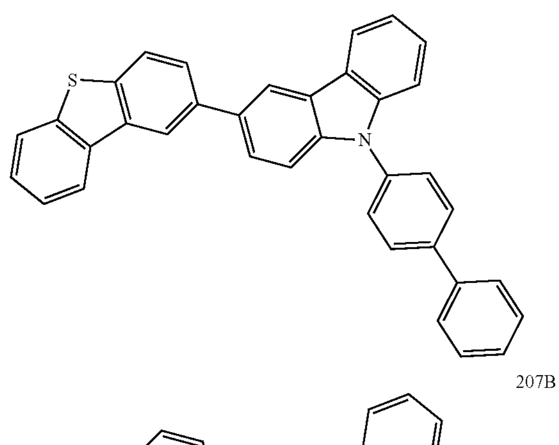
207B
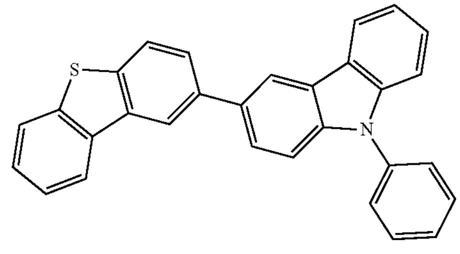

220B
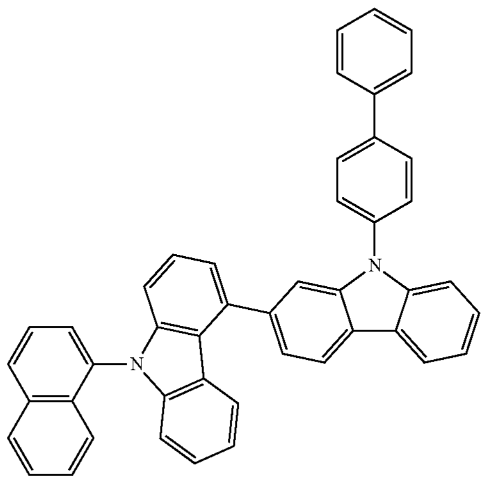
209B
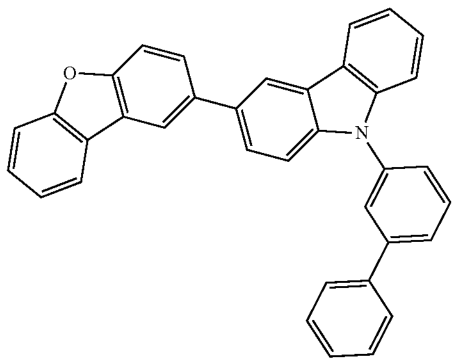
210B
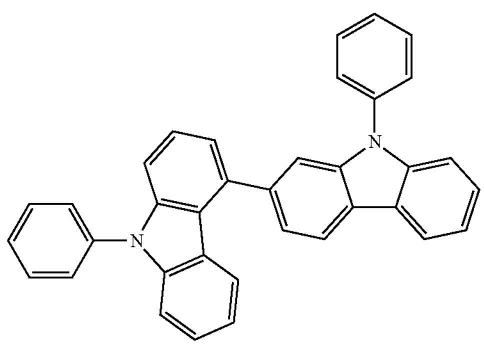
223B
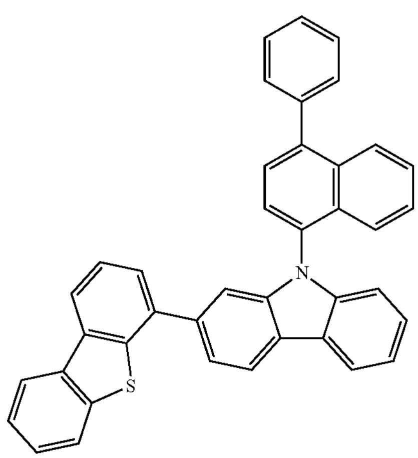
212B
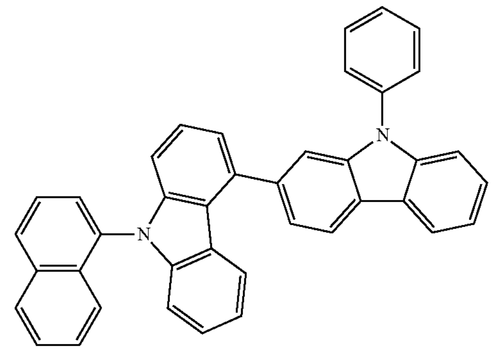
213B
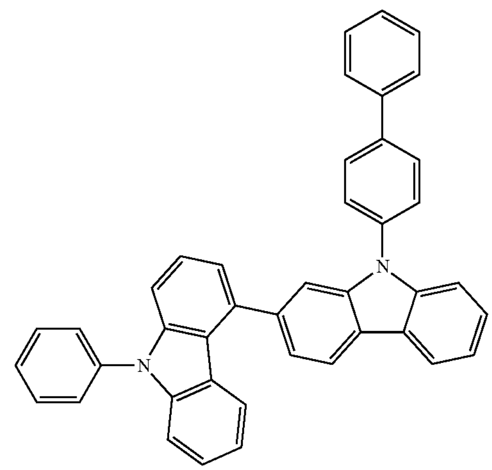
226B
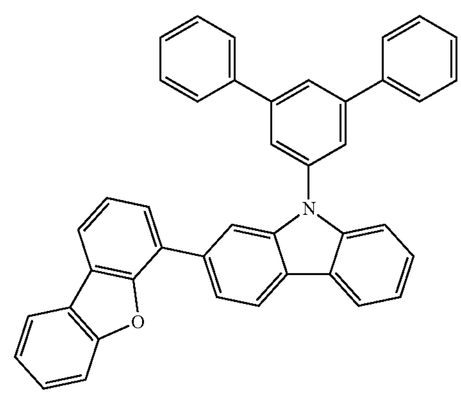
215B
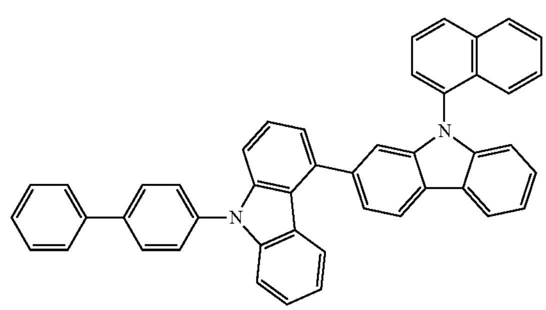

-continued
216B
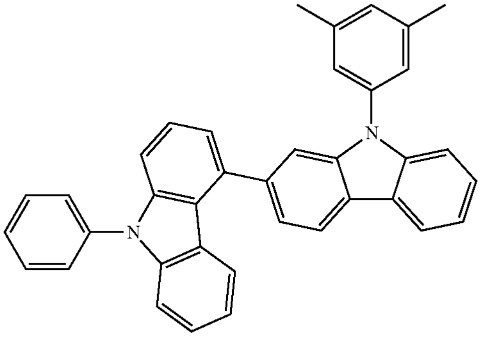
228B
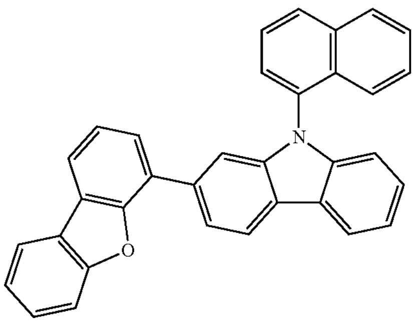
229B
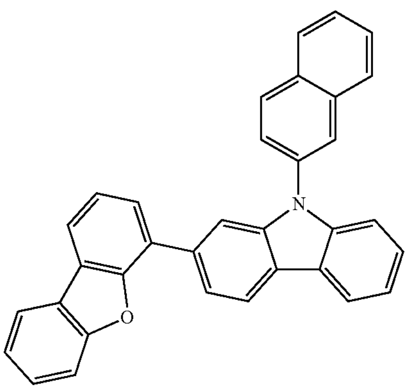
218B
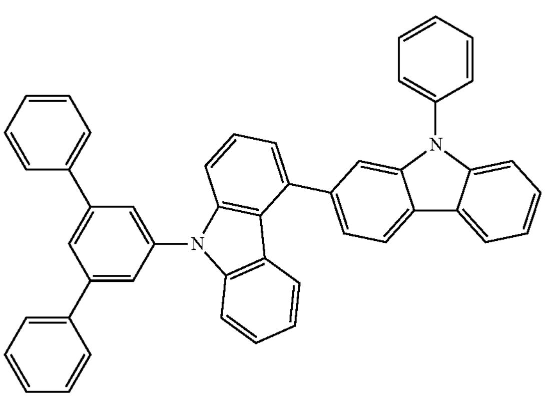
-continued
219B
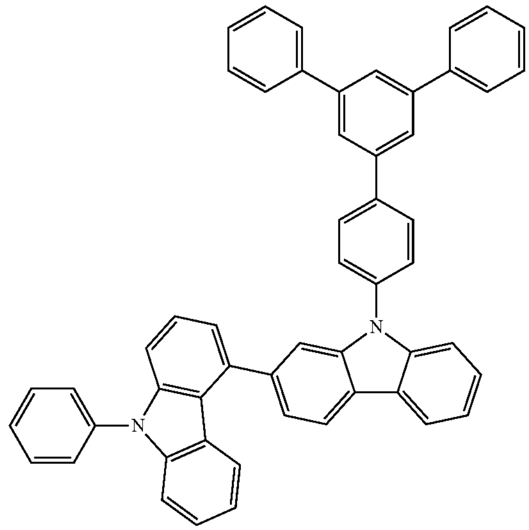
221B
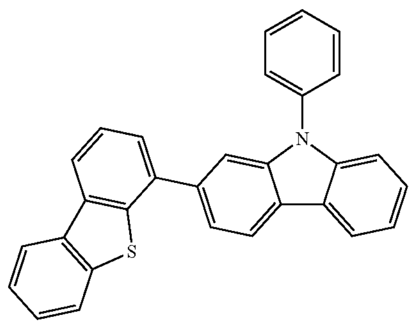
222B
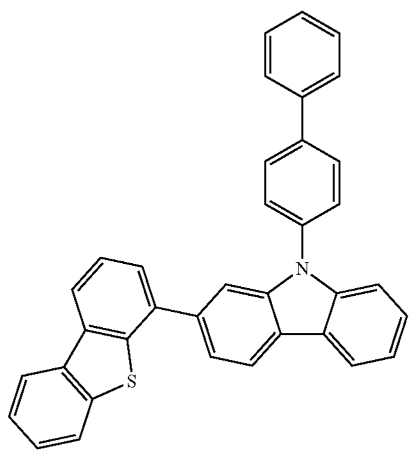
224B
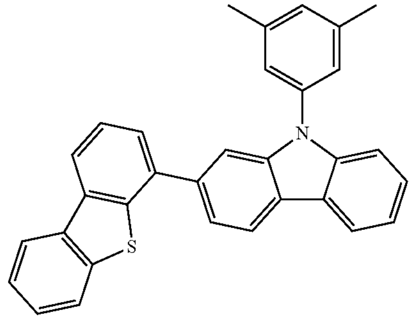

-continued

225B

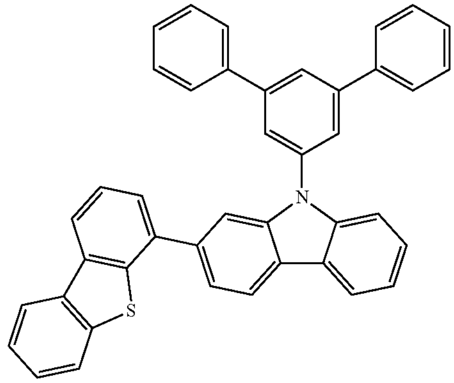

227B

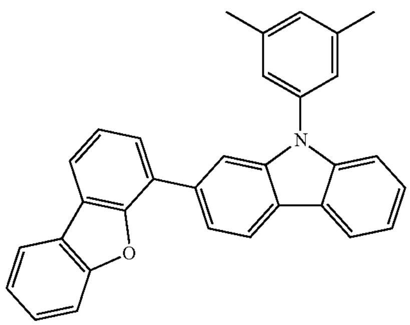

230B

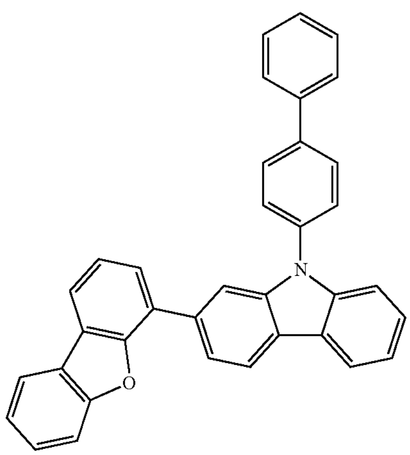

11. The organic light-emitting device of claim 1, wherein the emission auxiliary layer directly contacts the emission layer.

12. The organic light-emitting device of claim 10, wherein:

the second compound is selected from Compounds 143B-164B, 201B-209B, and 221B-230B.

13. An organic light-emitting device comprising:

a first electrode;

a second electrode; and an organic layer comprising an emission layer between the first electrode and the second electrode, and a hole transport region between the first electrode and the emission layer, the hole transport region comprising a hole injection layer, a hole transport layer, and an emission auxiliary layer, the organic layer comprising: a first compound and a second compound; in addition to a third compound, the emission layer comprises the first compound and the second compound, wherein the emission auxiliary layer comprises the third compound, wherein the hole transport layer comprises a compound different from the third compound, wherein the first compound is represented by Formula 1-1 or Formula 1-2, the second compound is represented by Formula 2, and the third compound is selected from Compounds A1, A4 to A27, B1 to B6, B8, B9, B11 to B25, C1, C2, C4, C5, C7 to C16, D1, D2, D4 to D9, E1 to E6, E8, E9, E10, F2 to F7, F9, F10, F12 to F30, and F32:

Formula 1-1

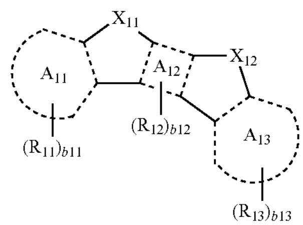

Formula 1-2

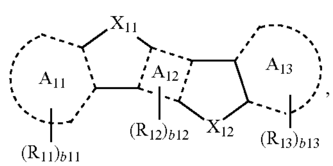

Formula 2

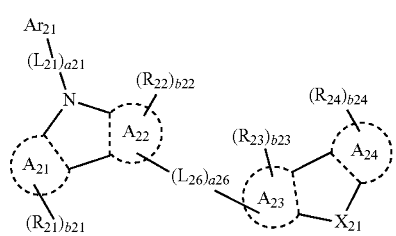

(A1)
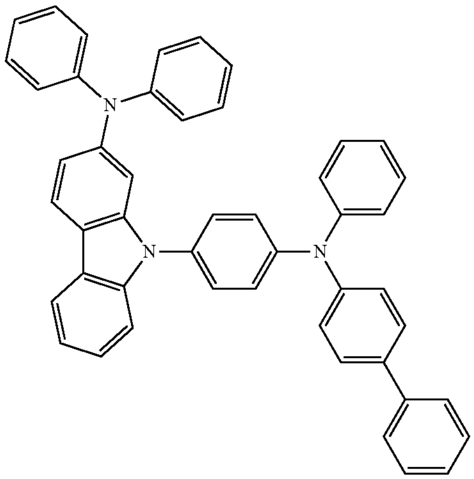
(A4)
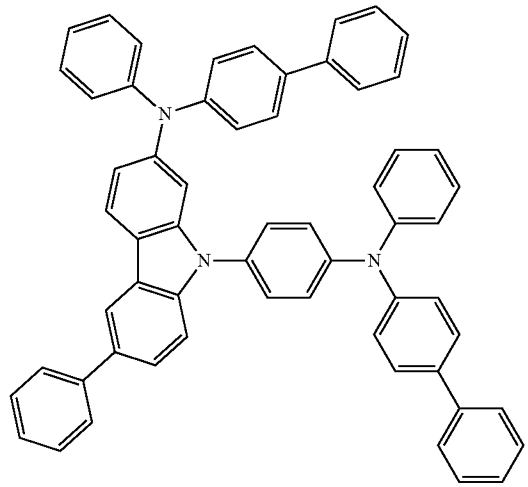
(A5)
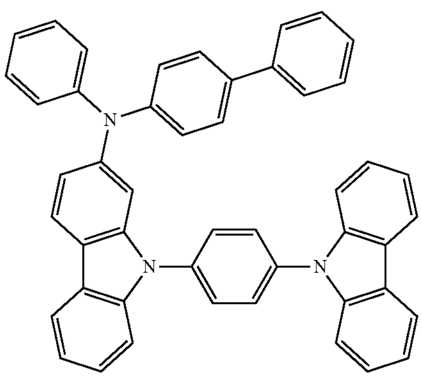
(A6)
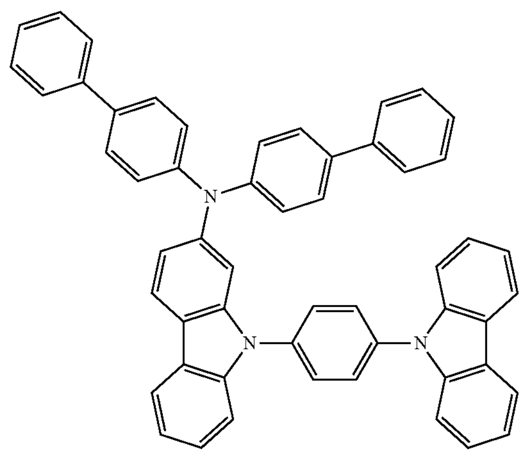
(A7)
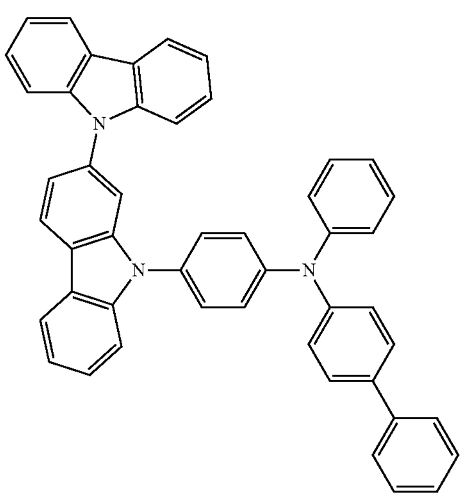
(A8)
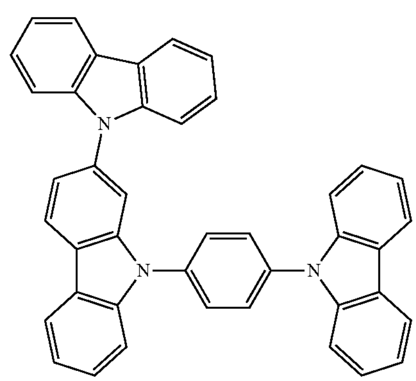

-continued
(A9)
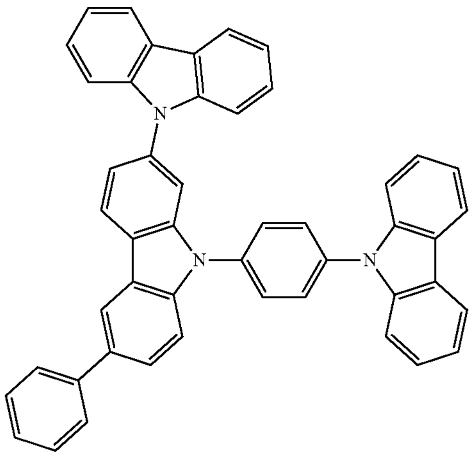
(A10)
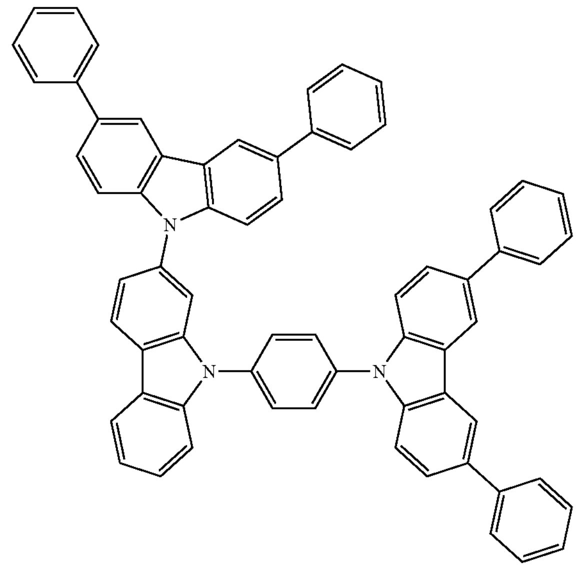
(A11)
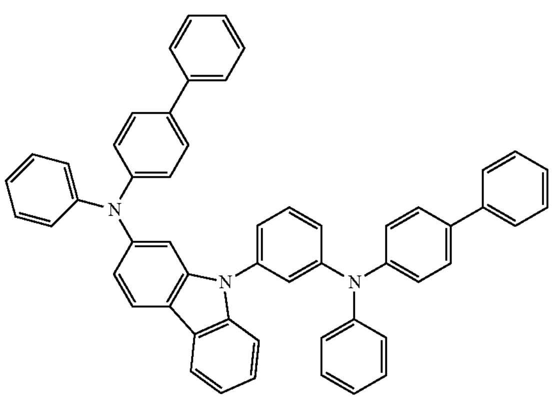
(A12)
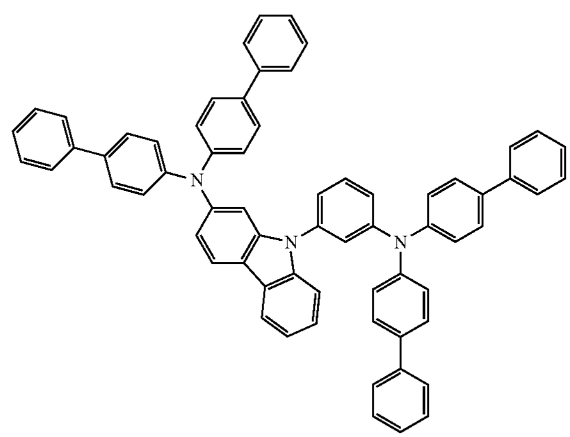
(A13)
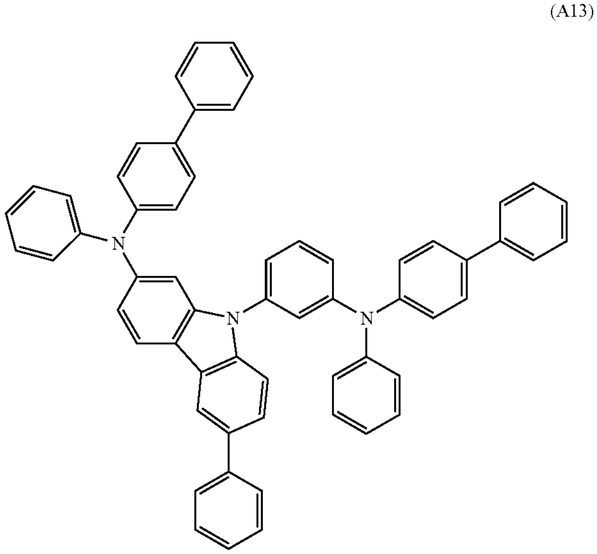
(A14)
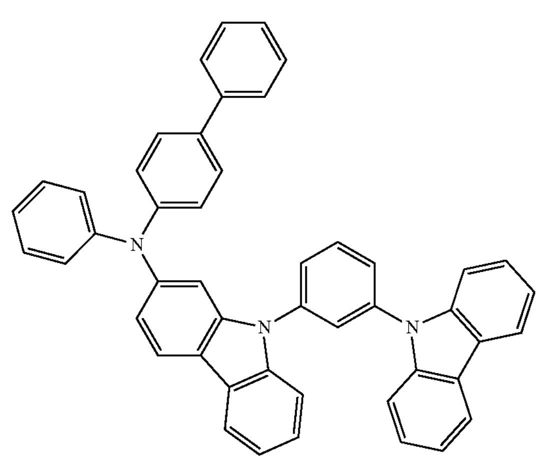

-continued
(A15)
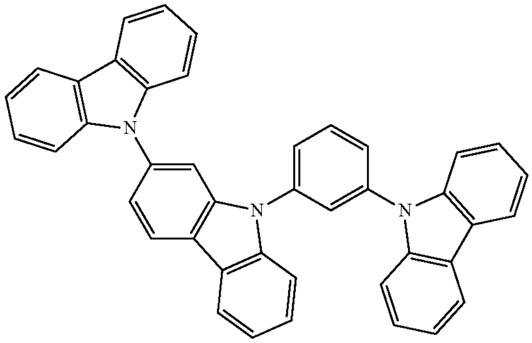
(A16)
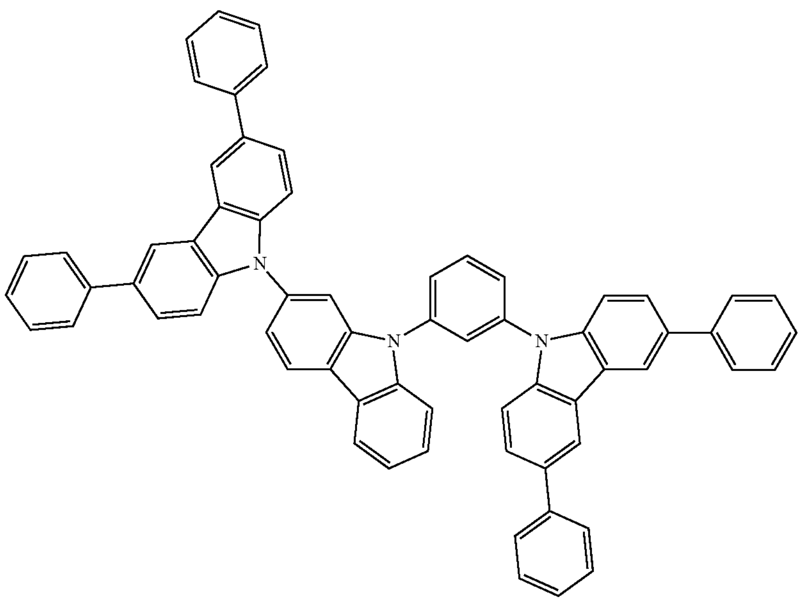
(A17)
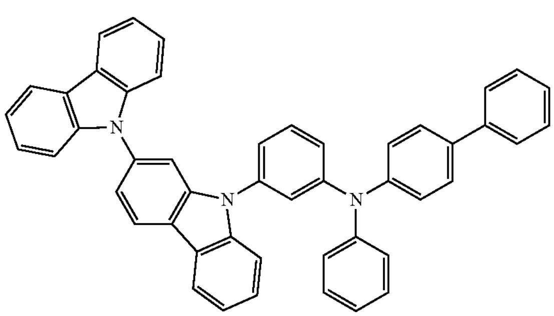
(A18)
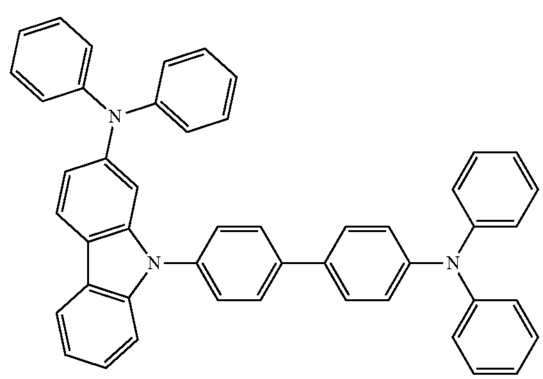

-continued
(A19)
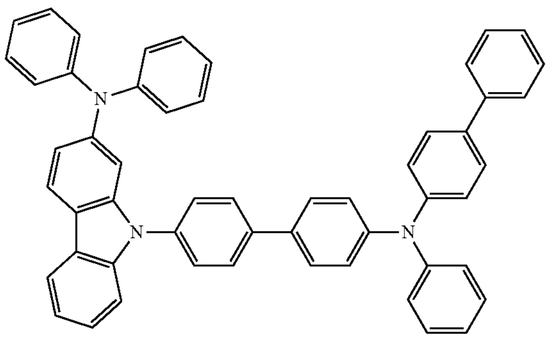
(A20)
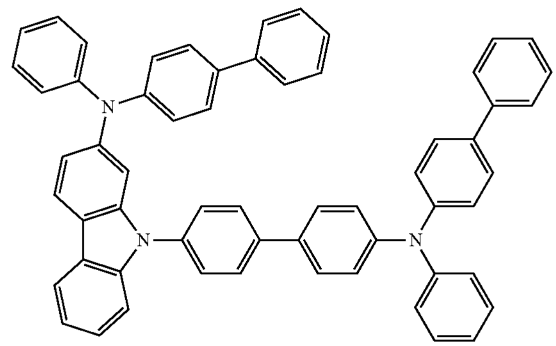
(A21)
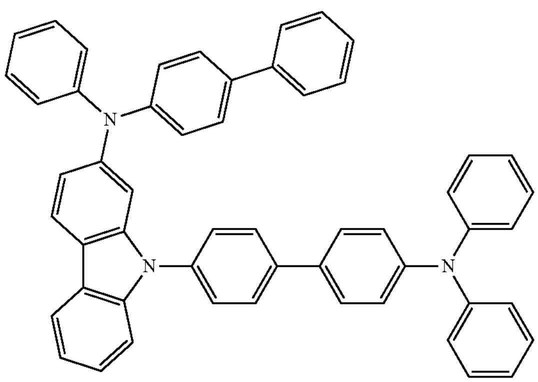
(A22)
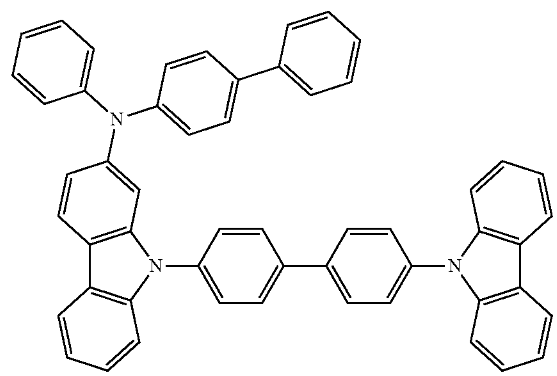
(A23)
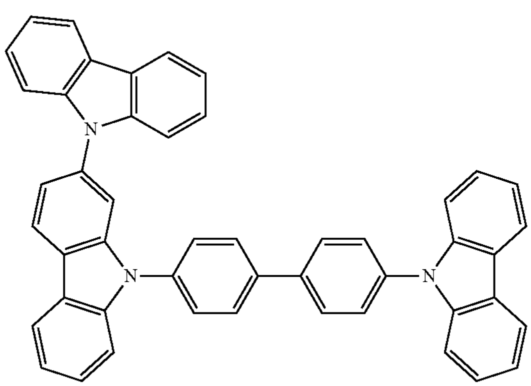
(A24)
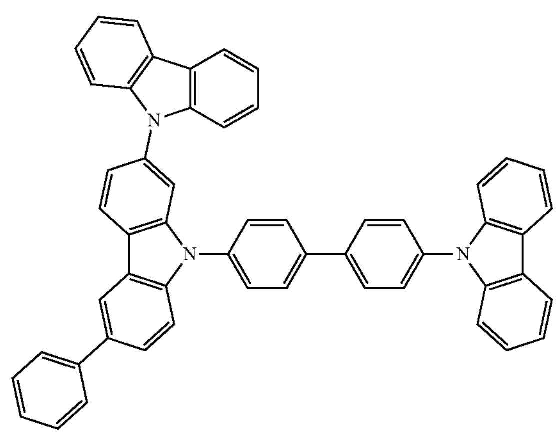

-continued
(A25)
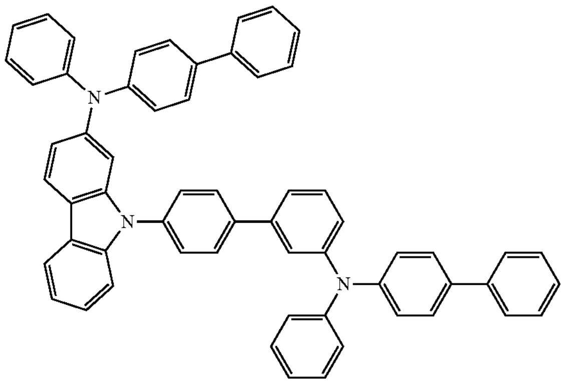
(A26)
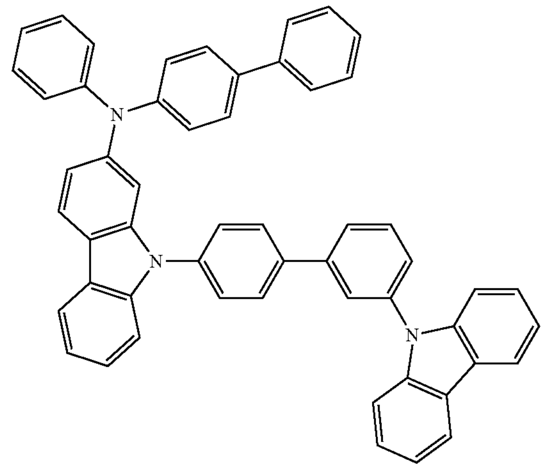
(A27)
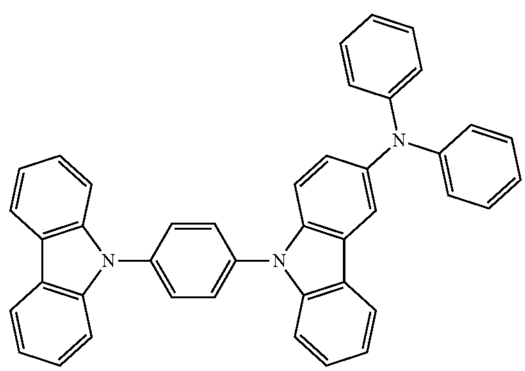
(B1)
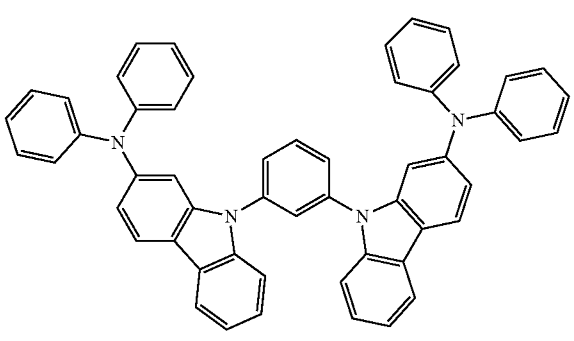
(B2)
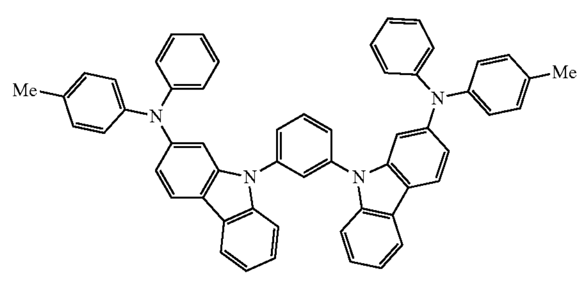

-continued
(B3)
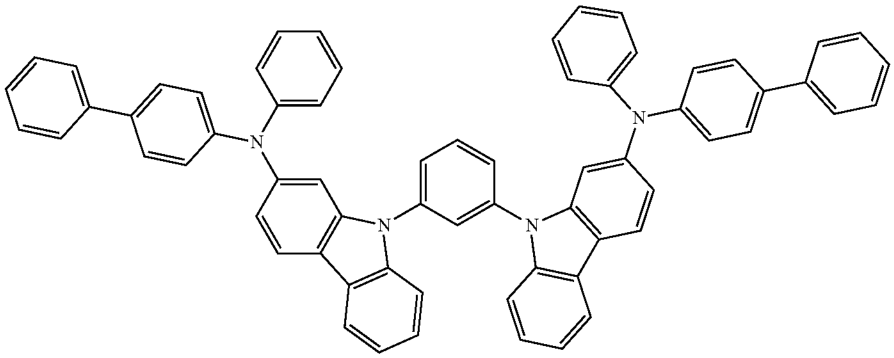
(B4)
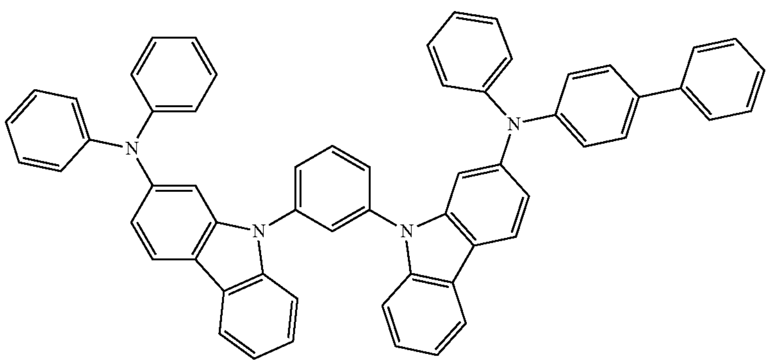
(B5)
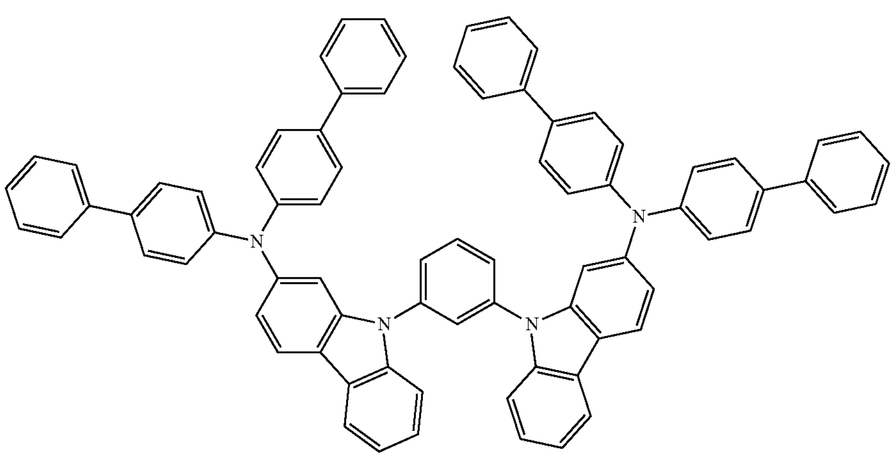

-continued
(B6)
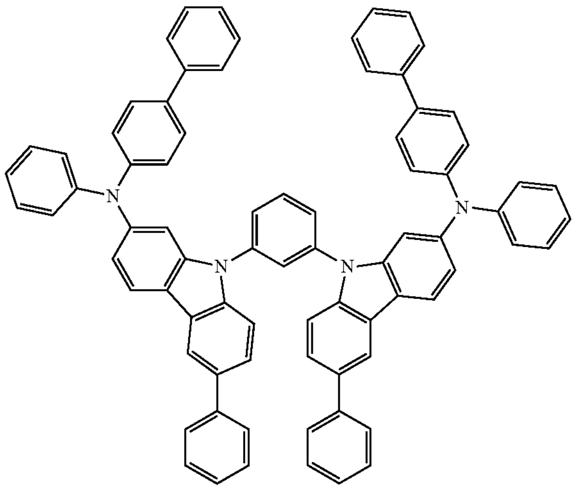
(B8)
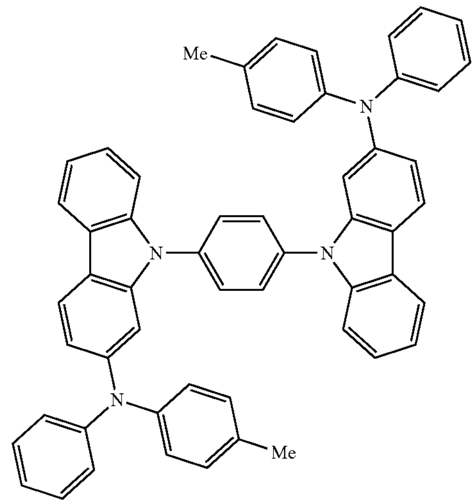
(B9)
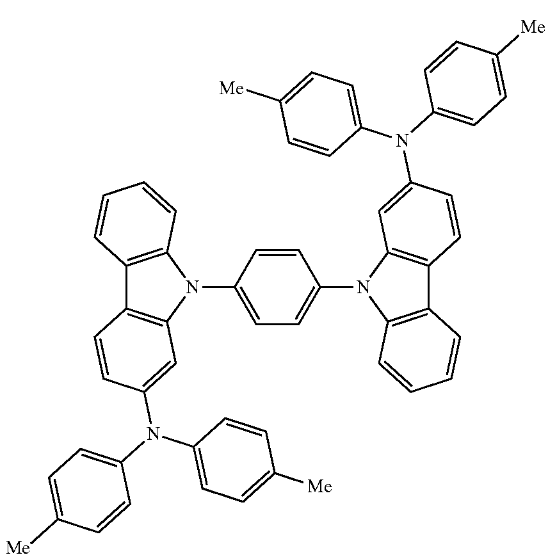
(B11)
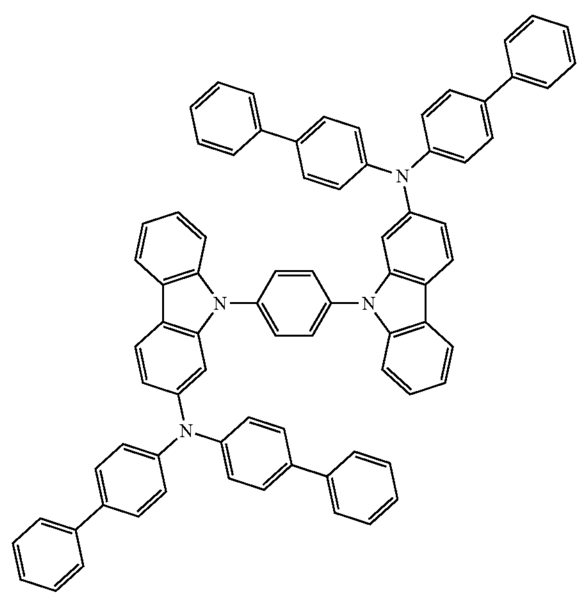

-continued
(B12)
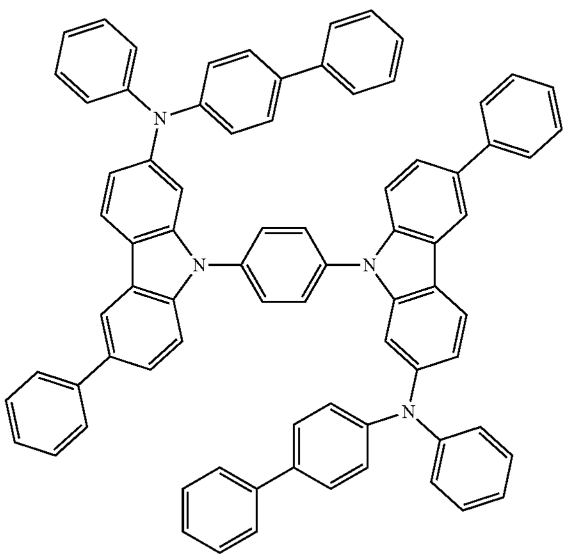
(B13)
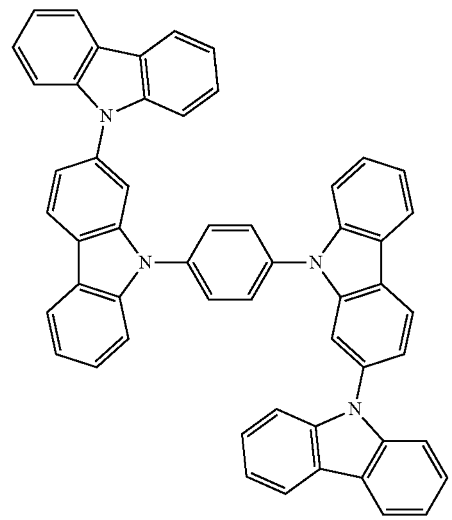
(B14)
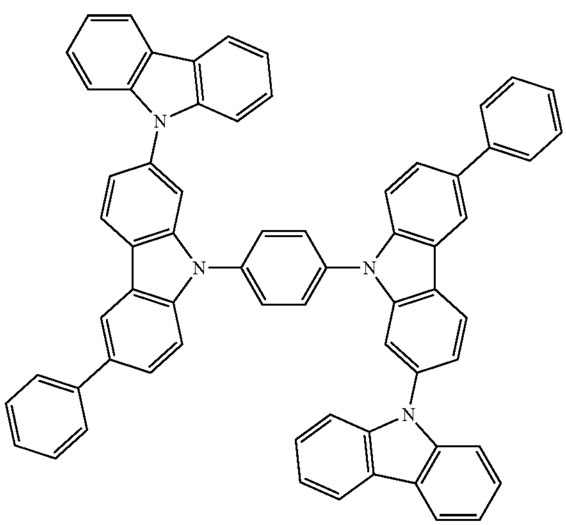
(B15)
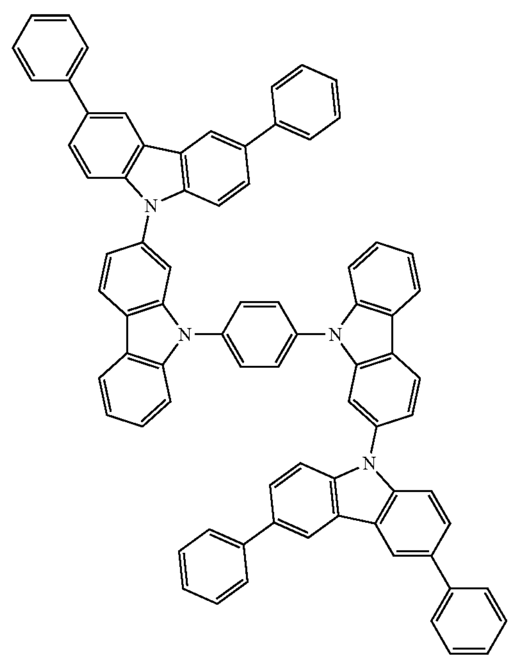
(B16)
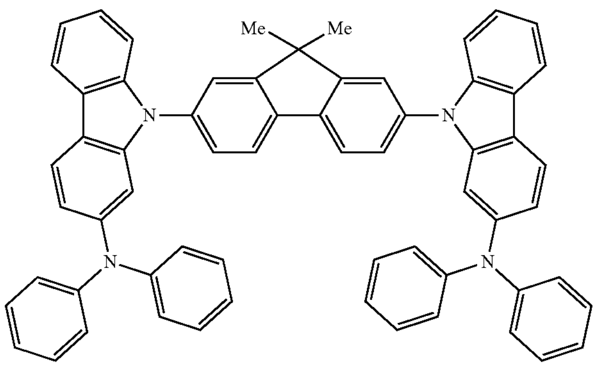

-continued
(B17)
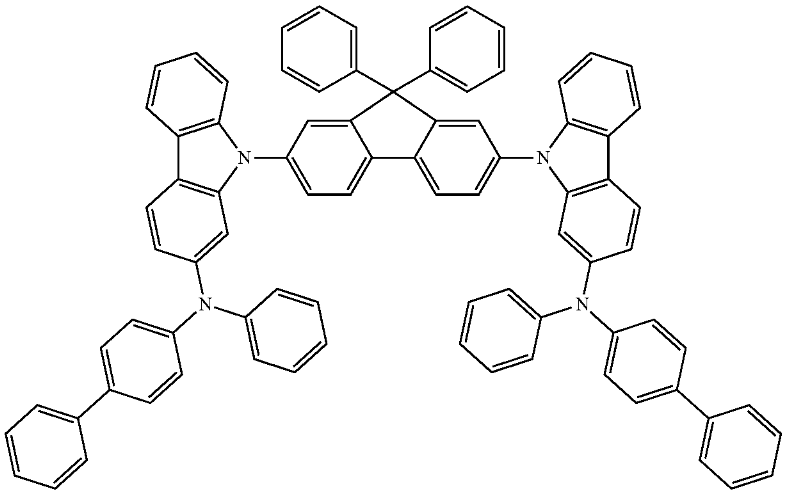
(B18)
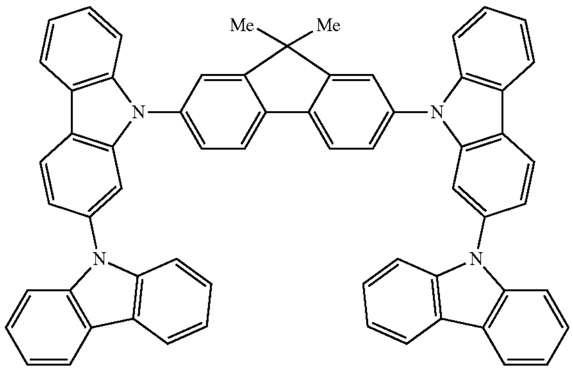
(B19)
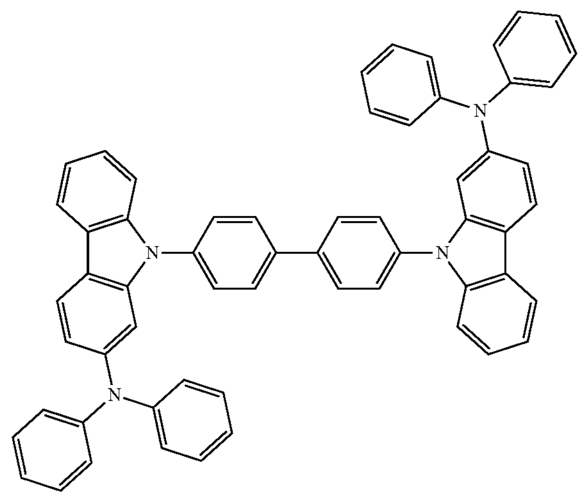
(B20)
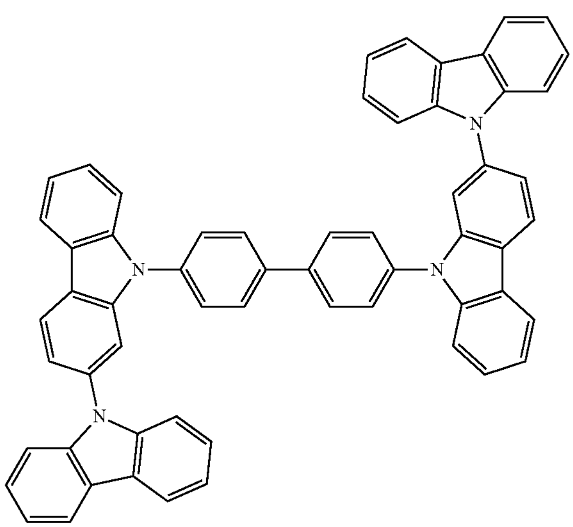
(B21)
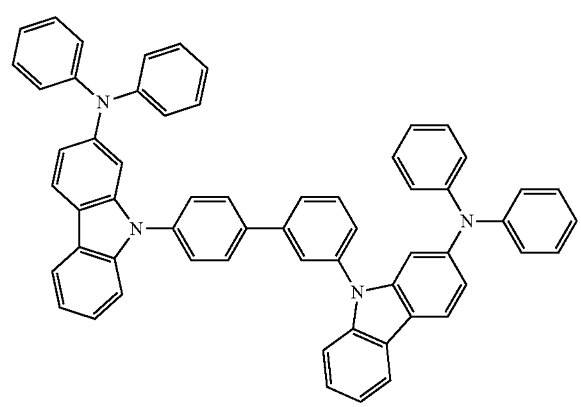

-continued
(B22)
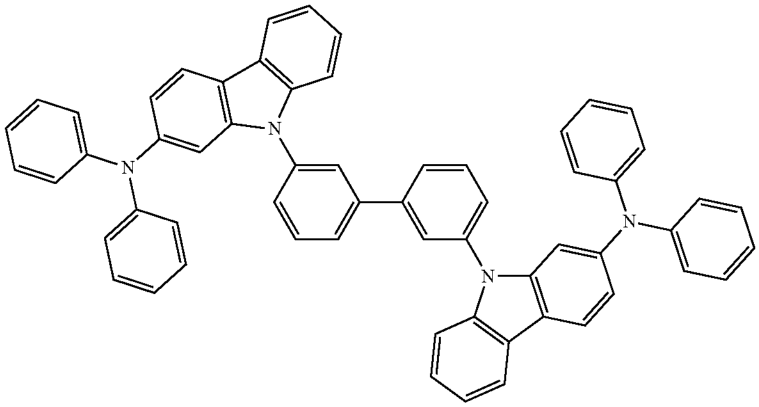
(B23)
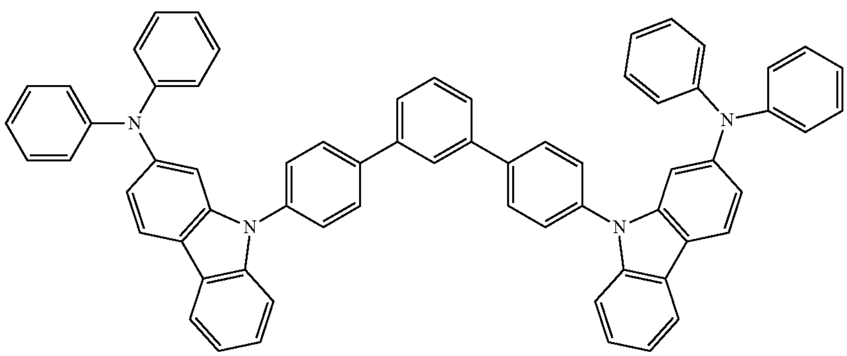
(B24)
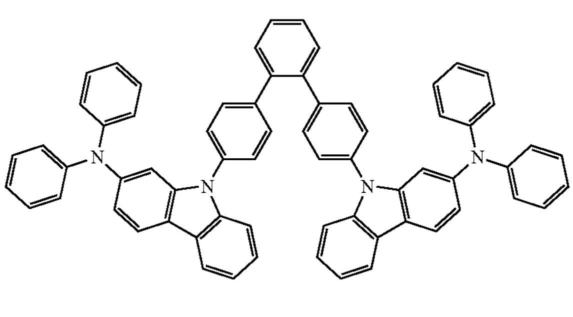
(B25)
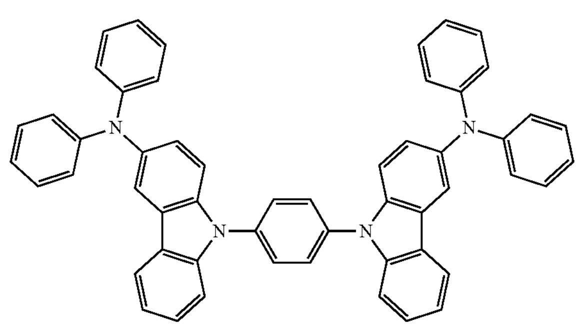

-continued
(C1)
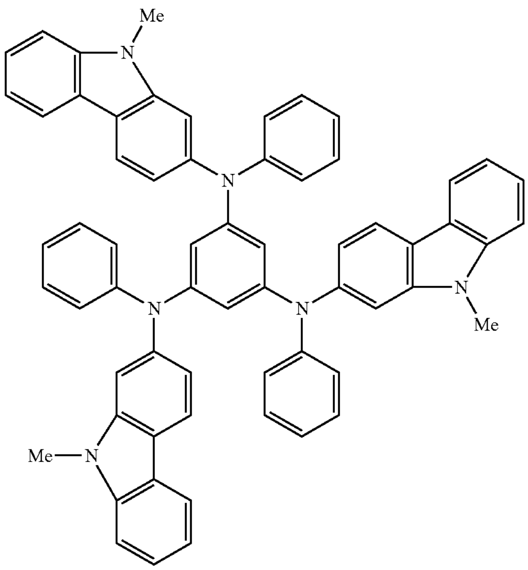
(C2)
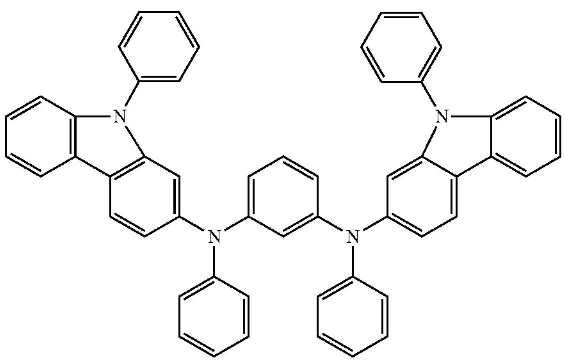
(C4)
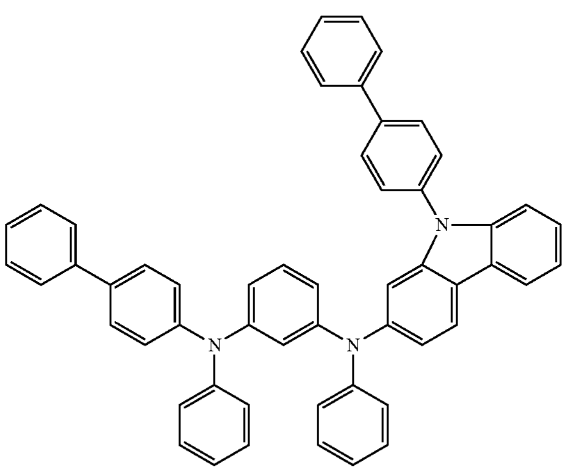
(C5)
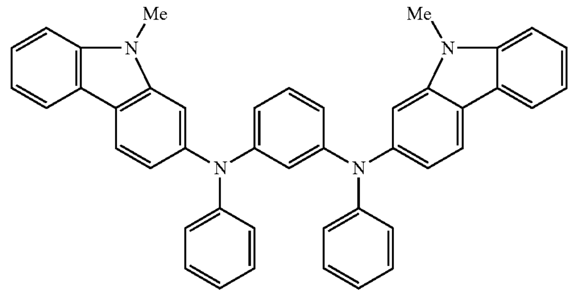
(C7)
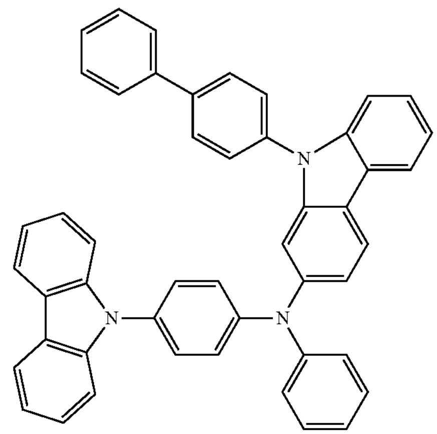
(C8)
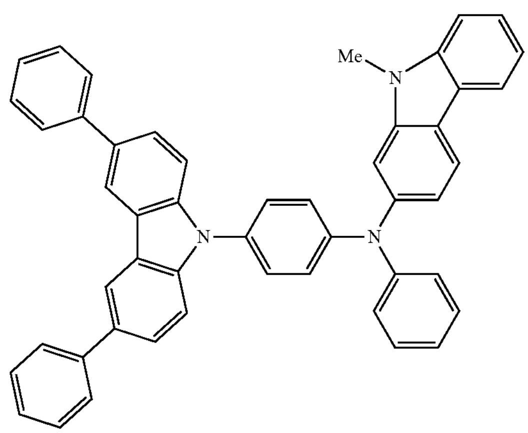

-continued
(C9)
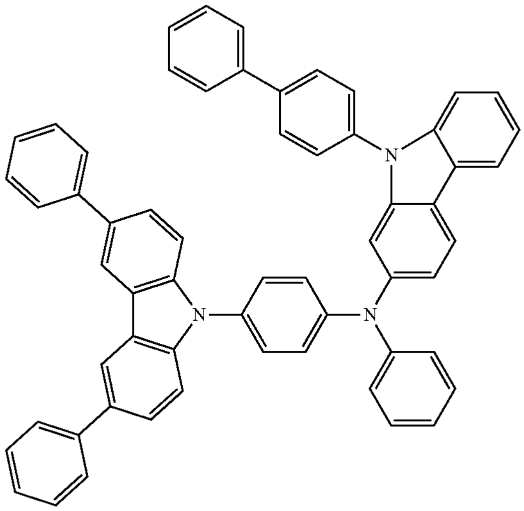
(C10)
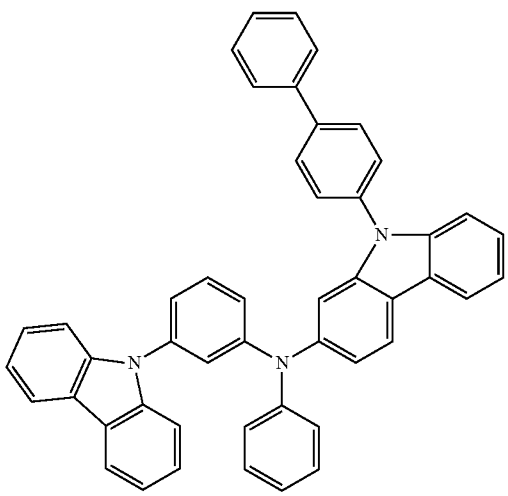
(C11)
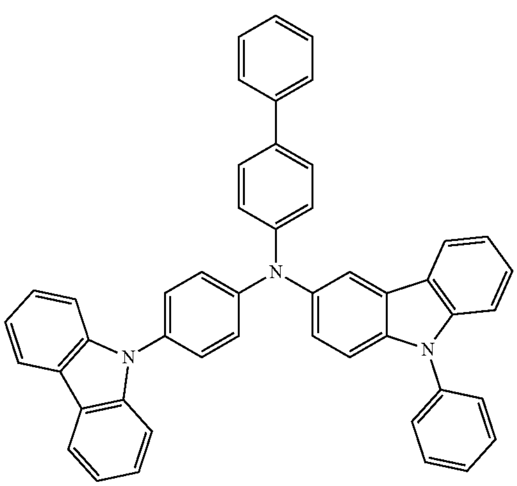
-continued
(C12)
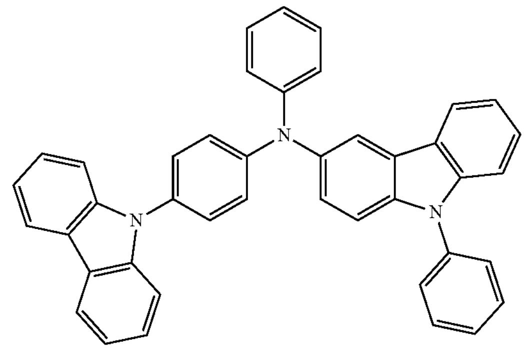
(C13)
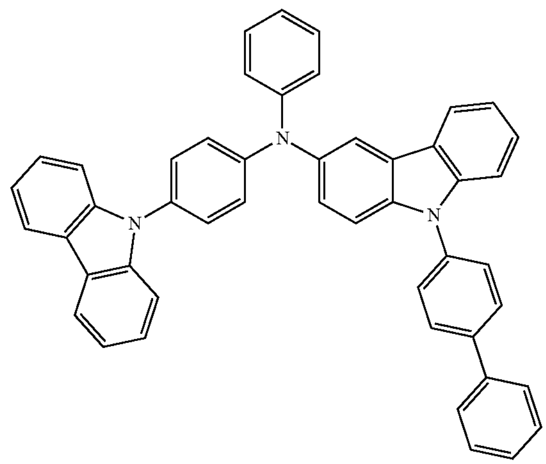
(C14)
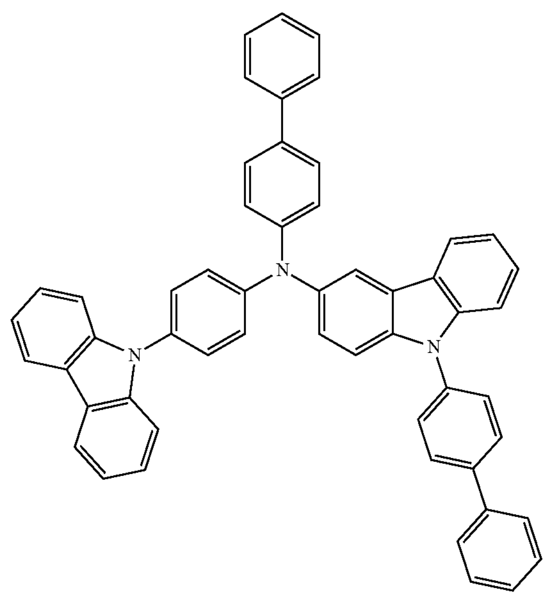

-continued
(C15)
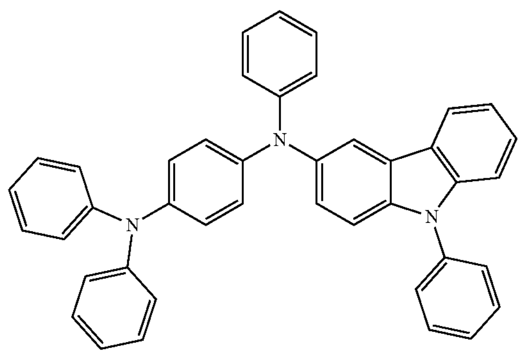
(C16)
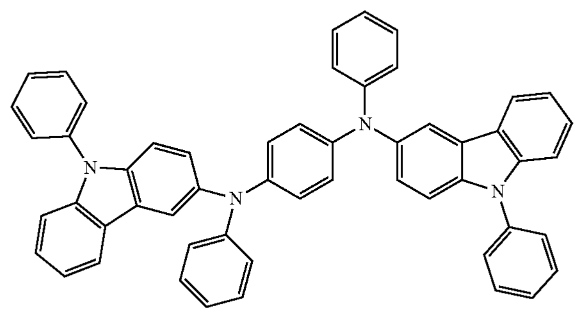
(D1)
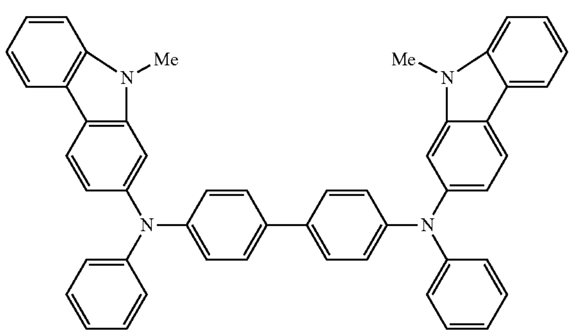
(D2)
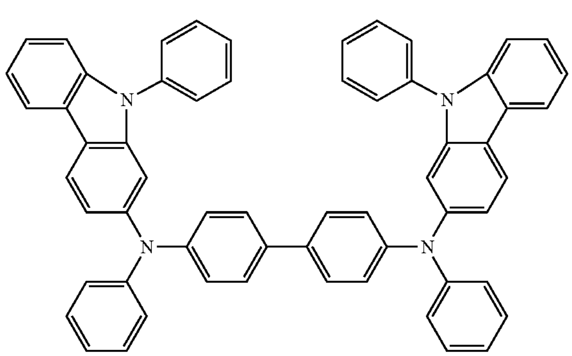
-continued
(D4)
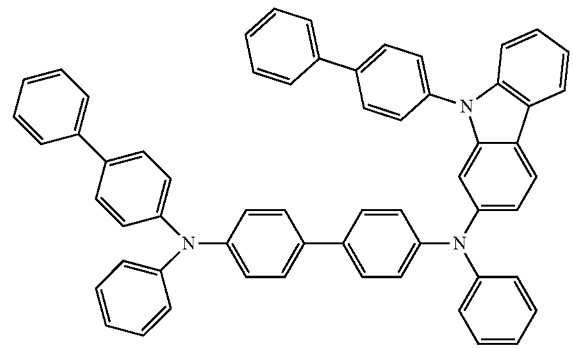
(D5)
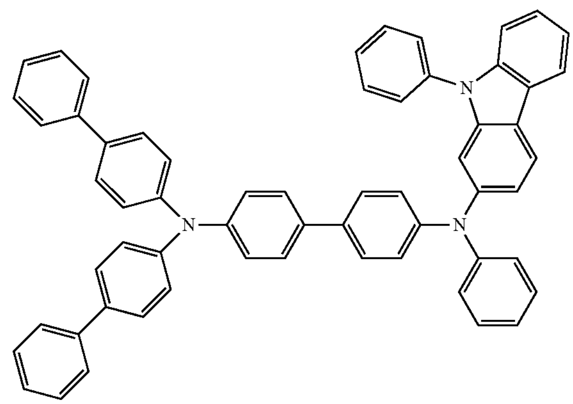
(D6)
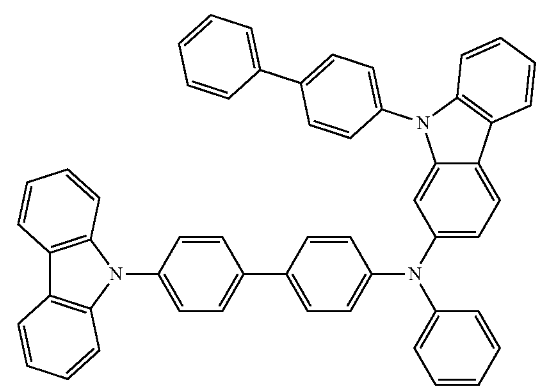
(D7)
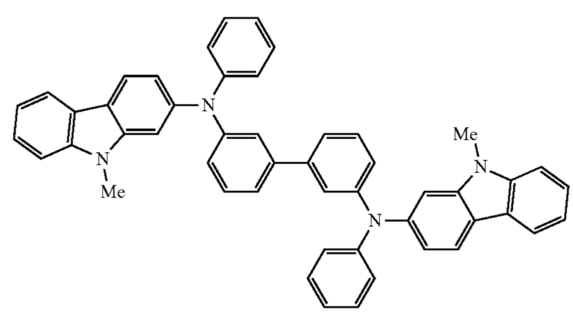

-continued
-continued
(D8)
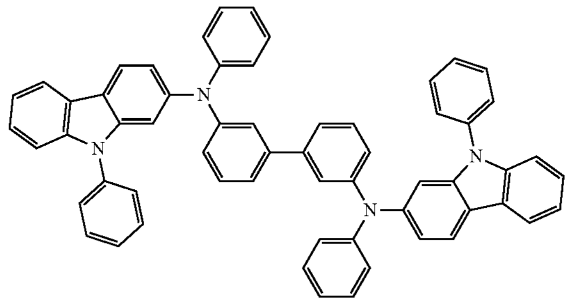
(D9)
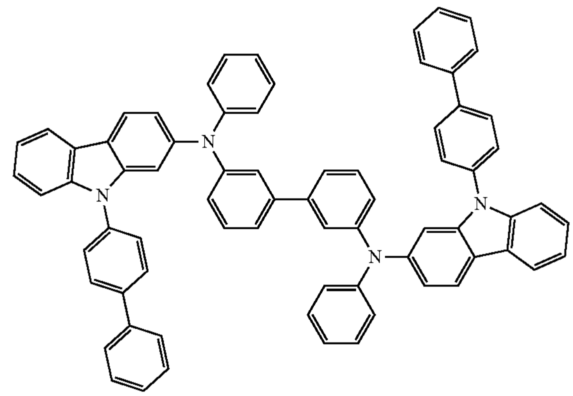
(E1)
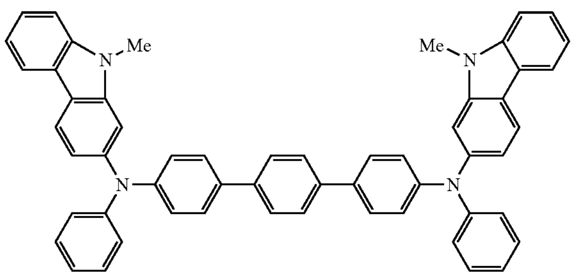
(E2)
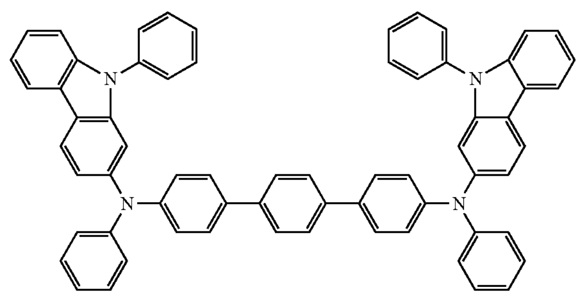
(E3)
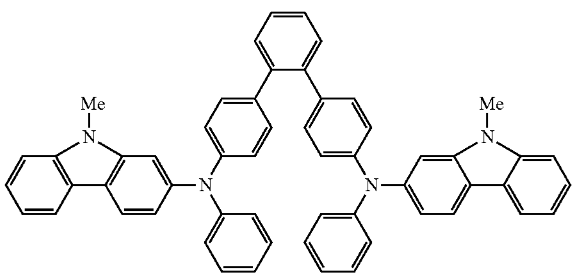
(E4)
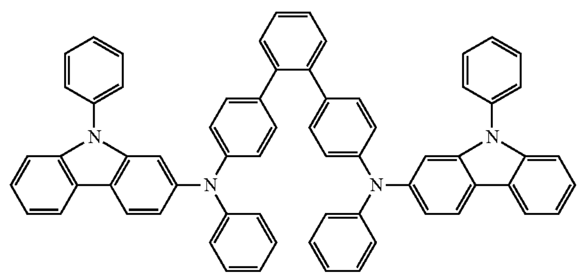
(E5)
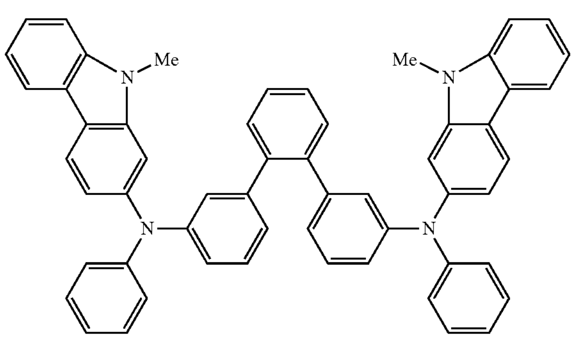
(E6)
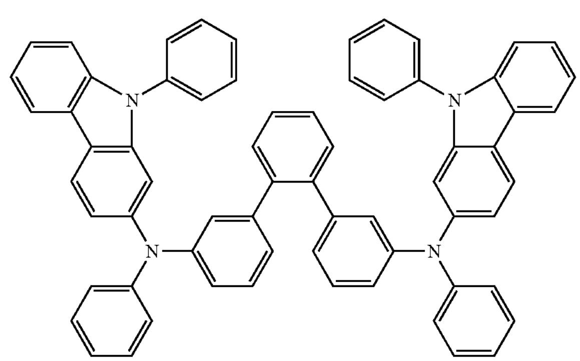

-continued
(E8)
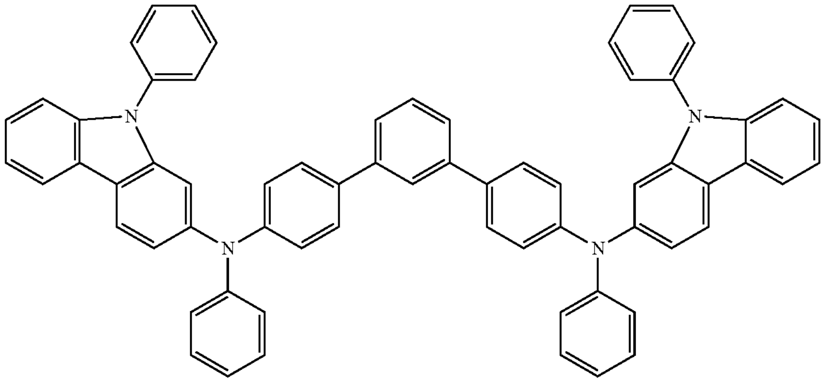
(E9)
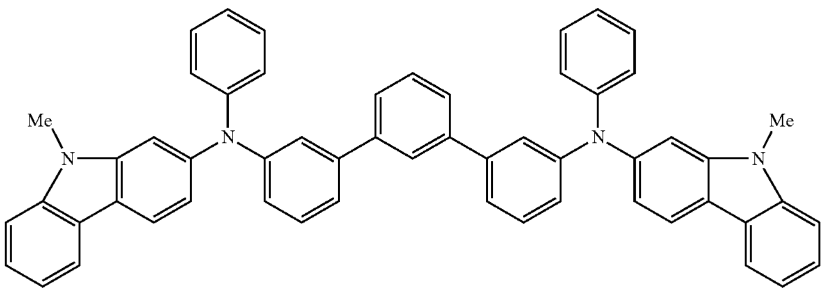
(E10)
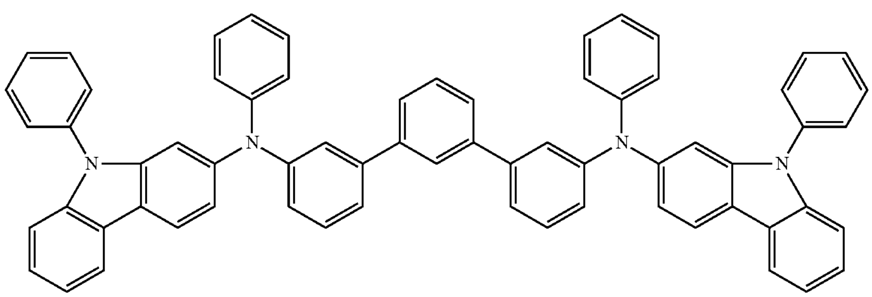
(F 2)
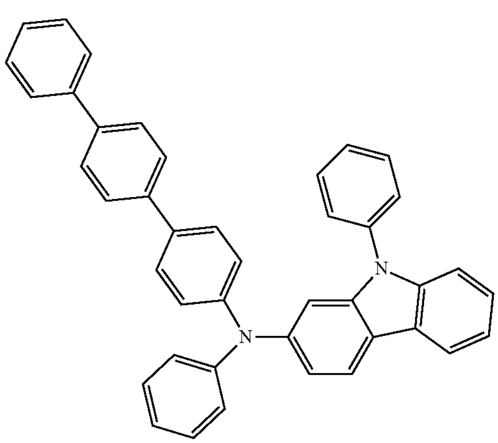
(F 3)
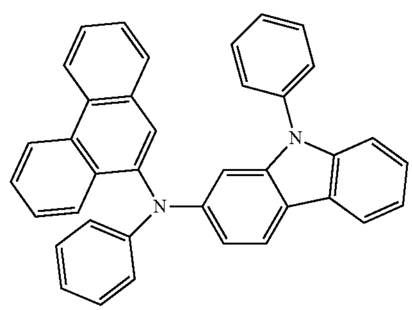

-continued
(F 4)
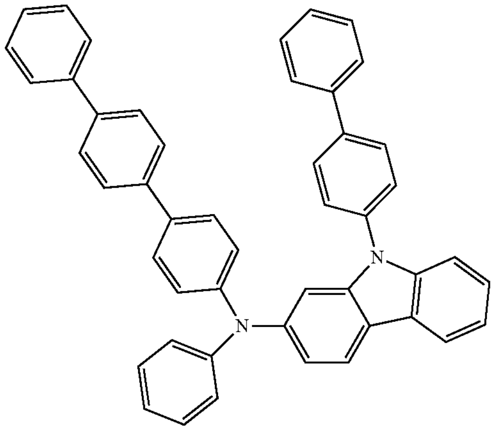
(F 5)
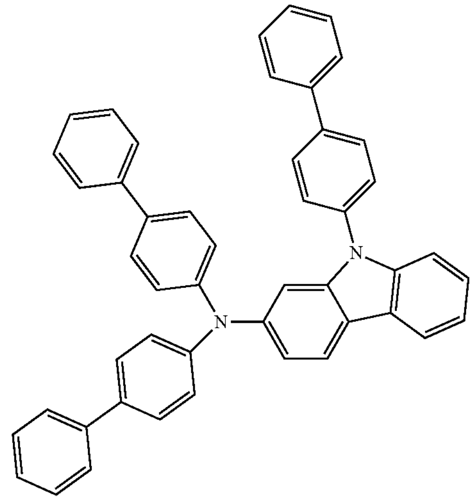
(F 6)
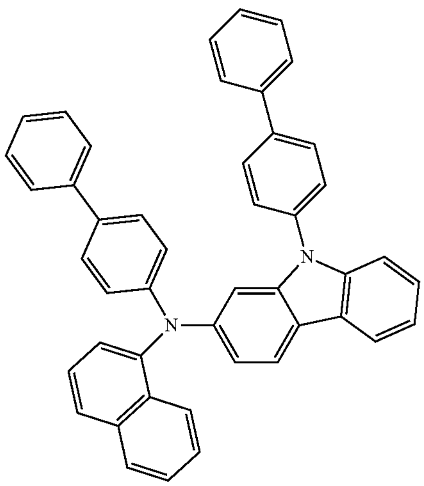
(F 7)
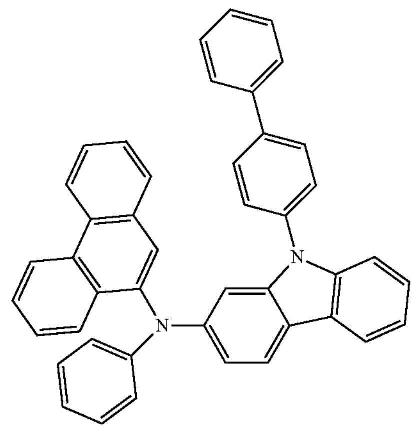
(F 9)
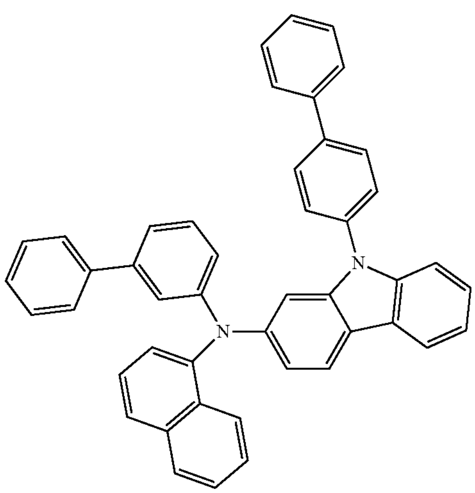
(F 10)
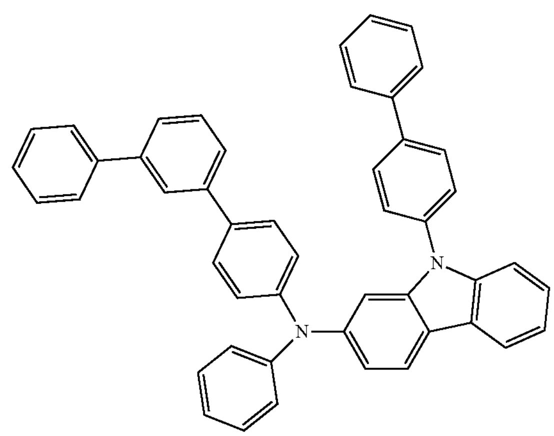

-continued
(F 12)
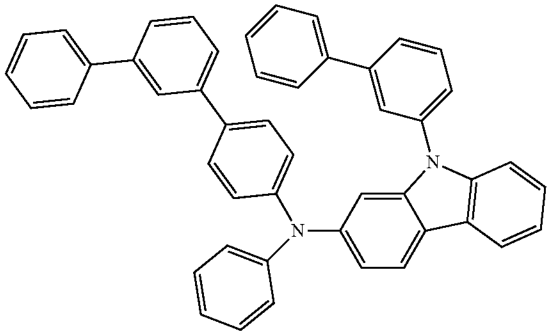
(F 13)
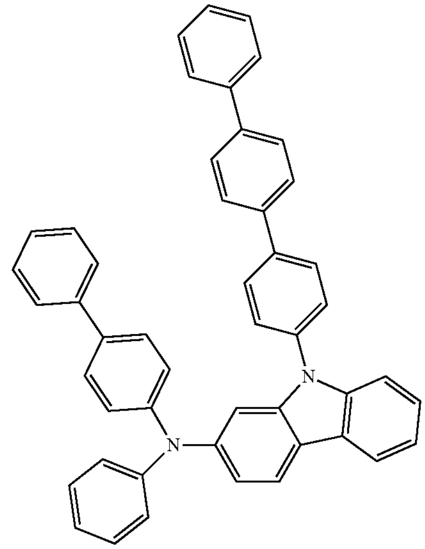
(F 14)
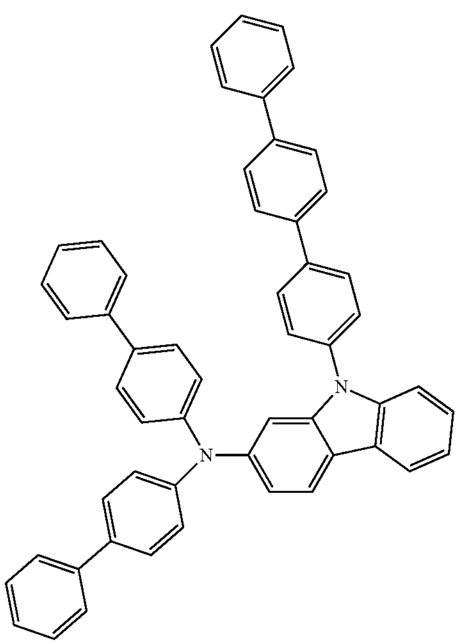
(F 15)
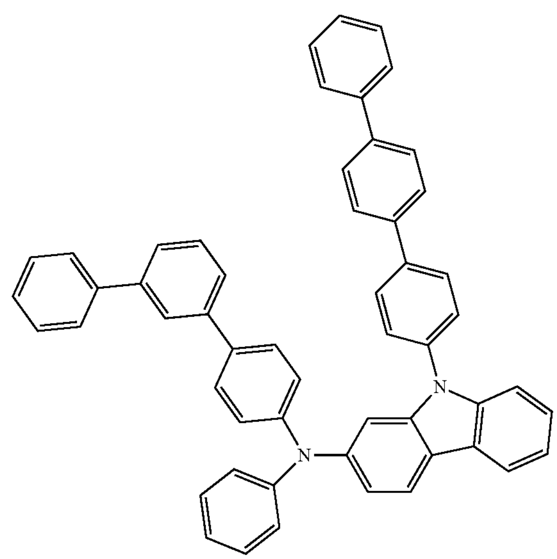

-continued
(F 16)
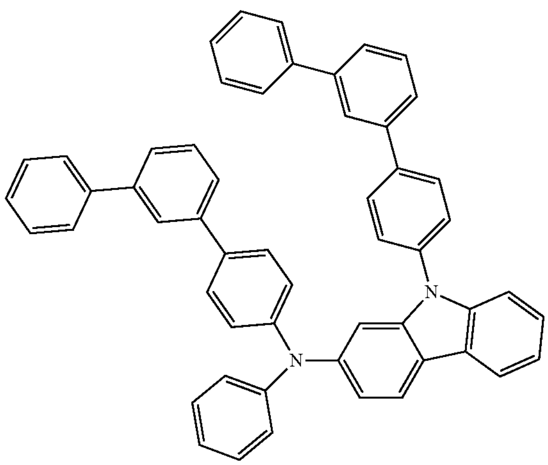
(F 17)
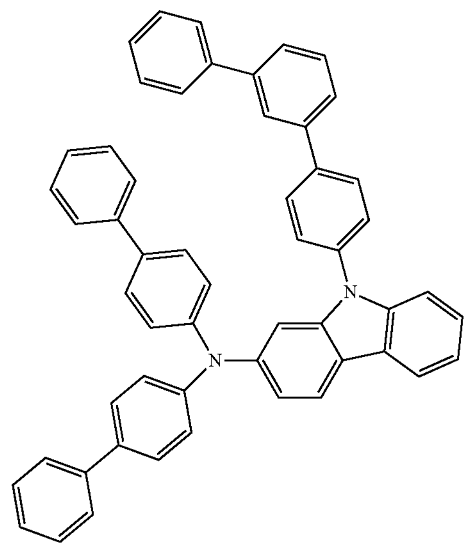
(F 18)
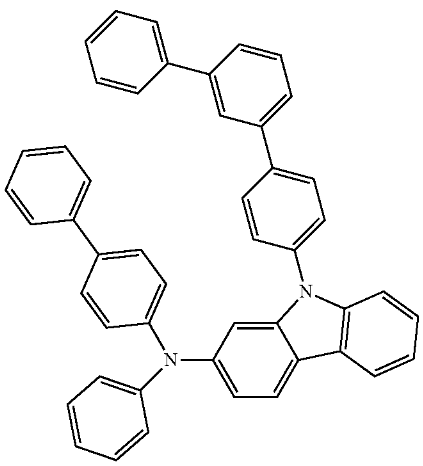
(F 19)
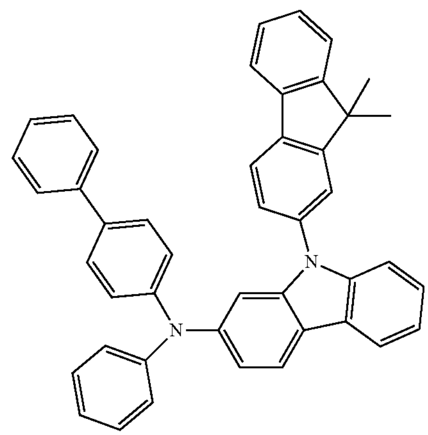
(F 20)
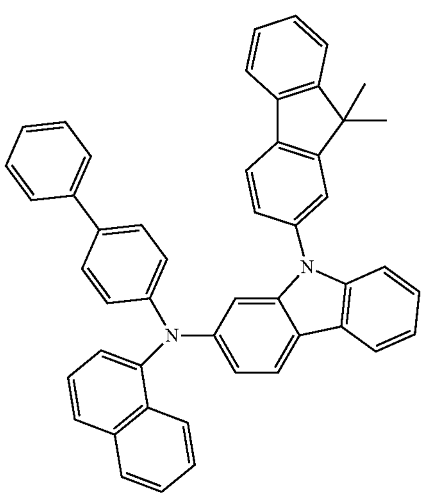
(F 21)
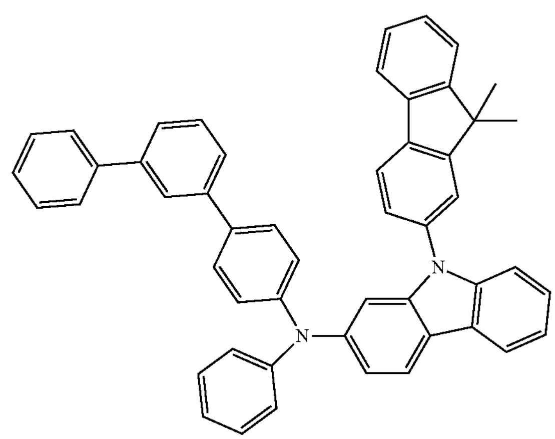

-continued
(F 22)
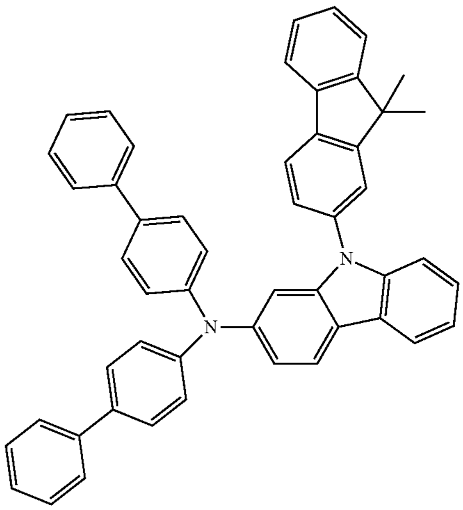
(F 23)
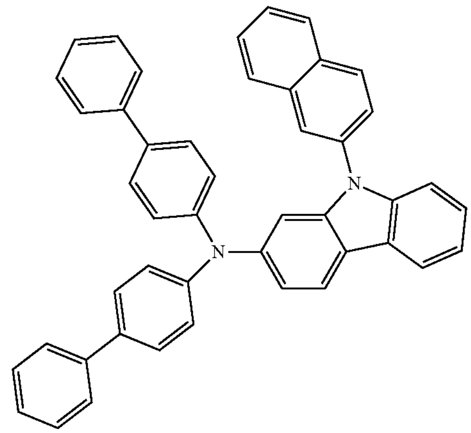
(F 24)
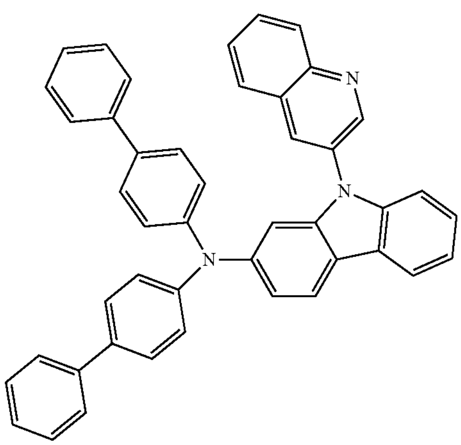
(F 25)
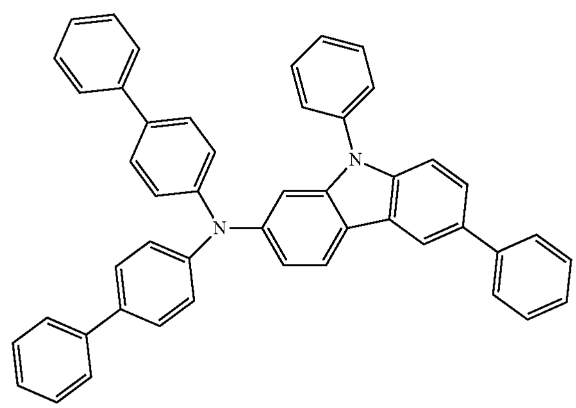
(F 26)
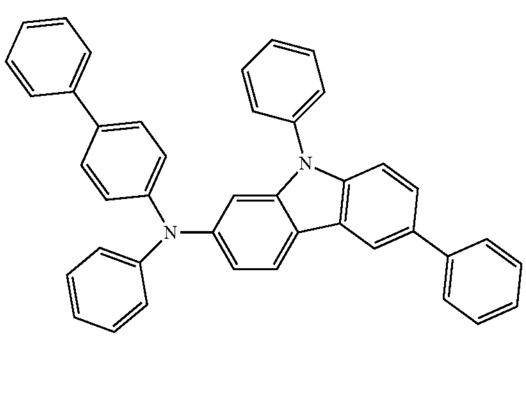
(F 27)
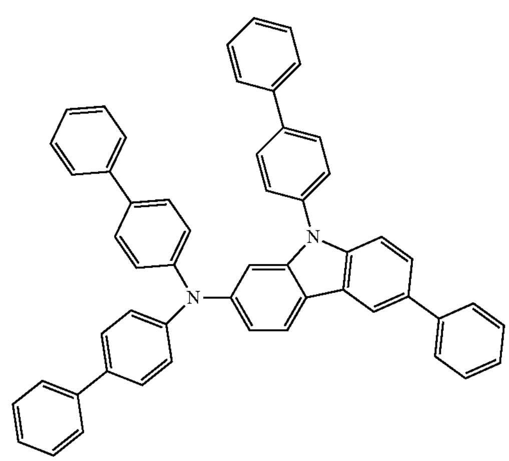

-continued (F 28)

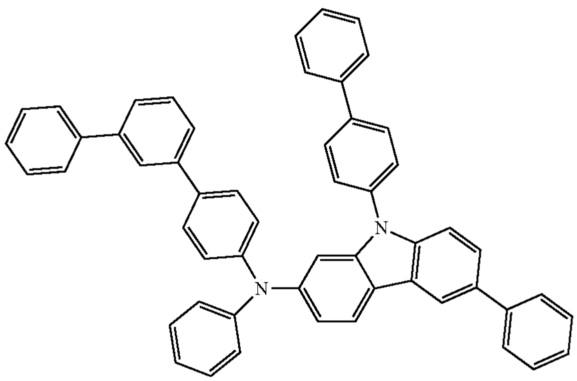

(F 29)

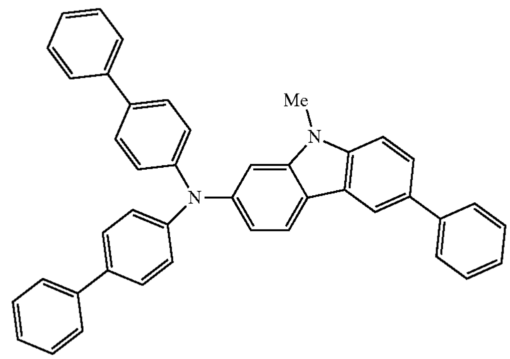

(F 30)

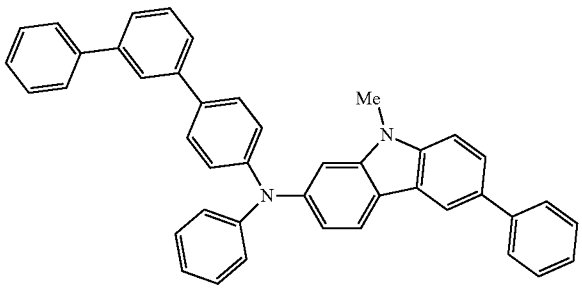

(F 32)

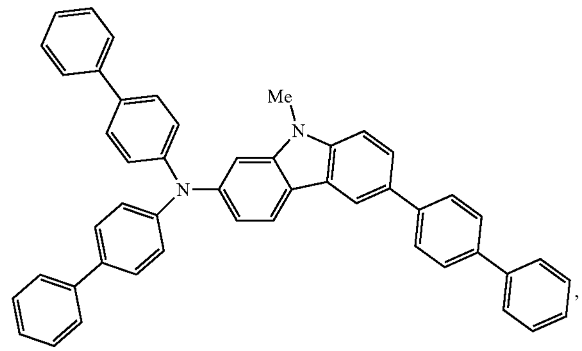

wherein, in Formula 1-1, Formula 1-2, and Formula 2, $A_{21}$ to $A_{24}$ are each independently selected from a $C_5$-$C_{20}$ carbocyclic group and a $C_1$-$C_{20}$ heterocyclic group, $X_{11}$ is $N[(L_{11})_{a11}$-$Ar_{11}]$, $X_{12}$ is selected from $N[(L_{12})_{a12}$-$Ar_{12}]$, $C(Ar_{14})(Ar_{16})$, O, and S, $X_{21}$ is selected from $N[(L_{22})_{a22}$-$Ar_{22}]$, $C(Ar_{23})(Ar_{24})$, O, and S, $A_{11}$ to $A_{13}$ are each independently selected from a benzene, a naphthalene, a phenanthrene, an anthracene, a pyridine, a pyrimidine, a quinoline, an isoquinoline, naphthyridine, a quinoxaline, a phthalazine, a quinazoline and a cinnoline, when $X_{12}$ is S or O, $A_{12}$ is a benzene, a phenanthrene, an anthracene, a pyridine, a pyrimidine, a quinoline, an isoquinoline, naphthyridine, a quinoxaline, a phthalazine, a quinazoline, or a cinnoline, a11 is 1, and $(L_{11})_{a11}$-$Ar_{11}$ is a phenyl group substituted with one selected from a biphenyl group and an alkyl group, a12 is an integer selected from 1 to 5, $L_{12}$, $L_{21}$, $L_{22}$, and $L_{26}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, wherein, when $X_{12}$ is $N[(L_{12})_{a12}$-$Ar_{12}]$, and $A_{11}$ to $A_{13}$ are each a benzene, $L_{12}$ is selected from a pentalenylene group, an indenylene group, an azulenylene group, a heptalenylene group, an indacenylene group, an acenaphthylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiazolylene group, an isothiazolylene group, an oxazolylene group, an isoxazolylene group, an isoindolylene group, an indolylene group, an indazolylene group, a purinylene group, a benzoquinolinylene group, a phthalazinylene group, a naphthyridinylene group, a quinoxalinylene group, a cinnolinylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a tetrazolylene group, a dibenzofuranylene group, a dibenzothiophenylene group, a benzocarbazolylene group, a dibenzocarbazolylene group, a thiadiazolylene group, an imidazopyridinylene group, an imidazopyrimidinylene group; and a pentalenylene group, an indenylene group, an azulenylene group, a heptalenylene group, an indacenylene group, an acenaphthylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiazolylene group, an isothiazolylene group, an oxazolylene group, an isoxazolylene group, an isoindolylene group, an indolylene group, an indazolylene group, a purinylene group, a benzoquinolinylene group, a phthalazinylene group, a naphthyridinylene group, a quinoxalinylene group, a cinnolinylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a tetrazolylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a biphenyl group, a terphenyl group, a pentalenyl group, an indenyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyrazinyl group, a pyridazinyl group, an isoindolyl group, an indolyl group, an indazolyl group, a purinyl group, a benzoquinolinyl group, a phthalazinyl group, a naphthyridinyl group, a quinoxalinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group, a21, a22, and a26 are each independently an integer selected from 0 to 5, $Ar_{12}$ is selected from a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), and —B($Q_6$)($Q_7$), and $Ar_{14}$, $Ar_{16}$, and $Ar_{21}$ to $Ar_{24}$ are each independently selected from a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_4$)($Q_5$), and —B($Q_6$)($Q_7$), provided that:

when $X_{12}$ is N[$(L_{12})_{a12}$-$Ar_{12}$] and $A_{11}$ to $A_{13}$ are each a benzene, $Ar_{12}$ is selected from a $C_1$-$C_{20}$ alkyl group and a $C_1$-$C_{20}$ alkoxy group;

a phenyl group, a biphenyl group, a terphenyl group, a pentalenyl group, an indenyl group, a naphthyl group, an azulenyl group, a heptalenyl group, an indacenyl group, an acenaphthyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiazolyl group, an isothiazolyl group, an oxazolyl group, an isoxazolyl group, an isoindolyl group, an indolyl group, an indazolyl group, a purinyl group, a benzoquinolinyl group, a phthalazinyl group, a naphthyridinyl group, a quinoxalinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a tetrazolyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, an imidazopyrimidinyl group, and —Si($Q_1$)($Q_2$)($Q_3$); and a phenyl group, a biphenyl group, a terphenyl group, a pentalenyl group, an indenyl group, a naphthyl group, an azulenyl group, a heptalenyl group, an indacenyl group, an acenaphthyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiazolyl group, an isothiazolyl group, an oxazolyl group, an isoxazolyl group, an isoindolyl group, an indolyl group, an indazolyl group, a purinyl group, a benzoquinolinyl group, a phthalazinyl group, a naphthyridinyl group, a quinoxalinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a tetrazolyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyrazinyl group, a pyridazinyl group, an isoindolyl group, an indolyl group, an indazolyl group, a purinyl group, a benzoquinolinyl group, a phthalazinyl group, a naphthyridinyl group, a quinoxalinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, a dibenzosilolyl group, and —Si($Q_{41}$)($Q_{42}$)($Q_{43}$), provided that when $Ar_{12}$ is an unsubstituted phenyl group, an unsubstituted naphthyl group, an unsubstituted biphenyl group, a phenyl group substituted with at least one selected from a phenyl group and a naphthyl group, or a naphthyl group substituted with at least one selected from a phenyl group and a naphthyl group, $Ar_{11}$ is a phenyl group substituted with at least one selected from a cyclopentyl group, a cyclohexyl group, a cycloheptyl group, a cyclopentenyl group, a cyclohexenyl group, and a t-butyl group, and when $X_{12}$ is C($Ar_{14}$)($Ar_{16}$), O, or S, and $A_{11}$ to $A_{13}$ are each a benzene or a naphthalene, $Ar_{11}$ is a $C_1$-$C_{20}$ alkyl group;

$R_{11}$ to $R_{13}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted monovalent non-aromatic condensed polycyclic group, a substituted or unsubstituted monovalent non-aromatic condensed heteropolycyclic group, —Si($Q_{11}$)($Q_{12}$)($Q_{13}$), —N($Q_{14}$)($Q_{15}$), and —B($Q_{16}$)($Q_{17}$);

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, an indolyl group, a pyridinyl group, a pyrazinyl group, a pyrimidinyl group, a pyridazinyl group, a quinoxalinyl group, a carbazolyl group, a triazinyl group, a dibenzofuranyl group, a dibenzothiophenyl group, a benzocarbazolyl group, a dibenzocarbazolyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, an indolyl group, a pyridinyl group, a pyrazinyl group, a pyrimidinyl group, a pyridazinyl group, a quinoxalinyl group, a carbazolyl group, a triazinyl group, a dibenzofuranyl group, a dibenzothiophenyl group, a benzocarbazolyl group, and a dibenzocarbazolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, and a naphthyl group; and —Si($Q_{11}$)($Q_{12}$)($Q_{13}$) and —N($Q_{14}$)($Q_{15}$), $R_{21}$ to $R_{24}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{11}$)($Q_{12}$)($Q_{13}$), —N($Q_{14}$)($Q_{15}$), and —B($Q_{16}$)($Q_{17}$), b11 to b13, and b21 to b24 are each independently an integer selected from 0 to 8, and at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from the group consisting of:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-Coo alkenyl group, a $C_2$-$C_{60}$ alkynyl group, a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{21}$)($Q_{22}$)($Q_{23}$), —N($Q_{24}$)($Q_{25}$), and —B($Q_{26}$)($Q_{27}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{31}$)($Q_{32}$)($Q_{33}$), —N($Q_{34}$)($Q_{35}$), and —B($Q_{36}$)($Q_{37}$); and —Si($Q_{41}$)($Q_{42}$)($Q_{43}$), —N($Q_{44}$)($Q_{45}$), and —B($Q_{46}$)($Q_{47}$), wherein $Q_1$ to $Q_7$, $Q_{11}$ to $Q_{17}$, $Q_{21}$ to $Q_{27}$, $Q_{31}$ to $Q_{37}$, and $Q_{41}$ to $Q_{47}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group; and a $C_6$-$C_{60}$ aryl group, a $C_1$-$C_{60}$ heteroaryl group, a monovalent non-aromatic condensed polycyclic group and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkoxy group, a phenyl group, a biphenyl group, a terphenyl group, and a naphthyl group, and $Q_4$ and $Q_5$ are optionally linked to each other to form a saturated or unsaturated ring.

14. An organic light-emitting device comprising:

a first electrode;

a second electrode; and an organic layer comprising an emission layer between the first electrode and the second electrode, and a hole transport region between the first electrode and the emission layer, the hole transport region comprising a hole injection layer, a hole transport layer, and an emission auxiliary layer, the organic layer comprising: a first compound and a second compound; in addition to a third compound, the emission layer comprises the first compound and the second compound, wherein the emission auxiliary layer comprises the third compound, wherein the hole transport layer comprises a compound different from the third compound, wherein the first compound is represented by Formula 1-15, the second compound is represented by Formula 2, and the third compound is selected from Compounds A1, A4 to A27, B1 to B6, B8, B9, B11 to B25, C1, C2, C4, C5, C7 to $C_{16}$, D1, D2, D4 to D9, E1 to E6, E8, E9, E10, and F2 to F7, F9, F10, F12 to F30, and F32:

1-15
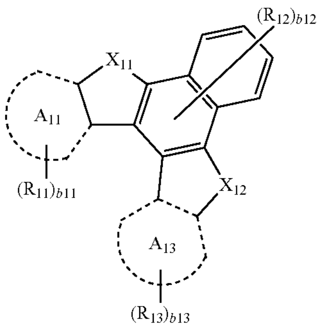
(A1)
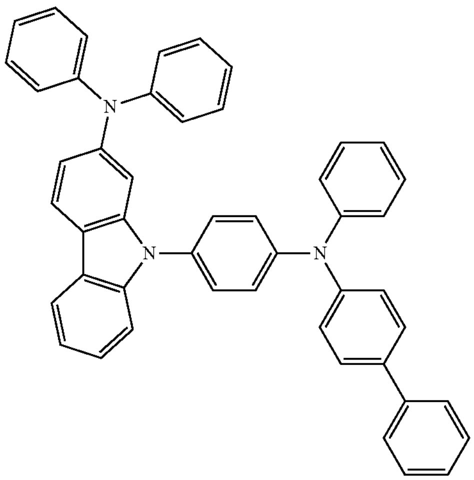
(A5)
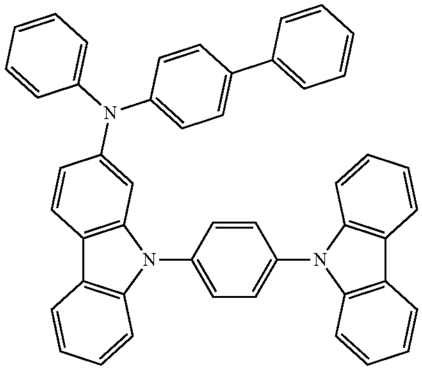
Formula 2
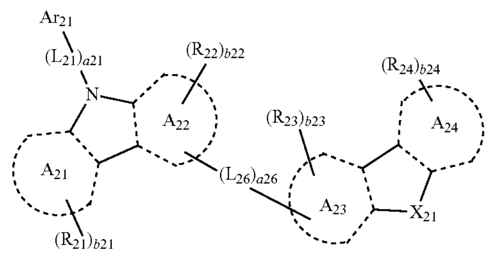
(A4)
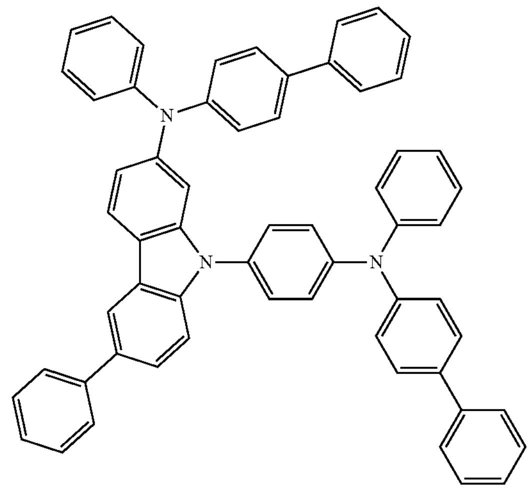
(A6)
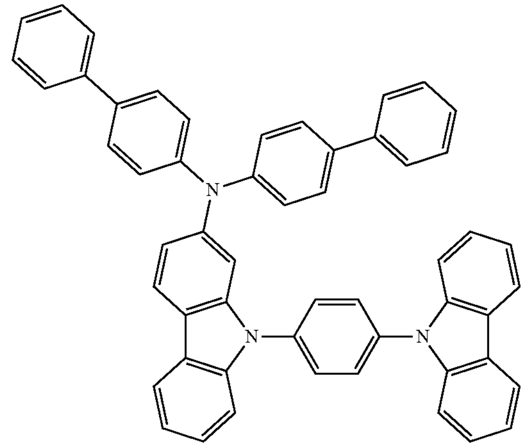

-continued
(A7)
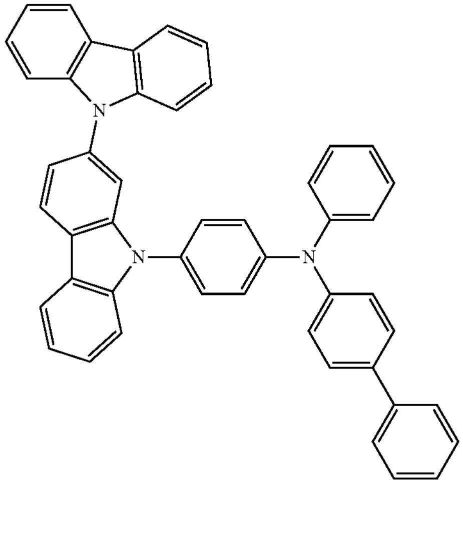
(A8)
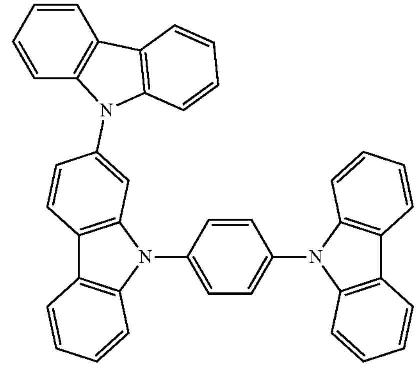
(A9)
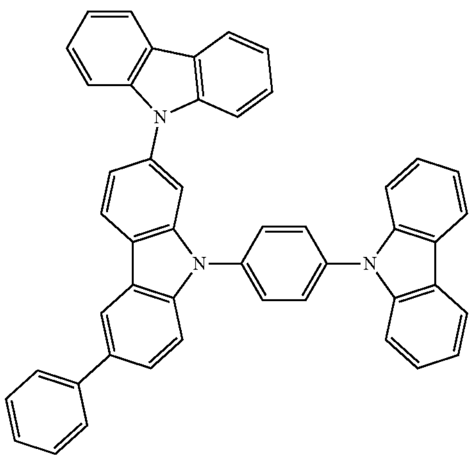
(A10)
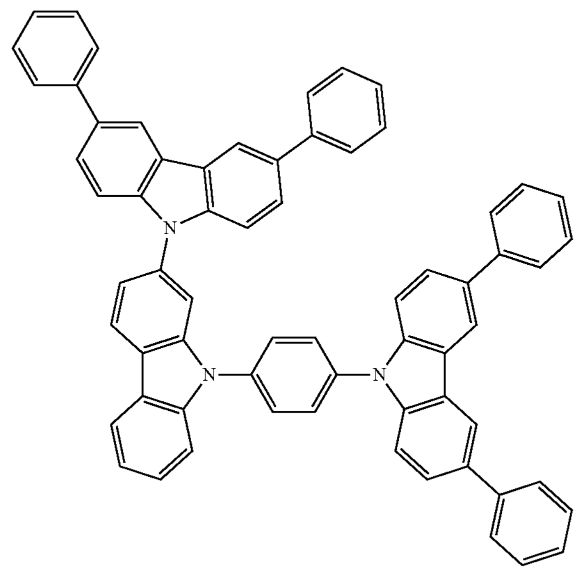
(A11)
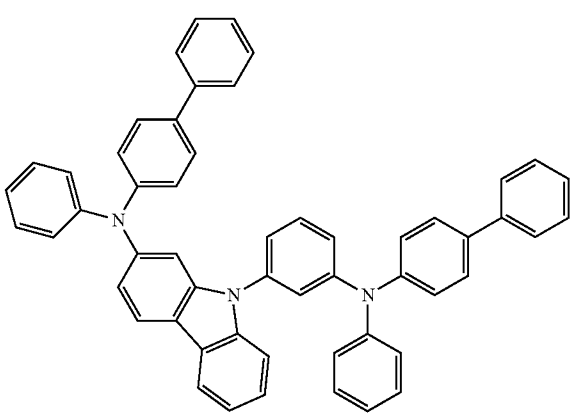
(A12)
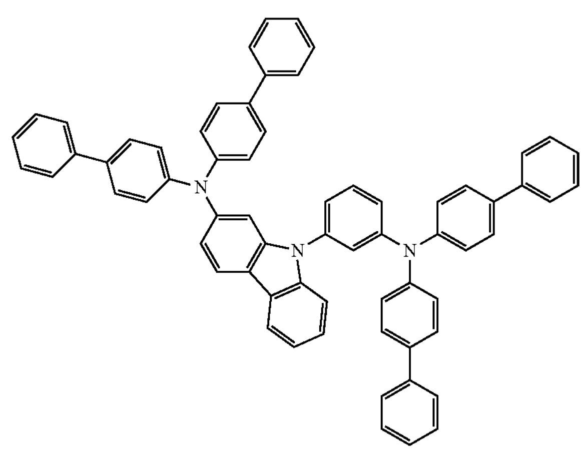

-continued
(A13)
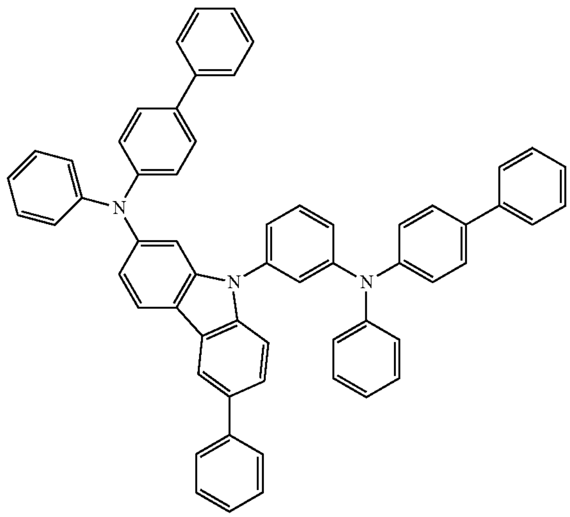
(A14)
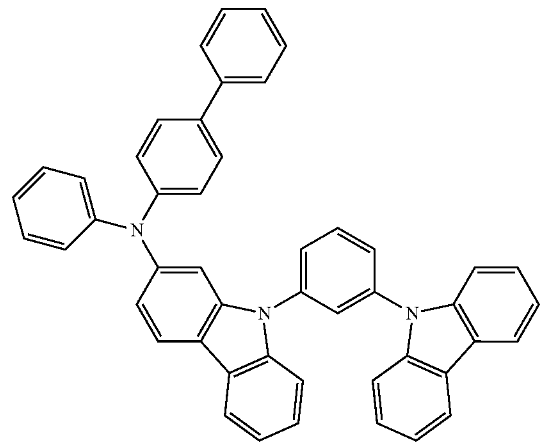
(A15)
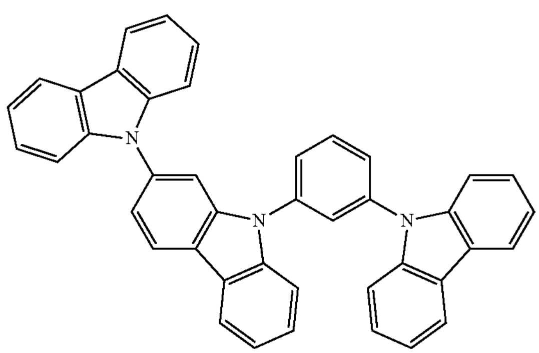
(A16)
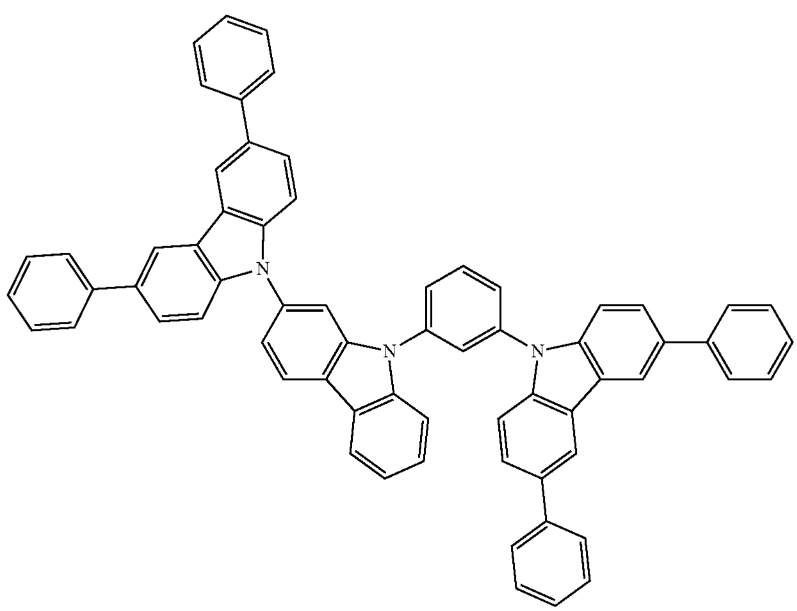

-continued
(A17)
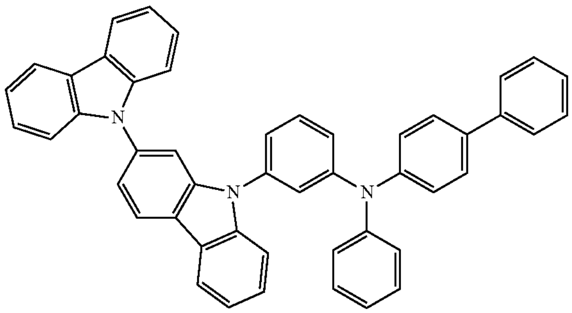
(A18)
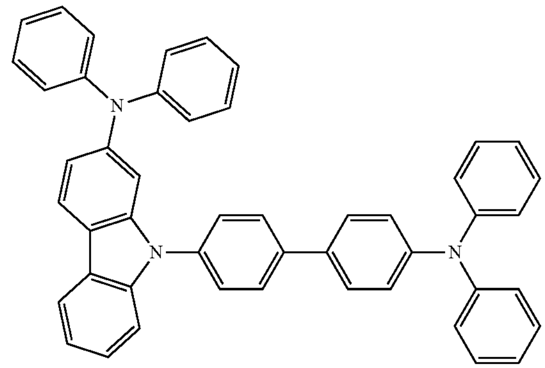
(A19)
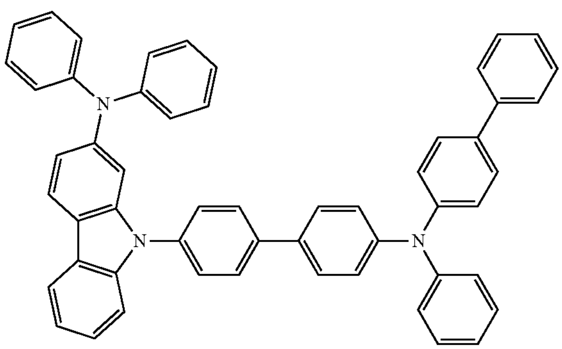
(A20)
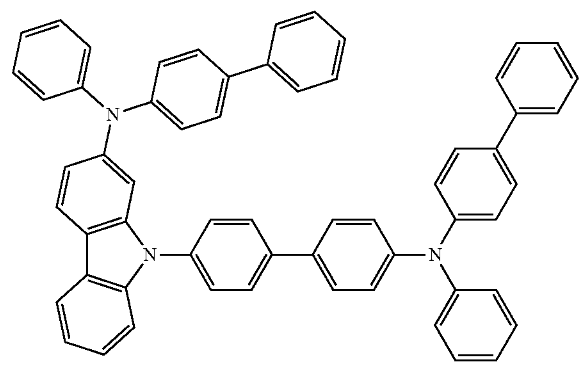
(A21)
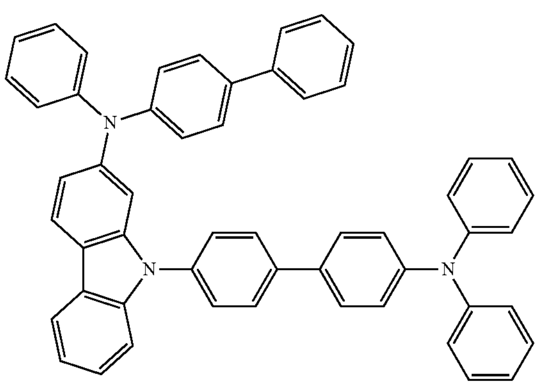
(A22)
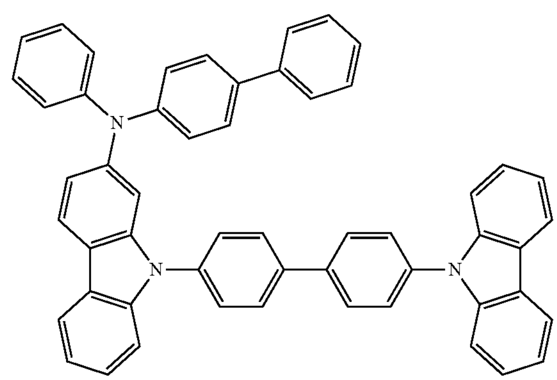
(A23)
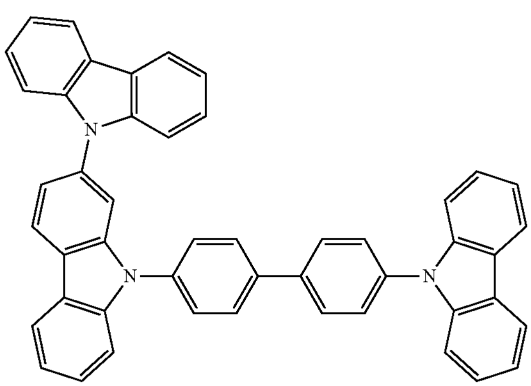
(A24)
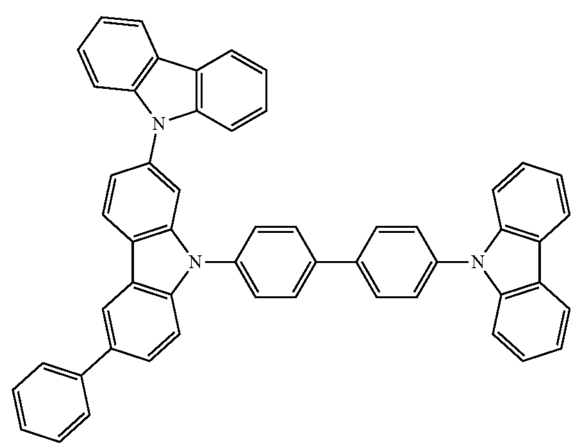

-continued
(A25)
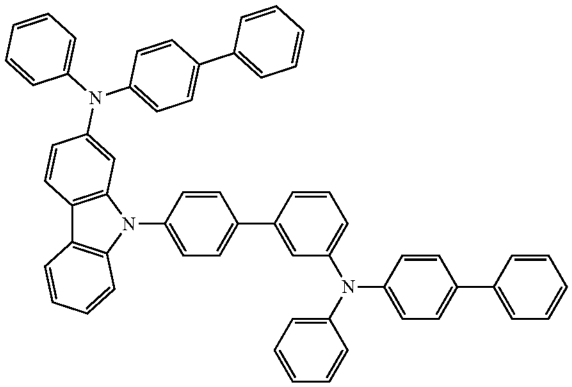
(A26)
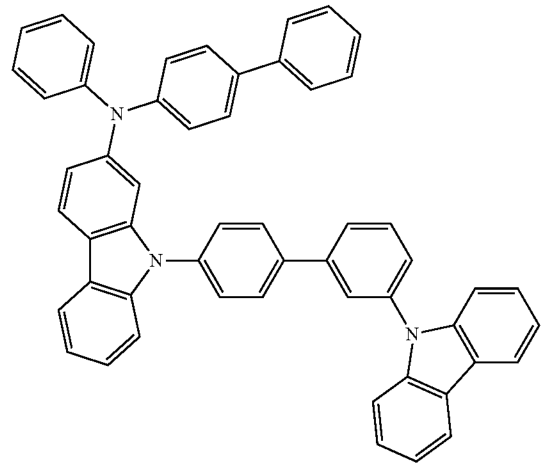
(A27)
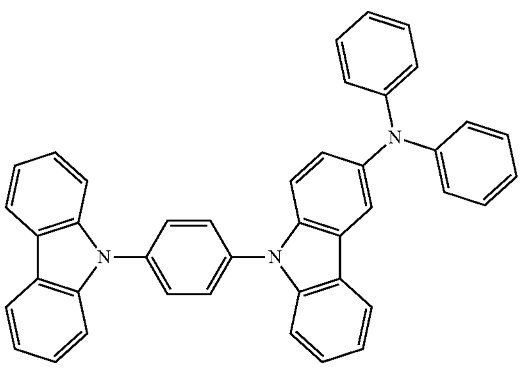
(B1)
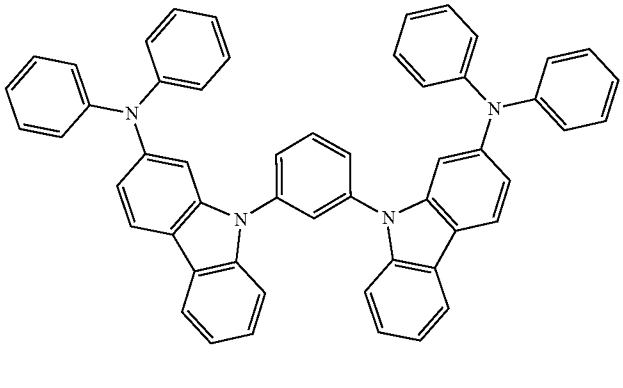

-continued
(B2)
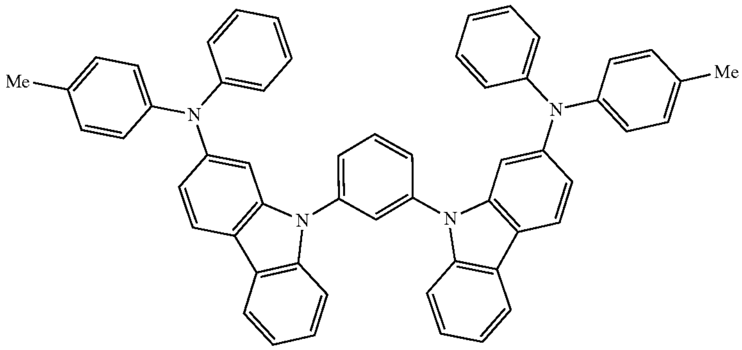
(B3)
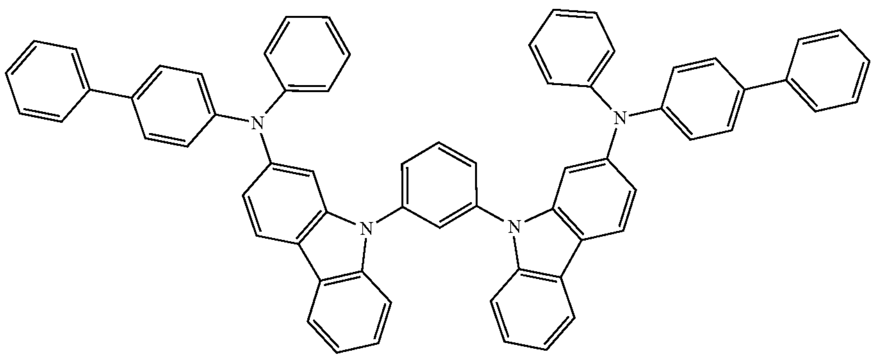
(B4)
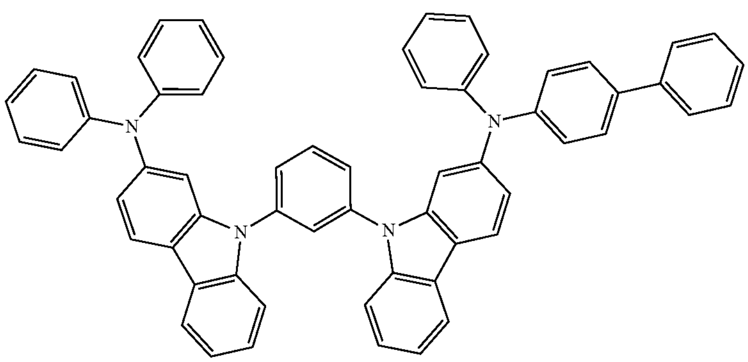
(B5)
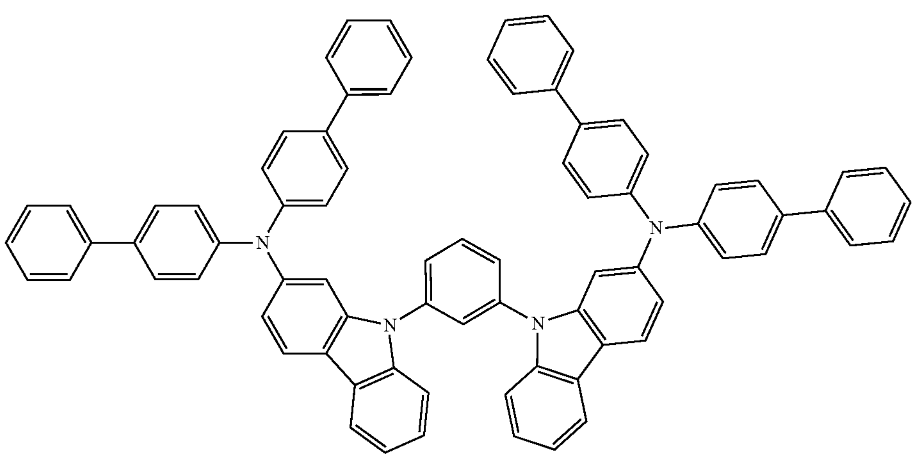

-continued
(B6)
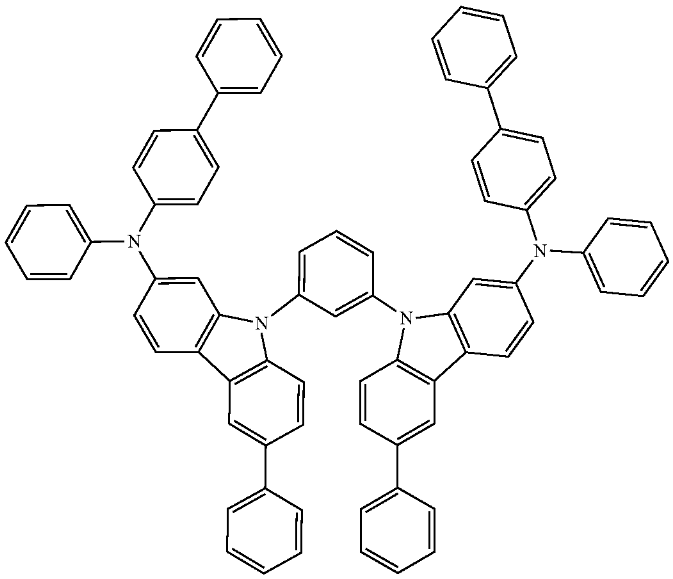
(B8)
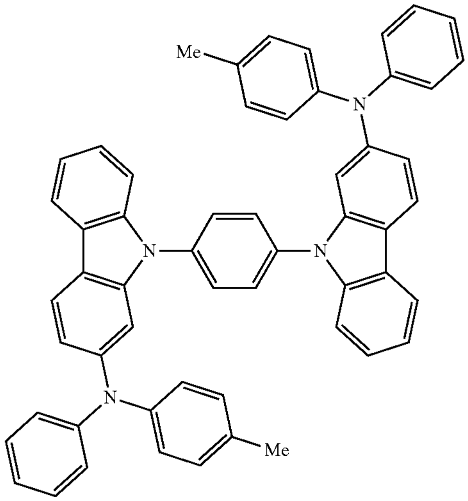
(B9)
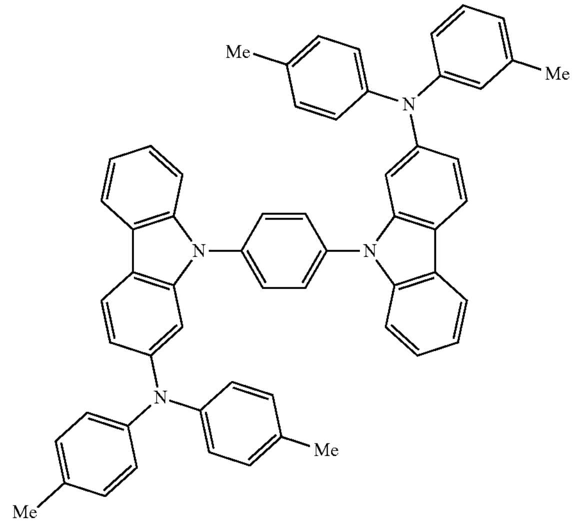

-continued
(B11)
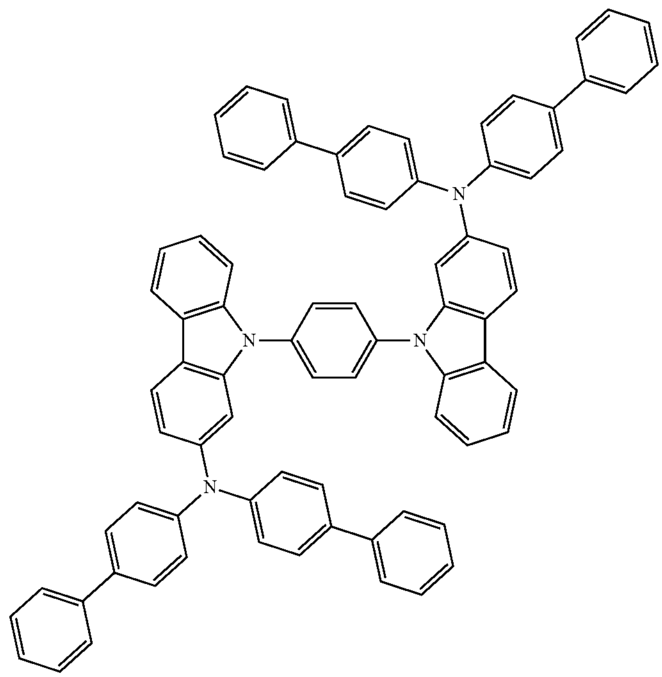
(B12)
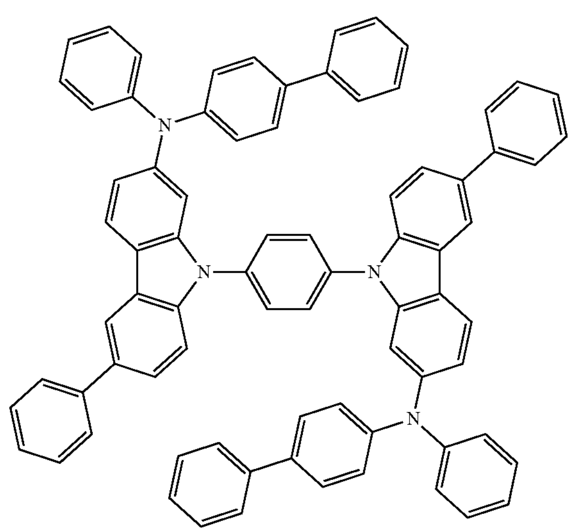

-continued
(B13)
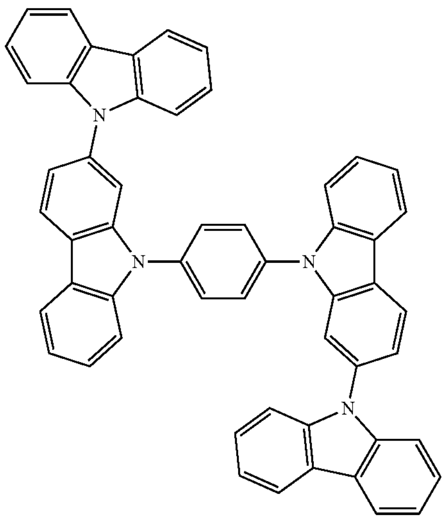
(B14)
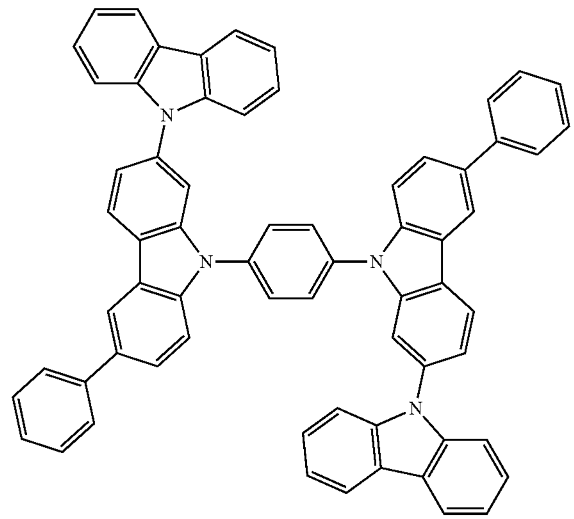
(B15)
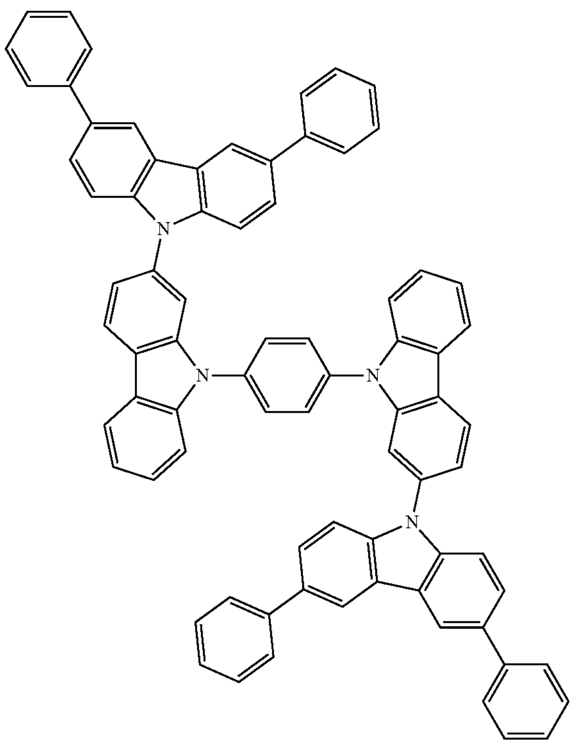
(B16)
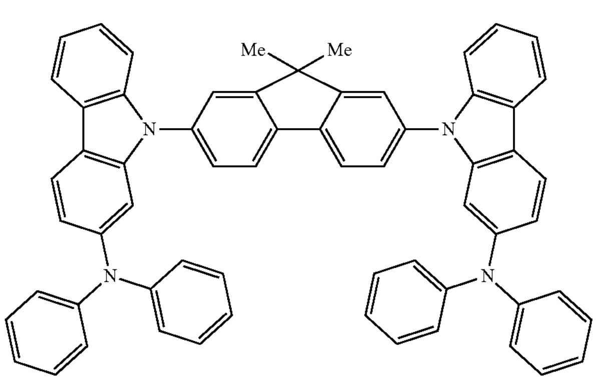

-continued
(B17)
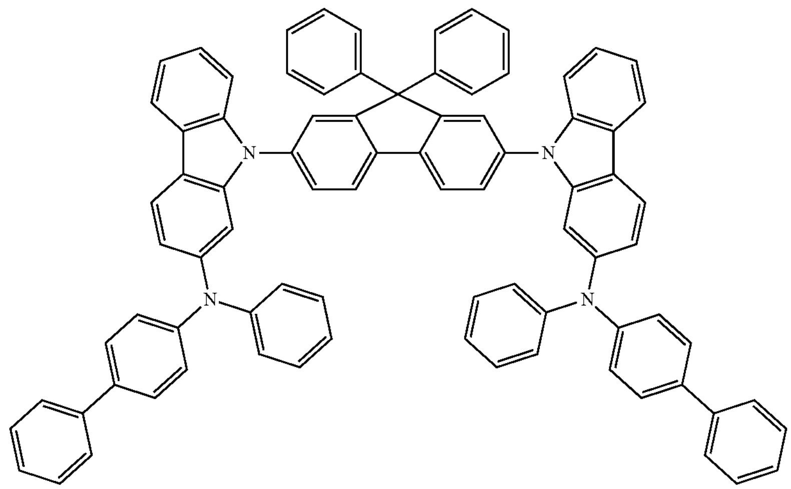
(B18)
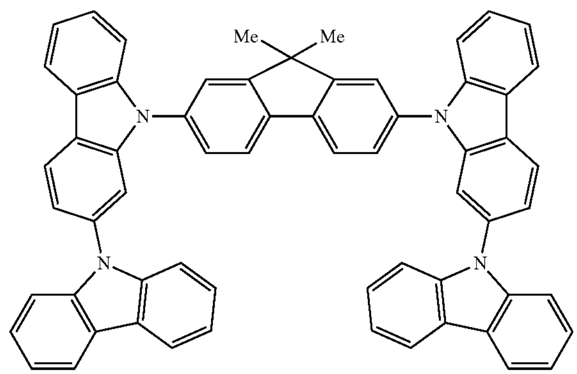
(B19)
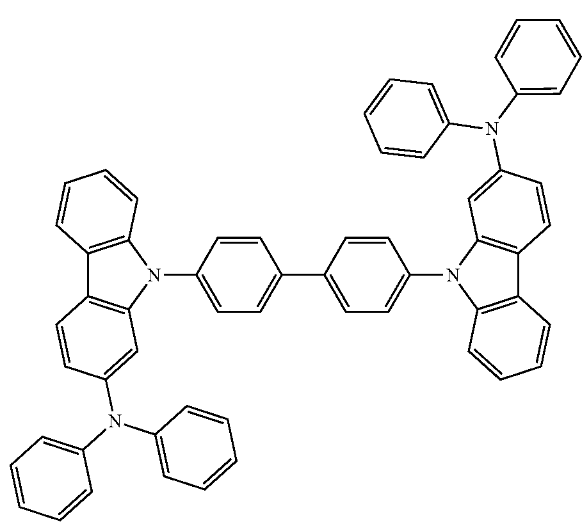
(B20)
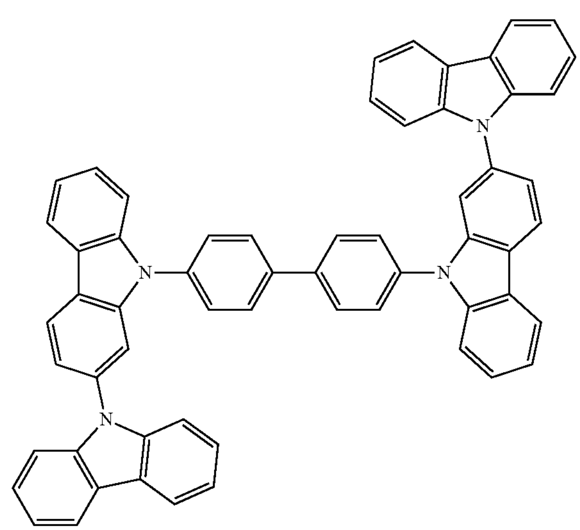

-continued
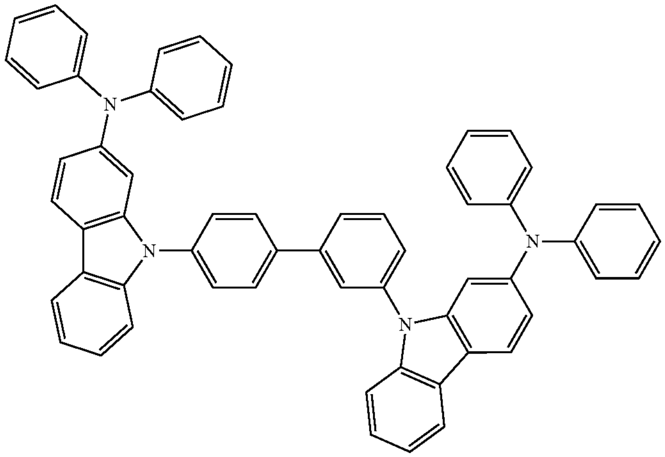
(B22)
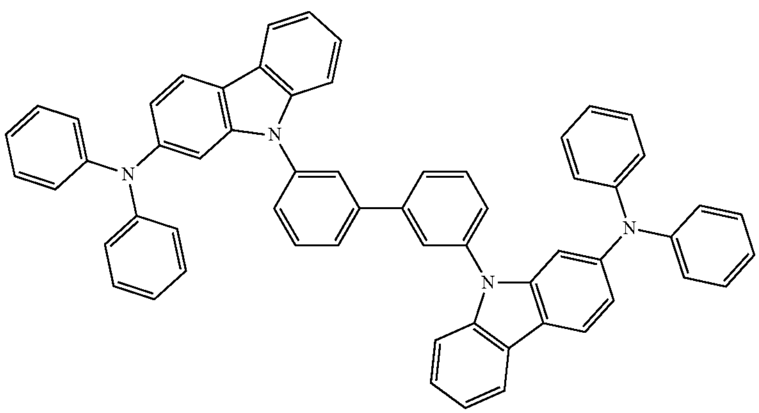
(B23)
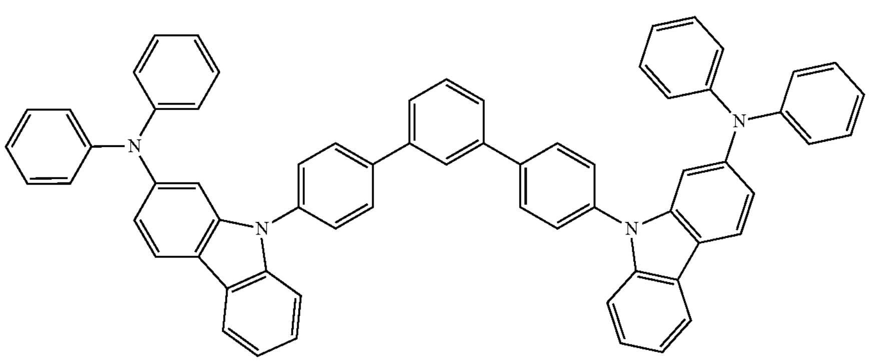
(B24)
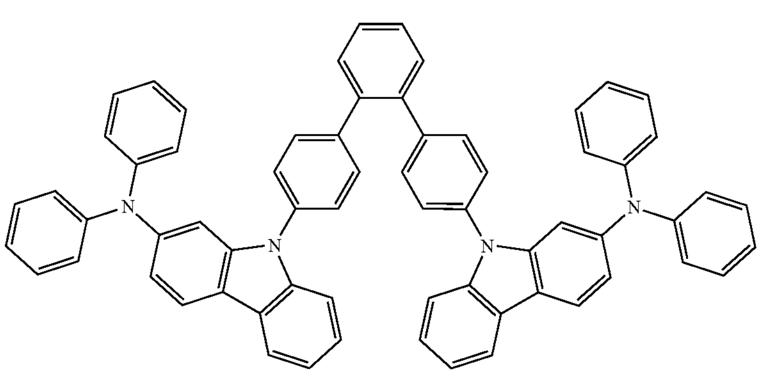

-continued
(B25)
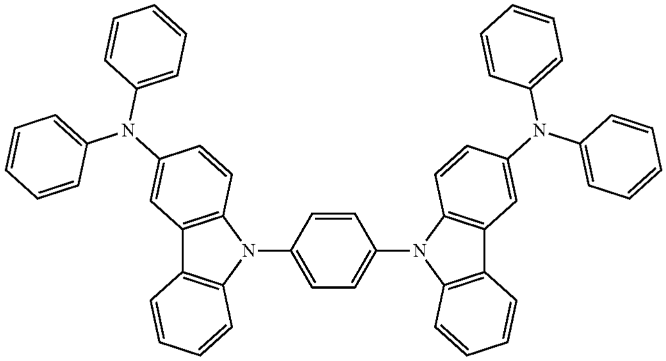
(C1)
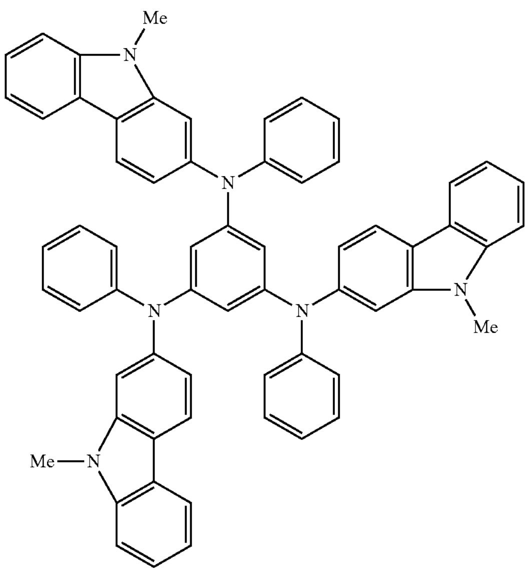
(C2)
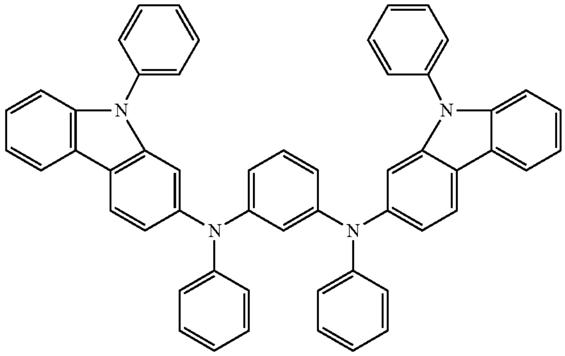
-continued
(C4)
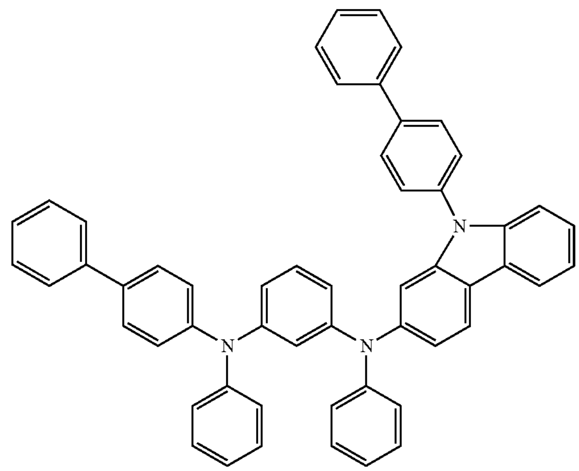
(C5)
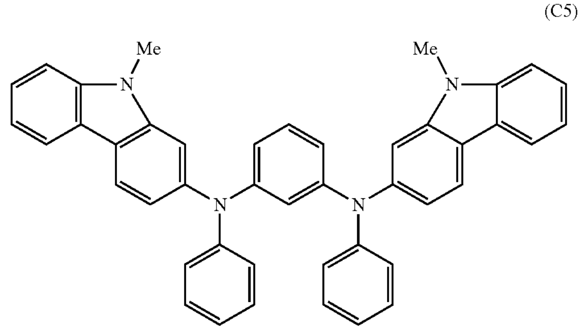

(C7)
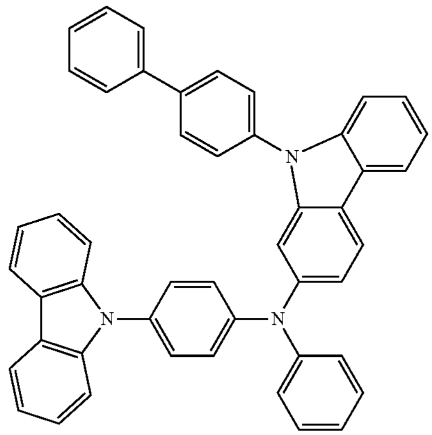
(C8)
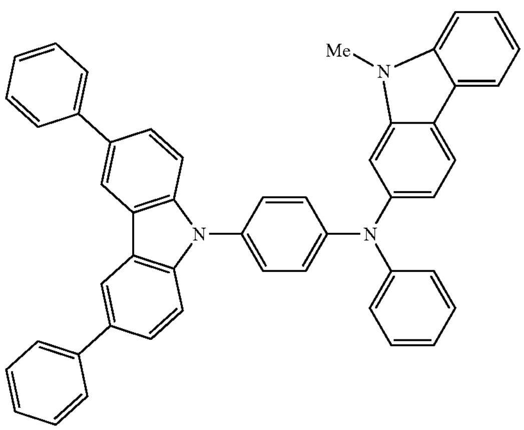
(C9)
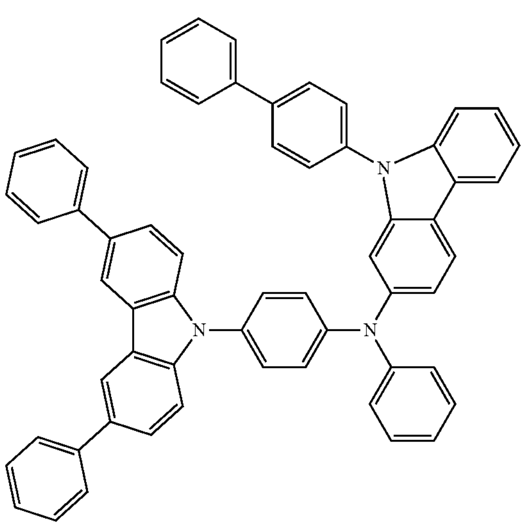
(C10)
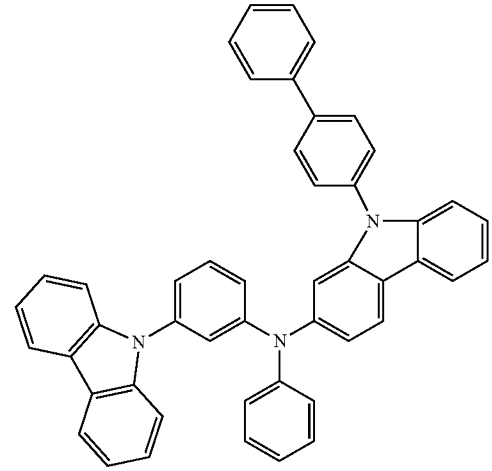
(C11)
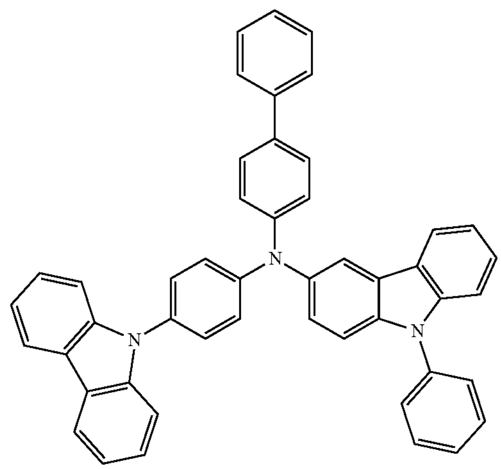
(C12)
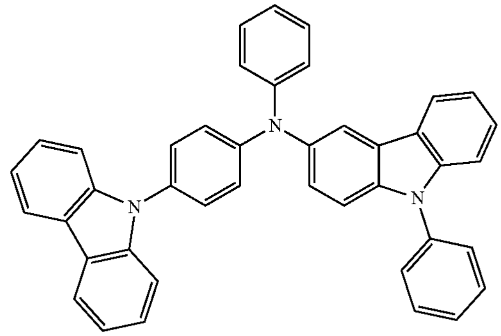

-continued
(C13)
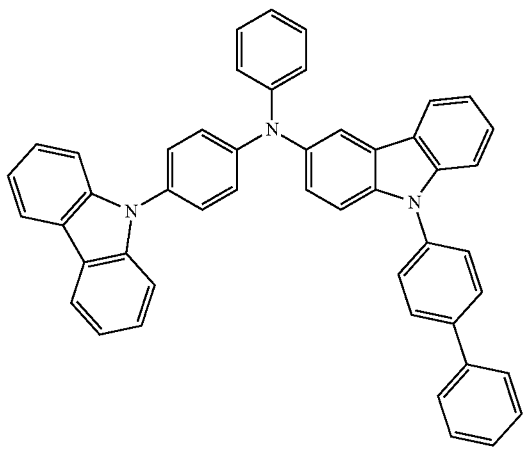
(C14)
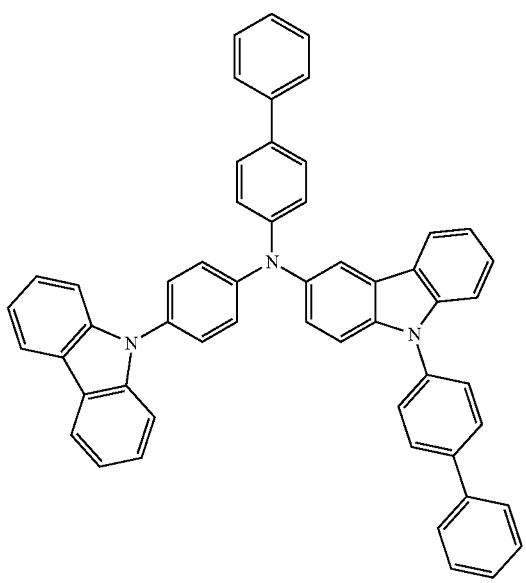
(C15)
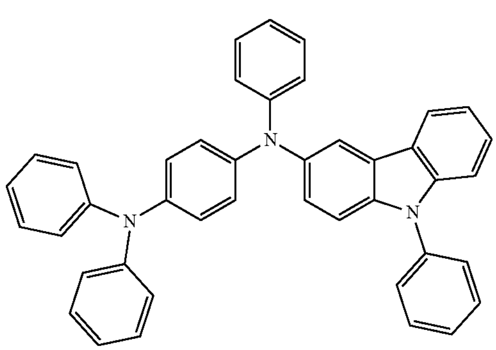
-continued
(C16)
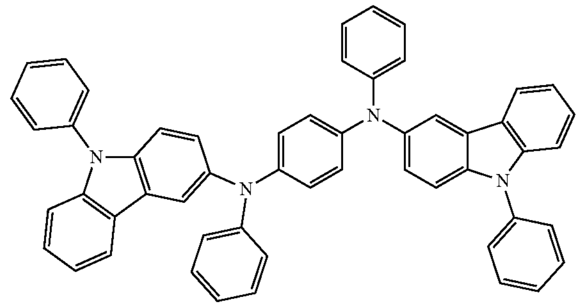
(D1)
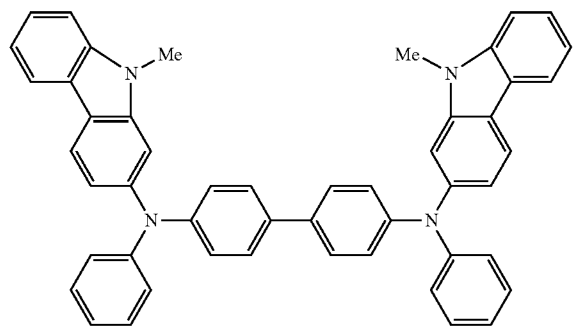
(D2)
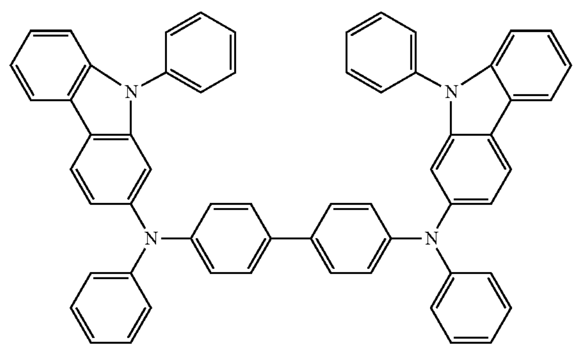
(D4)
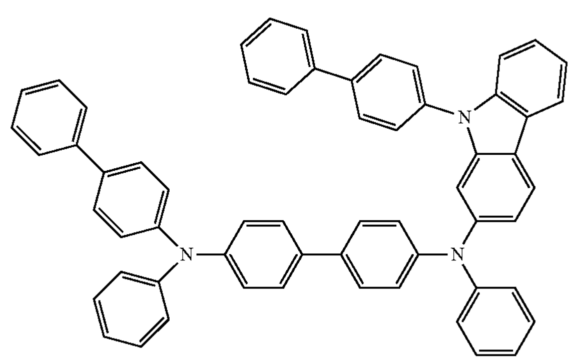

-continued
(D5)
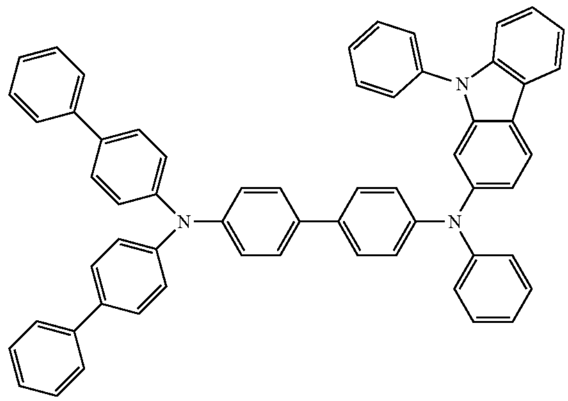
(D6)
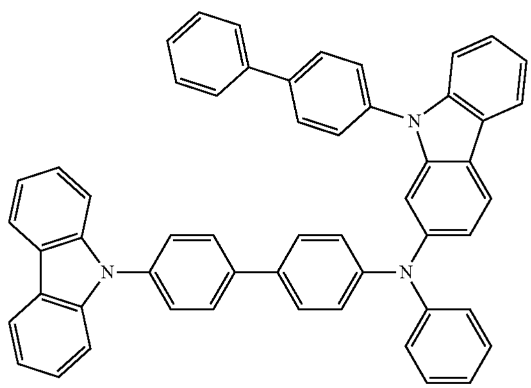
(D7)
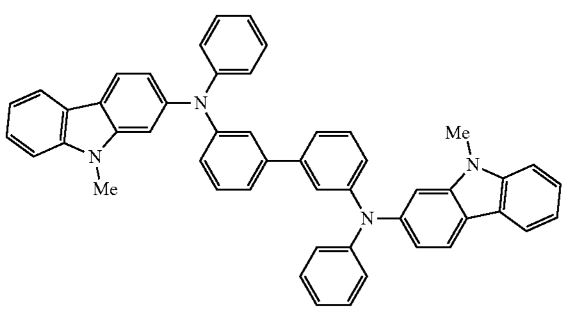
-continued
(D8)
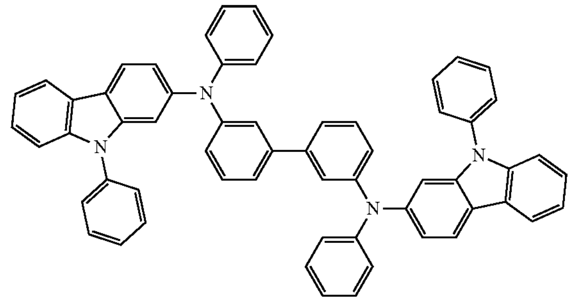
(D9)
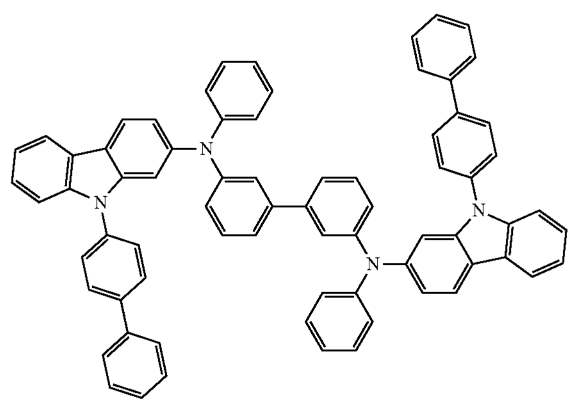
(E1)
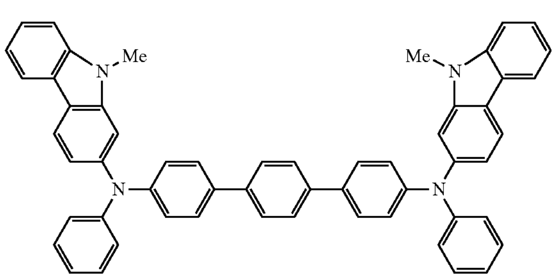
(E2)
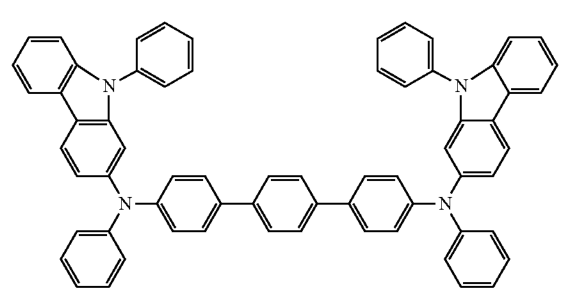

-continued
(E3)
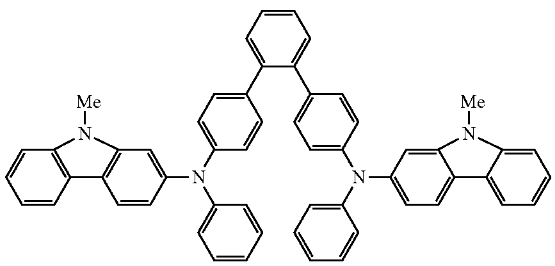
(E4)
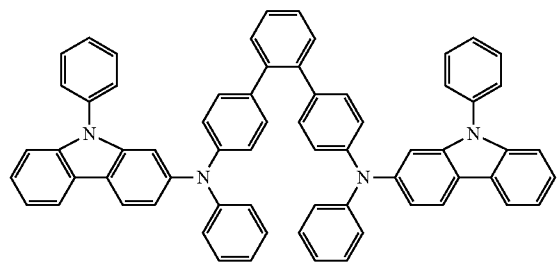
(E5)
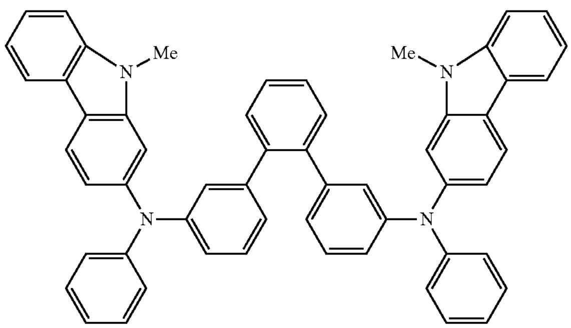
(E6)
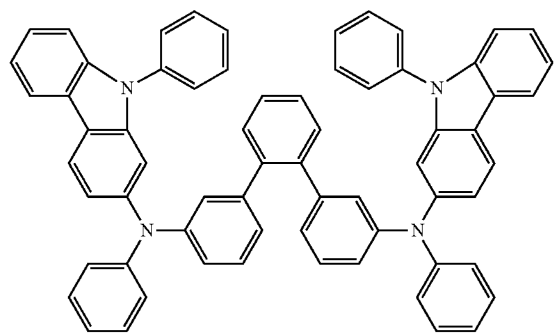
(E8)
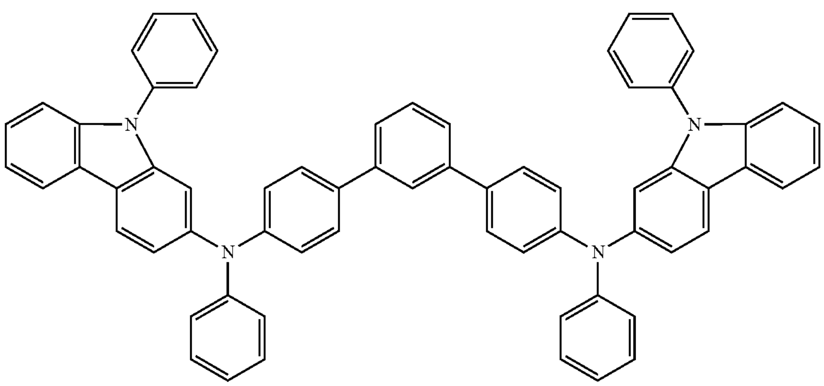
(E9)
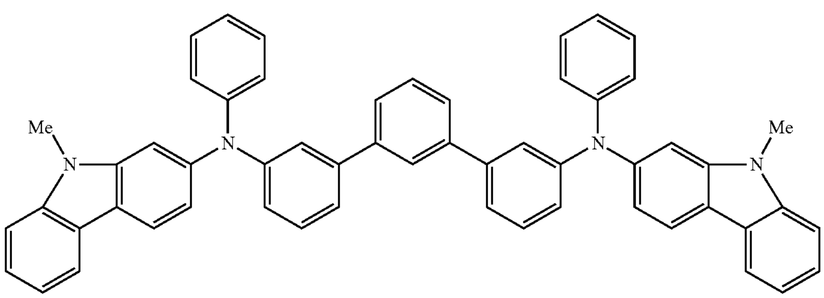
(E10)
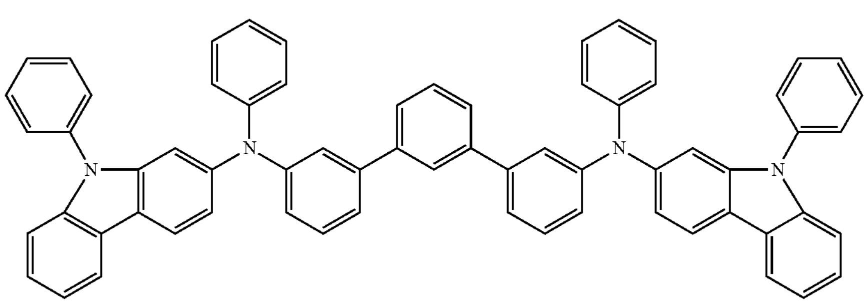

(F 2)
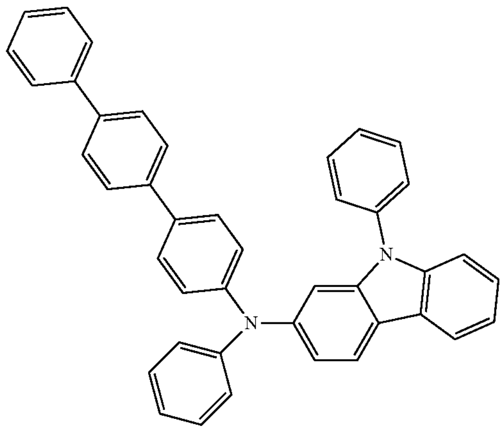
(F 3)
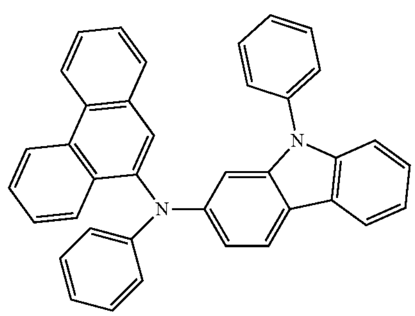
(F 4)
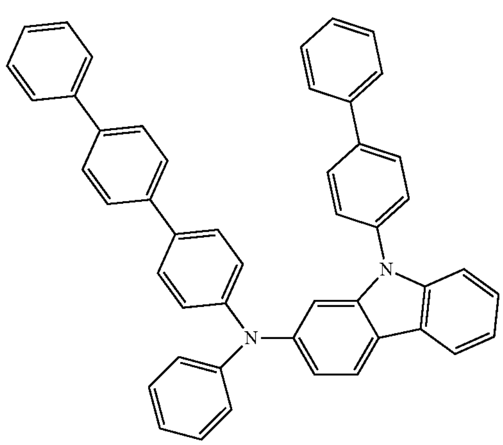
-continued
(F 5)
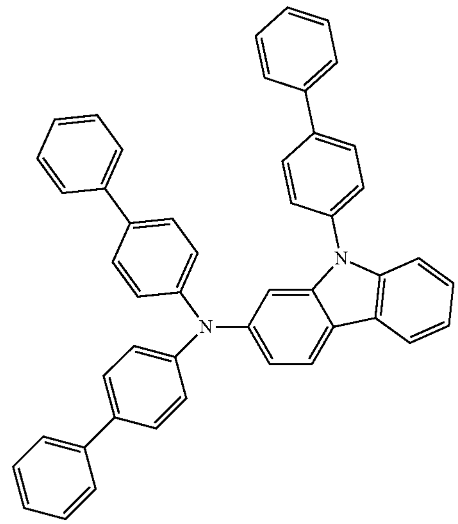
(F 6)
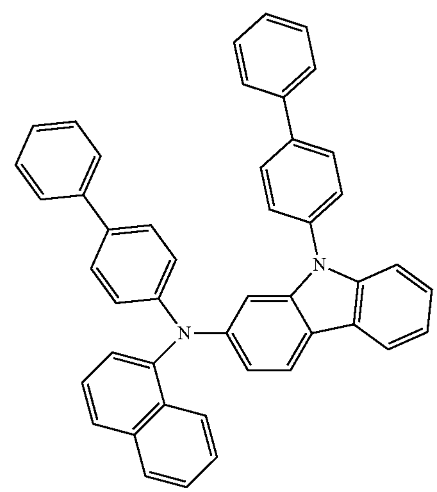
(F 7)
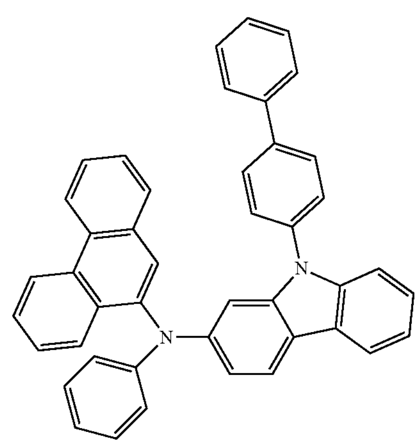

-continued
(F 9)
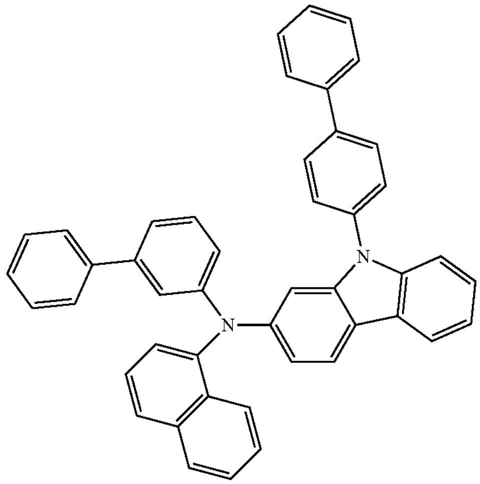
(F 10)
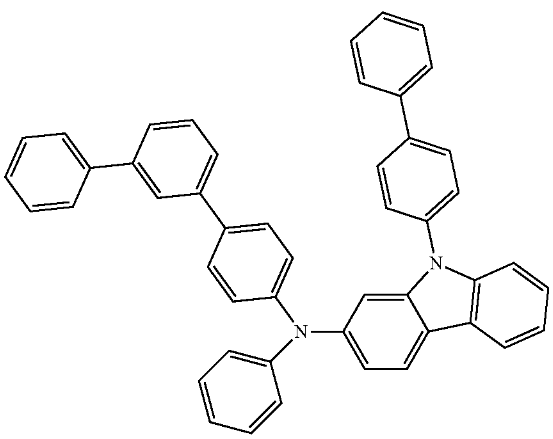
(F 12)
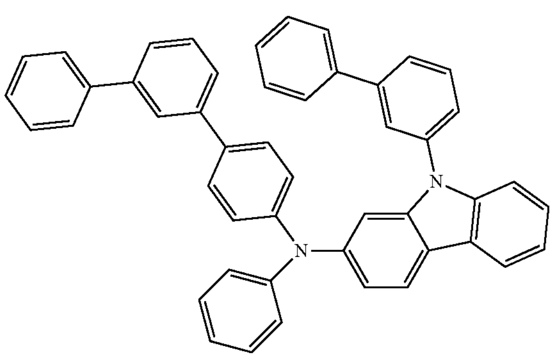
-continued
(F 13)
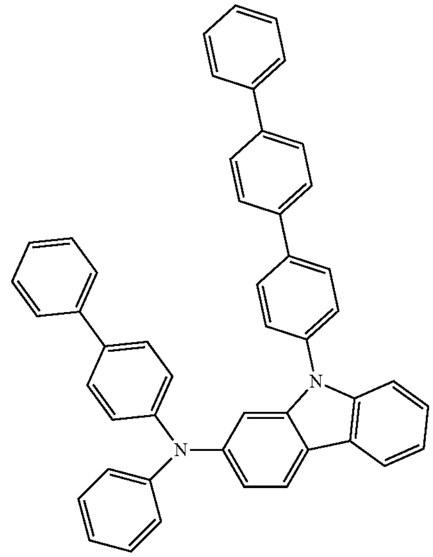
(F 14)
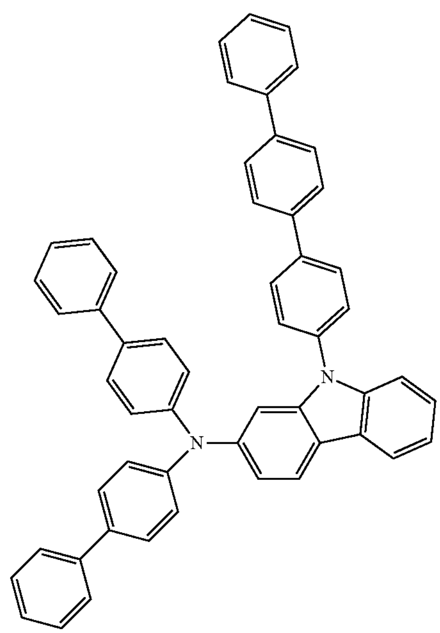

-continued
(F 15)
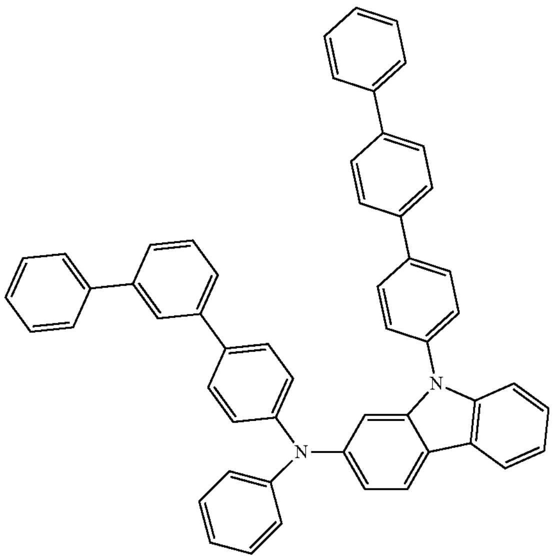
(F 16)
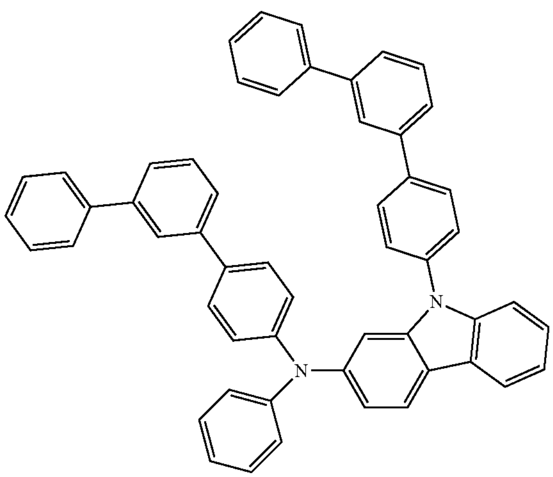
(F 17)
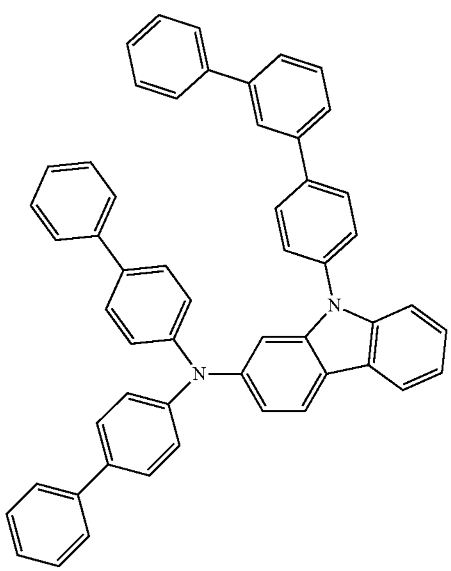
-continued
(F 18)
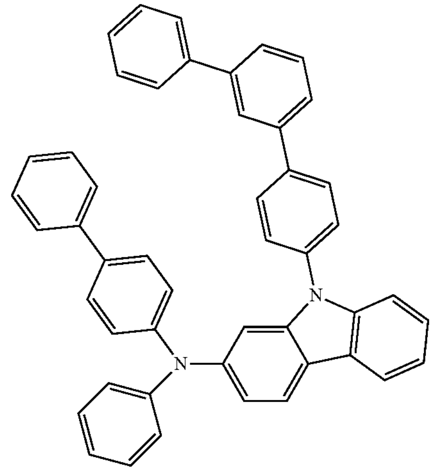
(F 19)
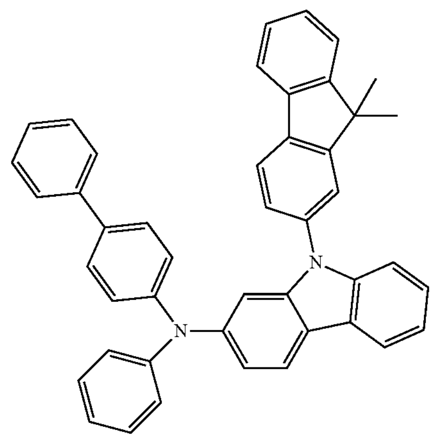
(F 20)
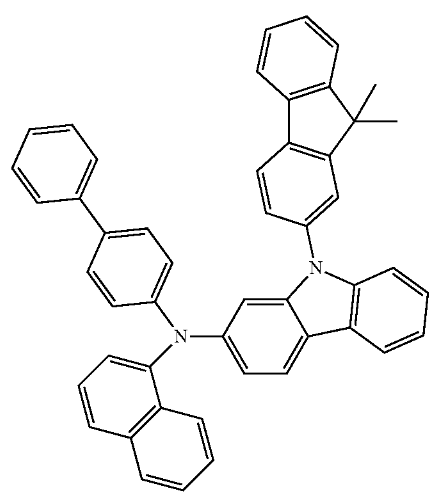

-continued
(F 21)
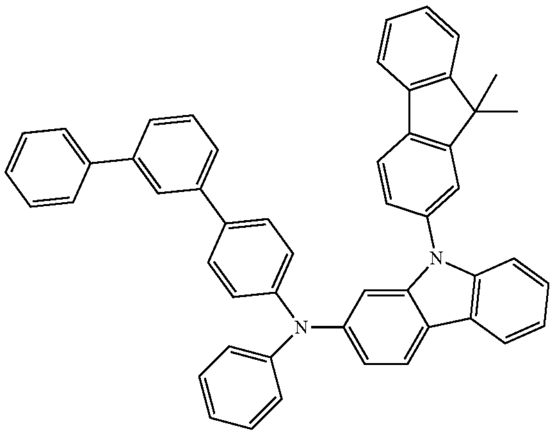
(F 22)
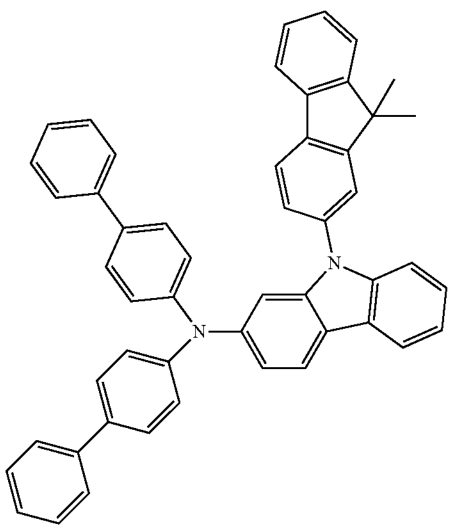
(F 23)
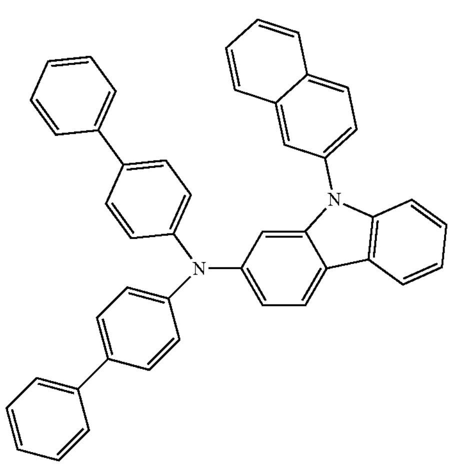
-continued
(F 24)
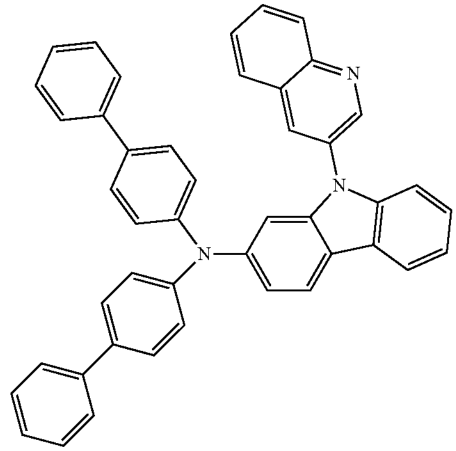
(F 25)
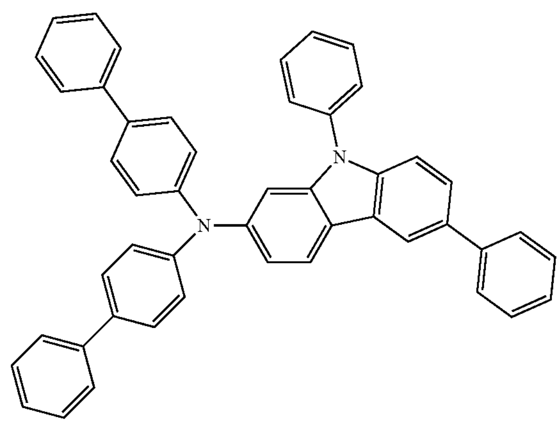
(F 26)
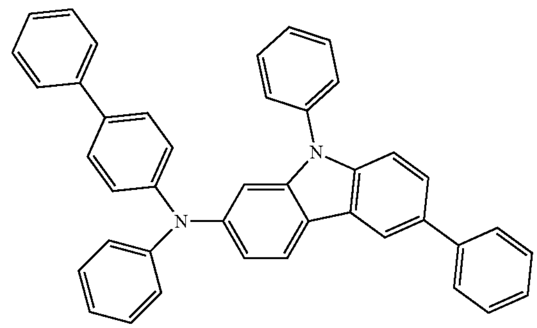

-continued (F 27)

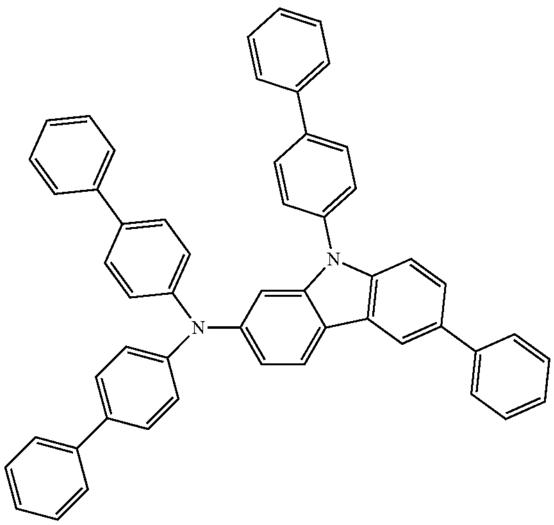

(F 28)

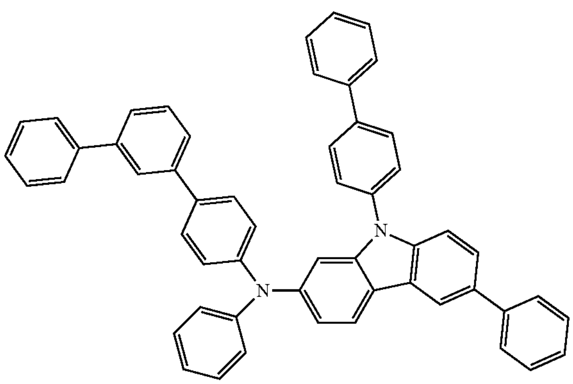

(F 29)

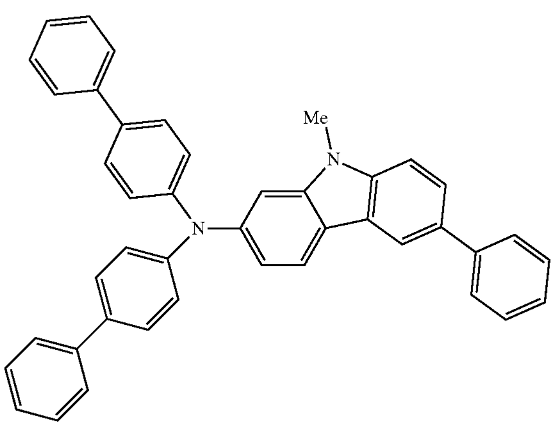

-continued (F 30)

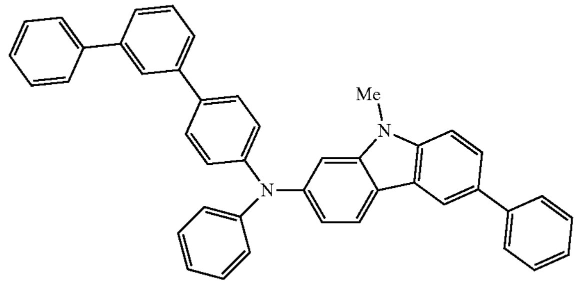

(F 32)

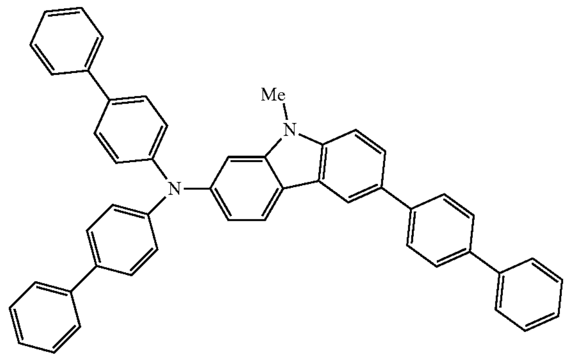

wherein, in Formulae 1-15, 1-22, and 2, $A_{11}$, $A_{13}$, and $A_{21}$ to $A_{24}$ are each independently selected from a $C_5$-$C_{20}$ carbocyclic group and a $C_1$-$C_{20}$ heterocyclic group, $X_{11}$ is $N[(L_{11})_{a11}$-$Ar_{11}]$, $X_{12}$ is selected from $N[(L_{12})_{a12}$-$Ar_{12}]$, $C(Ar_{14})(Ar_{16})$, O, and S, $X_{21}$ is selected from $N[(L_{22})_{a22}$-$Ar_{22}]$, $C(Ar_{23})(Ar_{24})$, O, and S, a11 and a12 are each independently an integer selected from 1 to 5, wherein, when $X_{12}$ is $N[(L_{12})_{a12}$-$Ar_{12}]$, $A_{11}$ and $A_{13}$ are each independently selected from a benzene, a naphthalene, a phenanthrene, an anthracene, a pyridine, a pyrimidine, a quinoline, an isoquinoline, naphthyridine, a quinoxaline, a phthalazine, a quinazoline, and a cinnoline, $L_{11}$, $L_{12}$, $L_{21}$, $L_{22}$, and $L_{26}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, wherein, when $X_{12}$ is $N[(L_{12})_{a12}$-$Ar_{12}]$, and $A_{11}$ and $A_{13}$ are each a benzene, $L_{11}$ and $L_{12}$ are each independently selected from a pentalenylene group, an indenylene group, an azulenylene group, a heptalenylene group, an indacenylene group, an acenaphthylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiazolylene group, an isothiazolylene group, an oxazolylene group, an isoxazolylene group, an isoindolylene group, an indolylene group, an indazolylene group, a purinylene group, a benzoquinolinylene group, a phthalazinylene group, a naphthyridinylene group, a quinoxalinylene group, a cinnolinylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a tetrazolylene group, a dibenzofuranylene group, a dibenzothiophenylene group, a benzocarbazolylene group, a dibenzocarbazolylene group, a thiatriazolines group, an imidazopyridinylene group, an imidazopyrimidinylene group; and a pentalenylene group, an indenylene group, an azulenylene group, a heptalenylene group, an indacenylene group, an acenaphthylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiazolylene group, an isothiazolylene group, an oxazolylene group, an isoxazolylene group, an isoindolylene group, an indolylene group, an indazolylene group, a purinylene group, a benzoquinolinylene group, a phthalazinylene group, a naphthyridinylene group, a quinoxalinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a tetrazolylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a biphenyl group, a terphenyl group, a pentalenyl group, an indenyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyrazinyl group, a pyridazinyl group, an isoindolyl group, an indolyl group, an indazolyl group, a purinyl group, a benzoquinolinyl group, a phthalazinyl group, a naphthyridinyl group, a quinoxalinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group, and when $X_{12}$ is $C(Ar_{14})(Ar_{16})$, O, or S, and $A_{11}$ and $A_{13}$ are each a benzene or a naphthalene, $L_{11}$ is selected from a pentalenylene group, an indenylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridazinylene group, an isoindolylene group, an indolylene group, an indazolylene group, a purinylene group, a benzoquinolinylene group, a phthalazinylene group, a naphthyridinylene group, a quinoxalinylene group, a cinnolinylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a dibenzofuranylene group, a dibenzothiophenylene group, a benzocarbazolylene group, a dibenzocarbazolylene group, a thiadiazolylene group, an imidazopyridinylene group, an imidazopyrimidinylene group; and a pentalenylene group, an indenylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridazinylene group, an isoindolylene group, an indolylene group, an indazolylene group, a purinylene group, a benzoquinolinylene group, a phthalazinylene group, a naphthyridinylene group, a quinoxalinylene group, a cinnolinylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyrazinyl group, a pyridazinyl group, an isoindolyl group, an indolyl group, an indazolyl group, a purinyl group, a benzoquinolinyl group, a phthalazinyl group, a naphthyridinyl group, a quinoxalinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group, a21, a22, and a26 are each independently an integer selected from 0 to 5, $Ar_{11}$ and $Ar_{12}$ are each independently selected from a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, and —$B(Q_6)(Q_7)$, and $Ar_{14}$, $Ar_{16}$, and $Ar_{21}$ to $Ar_{24}$ are each independently selected from a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_4)(Q_5)$, and —$B(Q_6)(Q_7)$, provided that:

when $X_{12}$ is $N[(L_{12})_{a12}$-$Ar_{12}]$ and $A_{11}$ and $A_{13}$ are each a benzene, $Ar_{11}$ and $Ar_{12}$ are each independently selected from a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiazolyl group, an isothiazolyl group, an oxazolyl group, an isoxazolyl group, an isoindolyl group, an indolyl group, an indazolyl group, a purinyl group, a benzoquinolinyl group, a phthalazinyl group, a naphthyridinyl group, a quinoxalinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a tetrazolyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, an imidazopyrimidinyl group, —$Si(Q_1)(Q_2)(Q_3)$; and a phenyl group, a biphenyl group, a terphenyl group, a pentalenyl group, an indenyl group, a naphthyl group, an azulenyl group, a heptalenyl group, an indacenyl group, an acenaphthyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiazolyl group, an isothiazolyl group, an oxazolyl group, an isoxazolyl group, an isoindolyl group, an indolyl group, an indazolyl group, a purinyl group, a benzoquinolinyl group, a phthalazinyl group, a naphthyridinyl group, a quinoxalinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a tetrazolyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, and an imidazopyrimidinyl group, each substituted with at least one selected from deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyrazinyl group, a pyridazinyl group, an isoindolyl group, an indolyl group, an indazolyl group, a purinyl group, a benzoquinolinyl group, a phthalazinyl group, a naphthyridinyl group, a quinoxalinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, a dibenzosilolyl group, and —Si($Q_{41}$)($Q_{42}$)($Q_{43}$), provided that when one of $Ar_{11}$ and $Ar_{12}$ is an unsubstituted phenyl group, an unsubstituted naphthyl group, an unsubstituted biphenyl group, a phenyl group substituted with at least one selected from a phenyl group and a naphthyl group, or a naphthyl group substituted with at least one selected from a phenyl group and a naphthyl group, the other of $Ar_{11}$ and $Ar_{12}$ is further substituted with at least one selected from deuterium, —Cl, —Br, —I, a hydroxyl group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkoxy group, a cyclopentyl group, a cyclohexyl group, a cycloheptyl group, a cyclopentenyl group, a cyclohexenyl group, a terphenyl group, a pentalenyl group, an indenyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyrazinyl group, a pyridazinyl group, an isoindolyl group, an indolyl group, an indazolyl group, a purinyl group, a benzoquinolinyl group, a phthalazinyl group, a naphthyridinyl group, a quinoxalinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, a dibenzosilolyl group, —Si($Q_{41}$)($Q_{42}$)($Q_{43}$), a tolyl group, and a t-butyl phenyl group, and when $X_{12}$ is C($Ar_{14}$)($Ar_{16}$), O, or S, and $A_{11}$ and $A_{13}$ are each a benzene or a naphthalene, $Ar_{11}$ is selected from a $C_1$-$C_{20}$ alkyl group and a $C_1$-$C_{20}$ alkoxy group;

a pentalenyl group, an indenyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridazinyl group, an isoindolyl group, an indolyl group, an indazolyl group, a purinyl group, a benzoquinolinyl group, a phthalazinyl group, a naphthyridinyl group, a quinoxalinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, an imidazopyrimidinyl group, —Si($Q_1$)($Q_2$)($Q_3$), —N($Q_4$)($Q_5$); and a pentalenyl group, an indenyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridazinyl group, an isoindolyl group, an indolyl group, an indazolyl group, a purinyl group, a benzoquinolinyl group, a phthalazinyl group, a naphthyridinyl group, a quinoxalinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyrazinyl group, a pyridazinyl group, an isoindolyl group, an indolyl group, an indazolyl group, a purinyl group, a benzoquinolinyl group, a phthalazinyl group, a naphthyridinyl group, a quinoxalinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, a dibenzosilolyl group, —$Si(Q_{41})(Q_{42})(Q_{43})$, and —$N(Q_{44})(Q_{45})$;

$R_{11}$ to $R_{13}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted monovalent non-aromatic condensed polycyclic group, a substituted or unsubstituted monovalent non-aromatic condensed heteropolycyclic group, —$Si(Q_{11})(Q_{12})(Q_{13})$, —$N(Q_{14})(Q_{15})$, and —$B(Q_{16})(Q_{17})$;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, an indolyl group, a pyridinyl group, a pyrazinyl group, a pyrimidinyl group, a pyridazinyl group, a quinoxalinyl group, a carbazolyl group, a triazinyl group, a dibenzofuranyl group, a dibenzothiophenyl group, a benzocarbazolyl group, a dibenzocarbazolyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, an indolyl group, a pyridinyl group, a pyrazinyl group, a pyrimidinyl group, a pyridazinyl group, a quinoxalinyl group, a carbazolyl group, a triazinyl group, a dibenzofuranyl group, a dibenzothiophenyl group, a benzocarbazolyl group, and a dibenzocarbazolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, and a naphthyl group; and —$Si(Q_{11})(Q_{12})(Q_{13})$ and —$N(Q_{14})(Q_{15})$, $R_{21}$ to $R_{24}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_{11})(Q_{12})(Q_{13})$, —$N(Q_{14})(Q_{15})$, and —$B(Q_{16})(Q_{17})$, b11 to b13, and b21 to b24 are each independently an integer selected from 0 to 8, and at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from the group consisting of:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-Coo aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{21}$)($Q_{22}$)($Q_{23}$), —N($Q_{24}$)($Q_{25}$), and —B($Q_{26}$)($Q_{27}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{31}$)($Q_{32}$)($Q_{33}$), —N($Q_{34}$)($Q_{35}$), and —B($Q_{36}$)($Q_{37}$); and —Si($Q_{41}$)($Q_{42}$)($Q_{43}$), —N($Q_{44}$)($Q_{45}$), and —B($Q_{46}$)($Q_{47}$), wherein $Q_1$ to $Q_7$, $Q_{11}$ to $Q_{17}$, $Q_{21}$ to $Q_{27}$, $Q_{31}$ to $Q_{37}$, and $Q_{41}$ to $Q_{47}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group; and a $C_6$-$C_{60}$ aryl group, a $C_1$-$C_{60}$ heteroaryl group, a monovalent non-aromatic condensed polycyclic group and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkoxy group, a phenyl group, a biphenyl group, a terphenyl group, and a naphthyl group, and $Q_4$ and $Q_5$ are optionally linked to each other to form a saturated or unsaturated ring.

* * * * *